US010862047B2

(12) United States Patent
Nakanotani et al.

(10) Patent No.: US 10,862,047 B2
(45) Date of Patent: Dec. 8, 2020

(54) ORGANIC ELECTROLUMINESCENT DEVICE

(71) Applicant: KYUSHU UNIVERSITY, NATIONAL UNIVERSITY CORPORATION, Fukuoka-shi, Fukuoka (JP)

(72) Inventors: Hajime Nakanotani, Fukuoka (JP); Chihaya Adachi, Fukuoka (JP); Takahiro Higuchi, Fukuoka (JP); Taro Furukawa, Fukuoka (JP)

(73) Assignee: KYUSHU UNIVERSITY, NATIONAL UNIVERSITY CORPORATION, Fukuoka (JP)

(*) Notice: Subject to any disclaimer, the term of this patent is extended or adjusted under 35 U.S.C. 154(b) by 0 days.

(21) Appl. No.: 14/911,761

(22) PCT Filed: Aug. 13, 2014

(86) PCT No.: PCT/JP2014/071373

§ 371 (c)(1),
(2) Date: Feb. 12, 2016

(87) PCT Pub. No.: WO2015/022974

PCT Pub. Date: Feb. 19, 2015

(65) Prior Publication Data

US 2016/0190478 A1 Jun. 30, 2016

(30) Foreign Application Priority Data

Aug. 14, 2013 (JP) ................................ 2013-168587
Feb. 28, 2014 (JP) ................................ 2014-038472

(51) Int. Cl.

*H01L 51/00* (2006.01)
*H01L 51/50* (2006.01)
*C09K 11/06* (2006.01)

(52) U.S. Cl.

CPC .......... *H01L 51/0072* (2013.01); *C09K 11/06* (2013.01); *H01L 51/0054* (2013.01);
(Continued)

(58) Field of Classification Search

CPC ............ H01L 51/0032; H01L 51/0071; H01L 51/0072; H01L 51/0069; H01L 51/0067; H01L 51/0054; H01L 51/5012

See application file for complete search history.

(56) References Cited

U.S. PATENT DOCUMENTS 7,737,624 B2 6/2010 Igarashi et al.
2002/0146589 A1 10/2002 Akiyama et al.
(Continued)

FOREIGN PATENT DOCUMENTS

CN 105074951 A 11/2015
CN 105103326 A 11/2015
(Continued)

OTHER PUBLICATIONS

International Preliminary Report on Patentability for Japanese Application No. JP20141071373 and English translation.
(Continued)

*Primary Examiner* — Bethany L Martin
(74) *Attorney, Agent, or Firm* — Browdy and Neimark, PLLC

(57) ABSTRACT

An organic electroluminescent device having an anode, a cathode, and a light emitting layer between the anode and the cathode, in which the light emitting layer contains a first organic compound, a second organic compound, and a third organic compound that satisfy the following expression (A), the second organic compound is a delayed fluorescent material, and the third organic compound is a light emitting material, is capable of enhancing the light emission efficiency. $E_{S1}(A)$, $E_{S1}(B)$ and $E_{S1}(C)$ represent a lowest singlet
(Continued)

excitation energy level of the first, second and third organic compound, respectively.

$$E_{S1}(A)>E_{S1}(B)>E_{S1}(C) \quad (A)$$

6 Claims, 11 Drawing Sheets

(52) U.S. Cl.
CPC ...... *H01L 51/0067* (2013.01); *H01L 51/0069* (2013.01); *H01L 51/0071* (2013.01); *H01L 51/5012* (2013.01); *H01L 51/5028* (2013.01); *C09K 2211/1011* (2013.01); *C09K 2211/1014* (2013.01); *C09K 2211/1033* (2013.01); *C09K 2211/1044* (2013.01); *C09K 2211/1074* (2013.01); *C09K 2211/1077* (2013.01); *C09K 2211/186* (2013.01); *H01L 51/0059* (2013.01); *H01L 51/0081* (2013.01); *H01L 51/5016* (2013.01); *H01L 2251/552* (2013.01)

(56) References Cited

U.S. PATENT DOCUMENTS

| | | | | |
|---|---|---|---|---|
| 2006/0192482 | A1 | 8/2006 | Igarashi et al. | |
| 2012/0248968 | A1 | 10/2012 | Ogiwara et al. | |
| 2013/0207047 | A1 | 8/2013 | Suda et al. | |
| 2013/0277654 | A1* | 10/2013 | Seo et al. ............ | H01L 51/0085 257/40 |
| 2013/0306945 | A1* | 11/2013 | Seo ..................... | H01L 51/5072 257/40 |
| 2014/0103329 | A1 | 4/2014 | Ogiwara et al. | |
| 2014/0145149 | A1* | 5/2014 | Lin ...................... | C07D 233/58 257/40 |
| 2015/0340623 | A1 | 11/2015 | Kawamura et al. | |
| 2016/0329512 | A1 | 11/2016 | Nishide et al. | |
| 2017/0062731 | A1* | 3/2017 | Ogiwara ............. | H01L 51/0074 |

FOREIGN PATENT DOCUMENTS

| | | | |
|---|---|---|---|
| EP | 2 958 158 | A1 | 12/2015 |
| EP | 2980877 | | 2/2016 |
| EP | 3035401 | A1 | 6/2016 |
| JP | 2002050483 | A | 2/2002 |
| JP | 2003520391 | A | 7/2003 |
| JP | 2005071986 | A | 3/2005 |
| JP | 2005108726 | A | 4/2005 |
| JP | 2005108727 | A | 4/2005 |
| JP | 2006041395 | A | 2/2006 |
| JP | 2008-509565 | A | 3/2008 |
| JP | 2010141059 | A | 6/2010 |
| JP | 2010245061 | A | 10/2010 |
| JP | 2013116975 | A | 6/2013 |
| JP | 2013120770 | A | 6/2013 |
| JP | 2014009224 | A | 1/2014 |
| JP | 2014009352 | A | 1/2014 |
| JP | 2014022666 | A | 2/2014 |
| JP | 2014075249 | A | 4/2014 |
| JP | 2013-168587 | † | 2/2015 |
| JP | 2014-038472 | † | 2/2015 |
| JP | 2015-144224 | A | 8/2015 |
| KR | 10-2015-0120447 | | 12/2014 |
| TW | 518768 | | 1/2003 |
| TW | 200920177 | A | 5/2009 |
| TW | 201248965 | | 12/2012 |
| WO | 2001008230 | A1 | 2/2001 |
| WO | 2011/070963 | A1 | 6/2011 |
| WO | 2012050001 | A1 | 4/2012 |
| WO | 2012133188 | A1 | 10/2012 |
| WO | 2013011954 | A1 | 1/2013 |
| WO | 2013011955 | A1 | 1/2013 |
| WO | 2013081088 | A1 | 6/2013 |
| WO | 2013133359 | A1 | 9/2013 |
| WO | 2013154064 | A1 | 10/2013 |
| WO | 2013161437 | A1 | 10/2013 |
| WO | 2014013947 | A1 | 1/2014 |
| WO | 2014104315 | A1 | 7/2014 |
| WO | 2014157610 | A1 | 10/2014 |
| WO | 2014157619 | A1 | 10/2014 |
| WO | 2015/098975 | A1 † | 7/2015 |

OTHER PUBLICATIONS

International Search Report for Japanese Application No. JP20141071373 and English translation.

Uoyama et al., "Highly efficient organic light-emitting diodes from delayed fluorescence" Nature, pp. 234-238, vol. 492 (Dec. 2013).

Extended European Search Report for European Patent Application No. 14836585.1, dated Dec. 5, 2016.

Third Party Observation for application No. EP20140836585 dated Jul. 11, 2016.

Chinese First Office Action for Application No. 2014800437168, dated Sep. 19, 2016.

Priority Document of EP2958158; Japanese Patent Application No. JP2013-270267; made publicly available upon publication of WO2015/098975 dated Jul. 2, 2015.

Priority Document of of EP2958158; Japanese Patent Application No. J2014-052133; made publicly available upon publication of WO2015/098975 dated Jul. 2, 2015.

Sae Youn Lee et al.,"High-efficiency organic light-emitting diodes utilizing thermally activated delayed fluorescence from triazine-based donor-acceptor hybrid molecules", Applied Physics Letters 101, 093306 (2012).

Qisheng Zhang et al., "Design of Efficient Thermally Activated Delayed Fluorescence Materials for Pure Blue Organic Light Emitting Diodes", Journal of American Chem. Soc. 2012, 134, 14706-14709.

Hiroki Uoyama et al., "Highly efficient organic light-emitting diodes from delayed fluorescence", Nature, Vol. 492, Dec. 13, 2012, pp. 234-240.

Office Action dated Dec. 15, 2017 issued in the corresponding Taiwanese patent Application No. 103127967 with its English Translation.

Communication dated Dec. 19, 2017 issued in the corresponding European Patent Application No. 14836585.1 (Third-party observations).

Office Action dated Feb. 9, 2018 issues in the corresponding European Patent Application No. 14836585.1.

European Office Action dated Oct. 25, 2017, issued in the corresponding European Patent Application No. 14 836 585.1-1552.

European Office Action for corresponding European Patent Application No. 14836585.1, dated Jun. 15, 2018.

Japanese Office Action for corresponding Japanese Patent Application No. 2014-249534, dated Jul. 31, 2018, with English Machine Translation.

Japanese Office Action for corresponding Japanese Patent Application No. 2014-249534, dated Sep. 24, 2019, with English Machine Translation.

Office Action for corresponding Korean Patent Application No. 10-2016-7006684, dated Apr. 28, 2020, with English Machine Translation.

* cited by examiner
† cited by third party

ORGANIC ELECTROLUMINESCENT DEVICE

TECHNICAL FIELD

The present invention relates to an organic electroluminescent device having a high light emission efficiency.

BACKGROUND ART

Studies are being actively performed for enhancing the light emission efficiency of an organic light emitting device, such as organic electroluminescent device (organic EL device). In particular, various studies are being performed for enhancing the light emission efficiency by devising the material used in the light emitting layer. Among the studies, there are studies relating to an organic electroluminescent device containing a host material and a guest material (i.e., a light emitting dopant), in which the device emits light through migration of excitation energy formed in the host material to the guest material.

Patent Documents 1 and 2 describe an organic electroluminescent device using a host material, a light emitting dopant, and an assist dopant, as materials of a light emitting layer. In the organic electroluminescent device, the assist dopant complements the migration of carrier in the light emitting layer, and for example, a hole transferring material, such as a phenylamine derivative, is used therefor in the case where the transfer of electrons is complemented, and an electron transferring material is used therefor in the case where the transfer of holes is complemented. Patent Documents 1 and 2 describe that the use of the assist dopant increases the probability of the recombination of carrier, and enhances the light emission efficiency of the organic electroluminescent device.

Patent Document 3 describes an organic electroluminescent device using a first dopant that is formed of a material capable of converting triplet excitation energy to light emission and has a first energy gap, a second dopant that is formed of a material capable of converting triplet excitation energy to light emission and has a second energy gap that is larger than the first energy gap, and a host material that has a third energy gap that is larger than the second energy gap, as materials of a light emitting layer, and describes an organic metal complex having iridium as a center metal, as an example of the first dopant and the second dopant. Patent Document 3 describes that the use of the combination of the two kinds of dopants and the host material enhances the light emission efficiency of the organic electroluminescent device, lowers the driving voltage, and enhances the light emission lifetime.

CITATION LIST

Patent Documents

Patent Document 1: JP-A-2005-108726
Patent Document 2: JP-A-2005-108727
Patent Document 3: JP-A-2006-413955

SUMMARY OF INVENTION

Technical Problem

However, the electroluminescent devices of Patent Documents 1 and 2 cannot sufficiently enhance the light emission efficiency due to the following reasons.

In an organic electroluminescent device using a host material and a light emitting dopant, when holes and electrons are injected to the light emitting layer thereof, the holes and the electrons are recombined mainly in the molecules of the host material to form excitation energy, and the host material is in a singlet excited state and a triplet excited state. The probabilities of the formation of the excitons in a singlet excited state (i.e., singlet excitons) and the excitons in a triplet excited state (i.e., triplet excitons) are statistically 25% for the singlet excitons and 75% for the triplet excitons.

In the case where the light emitting dopant is a perylene derivative, an oxadiazole derivative or an anthracene derivative as exemplified in the literatures, the energy of the singlet excitons is transferred to the light emitting dopant and excites the light emitting dopant to a singlet excited state. The light emitting dopant thus excited to a singlet excited state emits fluorescent light on returning to the original ground state. On the other hand, the energy of the triplet excitons is not transferred to the light emitting dopant, and the triplet excitons return to the ground state without contributing to the light emission. Accordingly, the organic electroluminescent device wastes the energy of the triplet excitons, which occupy 75% of the entire excitons, even though the probability of the recombination of the carrier is enhanced with the assist dopant, and thus is limited in enhancement of the light emission efficiency.

The organic electroluminescent device of Patent Document 3 uses a material capable of converting the triplet excitation energy to light emission, such as an iridium organic metal complex, as the first dopant. It has been known that an iridium organic metal complex receives triplet excitation energy from a host material, due to the effect of the heavy metal, and in this system, it is considered that the first dopant receives energy of the host material and the second dopant in a triplet excited state and can convert the energy to light emission. However, as the triplet excited state has a long lifetime, deactivation of the energy may occur due to the saturation of the excited state and the interaction with the excitons in a triplet excited state, and the quantum efficiency of the phosphorescence is generally not high. Accordingly, the organic electroluminescent device of the literature, which utilizes mainly light emission from the triplet excitation energy (i.e., phosphorescence), is difficult to enhance the light emission efficiency.

In consideration of the problems of the related art, the present inventors have made earnest investigations for providing an organic electroluminescent device having a high light emission efficiency.

Solution to Problem

As a result of earnest investigations, the inventors have found that by using a delayed fluorescent material as a assist dopant, the delayed fluorescent material in a triplet excited state undergoes inverse intersystem crossing to a singlet excited state, and thus the triplet excitation energy can consequently be converted to fluorescence, thereby providing an organic electroluminescent device having a high light emission efficiency. Based on the knowledge, the inventors thus have provided the invention shown below as a measure for solving the problems.

(1) An organic electroluminescent device containing an anode, a cathode, and at least one organic layer including a light emitting layer between the anode and the cathode, the light emitting layer containing a first organic compound, a second organic compound, and a third organic compound that satisfy the following expression (A), the second organic compound being a delayed fluorescent material, and the third organic compound being a light emitting material:

$$E_{S1}(A)>E_{S1}(B)>E_{S1}(C) \quad (A)$$

wherein $E_{S1}(A)$ represents a lowest singlet excitation energy level of the first organic compound; $E_{S1}(B)$ represents a lowest singlet excitation energy level of the second organic compound; and $E_{S1}(C)$ represents a lowest singlet excitation energy level of the third organic compound.

(2) The organic electroluminescent device according to the item (1), wherein the second organic compound has an energy difference $\Delta E_{st}$ between a lowest singlet excited state and a lowest triplet excited state at 77 K of 0.3 eV or less.

(3) The organic electroluminescent device according to the item (1), wherein the second organic compound has an energy difference $\Delta E_{st}$ between a lowest singlet excited state and a lowest triplet excited state at 77 K of 0.08 eV or less.

(4) The organic electroluminescent device according to any one of the items (1) to (3), wherein the first organic compound and the second organic compound satisfy the following expression (B):

$$E_{T1}(A)>E_{T1}(B) \quad (B)$$

wherein $E_{T1}(A)$ represents a lowest triplet excitation energy level at 77 K of the first organic compound; and $E_{T1}(B)$ represents a lowest triplet excitation energy level at 77 K of the second organic compound.

(5) The organic electroluminescent device according to any one of the items (1) to (4), wherein the third organic compound emits fluorescent light on returning from the lowest singlet excitation energy level to a ground energy level.

(6) The organic electroluminescent device according to any one of the items (1) to (5), wherein in the light emitting layer, a content of the second organic compound is smaller than a content of the first organic compound.

(7) The organic electroluminescent device according to any one of the items (1) to (6), wherein the light emitting layer contains two or more kinds of compounds as the third compound.

(8) The organic electroluminescent device according to any one of the items (1) to (7), wherein the light emitting layer contains one kind or two or more kinds of organic compounds, in addition to the first organic compound, the second organic compound, and the third organic compound.

Advantageous Effects of Invention

The organic light emitting device of the invention uses the combination of the three kinds of organic compounds that satisfy the particular condition, and thus has a feature of a considerably high light emission efficiency. In particular, the invention enhances the light emission efficiency in the case where the third organic compound is a compound that emits fluorescent light on returning from the lowest singlet excitation energy level to the ground energy level.

DESCRIPTION OF EMBODIMENTS

The contents of the invention will be described in detail below. The constitutional elements may be described below with reference to representative embodiments and specific examples of the invention, but the invention is not limited to the embodiments and the examples. In the description, a numerical range expressed with reference to the expressions, an upper limit or less and/or a lower limit or more, means a range that includes the upper limit and/or the lower limit. In the invention, the hydrogen atom that is present in the compound used in the invention is not particularly limited in isotope species, and for example, all the hydrogen atoms in the molecule may be $^{1}H$, and all or a part of them may be $^{2}H$ (deuterium (D)).

Layer Structure of Organic Electroluminescent Device

The organic electroluminescent device of the invention has a structure containing an anode, a cathode, and an organic layer formed between the anode and the cathode. The organic layer includes at least a light emitting layer, and the organic electroluminescent device of the invention has a characteristic feature in the constitution of the light emitting layer. The constitution of the light emitting layer will be described later.

Figure 1:
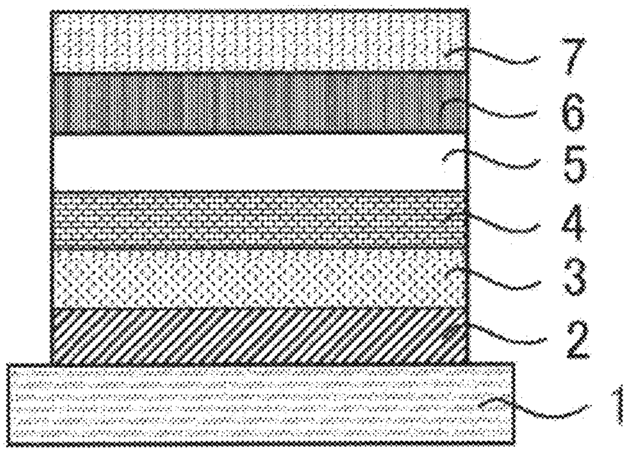
FIG. 1 is a schematic cross sectional illustration showing an example of the layer structure of the organic electroluminescent device.

The organic layer may contain only a light emitting layer, or may contain one or more additional organic layers in addition to the light emitting layer. Examples of the additional organic layer include a hole transporting layer, a hole injection layer, an electron barrier layer, a hole barrier layer, an electron injection layer, an electron transporting layer, and an exciton barrier layer. The hole transporting layer may be a hole injection and transporting layer having a hole injection function, and the electron transporting layer may be an electron injection and transporting layer having an electron injection function. A specific structural example of the organic electroluminescent device is shown in FIG. 1. In FIG. 1, the numeral 1 denotes a substrate, 2 denotes an anode, 3 denotes a hole injection layer, 4 denotes a hole transporting layer, 5 denotes a light emitting layer, 6 denotes an electron transporting layer, and 7 denotes a cathode.

The members and the layers of the organic electroluminescent device will be described below.

Light Emitting Layer

In the light emitting layer, holes and electrons injected from the anode and the cathode respectively are recombined to form excitons, and then the layer emits light.

In the organic electroluminescent device of the invention, the light emitting layer contains the first organic compound, the second organic compound, and the third organic compound that satisfy the following expression (A), in which the second organic compound is a delayed fluorescent material, and the third organic compound is a light emitting material.

$$E_{S1}(A)>E_{S1}(B)>E_{S1}(C) \quad \text{(A)}$$

In the expression (A), $E_{S1}(A)$ represents the lowest singlet excitation energy level of the first organic compound; $E_{S1}(B)$ represents the lowest singlet excitation energy level of the second organic compound; and $E_{S1}(C)$ represents the lowest singlet excitation energy level of the third organic compound.

The delayed fluorescent material in the invention means an organic compound that is capable of being transferred to the triplet excited state and then undergoing inverse intersystem crossing to the singlet excited state, and emits fluorescent light on returning from the singlet excited state to the ground state. The light formed through the inverse intersystem crossing from the triplet excited state to the singlet excited state has a lifetime that is longer than normal fluorescent light (prompt fluorescent light) and phosphorescent light, and thus is observed as fluorescent light that is delayed therefrom. Accordingly, the fluorescent light of this type is referred to as delayed fluorescent light.

In the light emitting layer, the first to third organic compounds have the lowest singlet excitation energy levels $E_{S1}(A)$, $E_{S1}(B)$ and $E_{S1}(C)$ satisfying the expression (A), and the second organic compound is a delayed fluorescent material, whereby the excitation energy formed through recombination of holes and electrons injected to the light emitting layer is efficiently converted to fluorescent light to provide a high light emission efficiency. The mechanism thereof is considered as follows.

In the light emitting layer, when the excitation energy is formed through recombination of holes and electrons, the organic compounds contained in the light emitting layer are transferred from the ground state to the singlet excited state and the triplet exited state. The probabilities of the formation of the organic compounds in a singlet excited state (i.e., singlet excitons) and the organic compounds in a triplet excited state (i.e., triplet excitons) are statistically 25% for the singlet excitons and 75% for the triplet excitons. Among the excitons, the energy of the first organic compound and the second organic compound in the singlet excited state is transferred to the third organic compound, and the third organic compound in the ground state is transferred to the singlet excited state. The third organic compound thus in the singlet excited state emits fluorescent light on returning to the ground state.

In the organic electroluminescent device of the invention at this time, the second organic compound in the triplet exited state undergoes inverse intersystem crossing to the singlet excited state since the second organic compound is a delayed fluorescent material, and the singlet excitation energy due to the inverse intersystem crossing is also transferred to the third organic compound. Accordingly, the energy of the second organic compound in the triplet excited state, which has large existence probability, also contributes indirectly to the light emission, and thus the light emission efficiency of the organic electroluminescent device is significantly enhanced as compared to an organic electroluminescent device having a constitution that does not contain the second organic compound in the light emitting layer.

In the organic electroluminescent device of the invention, the light emission occurs mainly from the third organic compound, and a part of the light emission may occur from the first organic compound and the second organic compound, or the light emission may partially occur therefrom. The light emission contains both fluorescent light and delayed fluorescent light.

In the organic electroluminescent device of the invention, the kinds and the combinations of the first organic compound, the second organic compound, and the third organic compound, as far as the second organic compound is a delayed fluorescent material, and the third organic compound is a light emitting material. The organic electroluminescent device of the invention preferably satisfies the following expression (B) from the standpoint that a further higher light emission efficiency may be achieved thereby.

$$E_{T1}(A)>E_{T1}(B) \quad \text{(B)}$$

In the expression (B), $E_{T1}(A)$ represents the lowest triplet excitation energy level at 77 K of the first organic compound; and $E_{T1}(B)$ represents the lowest triplet excitation energy level at 77 K of the second organic compound. The relationship between the lowest triplet excitation energy level at 77 K of the second organic compound $E_{T1}(B)$ and the lowest triplet excitation energy level at 77 K of the third organic compound $E_{T1}(C)$ is not particularly limited, and may be selected to satisfy the expression, $E_{T1}(B)>E_{T1}(C)$.

The invention will be described more specifically with reference to preferred examples below, but the scope of the invention is not construed as being limited to the following description based on the preferred examples.

Second Organic Compound

The delayed fluorescent material used as the second organic compound is not particularly limited, and is preferably a thermal activation type delayed fluorescent material undergoing inverse intersystem crossing from the singlet excited state to the triplet excited state through absorption of heat energy. The thermal activation type delayed fluorescent material relatively easily undergoes inverse intersystem crossing from the singlet excited state to the triplet excited state through absorption of heat that is formed by the device, and can make the triplet excitation energy thereof contribute to the light emission efficiently.

The delayed fluorescent material preferably has an energy difference $\Delta E_{st}$ between the energy level $E_{S1}$ in the lowest singlet excited state and the energy level $E_{T1}$ in the lowest triplet excited state at 77 K of 0.3 eV or less, more preferably 0.2 eV or less, further preferably 0.1 eV or less, and still further preferably 0.08 eV or less. The delayed fluorescent material that has an energy difference $\Delta E_{st}$ within the range relatively easily undergoes inverse intersystem crossing from the singlet excited state to the triplet excited state, and can make the triplet excitation energy thereof contribute to the light emission efficiently.

The delayed fluorescent material used as the second organic compound is not particularly limited, as far as the compound is capable of emitting delayed fluorescent light, and for example, a compound represented by the following general formula (1) may be preferably used.

General Formula (1)

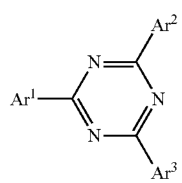

wherein in the general formula (1), $Ar^1$ to $Ar^3$ each independently represent a substituted or unsubstituted aryl group, provided that at least one of $Ar^1$ to $Ar^3$ represents an aryl group substituted with a group represented by the following general formula (2):

General Formula (2)

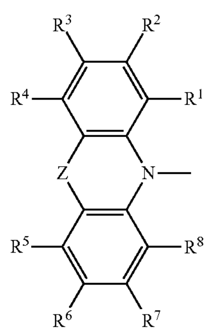

wherein in the general formula (2), $R^1$ to $R^8$ each independently represent a hydrogen atom or a substituent; Z represents O, S, O═C, or $Ar^4$—N; $Ar^4$ represents a substituted or unsubstituted aryl group, in which and $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure.

The aromatic ring constituting the aryl group represented by $Ar^1$ to $Ar^3$ in the general formula (1) may be a monocyclic ring or a condensed ring, and specific examples thereof include a benzene ring, a naphthalene ring, an anthracene ring, and a phenanthrene ring. The aryl group preferably has from 6 to 40 carbon atoms, more preferably from 6 to 20 carbon atoms, and further preferably from 6 to 14 carbon atoms. At least one of $Ar^1$ to $Ar^3$ represents an aryl group substituted with a group represented by the general formula (2). Two of $Ar^1$ to $Ar^3$ each may be an aryl group substituted with a group represented by the general formula (2), and three of them each may be an aryl group substituted with a group represented by the general formula (2). One aryl group may be substituted with two or more groups each represented by the general formula (2). For the descriptions and the preferred ranges of the substituent that is capable of being substituted on the aryl group represented by $Ar^1$ to $Ar^3$, reference may be made to the descriptions and the preferred ranges of the substituent represented by $R^1$ to $R^8$ described later.

In the general formula (2), $R^1$ to $R^8$ each independently represent a hydrogen atom or a substituent. All $R^1$ to $R^8$ may be hydrogen atoms. In the case where two or more thereof are substituents, the substituents may be the same as or different from each other. Examples of the substituent include a hydroxyl group, a halogen atom, a cyano group, an alkyl group having from 1 to 20 carbon atoms, an alkoxy group having from 1 to 20 carbon atoms, an alkylthio group having from 1 to 20 carbon atoms, an alkyl-substituted amino group having from 1 to 20 carbon atoms, an aryl-substituted amino group having from 12 to 40 carbon atoms, an acyl group having from 2 to 20 carbon atoms, an aryl group having from 6 to 40 carbon atoms, a heteroaryl group having from 3 to 40 carbon atoms, a substituted or unsubstituted carbazolyl group having from 12 to 40 carbon atoms, an alkenyl group having from 2 to 10 carbon atoms, an alkynyl group having from 2 to 10 carbon atoms, an alkoxycarbonyl group having from 2 to 10 carbon atoms, an alkylsulfonyl group having from 1 to 10 carbon atoms, a haloalkyl group having from 1 to 10 carbon atoms, an amide group, an alkylamide group having from 2 to 10 carbon atoms, a trialkylsilyl group having from 3 to 20 carbon atoms, a trialkylsilylalkyl group having from 4 to 20 carbon atoms, a trialkylsilylalkenyl group having from 5 to 20 carbon atoms, a trialkylsilylalkynyl group having from 5 to 20 carbon atoms, and a nitro group. In these specific examples, the substituent that is capable of being further substituted with a substituent may be substituted. More preferred examples of the substituent include a halogen atom, a cyano group, a substituted or unsubstituted alkyl group having from 1 to 20 carbon atoms, a substituted or unsubstituted alkoxy group having from 1 to 20 carbon atoms, a substituted or unsubstituted aryl group having from 6 to 40 carbon atoms, a substituted or unsubstituted heteroaryl group having from 3 to 40 carbon atoms, a substituted or unsubstituted dialkylamino group having from 2 to 10 carbon atoms, a substituted or unsubstituted diarylamino group having from 12 to 40 carbon atoms, and a substituted or unsubstituted carbazolyl group having from 12 to 40 carbon atoms. Further preferred examples of the substituent include a fluorine atom, a chlorine atom, a cyano group, a substituted or unsubstituted alkyl group having from 1 to 10 carbon atoms, a substituted or unsubstituted alkoxy group having from 1 to 10 carbon atoms, a substituted or unsubstituted dialkylamino group having from 2 to 10 carbon atoms, a substituted or unsubstituted diarylamino group having from 12 to 40 carbon atoms, a substituted or unsubstituted aryl group having from 6 to 15 carbon atoms, and a substituted or unsubstituted heteroaryl group having from 3 to 12 carbon atoms.

The alkyl group referred in the description herein may be linear, branched or cyclic, and more preferably has from 1 to 6 carbon atoms, and specific examples thereof include a methyl group, an ethyl group, a propyl group, a butyl group, a tert-butyl group, a pentyl group, a hexyl group, and an isopropyl group. The aryl group may be a monocyclic ring or a condensed ring, and specific examples thereof include a phenyl group and a naphthyl group. The alkoxy group may be linear, branched or cyclic, and more preferably has from 1 to 6 carbon atoms, and specific examples thereof include a methoxy group, an ethoxy group, a propoxy group, a butoxy group, a tert-butoxy group, a pentyloxy group, a hexyloxy group, and an isopropoxy group. The two alkyl groups of the dialkylamino group may be the same as or different from each other, and are preferably the same as each other. The two alkyl groups of the dialkylamino group each independently may be linear, branched or cyclic, and more preferably have from 1 to 6 carbon atoms, and specific examples thereof include a methyl group, as ethyl group, a propyl group, a butyl group, a pentyl group, a hexyl group, and an isopropyl group. The two alkyl groups of the dialkylamino group may be bonded to form a cyclic structure along with the nitrogen atom of the amino group. The aryl group that may be used as the substituent may be a monocyclic ring or a fused ring, and specific examples thereof, include a phenyl group and a naphthyl group. The heteroaryl group may be a monocyclic ring or a fused ring, and specific examples thereof include a pyridyl group, a pyridazyl group, a pyrimidyl group, a triazinyl group, a triazolyl group, and a benzotriazolyl group. The heteroaryl group may be a group that is bonded through the hetero atom or a group that is bonded through the carbon atom constituting the heteroaryl ring. Two aryl groups of the diarylamino group each may be a monocyclic ring or a fused ring, and specific examples thereof include a phenyl group and a naphthyl group. Two aryl groups of the diarylamino group may be bonded to each other to form a cyclic structure along with the nitrogen atom of the amino group, and examples thereof include a 9-carbazolyl group.

In the general formula (2), $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure. The cyclic structure may be an aromatic ring or an aliphatic ring, and may contain a heteroatom. The hetero atom, referred herein is preferably selected from a group consisting of a nitrogen atom, an oxygen atom, and a sulfur atom. Examples of the cyclic structure formed include a benzene ring, a naphthalene ring, a pyridine ring, a pyridazine ring, a pyrimidine ring, a pyrazine ring, a pyrrole ring, an imidazole ring, a pyrazole ring, a triazole ring, an imidazoline ring, an oxazole ring, an isoxazole ring, a thiazole ring, an isothiazole ring, a cyclohexadiene ring, a cyclohexene ring, a cyclopentene ring, a cycloheptatriene ring, a cycloheptadiene ring, and a cycloheptene ring.

In the general formula (2), Z represents O, S, O═C, or $Ar^4$—N, and $Ar^4$ represents a substituted or unsubstituted aryl group. The aromatic ring constituting the aryl group represented by $Ar^4$ may be a monocyclic ring or a condensed ring, and specific examples thereof include a benzene ring, a naphthalene ring, an anthracene ring, and a phenanthrene ring. The aryl group preferably has from 6 to 40 carbon atoms, more preferably from 6 to 20 carbon atoms, and further preferably from 6 to 14 carbon atoms. For the descriptions and the preferred ranges of the substituent that is capable of being substituted on the aryl group represented by $Ar^4$, reference may be made to the descriptions and the preferred ranges of the substituent that may be represented by $R^1$ to $R^8$.

The group represented by the general formula (2) is preferably a group represented by the following general formula (3), a group represented by the following general formula (4), or a group represented by the following general formula (5).

General Formula (3)

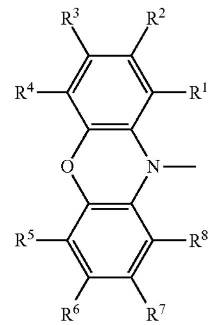

General Formula (4)

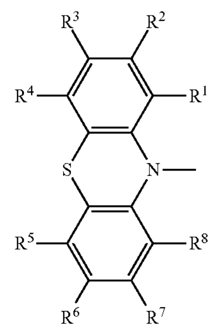

General Formula (5)

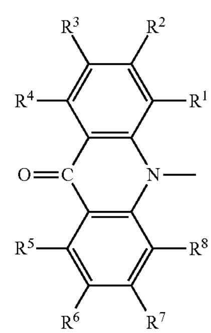

In the general formulae (3) to (5), $R^1$ to $R^8$ each independently represent a hydrogen atom or a substituent. For the descriptions and the preferred ranges of $R^1$ to $R^8$, reference may be made to the corresponding descriptions in the general formula (2). $R^1$ and $R^2$, $R^2$ and $R^3$, $R^3$ and $R^4$, $R^5$ and $R^6$, $R^6$ and $R^7$, and $R^7$ and $R^8$ may be bonded to each other to form a cyclic structure.

In the general formula (2), in the case where Z represents $Ar^4$—N, the compound represented by the general formula (1) particularly encompasses the structure represented by the following general formula (6):

General Formula (6)

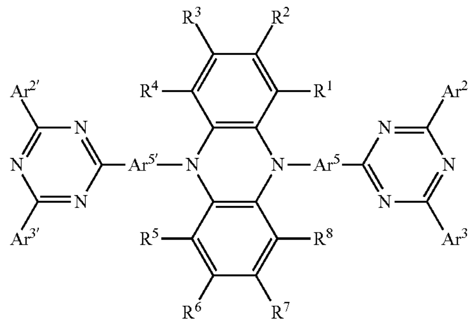

In the general formula (6), $Ar^2$, $Ar^3$, $Ar^{2'}$, and $Ar^{3'}$ each independently represent a substituted or unsubstituted aryl group; $Ar^5$ and $Ar^{5'}$ each independently represent a substituted or unsubstituted arylene group; and R1 to R8 each independently represent a hydrogen atom or a substituent, in which $R^1$ and $R^2$, $R^2$ and $R^3$, $R^3$ and $R^4$, $R^5$ and $R^6$, $R^6$ and $R^7$, and $R^7$ and $R^8$ may be bonded to each other to form a cyclic structure.

For the descriptions and the preferred ranges of $Ar^2$, $Ar^3$, $Ar^{2'}$, and $Ar^{3'}$ in the general formula (6), reference may be made to the descriptions and the preferred ranges of $Ar^1$ to $Ar^3$ in the general formula (1). The aromatic ring constituting the arylene group represented by $Ar^5$ and $Ar^{5'}$ in the general formula (6) may be a monocyclic ring or a condensed ring, and specific examples thereof include a benzene ring, a naphthalene ring, an anthracene ring, and a phenanthrene ring. The arylene group preferably has from 6 to 40 carbon atoms, more preferably from 6 to 20 carbon atoms, and further preferably from 6 to 14 carbon atoms. For the descriptions and the preferred ranges of $R^1$ to $R^8$ in the general formula (6), reference may be made to the descriptions and the preferred ranges of $R^1$ to $R^8$ in the general formula (2).

In the compound represented by the general formula (6), the compound, in which $Ar^2$ and $Ar^{2'}$ are the same as each other, $Ar^3$ and $Ar^{3'}$ are the same as each other, and $Ar^5$ and $Ar^{5'}$ are the same as each other, has such an advantage that the compound may be easily synthesized.

The compound represented by the general formula (1) preferably has a structure represented by the following general formula (7):

General Formula (7)

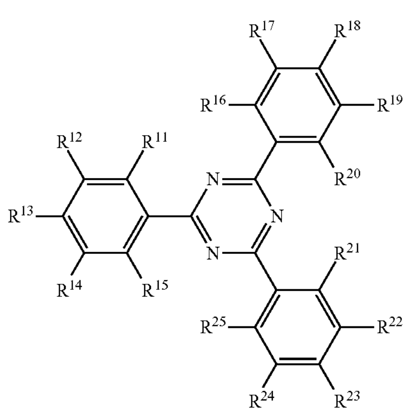

In the general formula (7), at least one of $R^{11}$ to $R^{25}$ represents a group represented by the general formula (2); and the other thereof each independently represent a hydrogen atom or a substituent other than a substituent represented by the general formula (2).

In the general formula (7), at least one of $R^{11}$ to $R^{25}$ represents a group represented by the general formula (2), and the number of the substituent represented by the general formula (2) is preferably from 1 to 9, and more preferably from 1 to 6, among $R^{11}$ to $R^{25}$. For example, the number of the substituent may be selected from a range of from 1 to 3. The group represented by the general formula (2) may be bonded to each of the three benzene rings bonded to the 1,3,5-triazine ring, or may be only one or two benzene rings. Preferred examples thereof include a case where the three benzene rings each have from 0 to 3 of the substituent represented by the general formula (2), and more preferred examples thereof include a case where the three benzene rings each have from 0 to 2 of the substituent represented by the general formula (2). For example, a case where the three benzene rings each have 0 or 1 of the substituent represented by the general formula (2) may be selected.

The substitution position of the group represented by the general formula (2) may be any one of $R^{11}$ to $R^{25}$, and the substitution position is preferably selected from $R^{12}$ to $R^{14}$, $R^{17}$ to $R^{19}$, and $R^{22}$ to $R^{24}$. Examples thereof include a case where from 0 to 2 of $R^{12}$ to $R^{14}$, from 0 to 2 of $R^{17}$ to $R^{19}$, and from 0 to 2 of $R^{22}$ to $R^{24}$ each represent the substituent represented by the general formula (2), and a case where 0 or 1 of $R^{12}$ to $R^{14}$, 0 or 1 of $R^{17}$ to $R^{19}$, and 0 or 1 of $R^{22}$ to $R^{24}$ each represent the substituent represented by the general formula (2).

In the case where any one of $R^{11}$ to $R^{25}$ is substituted by the substituent represented by the general formula (2), the substitution position thereof is preferably $R^{12}$ or $R^{13}$. In the case where any two of $R^{11}$ to $R^{25}$ are substituted by the substituent represented by the general formula (2), the substitution positions thereof are preferably $R^{12}$ and $R^{14}$, or any one of $R^{12}$ and $R^{13}$ and any one of $R^{17}$ and $R^{18}$. In the case where any three of $R^{11}$ to $R^{25}$ are substituted by the substituent represented by the general formula (2), the substitution positions thereof are preferably $R^{12}$, $R^{14}$, and any one of $R^{17}$ and $R^{18}$, or any one of $R^{12}$ and $R^{13}$, any one of $R^{17}$ and $R^{18}$, and any one of $R^{22}$ and $R^{23}$.

Among $R^{11}$ to $R^{25}$, ones that do not represent the substituent represented by the general formula (2) each independently represent a hydrogen atom or a substituent other than a substituent represented by the general formula (2), and may be all hydrogen atoms. In the case where two or more of them are the substituents, the substituents may be different from each other. For the descriptions and the preferred ranges of the substituent that may be represented by $R^{11}$ to $R^{25}$, reference may be made to the descriptions and the preferred ranges of the substituent that may be represented by $R^1$ to $R^8$.

In the general formula (7), $R^{11}$ and $R^{12}$, $R^{12}$ and $R^{13}$, $R^{13}$ and $R^{14}$, $R^{14}$ and $R^{15}$, $R^{16}$ and $R^{17}$, $R^{17}$ and $R^{18}$, $R^{18}$ and $R^{19}$, $R^{19}$ and $R^{20}$, $R^{21}$ and $R^{22}$, $R^{22}$ and $R^{23}$, $R^{23}$ and $R^{24}$, and $R^{24}$ and $R^{25}$ each may be bonded to each other to form a cyclic structure. For the descriptions and the preferred ranges of the cyclic structure, reference may be made to the corresponding descriptions in the general formula (2).

The group represented by the general formula (2) contained in the general formula (7) is preferably a group having a structure represented by the general formula (3), a group having a structure represented by the general formula (4), or a group having a structure represented by the general formula (5).

The compound represented by the general formula (7) preferably has a symmetric molecular structure. For example, the compound preferably has a rotation symmetric structure with the center of the triazine ring as the axis. In this case, in the general formula (7), $R^{11}$, $R^{16}$, and $R^{21}$ are the same as each other, $R^{12}$, $R^{17}$, and $R^{22}$ are the same as each other, $R^{13}$, $R^{18}$, and $R^{23}$ are the same as each other, $R^{14}$, $R^{19}$, and $R^{24}$ are the same as each other, and $R^{15}$, $R^{20}$, and $R^{25}$ are the same as each other. Examples of the compound in this case include the compound; in which $R^{13}$, $R^{18}$ and $R^{23}$ are the groups represented by the general formula (2), and the others are hydrogen atoms.

In the general formula (2), in the case where Z represent $Ar^4$—N, the compound represented by the general formula (7) particularly encompasses the structure represented by the following general formula (8):

General Formula (8)

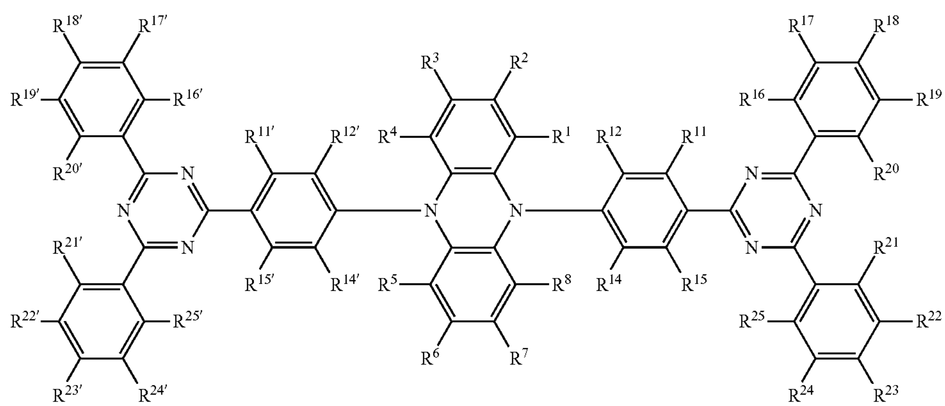

In the general formula (8), $R^1$ to $R^8$, $R^{11}$, $R^{12}$, $R^{14}$ to $R^{25}$, $R^{11'}$, $R^{12'}$, and $R^{14'}$ to $R^{25'}$ each independently represent a hydrogen atom or a substituent. For the descriptions and the preferred ranges of $R^1$ to $R^8$ in the general formula (8), reference may be made to the descriptions and the preferred ranges of $R^1$ to $R^8$ in the general formula (2). For the descriptions and the preferred ranges of $R^{11}$, $R^{12}$, $R^{14}$ to $R^{25}$, $R^{11'}$, $R^{12'}$, and $R^{14'}$ to $R^{25'}$ in the general formula (8), reference may be made to the descriptions and the preferred ranges of $R^{11}$ to $R^{25}$ in the general formula (7). In the general formula (8), $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{14}$ and $R^{15}$, $R^{16}$ and $R^{17}$, $R^{17}$ and $R^{18}$, $R^{18}$ and $R^{19}$, $R^{19}$ and $R^{20}$, $R^{21}$ and $R^{22}$, $R^{22}$ and $R^{23}$, $R^{23}$ and $R^{24}$, $R^{24}$ and $R^{25}$, $R^{11'}$ and $R^{12'}$, $R^{14'}$ and $R^{15'}$, $R^{16'}$ and $R^{17'}$, $R^{17'}$ and $R^{18'}$, $R^{18'}$ and $R^{19'}$, $R^{19'}$ and $R^{20'}$, $R^{21'}$ and $R^{22'}$, $R^{22'}$ and $R^{23'}$, $R^{23'}$ and $R^{24'}$, and $\$^{24'}$ and $R^{25'}$ each may be bonded to each other to form a cyclic structure. For the descriptions and the preferred ranges of the cyclic structure, reference may be made to the corresponding descriptions in the general formula (2).

Specific examples of the compound represented by the general formula (1) shown below. However, the compound represented by the general formula (1) capable of being used in the invention is not construed as being limited to the specific examples.

Compound 1

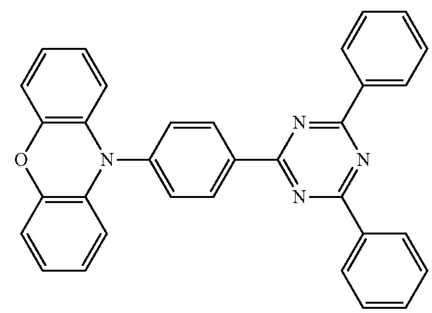

-continued

Compound 2

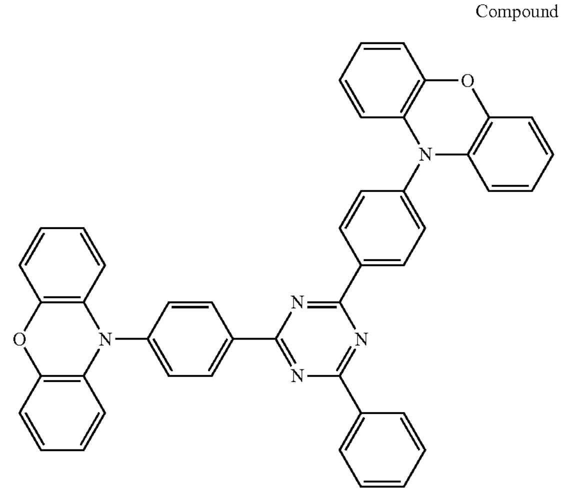

Compound 3
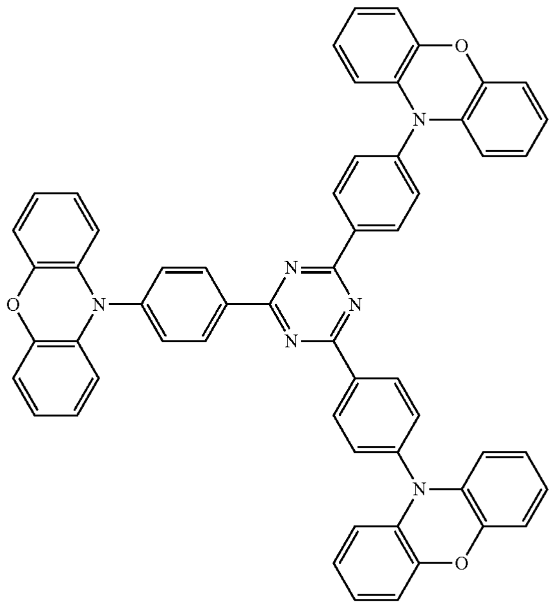
Compound 4
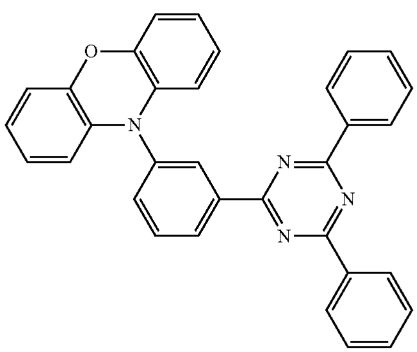
Compound 5
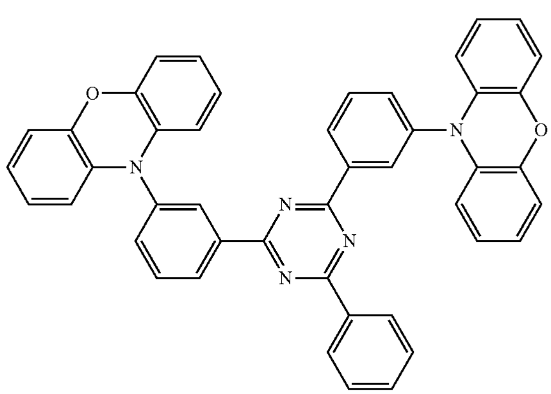
Compound 6
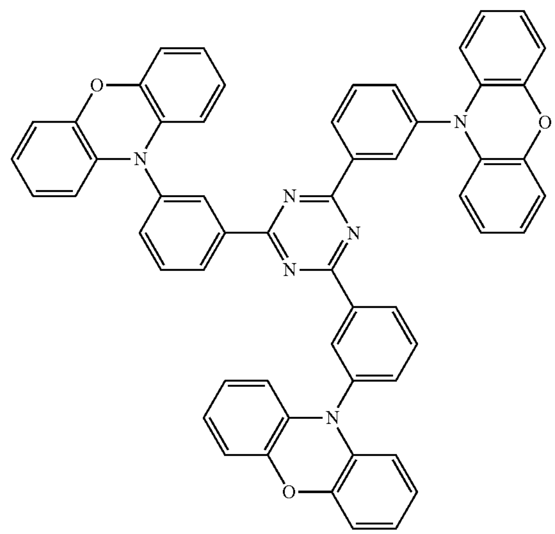
Compound 7
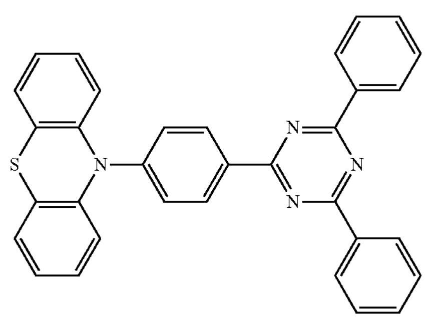
Compound 8
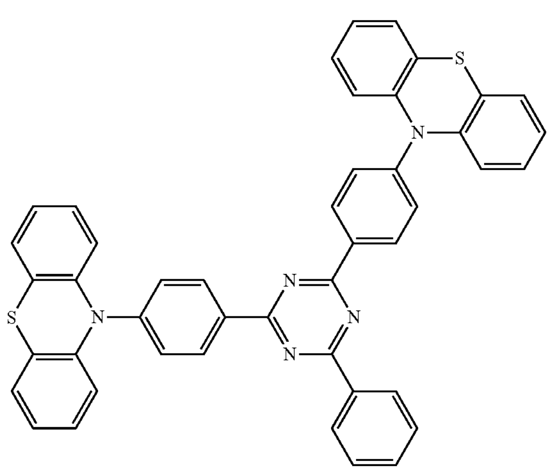

-continued
Compound 9
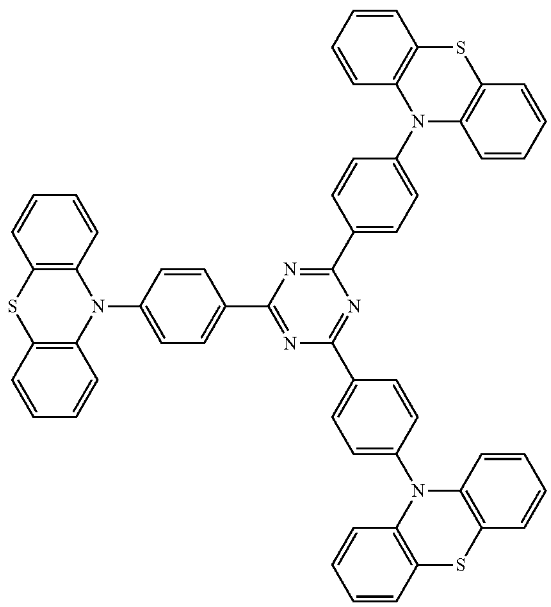
Compound 10
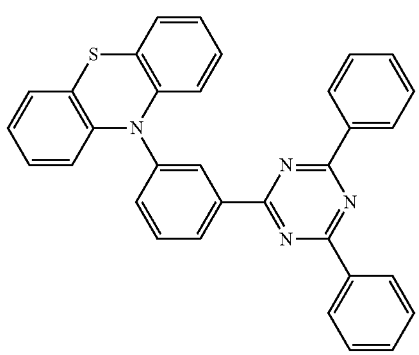
Compound 11
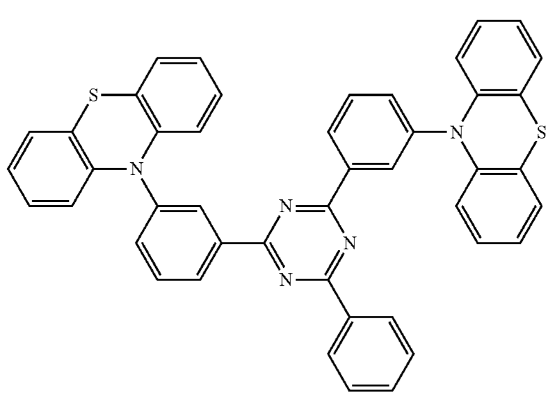
-continued
Compound 12
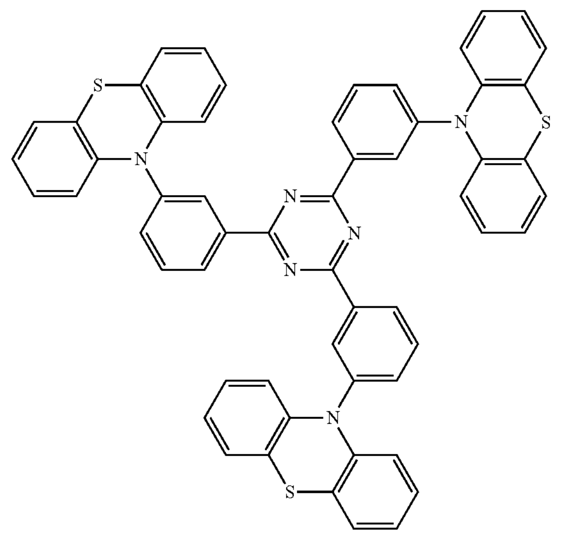
Compound 13
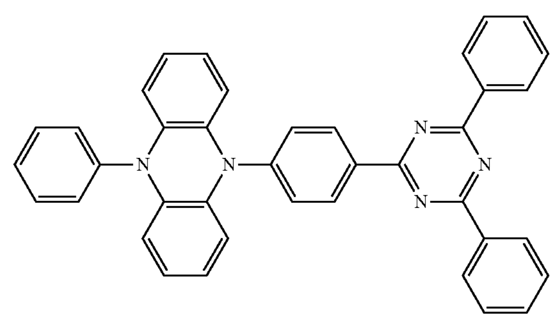
Compound 14
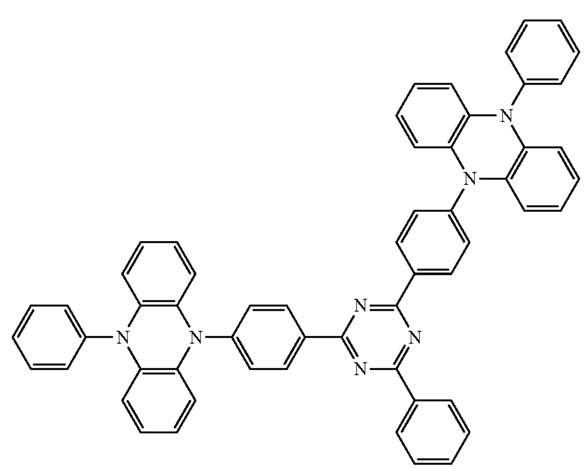

Compound 15
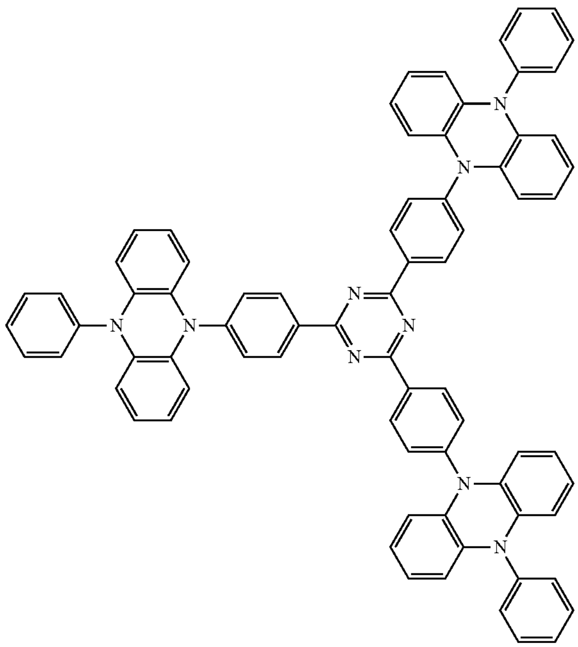
Compound 16
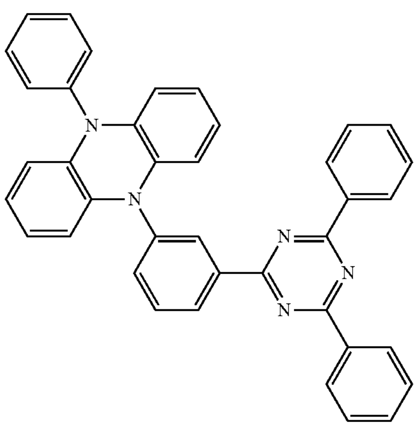
Compound 17
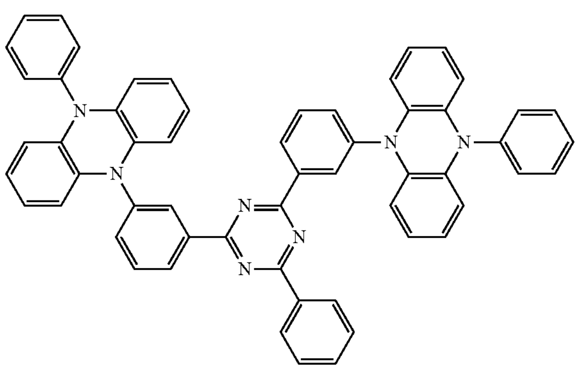
Compoun18
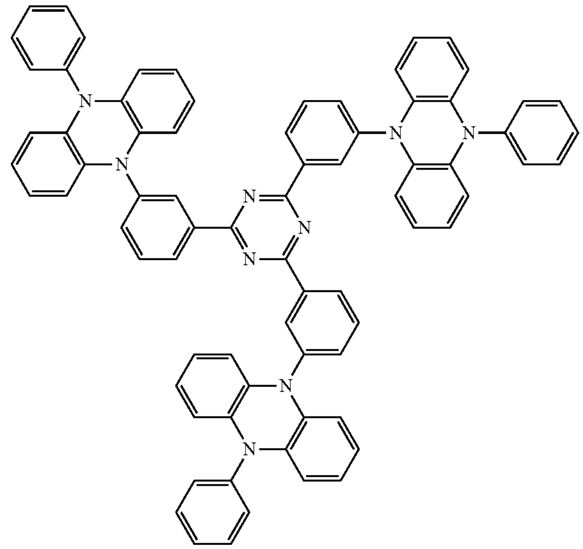
Compound 19
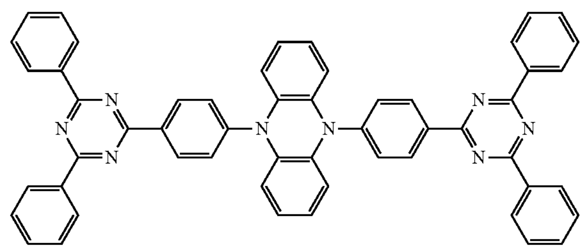
Compound 20
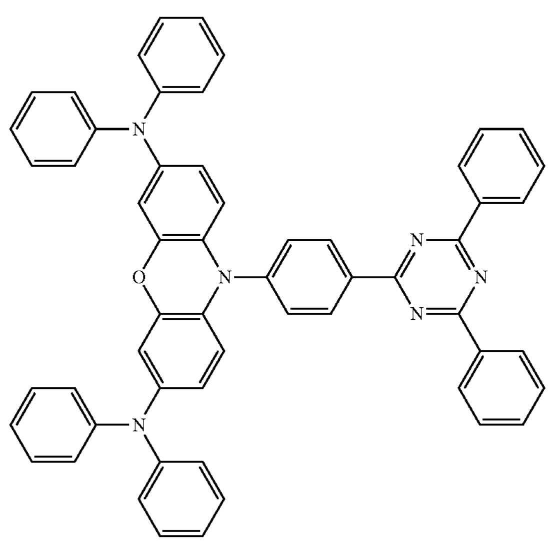

-continued
Compound 21
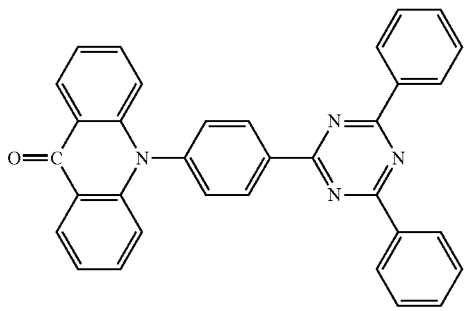
Compound 22
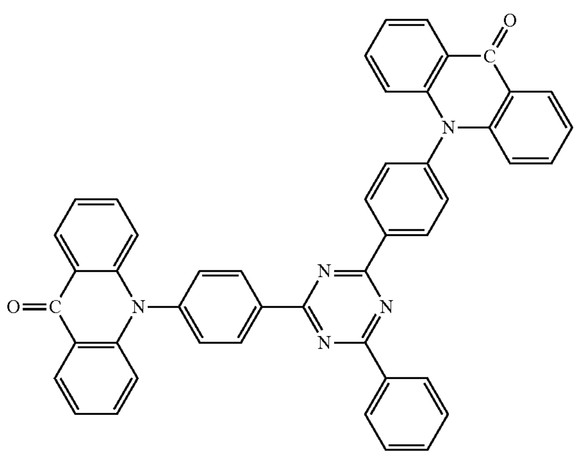
Compound 23
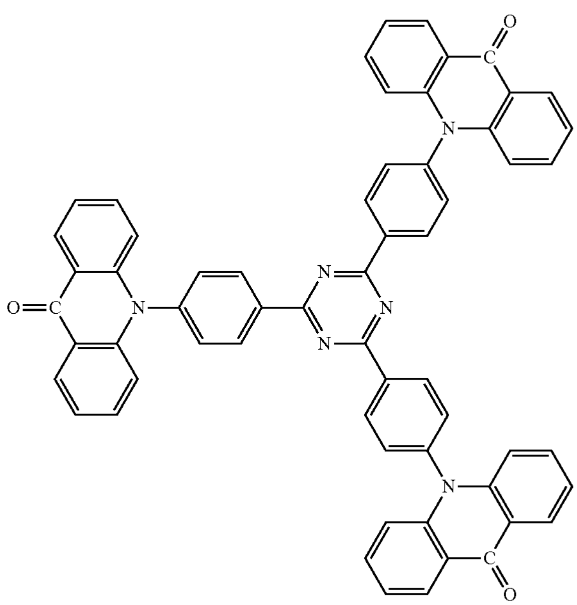
-continued
Compound 24
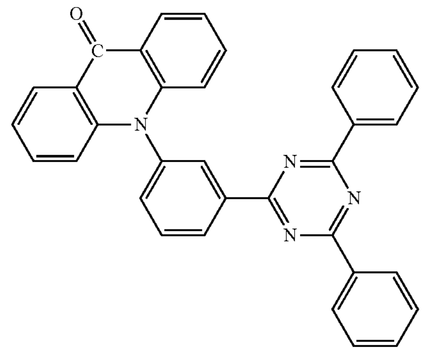
Compound 25
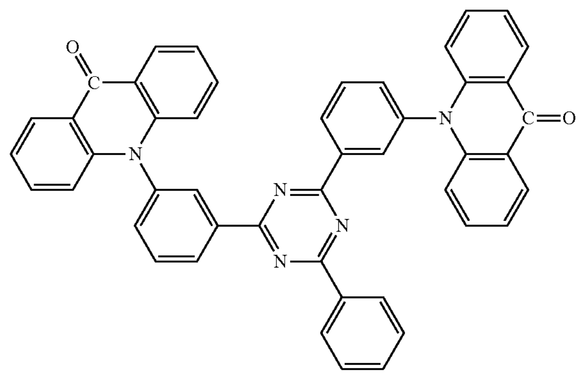
Compound 26
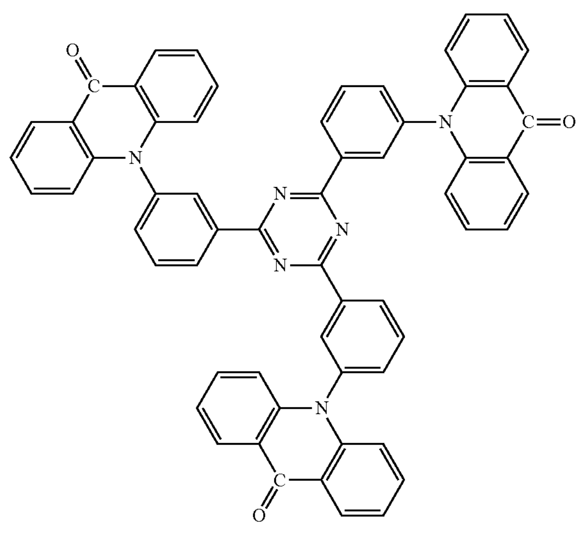
A compound represented by the following general formula (9) may be preferably used as the delayed fluorescent material used as the second organic compound.

General Formula (9)

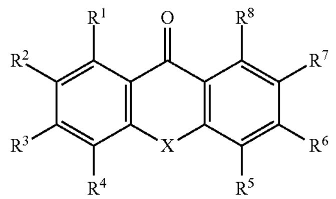

In the general formula (9), X represents an oxygen atom, a sulfur atom, or a nitrogen atom (in which a hydrogen atom or a substituent is bonded to the nitrogen atom, and the substituent is preferably an alkyl group having from 1 to 10 carton atoms or an aryl group having from 6 to 14 aryl group); and $R^1$ to $R^8$ each independently represent a hydrogen atom or a substituent, provided that at least one of $R^1$ to $R^8$ each independently represent a group represented by any one of the general formulae (10) to (14). X may be an oxygen atom or a sulfur atom, and is preferably an oxygen atom.

The number of the group represented by any one of the general formulae (10) to (14) among $R^1$ to $R^8$ may be only 1 or 2 or more, and is preferably from 1 to 4, and more preferably 1 or 2. In the case where plural groups each represented by any one of the general formulas (10) to (14) are present in the general formula (9), the groups may be the same as or different from each other.

In the case where only one of $R^1$ to $R^8$ is the group represented by any one of the general formulae (10) to (14), $R^2$ or $R^3$ is preferably the group represented by any one of the general formulae (10) to (14), and $R^3$ is more preferably the group represented by any one of the general formulae (10) to (14).

In the case where two or more of $R^1$ to $R^8$ each are the group represented by any one of the general formulae (10) to (14), at least one of $R^1$ to $R^4$ and at least one of $R^5$ to $R^8$ each are preferably the group represented by any one of the general formulae (10) to (14). In this case, the groups represented by any one of the general formulae (10) to (14) are preferably from 1 to 3 of $R^1$ to $R^4$ and from 1 to 3 of $R^5$ to $R^8$, and more preferably 1 or 2 of $R^1$ to $R^4$ and 1 or 2 of $R^5$ to $R^8$. The number of the group represented by any one of the general formulae (10) to (14) among $R^1$ to $R^4$ and the number of the group represented by any one of the general formulae (10) to (14) among $R^5$ to $R^6$ may be the same as or different from each other, and are preferably the same as each other. In $R^1$ to $R^4$, it is preferred that at least one of $R^2$ to $R^4$ is the group represented by any one of the general formulae (10) to (14), and it is more preferred that at least $R^3$ is the group represented by any one of the general formulae (10) to (14). In $R^5$ to $R^8$, it is preferred that at least one of $R^5$ to $R^7$ is the group represented by any one of the general formulae (10) to (14), and it is more preferred that at least $R^6$ is the group represented by any one of the general formulae (10) to (14). Preferred examples of the compound include the compound represented by the general formula (9), in which $R^3$ and $R^6$ each represent the group represented by any one of the general formulae (10) to (14), the compound represented by the general formula (9), in which $R^2$ and $R^7$ each represent the group represented by any one of the general formulae (10) to (14), and the compound represented by the general formula (9), in which $R^2$, $R^3$, $R^6$ and $R^7$ each represent the group represented by any one of the general formulae (10) to (14), and more preferred examples of the compound include the compound represented by the general formula (9), in which $R^3$ and $R^6$ each represent the group represented by any one of the general formulae (10) to (14). The plural groups each represented by any one of the general formulae (10) to (14) present in the general formula (9) may be the same as or different, from each other, and are preferably the same as each other. The compound represented by the general formula (9) preferably has a symmetric structure. Specifically, $R^1$ and $R^8$, $R^2$ and $R^7$, $R^3$ and $R^6$, and $R^4$ and $R^5$ each are preferably the same as each other.

In the compound represented by the general formula (9), both $R^3$ and $R^6$ are preferably the groups represented by any one of the general formulae (10) to (14). Preferred examples of the compound include a compound represented by the general formula (9), in which at least one of $R^3$ and $R^6$ is the groups represented by any one of the general formulae (10) to (14).

General Formula (10)

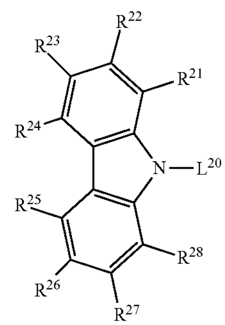

General Formula (11)

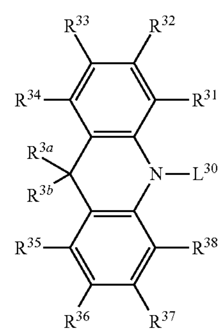

General Formula (12)

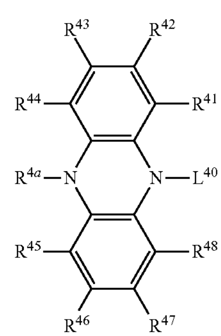

-continued

General Formula (13)

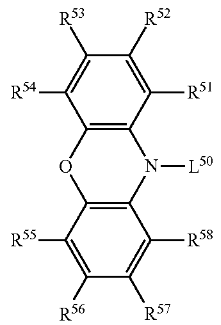

General Formula (14)

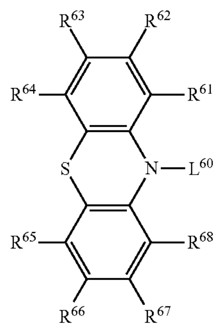

In the general formulae (10) to (14), $L^{20}$, $L^{30}$, $L^{40}$, $L^{50}$ and $L^{60}$ each independently represent a single bond or a divalent linking group; and $R^{21}$ to $R^{28}$, $R^{31}$ to $R^{38}$, $R^{3a}$, $R^{3b}$, $R^{41}$ to $R^{48}$, $R^{4a}$, $R^{51}$ to $R^{58}$, and $R^{63}$ to $R^{68}$ each independently represent a hydrogen atom or a substituent.

$L^{20}$, $L^{30}$, $L^{40}$, $L^{50}$ and $L^{60}$ each may represent a single bond or a divalent linking group, and preferably represent a single bond. In the case where at least one of $R^1$ to $R^8$ in the general formula (9) each represent the group represented by any one of the general formulae (10) to (14), wherein $L^{20}$, $L^{30}$, $L^{40}$, $L^{50}$ and $L^{60}$ each represent a linking group, the number of the linking group present in the general formula (9) may be only 1 or may be 2 or more. In the case where the general formula (9) contains plural linking groups, the linking groups may be the same as or different from each other. Examples of the divalent linking group that may be represented by $L^{20}$, $L^{30}$, $L^{40}$, $L^{50}$ and $L^{60}$ include an alkenylene group, an alkynylene group, an arylene group, a thiophendiyl group, and a linking group formed of a combination of these groups. The alkylene group and the alkenylene group each preferably have from 2 to 10 carbon atoms, more preferably from 2 to 6 carbon atoms, and further preferably from 2 to 4 carbon atoms. The arylene group preferably has from 6 to 10 carbon atoms, and more preferably 6 carbon atoms, and a p-phenylene group is further preferred. Examples of the thiophendiyl group include a 3,4-thiophendiyl group and 2,5-thiophendiyl group. Preferred examples of the linking group include a linking group represented by the general formula $-(CR^a{=}CR^b)_n-$. In the general formula, $R^a$ and $R^b$ each independently represent a hydrogen atom or an alkyl group. The alkyl group preferably has from 1 to 6 carbon atoms, and more preferably from 1 to 3 carbon atoms. n is preferably from 1 to 5, more preferably from 1 to 3, and further preferably 1 or 2. Examples thereof include $-CH{=}CH-$ and $-(CH{=}CH)_2-$.

The number of a substituent in the general formulae (10) to (14) is not particularly limited. In each of the general formulae (10) to (14), all $R^{21}$ to $R^{28}$, $R^{31}$ to $R^{38}$, $R^{3a}$, $R^{3b}R^{41}$ to $R^{48}$, $R^{4a}$, $R^{51}$ to $R^{58}$, and $R^{61}$ to $R^{68}$ each may be unsubstituted (i.e., a hydrogen atom), it is preferred that at least one of $R^{21}$ to $R^{28}$, $R^{31}$ to $R^{38}$, $R^{41}$ to $R^{48}$, $R^{51}$ to $R^{58}$, and $R^{61}$ to $R^{68}$ each represent a substituent, and it is more preferred that at least one of $R^{23}$, $R^{26}$, $R^{33}$, $R^{36}$, $R^{43}$, $R^{46}$, $R^{53}$, $R^{56}$, $R^{63}$ and $R^{66}$ each represents a substituent. In the case where the general formulae (10) to (14) contain plural substituents, the substituents may be the same as or different from each other.

Examples of the substituent that may be represented by $R^{21}$ to $R^{28}$, $R^{31}$ to $R^{38}$, $R^{3a}$, $R^{3b}$, $R^{41}$ to $R^{48}$, $R^{4a}$, $R^{51}$ to $R^{58}$, and $R^{61}$ to $R^{68}$ and the substituent that may be represented by $R^1$ to $R^8$ include a hydroxyl group, a halogen atom, a cyano group, an alkyl group having from 1 to 20 carbon atoms, an alkoxy group having from 1 to 20 carbon atoms, an alkylthio group having from 1 to 20 carbon atoms, an alkyl-substituted amino group having from 1 to 26 carbon atoms, an acyl group having from 2 to 20 carbon atoms, an aryl group having from 6 to 40 carbon atoms, a heteroaryl group having from 3 to 40 carbon atoms, an alkenyl group having from 2 to 10 carbon atoms, an alkynyl group having from 2 to 10 carbon atoms, an alkoxycarbonyl group having from 2 to 10 carbon atoms, an alkylsulfonyl group having from 1 to 10 carbon atoms, a haloalkyl group having from 1 to 10 carbon atoms, an amide group, an alkylamide group having from 2 to 10 carbon atoms, a trialkylsilyl group having from 3 to 20 carbon atoms, a trialkylsilylalkyl group having from 4 to 20 carbon atoms, a trialkylsilylalkenyl group having from 5 to 20 carbon atoms, a trialkylsilylalkynyl group having from 5 to 20 carbon atoms, and a nitro group. In these specific examples, the substituent that is capable of being further substituted with a substituent may be substituted. More preferred examples of the substituent include a halogen atom, a cyano group, a substituted or unsubstituted alkyl group having from 1 to 20 carbon atoms, an alkoxy group, having from 1 to 20 carbon atoms, a substituted or unsubstituted aryl group having from 6 to 40 carbon atoms, a substituted or unsubstituted heteroaryl group having from 3 to 40 carbon atoms, and a dialkyl-substituted amino group having from 1 to 20 carbon atoms. Further preferred examples of the substituent include a fluorine atom, a chlorine atom, a cyano group, a substituted or unsubstituted alkyl group having from 1 to 10 carbon atoms, a substituted or unsubstituted alkoxy group having from 1 to 10 carbon atoms, a substituted or unsubstituted aryl group having from 6 to 15 carbon atoms, and a substituted or unsubstituted heteroaryl group having from 3 to 12 carbon atoms.

At least one of $R^{23}$, $R^{26}$, $R^{33}$, $R^{36}$, $R^{43}$, $R^{46}$, $R^{53}$, $R^{56}$, $R^{63}$ and $R^{66}$ each preferably independently represent the group represented by any one of the general formulae (10) to (14).

$R^1$ and $R^2$, $R^2$ and $R^3$, $R^3$ and $R^4$, $R^5$ and $R^6$, $R^6$ and $R^7$, and $R^7$ and $R^8$, $R^{21}$ and $R^{22}$, $R^{22}$ and $R^{23}$, $R^{23}$ and $R^{24}$, $R^{24}$ and $R^{25}$, $R^{25}$ and $R^{26}$, $R^{26}$ and $R^{27}$, $R^{27}$ and $R^{28}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{3a}$ and $R^{3b}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{65}$ and $R^{66}$, $R^{66}$ and $R^{67}$, and $R^{67}$ and $R^{68}$ each may be bonded to each other to form a cyclic structure. The cyclic structure may be an aromatic ring or an aliphatic ring, and may contain a hetero atom, and the cyclic structure may be a condensed ring containing two or more rings. The hetero atom referred herein is preferably selected from the group consisting of a nitrogen atom, an oxygen atom and a sulfur atom. Examples of the cyclic structure formed include a benzene ring, a naphthalene ring, a pyridine ring, a pyridazine ring, a pyrimidine ring, a pyrazine ring, a pyrrole ring, an imidazole ring, a pyrazole ring, a triazole ring, an imadazoline ring, an oxazole ring, an isoxazole ring, a thiazole ring, an isothiazole ring, a cyclohexadiene ring, a cyclohexene ring, a cyclopentene ring, a cycloheptatriene ring, a cycloheptadiene ring, and a cycloheptene ring.

Specific examples of the compound represented by the general formula (9) shown below. However, the compound represented by the general formula (9) capable of being used in the invention is not construed as being limited to the specific examples.

Compound 101

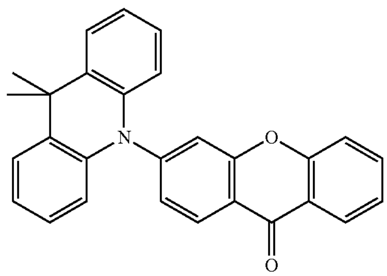

Compound 102

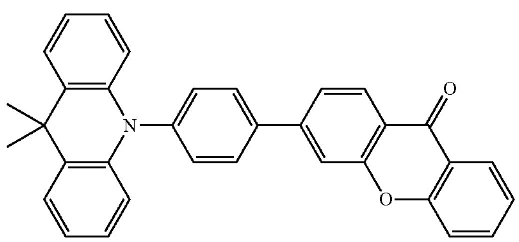

Compound 103

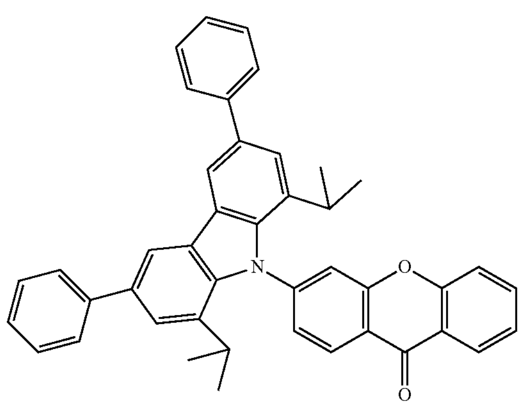

Compound 104

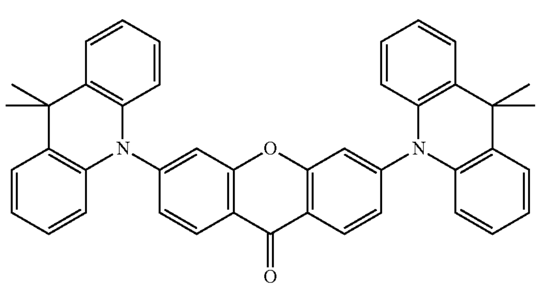

-continued

Compound 105

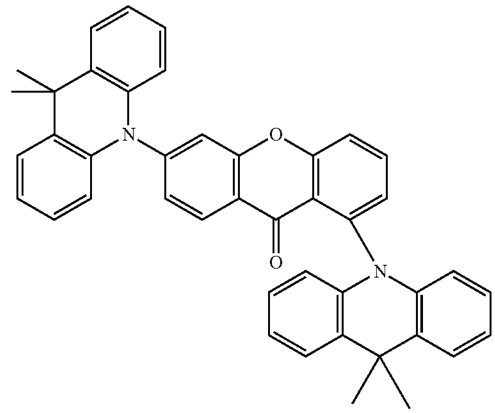

Compound 106

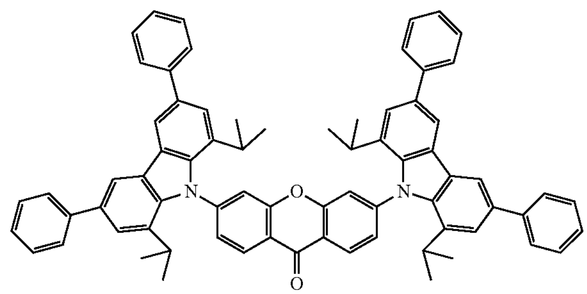

Compound 107

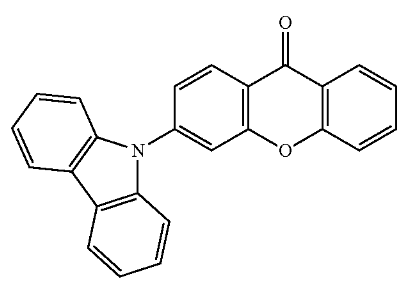

Compound 108

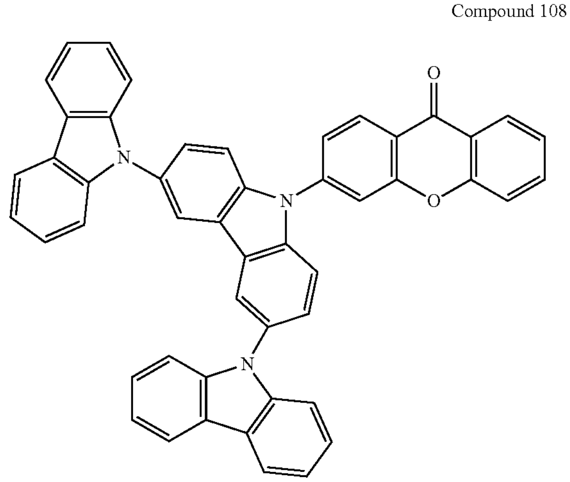

-continued
Compound 109
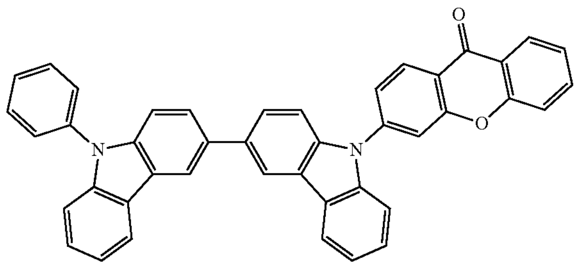
Compound 110
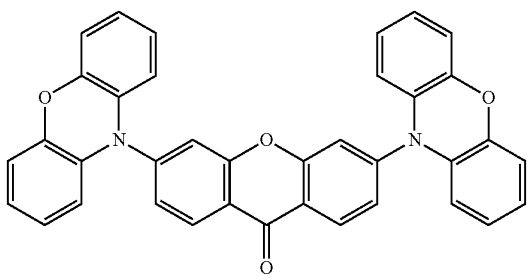
Compound 111
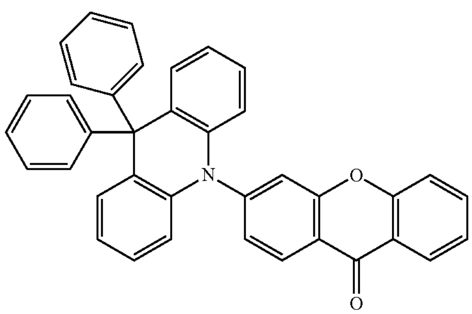
Compound 112
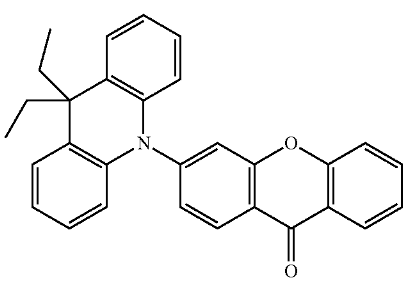
Compound 113
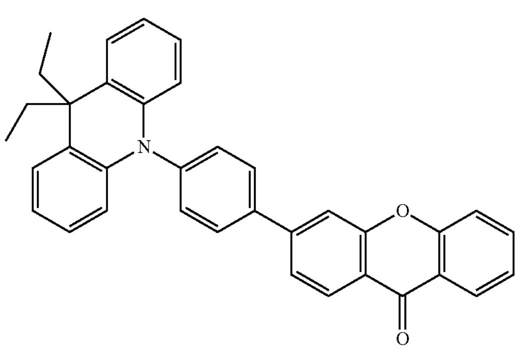
-continued
Compound 114
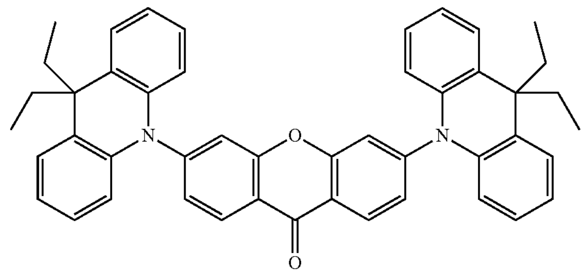
Compound 115
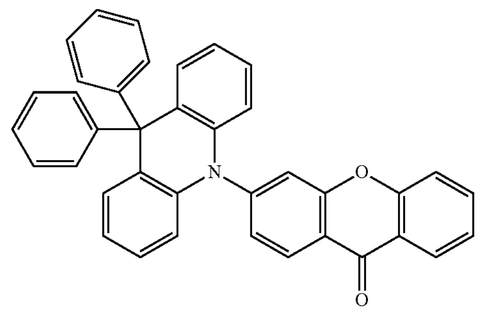
Compound 116
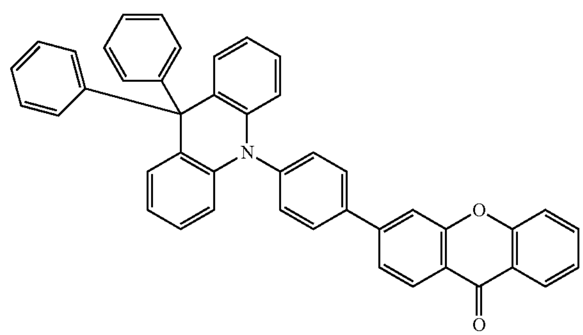
Compound 117
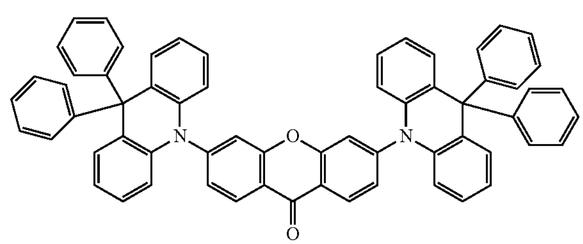
Compound 118
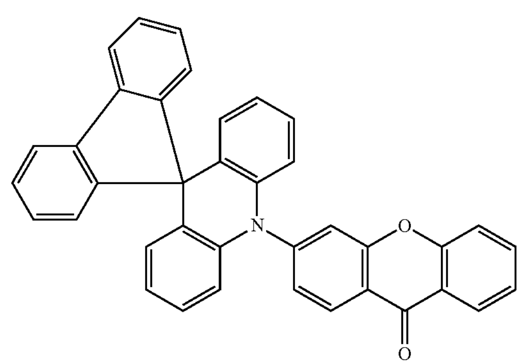

Compound 119
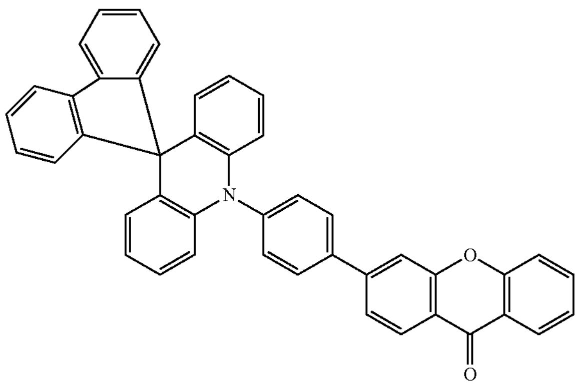
Compound 120
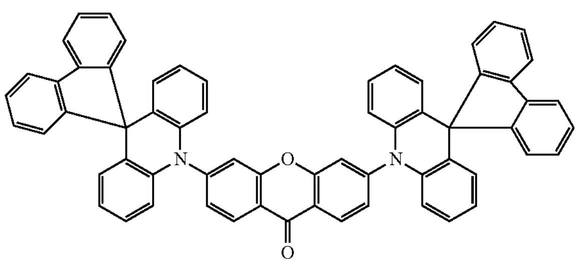
Compound 121
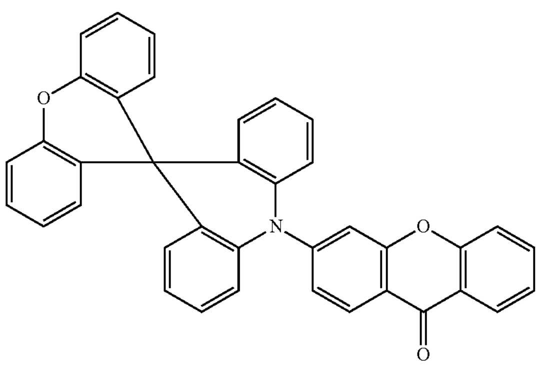
Compound 122
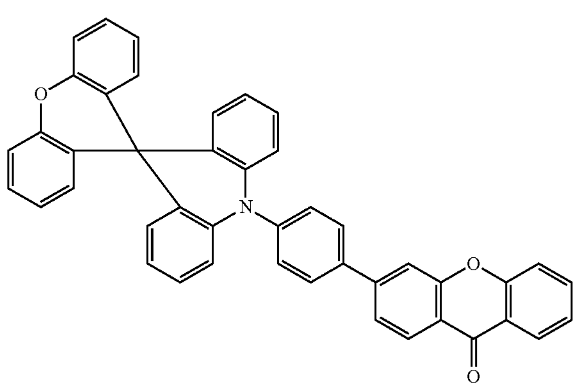
Compound 123
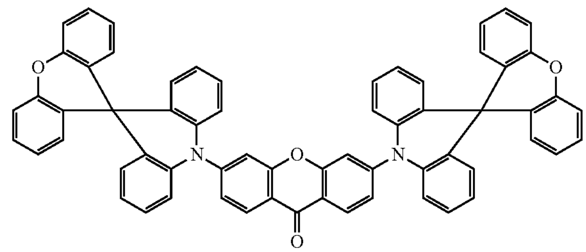
Compound 124
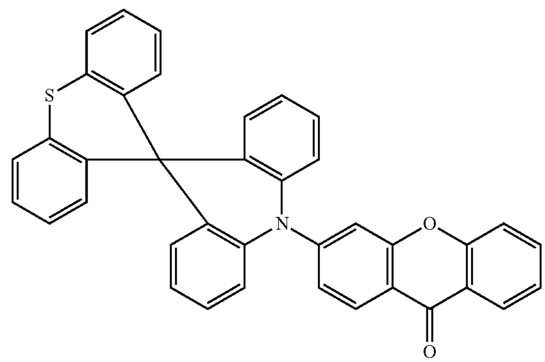
Compound 125
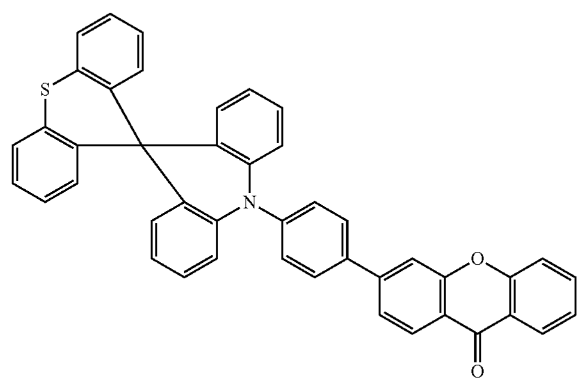
Compound 126
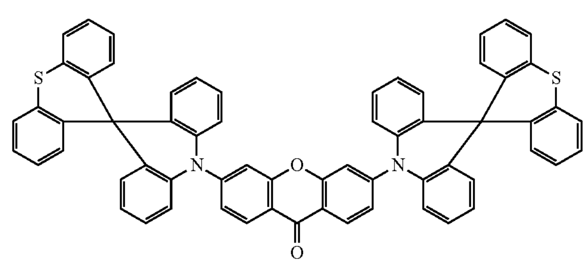

Compound 127
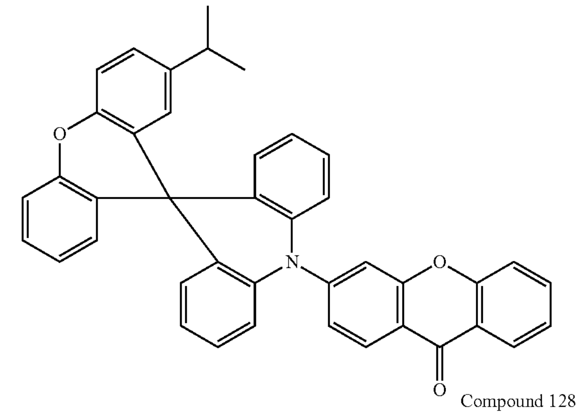
Compound 128
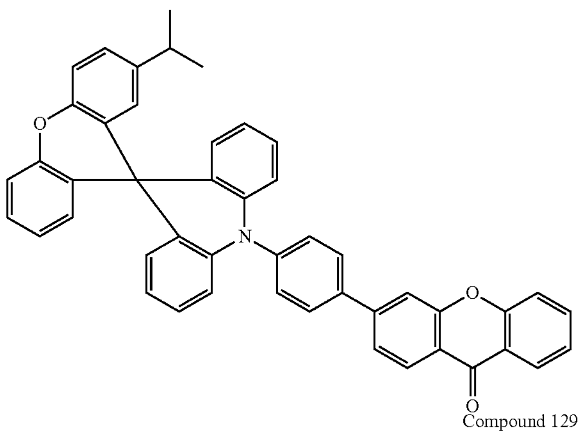
Compound 129
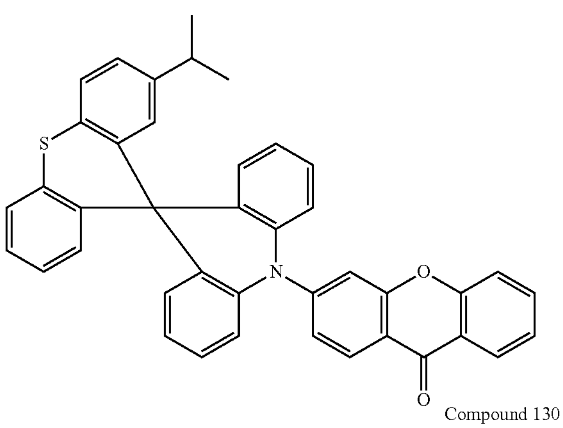
Compound 130
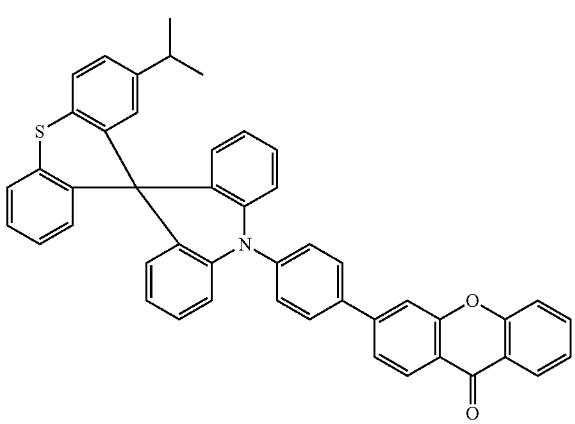
Compound 131
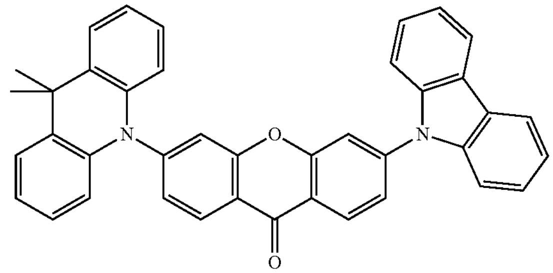
Compound 132
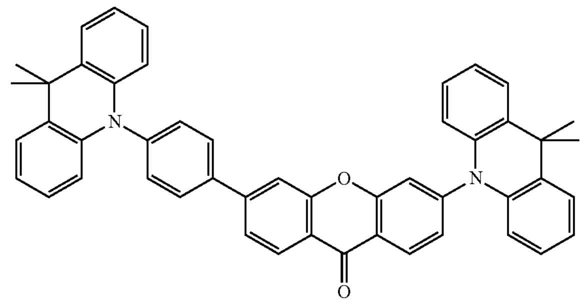
Compound 133
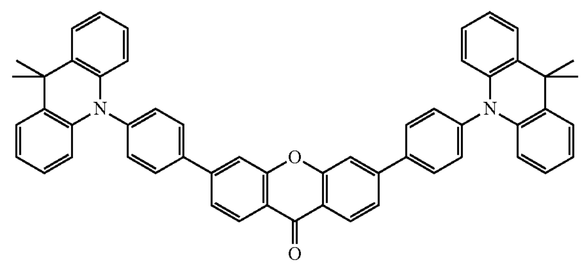
Compound 134
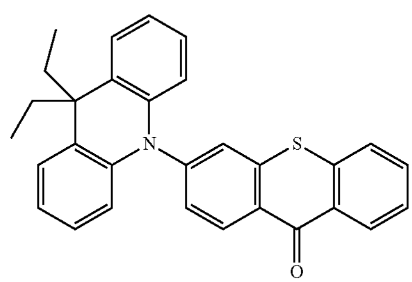
Compound 135
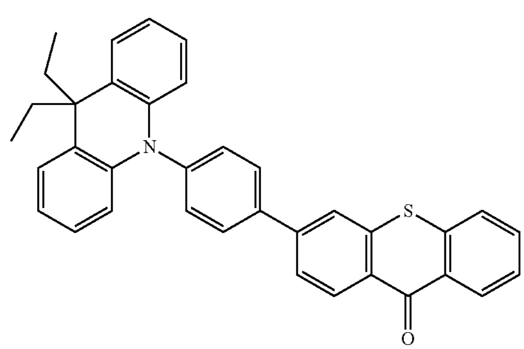

-continued
Compound 136
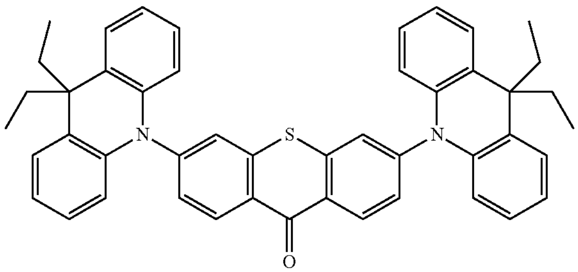
Compound 137
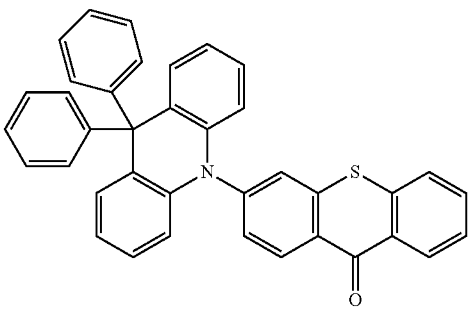
Compound 138
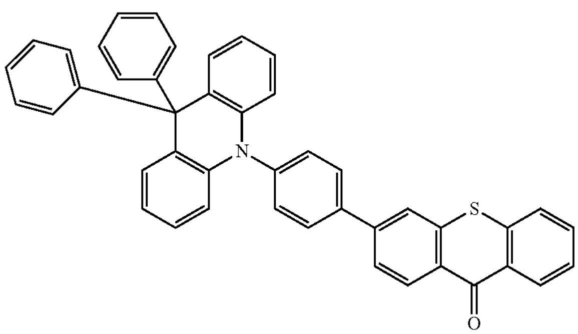
Compound 139
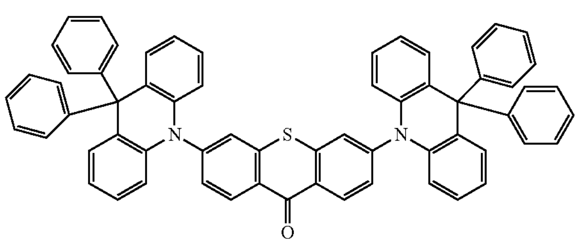
Compound 140
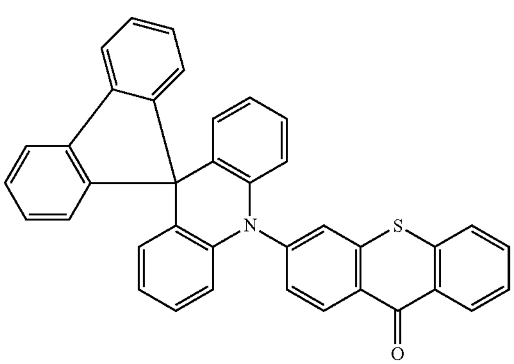
-continued
Compound 141
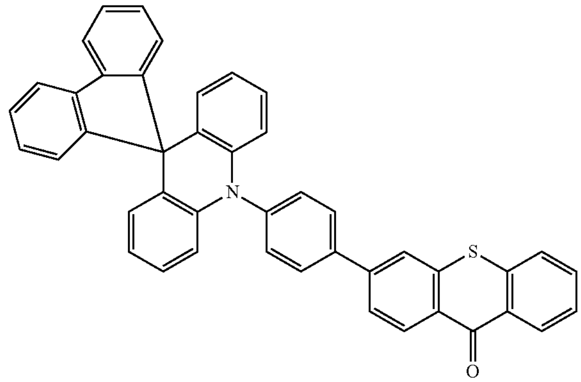
Compound 142
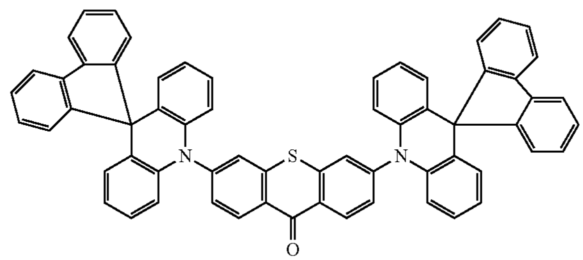
Compound 143
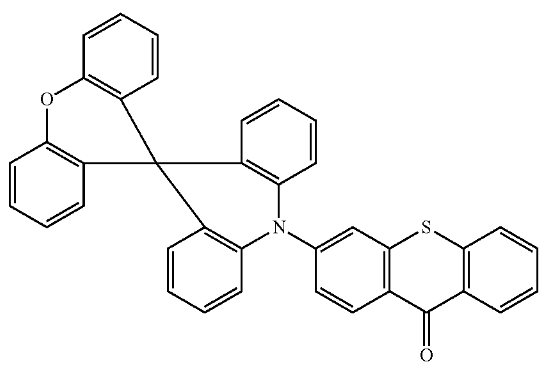
Compound 144
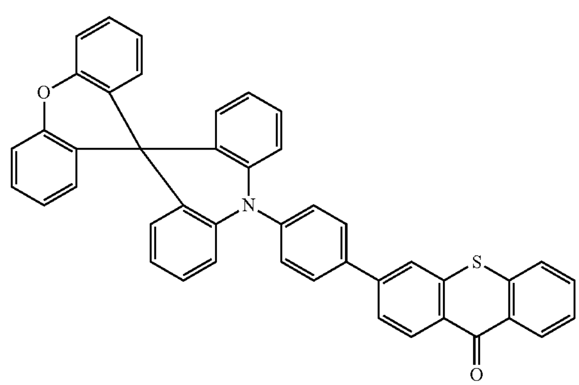

-continued
Compound 145
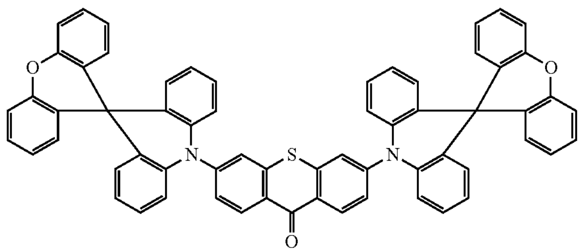
Compound 146
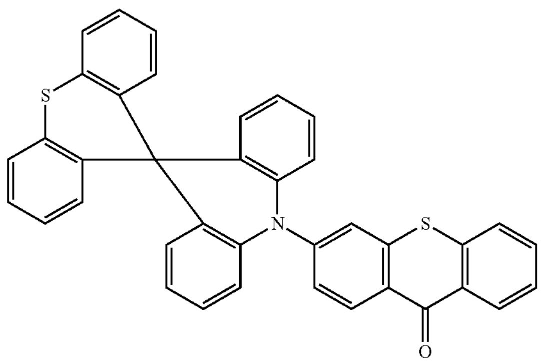
Compound 147
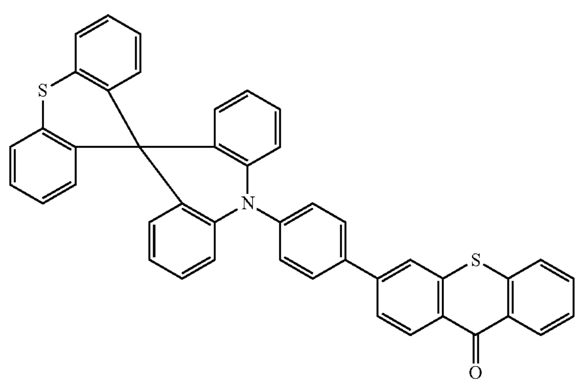
Compound 148
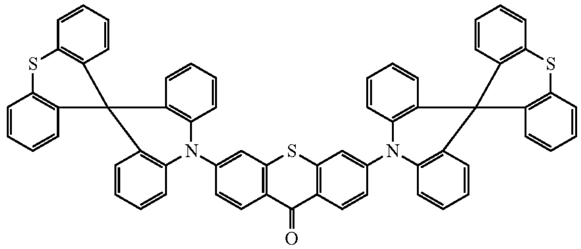
-continued
Compound 149
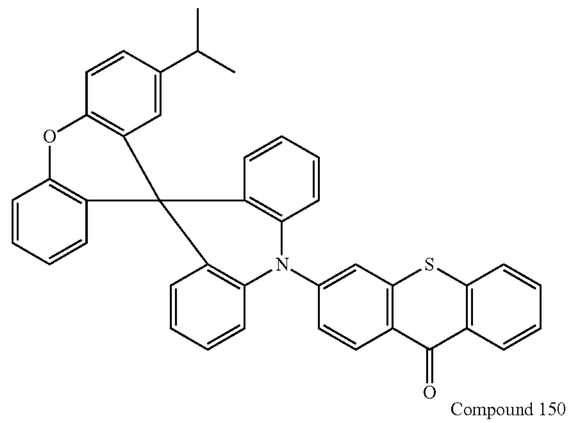
Compound 150
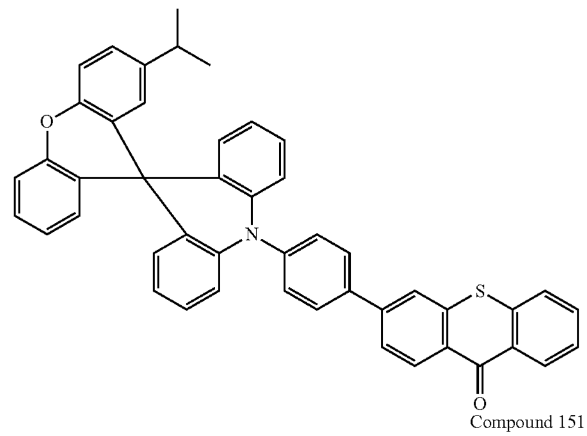
Compound 151
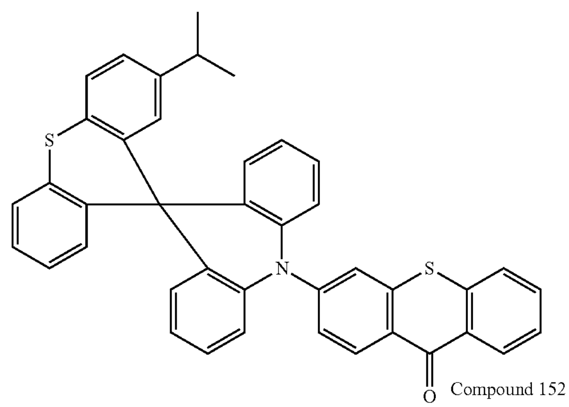
Compound 152
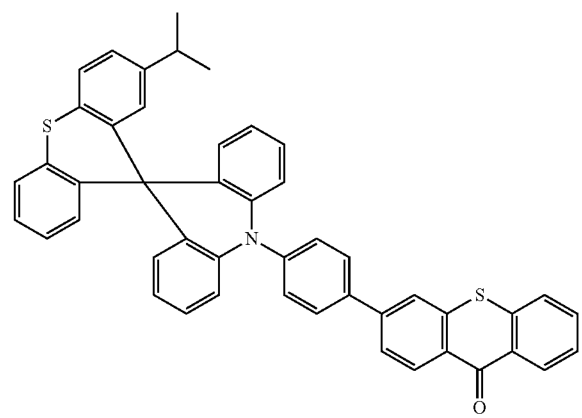

-continued
Compound 153
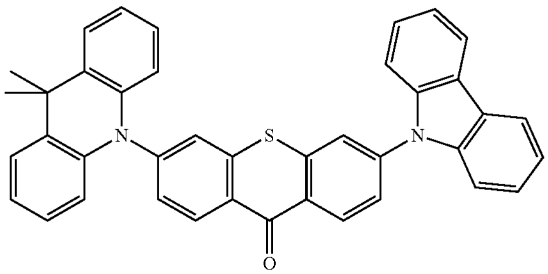
Compound 154
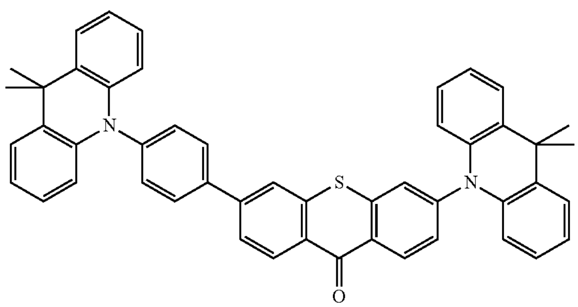
Compound 155
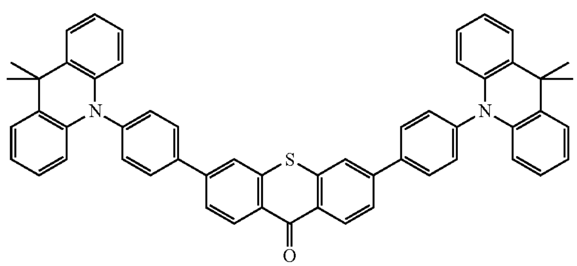
Compound 156
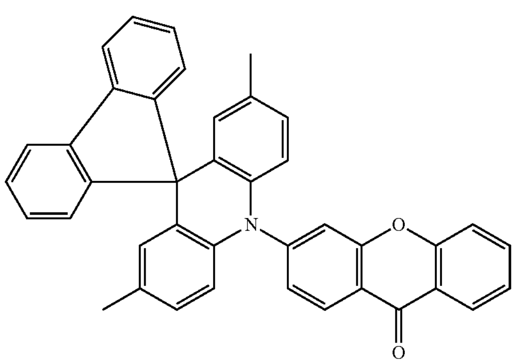
-continued
Compound 157
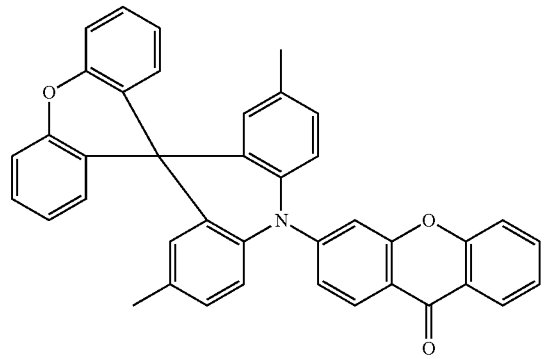
Compound 158
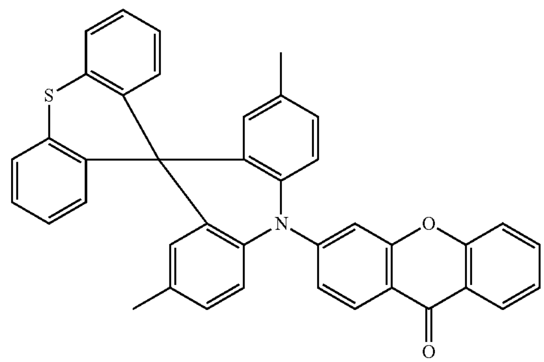
Compound 159
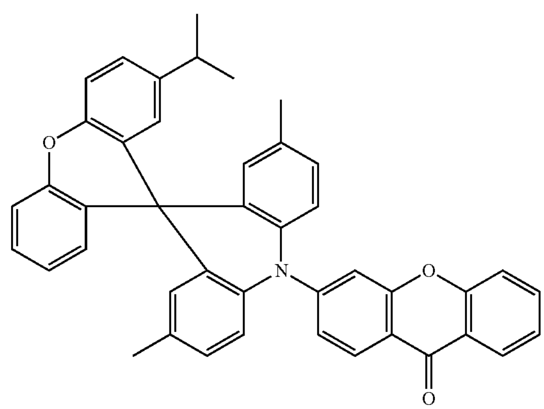
Compound 160
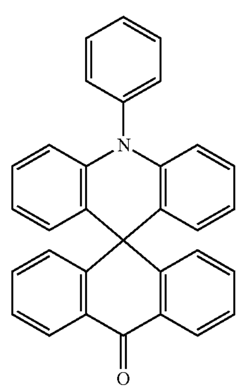
An the second organic compound, the following light emitting material capable of emitting delayed fluorescent light is also preferably used.

Preferred examples of the light emitting material include compounds represented by the following general formula (101). The entire description of WO 2013/154064 including the paragraphs 0008 to 0048 and 0095 to 0133 is incorporated herein by reference.

General Formula (101)

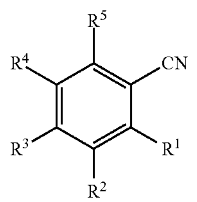

wherein in the general formula (101), at least one of $R^1$ to $R^5$ represents a cyano group, at least one of $R^1$ to $R^5$ represents a group represented by the following general formula (111), and the balance of $R^1$ to $R^5$ each represent a hydrogen atom or a substituent, General Formula (111)

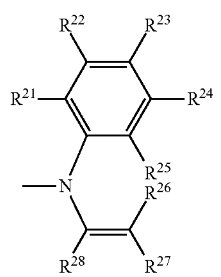

wherein in the general formula (11), $R^{21}$ to $R^{28}$ each independently represent a hydrogen atom or a substituent, provided that at least one of the following conditions (A) and (B) is satisfied:

(A) $R^{25}$ and $R^{26}$ together form a single bond, and (B) $R^{27}$ and $R^{28}$ together represent an atomic group that is necessary for forming a substituted or unsubstituted benzene ring.

In the general formula (101), at least one of $R^1$ to $R^5$ preferably represents a group represented by any one of the following general formulae (112) to (115).

General Formula (112)

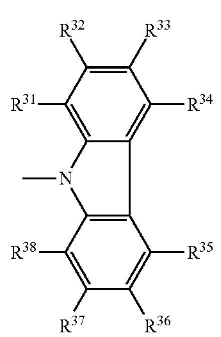

wherein in the general formula (112), $R^{31}$ to $R^{38}$ each independently represent a hydrogen atom or a substitutent, General Formula (113)

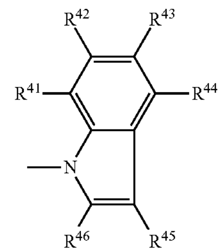

wherein in the general formula (113), $R^{41}$ to $R^{46}$ each independently represent a hydrogen atom or a substituent, General Formula (114)

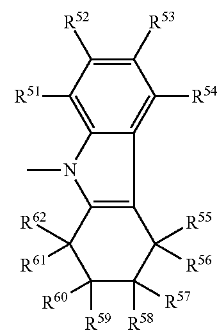

wherein in the general formula (114), $R^{51}$ to $R^{62}$ each independently represent a hydrogen atom or a substituent, General Formula (115)

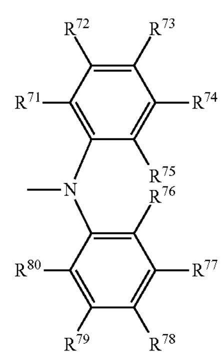

wherein in the general formula (115), $R^{71}$ to $R^{80}$ each independently represent a hydrogen atom or a substituent.

Specific examples of the compounds include the compounds shown in the following tables. In the care where two or more groups represented by any one of the general formulae (112) to (115) are present in the molecule of the following example compounds, all the groups have the same structure. The formulae (121) to (124) in the tables represent the following formulae, respectively, and n represents the number of the repeating units.

-continued

Formula (121)

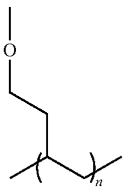

Formula (122)

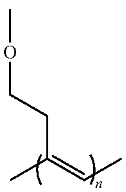

Formula (123)

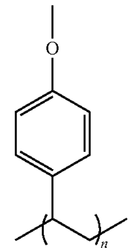

Formula (124)

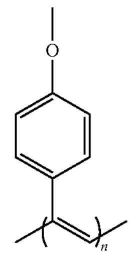

TABLE 1-1

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 1 | General formula (112) | General formula (112) | CN | General formula (112) | General formula (112) | H | H | H | H |
| 2 | General formula (112) | General formula (112) | CN | General formula (112) | General formula (112) | H | $CH_3$ | H | H |
| 3 | General formula (112) | General formula (112) | CN | General formula (112) | General formula (112) | H | $CH_3O$ | H | H |
| 4 | General formula (112) | General formula (112) | CN | General formula (112) | General formula (112) | H | H | $CH_3$ | H |
| 5 | General formula (112) | General formula (112) | CN | General formula (112) | General formula (112) | H | H | $CH_3O$ | H |
| 6 | General formula (112) | General formula (112) | CN | General formula (112) | General formula (112) | H | H | t-$C_4H_9$ | H |
| 7 | General formula (112) | General formula (112) | CN | General formula (112) | General formula (112) | H | H | Cl | H |
| 8 | General formula (112) | General formula (112) | CN | General formula (112) | General formula (112) | H | H | F | H |
| 9 | General formula (112) | General formula (112) | CN | General formula (112) | General formula (112) | H | H | H | $CH_3$ |
| 10 | General formula (112) | General formula (112) | CN | General formula (112) | General formula (112) | H | H | H | $CH_3O$ |
| 11 | General formula (112) | General formula (112) | CN | General formula (112) | H | H | H | H | H |
| 12 | General formula (112) | General formula (112) | CN | General formula (112) | H | H | $CH_3$ | H | H |
| 13 | General formula (112) | General formula (112) | CN | General formula (112) | H | H | $CH_3O$ | H | H |
| 14 | General formula (112) | General formula (112) | CN | General formula (112) | H | H | H | $CH_3$ | H |
| 15 | General formula (112) | General formula (112) | CN | General formula (112) | H | H | H | $CH_3O$ | H |
| 16 | General formula (112) | General formula (112) | CN | General formula (112) | H | H | H | t-$C_4H_9$ | H |
| 17 | General formula (112) | General formula (112) | CN | General formula (112) | H | H | H | Cl | H |
| 18 | General formula (112) | General formula (112) | CN | General formula (112) | H | H | H | F | H |
| 19 | General formula (112) | General formula (112) | CN | General formula (112) | H | H | H | H | $CH_3$ |
| 20 | General formula (112) | General formula (112) | CN | General formula (112) | H | H | H | H | $CH_3O$ |

TABLE 1-1-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 21 | General formula (112) | General formula (112) | CN | H | H | H | H | H | H |
| 22 | General formula (112) | General formula (112) | CN | H | H | H | $CH_3$ | H | H |
| 23 | General formula (112) | General formula (112) | CN | H | H | H | $CH_3O$ | H | H |
| 24 | General formula (112) | General formula (112) | CN | H | H | H | H | $CH_3$ | H |
| 25 | General formula (112) | General formula (112) | CN | H | H | H | H | $CH_3O$ | H |
| 26 | General formula (112) | General formula (112) | CN | H | H | H | H | t-$C_4H_9$ | H |
| 27 | General formula (112) | General formula (112) | CN | H | H | H | H | Cl | H |
| 28 | General formula (112) | General formula (112) | CN | H | H | H | H | F | H |
| 29 | General formula (112) | General formula (112) | CN | H | H | H | H | H | $CH_3$ |
| 30 | General formula (112) | General formula (112) | CN | H | H | H | H | H | $CH_3O$ |
| 31 | General formula (112) | H | CN | General formula (112) | H | H | H | H | H |
| 32 | General formula (112) | H | CN | General formula (112) | H | H | $CH_3$ | H | H |
| 33 | General formula (112) | H | CN | General formula (112) | H | H | $CH_3O$ | H | H |
| 34 | General formula (112) | H | CN | General formula (112) | H | H | H | $CH_3$ | H |
| 35 | General formula (112) | H | CN | General formula (112) | H | H | H | $CH_3O$ | H |
| 36 | General formula (112) | H | CN | General formula (112) | H | H | H | t-$C_4H_9$ | H |
| 37 | General formula (112) | H | CN | General formula (112) | H | H | H | Cl | H |
| 38 | General formula (112) | H | CN | General formula (112) | H | H | H | F | H |
| 39 | General formula (112) | H | CN | General formula (112) | H | H | H | H | $CH_3$ |
| 40 | General formula (112) | H | CN | General formula (112) | H | H | H | H | $CH_3O$ |
| 41 | General formula (112) | H | CN | H | General formula (112) | H | H | H | H |
| 42 | General formula (112) | H | CN | H | General formula (112) | H | $CH_3$ | H | H |
| 43 | General formula (112) | H | CN | H | General formula (112) | H | $CH_3O$ | H | H |
| 44 | General formula (112) | H | CN | H | General formula (112) | H | H | $CH_3$ | H |
| 45 | General formula (112) | H | CN | H | General formula (112) | H | H | $CH_3O$ | H |
| 46 | General formula (112) | H | CN | H | General formula (112) | H | H | t-$C_4H_9$ | H |
| 47 | General formula (112) | H | CN | H | General formula (112) | H | H | Cl | H |
| 48 | General formula (112) | H | CN | H | General formula (112) | H | H | F | H |
| 49 | General formula (112) | H | CN | H | General formula (112) | H | H | H | $CH_3$ |
| 50 | General formula (112) | H | CN | H | General formula (112) | H | H | H | $CH_3O$ |
| 51 | General formula (112) | H | CN | H | H | H | H | H | H |
| 52 | General formula (112) | H | CN | H | H | H | $CH_3$ | H | H |
| 53 | General formula (112) | H | CN | H | H | H | $CH_3O$ | H | H |
| 54 | General formula (112) | H | CN | H | H | H | H | $CH_3$ | H |
| 55 | General formula (112) | H | CN | H | H | H | H | $CH_3O$ | H |
| 56 | General formula (112) | H | CN | H | H | H | H | t-$C_4H_9$ | H |
| 57 | General formula (112) | H | CN | H | H | H | H | Cl | H |
| 58 | General formula (112) | H | CN | H | H | H | H | F | H |

TABLE 1-1-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 59 | General formula (112) | H | CN | H | H | H | H | H | $CH_3$ |
| 60 | General formula (112) | H | CN | H | H | H | H | H | $CH_3O$ |

TABLE 1-2

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 61 | General formula (112) | General formula (112) | CN | General formula (112) | F | H | H | H | H |
| 62 | General formula (112) | General formula (112) | CN | General formula (112) | F | H | $CH_3$ | H | H |
| 63 | General formula (112) | General formula (112) | CN | General formula (112) | F | H | $CH_3O$ | H | H |
| 64 | General formula (112) | General formula (112) | CN | General formula (112) | F | H | H | $CH_3$ | H |
| 65 | General formula (112) | General formula (112) | CN | General formula (112) | F | H | H | $CH_3O$ | H |
| 66 | General formula (112) | General formula (112) | CN | General formula (112) | F | H | H | t-$C_4H_9$ | H |
| 67 | General formula (112) | General formula (112) | CN | General formula (112) | F | H | H | Cl | H |
| 68 | General formula (112) | General formula (112) | CN | General formula (112) | F | H | H | F | H |
| 69 | General formula (112) | General formula (112) | CN | General formula (112) | F | H | H | H | $CH_3$ |
| 70 | General formula (112) | General formula (112) | CN | General formula (112) | F | H | H | H | $CH_3O$ |
| 71 | General formula (112) | General formula (112) | CN | F | F | H | H | H | H |
| 72 | General formula (112) | General formula (112) | CN | F | F | H | $CH_3$ | H | H |
| 73 | General formula (112) | General formula (112) | CN | F | F | H | $CH_3O$ | H | H |
| 74 | General formula (112) | General formula (112) | CN | F | F | H | H | $CH_3$ | H |
| 75 | General formula (112) | General formula (112) | CN | F | F | H | H | $CH_3O$ | H |
| 76 | General formula (112) | General formula (112) | CN | F | F | H | H | t-$C_4H_9$ | H |
| 77 | General formula (112) | General formula (112) | CN | F | F | H | H | Cl | H |
| 78 | General formula (112) | General formula (112) | CN | F | F | H | H | F | H |
| 79 | General formula (112) | General formula (112) | CN | F | F | H | H | H | $CH_3$ |
| 80 | General formula (112) | General formula (112) | CN | F | F | H | H | H | $CH_3O$ |
| 81 | General formula (112) | F | CN | General formula (112) | F | H | H | H | H |
| 82 | General formula (112) | F | CN | General formula (112) | F | H | $CH_3$ | H | H |
| 83 | General formula (112) | F | CN | General formula (112) | F | H | $CH_3O$ | H | H |
| 84 | General formula (112) | F | CN | General formula (112) | F | H | H | $CH_3$ | H |
| 85 | General formula (112) | F | CN | General formula (112) | F | H | H | $CH_3O$ | H |
| 86 | General formula (112) | F | CN | General formula (112) | F | H | H | t-$C_4H_9$ | H |
| 87 | General formula (112) | F | CN | General formula (112) | F | H | H | Cl | H |
| 88 | General formula (112) | F | CN | General formula (112) | F | H | H | F | H |
| 89 | General formula (112) | F | CN | General formula (112) | F | H | H | H | $CH_3$ |
| 90 | General formula (112) | F | CN | General formula (112) | F | H | H | H | $CH_3O$ |
| 91 | General formula (112) | F | CN | F | General formula (112) | H | H | H | H |

TABLE 1-2-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 92 | General formula (112) | F | CN | F | General formula (112) | H | $CH_3$ | H | H |
| 93 | General formula (112) | F | CN | F | General formula (112) | H | $CH_3O$ | H | H |
| 94 | General formula (112) | F | CN | F | General formula (112) | H | H | $CH_3$ | H |
| 95 | General formula (112) | F | CN | F | General formula (112) | H | H | $CH_3O$ | H |
| 96 | General formula (112) | F | CN | F | General formula (112) | H | H | t-$C_4H_9$ | H |
| 97 | General formula (112) | F | CN | F | General formula (112) | H | H | Cl | H |
| 98 | General formula (112) | F | CN | F | General formula (112) | H | H | F | H |
| 99 | General formula (112) | F | CN | F | General formula (112) | H | H | H | $CH_3$ |
| 100 | General formula (112) | F | CN | F | General formula (112) | H | H | H | $CH_3O$ |
| 101 | General formula (112) | F | CN | F | F | H | H | H | H |
| 102 | General formula (112) | F | CN | F | F | H | $CH_3$ | H | H |
| 103 | General formula (112) | F | CN | F | F | H | $CH_3O$ | H | H |
| 104 | General formula (112) | F | CN | F | F | H | H | $CH_3$ | H |
| 105 | General formula (112) | F | CN | F | F | H | H | $CH_3O$ | H |
| 106 | General formula (112) | F | CN | F | F | H | H | t-$C_4H_9$ | H |
| 107 | General formula (112) | F | CN | F | F | H | H | Cl | H |
| 108 | General formula (112) | F | CN | F | F | H | H | F | H |
| 109 | General formula (112) | F | CN | F | F | H | H | H | $CH_3$ |
| 110 | General formula (112) | F | CN | F | F | H | H | H | $CH_3O$ |
| 111 | General formula (112) | General formula (112) | CN | General formula (112) | OH | H | H | H | H |
| 112 | General formula (112) | General formula (112) | CN | General formula (112) | OH | H | $CH_3$ | H | H |
| 113 | General formula (112) | General formula (112) | CN | General formula (112) | OH | H | $CH_3O$ | H | H |
| 114 | General formula (112) | General formula (112) | CN | General formula (112) | OH | H | H | $CH_3$ | H |
| 115 | General formula (112) | General formula (112) | CN | General formula (112) | OH | H | H | $CH_3O$ | H |
| 116 | General formula (112) | General formula (112) | CN | General formula (112) | OH | H | H | t-$C_4H_9$ | H |
| 117 | General formula (112) | General formula (112) | CN | General formula (112) | OH | H | H | Cl | H |
| 118 | General formula (112) | General formula (112) | CN | General formula (112) | OH | H | H | F | H |
| 119 | General formula (112) | General formula (112) | CN | General formula (112) | OH | H | H | H | $CH_3$ |
| 120 | General formula (112) | General formula (112) | CN | General formula (112) | OH | H | H | H | $CH_3O$ |

TABLE 1-3

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 121 | General formula (112) | General formula (112) | CN | OH | OH | H | H | H | H |
| 122 | General formula (112) | General formula (112) | CN | OH | OH | H | $CH_3$ | H | H |
| 123 | General formula (112) | General formula (112) | CN | OH | OH | H | $CH_3O$ | H | H |
| 124 | General formula (112) | General formula (112) | CN | OH | OH | H | H | $CH_3$ | H |

TABLE 1-3-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 125 | General formula (112) | General formula (112) | CN | OH | OH | H | H | $CH_3O$ | H |
| 126 | General formula (112) | General formula (112) | CN | OH | OH | H | H | t-$C_4H_9$ | H |
| 127 | General formula (112) | General formula (112) | CN | OH | OH | H | H | Cl | H |
| 128 | General formula (112) | General formula (112) | CN | OH | OH | H | H | F | H |
| 129 | General formula (112) | General formula (112) | CN | OH | OH | H | H | H | $CH_3$ |
| 130 | General formula (112) | General formula (112) | CN | OH | OH | H | H | H | $CH_3O$ |
| 131 | General formula (112) | OH | CN | General formula (112) | OH | H | H | H | H |
| 132 | General formula (112) | OH | CN | General formula (112) | OH | H | $CH_3$ | H | H |
| 133 | General formula (112) | OH | CN | General formula (112) | OH | H | $CH_3O$ | H | H |
| 134 | General formula (112) | OH | CN | General formula (112) | OH | H | H | $CH_3$ | H |
| 135 | General formula (112) | OH | CN | General formula (112) | OH | H | H | $CH_3O$ | H |
| 136 | General formula (112) | OH | CN | General formula (112) | OH | H | H | t-$C_4H_9$ | H |
| 137 | General formula (112) | OH | CN | General formula (112) | OH | H | H | Cl | H |
| 138 | General formula (112) | OH | CN | General formula (112) | OH | H | H | F | H |
| 139 | General formula (112) | OH | CN | General formula (112) | OH | H | H | H | $CH_3$ |
| 140 | General formula (112) | OH | CN | General formula (112) | OH | H | H | H | $CH_3O$ |
| 141 | General formula (112) | OH | CN | OH | General formula (112) | H | H | H | H |
| 142 | General formula (112) | OH | CN | OH | General formula (112) | H | $CH_3$ | H | H |
| 143 | General formula (112) | OH | CN | OH | General formula (112) | H | $CH_3O$ | H | H |
| 144 | General formula (112) | OH | CN | OH | General formula (112) | H | H | $CH_3$ | H |
| 145 | General formula (112) | OH | CN | OH | General formula (112) | H | H | $CH_3O$ | H |
| 146 | General formula (112) | OH | CN | OH | General formula (112) | H | H | t-$C_4H_9$ | H |
| 147 | General formula (112) | OH | CN | OH | General formula (112) | H | H | Cl | H |
| 148 | General formula (112) | OH | CN | OH | General formula (112) | H | H | F | H |
| 149 | General formula (112) | OH | CN | OH | General formula (112) | H | H | H | $CH_3$ |
| 150 | General formula (112) | OH | CN | OH | General formula (112) | H | H | H | $CH_3O$ |
| 151 | General formula (112) | OH | CN | OH | OH | H | H | H | H |
| 152 | General formula (112) | OH | CN | OH | OH | H | $CH_3$ | H | H |
| 153 | General formula (112) | OH | CN | OH | OH | H | $CH_3O$ | H | H |
| 154 | General formula (112) | OH | CN | OH | OH | H | H | $CH_3$ | H |
| 155 | General formula (112) | OH | CN | OH | OH | H | H | $CH_3O$ | H |
| 156 | General formula (112) | OH | CN | OH | OH | H | H | t-$C_4H_9$ | H |
| 157 | General formula (112) | OH | CN | OH | OH | H | H | Cl | H |
| 158 | General formula (112) | OH | CN | OH | OH | H | H | F | H |
| 159 | General formula (112) | OH | CN | OH | OH | H | H | H | $CH_3$ |
| 160 | General formula (112) | OH | CN | OH | OH | H | H | H | $CH_3O$ |
| 161 | General formula (112) | General formula (112) | CN | General formula (112) | Cl | H | H | H | H |
| 162 | General formula (112) | General formula (112) | CN | General formula (112) | Cl | H | $CH_3$ | H | H |

TABLE 1-3-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 163 | General formula (112) | General formula (112) | CN | General formula (112) | Cl | H | $CH_3O$ | H | H |
| 164 | General formula (112) | General formula (112) | CN | General formula (112) | Cl | H | H | $CH_3$ | H |
| 165 | General formula (112) | General formula (112) | CN | General formula (112) | Cl | H | H | $CH_3O$ | H |
| 166 | General formula (112) | General formula (112) | CN | General formula (112) | Cl | H | H | t-$C_4H_9$ | H |
| 167 | General formula (112) | General formula (112) | CN | General formula (112) | Cl | H | H | Cl | H |
| 168 | General formula (112) | General formula (112) | CN | General formula (112) | Cl | H | H | F | H |
| 169 | General formula (112) | General formula (112) | CN | General formula (112) | Cl | H | H | H | $CH_3$ |
| 170 | General formula (112) | General formula (112) | CN | General formula (112) | Cl | H | H | H | $CH_3O$ |
| 171 | General formula (112) | General formula (112) | CN | General formula (112) | F | H | H | H | H |
| 172 | General formula (112) | General formula (112) | CN | General formula (112) | F | H | $CH_3$ | H | H |
| 173 | General formula (112) | General formula (112) | CN | General formula (112) | F | H | $CH_3O$ | H | H |
| 174 | General formula (112) | General formula (112) | CN | General formula (112) | F | H | H | $CH_3$ | H |
| 175 | General formula (112) | General formula (112) | CN | General formula (112) | F | H | H | $CH_3O$ | H |
| 176 | General formula (112) | General formula (112) | CN | General formula (112) | F | H | H | t-$C_4H_9$ | H |
| 177 | General formula (112) | General formula (112) | CN | General formula (112) | F | H | H | Cl | H |
| 178 | General formula (112) | General formula (112) | CN | General formula (112) | F | H | H | F | H |
| 179 | General formula (112) | General formula (112) | CN | General formula (112) | F | H | H | H | $CH_3$ |
| 180 | General formula (112) | General formula (112) | CN | General formula (112) | F | H | H | H | $CH_3O$ |

TABLE 1-4

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 181 | General formula (112) | General formula (112) | CN | General formula (112) | $CH_3O$ | H | H | H | H |
| 182 | General formula (112) | General formula (112) | CN | General formula (112) | $CH_3O$ | H | $CH_3$ | H | H |
| 183 | General formula (112) | General formula (112) | CN | General formula (112) | $CH_3O$ | H | $CH_3O$ | H | H |
| 184 | General formula (112) | General formula (112) | CN | General formula (112) | $CH_3O$ | H | H | $CH_3$ | H |
| 185 | General formula (112) | General formula (112) | CN | General formula (112) | $CH_3O$ | H | H | $CH_3O$ | H |
| 186 | General formula (112) | General formula (112) | CN | General formula (112) | $CH_3O$ | H | H | t-$C_4H_9$ | H |
| 187 | General formula (112) | General formula (112) | CN | General formula (112) | $CH_3O$ | H | H | Cl | H |
| 188 | General formula (112) | General formula (112) | CN | General formula (112) | $CH_3O$ | H | H | F | H |
| 189 | General formula (112) | General formula (112) | CN | General formula (112) | $C_2H_5O$ | H | H | H | $CH_3$ |
| 190 | General formula (112) | General formula (112) | CN | General formula (112) | $C_2H_5O$ | H | H | H | $CH_3O$ |
| 191 | General formula (112) | General formula (112) | CN | General formula (112) | $C_2H_5O$ | H | H | H | H |
| 192 | General formula (112) | General formula (112) | CN | General formula (112) | $C_2H_5O$ | H | $CH_3$ | H | H |
| 193 | General formula (112) | General formula (112) | CN | General formula (112) | $C_2H_5O$ | H | $CH_3O$ | H | H |
| 194 | General formula (112) | General formula (112) | CN | General formula (112) | $C_2H_5O$ | H | H | $CH_3$ | H |
| 195 | General formula (112) | General formula (112) | CN | General formula (112) | $C_2H_5O$ | H | H | $CH_3O$ | H |

TABLE 1-4-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 196 | General formula (112) | General formula (112) | CN | General formula (112) | $C_2H_5O$ | H | H | t-$C_4H_9$ | H |
| 197 | General formula (112) | General formula (112) | CN | General formula (112) | $C_2H_5O$ | H | H | Cl | H |
| 198 | General formula (112) | General formula (112) | CN | General formula (112) | $C_2H_5O$ | H | H | F | H |
| 199 | General formula (112) | General formula (112) | CN | General formula (112) | $C_2H_5O$ | H | H | H | $CH_3$ |
| 200 | General formula (112) | General formula (112) | CN | General formula (112) | $C_2H_5O$ | H | H | H | $CH_3O$ |
| 201 | General formula (112) | General formula (112) | CN | General formula (112) | $C_6H_5O$ | H | H | H | H |
| 202 | General formula (112) | General formula (112) | CN | General formula (112) | $C_6H_5O$ | H | $CH_3$ | H | H |
| 203 | General formula (112) | General formula (112) | CN | General formula (112) | $C_6H_5O$ | H | $CH_3O$ | H | H |
| 204 | General formula (112) | General formula (112) | CN | General formula (112) | $C_6H_5O$ | H | H | $CH_3$ | H |
| 205 | General formula (112) | General formula (112) | CN | General formula (112) | $C_6H_5O$ | H | H | $CH_3O$ | H |
| 206 | General formula (112) | General formula (112) | CN | General formula (112) | $C_6H_5O$ | H | H | t-$C_4H_9$ | H |
| 207 | General formula (112) | General formula (112) | CN | General formula (112) | $C_6H_5O$ | H | H | Cl | H |
| 208 | General formula (112) | General formula (112) | CN | General formula (112) | $C_6H_5O$ | H | H | F | H |
| 209 | General formula (112) | General formula (112) | CN | General formula (112) | $C_6H_5O$ | H | H | H | $CH_3$ |
| 210 | General formula (112) | General formula (112) | CN | General formula (112) | $C_6H_5O$ | H | H | H | $CH_3O$ |
| 211 | General formula (112) | General formula (112) | CN | General formula (112) | Formula (121) | H | H | H | H |
| 212 | General formula (112) | General formula (112) | CN | General formula (112) | Formula (121) | H | $CH_3$ | H | H |
| 213 | General formula (112) | General formula (112) | CN | General formula (112) | Formula (121) | H | $CH_3O$ | H | H |
| 214 | General formula (112) | General formula (112) | CN | General formula (112) | Formula (121) | H | H | $CH_3$ | H |
| 215 | General formula (112) | General formula (112) | CN | General formula (112) | Formula (121) | H | H | $CH_3O$ | H |
| 216 | General formula (112) | General formula (112) | CN | General formula (112) | Formula (121) | H | H | t-$C_4H_9$ | H |
| 217 | General formula (112) | General formula (112) | CN | General formula (112) | Formula (121) | H | H | Cl | H |
| 218 | General formula (112) | General formula (112) | CN | General formula (112) | Formula (121) | H | H | F | H |
| 219 | General formula (112) | General formula (112) | CN | General formula (112) | Formula (121) | H | H | H | $CH_3$ |
| 220 | General formula (112) | General formula (112) | CN | General formula (112) | Formula (121) | H | H | H | $CH_3O$ |
| 221 | General formula (112) | General formula (112) | CN | General formula (112) | Formula (122) | H | H | H | H |
| 222 | General formula (112) | General formula (112) | CN | General formula (112) | Formula (122) | H | $CH_3$ | H | H |
| 223 | General formula (112) | General formula (112) | CN | General formula (112) | Formula (122) | H | $CH_3O$ | H | H |
| 224 | General formula (112) | General formula (112) | CN | General formula (112) | Formula (122) | H | H | $CH_3$ | H |
| 225 | General formula (112) | General formula (112) | CN | General formula (112) | Formula (122) | H | H | $CH_3O$ | H |
| 226 | General formula (112) | General formula (112) | CN | General formula (112) | Formula (122) | H | H | t-$C_4H_9$ | H |
| 227 | General formula (112) | General formula (112) | CN | General formula (112) | Formula (122) | H | H | Cl | H |
| 228 | General formula (112) | General formula (112) | CN | General formula (112) | Formula (122) | H | H | F | H |
| 229 | General formula (112) | General formula (112) | CN | General formula (112) | Formula (122) | H | H | H | $CH_3$ |
| 230 | General formula (112) | General formula (112) | CN | General formula (112) | Formula (122) | H | H | H | $CH_3O$ |
| 231 | General formula (112) | General formula (112) | CN | General formula (112) | Formula (123) | H | H | H | H |
| 232 | General formula (112) | General formula (112) | CN | General formula (112) | Formula (123) | H | $CH_3$ | H | H |
| 233 | General formula (112) | General formula (112) | CN | General formula (112) | Formula (123) | H | $CH_3O$ | H | H |

TABLE 1-4-continued

| Compound No. | General formula (1) R[1] | R[2] | R[3] | R[4] | R[5] | General formula (112) $R^{31}$, $R^{38}$ | $R^{32}$, $R^{37}$ | $R^{33}$, $R^{36}$ | $R^{34}$, $R^{35}$ |
|---|---|---|---|---|---|---|---|---|---|
| 234 | General formula (112) | General formula (112) | CN | General formula (112) | Formula (123) | H | H | $CH_3$ | H |
| 235 | General formula (112) | General formula (112) | CN | General formula (112) | Formula (123) | H | H | $CH_3O$ | H |
| 236 | General formula (112) | General formula (112) | CN | General formula (112) | Formula (123) | H | H | t-$C_4H_9$ | H |
| 237 | General formula (112) | General formula (112) | CN | General formula (112) | Formula (123) | H | H | Cl | H |
| 238 | General formula (112) | General formula (112) | CN | General formula (112) | Formula (123) | H | H | F | H |
| 239 | General formula (112) | General formula (112) | CN | General formula (112) | Formula (123) | H | H | H | $CH_3$ |
| 240 | General formula (112) | General formula (112) | CN | General formula (112) | Formula (123) | H | H | H | $CH_3O$ |

TABLE 1-5

| Compound No. | General formula (1) $R^1$ | $R^2$ | $R^3$ | $R^4$ | $R^5$ | General formula (112) $R^{31}$, $R^{38}$ | $R^{32}$, $R^{37}$ | $R^{33}$, $R^{36}$ | $R^{34}$, $R^{35}$ |
|---|---|---|---|---|---|---|---|---|---|
| 241 | General formula (112) | General formula (112) | CN | General formula (112) | Formula (124) | H | H | H | H |
| 242 | General formula (112) | General formula (112) | CN | General formula (112) | Formula (124) | H | $CH_3$ | H | H |
| 243 | General formula (112) | General formula (112) | CN | General formula (112) | Formula (124) | H | $CH_3O$ | H | H |
| 244 | General formula (112) | General formula (112) | CN | General formula (112) | Formula (124) | H | H | $CH_3$ | H |
| 245 | General formula (112) | General formula (112) | CN | General formula (112) | Formula (124) | H | H | $CH_3O$ | H |
| 246 | General formula (112) | General formula (112) | CN | General formula (112) | Formula (124) | H | H | t-$C_4H_9$ | H |
| 247 | General formula (112) | General formula (112) | CN | General formula (112) | Formula (124) | H | H | Cl | H |
| 248 | General formula (112) | General formula (112) | CN | General formula (112) | Formula (124) | H | H | F | H |
| 249 | General formula (112) | General formula (112) | CN | General formula (112) | Formula (124) | H | H | H | $CH_3$ |
| 250 | General formula (112) | General formula (112) | CN | General formula (112) | Formula (124) | H | H | H | $CH_3O$ |
| 251 | General formula (112) | General formula (112) | CN | General formula (112) | General formula (112) | H | $C_6H_5$ | H | H |
| 252 | General formula (112) | General formula (112) | CN | General formula (112) | General formula (112) | H | H | $C_6H_5$ | H |
| 253 | General formula (112) | General formula (112) | CN | General formula (112) | H | H | $C_6H_5$ | H | H |
| 254 | General formula (112) | General formula (112) | CN | General formula (112) | H | H | H | $C_6H_5$ | H |
| 255 | General formula (112) | General formula (112) | CN | H | H | H | $C_6H_5$ | H | H |
| 256 | General formula (112) | General formula (112) | CN | H | H | H | H | $C_6H_5$ | H |
| 257 | General formula (112) | H | CN | General formula (112) | H | H | $C_6H_5$ | H | H |
| 258 | General formula (112) | H | CN | General formula (112) | H | H | H | $C_6H_5$ | H |
| 259 | General formula (112) | H | CN | H | General formula (112) | H | $C_6H_5$ | H | H |
| 260 | General formula (112) | H | CN | H | General formula (112) | H | H | $C_6H_5$ | H |
| 261 | General formula (112) | H | CN | H | H | H | $C_6H_5$ | H | H |
| 262 | General formula (112) | H | CN | H | H | H | H | $C_6H_5$ | H |
| 263 | General formula (112) | General formula (112) | CN | General formula (112) | F | H | $C_6H_5$ | H | H |
| 264 | General formula (112) | General formula (112) | CN | General formula (112) | F | H | H | $C_6H_5$ | H |
| 265 | General formula (112) | General formula (112) | CN | F | F | H | $C_6H_5$ | H | H |
| 266 | General formula (112) | General formula (112) | CN | F | F | H | H | $C_6H_5$ | H |

TABLE 1-5-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 267 | General formula (112) | F | CN | General formula (112) | F | H | $C_6H_5$ | H | H |
| 268 | General formula (112) | F | CN | General formula (112) | F | H | H | $C_6H_5$ | H |
| 269 | General formula (112) | F | CN | F | General formula (112) | H | $C_6H_5$ | H | H |
| 270 | General formula (112) | F | CN | F | General formula (112) | H | H | $C_6H_5$ | H |
| 271 | General formula (112) | F | CN | F | F | H | $C_6H_5$ | H | H |
| 272 | General formula (112) | F | CN | F | F | H | H | $C_6H_5$ | H |
| 273 | General formula (112) | General formula (112) | CN | General formula (112) | OH | H | $C_6H_5$ | H | H |
| 274 | General formula (112) | General formula (112) | CN | General formula (112) | OH | H | H | $C_6H_5$ | H |
| 275 | General formula (112) | General formula (112) | CN | OH | OH | H | $C_6H_5$ | H | H |
| 276 | General formula (112) | General formula (112) | CN | OH | OH | H | H | $C_6H_5$ | H |
| 277 | General formula (112) | OH | CN | General formula (112) | OH | H | $C_6H_5$ | H | H |
| 278 | General formula (112) | OH | CN | General formula (112) | OH | H | H | $C_6H_5$ | H |
| 279 | General formula (112) | OH | CN | OH | General formula (112) | H | $C_6H_5$ | H | H |
| 280 | General formula (112) | OH | CN | OH | General formula (112) | H | H | $C_6H_5$ | H |
| 281 | General formula (112) | OH | CN | OH | OH | H | $C_6H_5$ | H | H |
| 282 | General formula (112) | OH | CN | OH | OH | H | H | $C_6H_5$ | H |
| 283 | General formula (112) | General formula (112) | CN | General formula (112) | Cl | H | $C_6H_5$ | H | H |
| 284 | General formula (112) | General formula (112) | CN | General formula (112) | Cl | H | H | $C_6H_5$ | H |
| 285 | General formula (112) | General formula (112) | CN | General formula (112) | F | H | $C_6H_5$ | H | H |
| 286 | General formula (112) | General formula (112) | CN | General formula (112) | F | H | H | $C_6H_5$ | H |
| 287 | General formula (112) | General formula (112) | CN | General formula (112) | $CH_3O$ | H | $C_6H_5$ | H | H |
| 288 | General formula (112) | General formula (112) | CN | General formula (112) | $CH_3O$ | H | H | $C_6H_5$ | H |
| 289 | General formula (112) | General formula (112) | CN | General formula (112) | $C_2H_5O$ | H | $C_6H_5$ | H | H |
| 290 | General formula (112) | General formula (112) | CN | General formula (112) | $C_2H_5O$ | H | H | $C_6H_5$ | H |
| 291 | General formula (112) | General formula (112) | CN | General formula (112) | $C_6H_5O$ | H | $C_6H_5$ | H | H |
| 292 | General formula (112) | General formula (112) | CN | General formula (112) | $C_6H_5O$ | H | H | $C_6H_5$ | H |
| 293 | General formula (112) | General formula (112) | CN | General formula (112) | Formula (121) | H | $C_6H_5$ | H | H |
| 294 | General formula (112) | General formula (112) | CN | General formula (112) | Formula (121) | H | H | $C_6H_5$ | H |
| 295 | General formula (112) | General formula (112) | CN | General formula (112) | Formula (122) | H | $C_6H_5$ | H | H |
| 296 | General formula (112) | General formula (112) | CN | General formula (112) | Formula (122) | H | H | $C_6H_5$ | H |
| 297 | General formula (112) | General formula (112) | CN | General formula (112) | Formula (123) | H | $C_6H_5$ | H | H |
| 298 | General formula (112) | General formula (112) | CN | General formula (112) | Formula (123) | H | H | $C_6H_5$ | H |
| 299 | General formula (112) | General formula (112) | CN | General formula (112) | Formula (124) | H | $C_6H_5$ | H | H |
| 300 | General formula (112) | General formula (112) | CN | General formula (112) | Formula (124) | H | H | $C_6H_5$ | H |

TABLE 2-1

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 301 | General formula (112) | CN | General formula (112) | General formula (112) | General formula (112) | H | H | H | H |
| 302 | General formula (112) | CN | General formula (112) | General formula (112) | General formula (112) | H | $CH_3$ | H | H |
| 303 | General formula (112) | CN | General formula (112) | General formula (112) | General formula (112) | H | $CH_3O$ | H | H |
| 304 | General formula (112) | CN | General formula (112) | General formula (112) | General formula (112) | H | H | $CH_3$ | H |
| 305 | General formula (112) | CN | General formula (112) | General formula (112) | General formula (112) | H | H | $CH_3O$ | H |
| 306 | General formula (112) | CN | General formula (112) | General formula (112) | General formula (112) | H | H | t-$C_4H_9$ | H |
| 307 | General formula (112) | CN | General formula (112) | General formula (112) | General formula (112) | H | H | Cl | H |
| 308 | General formula (112) | CN | General formula (112) | General formula (112) | General formula (112) | H | H | F | H |
| 309 | General formula (112) | CN | General formula (112) | General formula (112) | General formula (112) | H | H | H | $CH_3$ |
| 310 | General formula (112) | CN | General formula (112) | General formula (112) | General formula (112) | H | H | H | $CH_3O$ |
| 311 | General formula (112) | CN | General formula (112) | General formula (112) | H | H | H | H | H |
| 312 | General formula (112) | CN | General formula (112) | General formula (112) | H | H | H | $CH_3$ | H |
| 313 | General formula (112) | CN | General formula (112) | General formula (112) | H | H | H | $CH_3O$ | H |
| 314 | General formula (112) | CN | General formula (112) | H | General formula (112) | H | H | H | H |
| 315 | General formula (112) | CN | General formula (112) | H | General formula (112) | H | H | $CH_3$ | H |
| 316 | General formula (112) | CN | General formula (112) | H | General formula (112) | H | H | $CH_3O$ | H |
| 317 | General formula (112) | CN | H | General formula (112) | General formula (112) | H | H | H | H |
| 318 | General formula (112) | CN | H | General formula (112) | General formula (112) | H | H | $CH_3$ | H |
| 319 | General formula (112) | CN | H | General formula (112) | General formula (112) | H | H | $CH_3O$ | H |
| 320 | H | CN | General formula (112) | General formula (112) | General formula (112) | H | H | H | H |
| 321 | H | CN | General formula (112) | General formula (112) | General formula (112) | H | H | $CH_3$ | H |
| 322 | H | CN | General formula (112) | General formula (112) | General formula (112) | H | H | $CH_3O$ | H |
| 323 | General formula (112) | CN | General formula (112) | H | H | H | H | H | H |
| 324 | General formula (112) | CN | General formula (112) | H | H | H | H | $CH_3$ | H |
| 325 | General formula (112) | CN | General formula (112) | H | H | H | H | $CH_3O$ | H |
| 326 | General formula (112) | CN | H | General formula (112) | H | H | H | H | H |
| 327 | General formula (112) | CN | H | General formula (112) | H | H | H | $CH_3$ | H |
| 328 | General formula (112) | CN | H | General formula (112) | H | H | H | $CH_3O$ | H |
| 329 | H | CN | General formula (112) | General formula (112) | H | H | H | H | H |
| 330 | H | CN | General formula (112) | General formula (112) | H | H | H | $CH_3$ | H |
| 331 | H | CN | General formula (112) | General formula (112) | H | H | H | $CH_3O$ | H |
| 332 | General formula (112) | CN | H | H | General formula (112) | H | H | H | H |
| 333 | General formula (112) | CN | H | H | General formula (112) | H | H | $CH_3$ | H |
| 334 | General formula (112) | CN | H | H | General formula (112) | H | H | $CH_3O$ | H |
| 335 | H | CN | General formula (112) | H | General formula (112) | H | H | H | H |
| 336 | H | CN | General formula (112) | H | General formula (112) | H | H | $CH_3$ | H |
| 337 | H | CN | General formula (112) | H | General formula (112) | H | H | $CH_3O$ | H |
| 338 | H | CN | H | General formula (112) | General formula (112) | H | H | H | H |

TABLE 2-1-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 339 | H | CN | H | General formula (112) | General formula (112) | H | H | $CH_3$ | H |
| 340 | H | CN | H | General formula (112) | General formula (112) | H | H | $CH_3O$ | H |
| 341 | General formula (112) | CN | H | H | H | H | H | H | H |
| 342 | General formula (112) | CN | H | H | H | H | H | $CH_3$ | H |
| 343 | General formula (112) | CN | H | H | H | H | H | $CH_3O$ | H |
| 344 | H | CN | General formula (112) | H | H | H | H | H | H |
| 345 | H | CN | General formula (112) | H | H | H | H | $CH_3$ | H |
| 346 | H | CN | General formula (112) | H | H | H | H | $CH_3O$ | H |
| 347 | H | CN | H | General formula (112) | H | H | H | H | H |
| 348 | H | CN | H | General formula (112) | H | H | H | $CH_3$ | H |
| 349 | H | CN | H | General formula (112) | H | H | H | $CH_3O$ | H |
| 350 | General formula (112) | CN | General formula (112) | General formula (112) | F | H | H | H | H |

TABLE 2-2

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 351 | General formula (112) | CN | General formula (112) | General formula (112) | F | H | H | $CH_3$ | H |
| 352 | General formula (112) | CN | General formula (112) | General formula (112) | F | H | H | $CH_3O$ | H |
| 353 | General formula (112) | CN | General formula (112) | F | General formula (112) | H | H | H | H |
| 354 | General formula (112) | CN | General formula (112) | F | General formula (112) | H | H | $CH_3$ | H |
| 355 | General formula (112) | CN | General formula (112) | F | General formula (112) | H | H | $CH_3O$ | H |
| 356 | General formula (112) | CN | F | General formula (112) | General formula (112) | H | H | H | H |
| 357 | General formula (112) | CN | F | General formula (112) | General formula (112) | H | H | $CH_3$ | H |
| 358 | General formula (112) | CN | F | General formula (112) | General formula (112) | H | H | $CH_3O$ | H |
| 359 | F | CN | General formula (112) | General formula (112) | General formula (112) | H | H | H | H |
| 360 | F | CN | General formula (112) | General formula (112) | General formula (112) | H | H | $CH_3$ | H |
| 361 | F | CN | General formula (112) | General formula (112) | General formula (112) | H | H | $CH_3O$ | H |
| 362 | General formula (112) | CN | General formula (112) | F | F | H | H | H | H |
| 363 | General formula (112) | CN | General formula (112) | F | F | H | H | $CH_3$ | H |
| 364 | General formula (112) | CN | General formula (112) | F | F | H | H | $CH_3O$ | H |
| 365 | General formula (112) | CN | F | General formula (112) | F | H | H | H | H |
| 366 | General formula (112) | CN | F | General formula (112) | F | H | H | $CH_3$ | H |
| 367 | General formula (112) | CN | F | General formula (112) | F | H | H | $CH_3O$ | H |
| 368 | F | CN | General formula (112) | General formula (112) | F | H | H | H | H |
| 369 | F | CN | General formula (112) | General formula (112) | F | H | H | $CH_3$ | H |
| 370 | F | CN | General formula (112) | General formula (112) | F | H | H | $CH_3O$ | H |
| 371 | General formula (112) | CN | F | F | General formula (112) | H | H | H | H |

TABLE 2-2-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 372 | General formula (112) | CN | F | F | General formula (112) | H | H | $CH_3$ | H |
| 373 | General formula (112) | CN | F | F | General formula (112) | H | H | $CH_3O$ | H |
| 374 | F | CN | General formula (112) | F | General formula (112) | H | H | H | H |
| 375 | F | CN | General formula (112) | F | General formula (112) | H | H | $CH_3$ | H |
| 376 | F | CN | General formula (112) | F | General formula (112) | H | H | $CH_3O$ | H |
| 377 | F | CN | F | General formula (112) | General formula (112) | H | H | H | H |
| 378 | F | CN | F | General formula (112) | General formula (112) | H | H | $CH_3$ | H |
| 379 | F | CN | F | General formula (112) | General formula (112) | H | H | $CH_3O$ | H |
| 380 | General formula (112) | CN | F | F | F | H | H | H | H |
| 381 | General formula (112) | CN | F | F | F | H | H | $CH_3$ | H |
| 382 | General formula (112) | CN | F | F | F | H | H | $CH_3O$ | H |
| 383 | F | CN | General formula (112) | F | F | H | H | H | H |
| 384 | F | CN | General formula (112) | F | F | H | H | $CH_3$ | H |
| 385 | F | CN | General formula (112) | F | F | H | H | $CH_3O$ | H |
| 386 | F | CN | F | General formula (112) | F | H | H | H | H |
| 387 | F | CN | F | General formula (112) | F | H | H | $CH_3$ | H |
| 388 | F | CN | F | General formula (112) | F | H | H | $CH_3O$ | H |
| 389 | General formula (112) | CN | General formula (112) | General formula (112) | OH | H | H | H | H |
| 390 | General formula (112) | CN | General formula (112) | General formula (112) | OH | H | H | $CH_3$ | H |
| 391 | General formula (112) | CN | General formula (112) | General formula (112) | OH | H | H | $CH_3O$ | H |
| 392 | General formula (112) | CN | General formula (112) | OH | General formula (112) | H | H | H | H |
| 393 | General formula (112) | CN | General formula (112) | OH | General formula (112) | H | H | $CH_3$ | H |
| 394 | General formula (112) | CN | General formula (112) | OH | General formula (112) | H | H | $CH_3O$ | H |
| 395 | General formula (112) | CN | General formula (112) | OH | General formula (112) | H | H | t-$C_4H_9$ | H |
| 396 | General formula (112) | CN | General formula (112) | OH | General formula (112) | H | H | Cl | H |
| 397 | General formula (112) | CN | General formula (112) | OH | General formula (112) | H | H | F | H |
| 398 | General formula (112) | CN | OH | General formula (112) | General formula (112) | H | H | H | H |
| 399 | General formula (112) | CN | OH | General formula (112) | General formula (112) | H | H | $CH_3$ | H |
| 400 | General formula (112) | CN | OH | General formula (112) | General formula (112) | H | H | $CH_3O$ | H |
| 401 | OH | CN | General formula (112) | General formula (112) | General formula (112) | H | H | H | H |
| 402 | OH | CN | General formula (112) | General formula (112) | General formula (112) | H | H | $CH_3$ | H |
| 403 | OH | CN | General formula (112) | General formula (112) | General formula (112) | H | H | $CH_3O$ | H |
| 404 | General formula (112) | CN | General formula (112) | OH | OH | H | H | H | H |
| 405 | General formula (112) | CN | General formula (112) | OH | OH | H | H | $CH_3$ | H |

TABLE 2-3

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 406 | General formula (112) | CN | General formula (112) | OH | OH | H | H | $CH_3O$ | H |
| 407 | General formula (112) | CN | OH | General formula (112) | OH | H | H | H | H |
| 408 | General formula (112) | CN | OH | General formula (112) | OH | H | H | $CH_3$ | H |
| 409 | General formula (112) | CN | OH | General formula (112) | OH | H | H | $CH_3O$ | H |
| 410 | OH | CN | General formula (112) | General formula (112) | OH | H | H | H | H |
| 411 | OH | CN | General formula (112) | General formula (112) | OH | H | H | $CH_3$ | H |
| 412 | OH | CN | General formula (112) | General formula (112) | OH | H | H | $CH_3O$ | H |
| 413 | General formula (112) | CN | OH | OH | General formula (112) | H | H | H | H |
| 414 | General formula (112) | CN | OH | OH | General formula (112) | H | H | $CH_3$ | H |
| 415 | General formula (112) | CN | OH | OH | General formula (112) | H | H | $CH_3O$ | H |
| 416 | OH | CN | General formula (112) | OH | General formula (112) | H | H | H | H |
| 417 | OH | CN | General formula (112) | OH | General formula (112) | H | H | $CH_3$ | H |
| 418 | OH | CN | General formula (112) | OH | General formula (112) | H | H | $CH_3O$ | H |
| 419 | OH | CN | OH | General formula (112) | General formula (112) | H | H | H | H |
| 420 | OH | CN | OH | General formula (112) | General formula (112) | H | H | $CH_3$ | H |
| 421 | OH | CN | OH | General formula (112) | General formula (112) | H | H | $CH_3O$ | H |
| 422 | General formula (112) | CN | OH | OH | OH | H | H | H | H |
| 423 | General formula (112) | CN | OH | OH | OH | H | H | $CH_3$ | H |
| 424 | General formula (112) | CN | OH | OH | OH | H | H | $CH_3O$ | H |
| 425 | OH | CN | General formula (112) | OH | OH | H | H | H | H |
| 426 | OH | CN | General formula (112) | OH | OH | H | H | $CH_3$ | H |
| 427 | OH | CN | General formula (112) | OH | OH | H | H | $CH_3O$ | H |
| 428 | OH | CN | OH | General formula (112) | OH | H | H | H | H |
| 429 | OH | CN | OH | General formula (112) | OH | H | H | $CH_3$ | H |
| 430 | OH | CN | OH | General formula (112) | OH | H | H | $CH_3O$ | H |
| 431 | OH | CN | OH | OH | General formula (112) | H | H | H | H |
| 432 | OH | CN | OH | OH | General formula (112) | H | H | $CH_3$ | H |
| 433 | OH | CN | OH | OH | General formula (112) | H | H | $CH_3O$ | H |
| 434 | General formula (112) | CN | General formula (112) | Cl | General formula (112) | H | H | H | H |
| 435 | General formula (112) | CN | General formula (112) | Cl | General formula (112) | H | H | $CH_3$ | H |
| 436 | General formula (112) | CN | General formula (112) | Cl | General formula (112) | H | H | $CH_3O$ | H |
| 437 | General formula (112) | CN | General formula (112) | Cl | General formula (112) | H | H | t-$C_4H_9$ | H |
| 438 | General formula (112) | CN | General formula (112) | Cl | General formula (112) | H | H | Cl | H |
| 439 | General formula (112) | CN | General formula (112) | Cl | General formula (112) | H | H | F | H |
| 440 | General formula (112) | CN | General formula (112) | F | General formula (112) | H | H | H | H |
| 441 | General formula (112) | CN | General formula (112) | F | General formula (112) | H | H | $CH_3$ | H |
| 442 | General formula (112) | CN | General formula (112) | F | General formula (112) | H | H | $CH_3O$ | H |
| 443 | General formula (112) | CN | General formula (112) | F | General formula (112) | H | H | t-$C_4H_9$ | H |

TABLE 2-3-continued

| Compound | General formula (1) | | | | General formula (112) | | | |
|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 444 | General formula (112) | CN | General formula (112) | F | General formula (112) | H | H | Cl | H |
| 445 | General formula (112) | CN | General formula (112) | F | General formula (112) | H | H | F | H |
| 446 | General formula (112) | CN | General formula (112) | $CH_3O$ | General formula (112) | H | H | H | H |
| 447 | General formula (112) | CN | General formula (112) | $CH_3O$ | General formula (112) | H | H | $CH_3$ | H |
| 448 | General formula (112) | CN | General formula (112) | $CH_3O$ | General formula (112) | H | H | $CH_3O$ | H |
| 449 | General formula (112) | CN | General formula (112) | $CH_3O$ | General formula (112) | H | H | t-$C_4H_9$ | H |
| 450 | General formula (112) | CN | General formula (112) | $CH_3O$ | General formula (112) | H | H | Cl | H |
| 451 | General formula (112) | CN | General formula (112) | $CH_3O$ | General formula (112) | H | H | F | H |
| 452 | General formula (112) | CN | General formula (112) | $C_2H_5O$ | General formula (112) | H | H | H | H |
| 453 | General formula (112) | CN | General formula (112) | $C_2H_5O$ | General formula (112) | H | H | $CH_3$ | H |
| 454 | General formula (112) | CN | General formula (112) | $C_2H_5O$ | General formula (112) | H | H | $CH_3O$ | H |
| 455 | General formula (112) | CN | General formula (112) | $C_2H_5O$ | General formula (112) | H | H | t-$C_4H_9$ | H |
| 456 | General formula (112) | CN | General formula (112) | $C_2H_5O$ | General formula (112) | H | H | Cl | H |
| 457 | General formula (112) | CN | General formula (112) | $C_2H_5O$ | General formula (112) | H | H | F | H |
| 458 | General formula (112) | CN | General formula (112) | $C_6H_5O$ | General formula (112) | H | H | H | H |
| 459 | General formula (112) | CN | General formula (112) | $C_6H_5O$ | General formula (112) | H | H | $CH_3$ | H |
| 460 | General formula (112) | CN | General formula (112) | $C_6H_5O$ | General formula (112) | H | H | $CH_3O$ | H |

TABLE 2-4

| Compound | General formula (1) | | | | General formula (112) | | | |
|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 461 | General formula (112) | CN | General formula (112) | $C_6H_5O$ | General formula (112) | H | H | t-$C_4H_9$ | H |
| 462 | General formula (112) | CN | General formula (112) | $C_6H_5O$ | General formula (112) | H | H | Cl | H |
| 463 | General formula (112) | CN | General formula (112) | $C_6H_5O$ | General formula (112) | H | H | F | H |
| 464 | General formula (112) | CN | General formula (112) | Formula (121) | General formula (112) | H | H | H | H |
| 465 | General formula (112) | CN | General formula (112) | Formula (121) | General formula (112) | H | H | $CH_3$ | H |
| 466 | General formula (112) | CN | General formula (112) | Formula (121) | General formula (112) | H | H | $CH_3O$ | H |
| 467 | General formula (112) | CN | General formula (112) | Formula (121) | General formula (112) | H | H | t-$C_4H_9$ | H |
| 468 | General formula (112) | CN | General formula (112) | Formula (121) | General formula (112) | H | H | Cl | H |
| 469 | General formula (112) | CN | General formula (112) | Formula (121) | General formula (112) | H | H | F | H |
| 470 | General formula (112) | CN | General formula (112) | Formula (122) | General formula (112) | H | H | H | H |
| 471 | General formula (112) | CN | General formula (112) | Formula (122) | General formula (112) | H | H | $CH_3$ | H |
| 472 | General formula (112) | CN | General formula (112) | Formula (122) | General formula (112) | H | H | $CH_3O$ | H |
| 473 | General formula (112) | CN | General formula (112) | Formula (122) | General formula (112) | H | H | t-$C_4H_9$ | H |
| 474 | General formula (112) | CN | General formula (112) | Formula (122) | General formula (112) | H | H | Cl | H |
| 475 | General formula (112) | CN | General formula (112) | Formula (122) | General formula (112) | H | H | F | H |
| 476 | General formula (112) | CN | General formula (112) | Formula (123) | General formula (112) | H | H | H | H |

TABLE 2-4-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 477 | General formula (112) | CN | General formula (112) | Formula (123) | General formula (112) | H | H | $CH_3$ | H |
| 478 | General formula (112) | CN | General formula (112) | Formula (123) | General formula (112) | H | H | $CH_3O$ | H |
| 479 | General formula (112) | CN | General formula (112) | Formula (123) | General formula (112) | H | H | t-$C_4H_9$ | H |
| 480 | General formula (112) | CN | General formula (112) | Formula (123) | General formula (112) | H | H | Cl | H |
| 481 | General formula (112) | CN | General formula (112) | Formula (123) | General formula (112) | H | H | F | H |
| 482 | General formula (112) | CN | General formula (112) | Formula (124) | General formula (112) | H | H | H | H |
| 483 | General formula (112) | CN | General formula (112) | Formula (124) | General formula (112) | H | H | $CH_3$ | H |
| 484 | General formula (112) | CN | General formula (112) | Formula (124) | General formula (112) | H | H | $CH_3O$ | H |
| 485 | General formula (112) | CN | General formula (112) | Formula (124) | General formula (112) | H | H | t-$C_4H_9$ | H |
| 486 | General formula (112) | CN | General formula (112) | Formula (124) | General formula (112) | H | H | Cl | H |
| 487 | General formula (112) | CN | General formula (112) | Formula (124) | General formula (112) | H | H | F | H |
| 488 | General formula (112) | CN | General formula (112) | General formula (112) | General formula (112) | H | $C_6H_5$ | H | H |
| 489 | General formula (112) | CN | General formula (112) | General formula (112) | General formula (112) | H | H | $C_6H_5$ | H |
| 490 | General formula (112) | CN | General formula (112) | General formula (112) | H | H | $C_6H_5$ | H | H |
| 491 | General formula (112) | CN | General formula (112) | General formula (112) | H | H | H | $C_6H_5$ | H |
| 492 | General formula (112) | CN | General formula (112) | H | General formula (112) | H | $C_6H_5$ | H | H |
| 493 | General formula (112) | CN | General formula (112) | H | General formula (112) | H | H | $C_6H_5$ | H |
| 494 | General formula (112) | CN | H | General formula (112) | General formula (112) | H | $C_6H_5$ | H | H |
| 495 | General formula (112) | CN | H | General formula (112) | General formula (112) | H | H | $C_6H_5$ | H |
| 496 | H | CN | General formula (112) | General formula (112) | General formula (112) | H | $C_6H_5$ | H | H |
| 497 | H | CN | General formula (112) | General formula (112) | General formula (112) | H | H | $C_6H_5$ | H |
| 498 | General formula (112) | CN | General formula (112) | H | H | H | $C_6H_5$ | H | H |
| 499 | General formula (112) | CN | General formula (112) | H | H | H | H | $C_6H_5$ | H |
| 500-1 | General formula (112) | CN | H | General formula (112) | H | H | $C_6H_5$ | H | H |
| 500-2 | General formula (112) | CN | H | General formula (112) | H | H | H | $C_6H_5$ | H |
| 500-3 | H | CN | General formula (112) | General formula (112) | H | H | $C_6H_5$ | H | H |
| 500-4 | H | CN | General formula (112) | General formula (112) | H | H | H | $C_6H_5$ | H |
| 500-5 | General formula (112) | CN | H | H | General formula (112) | H | $C_6H_5$ | H | H |
| 500-6 | General formula (112) | CN | H | H | General formula (112) | H | H | $C_6H_5$ | H |
| 500-7 | H | CN | General formula (112) | H | General formula (112) | H | $C_6H_5$ | H | H |
| 500-8 | H | CN | General formula (112) | H | General formula (112) | H | H | $C_6H_5$ | H |
| 500-9 | H | CN | H | General formula (112) | General formula (112) | H | $C_6H_5$ | H | H |
| 500-10 | H | CN | H | General formula (112) | General formula (112) | H | H | $C_6H_5$ | H |
| 500-11 | General formula (112) | CN | H | H | H | H | $C_6H_5$ | H | H |
| 500-12 | General formula (112) | CN | H | H | H | H | H | $C_6H_5$ | H |
| 500-13 | H | CN | General formula (112) | H | H | H | $C_6H_5$ | H | H |

TABLE 2-4-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 500-14 | H | CN | General formula (112) | H | H | H | H | $C_6H_5$ | H |
| 500-15 | H | CN | H | General formula (112) | H | H | $C_6H_5$ | H | H |

TABLE 2-5

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 500-16 | H | CN | H | General formula (112) | H | H | H | $C_6H_5$ | H |
| 500-17 | General formula (112) | CN | General formula (112) | General formula (112) | F | H | H | $C_6H_5$ | H |
| 500-18 | General formula (112) | CN | General formula (112) | F | General formula (112) | H | H | $C_6H_5$ | H |
| 500-19 | General formula (112) | CN | F | General formula (112) | General formula (112) | H | H | $C_6H_5$ | H |
| 500-20 | F | CN | General formula (112) | General formula (112) | General formula (112) | H | H | $C_6H_5$ | H |
| 500-21 | General formula (112) | CN | General formula (112) | F | F | H | H | $C_6H_5$ | H |
| 500-22 | General formula (112) | CN | F | General formula (112) | F | H | H | $C_6H_5$ | H |
| 500-23 | F | CN | General formula (112) | General formula (112) | F | H | H | $C_6H_5$ | H |
| 500-24 | General formula (112) | CN | F | F | General formula (112) | H | H | $C_6H_5$ | H |
| 500-25 | F | CN | General formula (112) | F | General formula (112) | H | H | $C_6H_5$ | H |
| 500-26 | F | CN | F | General formula (112) | General formula (112) | H | H | $C_6H_5$ | H |
| 500-27 | General formula (112) | CN | F | F | F | H | H | $C_6H_5$ | H |
| 500-28 | F | CN | General formula (112) | F | F | H | H | $C_6H_5$ | H |
| 500-29 | F | CN | F | General formula (112) | F | H | H | $C_6H_5$ | H |
| 500-30 | General formula (112) | CN | General formula (112) | General formula (112) | OH | H | H | $C_6H_5$ | H |
| 500-31 | General formula (112) | CN | General formula (112) | OH | General formula (112) | H | H | $C_6H_5$ | H |
| 500-32 | General formula (112) | CN | OH | General formula (112) | General formula (112) | H | H | $C_6H_5$ | H |
| 500-33 | OH | CN | General formula (112) | General formula (112) | General formula (112) | H | H | $C_6H_5$ | H |
| 500-34 | General formula (112) | CN | General formula (112) | OH | OH | H | H | $C_6H_5$ | H |
| 500-35 | General formula (112) | CN | OH | General formula (112) | OH | H | H | $C_6H_5$ | H |
| 500-36 | OH | CN | General formula (112) | General formula (112) | OH | H | H | $C_6H_5$ | H |
| 500-37 | General formula (112) | CN | OH | OH | General formula (112) | H | H | $C_6H_5$ | H |
| 500-38 | OH | CN | General formula (112) | OH | General formula (112) | H | H | $C_6H_5$ | H |
| 500-39 | OH | CN | OH | General formula (112) | General formula (112) | H | H | $C_6H_5$ | H |
| 500-40 | General formula (112) | CN | OH | OH | OH | H | H | $C_6H_5$ | H |
| 500-41 | OH | CN | General formula (112) | OH | OH | H | H | $C_6H_5$ | H |
| 500-42 | OH | CN | OH | General formula (112) | OH | H | H | $C_6H_5$ | H |
| 500-43 | OH | CN | OH | OH | General formula (112) | H | H | $C_6H_5$ | H |
| 500-44 | General formula (112) | CN | General formula (112) | Cl | General formula (112) | H | H | $C_6H_5$ | H |
| 500-45 | General formula (112) | CN | General formula (112) | F | General formula (112) | H | H | $C_6H_5$ | H |
| 500-46 | General formula (112) | CN | General formula (112) | $CH_3O$ | General formula (112) | H | H | $C_6H_5$ | H |

TABLE 2-5-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 500-47 | General formula (112) | CN | General formula (112) | $C_2H_5O$ | General formula (112) | H | H | $C_6H_5$ | H |
| 500-48 | General formula (112) | CN | General formula (112) | $C_6H_5O$ | General formula (112) | H | H | $C_6H_5$ | H |
| 500-49 | General formula (112) | CN | General formula (112) | Formula (121) | General formula (112) | H | H | $C_6H_5$ | H |
| 500-50 | General formula (112) | CN | General formula (112) | Formula (122) | General formula (112) | H | H | $C_6H_5$ | H |
| 500-51 | General formula (112) | CN | General formula (112) | Formula (123) | General formula (112) | H | H | $C_6H_5$ | H |
| 500-52 | General formula (112) | CN | General formula (112) | Formula (124) | General formula (112) | H | H | $C_6H_5$ | H |

TABLE 3-1

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 501 | CN | General formula (112) | General formula (112) | General formula (112) | General formula (112) | H | H | H | H |
| 502 | CN | General formula (112) | General formula (112) | General formula (112) | General formula (112) | H | $CH_3$ | H | H |
| 503 | CN | General formula (112) | General formula (112) | General formula (112) | General formula (112) | H | $CH_3O$ | H | H |
| 504 | CN | General formula (112) | General formula (112) | General formula (112) | General formula (112) | H | H | $CH_3$ | H |
| 505 | CN | General formula (112) | General formula (112) | General formula (112) | General formula (112) | H | H | $CH_3O$ | H |
| 506 | CN | General formula (112) | General formula (112) | General formula (112) | General formula (112) | H | H | t-$C_4H_9$ | H |
| 507 | CN | General formula (112) | General formula (112) | General formula (112) | General formula (112) | H | H | Cl | H |
| 508 | CN | General formula (112) | General formula (112) | General formula (112) | General formula (112) | H | H | F | H |
| 509 | CN | General formula (112) | General formula (112) | General formula (112) | General formula (112) | H | H | H | $CH_3$ |
| 510 | CN | General formula (112) | General formula (112) | General formula (112) | General formula (112) | H | H | H | $CH_3O$ |
| 511 | CN | General formula (112) | General formula (112) | General formula (112) | H | H | H | H | H |
| 512 | CN | General formula (112) | General formula (112) | General formula (112) | H | H | H | $CH_3$ | H |
| 513 | CN | General formula (112) | General formula (112) | General formula (112) | H | H | H | $CH_3O$ | H |
| 514 | CN | General formula (112) | General formula (112) | H | General formula (112) | H | H | H | H |
| 515 | CN | General formula (112) | General formula (112) | H | General formula (112) | H | H | $CH_3$ | H |
| 516 | CN | General formula (112) | General formula (112) | H | General formula (112) | H | H | $CH_3O$ | H |
| 517 | CN | General formula (112) | General formula (112) | H | H | H | H | H | H |
| 518 | CN | General formula (112) | General formula (112) | H | H | H | H | $CH_3$ | H |
| 519 | CN | General formula (112) | General formula (112) | H | H | H | H | $CH_3O$ | H |
| 520 | CN | General formula (112) | H | General formula (112) | H | H | H | H | H |
| 521 | CN | General formula (112) | H | General formula (112) | H | H | H | $CH_3$ | H |
| 522 | CN | General formula (112) | H | General formula (112) | H | H | H | $CH_3O$ | H |
| 523 | CN | H | General formula (112) | General formula (112) | H | H | H | H | H |
| 524 | CN | H | General formula (112) | General formula (112) | H | H | H | $CH_3$ | H |
| 525 | CN | H | General formula (112) | General formula (112) | H | H | H | $CH_3O$ | H |
| 526 | CN | General formula (112) | H | H | General formula (112) | H | H | H | H |
| 527 | CN | General formula (112) | H | H | General formula (112) | H | H | $CH_3$ | H |

TABLE 3-1-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 528 | CN | General formula (112) | H | H | General formula (112) | H | H | $CH_3O$ | H |
| 529 | CN | General formula (112) | H | H | H | H | H | H | H |
| 530 | CN | General formula (112) | H | H | H | H | H | $CH_3$ | H |
| 531 | CN | General formula (112) | H | H | H | H | H | $CH_3O$ | H |
| 532 | CN | H | General formula (112) | H | H | H | H | H | H |
| 533 | CN | H | General formula (112) | H | H | H | H | $CH_3$ | H |
| 534 | CN | H | General formula (112) | H | H | H | H | $CH_3O$ | H |
| 535 | CN | General formula (112) | General formula (112) | General formula (112) | F | H | H | H | H |
| 536 | CN | General formula (112) | General formula (112) | General formula (112) | F | H | H | $CH_3$ | H |
| 537 | CN | General formula (112) | General formula (112) | General formula (112) | F | H | H | $CH_3O$ | H |
| 538 | CN | General formula (112) | General formula (112) | F | General formula (112) | H | H | H | H |
| 539 | CN | General formula (112) | General formula (112) | F | General formula (112) | H | H | $CH_3$ | H |
| 540 | CN | General formula (112) | General formula (112) | F | General formula (112) | H | H | $CH_3O$ | H |
| 541 | CN | General formula (112) | General formula (112) | F | F | H | H | H | H |
| 542 | CN | General formula (112) | General formula (112) | F | F | H | H | $CH_3$ | H |
| 543 | CN | General formula (112) | General formula (112) | F | F | H | H | $CH_3O$ | H |
| 544 | CN | General formula (112) | F | General formula (112) | F | H | H | H | H |
| 545 | CN | General formula (112) | F | General formula (112) | F | H | H | $CH_3$ | H |
| 546 | CN | General formula (112) | F | General formula (112) | F | H | H | $CH_3O$ | H |
| 547 | CN | F | General formula (112) | General formula (112) | F | H | H | H | H |
| 548 | CN | F | General formula (112) | General formula (112) | F | H | H | $CH_3$ | H |
| 549 | CN | F | General formula (112) | General formula (112) | F | H | H | $CH_3O$ | H |
| 550 | CN | General formula (112) | F | F | General formula (112) | H | H | H | H |
| 551 | CN | General formula (112) | F | F | General formula (112) | H | H | $CH_3$ | H |
| 552 | CN | General formula (112) | F | F | General formula (112) | H | H | $CH_3O$ | H |
| 553 | CN | General formula (112) | F | F | F | H | H | H | H |
| 554 | CN | General formula (112) | F | F | F | H | H | $CH_3$ | H |
| 555 | CN | General formula (112) | F | F | F | H | H | $CH_3O$ | H |
| 556 | CN | F | General formula (112) | F | F | H | H | H | H |
| 557 | CN | F | General formula (112) | F | F | H | H | $CH_3$ | H |
| 558 | CN | F | General formula (112) | F | F | H | H | $CH_3O$ | H |
| 559 | CN | General formula (112) | General formula (112) | General formula (112) | OH | H | H | H | H |

TABLE 3-2

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 560 | CN | General formula (112) | General formula (112) | General formula (112) | OH | H | H | $CH_3$ | H |

TABLE 3-2-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 561 | CN | General formula (112) | General formula (112) | General formula (112) | OH | H | H | $CH_3O$ | H |
| 562 | CN | General formula (112) | General formula (112) | OH | General formula (112) | H | H | H | H |
| 563 | CN | General formula (112) | General formula (112) | OH | General formula (112) | H | H | $CH_3$ | H |
| 654 | CN | General formula (112) | General formula (112) | OH | General formula (112) | H | H | $CH_3O$ | H |
| 565 | CN | General formula (112) | General formula (112) | OH | General formula (112) | H | H | Cl | H |
| 566 | CN | General formula (112) | General formula (112) | OH | General formula (112) | H | H | F | H |
| 567 | CN | General formula (112) | General formula (112) | OH | OH | H | H | H | H |
| 568 | CN | General formula (112) | General formula (112) | OH | OH | H | H | $CH_3$ | H |
| 569 | CN | General formula (112) | General formula (112) | OH | OH | H | H | $CH_3O$ | H |
| 570 | CN | General formula (112) | OH | General formula (112) | OH | H | H | H | H |
| 571 | CN | General formula (112) | OH | General formula (112) | OH | H | H | $CH_3$ | H |
| 572 | CN | General formula (112) | OH | General formula (112) | OH | H | H | $CH_3O$ | H |
| 573 | CN | OH | General formula (112) | General formula (112) | OH | H | H | H | H |
| 574 | CN | OH | General formula (112) | General formula (112) | OH | H | H | $CH_3$ | H |
| 575 | CN | OH | General formula (112) | General formula (112) | OH | H | H | $CH_3O$ | H |
| 576 | CN | General formula (112) | OH | OH | General formula (112) | H | H | H | H |
| 577 | CN | General formula (112) | OH | OH | General formula (112) | H | H | $CH_3$ | H |
| 578 | CN | General formula (112) | OH | OH | General formula (112) | H | H | $CH_3O$ | H |
| 579 | CN | General formula (112) | OH | OH | OH | H | H | H | H |
| 580 | CN | General formula (112) | OH | OH | OH | H | H | $CH_3$ | H |
| 581 | CN | General formula (112) | OH | OH | OH | H | H | $CH_3O$ | H |
| 582 | CN | OH | General formula (112) | OH | OH | H | H | H | H |
| 583 | CN | OH | General formula (112) | OH | OH | H | H | $CH_3$ | H |
| 584 | CN | OH | General formula (112) | OH | OH | H | H | $CH_3O$ | H |
| 585 | CN | General formula (112) | General formula (112) | Cl | General formula (112) | H | H | H | H |
| 586 | CN | General formula (112) | General formula (112) | Cl | General formula (112) | H | H | $CH_3$ | H |
| 587 | CN | General formula (112) | General formula (112) | Cl | General formula (112) | H | H | $CH_3O$ | H |
| 588 | CN | General formula (112) | General formula (112) | Cl | General formula (112) | H | H | t-$C_4H_9$ | H |
| 589 | CN | General formula (112) | General formula (112) | Cl | General formula (112) | H | H | Cl | H |
| 590 | CN | General formula (112) | General formula (112) | Cl | General formula (112) | H | H | F | H |
| 591 | CN | General formula (112) | General formula (112) | F | General formula (112) | H | H | H | H |
| 592 | CN | General formula (112) | General formula (112) | F | General formula (112) | H | H | $CH_3$ | H |
| 593 | CN | General formula (112) | General formula (112) | F | General formula (112) | H | H | $CH_3O$ | H |
| 594 | CN | General formula (112) | General formula (112) | F | General formula (112) | H | H | t-$C_4H_9$ | H |
| 595 | CN | General formula (112) | General formula (112) | F | General formula (112) | H | H | Cl | H |
| 596 | CN | General formula (112) | General formula (112) | F | General formula (112) | H | H | F | H |
| 597 | CN | General formula (112) | General formula (112) | $CH_3O$ | General formula (112) | H | H | H | H |
| 598 | CN | General formula (112) | General formula (112) | $CH_3O$ | General formula (112) | H | H | $CH_3$ | H |

TABLE 3-2-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 599 | CN | General formula (112) | General formula (112) | $CH_3O$ | General formula (112) | H | H | $CH_3O$ | H |
| 600 | CN | General formula (112) | General formula (112) | $CH_3O$ | General formula (112) | H | H | t-$C_4H_9$ | H |
| 601 | CN | General formula (112) | General formula (112) | $CH_3O$ | General formula (112) | H | H | Cl | H |
| 602 | CN | General formula (112) | General formula (112) | $CH_3O$ | General formula (112) | H | H | F | H |
| 603 | CN | General formula (112) | General formula (112) | $C_2H_5O$ | General formula (112) | H | H | H | H |
| 604 | CN | General formula (112) | General formula (112) | $C_2H_5O$ | General formula (112) | H | H | $CH_3$ | H |
| 605 | CN | General formula (112) | General formula (112) | $C_2H_5O$ | General formula (112) | H | H | $CH_3O$ | H |
| 606 | CN | General formula (112) | General formula (112) | $C_2H_5O$ | General formula (112) | H | H | t-$C_4H_9$ | H |
| 607 | CN | General formula (112) | General formula (112) | $C_2H_5O$ | General formula (112) | H | H | Cl | H |
| 608 | CN | General formula (112) | General formula (112) | $C_2H_5O$ | General formula (112) | H | H | F | H |
| 609 | CN | General formula (112) | General formula (112) | $C_6H_5O$ | General formula (112) | H | H | H | H |
| 610 | CN | General formula (112) | General formula (112) | $C_6H_5O$ | General formula (112) | H | H | $CH_3$ | H |
| 611 | CN | General formula (112) | General formula (112) | $C_6H_5O$ | General formula (112) | H | H | $CH_3O$ | H |
| 612 | CN | General formula (112) | General formula (112) | $C_6H_5O$ | General formula (112) | H | H | t-$C_4H_9$ | H |
| 613 | CN | General formula (112) | General formula (112) | $C_6H_5O$ | General formula (112) | H | H | Cl | H |
| 614 | CN | General formula (112) | General formula (112) | $C_6H_5O$ | General formula (112) | H | H | F | H |
| 615 | CN | General formula (112) | General formula (112) | Formula (121) | General formula (112) | H | H | H | H |
| 616 | CN | General formula (112) | General formula (112) | Formula (121) | General formula (112) | H | H | $CH_3$ | H |
| 617 | CN | General formula (112) | General formula (112) | Formula (121) | General formula (112) | H | H | $CH_3O$ | H |
| 618 | CN | General formula (112) | General formula (112) | Formula (121) | General formula (112) | H | H | t-$C_4H_9$ | H |
| 619 | CN | General formula (112) | General formula (112) | Formula (121) | General formula (112) | H | H | Cl | H |
| 620 | CN | General formula (112) | General formula (112) | Formula (121) | General formula (112) | H | H | F | H |

TABLE 3-3

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 621 | CN | General formula (112) | General formula (112) | Formula (122) | General formula (112) | H | H | H | H |
| 622 | CN | General formula (112) | General formula (112) | Formula (122) | General formula (112) | H | H | $CH_3$ | H |
| 623 | CN | General formula (112) | General formula (112) | Formula (122) | General formula (112) | H | H | $CH_3O$ | H |
| 624 | CN | General formula (112) | General formula (112) | Formula (122) | General formula (112) | H | H | t-$C_4H_9$ | H |
| 625 | CN | General formula (112) | General formula (112) | Formula (122) | General formula (112) | H | H | Cl | H |
| 626 | CN | General formula (112) | General formula (112) | Formula (122) | General formula (112) | H | H | F | H |
| 627 | CN | General formula (112) | General formula (112) | Formula (123) | General formula (112) | H | H | H | H |
| 628 | CN | General formula (112) | General formula (112) | Formula (123) | General formula (112) | H | H | $CH_3$ | H |
| 629 | CN | General formula (112) | General formula (112) | Formula (123) | General formula (112) | H | H | $CH_3O$ | H |
| 630 | CN | General formula (112) | General formula (112) | Formula (123) | General formula (112) | H | H | t-$C_4H_9$ | H |
| 631 | CN | General formula (112) | General formula (112) | Formula (123) | General formula (112) | H | H | Cl | H |

TABLE 3-3-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 632 | CN | General formula (112) | General formula (112) | Formula (123) | General formula (112) | H | H | F | H |
| 633 | CN | General formula (112) | General formula (112) | Formula (124) | General formula (112) | H | H | H | H |
| 634 | CN | General formula (112) | General formula (112) | Formula (124) | General formula (112) | H | H | $CH_3$ | H |
| 635 | CN | General formula (112) | General formula (112) | Formula (124) | General formula (112) | H | H | $CH_3O$ | H |
| 636 | CN | General formula (112) | General formula (112) | Formula (124) | General formula (112) | H | H | t-$C_4H_9$ | H |
| 637 | CN | General formula (112) | General formula (112) | Formula (124) | General formula (112) | H | H | Cl | H |
| 638 | CN | General formula (112) | General formula (112) | Formula (124) | General formula (112) | H | H | F | H |
| 639 | CN | General formula (112) | General formula (112) | General formula (112) | General formula (112) | H | $C_6H_5$ | H | H |
| 640 | CN | General formula (112) | General formula (112) | General formula (112) | General formula (112) | H | H | $C_6H_5$ | H |
| 641 | CN | General formula (112) | General formula (112) | General formula (112) | H | H | $C_6H_5$ | H | H |
| 642 | CN | General formula (112) | General formula (112) | General formula (112) | H | H | H | $C_6H_5$ | H |
| 643 | CN | General formula (112) | General formula (112) | H | General formula (112) | H | $C_6H_5$ | H | H |
| 644 | CN | General formula (112) | General formula (112) | H | General formula (112) | H | H | $C_6H_5$ | H |
| 645 | CN | General formula (112) | General formula (112) | H | H | H | $C_6H_5$ | H | H |
| 646 | CN | General formula (112) | General formula (112) | H | H | H | H | $C_6H_5$ | H |
| 647 | CN | General formula (112) | H | General formula (112) | H | H | $C_6H_5$ | H | H |
| 648 | CN | General formula (112) | H | General formula (112) | H | H | H | $C_6H_5$ | H |
| 649 | CN | H | General formula (112) | General formula (112) | H | H | $C_6H_5$ | H | H |
| 650 | CN | H | General formula (112) | General formula (112) | H | H | H | $C_6H_5$ | H |
| 651 | CN | H | H | General formula (112) | General formula (112) | H | $C_6H_5$ | H | H |
| 652 | CN | H | H | General formula (112) | General formula (112) | H | H | $C_6H_5$ | H |
| 653 | CN | General formula (112) | H | H | H | H | $C_6H_5$ | H | H |
| 654 | CN | General formula (112) | H | H | H | H | H | $C_6H_5$ | H |
| 655 | CN | H | General formula (112) | H | H | H | $C_6H_5$ | H | H |
| 656 | CN | H | General formula (112) | H | H | H | H | $C_6H_5$ | H |
| 657 | CN | General formula (112) | General formula (112) | General formula (112) | F | H | H | $C_6H_5$ | H |
| 658 | CN | General formula (112) | General formula (112) | F | General formula (112) | H | H | $C_6H_5$ | H |
| 659 | CN | General formula (112) | General formula (112) | F | F | H | H | $C_6H_5$ | H |
| 660 | CN | General formula (112) | F | General formula (112) | F | H | H | $C_6H_5$ | H |
| 661 | CN | F | General formula (112) | General formula (112) | F | H | H | $C_6H_5$ | H |
| 662 | CN | F | F | General formula (112) | General formula (112) | H | H | $C_6H_5$ | H |
| 663 | CN | General formula (112) | F | F | F | H | H | $C_6H_5$ | H |
| 664 | CN | F | General formula (112) | F | F | H | H | $C_6H_5$ | H |
| 665 | CN | General formula (112) | General formula (112) | General formula (112) | OH | H | H | $C_6H_5$ | H |
| 666 | CN | General formula (112) | General formula (112) | OH | General formula (112) | H | H | $C_6H_5$ | H |
| 667 | CN | General formula (112) | General formula (112) | OH | OH | H | H | $C_6H_5$ | H |
| 668 | CN | General formula (112) | OH | General formula (112) | OH | H | H | $C_6H_5$ | H |
| 669 | CN | OH | General formula (112) | General formula (112) | OH | H | H | $C_6H_5$ | H |

TABLE 3-3-continued

| Compound | General formula (1) | | | | | General formula (112) | | | |
|---|---|---|---|---|---|---|---|---|---|
| No. | $R^1$ | $R^2$ | $R^3$ | $R^4$ | $R^5$ | $R^{31}$, $R^{38}$ | $R^{32}$, $R^{37}$ | $R^{33}$, $R^{36}$ | $R^{34}$, $R^{35}$ |
| 670 | CN | OH | OH | General formula (112) | General formula (112) | H | H | $C_6H_5$ | H |
| 671 | CN | General formula (112) | OH | OH | OH | H | H | $C_6H_5$ | H |
| 672 | CN | OH | General formula (112) | OH | OH | H | H | $C_6H_5$ | H |
| 673 | CN | General formula (112) | General formula (112) | Cl | General formula (112) | H | H | $C_6H_5$ | H |
| 674 | CN | General formula (112) | General formula (112) | F | General formula (112) | H | H | $C_6H_5$ | H |
| 675 | CN | General formula (112) | General formula (112) | $CH_3O$ | General formula (112) | H | H | $C_6H_5$ | H |
| 676 | CN | General formula (112) | General formula (112) | $C_2H_5O$ | General formula (112) | H | H | $C_6H_5$ | H |
| 677 | CN | General formula (112) | General formula (112) | $C_6H_5O$ | General formula (112) | H | H | $C_6H_5$ | H |
| 678 | CN | General formula (112) | General formula (112) | Formula (121) | General formula (112) | H | H | $C_6H_5$ | H |
| 679 | CN | General formula (112) | General formula (112) | Formula (122) | General formula (112) | H | H | $C_6H_5$ | H |
| 680 | CN | General formula (112) | General formula (112) | Formula (123) | General formula (112) | H | H | $C_6H_5$ | H |
| 681 | CN | General formula (112) | General formula (112) | Formula (124) | General formula (112) | H | H | $C_6H_5$ | H |

TABLE 4-1

| Compound | General formula (1) | | | | | General formula (113) | | | | | |
|---|---|---|---|---|---|---|---|---|---|---|---|
| No. | $R^1$ | $R^2$ | $R^3$ | $R^4$ | $R^5$ | $R^{41}$ | $R^{42}$ | $R^{43}$ | $R^{44}$ | $R^{45}$ | $R^{46}$ |
| 701 | General formula (113) | General formula (113) | CN | General formula (113) | General formula (113) | H | H | H | H | H | H |
| 702 | General formula (113) | General formula (113) | CN | General formula (113) | General formula (113) | H | $CH_3$ | H | H | H | H |
| 703 | General formula (113) | General formula (113) | CN | General formula (113) | General formula (113) | H | $CH_3O$ | H | H | H | H |
| 704 | General formula (113) | General formula (113) | CN | General formula (113) | General formula (113) | H | H | $CH_3$ | H | H | H |
| 705 | General formula (113) | General formula (113) | CN | General formula (113) | General formula (113) | H | H | $CH_3O$ | H | H | H |
| 706 | General formula (113) | General formula (113) | CN | General formula (113) | General formula (113) | H | H | t-$C_4H_9$ | H | H | H |
| 707 | General formula (113) | General formula (113) | CN | General formula (113) | General formula (113) | H | H | Cl | H | H | H |
| 708 | General formula (113) | General formula (113) | CN | General formula (113) | General formula (113) | H | H | F | H | H | H |
| 709 | General formula (113) | General formula (113) | CN | General formula (113) | General formula (113) | H | H | H | $CH_3$ | H | H |
| 710 | General formula (113) | General formula (113) | CN | General formula (113) | General formula (113) | H | H | H | $CH_3O$ | H | H |
| 711 | General formula (113) | General formula (113) | CN | General formula (113) | General formula (113) | H | H | H | H | $CH_3$ | H |
| 712 | General formula (113) | General formula (113) | CN | General formula (113) | General formula (113) | H | H | H | H | $CH_3O$ | H |
| 713 | General formula (113) | General formula (113) | CN | General formula (113) | General formula (113) | H | H | H | H | t-$C_4H_9$ | H |
| 714 | General formula (113) | General formula (113) | CN | General formula (113) | General formula (113) | H | H | H | H | Cl | H |
| 715 | General formula (113) | General formula (113) | CN | General formula (113) | General formula (113) | H | H | H | H | F | H |
| 716 | General formula (113) | General formula (113) | CN | General formula (113) | General formula (113) | H | H | H | H | $C_6H_5$ | H |
| 717 | General formula (113) | General formula (113) | CN | General formula (113) | General formula (113) | H | H | H | H | p-$CH_3C_6H_4$ | H |
| 718 | General formula (113) | General formula (113) | CN | General formula (113) | General formula (113) | H | H | H | H | 2,4,6-$(CH_3)_3C_6H_2$ | H |
| 719 | General formula (113) | General formula (113) | CN | General formula (113) | General formula (113) | H | H | H | H | p-$CH_3OC_6H_4$ | H |
| 720 | General formula (113) | General formula (113) | CN | General formula (113) | General formula (113) | H | H | H | H | p-$(CH_3)_2NC_6H_4$ | H |

TABLE 4-1-continued

| Compound No. | General formula (1) R[1] | R[2] | R[3] | R[4] | R[5] | General formula (113) R[41] | R[42] | R[43] | R[44] | R[45] | R[46] |
|---|---|---|---|---|---|---|---|---|---|---|---|
| 721 | General formula (113) | General formula (113) | CN | General formula (113) | General formula (113) | H | H | H | H | p-$FC_6H_4$ | H |
| 722 | General formula (113) | General formula (113) | CN | General formula (113) | General formula (113) | H | H | H | H | p-$CNC_6H_4$ | H |
| 723 | General formula (113) | General formula (113) | CN | General formula (113) | General formula (113) | H | H | H | H | H | $CH_3$ |
| 724 | General formula (113) | General formula (113) | CN | General formula (113) | General formula (113) | H | H | H | H | H | $CH_3O$ |
| 725 | General formula (113) | General formula (113) | CN | General formula (113) | General formula (113) | H | H | H | H | H | t-$C_4H_9$ |
| 726 | General formula (113) | General formula (113) | CN | General formula (113) | General formula (113) | H | H | H | H | H | Cl |
| 727 | General formula (113) | General formula (113) | CN | General formula (113) | General formula (113) | H | H | H | H | H | F |
| 728 | General formula (113) | General formula (113) | CN | General formula (113) | General formula (113) | H | H | H | H | H | $C_6H_5$ |
| 729 | General formula (113) | General formula (113) | CN | General formula (113) | General formula (113) | H | H | H | H | H | p-$CH_3C_6H_4$ |
| 730 | General formula (113) | General formula (113) | CN | General formula (113) | General formula (113) | H | H | H | H | H | 2,4,6-$(CH_3)_3C_6H_2$ |
| 731 | General formula (113) | General formula (113) | CN | General formula (113) | General formula (113) | H | H | H | H | H | p-$CH_3OC_6H_4$ |
| 732 | General formula (113) | General formula (113) | CN | General formula (113) | General formula (113) | H | H | H | H | H | p-$(CH_3)_2NC_6H_4$ |
| 733 | General formula (113) | General formula (113) | CN | General formula (113) | General formula (113) | H | H | H | H | H | p-$FC_6H_4$ |
| 734 | General formula (113) | General formula (113) | CN | General formula (113) | General formula (113) | H | H | H | H | H | p-$CNC_6H_4$ |
| 735 | General formula (113) | General formula (113) | CN | General formula (113) | H | H | H | H | H | H | H |
| 736 | General formula (113) | General formula (113) | CN | H | General formula (113) | H | H | H | H | H | H |
| 737 | General formula (113) | General formula (113) | CN | H | H | H | H | H | H | H | H |
| 738 | General formula (113) | H | CN | General formula (113) | H | H | H | H | H | H | H |
| 739 | H | General formula (113) | CN | General formula (113) | H | H | H | H | H | H | H |
| 740 | General formula (113) | H | CN | H | H | H | H | H | H | H | H |
| 741 | General formula (113) | General formula (113) | CN | General formula (113) | F | H | H | H | H | H | H |
| 742 | General formula (113) | General formula (113) | CN | F | General formula (113) | H | H | H | H | H | H |
| 743 | General formula (113) | General formula (113) | CN | F | F | H | H | H | H | H | H |
| 744 | General formula (113) | F | CN | General formula (113) | F | H | H | H | H | H | H |
| 745 | F | General formula (113) | CN | General formula (113) | F | H | H | H | H | H | H |
| 746 | General formula (113) | F | CN | F | F | H | H | H | H | H | H |
| 747 | General formula (113) | General formula (113) | CN | General formula (113) | OH | H | H | H | H | H | H |
| 748 | General formula (113) | General formula (113) | CN | OH | General formula (113) | H | H | H | H | H | H |
| 749 | General formula (113) | General formula (113) | CN | OH | OH | H | H | H | H | H | H |
| 750 | General formula (113) | OH | CN | General formula (113) | OH | H | H | H | H | H | H |
| 751 | OH | General formula (113) | CN | General formula (113) | OH | H | H | H | H | H | H |
| 752 | General formula (113) | OH | CN | OH | OH | H | H | H | H | H | H |

TABLE 4-2

| Compound | General formula (1) | | | | | General formula (113) | | | | | |
|---|---|---|---|---|---|---|---|---|---|---|---|
| No. | $R^1$ | $R^2$ | $R^3$ | $R^4$ | $R^5$ | $R^{41}$ | $R^{42}$ | $R^{43}$ | $R^{44}$ | $R^{45}$ | $R^{46}$ |
| 753 | General formula (113) | General formula (113) | CN | Cl | General formula (113) | H | H | H | H | H | H |
| 754 | General formula (113) | General formula (113) | CN | Cl | General formula (113) | H | H | $CH_3$ | H | H | H |
| 755 | General formula (113) | General formula (113) | CN | Cl | General formula (113) | H | H | $CH_3O$ | H | H | H |
| 756 | General formula (113) | General formula (113) | CN | Cl | General formula (113) | H | H | t-$C_4H_9$ | H | H | H |
| 757 | General formula (113) | General formula (113) | CN | Cl | General formula (113) | H | H | Cl | H | H | H |
| 758 | General formula (113) | General formula (113) | CN | Cl | General formula (113) | H | H | F | H | H | H |
| 759 | General formula (113) | General formula (113) | CN | F | General formula (113) | H | H | H | H | H | H |
| 760 | General formula (113) | General formula (113) | CN | F | General formula (113) | H | H | $CH_3$ | H | H | H |
| 761 | General formula (113) | General formula (113) | CN | F | General formula (113) | H | H | $CH_3O$ | H | H | H |
| 762 | General formula (113) | General formula (113) | CN | F | General formula (113) | H | H | t-$C_4H_9$ | H | H | H |
| 763 | General formula (113) | General formula (113) | CN | F | General formula (113) | H | H | Cl | H | H | H |
| 764 | General formula (113) | General formula (113) | CN | F | General formula (113) | H | H | F | H | H | H |
| 765 | General formula (113) | General formula (113) | CN | $CH_3O$ | General formula (113) | H | H | H | H | H | H |
| 766 | General formula (113) | General formula (113) | CN | $CH_3O$ | General formula (113) | H | H | $CH_3$ | H | H | H |
| 767 | General formula (113) | General formula (113) | CN | $CH_3O$ | General formula (113) | H | H | $CH_3O$ | H | H | H |
| 768 | General formula (113) | General formula (113) | CN | $CH_3O$ | General formula (113) | H | H | t-$C_4H_9$ | H | H | H |
| 769 | General formula (113) | General formula (113) | CN | $CH_3O$ | General formula (113) | H | H | Cl | H | H | H |
| 770 | General formula (113) | General formula (113) | CN | $CH_3O$ | General formula (113) | H | H | F | H | H | H |
| 771 | General formula (113) | General formula (113) | CN | $C_2H_5O$ | General formula (113) | H | H | H | H | H | H |
| 772 | General formula (113) | General formula (113) | CN | $C_2H_5O$ | General formula (113) | H | H | $CH_3$ | H | H | H |
| 773 | General formula (113) | General formula (113) | CN | $C_2H_5O$ | General formula (113) | H | H | $CH_3O$ | H | H | H |
| 774 | General formula (113) | General formula (113) | CN | $C_2H_5O$ | General formula (113) | H | H | t-$C_4H_9$ | H | H | H |
| 775 | General formula (113) | General formula (113) | CN | $C_2H_5O$ | General formula (113) | H | H | Cl | H | H | H |
| 776 | General formula (113) | General formula (113) | CN | $C_2H_5O$ | General formula (113) | H | H | F | H | H | H |
| 777 | General formula (113) | General formula (113) | CN | $C_6H_5O$ | General formula (113) | H | H | H | H | H | H |
| 778 | General formula (113) | General formula (113) | CN | $C_6H_5O$ | General formula (113) | H | H | $CH_3$ | H | H | H |
| 779 | General formula (113) | General formula (113) | CN | $C_6H_5O$ | General formula (113) | H | H | $CH_3O$ | H | H | H |
| 780 | General formula (113) | General formula (113) | CN | $C_6H_5O$ | General formula (113) | H | H | t-$C_4H_9$ | H | H | H |
| 781 | General formula (113) | General formula (113) | CN | $C_6H_5O$ | General formula (113) | H | H | Cl | H | H | H |
| 782 | General formula (113) | General formula (113) | CN | $C_6H_5O$ | General formula (113) | H | H | F | H | H | H |
| 783 | General formula (113) | General formula (113) | CN | Formula (121) | General formula (113) | H | H | H | H | H | H |
| 784 | General formula (113) | General formula (113) | CN | Formula (121) | General formula (113) | H | H | $CH_3$ | H | H | H |
| 785 | General formula (113) | General formula (113) | CN | Formula (121) | General formula (113) | H | H | $CH_3O$ | H | H | H |
| 786 | General formula (113) | General formula (113) | CN | Formula (121) | General formula (113) | H | H | t-$C_4H_9$ | H | H | H |
| 787 | General formula (113) | General formula (113) | CN | Formula (121) | General formula (113) | H | H | Cl | H | H | H |
| 788 | General formula (113) | General formula (113) | CN | Formula (121) | General formula (113) | H | H | F | H | H | H |
| 789 | General formula (113) | General formula (113) | CN | Formula (122) | General formula (113) | H | H | H | H | H | H |

TABLE 4-2-continued

| Compound No. | General formula (1) R¹ | R² | R³ | R⁴ | R⁵ | General formula (113) R⁴¹ | R⁴² | R⁴³ | R⁴⁴ | R⁴⁵ | R⁴⁶ |
|---|---|---|---|---|---|---|---|---|---|---|---|
| 790 | General formula (113) | General formula (113) | CN | Formula (122) | General formula (113) | H | H | $CH_3$ | H | H | H |
| 791 | General formula (113) | General formula (113) | CN | Formula (122) | General formula (113) | H | H | $CH_3O$ | H | H | H |
| 792 | General formula (113) | General formula (113) | CN | Formula (122) | General formula (113) | H | H | t-$C_4H_9$ | H | H | H |
| 793 | General formula (113) | General formula (113) | CN | Formula (122) | General formula (113) | H | H | Cl | H | H | H |
| 794 | General formula (113) | General formula (113) | CN | Formula (122) | General formula (113) | H | H | F | H | H | H |
| 795 | General formula (113) | General formula (113) | CN | Formula (123) | General formula (113) | H | H | H | H | H | H |
| 796 | General formula (113) | General formula (113) | CN | Formula (123) | General formula (113) | H | H | $CH_3$ | H | H | H |
| 797 | General formula (113) | General formula (113) | CN | Formula (123) | General formula (113) | H | H | $CH_3O$ | H | H | H |
| 798 | General formula (113) | General formula (113) | CN | Formula (123) | General formula (113) | H | H | t-$C_4H_9$ | H | H | H |
| 799 | General formula (113) | General formula (113) | CN | Formula (123) | General formula (113) | H | H | Cl | H | H | H |
| 800 | General formula (113) | General formula (113) | CN | Formula (123) | General formula (113) | H | H | F | H | H | H |
| 801 | General formula (113) | General formula (113) | CN | Formula (124) | General formula (113) | H | H | H | H | H | H |
| 802 | General formula (113) | General formula (113) | CN | Formula (124) | General formula (113) | H | H | $CH_3$ | H | H | H |
| 803 | General formula (113) | General formula (113) | CN | Formula (124) | General formula (113) | H | H | $CH_3O$ | H | H | H |
| 804 | General formula (113) | General formula (113) | CN | Formula (124) | General formula (113) | H | H | t-$C_4H_9$ | H | H | H |
| 805 | General formula (113) | General formula (113) | CN | Formula (124) | General formula (113) | H | H | Cl | H | H | H |
| 806 | General formula (113) | General formula (113) | CN | Formula (124) | General formula (113) | H | H | F | H | H | H |

TABLE 5-1

| Compound No. | General formula (1) R¹ | R² | R³ | R⁴ | R⁵ | General formula (114) R⁵² | R⁵³ | R⁵⁴ | R⁵⁵ | R⁵⁷ | R⁵⁹ | R⁶¹ | R⁵¹, R⁵⁶, R⁵⁸, R⁶⁰, R⁶² |
|---|---|---|---|---|---|---|---|---|---|---|---|---|---|
| 901 | General formula (114) | General formula (114) | CN | General formula (114) | General formula (114) | H | H | H | H | H | H | H | H |
| 902 | General formula (114) | General formula (114) | CN | General formula (114) | General formula (114) | $CH_3$ | H | H | H | H | H | H | H |
| 903 | General formula (114) | General formula (114) | CN | General formula (114) | General formula (114) | $CH_3O$ | H | H | H | H | H | H | H |
| 904 | General formula (114) | General formula (114) | CN | General formula (114) | General formula (114) | H | $CH_3$ | H | H | H | H | H | H |
| 905 | General formula (114) | General formula (114) | CN | General formula (114) | General formula (114) | H | $CH_3O$ | H | H | H | H | H | H |
| 906 | General formula (114) | General formula (114) | CN | General formula (114) | General formula (114) | H | t-$C_4H_9$ | H | H | H | H | H | H |
| 907 | General formula (114) | General formula (114) | CN | General formula (114) | General formula (114) | H | Cl | H | H | H | H | H | H |
| 908 | General formula (114) | General formula (114) | CN | General formula (114) | General formula (114) | H | F | H | H | H | H | H | H |
| 909 | General formula (114) | General formula (114) | CN | General formula (114) | General formula (114) | H | H | $CH_3$ | H | H | H | H | H |

TABLE 5-1-continued

| Compound No. | General formula (1) $R^1$ | $R^2$ | $R^3$ | $R^4$ | $R^5$ | General formula (114) $R^{52}$ | $R^{53}$ | $R^{54}$ | $R^{55}$ | $R^{57}$ | $R^{59}$ | $R^{61}$ | $R^{51}$, $R^{56}$, $R^{58}$, $R^{60}$, $R^{62}$ |
|---|---|---|---|---|---|---|---|---|---|---|---|---|---|
| 910 | General formula (114) | General formula (114) | CN | General formula (114) | General formula (114) | H | H | $CH_3O$ | H | H | H | H | H |
| 911 | General formula (114) | General formula (114) | CN | General formula (114) | General formula (114) | H | H | H | $CH_3$ | H | H | H | H |
| 912 | General formula (114) | General formula (114) | CN | General formula (114) | General formula (114) | H | H | H | $CH_3O$ | H | H | H | H |
| 913 | General formula (114) | General formula (114) | CN | General formula (114) | General formula (114) | H | H | H | H | $CH_3$ | H | H | H |
| 914 | General formula (114) | General formula (114) | CN | General formula (114) | General formula (114) | H | H | H | H | $CH_3O$ | H | H | H |
| 915 | General formula (114) | General formula (114) | CN | General formula (114) | General formula (114) | H | H | H | H | H | $CH_3$ | H | H |
| 916 | General formula (114) | General formula (114) | CN | General formula (114) | General formula (114) | H | H | H | H | H | $CH_3O$ | H | H |
| 917 | General formula (114) | General formula (114) | CN | General formula (114) | General formula (114) | H | H | H | H | H | H | $CH_3$ | H |
| 918 | General formula (114) | General formula (114) | CN | General formula (114) | General formula (114) | H | H | H | H | H | H | $CH_3O$ | H |
| 919 | General formula (114) | General formula (114) | CN | General formula (114) | H | H | H | H | H | H | H | H | H |
| 920 | General formula (114) | General formula (114) | CN | H | General formula (114) | H | H | H | H | H | H | H | H |
| 921 | General formula (114) | General formula (114) | CN | H | H | H | H | H | H | H | H | H | H |
| 922 | General formula (114) | H | CN | General formula (114) | H | H | H | H | H | H | H | H | H |
| 923 | H | General formula (114) | CN | General formula (114) | H | H | H | H | H | H | H | H | H |
| 924 | General formula (114) | H | CN | H | H | H | H | H | H | H | H | H | H |
| 925 | General formula (114) | General formula (114) | CN | General formula (114) | F | H | H | H | H | H | H | H | H |
| 926 | General formula (114) | General formula (114) | CN | F | General formula (114) | H | H | H | H | H | H | H | H |
| 927 | General formula (114) | General formula (114) | CN | F | F | H | H | H | H | H | H | H | H |
| 928 | General formula (114) | F | CN | General formula (114) | F | H | H | H | H | H | H | H | H |
| 929 | F | General formula (114) | CN | General formula (114) | F | H | H | H | H | H | H | H | H |
| 930 | General formula (114) | F | CN | F | F | H | H | H | H | H | H | H | H |
| 931 | General formula (114) | General formula (114) | CN | General formula (114) | OH | H | H | H | H | H | H | H | H |
| 932 | General formula (114) | General formula (114) | CN | OH | General formula (114) | H | H | H | H | H | H | H | H |
| 933 | General formula (114) | General formula (114) | CN | OH | OH | H | H | H | H | H | H | H | H |

TABLE 5-1-continued

| Compound No. | General formula (1) R1 | R2 | R3 | R4 | R5 | General formula (114) R52 | R53 | R54 | R55 | R57 | R59 | R61 | R51, R56, R58, R60, R62 |
|---|---|---|---|---|---|---|---|---|---|---|---|---|---|
| 934 | General formula (114) | OH | CN | General formula (114) | OH | H | H | H | H | H | H | H | H |
| 935 | OH | General formula (114) | CN | General formula (114) | OH | H | H | H | H | H | H | H | H |
| 936 | General formula (114) | OH | CN | OH | OH | H | H | H | H | H | H | H | H |
| 937 | General formula (114) | General formula (114) | CN | Cl | General formula (114) | H | H | H | H | H | H | H | H |
| 938 | General formula (114) | General formula (114) | CN | Cl | General formula (114) | H | $CH_3$ | H | H | H | H | H | H |
| 939 | General formula (114) | General formula (114) | CN | Cl | General formula (114) | H | $CH_3O$ | H | H | H | H | H | H |
| 940 | General formula (114) | General formula (114) | CN | Cl | General formula (114) | H | t-$C_4H_9$ | H | H | H | H | H | H |
| 941 | General formula (114) | General formula (114) | CN | Cl | General formula (114) | H | Cl | H | H | H | H | H | H |
| 942 | General formula (114) | General formula (114) | CN | Cl | General formula (114) | H | F | H | H | H | H | H | H |
| 943 | General formula (114) | General formula (114) | CN | F | General formula (114) | H | H | H | H | H | H | H | H |
| 944 | General formula (114) | General formula (114) | CN | F | General formula (114) | H | $CH_3$ | H | H | H | H | H | H |

TABLE 5-2

| Compound No. | General formula (1) R1 | R2 | R3 | R4 | R5 | General formula (114) R52 | R53 | R54 | R55 | R57 | R59 | R61 | R51, R56, R58, R60, R62 |
|---|---|---|---|---|---|---|---|---|---|---|---|---|---|
| 945 | General formula (114) | General formula (114) | CN | F | General formula (114) | H | $CH_3O$ | H | H | H | H | H | H |
| 946 | General formula (114) | General formula (114) | CN | F | General formula (114) | H | t-$C_4H_9$ | H | H | H | H | H | H |
| 947 | General formula (114) | General formula (114) | CN | F | General formula (114) | H | Cl | H | H | H | H | H | H |
| 948 | General formula (114) | General formula (114) | CN | F | General formula (114) | H | F | H | H | H | H | H | H |
| 949 | General formula (114) | General formula (114) | CN | $CH_3O$ | General formula (114) | H | H | H | H | H | H | H | H |
| 950 | General formula (114) | General formula (114) | CN | $CH_3O$ | General formula (114) | H | $CH_3$ | H | H | H | H | H | H |
| 951 | General formula (114) | General formula (114) | CN | $CH_3O$ | General formula (114) | H | $CH_3O$ | H | H | H | H | H | H |
| 952 | General formula (114) | General formula (114) | CN | $CH_3O$ | General formula (114) | H | t-$C_4H_9$ | H | H | H | H | H | H |
| 953 | General formula (114) | General formula (114) | CN | $CH_3O$ | General formula (114) | H | Cl | H | H | H | H | H | H |
| 954 | General formula (114) | General formula (114) | CN | $CH_3O$ | General formula (114) | H | F | H | H | H | H | H | H |
| 955 | General formula (114) | General formula (114) | CN | $C_2H_5O$ | General formula (114) | H | H | H | H | H | H | H | H |
| 956 | General formula (114) | General formula (114) | CN | $C_2H_5O$ | General formula (114) | H | $CH_3$ | H | H | H | H | H | H |
| 957 | General formula (114) | General formula (114) | CN | $C_2H_5O$ | General formula (114) | H | $CH_3O$ | H | H | H | H | H | H |

TABLE 5-2-continued

| Compound No. | General formula (1) | | | | | General formula (114) | | | | | | | |
|---|---|---|---|---|---|---|---|---|---|---|---|---|---|
| | $R^1$ | $R^2$ | $R^3$ | $R^4$ | $R^5$ | $R^{52}$ | $R^{53}$ | $R^{54}$ | $R^{55}$ | $R^{57}$ | $R^{59}$ | $R^{61}$ | $R^{51}$, $R^{56}$, $R^{58}$, $R^{60}$, $R^{62}$ |
| 958 | General formula (114) | General formula (114) | CN | $C_2H_5O$ | General formula (114) | H | t-$C_4H_9$ | H | H | H | H | H | H |
| 959 | General formula (114) | General formula (114) | CN | $C_2H_5O$ | General formula (114) | H | Cl | H | H | H | H | H | H |
| 960 | General formula (114) | General formula (114) | CN | $C_2H_5O$ | General formula (114) | H | F | H | H | H | H | H | H |
| 961 | General formula (114) | General formula (114) | CN | $C_6H_5O$ | General formula (114) | H | H | H | H | H | H | H | H |
| 962 | General formula (114) | General formula (114) | CN | $C_6H_5O$ | General formula (114) | H | $CH_3$ | H | H | H | H | H | H |
| 963 | General formula (114) | General formula (114) | CN | $C_6H_5O$ | General formula (114) | H | $CH_3O$ | H | H | H | H | H | H |
| 964 | General formula (114) | General formula (114) | CN | $C_6H_5O$ | General formula (114) | H | t-$C_4H_9$ | H | H | H | H | H | H |
| 965 | General formula (114) | General formula (114) | CN | $C_6H_5O$ | General formula (114) | H | Cl | H | H | H | H | H | H |
| 966 | General formula (114) | General formula (114) | CN | $C_6H_5O$ | General formula (114) | H | F | H | H | H | H | H | H |
| 967 | General formula (114) | General formula (114) | CN | Formula (121) | General formula (114) | H | H | H | H | H | H | H | H |
| 968 | General formula (114) | General formula (114) | CN | Formula (121) | General formula (114) | H | $CH_3$ | H | H | H | H | H | H |
| 969 | General formula (114) | General formula (114) | CN | Formula (121) | General formula (114) | H | $CH_3O$ | H | H | H | H | H | H |
| 970 | General formula (114) | General formula (114) | CN | Formula (121) | General formula (114) | H | t-$C_4H_9$ | H | H | H | H | H | H |
| 971 | General formula (114) | General formula (114) | CN | Formula (121) | General formula (114) | H | Cl | H | H | H | H | H | H |
| 972 | General formula (114) | General formula (114) | CN | Formula (121) | General formula (114) | H | F | H | H | H | H | H | H |
| 973 | General formula (114) | General formula (114) | CN | Formula (122) | General formula (114) | H | H | H | H | H | H | H | H |
| 974 | General formula (114) | General formula (114) | CN | Formula (122) | General formula (114) | H | $CH_3$ | H | H | H | H | H | H |
| 975 | General formula (114) | General formula (114) | CN | Formula (122) | General formula (114) | H | $CH_3O$ | H | H | H | H | H | H |
| 976 | General formula (114) | General formula (114) | CN | Formula (122) | General formula (114) | H | t-$C_4H_9$ | H | H | H | H | H | H |
| 977 | General formula (114) | General formula (114) | CN | Formula (122) | General formula (114) | H | Cl | H | H | H | H | H | H |
| 978 | General formula (114) | General formula (114) | CN | Formula (122) | General formula (114) | H | F | H | H | H | H | H | H |
| 989 | General formula (114) | General formula (114) | CN | Formula (123) | General formula (114) | H | H | H | H | H | H | H | H |
| 980 | General formula (114) | General formula (114) | CN | Formula (123) | General formula (114) | H | $CH_3$ | H | H | H | H | H | H |
| 981 | General formula (114) | General formula (114) | CN | Formula (123) | General formula (114) | H | $CH_3O$ | H | H | H | H | H | H |
| 982 | General formula (114) | General formula (114) | CN | Formula (123) | General formula (114) | H | t-$C_4H_9$ | H | H | H | H | H | H |
| 983 | General formula (114) | General formula (114) | CN | Formula (123) | General formula (114) | H | Cl | H | H | H | H | H | H |
| 984 | General formula (114) | General formula (114) | CN | Formula (123) | General formula (114) | H | F | H | H | H | H | H | H |
| 985 | General formula (114) | General formula (114) | CN | Formula (124) | General formula (114) | H | H | H | H | H | H | H | H |
| 986 | General formula (114) | General formula (114) | CN | Formula (124) | General formula (114) | H | $CH_3$ | H | H | H | H | H | H |
| 987 | General formula (114) | General formula (114) | CN | Formula (124) | General formula (114) | H | $CH_3O$ | H | H | H | H | H | H |
| 988 | General formula (114) | General formula (114) | CN | Formula (124) | General formula (114) | H | t-$C_4H_9$ | H | H | H | H | H | H |
| 989 | General formula (114) | General formula (114) | CN | Formula (124) | General formula (114) | H | Cl | H | H | H | H | H | H |
| 990 | General formula (114) | General formula (114) | CN | Formula (124) | General formula (114) | H | F | H | H | H | H | H | H |

TABLE 6-1

| Compound | General formula (1) | | | | | General formula (115) | | | | |
|---|---|---|---|---|---|---|---|---|---|---|
| No. | $R^1$ | $R^2$ | $R^3$ | $R^4$ | $R^5$ | $R^{71}$, $R^{80}$ | $R^{72}$, $R^{79}$ | $R^{73}$, $R^{78}$ | $R^{74}$, $R^{77}$ | $R^{75}$, $R^{76}$ |
| 1001 | General formula (115) | General formula (115) | CN | General formula (115) | General formula (115) | H | H | H | H | H |
| 1002 | General formula (115) | General formula (115) | CN | General formula (115) | General formula (115) | H | $CH_3$ | H | H | H |
| 1003 | General formula (115) | General formula (115) | CN | General formula (115) | General formula (115) | H | $CH_3O$ | H | H | H |
| 1004 | General formula (115) | General formula (115) | CN | General formula (115) | General formula (115) | H | $C_6H_5$ | H | H | H |
| 1005 | General formula (115) | General formula (115) | CN | General formula (115) | General formula (115) | H | $CH_3$ | H | $CH_3$ | H |
| 1006 | General formula (115) | General formula (115) | CN | General formula (115) | General formula (115) | H | $CH_3O$ | H | $CH_3O$ | H |
| 1007 | General formula (115) | General formula (115) | CN | General formula (115) | General formula (115) | H | $C_6H_5$ | H | $C_6H_5$ | H |
| 1008 | General formula (115) | General formula (115) | CN | General formula (115) | General formula (115) | H | H | $CH_3$ | H | H |
| 1009 | General formula (115) | General formula (115) | CN | General formula (115) | General formula (115) | H | H | $CH_3O$ | H | H |
| 1010 | General formula (115) | General formula (115) | CN | General formula (115) | General formula (115) | H | H | t-$C_4H_9$ | H | H |
| 1011 | General formula (115) | General formula (115) | CN | General formula (115) | General formula (115) | H | H | Cl | H | H |
| 1012 | General formula (115) | General formula (115) | CN | General formula (115) | General formula (115) | H | H | F | H | H |
| 1013 | General formula (115) | General formula (115) | CN | General formula (115) | General formula (115) | H | H | $C_6H_5$ | H | H |
| 1014 | General formula (115) | General formula (115) | CN | General formula (115) | General formula (115) | H | H | p-$C_6H_5$—$C_6H_4$ | H | H |
| 1015 | General formula (115) | General formula (115) | CN | General formula (115) | H | H | H | H | H | H |
| 1016 | General formula (115) | General formula (115) | CN | H | General formula (115) | H | H | H | H | H |
| 1017 | General formula (115) | General formula (115) | CN | H | H | H | H | H | H | H |
| 1018 | General formula (115) | H | CN | General formula (115) | H | H | H | H | H | H |
| 1019 | H | General formula (115) | CN | General formula (115) | H | H | H | H | H | H |
| 1020 | General formula (115) | H | CN | H | H | H | H | H | H | H |
| 1021 | General formula (115) | General formula (115) | CN | General formula (115) | F | H | H | H | H | H |
| 1022 | General formula (115) | General formula (115) | CN | F | General formula (115) | H | H | H | H | H |
| 1023 | General formula (115) | General formula (115) | CN | F | F | H | H | H | H | H |
| 1024 | General formula (115) | F | CN | General formula (115) | F | H | H | H | H | H |
| 1025 | F | General formula (115) | CN | General formula (115) | F | H | H | H | H | H |
| 1026 | General formula (115) | F | CN | F | F | H | H | H | H | H |
| 1027 | General formula (115) | General formula (115) | CN | General formula (115) | OH | H | H | H | H | H |
| 1028 | General formula (115) | General formula (115) | CN | OH | General formula (115) | H | H | H | H | H |
| 1029 | General formula (115) | General formula (115) | CN | OH | OH | H | H | H | H | H |
| 1030 | General formula (115) | OH | CN | General formula (115) | OH | H | H | H | H | H |
| 1031 | OH | General formula (115) | CN | General formula (115) | OH | H | H | H | H | H |
| 1032 | General formula (115) | OH | CN | OH | OH | H | H | H | H | H |
| 1033 | General formula (115) | General formula (115) | CN | Cl | General formula (115) | H | H | H | H | H |
| 1034 | General formula (115) | General formula (115) | CN | Cl | General formula (115) | H | H | $CH_3$ | H | H |
| 1035 | General formula (115) | General formula (115) | CN | Cl | General formula (115) | H | H | $CH_3O$ | H | H |
| 1036 | General formula (115) | General formula (115) | CN | Cl | General formula (115) | H | H | t-$C_4H_9$ | H | H |
| 1037 | General formula (115) | General formula (115) | CN | Cl | General formula (115) | H | H | Cl | H | H |
| 1038 | General formula (115) | General formula (115) | CN | Cl | General formula (115) | H | H | F | H | H |

TABLE 6-1-continued

| Compound | General formula (1) | | | | | General formula (115) | | | | |
|---|---|---|---|---|---|---|---|---|---|---|
| No. | $R^1$ | $R^2$ | $R^3$ | $R^4$ | $R^5$ | $R^{71}$, $R^{80}$ | $R^{72}$, $R^{79}$ | $R^{73}$, $R^{78}$ | $R^{74}$, $R^{77}$ | $R^{75}$, $R^{76}$ |
| 1039 | General formula (115) | General formula (115) | CN | F | General formula (115) | H | H | H | H | H |
| 1040 | General formula (115) | General formula (115) | CN | F | General formula (115) | H | H | $CH_3$ | H | H |
| 1041 | General formula (115) | General formula (115) | CN | F | General formula (115) | H | H | $CH_3O$ | H | H |
| 1042 | General formula (115) | General formula (115) | CN | F | General formula (115) | H | H | t-$C_4H_9$ | H | H |
| 1043 | General formula (115) | General formula (115) | CN | F | General formula (115) | H | H | Cl | H | H |

TABLE 6-2

| Compound | General formula (1) | | | | | General formula (115) | | | | |
|---|---|---|---|---|---|---|---|---|---|---|
| No. | $R^1$ | $R^2$ | $R^3$ | $R^4$ | $R^5$ | $R^{71}$, $R^{80}$ | $R^{72}$, $R^{79}$ | $R^{73}$, $R^{78}$ | $R^{74}$, $R^{77}$ | $R^{75}$, $R^{76}$ |
| 1044 | General formula (115) | General formula (115) | CN | F | General formula (115) | H | H | F | H | H |
| 1045 | General formula (115) | General formula (115) | CN | $CH_3O$ | General formula (115) | H | H | H | H | H |
| 1046 | General formula (115) | General formula (115) | CN | $CH_3O$ | General formula (115) | H | H | $CH_3$ | H | H |
| 1047 | General formula (115) | General formula (115) | CN | $CH_3O$ | General formula (115) | H | H | $CH_3O$ | H | H |
| 1048 | General formula (115) | General formula (115) | CN | $CH_3O$ | General formula (115) | H | H | t-$C_4H_9$ | H | H |
| 1049 | General formula (115) | General formula (115) | CN | $CH_3O$ | General formula (115) | H | H | Cl | H | H |
| 1050 | General formula (115) | General formula (115) | CN | $CH_3O$ | General formula (115) | H | H | F | H | H |
| 1051 | General formula (115) | General formula (115) | CN | $C_2H_5O$ | General formula (115) | H | H | H | H | H |
| 1052 | General formula (115) | General formula (115) | CN | $C_2H_5O$ | General formula (115) | H | H | $CH_3$ | H | H |
| 1053 | General formula (115) | General formula (115) | CN | $C_2H_5O$ | General formula (115) | H | H | $CH_3O$ | H | H |
| 1054 | General formula (115) | General formula (115) | CN | $C_2H_5O$ | General formula (115) | H | H | t-$C_4H_9$ | H | H |
| 1055 | General formula (115) | General formula (115) | CN | $C_2H_5O$ | General formula (115) | H | H | Cl | H | H |
| 1056 | General formula (115) | General formula (115) | CN | $C_2H_5O$ | General formula (115) | H | H | F | H | H |
| 1057 | General formula (115) | General formula (115) | CN | $C_6H_5O$ | General formula (115) | H | H | H | H | H |
| 1058 | General formula (115) | General formula (115) | CN | $C_6H_5O$ | General formula (115) | H | H | $CH_3$ | H | H |
| 1059 | General formula (115) | General formula (115) | CN | $C_6H_5O$ | General formula (115) | H | H | $CH_3O$ | H | H |
| 1060 | General formula (115) | General formula (115) | CN | $C_6H_5O$ | General formula (115) | H | H | t-$C_4H_9$ | H | H |
| 1061 | General formula (115) | General formula (115) | CN | $C_6H_5O$ | General formula (115) | H | H | Cl | H | H |
| 1062 | General formula (115) | General formula (115) | CN | $C_6H_5O$ | General formula (115) | H | H | F | H | H |
| 1063 | General formula (115) | General formula (115) | CN | Formula (121) | General formula (115) | H | H | H | H | H |
| 1064 | General formula (115) | General formula (115) | CN | Formula (121) | General formula (115) | H | H | $CH_3$ | H | H |
| 1065 | General formula (115) | General formula (115) | CN | Formula (121) | General formula (115) | H | H | $CH_3O$ | H | H |
| 1066 | General formula (115) | General formula (115) | CN | Formula (121) | General formula (115) | H | H | t-$C_4H_9$ | H | H |
| 1067 | General formula (115) | General formula (115) | CN | Formula (121) | General formula (115) | H | H | Cl | H | H |
| 1068 | General formula (115) | General formula (115) | CN | Formula (121) | General formula (115) | H | H | F | H | H |
| 1069 | General formula (115) | General formula (115) | CN | Formula (122) | General formula (115) | H | H | H | H | H |
| 1070 | General formula (115) | General formula (115) | CN | Formula (122) | General formula (115) | H | H | $CH_3$ | H | H |
| 1071 | General formula (115) | General formula (115) | CN | Formula (122) | General formula (115) | H | H | $CH_3O$ | H | H |

TABLE 6-2-continued

| Compound | General formula (1) | | | | | General formula (115) | | | | |
|---|---|---|---|---|---|---|---|---|---|---|
| No. | $R^1$ | $R^2$ | $R^3$ | $R^4$ | $R^5$ | $R^{71}$, $R^{80}$ | $R^{72}$, $R^{79}$ | $R^{73}$, $R^{78}$ | $R^{74}$, $R^{77}$ | $R^{75}$, $R^{76}$ |
| 1072 | General formula (115) | General formula (115) | CN | Formula (122) | General formula (115) | H | H | t-$C_4H_9$ | H | H |
| 1073 | General formula (115) | General formula (115) | CN | Formula (122) | General formula (115) | H | H | Cl | H | H |
| 1074 | General formula (115) | General formula (115) | CN | Formula (122) | General formula (115) | H | H | F | H | H |
| 1075 | General formula (115) | General formula (115) | CN | Formula (123) | General formula (115) | H | H | H | H | H |
| 1076 | General formula (115) | General formula (115) | CN | Formula (123) | General formula (115) | H | H | $CH_3$ | H | H |
| 1077 | General formula (115) | General formula (115) | CN | Formula (123) | General formula (115) | H | H | $CH_3O$ | H | H |
| 1078 | General formula (115) | General formula (115) | CN | Formula (123) | General formula (115) | H | H | t-$C_4H_9$ | H | H |
| 1079 | General formula (115) | General formula (115) | CN | Formula (123) | General formula (115) | H | H | Cl | H | H |
| 1080 | General formula (115) | General formula (115) | CN | Formula (123) | General formula (115) | H | H | F | H | H |
| 1081 | General formula (115) | General formula (115) | CN | Formula (124) | General formula (115) | H | H | H | H | H |
| 1082 | General formula (115) | General formula (115) | CN | Formula (124) | General formula (115) | H | H | $CH_3$ | H | H |
| 1083 | General formula (115) | General formula (115) | CN | Formula (124) | General formula (115) | H | H | $CH_3O$ | H | H |
| 1084 | General formula (115) | General formula (115) | CN | Formula (124) | General formula (115) | H | H | t-$C_4H_9$ | H | H |
| 1085 | General formula (115) | General formula (115) | CN | Formula (124) | General formula (115) | H | H | Cl | H | H |
| 1086 | General formula (115) | General formula (115) | CN | Formula (124) | General formula (115) | H | H | F | H | H |

Examples of the preferred light emitting material capable of emitting delayed fluorescent light include the following compounds.

(1) A compound represented by the following general formula (131):

General Formula (131)

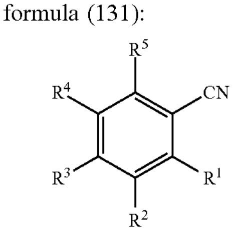

wherein in the general formula (131), from 0 to 1 of $R^1$ to $R^5$ represents a cyano group, from 1 to 5 of $R^1$ to $R^5$ each represent a group represented by the following general formula (132), and the balance of $R^1$ to $R^5$ each represent a hydrogen atom or a substituent other than the above, General Formula (132)

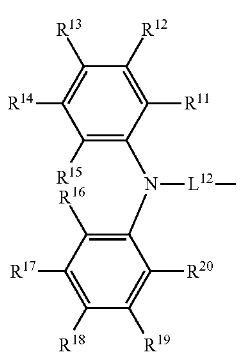

wherein in the general formula (132), $R^{11}$ to $R^{20}$ each independently represent a hydrogen atom or a substituent, in which $R^{11}$ and $R^{12}$, $R^{13}$ and $R^{13}$, $R^{13}$ and $R^{14}$, $R^{14}$ and $R^{15}$, $R^{15}$ and $R^{16}$, $R^{16}$ and $R^{17}$, $R^{17}$ and $R^{18}$, and $R^{18}$ and $R^{19}$, and $R^{19}$ and $R^{20}$ each may be bonded to each other to form a ring structure; and $L^{12}$ represents a substituted or unsubstituted arylene group or a substituted or unsubstituted heteroarylene group.

(2) The compound according to the item (1), wherein the group represented by the general formula (132) is a group represented by any one of the following general formulae (133) to (138):

General Formula (133)

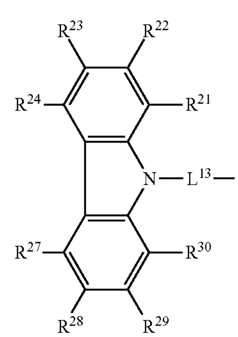

-continued

General Formula (134)

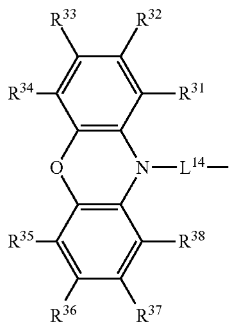

General Formula (135)

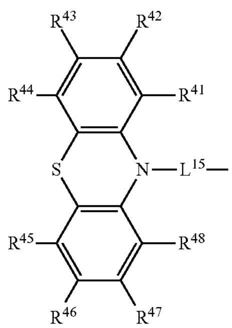

General Formula (136)

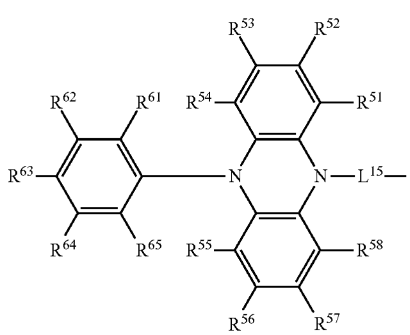

General Formula (137)

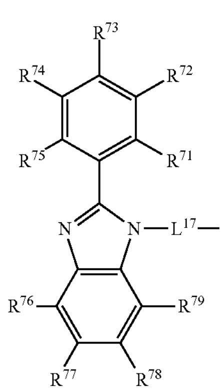

-continued

General Formula (138)

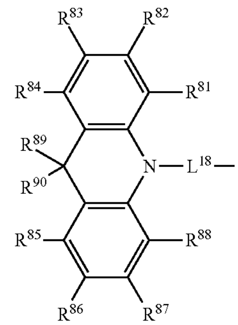

wherein in the general formulae (133) to (138), $R^{21}$ to $R^{24}$, $R^{27}$ to $R^{38}$, $R^{41}$ to $R^{48}$, $R^{51}$ to $R^{58}$, $R^{61}$ to $R^{65}$, $R^{71}$ to $R^{79}$, $R^{81}$ to $R^{90}$ each independently represent a hydrogen atom or a substituent, in which $R^{21}$ and $R^{22}$, $R^{22}$ and $R^{23}$, $R^{23}$ and $R^{24}$, $R^{27}$ and $R^{28}$, $R^{28}$ and $R^{29}$, $R^{29}$ and $R^{30}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{64}$ and $R^{65}$, $R^{54}$ and $R^{61}$, $R^{55}$ and $R^{65}$, $R^{71}$ and $R^{72}$, $R^{72}$ and $R^{73}$, $R^{73}$ and $R^{74}$, $R^{74}$ and $R^{75}$, $R^{76}$ and $R^{77}$, $R^{77}$ and $R^{78}$, $R^{75}$ and $R^{79}$, $R^{81}$ and $R^{82}$, $R^{82}$ and $R^{83}$, $R^{83}$ and $R^{84}$, $R^{85}$ and $R^{86}$, $R^{86}$ and $R^{87}$, $R^{87}$ and $R^{86}$, and $R^{89}$ and $R^{90}$ each may be bonded to each other to form a ring structure; and $L^{13}$ and $L^{18}$ each independently represent a substituted or unsubstituted arylene group or a substituted or unsubstituted heteroarylene group.

(3) The compound according to the item (1) or (2), wherein in the general formula (131), $R^3$ represents a cyano group.

(4) The compound according to any one of the items (1) to (3), wherein in the general formula (131), $R^1$ and $R^4$ each represent a group represented by the general formula (132).

(5) The compound according to any one of the items (1) to (4), wherein in the general formula (132), $L^{12}$ represents a phenylene group.

(6) The compound according to any one of the items (1) to (5), wherein the group represented by the general formula (132) is a group represented by the general formula (133).

(7) The compound according to the item (6), wherein in the general formula (133), $L^{13}$ represents a 1,3-phenylene group.

(8) The compound according to any one of the items (1) to (5), wherein the group represented by the general formula (132) is a group represented by the general formula (134).

(9) The compound according to the item (8), wherein in the general formula (134), $L^{14}$ represents a 1,4-phenylene group.

(10) The compound according to any one of the items (1) to (5), wherein the group represented by the general formula (132) is a group represented by the general formula (138).

(11) The compound according to the item (10), wherein in the general formula (132), $L^{18}$ represents a 1,4-phenylene group.

Examples of the compound include the following compounds.

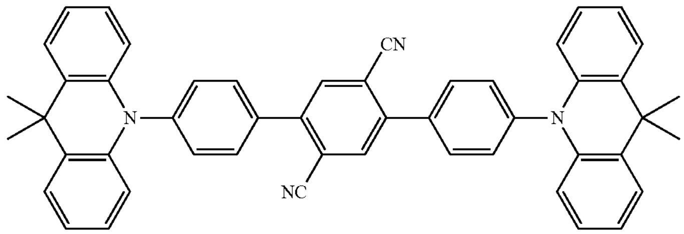
CN
N
N
NC
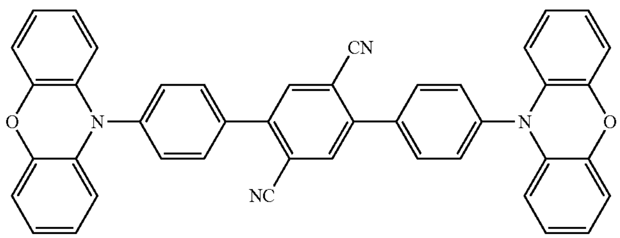
CN
O
N
N
O
NC
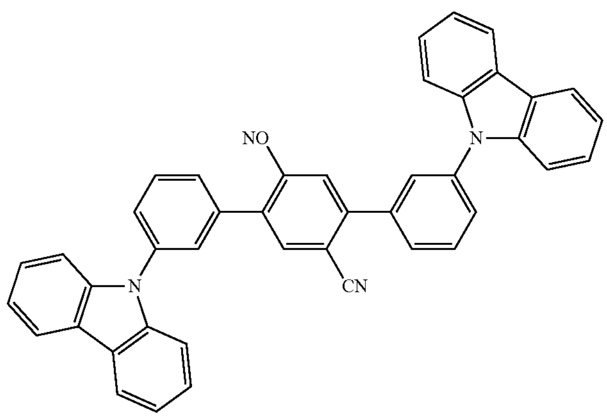
NO
N
N
CN
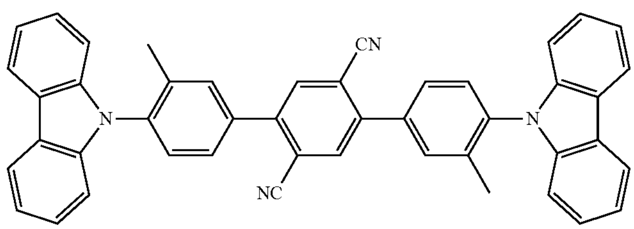
CN
N
N
NC
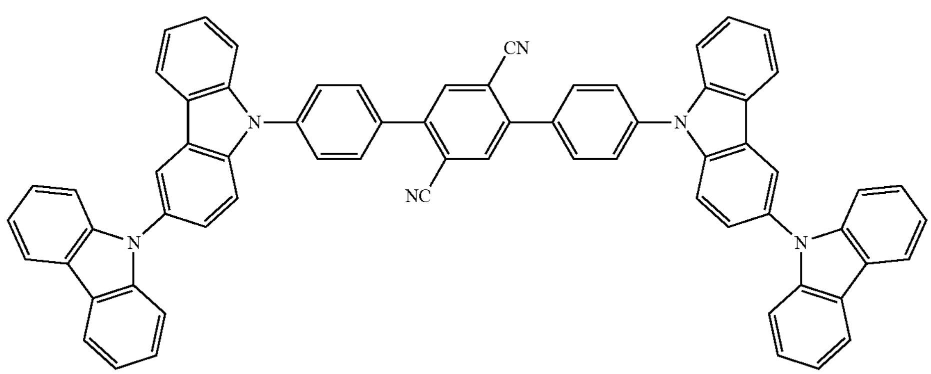
CN
N
N
NC
N
N -continued
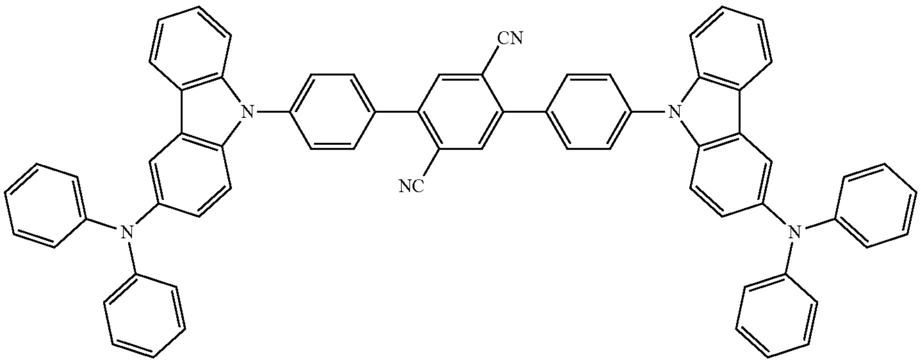
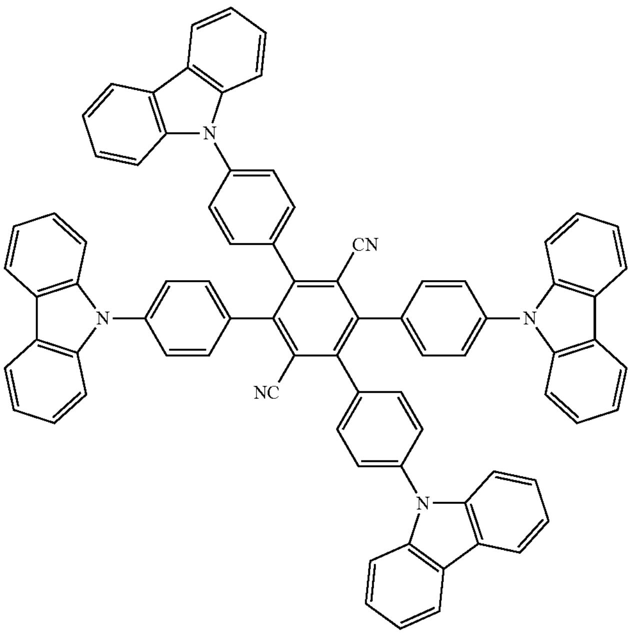
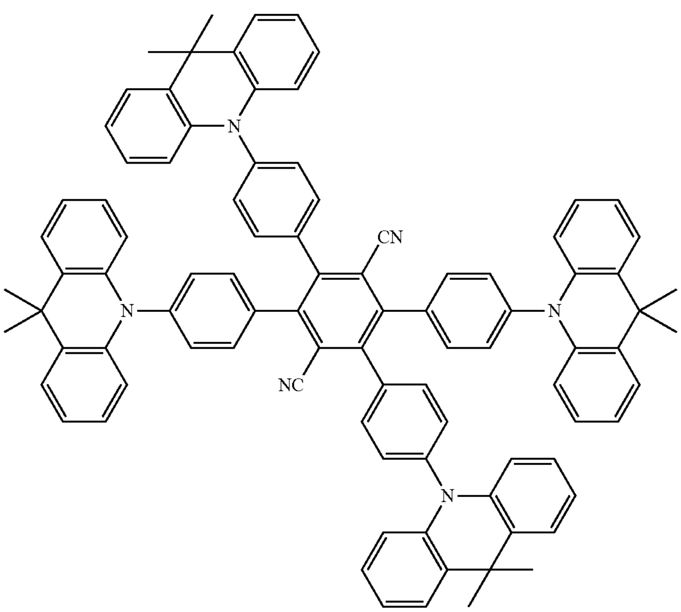

-continued
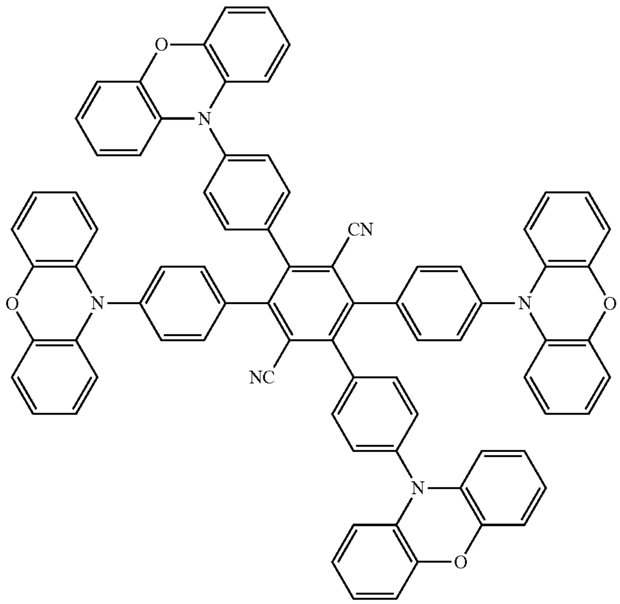
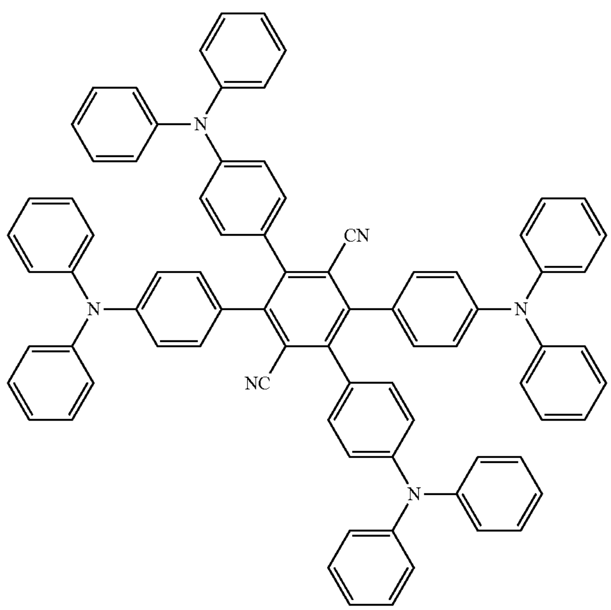
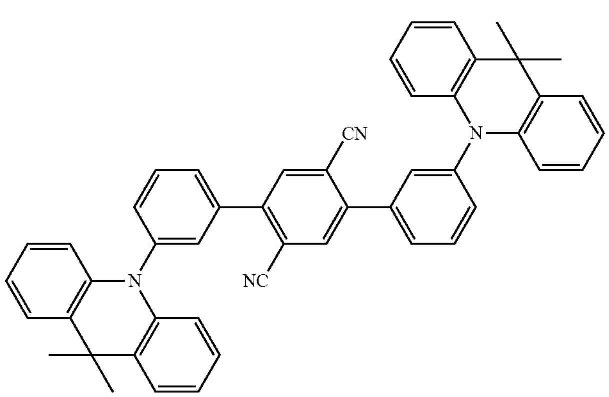

-continued
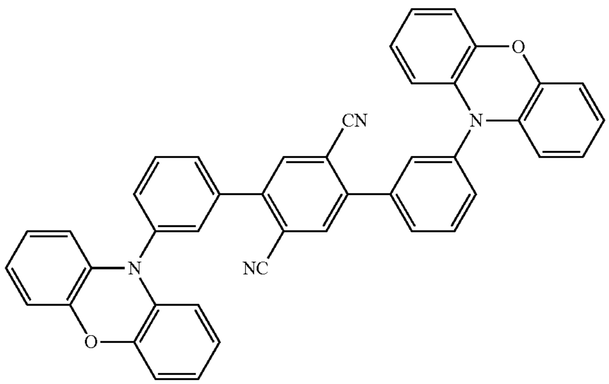
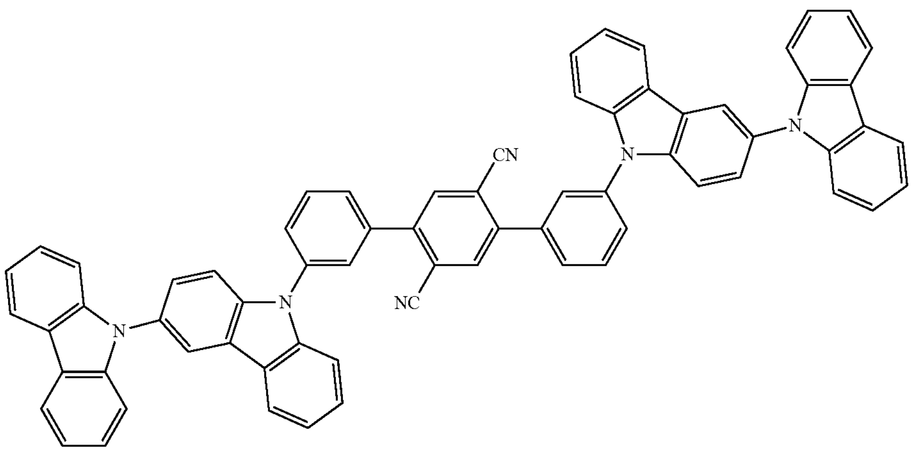
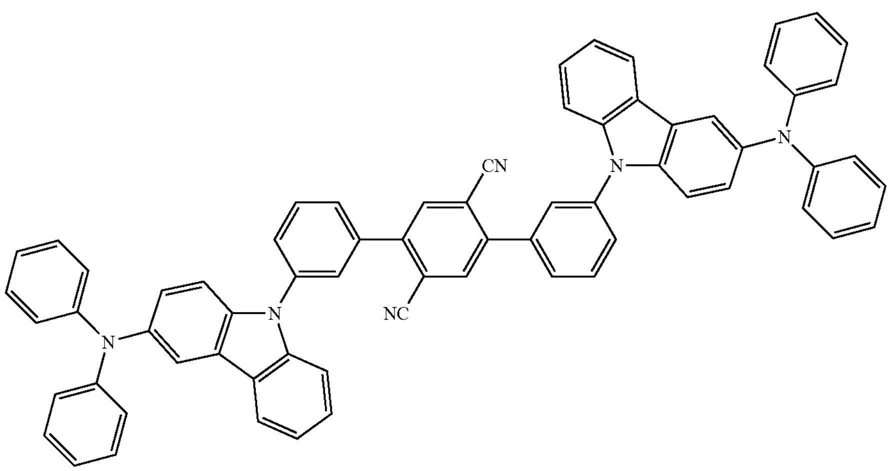
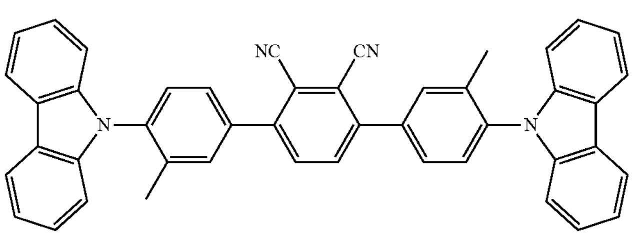

-continued
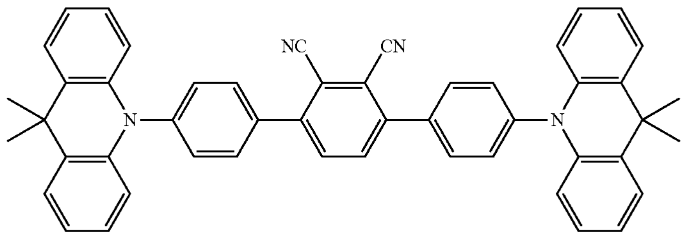
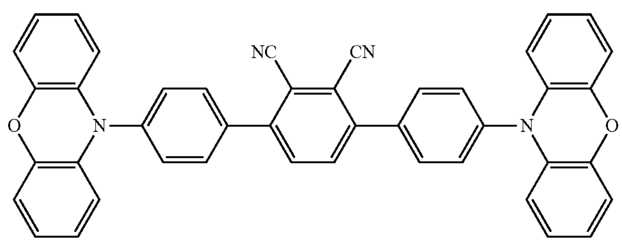
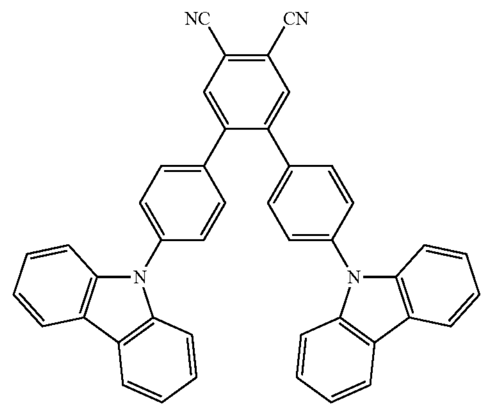
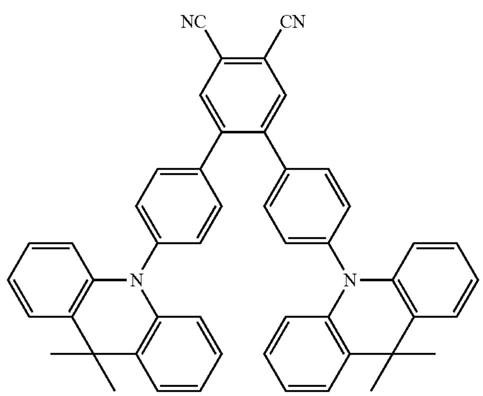
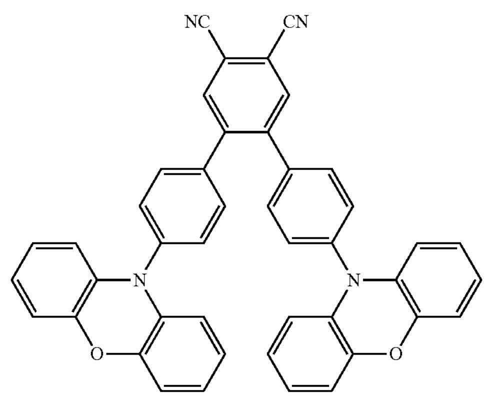
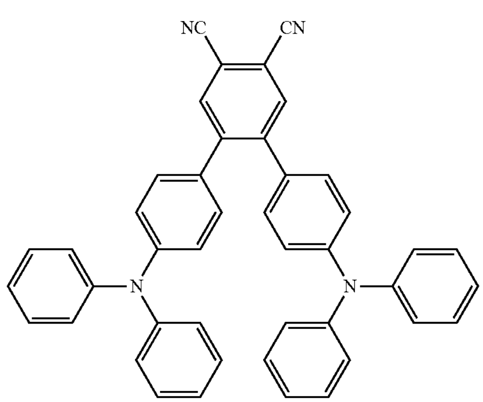
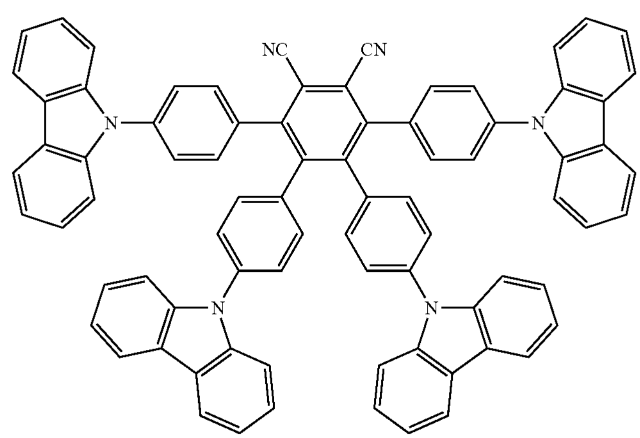

-continued
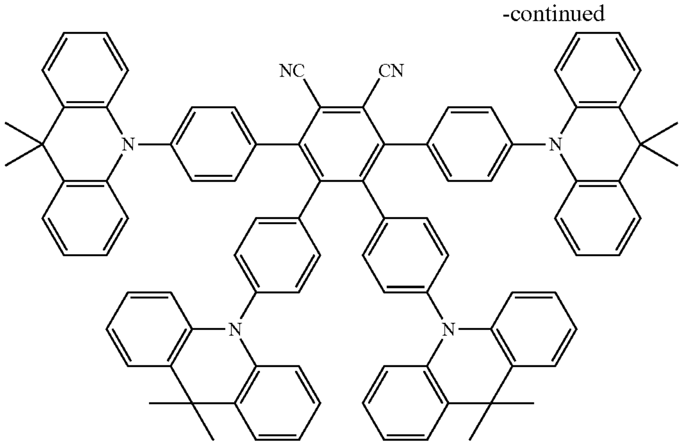
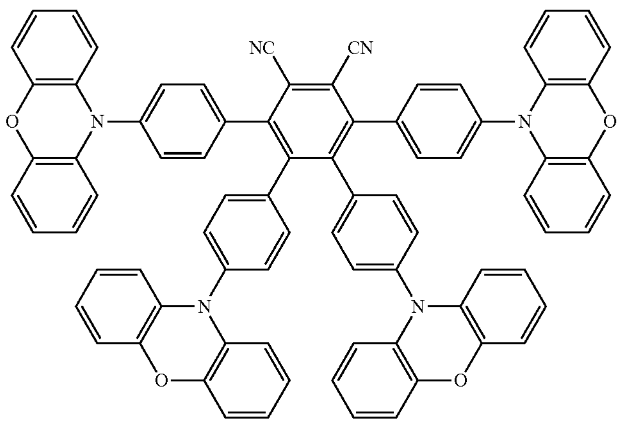
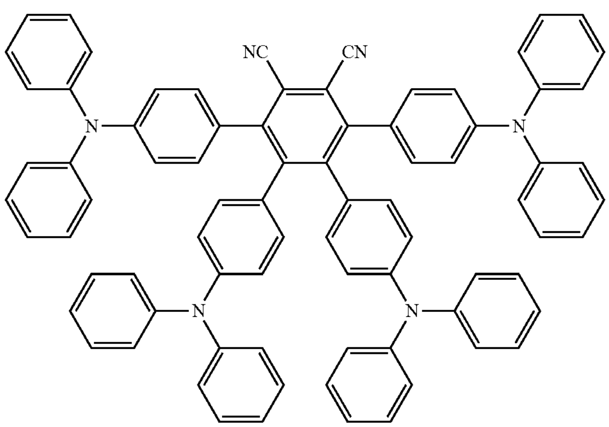
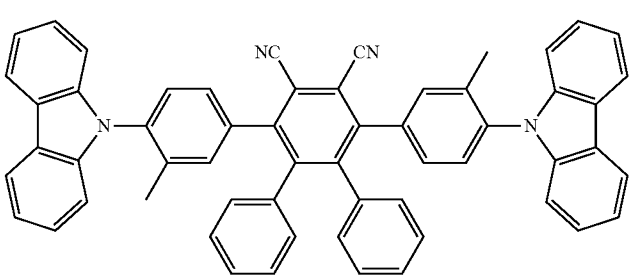

-continued
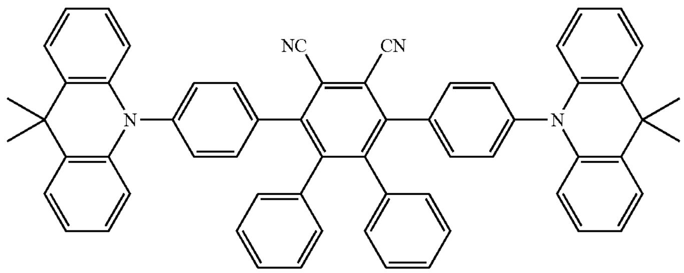
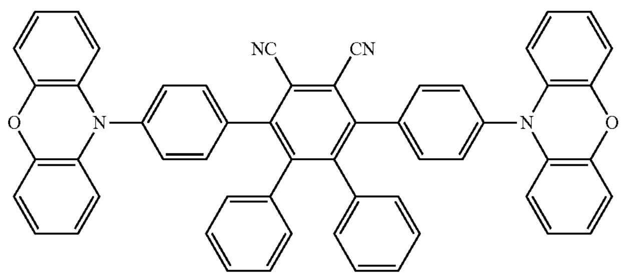
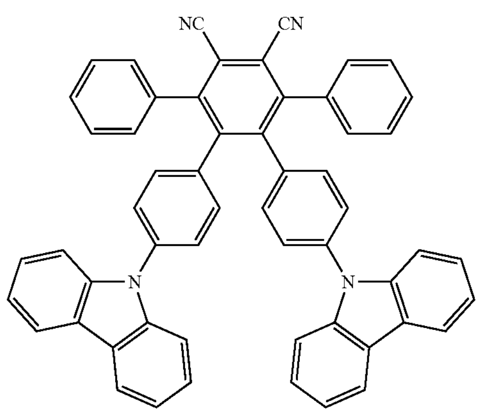
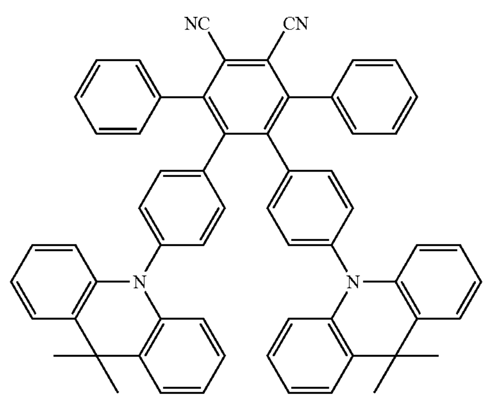
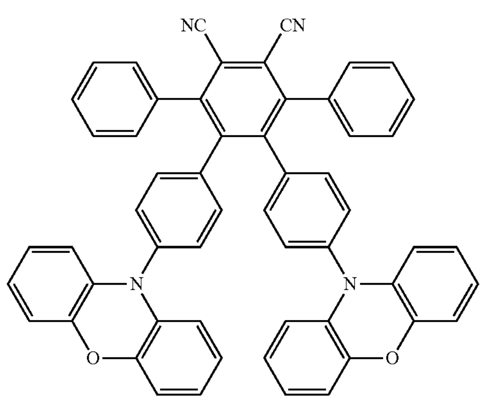
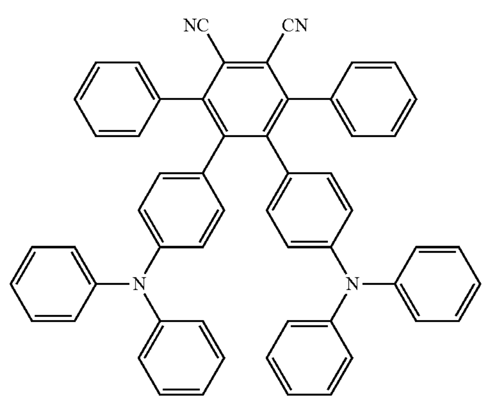

Examples of the preferred light emitting material include compounds represented by the following general formula (141). The entire description of WO 2013/011954 including the paragraphs 0007 to 0047 and 0073 to 0085 is incorporated herein by reference.

General Formula (141)

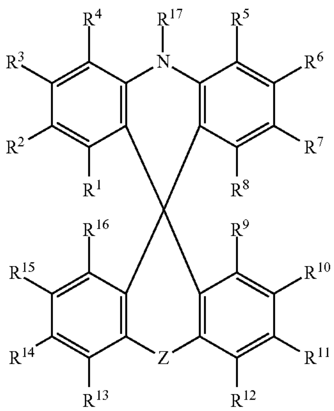

wherein in the general formula (141), $R^1$, $R^2$, $R^3$, $R^4$, $R^5$, $R^6$, $R^7$, $R^8$ and $R^{17}$ each independently represent a hydrogen atom or an electron donating group, provided that at least one thereof represents an electron donating group; $R^9$, $R^{10}$, $R^{11}$, $R^{12}$, $R^{13}$, $R^{14}$, $R^{15}$ and $R^{16}$ each independently represent a hydrogen atom or an electron withdrawing group having no unshared electron pair at the α-position; and Z represents a single bond or >C═Y, wherein Y represents O, S, $C(CN)_2$ or $C(COOH)_2$, provided that when Z represents a single bond, at least one of $R^9$, $R^{10}$, $R^{11}$, $R^{12}$, $R^{13}$, $R^{14}$, $R^{15}$ and $R^{16}$ represents an electron withdrawing group having no unshared electron pair at the α-position.

Specific examples of the compounds include the compounds shown in the following tables. In the tables, D1 to D3 represent the following aryl groups substituted by an electron donating group, respectively; A1 to A5 represent the following electron withdrawing groups, respectively; H represents a hydrogen atom; and Ph represents a phenyl group.

D1

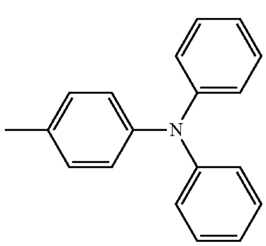

D2

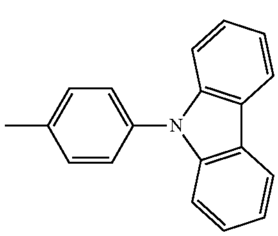

-continued

D3

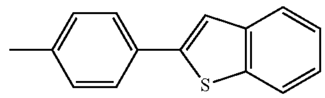

A1

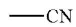

A2

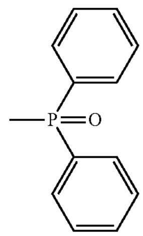

A3

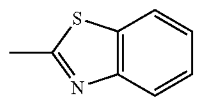

A4

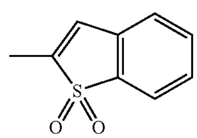

A5

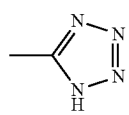

TABLE 7

| Compound No. | $R^2$ | $R^7$ | $R^{10}$ | $R^{15}$ | $R^{17}$ | Z | Other Rs |
|---|---|---|---|---|---|---|---|
| 2001 | H | H | A1 | A1 | Ph | single bond | H |
| 2002 | H | D1 | A1 | A1 | Ph | single bond | H |
| 2003 | H | D2 | A1 | A1 | Ph | single bond | H |
| 2004 | H | D3 | A1 | A1 | Ph | single bond | H |
| 2005 | H | H | A2 | A2 | Ph | single bond | H |
| 2006 | H | D1 | A2 | A2 | Ph | single bond | H |
| 2007 | H | D2 | A2 | A2 | Ph | single bond | H |
| 2008 | H | D3 | A2 | A2 | Ph | single bond | H |
| 2009 | H | H | A3 | A3 | Ph | single bond | H |
| 2010 | H | D1 | A3 | A3 | Ph | single bond | H |
| 2011 | H | D2 | A3 | A3 | Ph | single bond | H |
| 2012 | H | D3 | A3 | A3 | Ph | single bond | H |
| 2013 | H | H | A4 | A4 | Ph | single bond | H |
| 2014 | H | D1 | A4 | A4 | Ph | single bond | H |
| 2015 | H | D2 | A4 | A4 | Ph | single bond | H |
| 2016 | H | D3 | A4 | A4 | Ph | single bond | H |
| 2017 | H | H | A5 | A5 | Ph | single bond | H |
| 2018 | H | D1 | A5 | A5 | Ph | single bond | H |
| 2019 | H | D2 | A5 | A5 | Ph | single bond | H |
| 2020 | H | D3 | A5 | A5 | Ph | single bond | H |
| 2021 | D1 | D1 | A1 | A1 | Ph | single bond | H |
| 2022 | D2 | D2 | A1 | A1 | Ph | single bond | H |
| 2023 | D3 | D3 | A1 | A1 | Ph | single bond | H |
| 2024 | D1 | D1 | A2 | A2 | Ph | single bond | H |
| 2025 | D2 | D2 | A2 | A2 | Ph | single bond | H |
| 2026 | D3 | D3 | A2 | A2 | Ph | single bond | H |
| 2027 | D1 | D1 | A3 | A3 | Ph | single bond | H |
| 2028 | D2 | D2 | A3 | A3 | Ph | single bond | H |
| 2029 | D3 | D3 | A3 | A3 | Ph | single bond | H |
| 2030 | D1 | D1 | A4 | A4 | Ph | single bond | H |
| 2031 | D2 | D2 | A4 | A4 | Ph | single bond | H |
| 2032 | D3 | D3 | A4 | A4 | Ph | single bond | H |
| 2033 | D1 | D1 | A5 | A5 | Ph | single bond | H |

TABLE 7-continued

| Compound No. | $R^2$ | $R^7$ | $R^{10}$ | $R^{15}$ | $R^{17}$ | Z | Other Rs |
|---|---|---|---|---|---|---|---|
| 2034 | D2 | D2 | A5 | A5 | Ph | single bond | H |
| 2035 | D3 | D3 | A5 | A5 | Ph | single bond | H |

TABLE 8

| Compound No. | $R^3$ | $R^6$ | $R^{11}$ | $R^{14}$ | $R^{17}$ | Z | Other Rs |
|---|---|---|---|---|---|---|---|
| 2036 | H | H | H | A1 | Ph | single bond | H |
| 2037 | H | D1 | H | A1 | Ph | single bond | H |
| 2038 | H | D2 | H | A1 | Ph | single bond | H |
| 2039 | H | D3 | H | A1 | Ph | single bond | H |
| 2040 | H | H | H | A2 | Ph | single bond | H |
| 2041 | H | D1 | H | A2 | Ph | single bond | H |
| 2042 | H | D2 | H | A2 | Ph | single bond | H |
| 2043 | H | D3 | H | A2 | Ph | single bond | H |
| 2044 | H | H | H | A3 | Ph | single bond | H |
| 2045 | H | D1 | H | A3 | Ph | single bond | H |
| 2046 | H | D2 | H | A3 | Ph | single bond | H |
| 2047 | H | D3 | H | A3 | Ph | single bond | H |
| 2048 | H | H | H | A4 | Ph | single bond | H |
| 2049 | H | D1 | H | A4 | Ph | single bond | H |
| 2050 | H | D2 | H | A4 | Ph | single bond | H |
| 2051 | H | D3 | H | A4 | Ph | single bond | H |
| 2052 | H | H | H | A5 | Ph | single bond | H |
| 2053 | H | D1 | H | A5 | Ph | single bond | H |
| 2054 | H | D2 | H | A5 | Ph | single bond | H |
| 2055 | H | D3 | H | A5 | Ph | single bond | H |
| 2056 | D1 | D1 | H | A1 | Ph | single bond | H |
| 2057 | D2 | D2 | H | A1 | Ph | single bond | H |
| 2058 | D3 | D3 | H | A1 | Ph | single bond | H |
| 2059 | D1 | D1 | H | A2 | Ph | single bond | H |
| 2060 | D2 | D2 | H | A2 | Ph | single bond | H |
| 2061 | D3 | D3 | H | A2 | Ph | single bond | H |
| 2062 | D1 | D1 | H | A3 | Ph | single bond | H |
| 2063 | D2 | D2 | H | A3 | Ph | single bond | H |
| 2064 | D3 | D3 | H | A3 | Ph | single bond | H |
| 2065 | D1 | D1 | H | A4 | Ph | single bond | H |
| 2066 | D2 | D2 | H | A4 | Ph | single bond | H |
| 2067 | D3 | D3 | H | A4 | Ph | single bond | H |
| 2068 | D1 | D1 | H | A5 | Ph | single bond | H |
| 2069 | D2 | D2 | H | A5 | Ph | single bond | H |
| 2070 | D3 | D3 | H | A5 | Ph | single bond | H |

TABLE 9

| Compound No. | $R^2$ | $R^7$ | $R^{10}$ | $R^{15}$ | $R^{17}$ | Z | Other Rs |
|---|---|---|---|---|---|---|---|
| 2071 | H | H | A1 | A1 | Ph | C═O | H |
| 2072 | H | D1 | A1 | A1 | Ph | C═O | H |
| 2073 | H | D2 | A1 | A1 | Ph | C═O | H |
| 2074 | H | D3 | A1 | A1 | Ph | C═O | H |
| 2075 | H | H | A2 | A2 | Ph | C═O | H |
| 2076 | H | D1 | A2 | A2 | Ph | C═O | H |
| 2077 | H | D2 | A2 | A2 | Ph | C═O | H |
| 2078 | H | D3 | A2 | A2 | Ph | C═O | H |
| 2079 | H | H | A3 | A3 | Ph | C═O | H |
| 2080 | H | D1 | A3 | A3 | Ph | C═O | H |
| 2081 | H | D2 | A3 | A3 | Ph | C═O | H |
| 2082 | H | D3 | A3 | A3 | Ph | C═O | H |
| 2083 | H | H | A4 | A4 | Ph | C═O | H |
| 2084 | H | D1 | A4 | A4 | Ph | C═O | H |
| 2085 | H | D2 | A4 | A4 | Ph | C═O | H |
| 2086 | H | D3 | A4 | A4 | Ph | C═O | H |
| 2087 | H | H | A5 | A5 | Ph | C═O | H |
| 2088 | H | D1 | A5 | A5 | Ph | C═O | H |
| 2089 | H | D2 | A5 | A5 | Ph | C═O | H |
| 2090 | H | D3 | A5 | A5 | Ph | C═O | H |
| 2091 | D1 | D1 | A1 | A1 | Ph | C═O | H |
| 2092 | D2 | D2 | A1 | A1 | Ph | C═O | H |
| 2093 | D3 | D3 | A1 | A1 | Ph | C═O | H |

TABLE 9-continued

| Compound No. | $R^2$ | $R^7$ | $R^{10}$ | $R^{15}$ | $R^{17}$ | Z | Other Rs |
|---|---|---|---|---|---|---|---|
| 2094 | D1 | D1 | A2 | A2 | Ph | C═O | H |
| 2095 | D2 | D2 | A2 | A2 | Ph | C═O | H |
| 2096 | D3 | D3 | A2 | A2 | Ph | C═O | H |
| 2097 | D1 | D1 | A3 | A3 | Ph | C═O | H |
| 2098 | D2 | D2 | A3 | A3 | Ph | C═O | H |
| 2099 | D3 | D3 | A3 | A3 | Ph | C═O | H |
| 2100 | D1 | D1 | A4 | A4 | Ph | C═O | H |
| 2101 | D2 | D2 | A4 | A4 | Ph | C═O | H |
| 2102 | D3 | D3 | A4 | A4 | Ph | C═O | H |
| 2103 | D1 | D1 | A5 | A5 | Ph | C═O | H |
| 2104 | D2 | D2 | A5 | A5 | Ph | C═O | H |
| 2105 | D3 | D3 | A5 | A5 | Ph | C═O | H |

TABLE 10

| Compound No. | $R^3$ | $R^6$ | $R^{11}$ | $R^{14}$ | $R^{17}$ | Z | Other Rs |
|---|---|---|---|---|---|---|---|
| 2106 | H | H | H | A1 | Ph | C═O | H |
| 2107 | H | D1 | H | A1 | Ph | C═O | H |
| 2108 | H | D2 | H | A1 | Ph | C═O | H |
| 2109 | H | D3 | H | A1 | Ph | C═O | H |
| 2110 | H | H | H | A2 | Ph | C═O | H |
| 2111 | H | D1 | H | A2 | Ph | C═O | H |
| 2112 | H | D2 | H | A2 | Ph | C═O | H |
| 2113 | H | D3 | H | A2 | Ph | C═O | H |
| 2114 | H | H | H | A3 | Ph | C═O | H |
| 2115 | H | D1 | H | A3 | Ph | C═O | H |
| 2116 | H | D2 | H | A3 | Ph | C═O | H |
| 2117 | H | D3 | H | A3 | Ph | C═O | H |
| 2118 | H | H | H | A4 | Ph | C═O | H |
| 2119 | H | D1 | H | A4 | Ph | C═O | H |
| 2120 | H | D2 | H | A4 | Ph | C═O | H |
| 2121 | H | D3 | H | A4 | Ph | C═O | H |
| 2122 | H | H | H | A5 | Ph | C═O | H |
| 2123 | H | D1 | H | A5 | Ph | C═O | H |
| 2124 | H | D2 | H | A5 | Ph | C═O | H |
| 2125 | H | D3 | H | A5 | Ph | C═O | H |
| 2126 | D1 | D1 | H | A1 | Ph | C═O | H |
| 2127 | D2 | D2 | H | A1 | Ph | C═O | H |
| 2128 | D3 | D3 | H | A1 | Ph | C═O | H |
| 2129 | D1 | D1 | H | A2 | Ph | C═O | H |
| 2130 | D2 | D2 | H | A2 | Ph | C═O | H |
| 2131 | D3 | D3 | H | A2 | Ph | C═O | H |
| 2132 | D1 | D1 | H | A3 | Ph | C═O | H |
| 2133 | D2 | D2 | H | A3 | Ph | C═O | H |
| 2134 | D3 | D3 | H | A3 | Ph | C═O | H |
| 2135 | D1 | D1 | H | A4 | Ph | C═O | H |
| 2136 | D2 | D2 | H | A4 | Ph | C═O | H |
| 2137 | D3 | D3 | H | A4 | Ph | C═O | H |
| 2138 | D1 | D1 | H | A5 | Ph | C═O | H |
| 2139 | D2 | D2 | H | A5 | Ph | C═O | H |
| 2140 | D3 | D3 | H | A5 | Ph | C═O | H |
| 2141 | H | H | H | H | Ph | C═O | H |

TABLE 11

| Compound No. | $R^2$ | $R^7$ | $R^{10}$ | $R^{15}$ | $R^{17}$ | Z | Other Rs |
|---|---|---|---|---|---|---|---|
| 2142 | H | H | A1 | A1 | Ph | C═S | H |
| 2143 | H | D1 | A1 | A1 | Ph | C═S | H |
| 2144 | H | D2 | A1 | A1 | Ph | C═S | H |
| 2145 | H | D3 | A1 | A1 | Ph | C═S | H |
| 2146 | H | H | A2 | A2 | Ph | C═S | H |
| 2147 | H | D1 | A2 | A2 | Ph | C═S | H |
| 2148 | H | D2 | A2 | A2 | Ph | C═S | H |
| 2149 | H | D3 | A2 | A2 | Ph | C═S | H |
| 2150 | H | H | A3 | A3 | Ph | C═S | H |
| 2151 | H | D1 | A3 | A3 | Ph | C═S | H |
| 2152 | H | D2 | A3 | A3 | Ph | C═S | H |
| 2153 | H | D3 | A3 | A3 | Ph | C═S | H |

TABLE 11-continued

| Compound No. | $R^2$ | $R^7$ | $R^{10}$ | $R^{15}$ | $R^{17}$ | Z | Other Rs |
|---|---|---|---|---|---|---|---|
| 2154 | H | H | A4 | A4 | Ph | C=S | H |
| 2155 | H | D1 | A4 | A4 | Ph | C=S | H |
| 2156 | H | D2 | A4 | A4 | Ph | C=S | H |
| 2157 | H | D3 | A4 | A4 | Ph | C=S | H |
| 2158 | H | H | A5 | A5 | Ph | C=S | H |
| 2159 | H | D1 | A5 | A5 | Ph | C=S | H |
| 2160 | H | D2 | A5 | A5 | Ph | C=S | H |
| 2161 | H | D3 | A5 | A5 | Ph | C=S | H |
| 2162 | D1 | D1 | A1 | A1 | Ph | C=S | H |
| 2163 | D2 | D2 | A1 | A1 | Ph | C=S | H |
| 2164 | D3 | D3 | A1 | A1 | Ph | C=S | H |
| 2165 | D1 | D1 | A2 | A2 | Ph | C=S | H |
| 2166 | D2 | D2 | A2 | A2 | Ph | C=S | H |
| 2167 | D3 | D3 | A2 | A2 | Ph | C=S | H |
| 2168 | D1 | D1 | A3 | A3 | Ph | C=S | H |
| 2169 | D2 | D2 | A3 | A3 | Ph | C=S | H |
| 2170 | D3 | D3 | A3 | A3 | Ph | C=S | H |
| 2171 | D1 | D1 | A4 | A4 | Ph | C=S | H |
| 2172 | D2 | D2 | A4 | A4 | Ph | C=S | H |
| 2173 | D3 | D3 | A4 | A4 | Ph | C=S | H |
| 2174 | D1 | D1 | A5 | A5 | Ph | C=S | H |
| 2175 | D2 | D2 | A5 | A5 | Ph | C=S | H |
| 2176 | D3 | D3 | A5 | A5 | Ph | C=S | H |

TABLE 12

| Compound No. | $R^3$ | $R^8$ | $R^{11}$ | $R^{14}$ | $R^{17}$ | Z | Other Rs |
|---|---|---|---|---|---|---|---|
| 2177 | H | H | H | A1 | Ph | C=S | H |
| 2178 | H | D1 | H | A1 | Ph | C=S | H |
| 2179 | H | D2 | H | A1 | Ph | C=S | H |
| 2180 | H | D3 | H | A1 | Ph | C=S | H |
| 2181 | H | H | H | A2 | Ph | C=S | H |
| 2182 | H | D1 | H | A2 | Ph | C=S | H |
| 2183 | H | D2 | H | A2 | Ph | C=S | H |
| 2184 | H | D3 | H | A2 | Ph | C=S | H |
| 2185 | H | H | H | A3 | Ph | C=S | H |
| 2186 | H | D1 | H | A3 | Ph | C=S | H |
| 2187 | H | D2 | H | A3 | Ph | C=S | H |
| 2188 | H | D3 | H | A3 | Ph | C=S | H |
| 2189 | H | H | H | A4 | Ph | C=S | H |
| 2190 | H | D1 | H | A4 | Ph | C=S | H |
| 2191 | H | D2 | H | A4 | Ph | C=S | H |
| 2192 | H | D3 | H | A4 | Ph | C=S | H |
| 2193 | H | H | H | A5 | Ph | C=S | H |
| 2194 | H | D1 | H | A5 | Ph | C=S | H |
| 2195 | H | D2 | H | A5 | Ph | C=S | H |
| 2196 | H | D3 | H | A5 | Ph | C=S | H |
| 2197 | D1 | D1 | H | A1 | Ph | C=S | H |
| 2198 | D2 | D2 | H | A1 | Ph | C=S | H |
| 2199 | D3 | D3 | H | A1 | Ph | C=S | H |
| 2200 | D1 | D1 | H | A2 | Ph | C=S | H |
| 2201 | D2 | D2 | H | A2 | Ph | C=S | H |
| 2202 | D3 | D3 | H | A2 | Ph | C=S | H |
| 2203 | D1 | D1 | H | A3 | Ph | C=S | H |
| 2204 | D2 | D2 | H | A3 | Ph | C=S | H |
| 2205 | D3 | D3 | H | A3 | Ph | C=S | H |
| 2206 | D1 | D1 | H | A4 | Ph | C=S | H |
| 2207 | D2 | D2 | H | A4 | Ph | C=S | H |
| 2208 | D3 | D3 | H | A4 | Ph | C=S | H |
| 2209 | D1 | D1 | H | A5 | Ph | C=S | H |
| 2210 | D2 | D2 | H | A5 | Ph | C=S | H |
| 2211 | D3 | D3 | H | A5 | Ph | C=S | H |
| 2212 | H | H | H | H | Ph | C=S | H |

TABLE 13

| Compound No. | $R^2$ | $R^7$ | $R^{10}$ | $R^{15}$ | $R^{17}$ | Z | Other Rs |
|---|---|---|---|---|---|---|---|
| 2213 | H | H | A1 | A1 | Ph | $C{=}C(CN)_2$ | H |
| 2214 | H | D1 | A1 | A1 | Ph | $C{=}C(CN)_2$ | H |

TABLE 13-continued

| Compound No. | $R^2$ | $R^7$ | $R^{10}$ | $R^{15}$ | $R^{17}$ | Z | Other Rs |
|---|---|---|---|---|---|---|---|
| 2215 | H | D2 | A1 | A1 | Ph | $C{=}C(CN)_2$ | H |
| 2216 | H | D3 | A1 | A1 | Ph | $C{=}C(CN)_2$ | H |
| 2217 | H | H | A2 | A2 | Ph | $C{=}C(CN)_2$ | H |
| 2218 | H | D1 | A2 | A2 | Ph | $C{=}C(CN)_2$ | H |
| 2219 | H | D2 | A2 | A2 | Ph | $C{=}C(CN)_2$ | H |
| 2220 | H | D3 | A2 | A2 | Ph | $C{=}C(CN)_2$ | H |
| 2221 | H | H | A3 | A3 | Ph | $C{=}C(CN)_2$ | H |
| 2222 | H | D1 | A3 | A3 | Ph | $C{=}C(CN)_2$ | H |
| 2223 | H | D2 | A3 | A3 | Ph | $C{=}C(CN)_2$ | H |
| 2224 | H | D3 | A3 | A3 | Ph | $C{=}C(CN)_2$ | H |
| 2225 | H | H | A4 | A4 | Ph | $C{=}C(CN)_2$ | H |
| 2226 | H | D1 | A4 | A4 | Ph | $C{=}C(CN)_2$ | H |
| 2227 | H | D2 | A4 | A4 | Ph | $C{=}C(CN)_2$ | H |
| 2228 | H | D3 | A4 | A4 | Ph | $C{=}C(CN)_2$ | H |
| 2229 | H | H | A5 | A5 | Ph | $C{=}C(CN)_2$ | H |
| 2230 | H | D1 | A5 | A5 | Ph | $C{=}C(CN)_2$ | H |
| 2231 | H | D2 | A5 | A5 | Ph | $C{=}C(CN)_2$ | H |
| 2232 | H | D3 | A5 | A5 | Ph | $C{=}C(CN)_2$ | H |
| 2233 | D1 | D1 | A1 | A1 | Ph | $C{=}C(CN)_2$ | H |
| 2234 | D2 | D2 | A1 | A1 | Ph | $C{=}C(CN)_2$ | H |
| 2235 | D3 | D3 | A1 | A1 | Ph | $C{=}C(CN)_2$ | H |
| 2236 | D1 | D1 | A2 | A2 | Ph | $C{=}C(CN)_2$ | H |
| 2237 | D2 | D2 | A2 | A2 | Ph | $C{=}C(CN)_2$ | H |
| 2238 | D3 | D3 | A2 | A2 | Ph | $C{=}C(CN)_2$ | H |
| 2239 | D1 | D1 | A3 | A3 | Ph | $C{=}C(CN)_2$ | H |
| 2240 | D2 | D2 | A3 | A3 | Ph | $C{=}C(CN)_2$ | H |
| 2241 | D3 | D3 | A3 | A3 | Ph | $C{=}C(CN)_2$ | H |
| 2242 | D1 | D1 | A4 | A4 | Ph | $C{=}C(CN)_2$ | H |
| 2243 | D2 | D2 | A4 | A4 | Ph | $C{=}C(CN)_2$ | H |
| 2244 | D3 | D3 | A4 | A4 | Ph | $C{=}C(CN)_2$ | H |
| 2245 | D1 | D1 | A5 | A5 | Ph | $C{=}C(CN)_2$ | H |
| 2246 | D2 | D2 | A5 | A5 | Ph | $C{=}C(CN)_2$ | H |
| 2247 | D3 | D3 | A5 | A5 | Ph | $C{=}C(CN)_2$ | H |

TABLE 14

| Compound No. | $R^3$ | $R^8$ | $R^{11}$ | $R^{14}$ | $R^{17}$ | Z | Other Rs |
|---|---|---|---|---|---|---|---|
| 2248 | H | H | H | A1 | Ph | $C{=}C(CN)_2$ | H |
| 2249 | H | D1 | H | A1 | Ph | $C{=}C(CN)_2$ | H |
| 2250 | H | D2 | H | A1 | Ph | $C{=}C(CN)_2$ | H |
| 2251 | H | D3 | H | A1 | Ph | $C{=}C(CN)_2$ | H |
| 2252 | H | H | H | A2 | Ph | $C{=}C(CN)_2$ | H |
| 2253 | H | D1 | H | A2 | Ph | $C{=}C(CN)_2$ | H |
| 2254 | H | D2 | H | A2 | Ph | $C{=}C(CN)_2$ | H |
| 2255 | H | D3 | H | A2 | Ph | $C{=}C(CN)_2$ | H |
| 2256 | H | H | H | A3 | Ph | $C{=}C(CN)_2$ | H |
| 2257 | H | D1 | H | A3 | Ph | $C{=}C(CN)_2$ | H |
| 2258 | H | D2 | H | A3 | Ph | $C{=}C(CN)_2$ | H |
| 2259 | H | D3 | H | A3 | Ph | $C{=}C(CN)_2$ | H |
| 2260 | H | H | H | A4 | Ph | $C{=}C(CN)_2$ | H |
| 2261 | H | D1 | H | A4 | Ph | $C{=}C(CN)_2$ | H |
| 2262 | H | D2 | H | A4 | Ph | $C{=}C(CN)_2$ | H |
| 2263 | H | D3 | H | A4 | Ph | $C{=}C(CN)_2$ | H |
| 2264 | H | H | H | A5 | Ph | $C{=}C(CN)_2$ | H |
| 2265 | H | D1 | H | A5 | Ph | $C{=}C(CN)_2$ | H |
| 2266 | H | D2 | H | A5 | Ph | $C{=}C(CN)_2$ | H |
| 2267 | H | D3 | H | A5 | Ph | $C{=}C(CN)_2$ | H |
| 2268 | D1 | D1 | H | A1 | Ph | $C{=}C(CN)_2$ | H |
| 2269 | D2 | D2 | H | A1 | Ph | $C{=}C(CN)_2$ | H |
| 2270 | D3 | D3 | H | A1 | Ph | $C{=}C(CN)_2$ | H |
| 2271 | D1 | D1 | H | A2 | Ph | $C{=}C(CN)_2$ | H |
| 2272 | D2 | D2 | H | A2 | Ph | $C{=}C(CN)_2$ | H |
| 2273 | D3 | D3 | H | A2 | Ph | $C{=}C(CN)_2$ | H |
| 2274 | D1 | D1 | H | A3 | Ph | $C{=}C(CN)_2$ | H |
| 2275 | D2 | D2 | H | A3 | Ph | $C{=}C(CN)_2$ | H |
| 2276 | D3 | D3 | H | A3 | Ph | $C{=}C(CN)_2$ | H |
| 2277 | D1 | D1 | H | A4 | Ph | $C{=}C(CN)_2$ | H |
| 2278 | D2 | D2 | H | A4 | Ph | $C{=}C(CN)_2$ | H |
| 2279 | D3 | D3 | H | A4 | Ph | $C{=}C(CN)_2$ | H |
| 2280 | D1 | D1 | H | A5 | Ph | $C{=}C(CN)_2$ | H |
| 2281 | D2 | D2 | H | A5 | Ph | $C{=}C(CN)_2$ | H |

TABLE 14-continued

| Compound No. | R^3 | R^8 | R^11 | R^14 | R^17 | Z | Other Rs |
|---|---|---|---|---|---|---|---|
| 2282 | D3 | D3 | H | A5 | Ph | C=C(CN)$_2$ | H |
| 2283 | H | H | H | H | Ph | C=C(CN)$_2$ | H |

TABLE 15

| Compound No. | R^2 | R^7 | R^10 | R^15 | R^17 | Z | Other Rs |
|---|---|---|---|---|---|---|---|
| 2284 | H | H | A1 | A1 | Ph | C=C(COOH)$_2$ | H |
| 2285 | H | D1 | A1 | A1 | Ph | C=C(COOH)$_2$ | H |
| 2286 | H | D2 | A1 | A1 | Ph | C=C(COOH)$_2$ | H |
| 2287 | H | D3 | A1 | A1 | Ph | C=C(COOH)$_2$ | H |
| 2288 | H | H | A2 | A2 | Ph | C=C(COOH)$_2$ | H |
| 2289 | H | D1 | A2 | A2 | Ph | C=C(COOH)$_2$ | H |
| 2290 | H | D2 | A2 | A2 | Ph | C=C(COOH)$_2$ | H |
| 2291 | H | D3 | A2 | A2 | Ph | C=C(COOH)$_2$ | H |
| 2292 | H | H | A3 | A3 | Ph | C=C(COOH)$_2$ | H |
| 2293 | H | D1 | A3 | A3 | Ph | C=C(COOH)$_2$ | H |
| 2294 | H | D2 | A3 | A3 | Ph | C=C(COOH)$_2$ | H |
| 2295 | H | D3 | A3 | A3 | Ph | C=C(COOH)$_2$ | H |
| 2296 | H | H | A4 | A4 | Ph | C=C(COOH)$_2$ | H |
| 2297 | H | D1 | A4 | A4 | Ph | C=C(COOH)$_2$ | H |
| 2298 | H | D2 | A4 | A4 | Ph | C=C(COOH)$_2$ | H |
| 2299 | H | D3 | A4 | A4 | Ph | C=C(COOH)$_2$ | H |
| 2300 | H | H | A5 | A5 | Ph | C=C(COOH)$_2$ | H |
| 2301 | H | D1 | A5 | A5 | Ph | C=C(COOH)$_2$ | H |
| 2302 | H | D2 | A5 | A5 | Ph | C=C(COOH)$_2$ | H |
| 2303 | H | D3 | A5 | A5 | Ph | C=C(COOH)$_2$ | H |
| 2304 | D1 | D1 | A1 | A1 | Ph | C=C(COOH)$_2$ | H |
| 2305 | D2 | D2 | A1 | A1 | Ph | C=C(COOH)$_2$ | H |
| 2306 | D3 | D3 | A1 | A1 | Ph | C=C(COOH)$_2$ | H |
| 2307 | D1 | D1 | A2 | A2 | Ph | C=C(COOH)$_2$ | H |
| 2308 | D2 | D2 | A2 | A2 | Ph | C=C(COOH)$_2$ | H |
| 2309 | D3 | D3 | A2 | A2 | Ph | C=C(COOH)$_2$ | H |
| 2310 | D1 | D1 | A3 | A3 | Ph | C=C(COOH)$_2$ | H |
| 2311 | D2 | D2 | A3 | A3 | Ph | C=C(COOH)$_2$ | H |
| 2312 | D3 | D3 | A3 | A3 | Ph | C=C(COOH)$_2$ | H |
| 2313 | D1 | D1 | A4 | A4 | Ph | C=C(COOH)$_2$ | H |
| 2314 | D2 | D2 | A4 | A4 | Ph | C=C(COOH)$_2$ | H |
| 2315 | D3 | D3 | A4 | A4 | Ph | C=C(COOH)$_2$ | H |
| 2316 | D1 | D1 | A5 | A5 | Ph | C=C(COOH)$_2$ | H |
| 2317 | D2 | D2 | A5 | A5 | Ph | C=C(COOH)$_2$ | H |
| 2318 | D3 | D3 | A5 | A5 | Ph | C=C(COOH)$_2$ | H |

TABLE 16

| Compound No. | R^3 | R^6 | R^11 | R^14 | R^17 | Z | Other Rs |
|---|---|---|---|---|---|---|---|
| 2319 | H | H | H | A1 | Ph | C=C(COOH)$_2$ | H |
| 2320 | H | D1 | H | A1 | Ph | C=C(COOH)$_2$ | H |
| 2321 | H | D2 | H | A1 | Ph | C=C(COOH)$_2$ | H |
| 2322 | H | D3 | H | A1 | Ph | C=C(COOH)$_2$ | H |
| 2323 | H | H | H | A2 | Ph | C=C(COOH)$_2$ | H |
| 2324 | H | D1 | H | A2 | Ph | C=C(COOH)$_2$ | H |
| 2325 | H | D2 | H | A2 | Ph | C=C(COOH)$_2$ | H |
| 2326 | H | D3 | H | A2 | Ph | C=C(COOH)$_2$ | H |
| 2327 | H | H | H | A3 | Ph | C=C(COOH)$_2$ | H |
| 2328 | H | D1 | H | A3 | Ph | C=C(COOH)$_2$ | H |
| 2329 | H | D2 | H | A3 | Ph | C=C(COOH)$_2$ | H |
| 2330 | H | D3 | H | A3 | Ph | C=C(COOH)$_2$ | H |
| 2331 | H | H | H | A4 | Ph | C=C(COOH)$_2$ | H |
| 2332 | H | D1 | H | A4 | Ph | C=C(COOH)$_2$ | H |
| 2333 | H | D2 | H | A4 | Ph | C=C(COOH)$_2$ | H |
| 2334 | H | D3 | H | A4 | Ph | C=C(COOH)$_2$ | H |
| 2335 | H | H | H | A5 | Ph | C=C(COOH)$_2$ | H |
| 2336 | H | D1 | H | A5 | Ph | C=C(COOH)$_2$ | H |
| 2337 | H | D2 | H | A5 | Ph | C=C(COOH)$_2$ | H |
| 2338 | H | D3 | H | A5 | Ph | C=C(COOH)$_2$ | H |
| 2339 | D1 | D1 | H | A1 | Ph | C=C(COOH)$_2$ | H |
| 2340 | D2 | D2 | H | A1 | Ph | C=C(COOH)$_2$ | H |
| 2341 | D3 | D3 | H | A1 | Ph | C=C(COOH)$_2$ | H |

TABLE 16-continued

| Compound No. | R^3 | R^6 | R^11 | R^14 | R^17 | Z | Other Rs |
|---|---|---|---|---|---|---|---|
| 2342 | D1 | D1 | H | A2 | Ph | C=C(COOH)$_2$ | H |
| 2343 | D2 | D2 | H | A2 | Ph | C=C(COOH)$_2$ | H |
| 2344 | D3 | D3 | H | A2 | Ph | C=C(COOH)$_2$ | H |
| 2345 | D1 | D1 | H | A3 | Ph | C=C(COOH)$_2$ | H |
| 2346 | D2 | D2 | H | A3 | Ph | C=C(COOH)$_2$ | H |
| 2347 | D3 | D3 | H | A3 | Ph | C=C(COOH)$_2$ | H |
| 2348 | D1 | D1 | H | A4 | Ph | C=C(COOH)$_2$ | H |
| 2349 | D2 | D2 | H | A4 | Ph | C=C(COOH)$_2$ | H |
| 2350 | D3 | D3 | H | A4 | Ph | C=C(COOH)$_2$ | H |
| 2351 | D1 | D1 | H | A5 | Ph | C=C(COOH)$_2$ | H |
| 2352 | D2 | D2 | H | A5 | Ph | C=C(COOH)$_2$ | H |
| 2353 | D3 | D3 | H | A5 | Ph | C=C(COOH)$_2$ | H |
| 2354 | H | H | H | H | Ph | C=C(COOH)$_2$ | H |

Examples of the preferred light emitting material include compounds represented by the following general formula (151). The entire description of WO 2013/011955 including the paragraphs 0007 to 0033 and 0059 to 0066 is incorporated herein by reference.

General Formula (151)

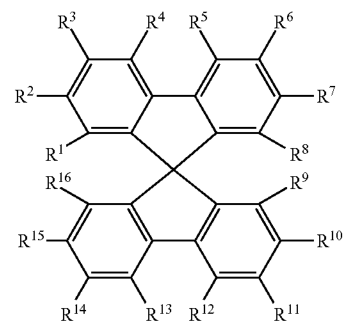

wherein in the general formula (151), $R^1$, $R^2$, $R^3$, $R^4$, $R^5$, $R^6$, $R^7$ and $R^8$ each independently represent a hydrogen atom or an electron donating group, provided that at least one thereof represents an electron donating group; $R^9$, $R^{10}$, $R^{11}$, $R^{12}$, $R^{13}$, $R^{14}$, $R^{15}$ and $R^{16}$ each independently represent a hydrogen atom or an electron withdrawing group, provided that at least one thereof represents an electron withdrawing group.

Specific examples of the compounds include the compounds shown in the following tables. In the tables, D1 to D10 represent the unsubstituted electron donating groups having the following structures, respectively.

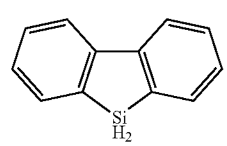

D1

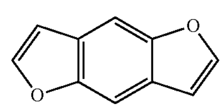

D2

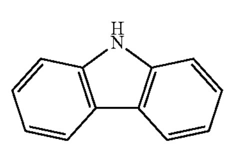

D3

-continued
D4
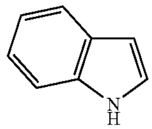
D5
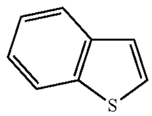
D6
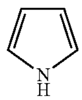
D7
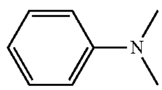
-continued
D8
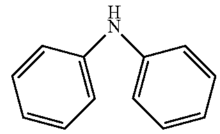
D9
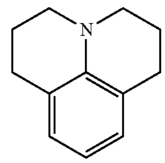
10
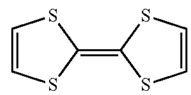
TABLE 17
Compound 3001
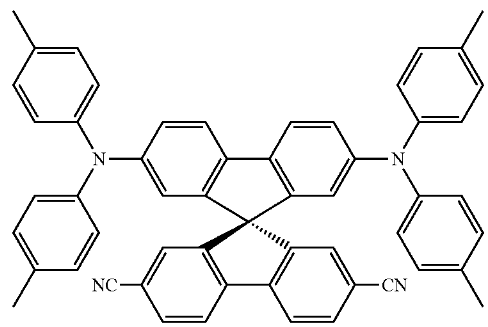
| Compound No. | $R^2$ | $R^7$ | $R^{10}$ | $R^{15}$ | Other Rs |
|---|---|---|---|---|---|
| 3002 | D1 | D1 | CN | CN | H |
| 3003 | D2 | D2 | CN | CN | H |
| 3004 | D3 | D3 | CN | CN | H |
| 3005 | D4 | D4 | CN | CN | H |
| 3006 | D5 | D5 | CN | CN | H |
| 3007 | D6 | D6 | CN | CN | H |
| 3008 | D7 | D7 | CN | CN | H |
| 3009 | D8 | D8 | CN | CN | H |
| 3010 | D9 | D9 | CN | CN | H |
| 3011 | D10 | D10 | CN | CN | H |
| 3012 | H | D1 | H | CN | H |
| 3013 | H | D2 | H | CN | H |
| 3014 | H | D3 | H | CN | H |
| 3015 | H | D4 | H | CN | H |
| 3016 | H | D5 | H | CN | H |
| 3017 | H | D6 | H | CN | H |
| 3018 | H | D7 | H | CN | H |
| 3019 | H | D8 | H | CN | H |
| 3020 | H | D9 | H | CN | H |
| 3021 | H | D10 | H | CN | H |

TABLE 18

| Compound No. | $R^3$ | $R^8$ | $R^{11}$ | $R^{14}$ | Other Rs |
|---|---|---|---|---|---|
| 3022 | D1 | D1 | CN | CN | H |
| 3023 | D2 | D2 | CN | CN | H |
| 3024 | D3 | D3 | CN | CN | H |
| 3025 | D4 | D4 | CN | CN | H |
| 3026 | D5 | D5 | CN | CN | H |
| 3027 | D6 | D6 | CN | CN | H |
| 3028 | D7 | D7 | CN | CN | H |
| 3029 | D8 | D8 | CN | CN | H |
| 3030 | D9 | D9 | CN | CN | H |
| 3031 | D10 | D10 | CN | CN | H |
| 3032 | H | D1 | H | CN | H |
| 3033 | H | D2 | H | CN | H |
| 3034 | H | D3 | H | CN | H |
| 3035 | H | D4 | H | CN | H |
| 3036 | H | D5 | H | CN | H |
| 3037 | H | D6 | H | CN | H |
| 3038 | H | D7 | H | CN | H |
| 3039 | H | D8 | H | CN | H |
| 3040 | H | D9 | H | CN | H |
| 3041 | H | D10 | H | CN | H |

TABLE 19

| Compound No. | $R^2$, $R^7$ | $R^3$, $R^6$ | $R^{10}$, $R^{15}$ | $R^{11}$, $R^{14}$ | Other Rs |
|---|---|---|---|---|---|
| 3042 | diphenylamino group | H | CN | H | H |
| 3043 | bis(2-methylphenyl)amino group | H | CN | H | H |
| 3044 | bis(3-methylphenyl)amino group | H | CN | H | H |
| 3045 | bis(2,4-dimethylphenyl)amino group | H | CN | H | H |
| 3046 | bis(2,6-dimethylphenyl)amino group | H | CN | H | H |
| 3047 | bis(3,5-dimethylphenyl)amino group | H | CN | H | H |
| 3048 | bis(2,4,6-trimethylphenyl)amino group | H | CN | H | H |
| 3049 | bis(4-ethylphenyl)amino group | H | CN | H | H |
| 3050 | bis(4-propylphenyl)amino group | H | CN | H | H |
| 3051 | diphenylamino group | H | H | CN | H |
| 3052 | bis(2-methylphenyl)amino group | H | H | CN | H |
| 3053 | bis(3-methylphenyl)amino group | H | H | CN | H |
| 3054 | bis(4-methylphenyl)amino group | H | H | CN | H |
| 3055 | bis(2,4-dimethylphenyl)amino group | H | H | CN | H |
| 3056 | bis(2,6-dimethylphenyl)amino group | H | H | CN | H |
| 3057 | bis(3,5-dimethylphenyl)amino group | H | H | CN | H |
| 3058 | bis(2,4,6-trimethylphenyl)amino group | H | H | CN | H |
| 3059 | bis(4-ethylphenyl)amino group | H | H | CN | H |
| 3060 | bis(4-propylphenyl)amino group | H | H | CN | H |

TABLE 20

| Compound No. | $R^2$, $R^7$ | $R^3$, $R^6$ | $R^{10}$, $R^{15}$ | $R^{11}$, $R^{14}$ | Other Rs |
|---|---|---|---|---|---|
| 3061 | H | diphenylamino group | CN | H | H |
| 3062 | H | bis(2-methylphenyl)amino group | CN | H | H |
| 3063 | H | bis(3-methylphenyl)amino group | CN | H | H |
| 3064 | H | bis(4-methylphenyl)amino group | CN | H | H |
| 3065 | H | bis(2,4-dimethylphenyl)amino group | CN | H | H |
| 3066 | H | bis(2,6-dimethylphenyl)amino group | CN | H | H |
| 3067 | H | bis(3,5-dimethylphenyl)amino group | CN | H | H |
| 3068 | H | bis(2,4,6-trimethylphenyl)amino group | CN | H | H |
| 3069 | H | bis(4-ethylphenyl)amino group | CN | H | H |
| 3070 | H | bis(4-propylphenyl)amino group | CN | H | H |
| 3071 | H | diphenylamino group | H | CN | H |
| 3072 | H | bis(2-methylphenyl)amino group | H | CN | H |
| 3073 | H | bis(3-methylphenyl)amino group | H | CN | H |
| 3074 | H | bis(4-methylphenyl)amino group | H | CN | H |
| 3075 | H | bis(2,4-dimethylphenyl)amino group | H | CN | H |
| 3076 | H | bis(2,6-dimethylphenyl)amino group | H | CN | H |
| 3077 | H | bis(3,5-dimethylphenyl)amino group | H | CN | H |
| 3078 | H | bis(2,4,6-trimethylphenyl)amino group | H | CN | H |
| 3079 | H | bis(4-ethylphenyl)amino group | H | CN | H |
| 3080 | H | bis(4-propylphenyl)amino group | H | CN | H |

Examples of the preferred light emitting material include compounds represented by the following general formula (161). The entire description of WO 2013/081088 including the paragraphs 0008 to 0071 and 0118 to 0133 is incorporated herein by reference.

General Formula (161)

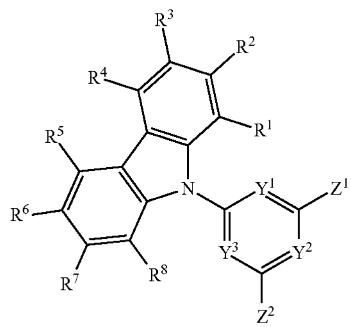

wherein in the general formula (161), any two or $Y^1$, $Y^2$ and $Y^3$ each represent a nitrogen atom, and the balance thereof represents a methine group, of all $Y^1$, $Y^2$ and $Y^3$ each represent a nitrogen atom; $Z^1$ and $Z^2$ each independently represent a hydrogen atom or a substituent; and $R^1$ and $R^8$ each independently represent a hydrogen atom or a substituent, provided that at least one of $R^1$ to $R^8$ represents a substituted or unsubstituted diarylamino group or a substituted or unsubstituted carbazolyl group. The compound represented by the general formula (161) has at least two carbazole structures in the molecule thereof.

Examples of the compound include the following compounds.

1

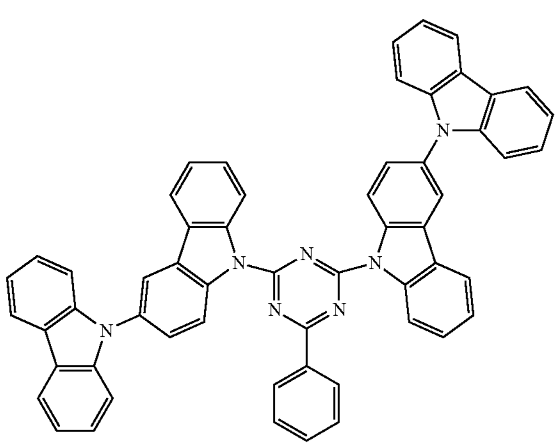

-continued

2

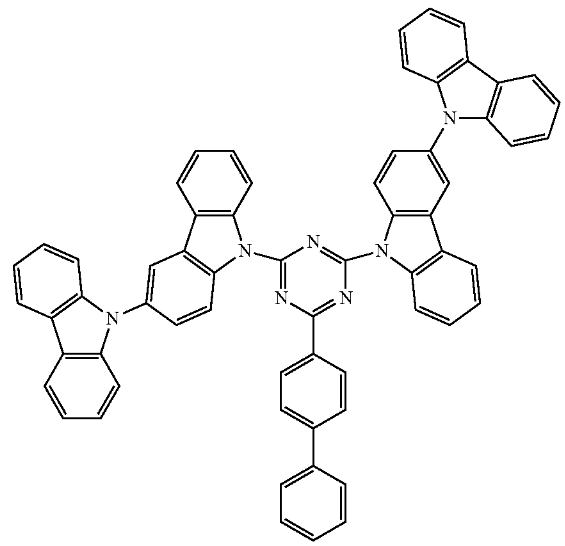

3

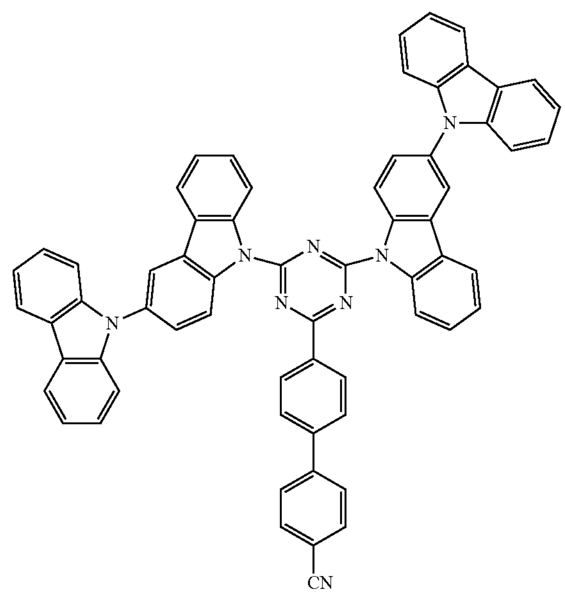

4

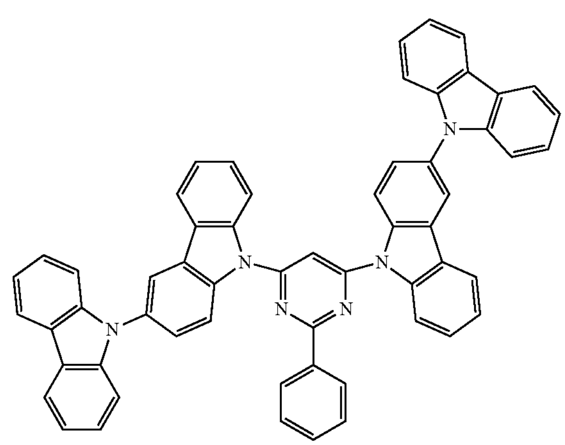

5
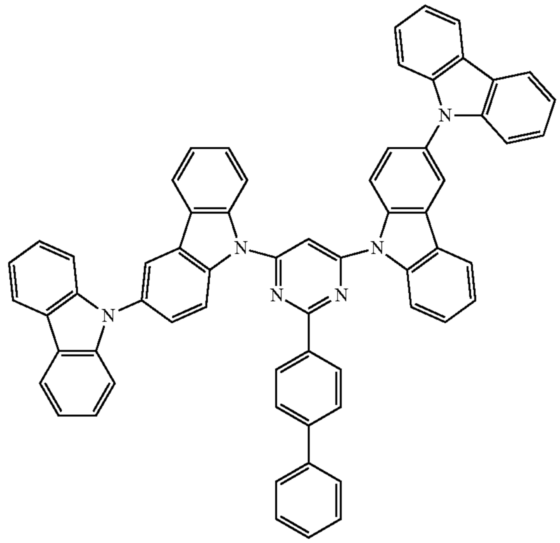
6
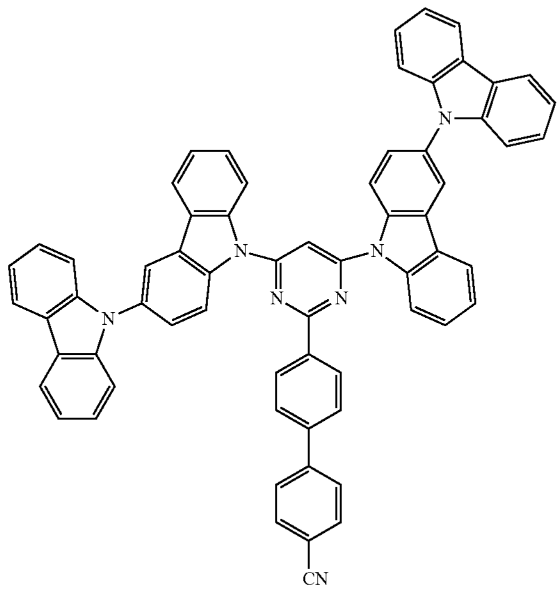
7
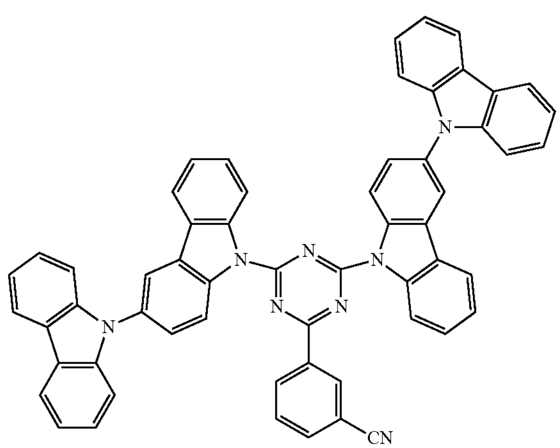
8
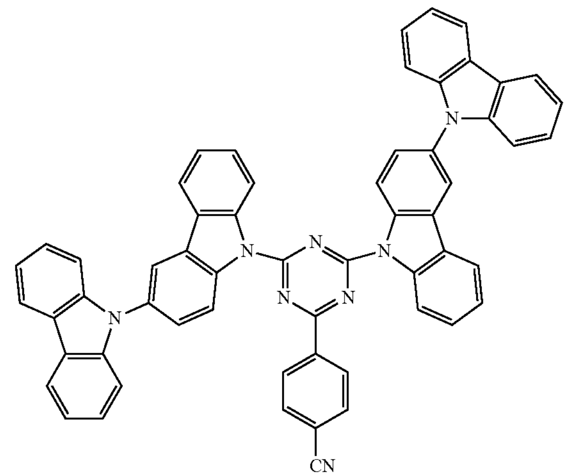
9
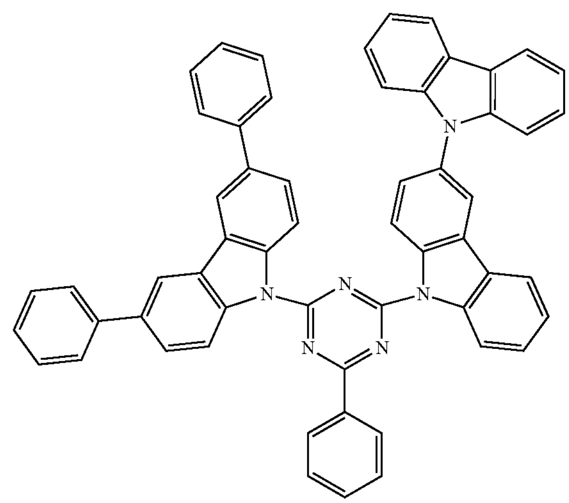
10
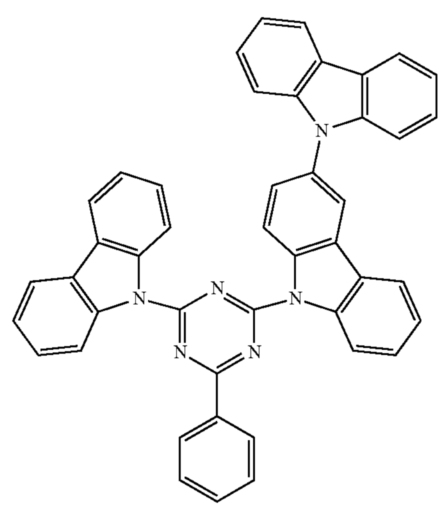

11
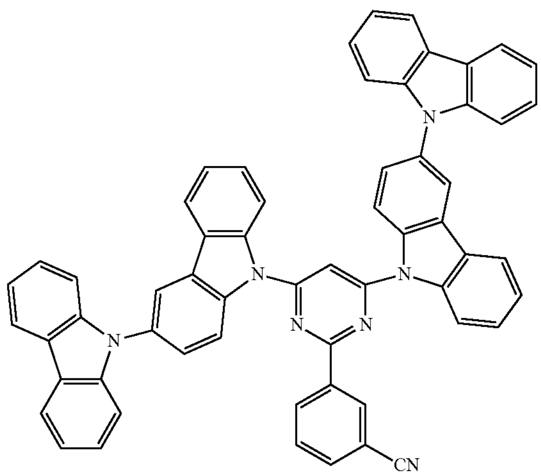
12
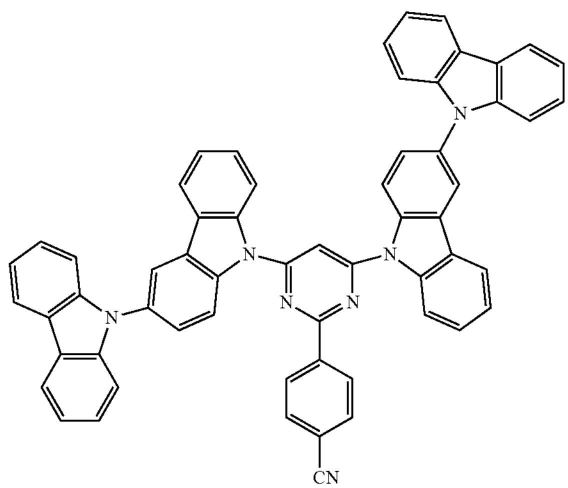
13
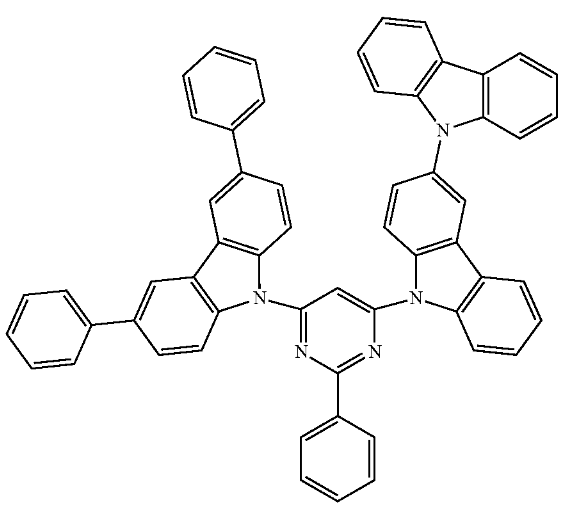
14
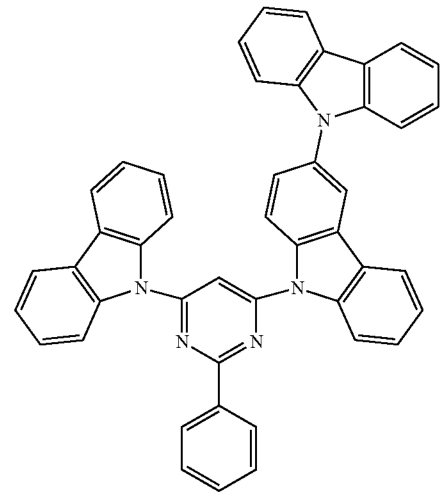
15
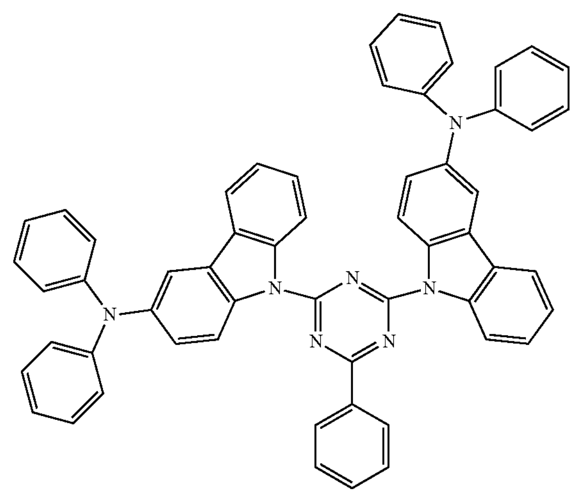
16
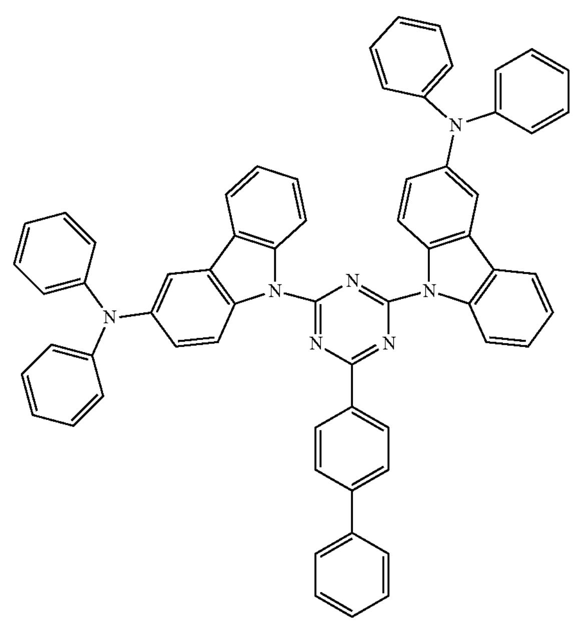

-continued
17
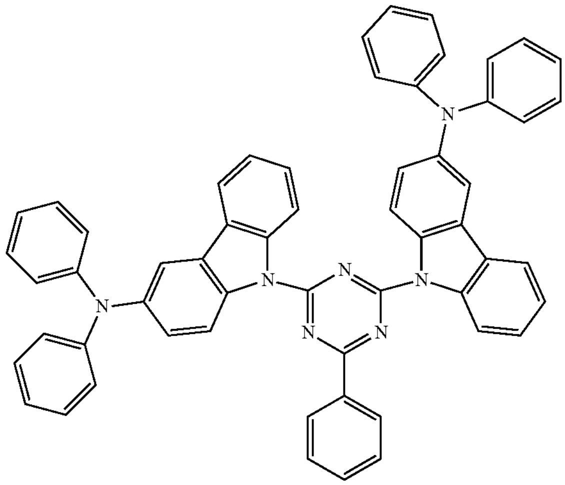
18
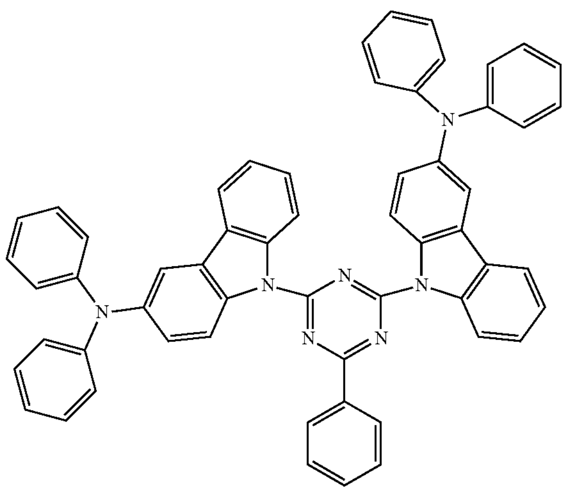
19
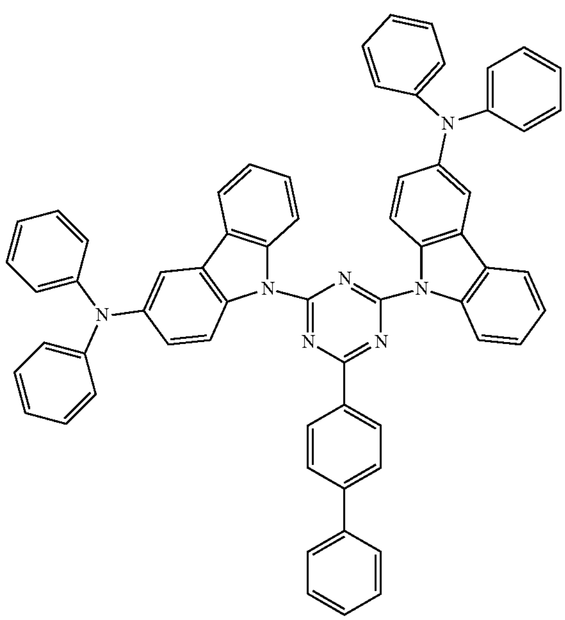
-continued
20
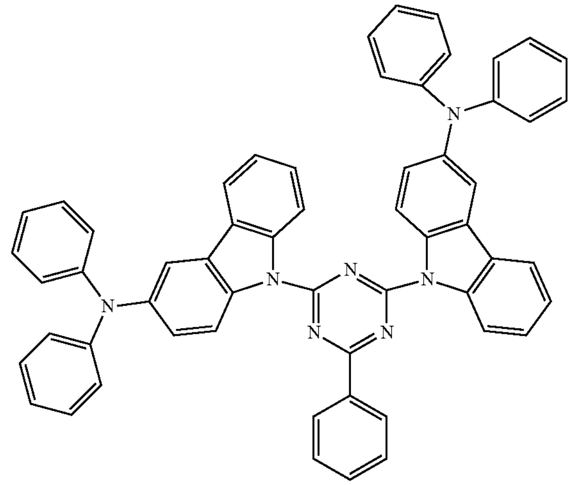
21
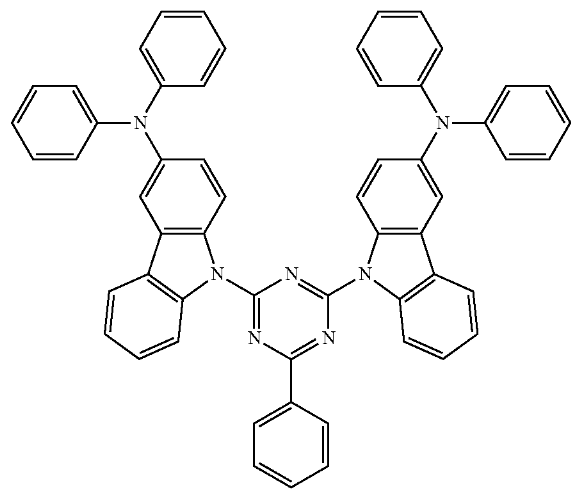
22
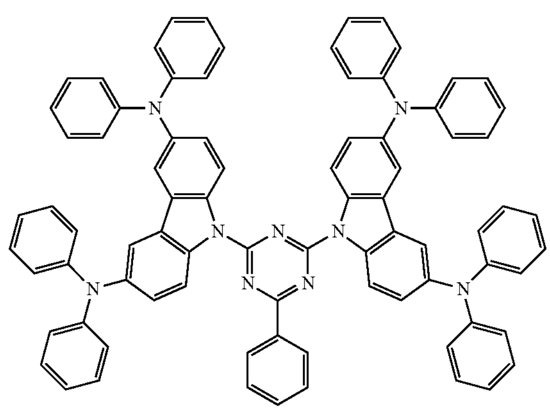

-continued
23
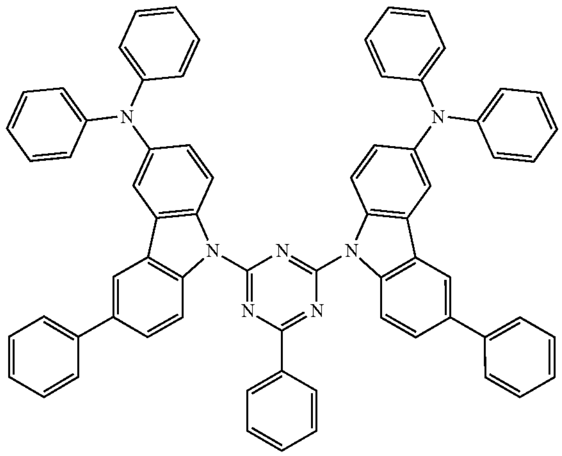
24
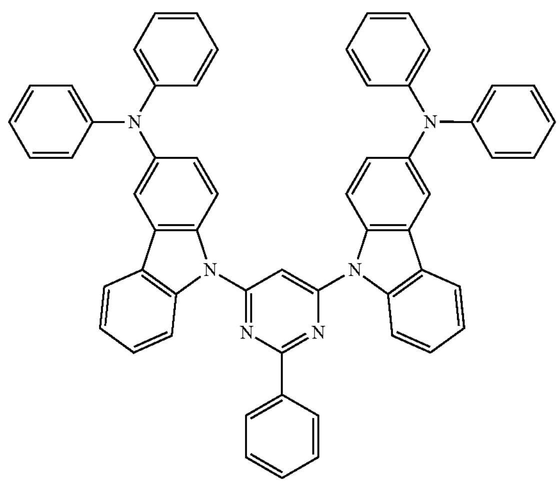
25
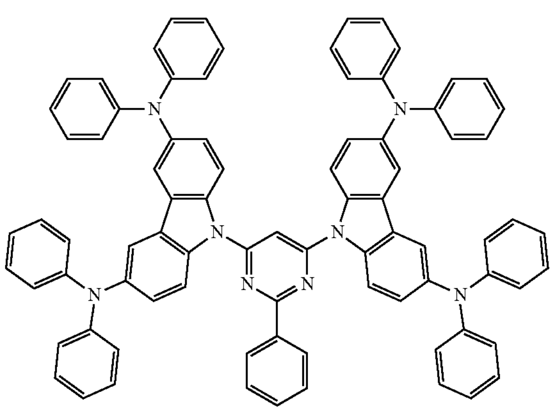
-continued
26
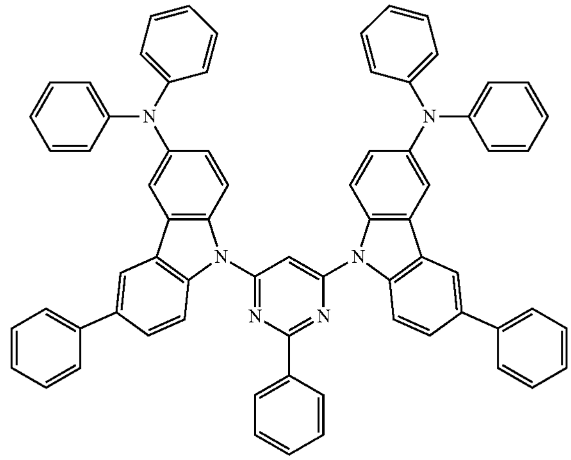
27
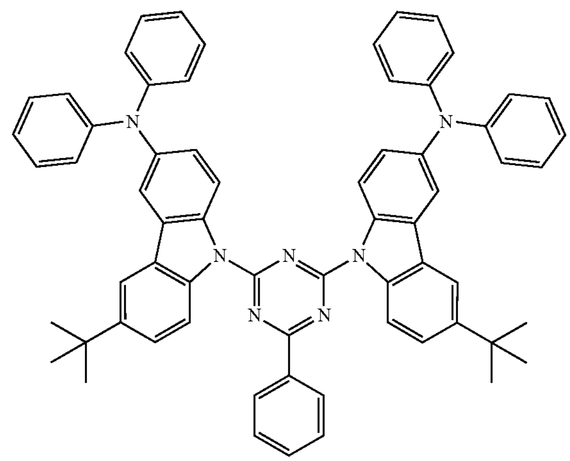
28
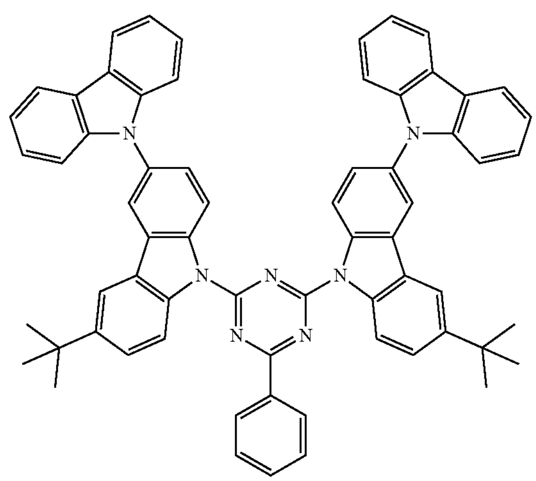

-continued
29
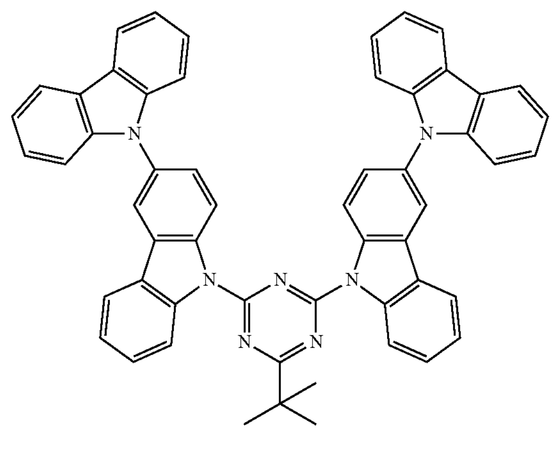
30
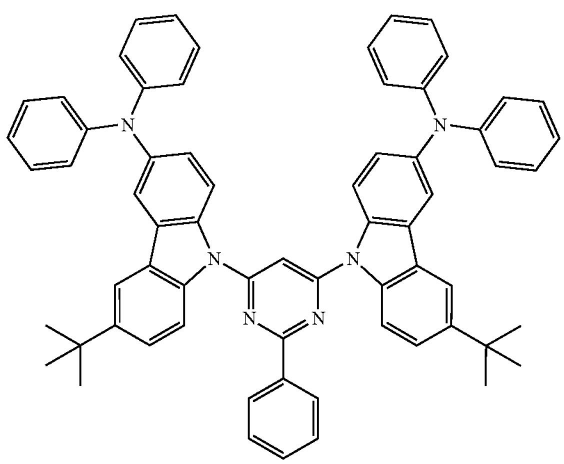
31
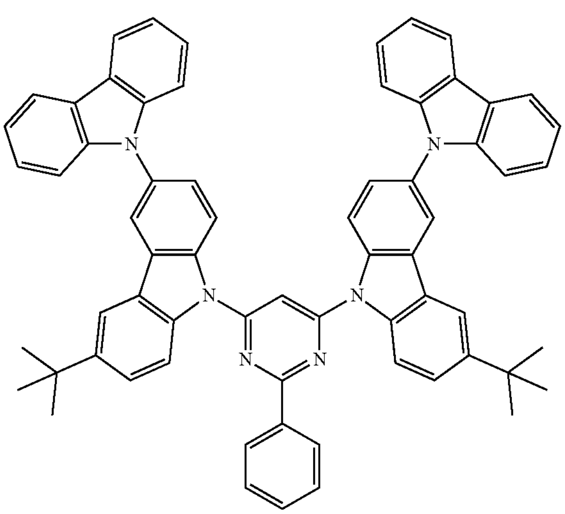
-continued
32
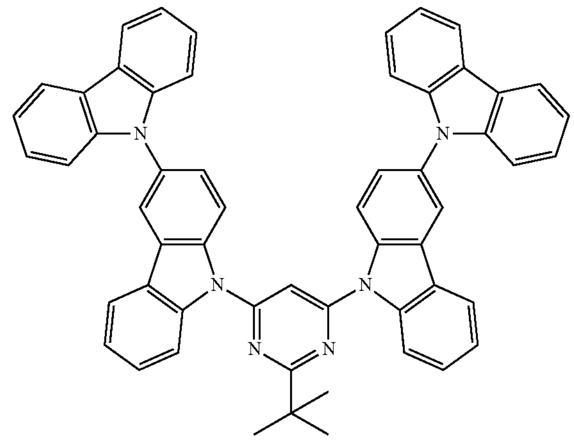
33
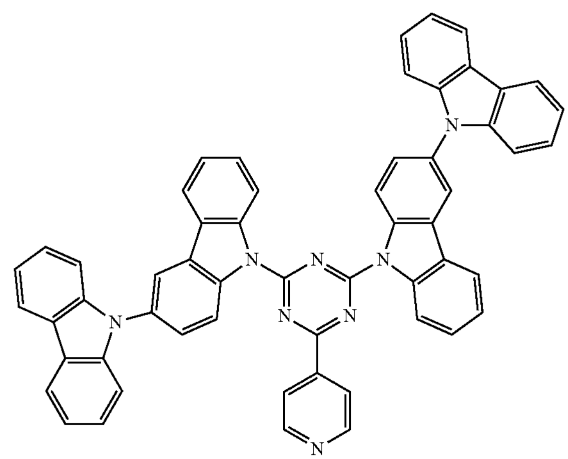
34
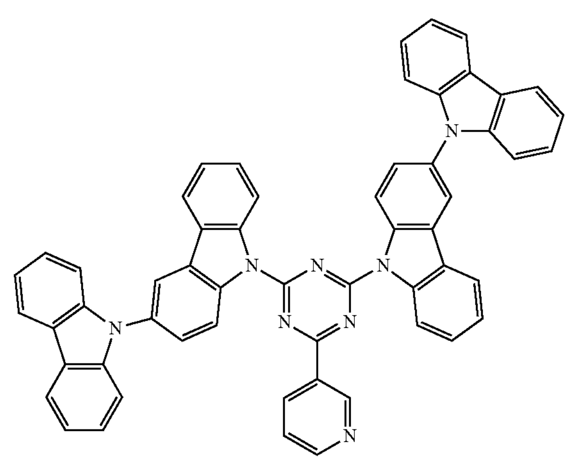

-continued
35
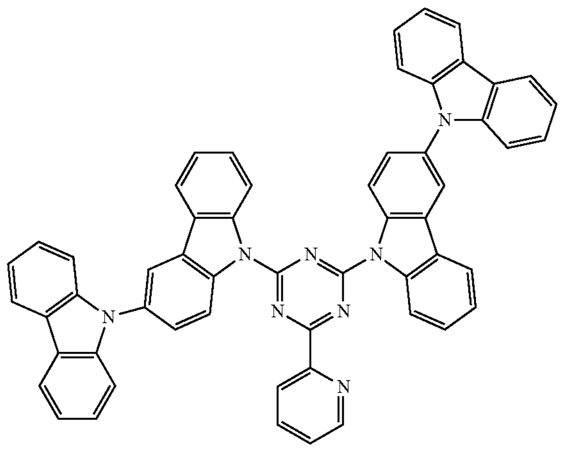
36
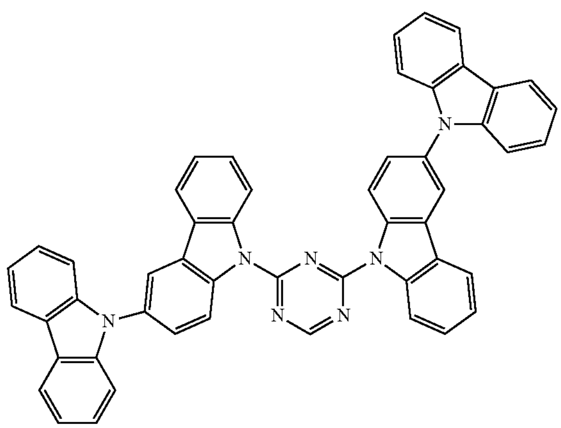
37
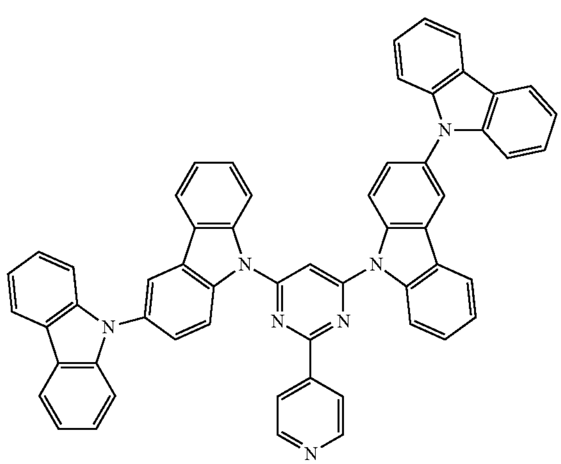
-continued
38
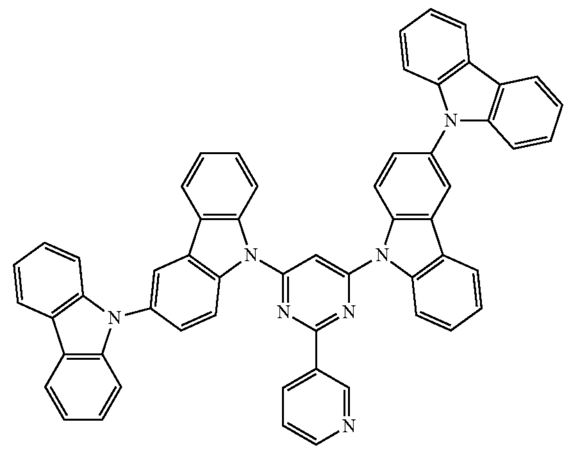
39
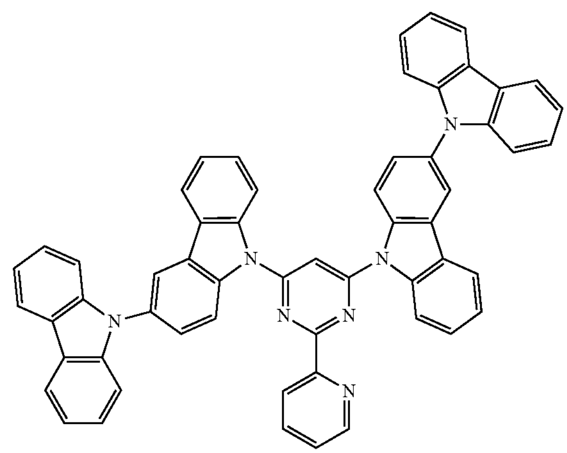
40
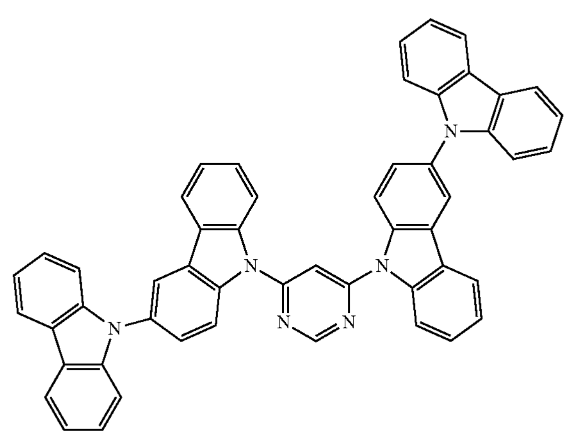

-continued
41
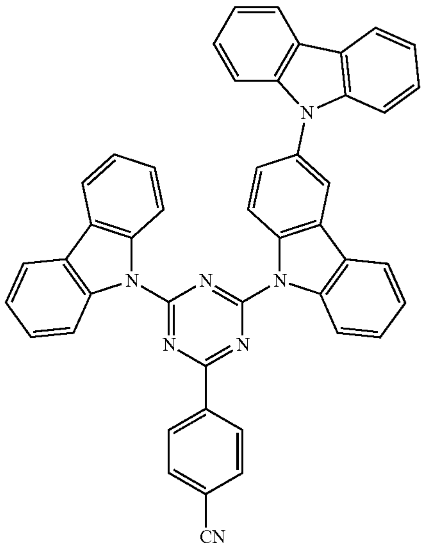
42
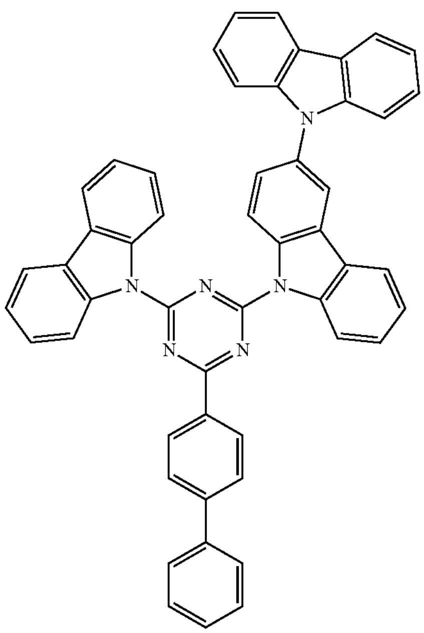
43
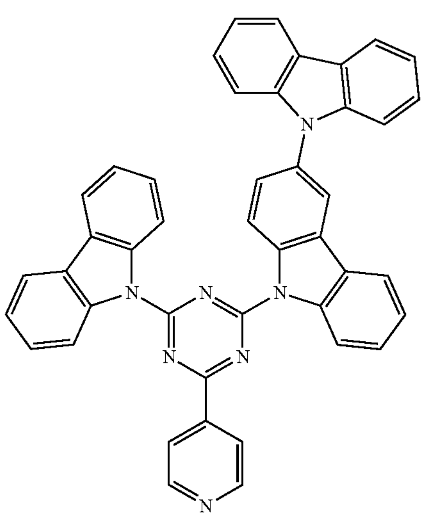
-continued
44
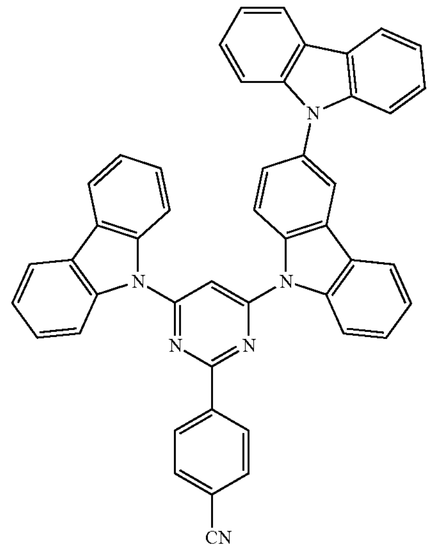
45
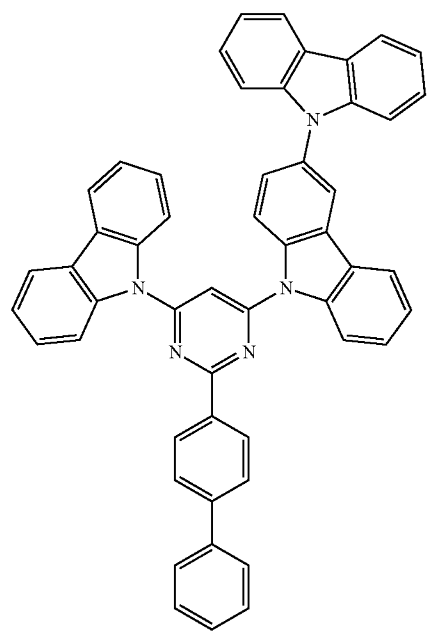
46
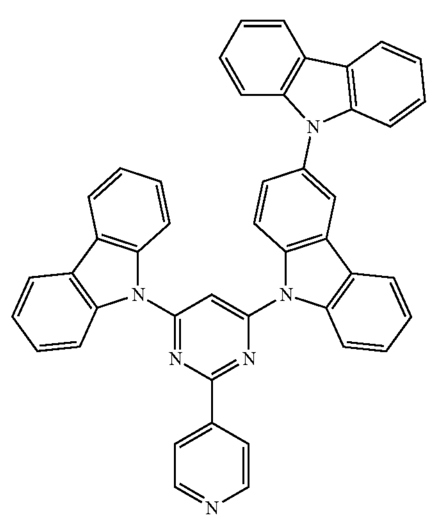

-continued
47
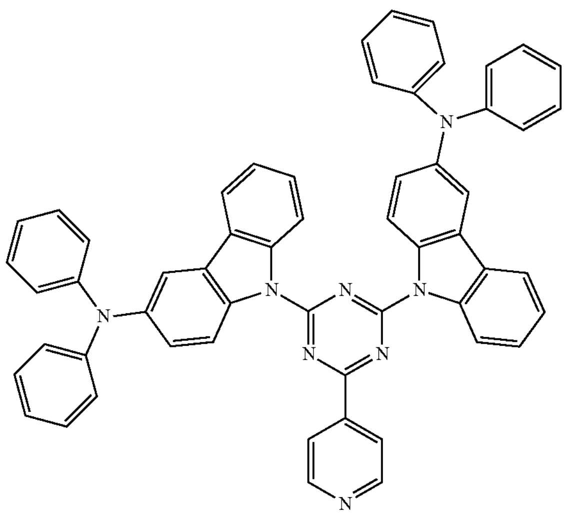
48
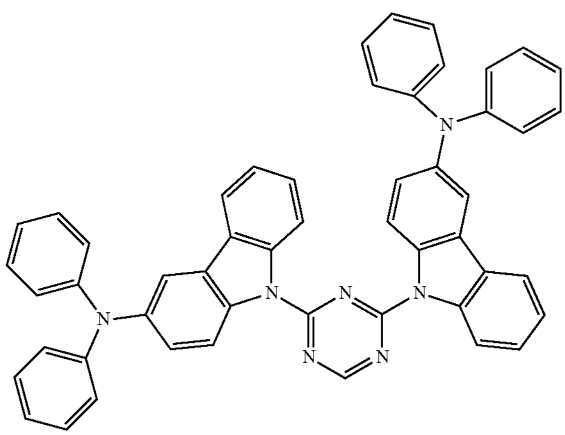
49
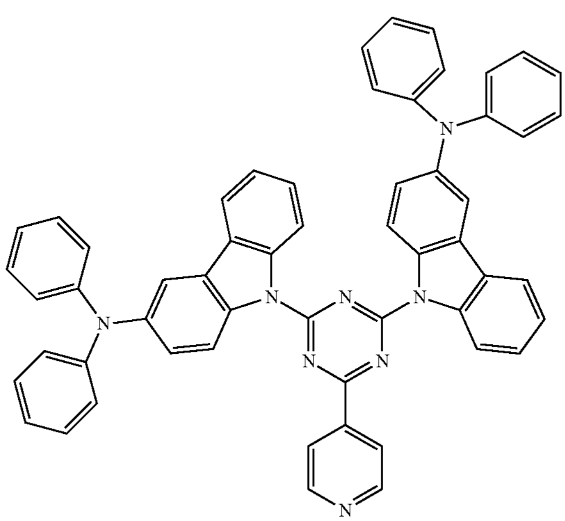
-continued
50
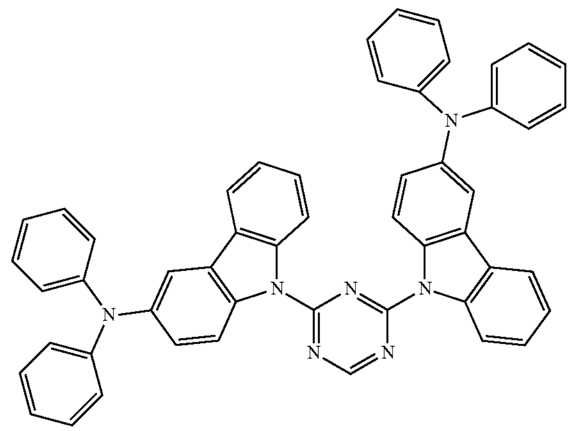
51
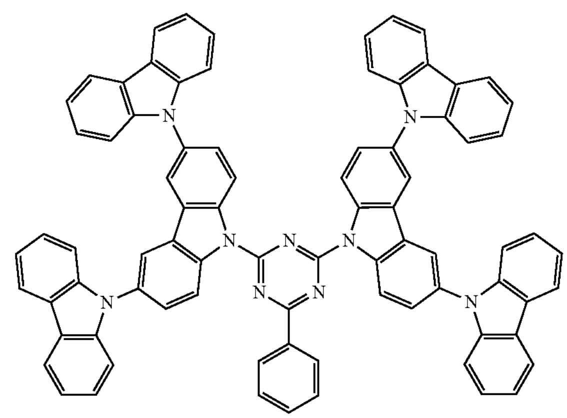
52
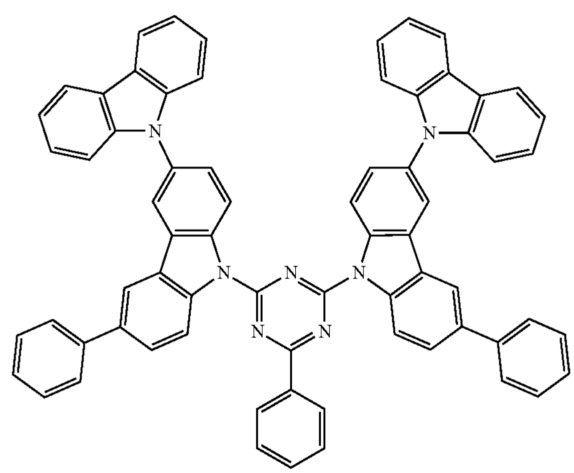

53
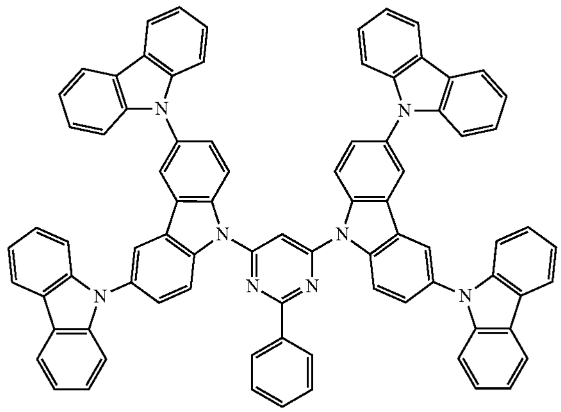
54
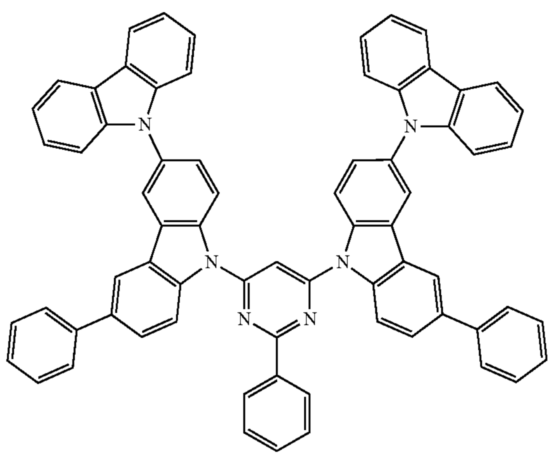
55
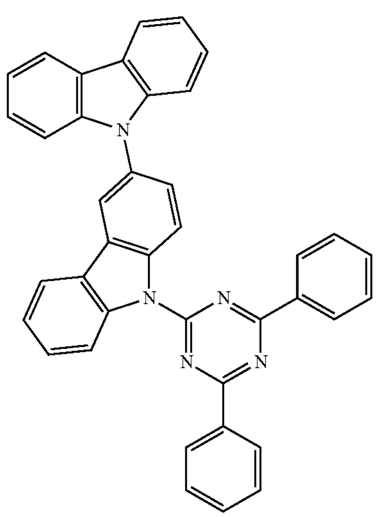
56
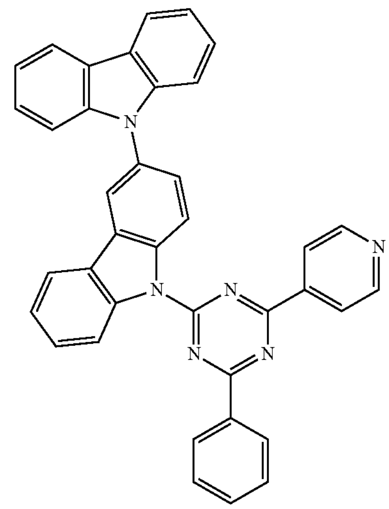
57
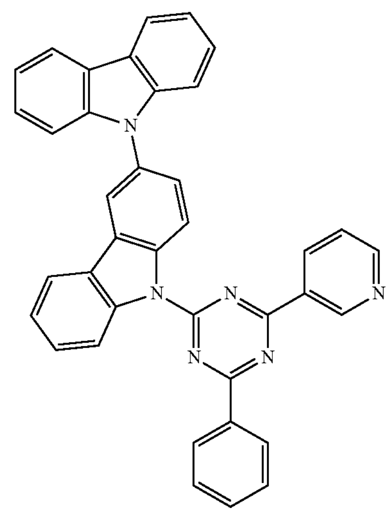
58
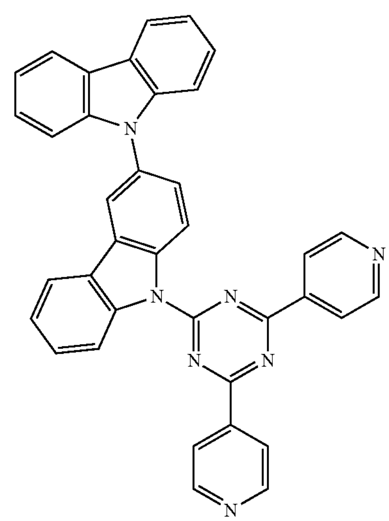

-continued
59
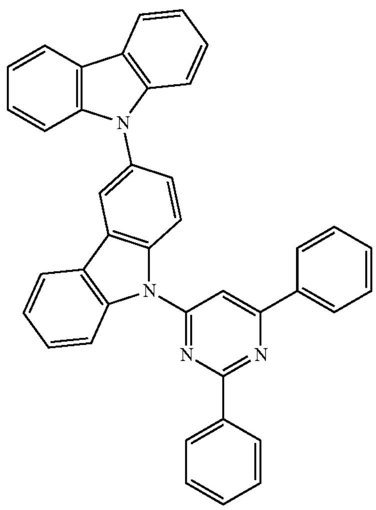
60
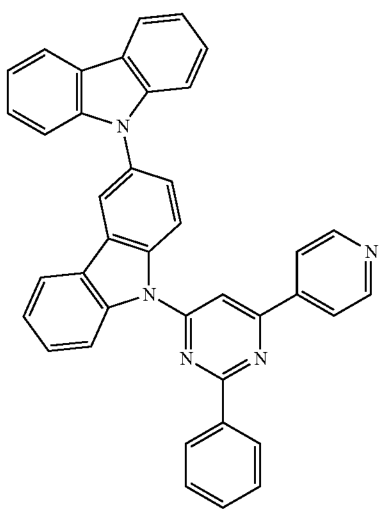
61
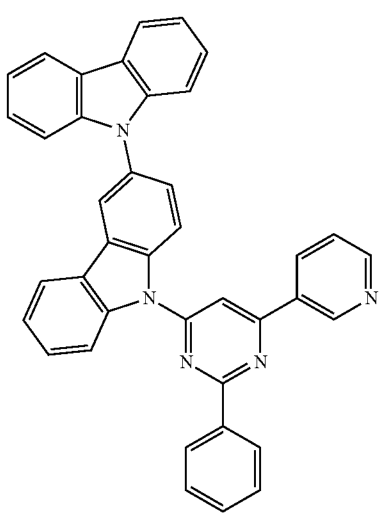
-continued
62
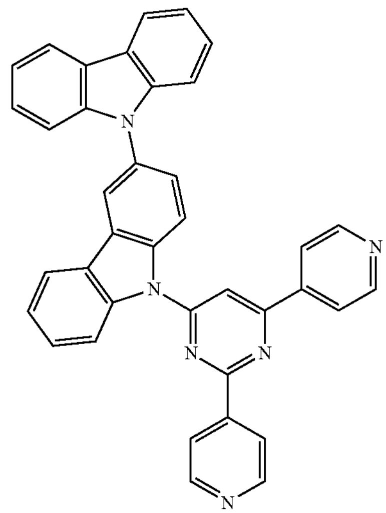
63
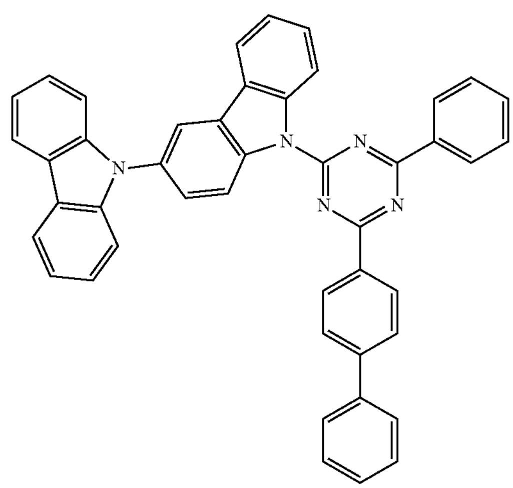
64
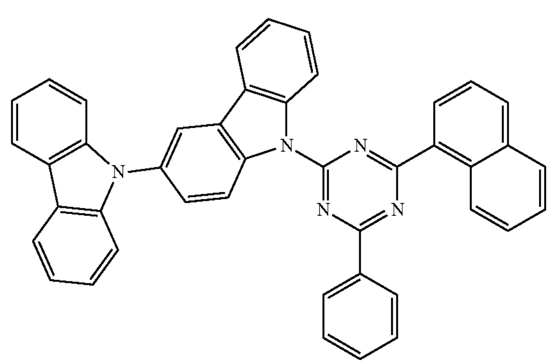

-continued
65
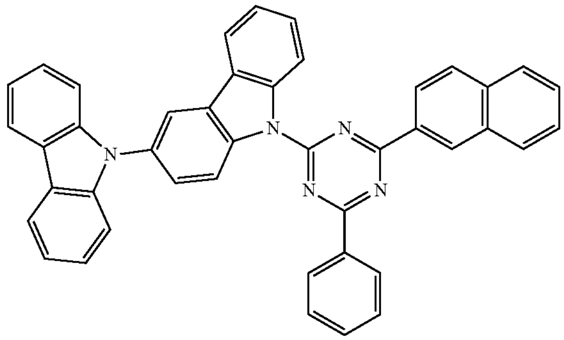
66
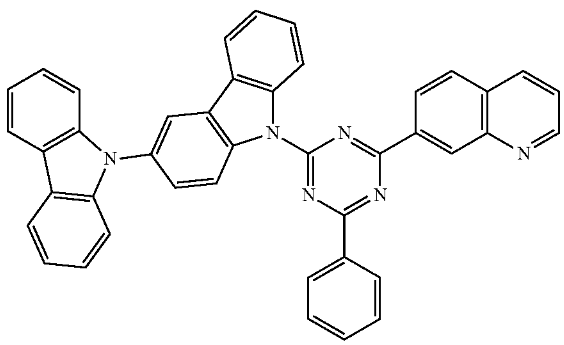
67
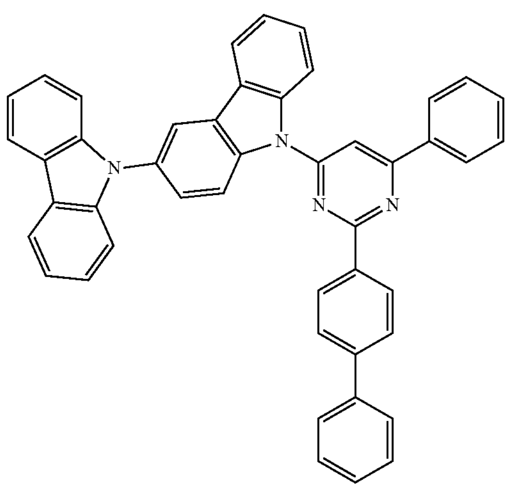
68
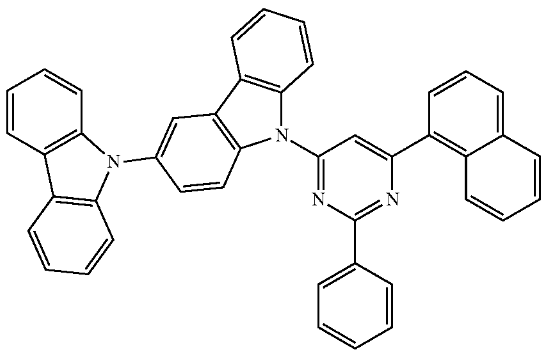
-continued
69
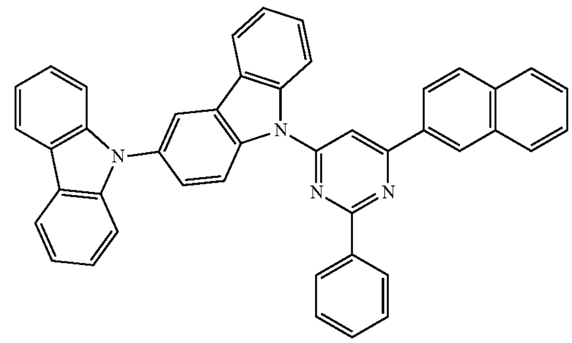
70
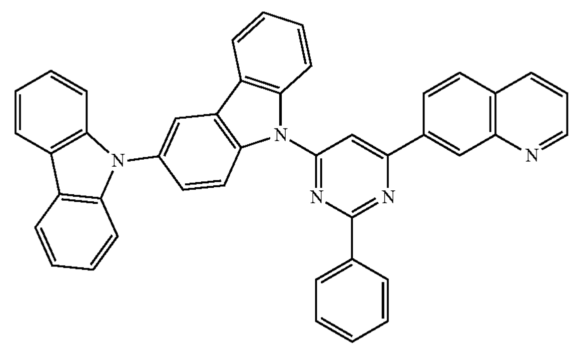
71
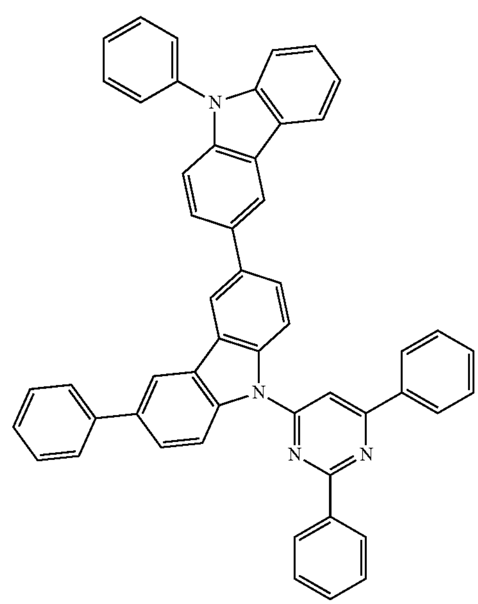

-continued
-continued
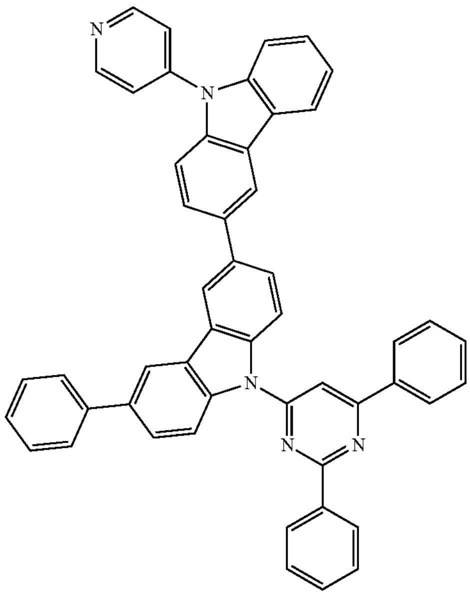
72
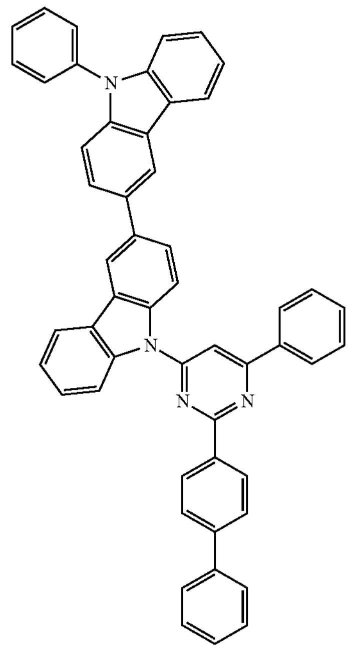
74
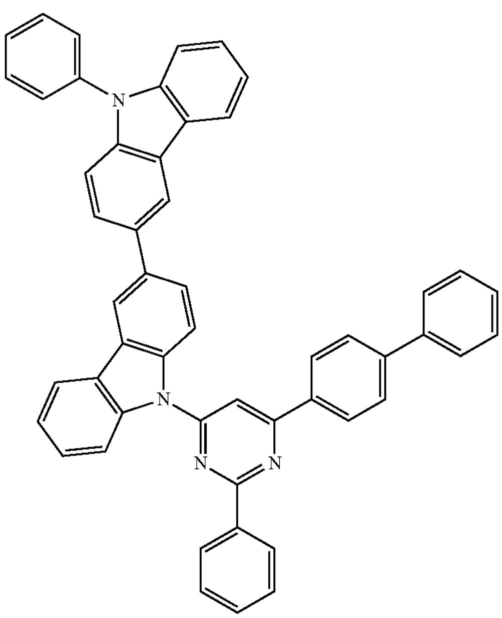
73
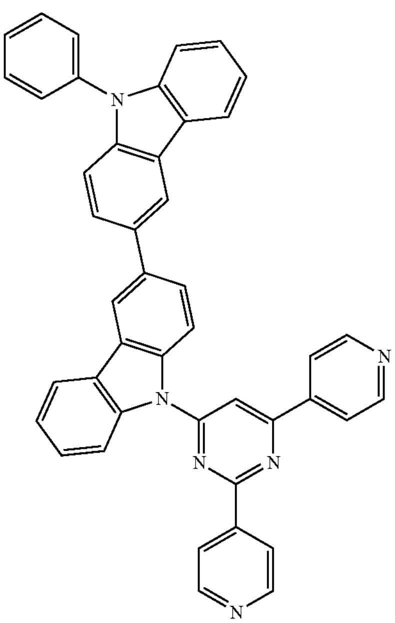
75

-continued
76
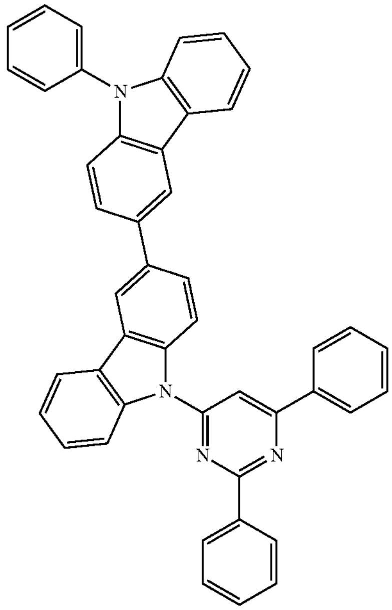
77
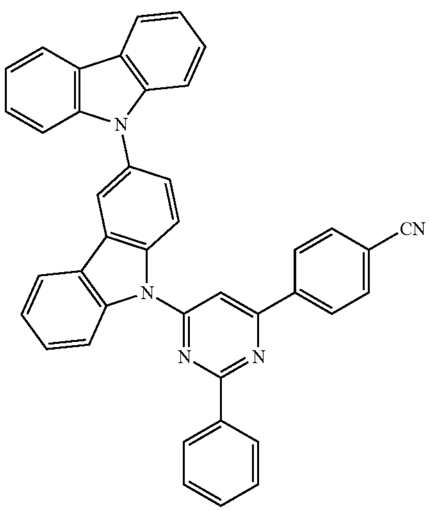
78
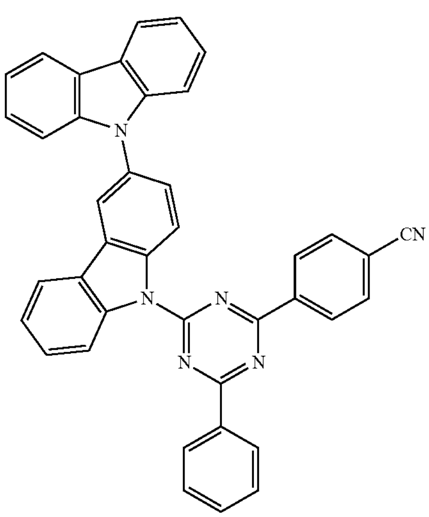
-continued
79
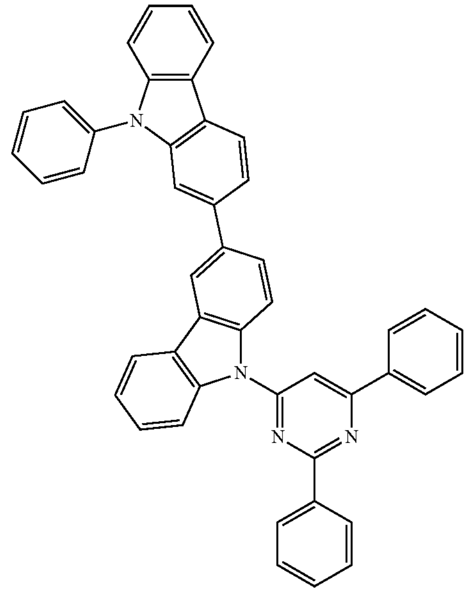
80
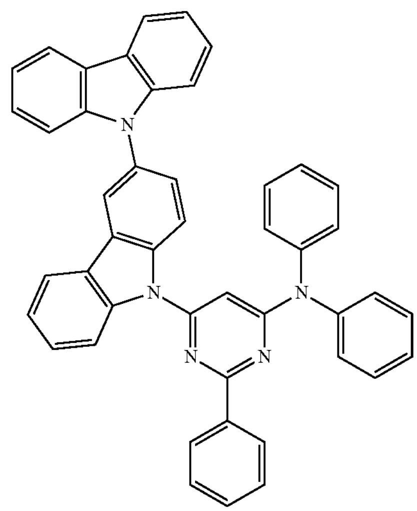
81
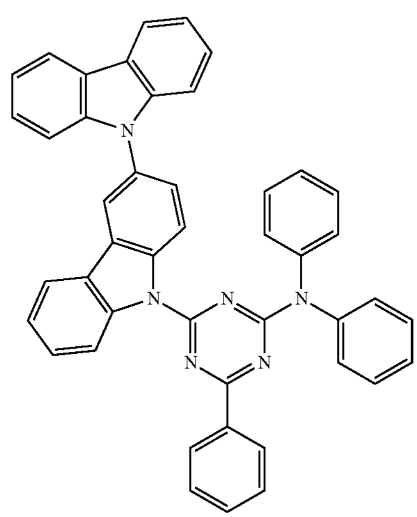

-continued
82
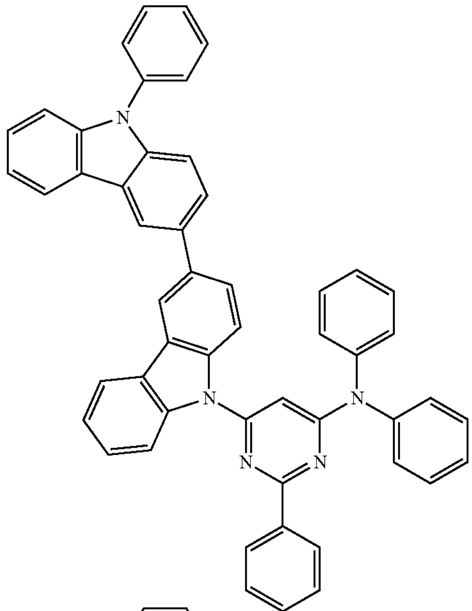
83
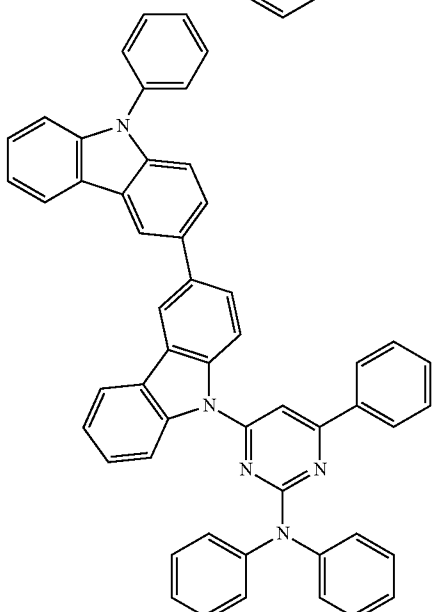
84
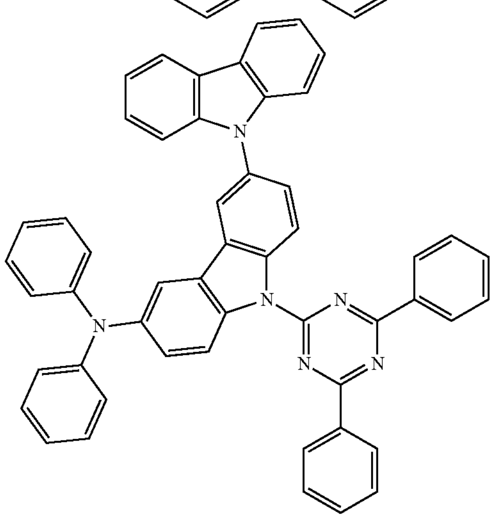
-continued
85
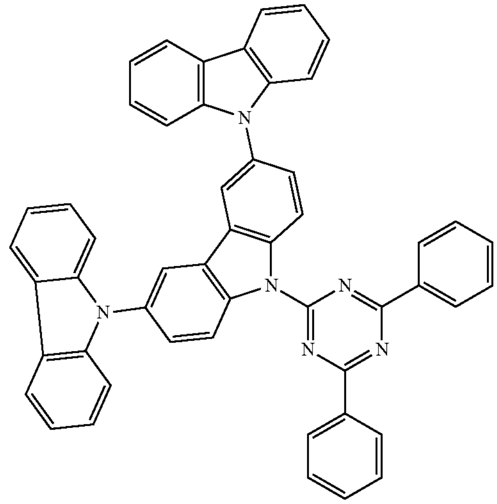
86
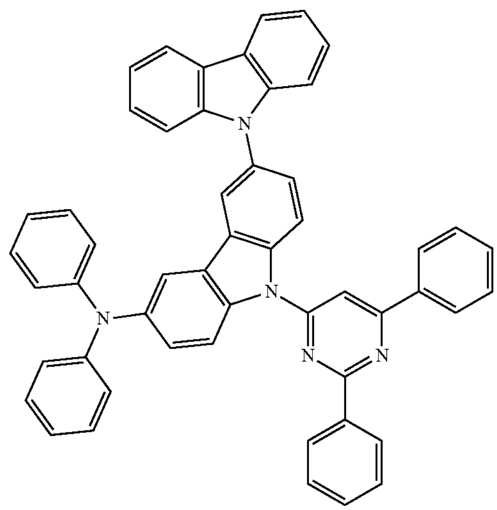
87
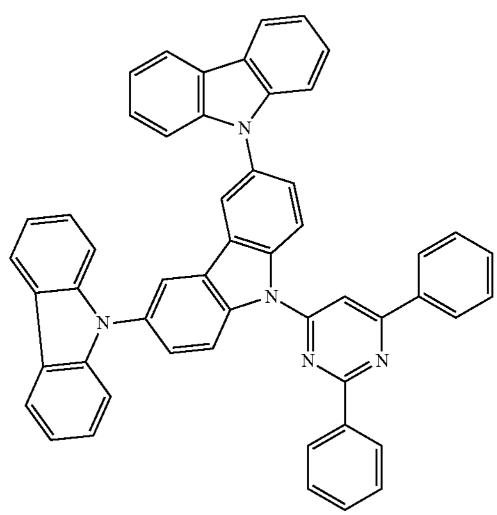

-continued

88

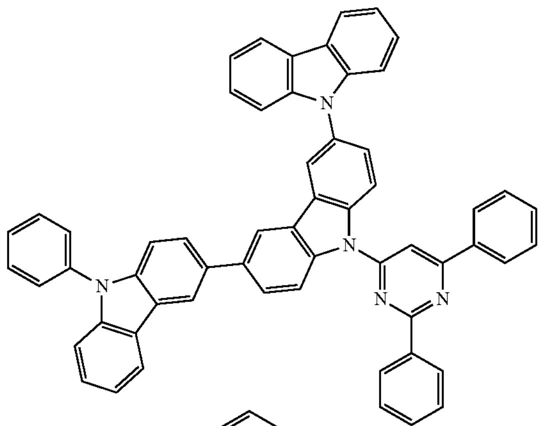

89

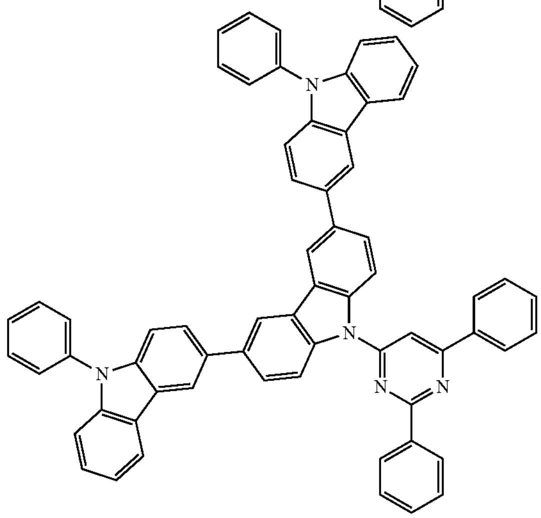

Examples of the preferred light emitting material include compounds represented by the following general formula (181). The entire description of JP-A-2013-116975 including the paragraphs 0008 to 0020 and 0038 to 0040 is incorporated herein by reference.

General Formula (181)

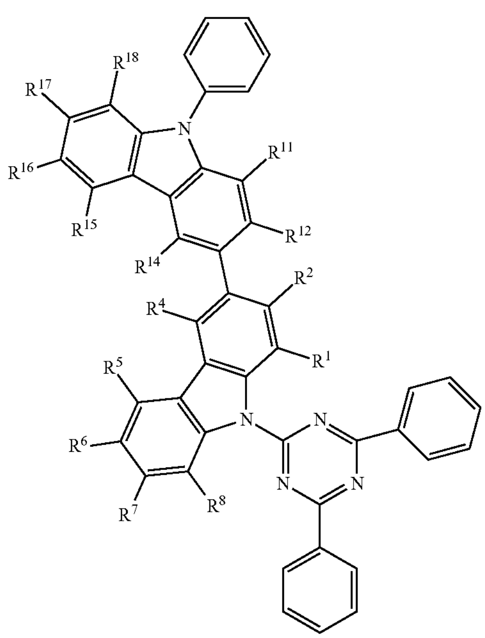

wherein in the general formula (181), $R^1$, $R^2$, $R^4$ to $R^8$, $R^{11}$, $R^{12}$ and and $R^{14}$ to $R^{18}$ each independently represent a hydrogen atom or a substituent.

Examples of the compound include the following compound.

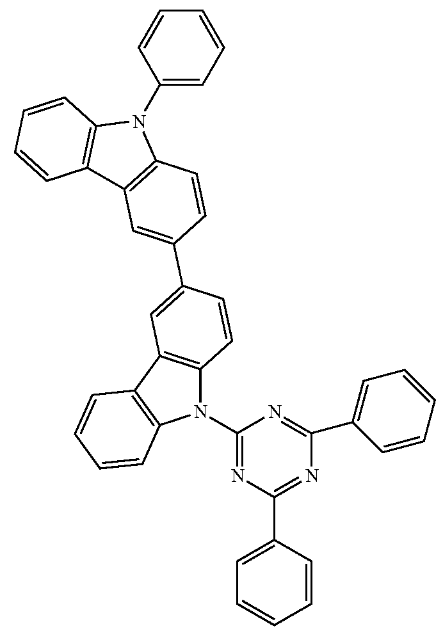 [SMILES: c1ccc(-c2nc(-c3ccccc3)nc(-n3c4ccccc4c4cc(-c5ccc6c(c5)c5ccccc5n6-c5ccccc5)ccc43)n2)cc1]

Examples of the preferred light emitting material include the following compounds.

(1) A compound represented by the following general formula (191):

General Formula (191)

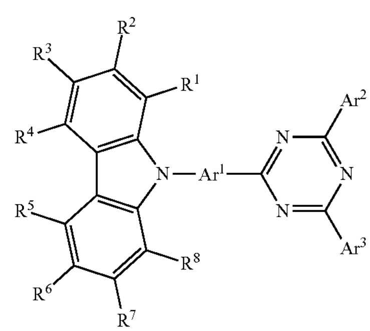

wherein in the general formula (191), $Ar^1$ represents a substituted or unsubstituted arylene group; $Ar^2$ and $Ar^3$ each independently represent a substituted or unsubstituted aryl group; and $R^1$ to $R^8$ each independently represent a hydrogen atom or a substituent, provided that at least one of $R^1$ to $R^8$ represents a substituted or unsubstituted diarylamino group, and $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure.

(2) The compound according to the item (1), wherein in the general formula (191), at least one of $R^3$ to $R^4$ represents a substituted or unsubstituted diarylamino group, and at least one of $R^5$ and $R^8$ represents a substituted or unsubstituted diarylamino group.

(3) The compound according to the item (2), wherein in the general formula (191), $R^3$ and $R^6$ each represent a substituted or unsubstituted diarylamino group.

(4) The compound according to any one of the items (1) to (3), wherein in the general formula (191), at least one of $R^1$ to $R^8$ represents a substituted or unsubstituted diphenylamino group.

(5) The compound according to any one of the items (1) to (4), wherein in the general formula (191), $Ar^2$ and $Ar^3$ each independently represent a substituted or unsubstituted phenyl group.

(6) The compound according to any one of the items (1) to (5), wherein in the general formula (191), $Ar^1$ represents a substituted or unsubstituted phenylene group, a substituted or unsubstituted naphthylene group or a substituted or unsubstituted anthracenylene group.

(7) The compound according to the item (1), wherein the compound has a structure represented by the following general formula (192):

General Formula (192)

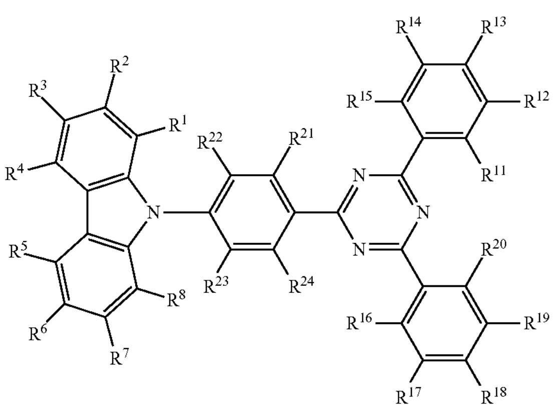

wherein in the general formula (192), $R^1$ to $R^8$ and $R^{11}$ to $R^{24}$ each independently represent a hydrogen atom or a substituent, provided that at least one of $R^1$ to $R^8$ represents a substituted or unsubstituted diarylamino group, and $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{12}$ and $R^{13}$, $R^{13}$ and $R^{14}$, $R^{14}$ and $R^{15}$, $R^{16}$ and $R^{17}$, $R^{17}$ and $R^{18}$, $R^{18}$ and $R^{19}$, $R^{19}$ and $R^{20}$, $R^{21}$ and $R^{22}$, and $R^{23}$ and $R^{24}$ each may be bonded to each other to form a ring structure.

(8) The compound according to the item (7), wherein in the general formula (192), at least one of $R^1$ to $R^4$ represents a substituted or unsubstituted diarylamino group, and at least one of $R^5$ to $R^8$ represents a substituted or unsubstituted diarylamino group.

(9) The compound according to the item (8), wherein in the general formula (192), $R^3$ and $R^6$ each represent a substituted or unsubstituted diarylamino group.

Specific examples of the compound include the following compounds. Ph represents a phenyl group.

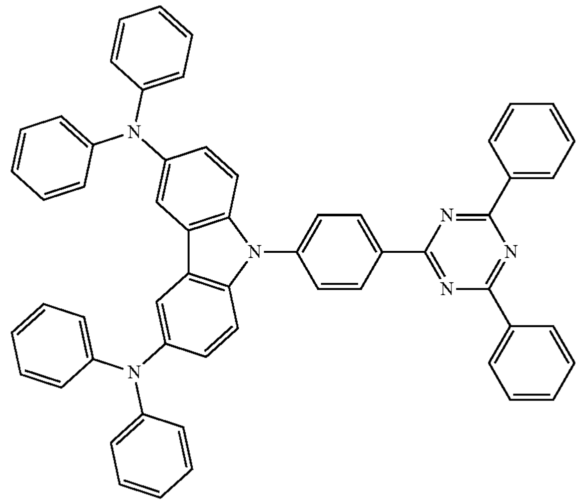

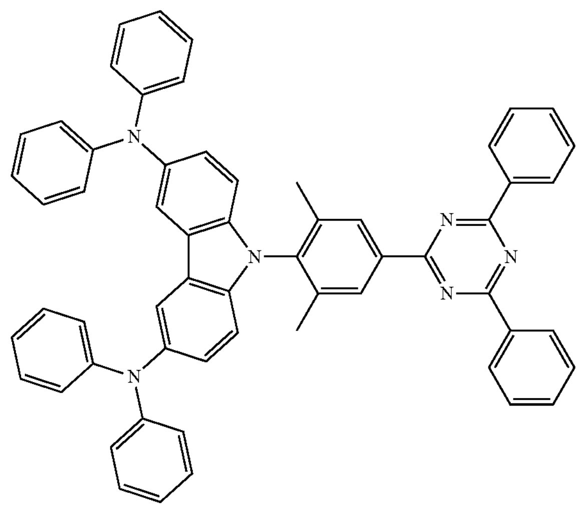

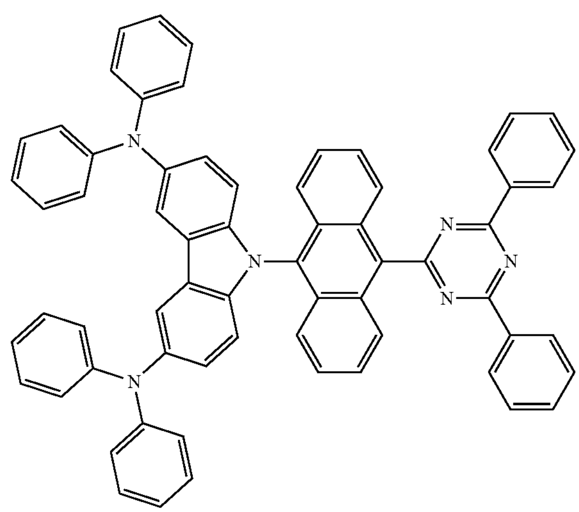

-continued
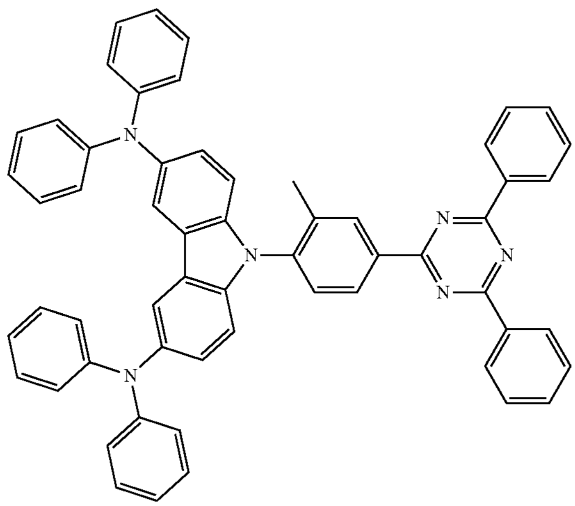
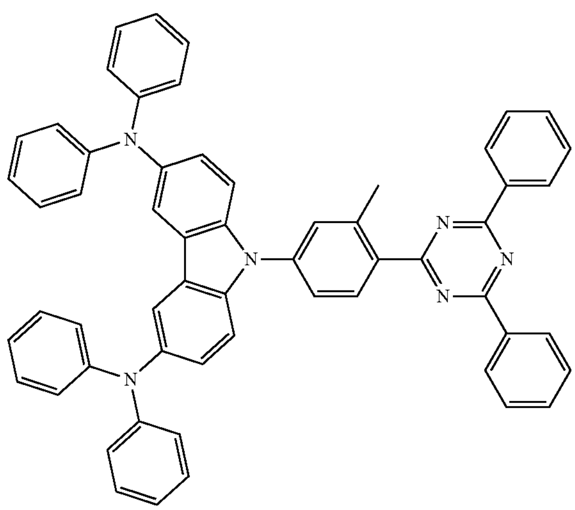
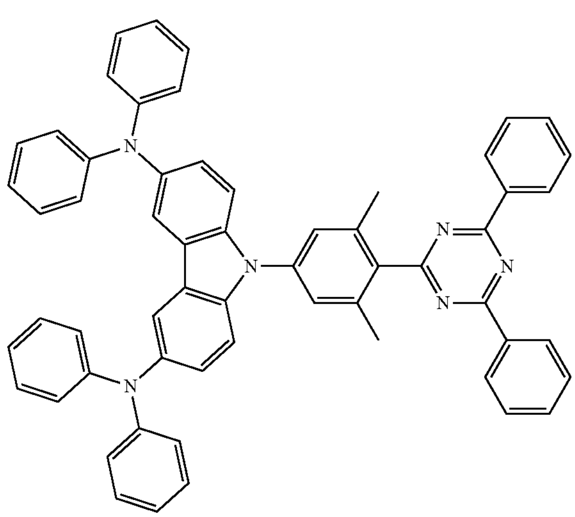
-continued
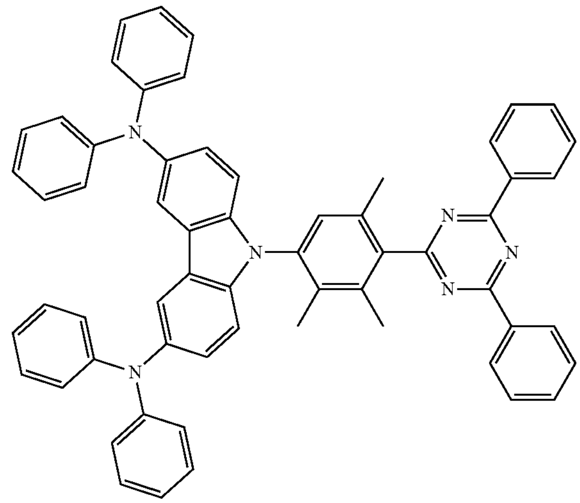
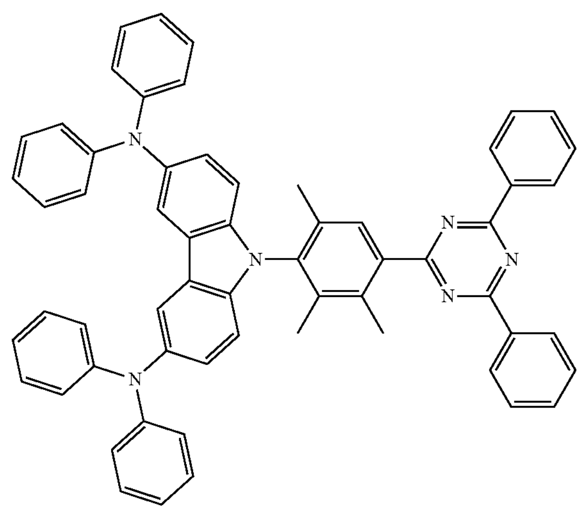
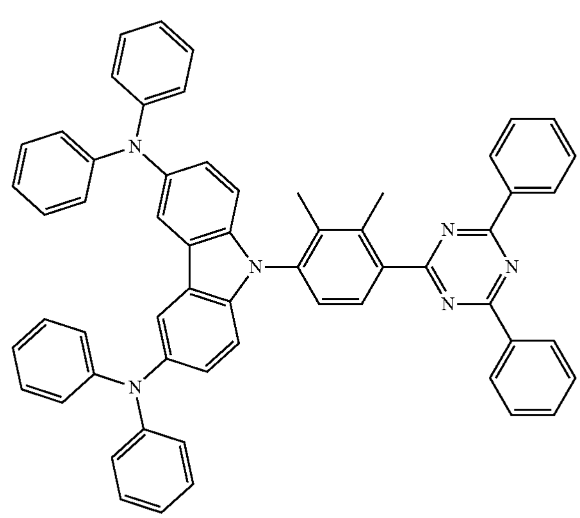

-continued

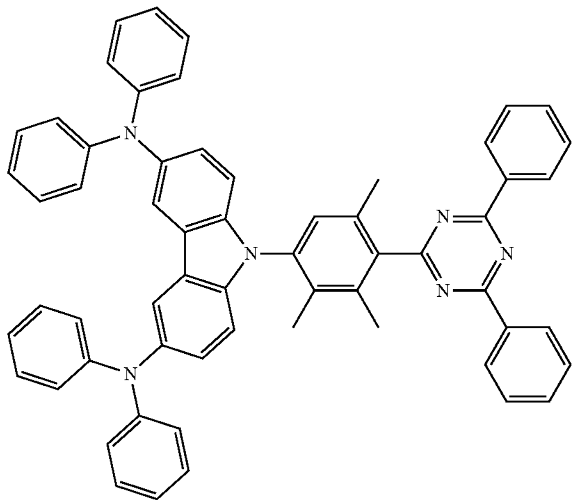

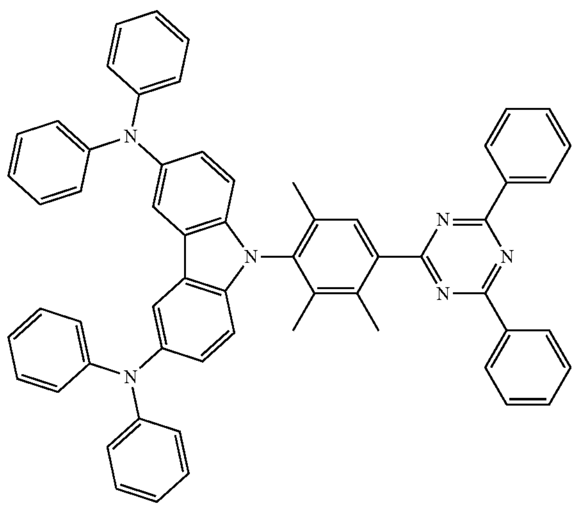

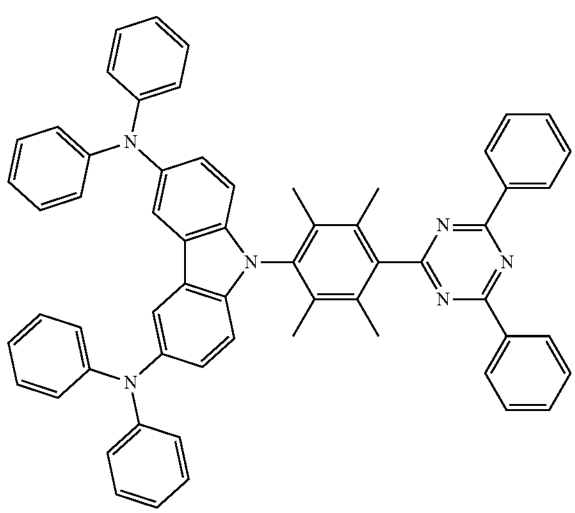

Examples of the preferred light emitting material include the following compounds.

(1) A compound represented by the following general formula (201):

General Formula (201)

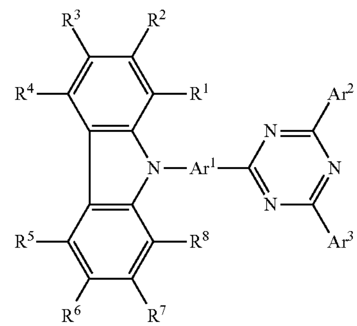

wherein in the general formula (201), $R^1$ to $R^8$ each independently represent a hydrogen atom or a substituent, provided that at least one of $R^1$ to $R^8$ represents a substituted or unsubstituted carbazolyl group; and $Ar^1$ to $Ar^3$ each independently represent a substituted or unsubstituted aromatic ring or a heteroaromatic ring.

(2) The compound according to the item (1), wherein in the general formula (201) at least one of $R^3$ and $R^6$ represents a substituted or unsubstituted carbazolyl group.

(3) The compound according to the item (1) or (2), wherein the carbazolyl group is a 1-carbazolyl group, a 2-carbazolyl group, a 3-carbazolyl group or a 4-carbazolyl group.

(4) The compound according to any one of the items (1) to (3), wherein the carbazolyl group has a substituent on the nitrogen atom in the carbazole ring structure.

(5) The compound according to any one of the items (1) to (4), wherein in the general formula (201), at least one of $Ar^1$, $Ar^2$ and $Ar^3$ represents a benzene ring or a naphthalene ring.

(6) The compound according to any one of the items (1) to (5), wherein in the general formula (201), $Ar^1$, $Ar^2$ and $Ar^3$ each represent the same aromatic ring or the same heteroaromatic ring.

(7) The compound according to any one of the items (1) to (6), wherein in the general formula (201), $Ar^1$, $Ar^2$ and $Ar^3$ each represent a benzene ring.

Specific examples of the compound including the following compounds.

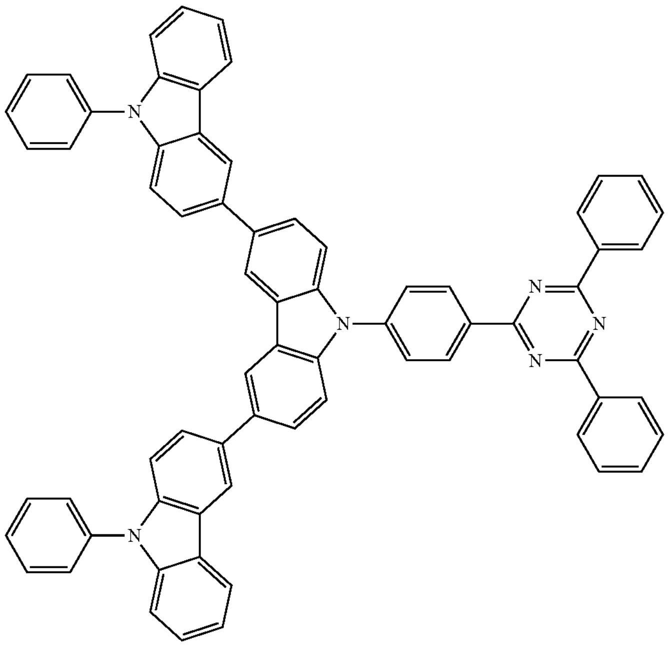
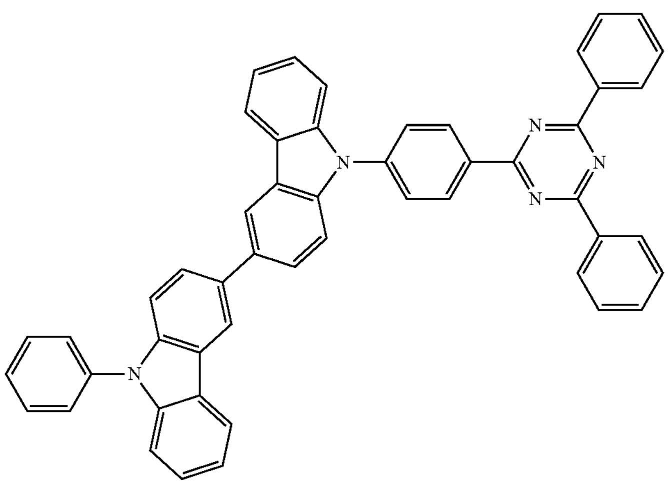
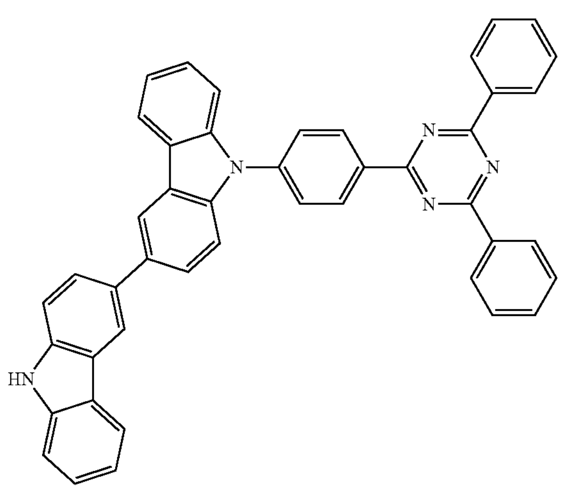

-continued
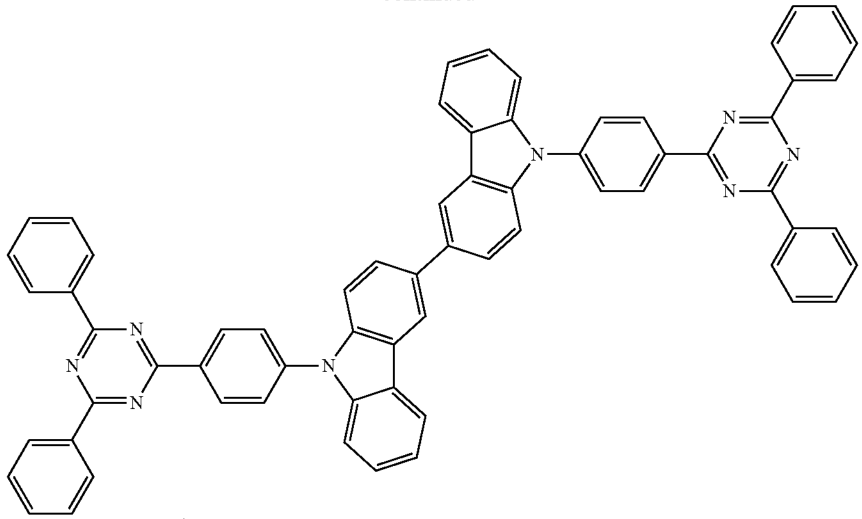
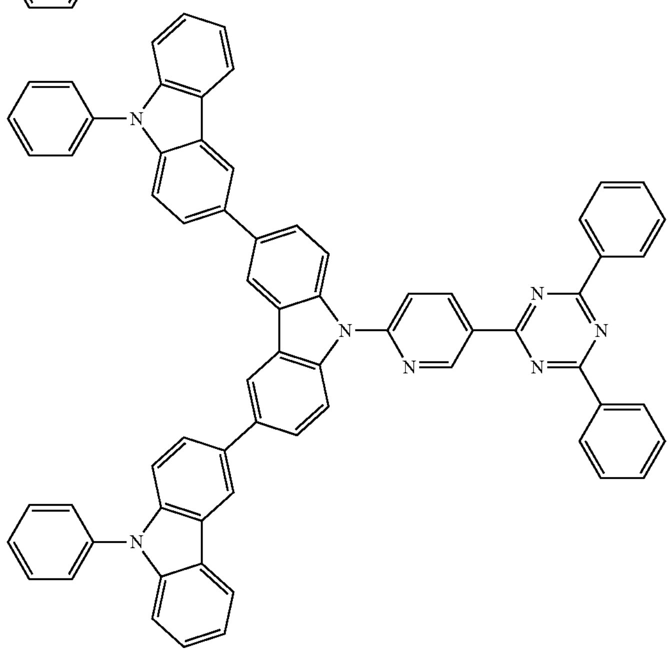
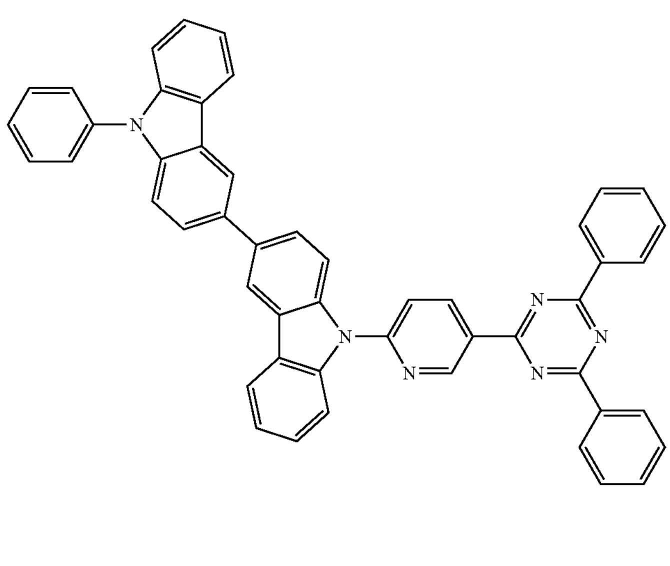

-continued
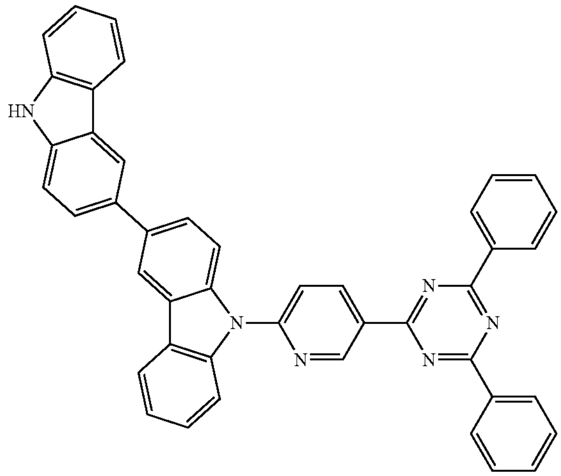
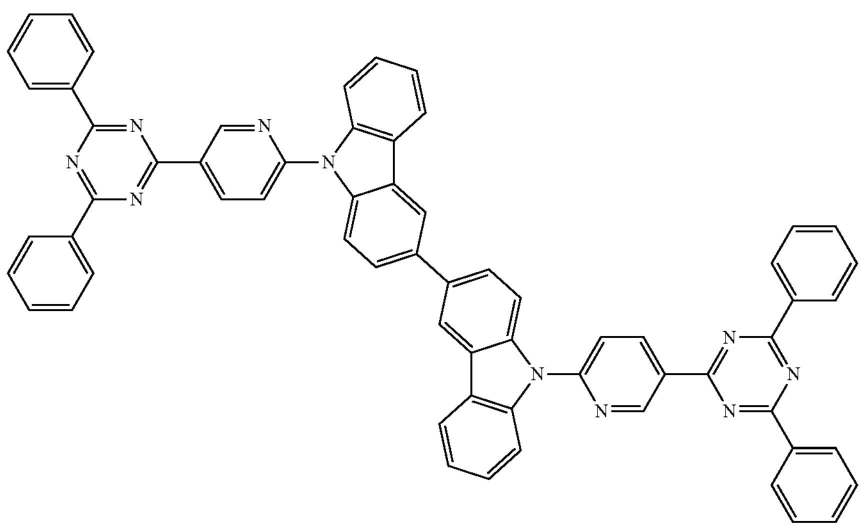
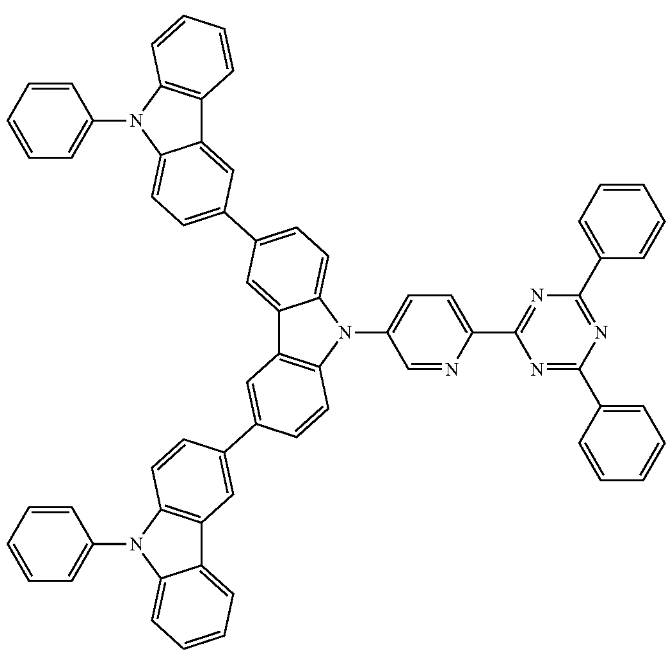

-continued
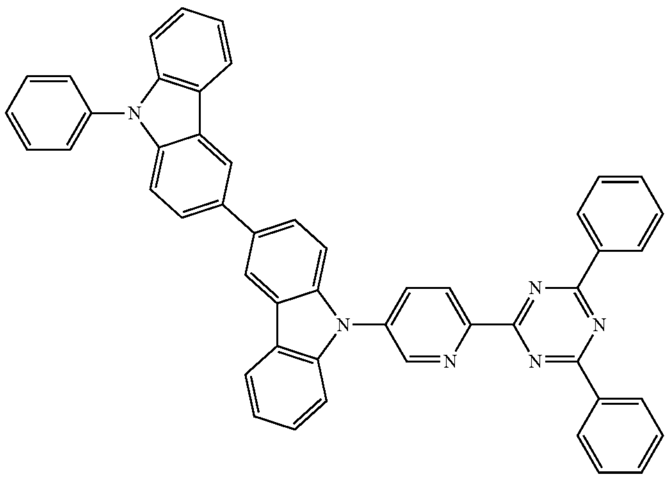
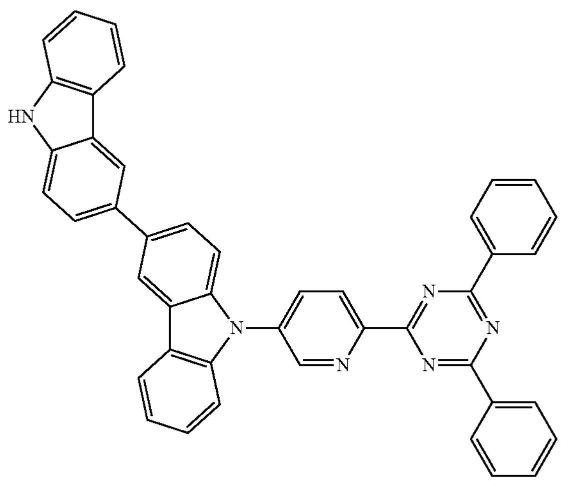
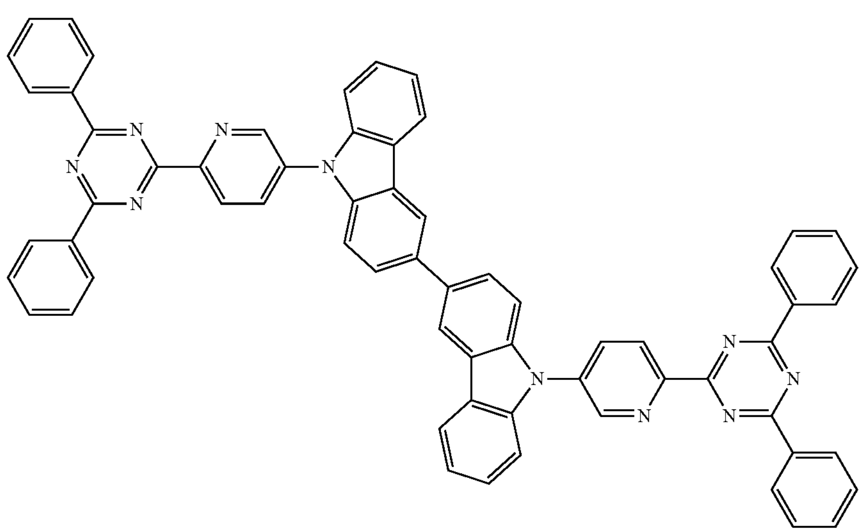

-continued
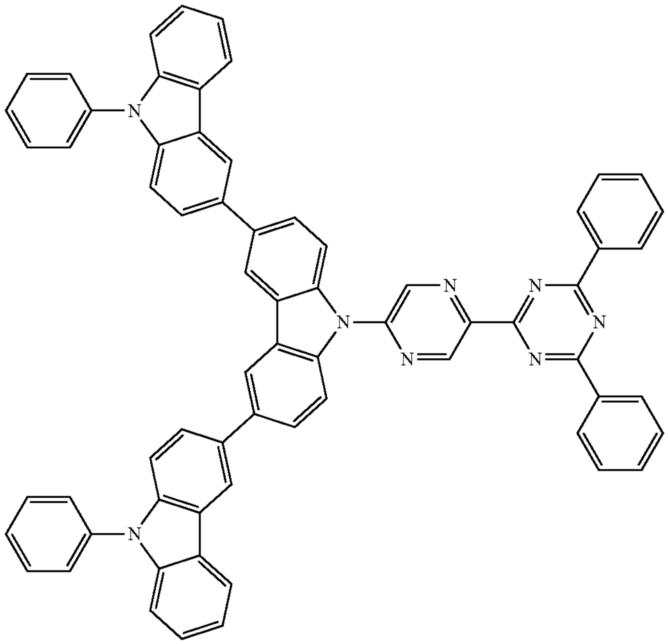
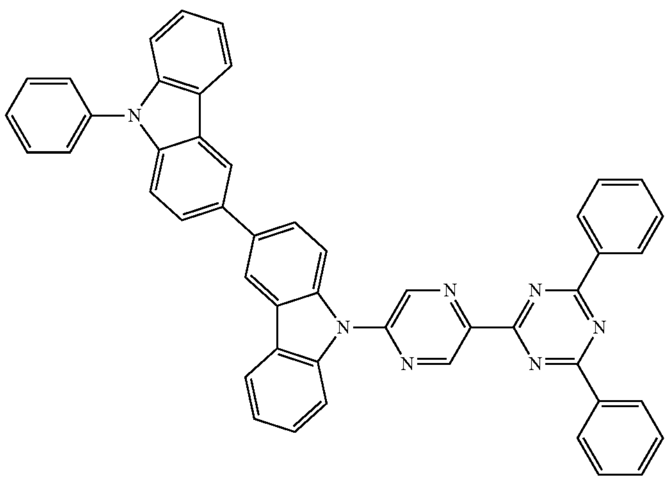
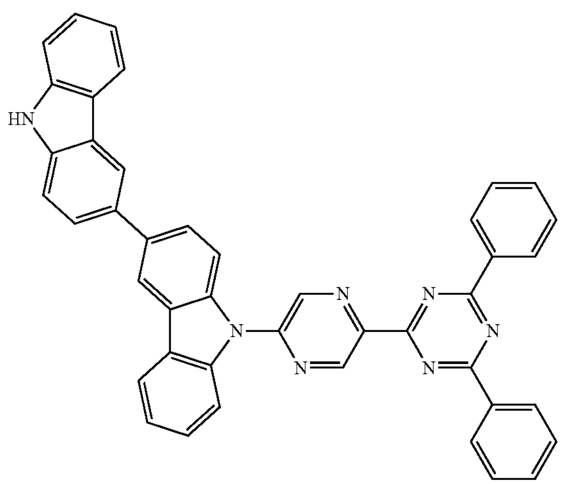

-continued
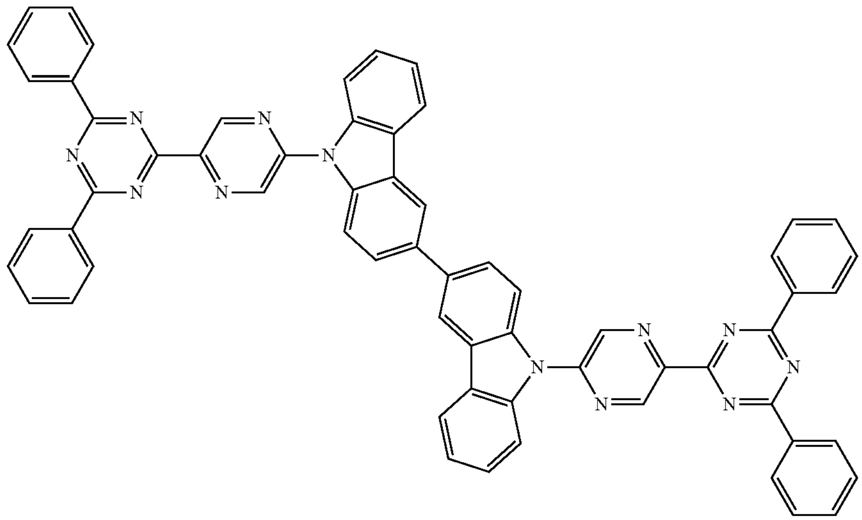
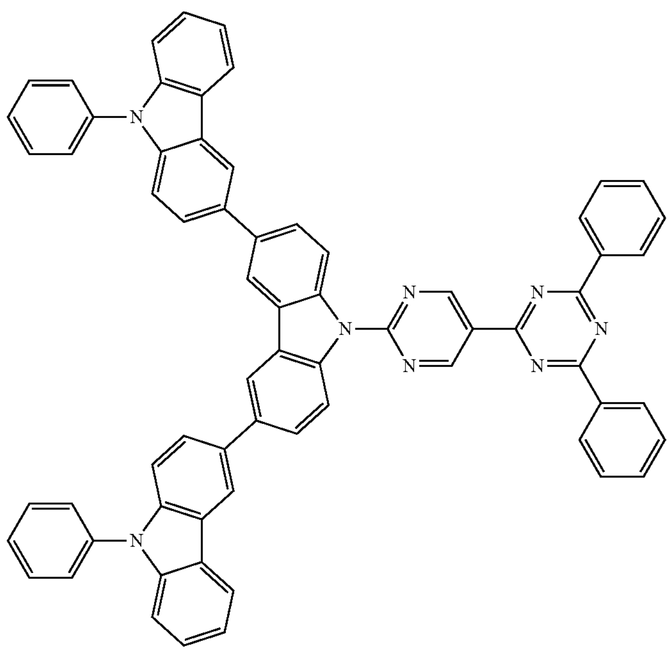
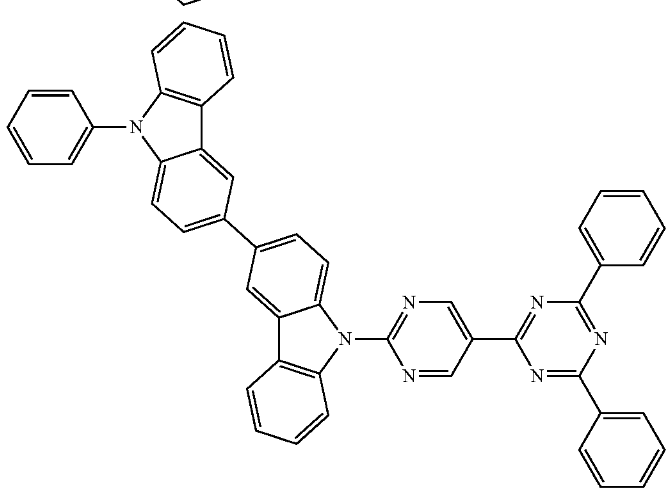

-continued
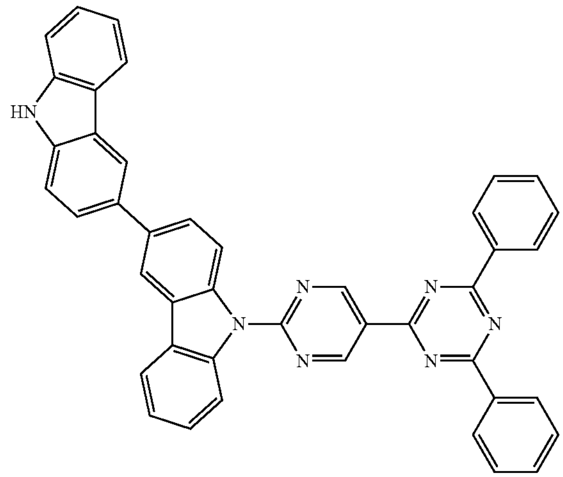
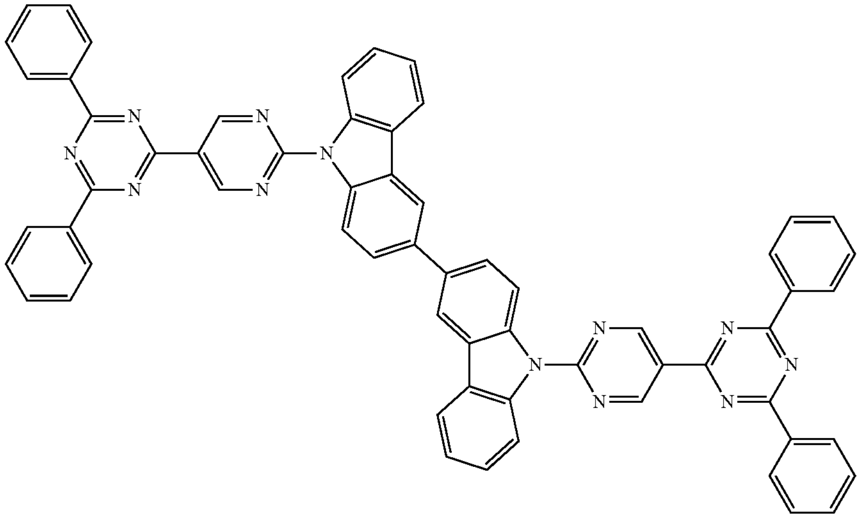
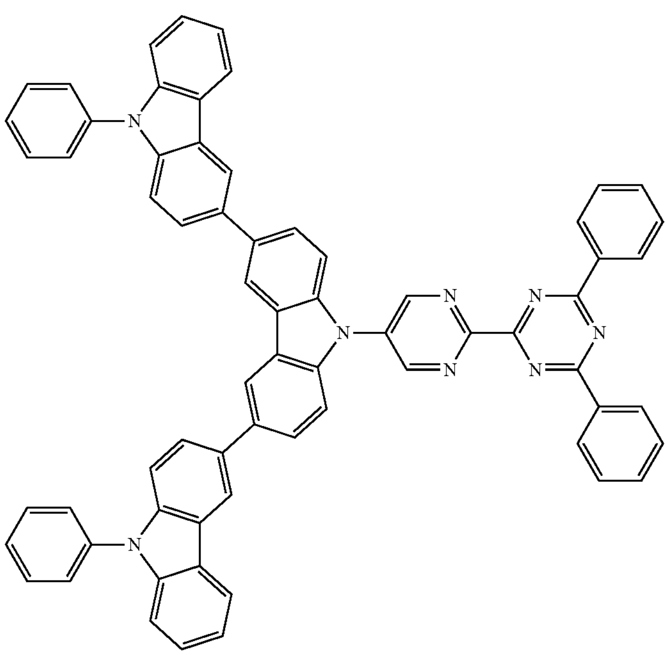

-continued
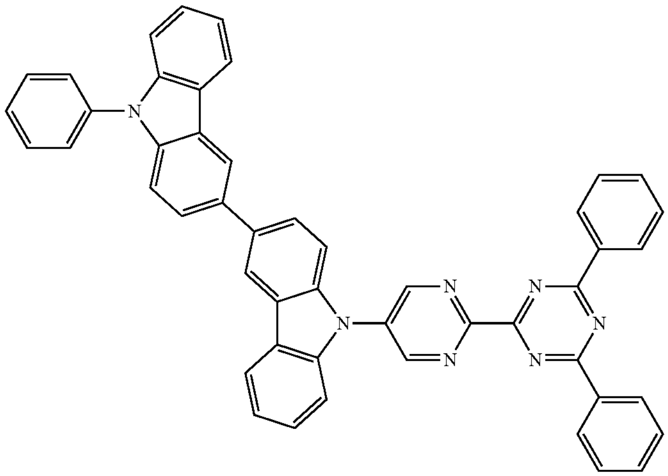
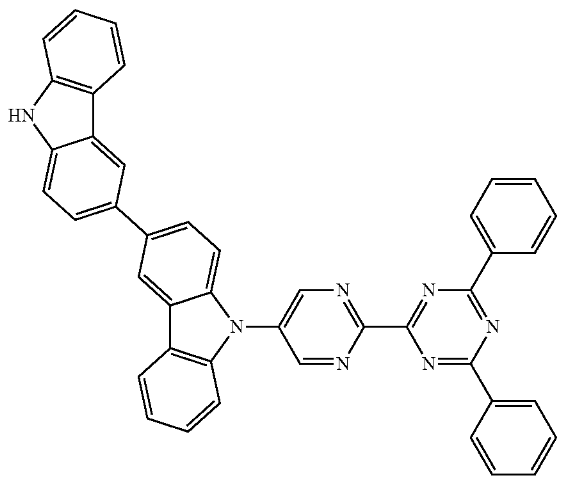
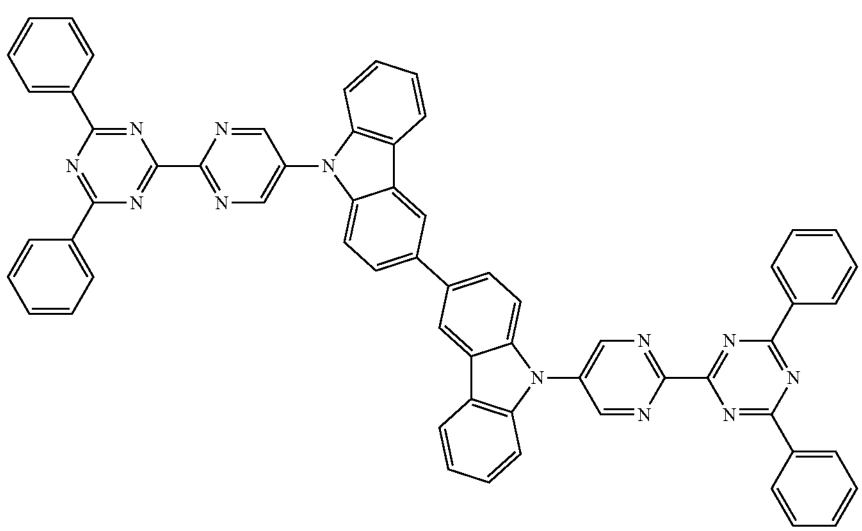

-continued
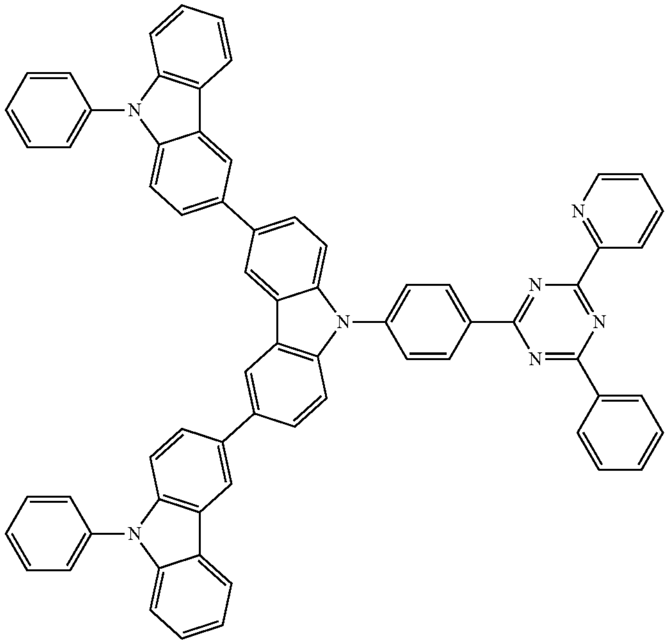
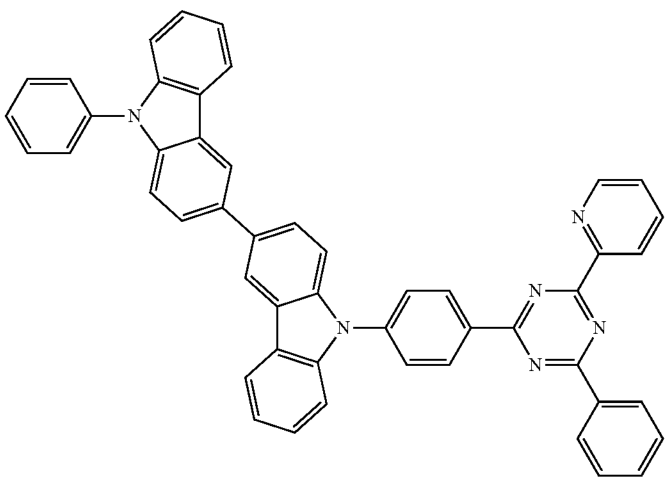
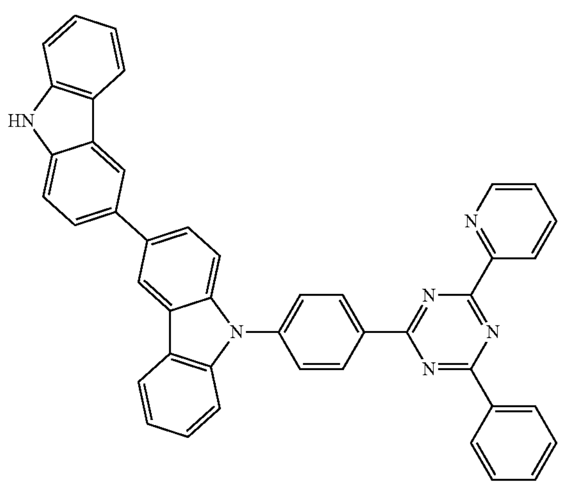

-continued
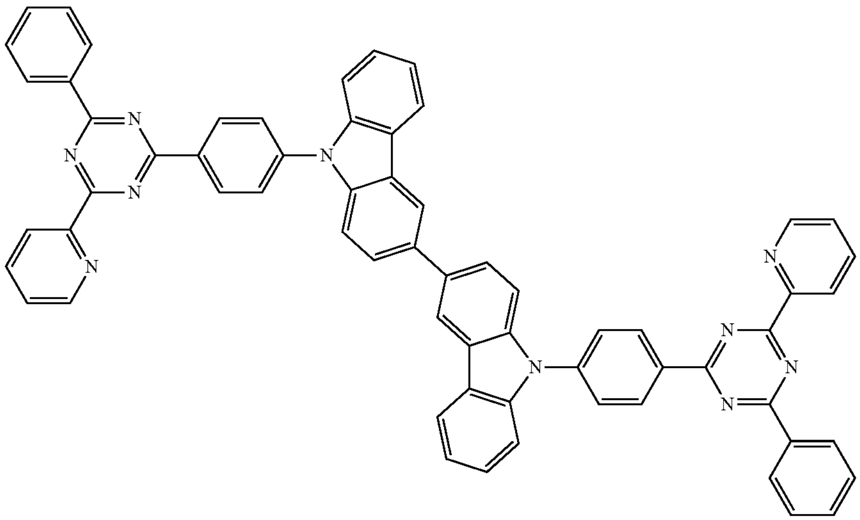
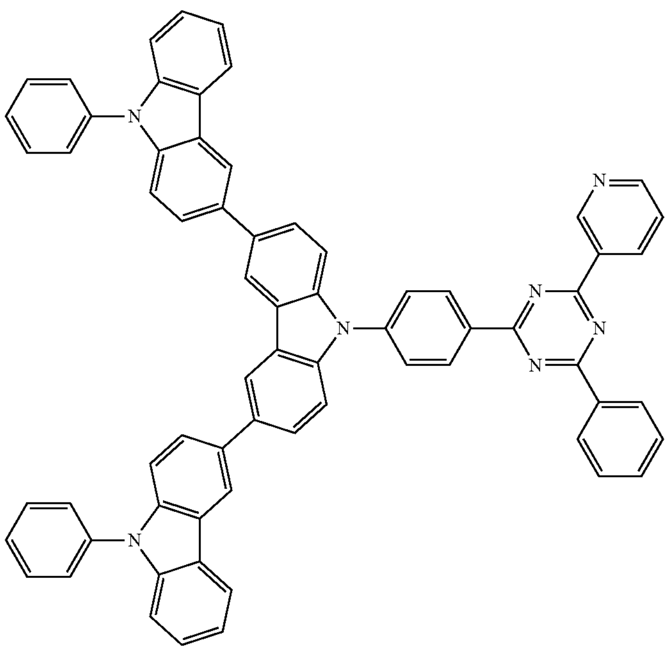
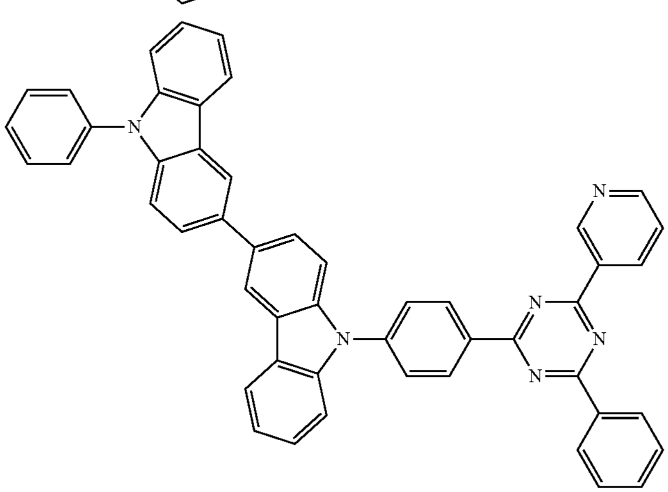

-continued
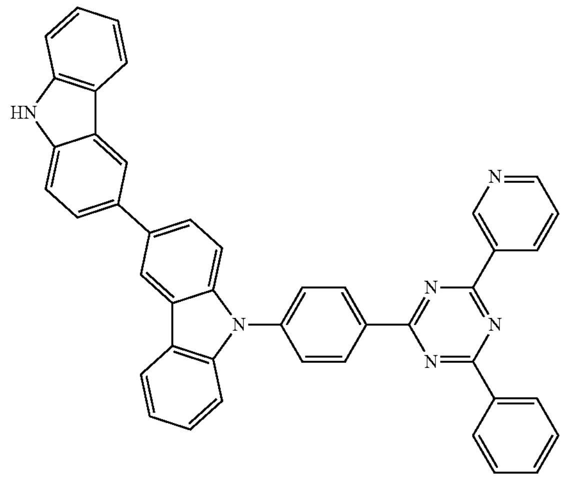 [SMILES: c1ccc(-c2nc(-c3ccc(-n4c5ccccc5c5cc(-c6ccc7[nH]c8ccccc8c7c6)ccc54)cc3)nc(-c3cccnc3)n2)cc1]
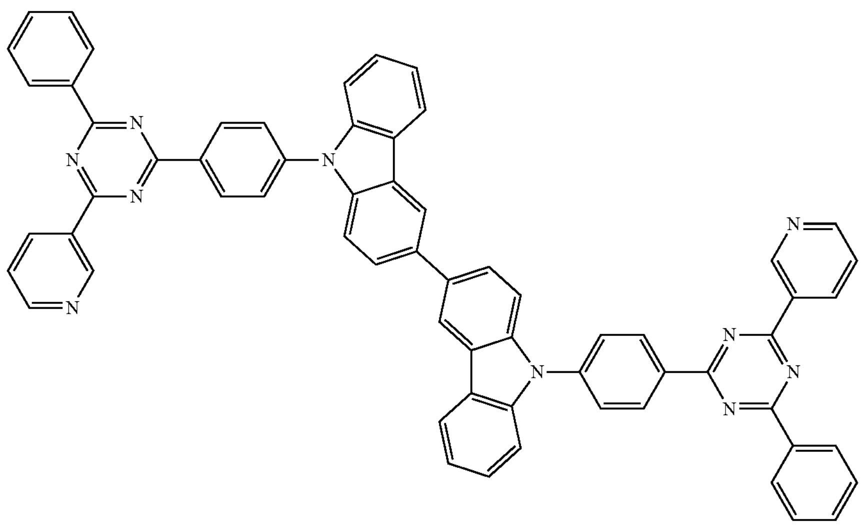
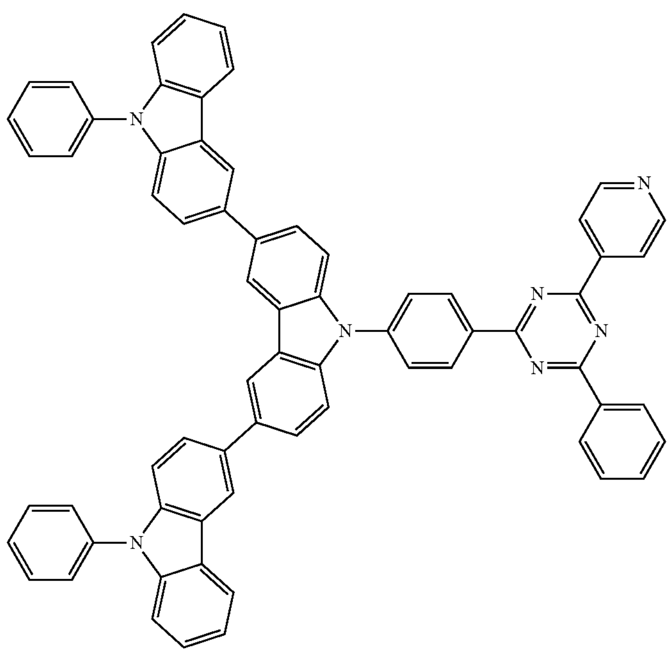

-continued
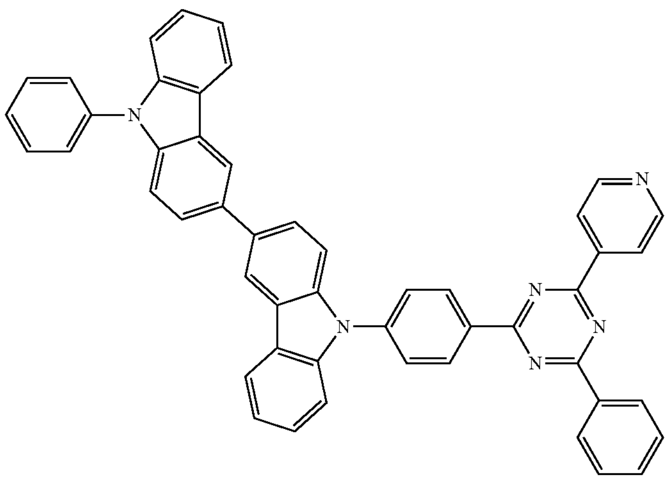
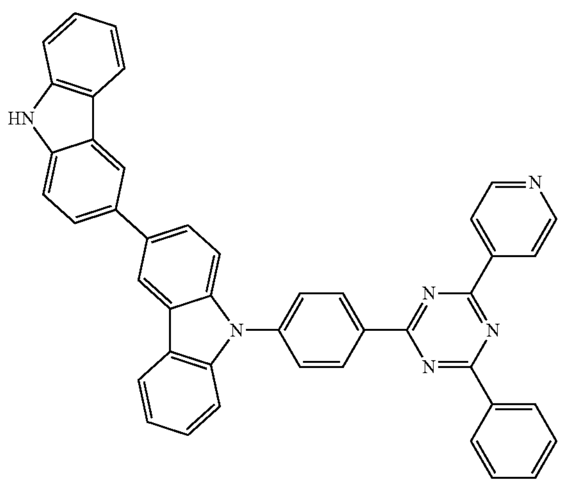
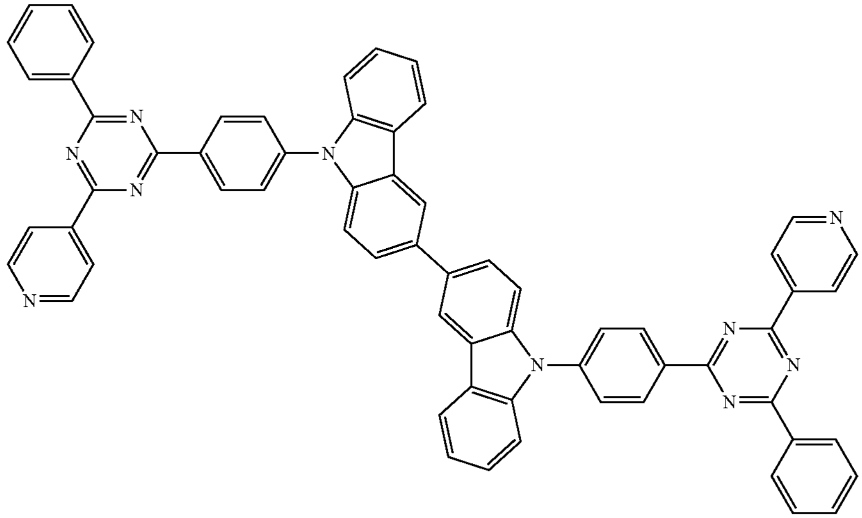

-continued
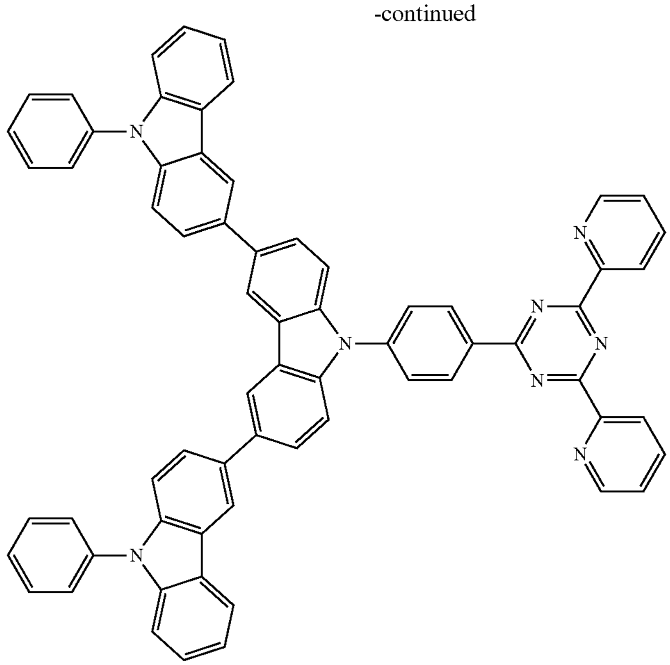
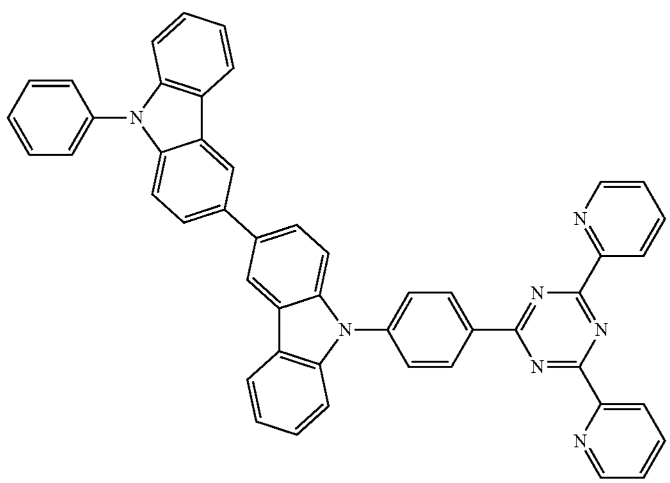
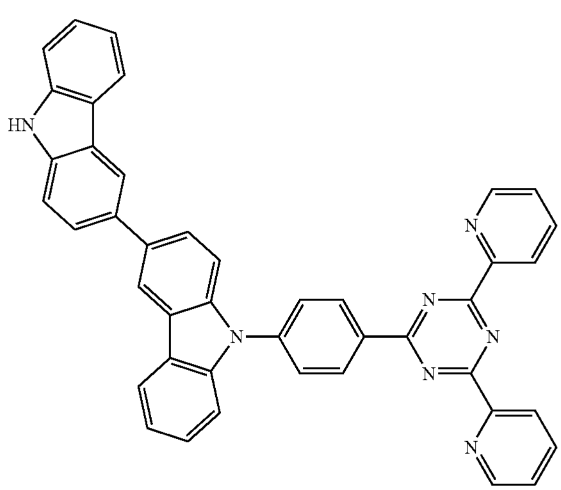

-continued
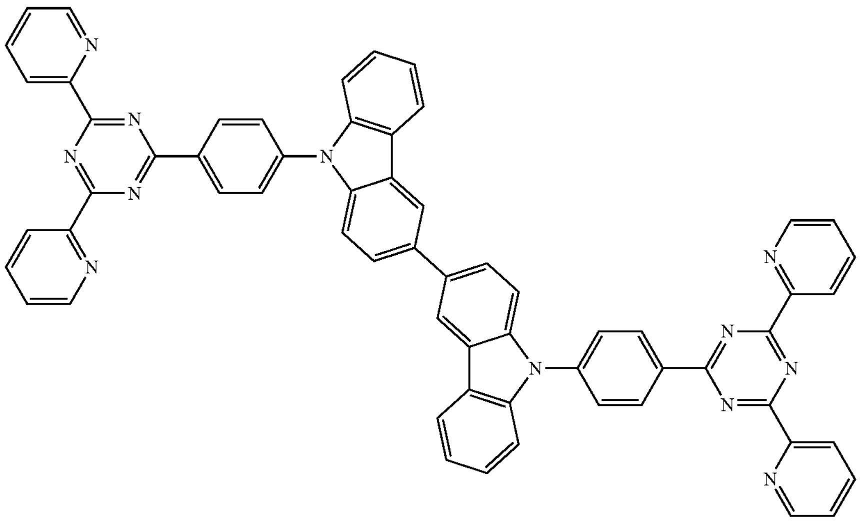
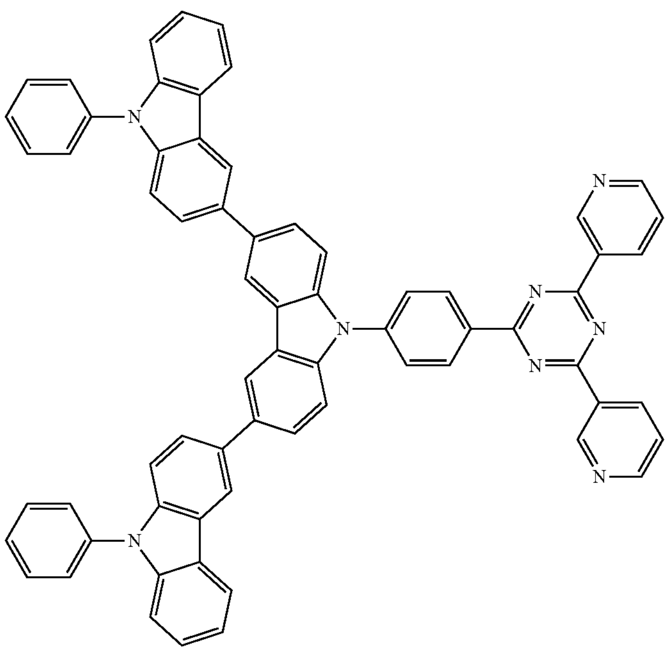
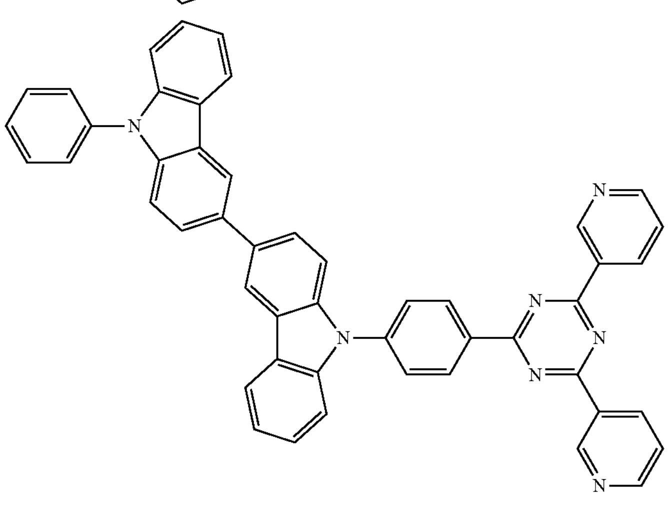

-continued
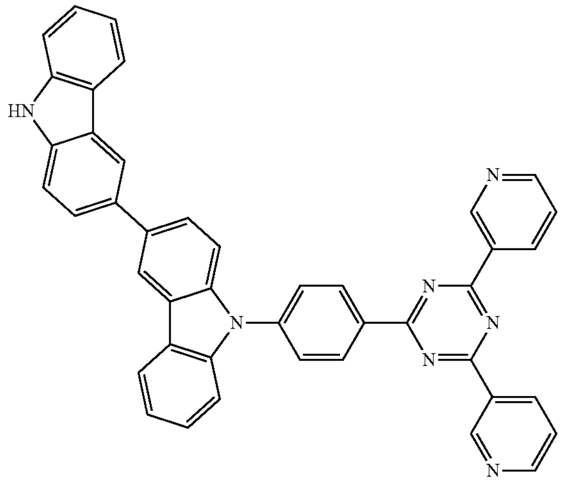
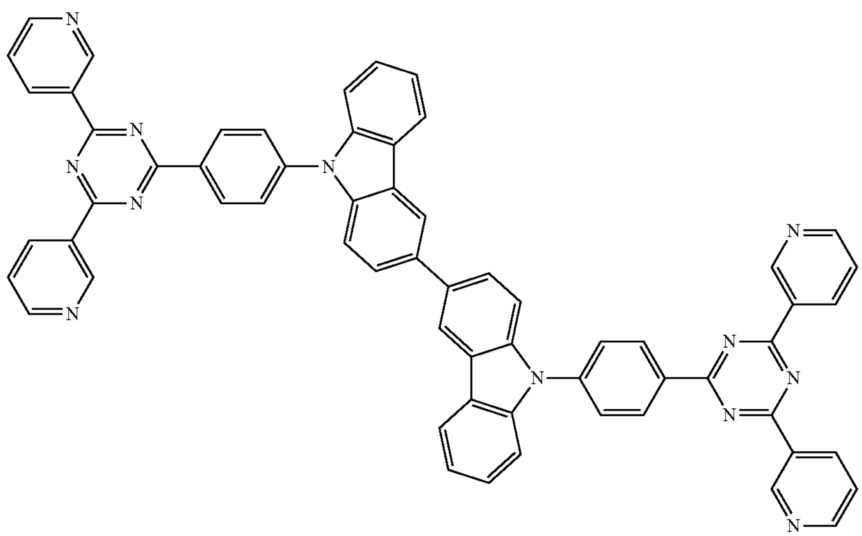
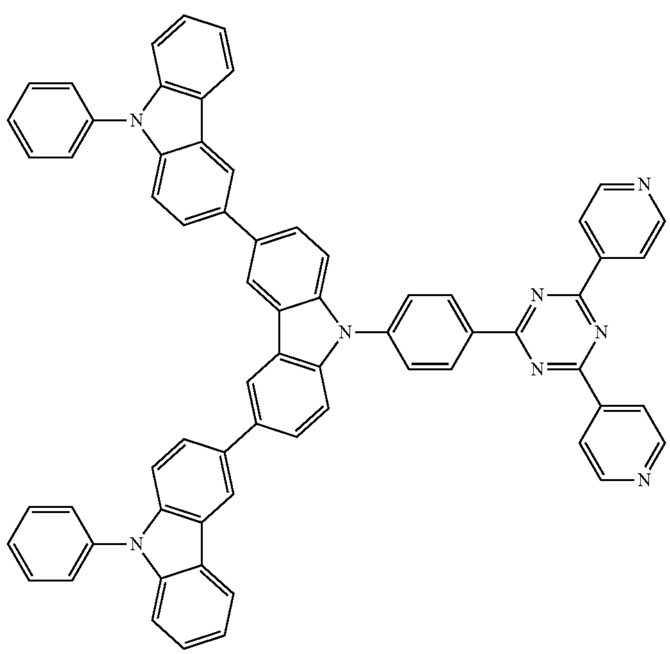

-continued
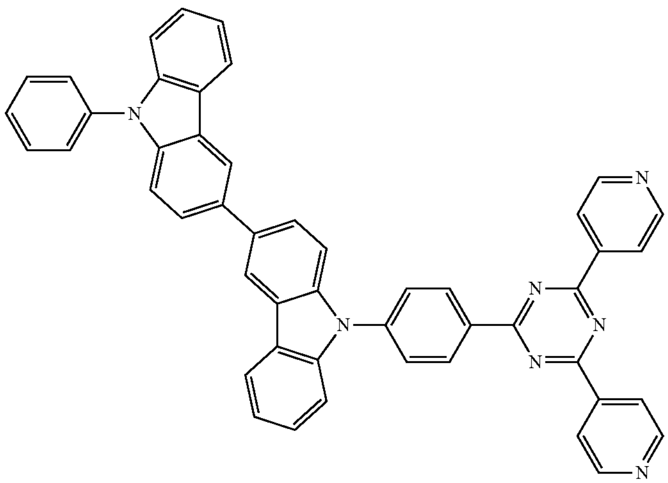
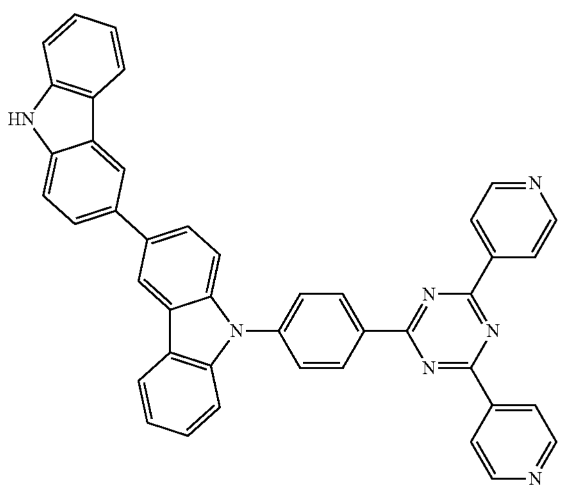
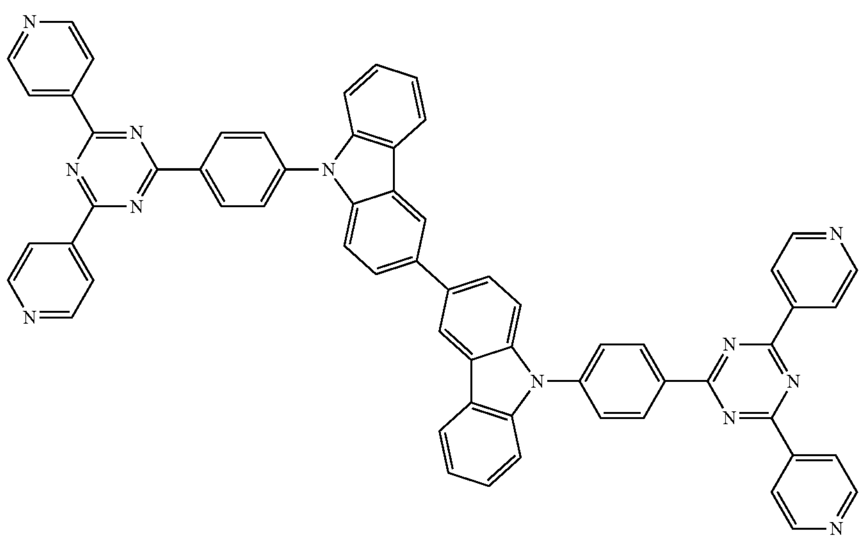

-continued
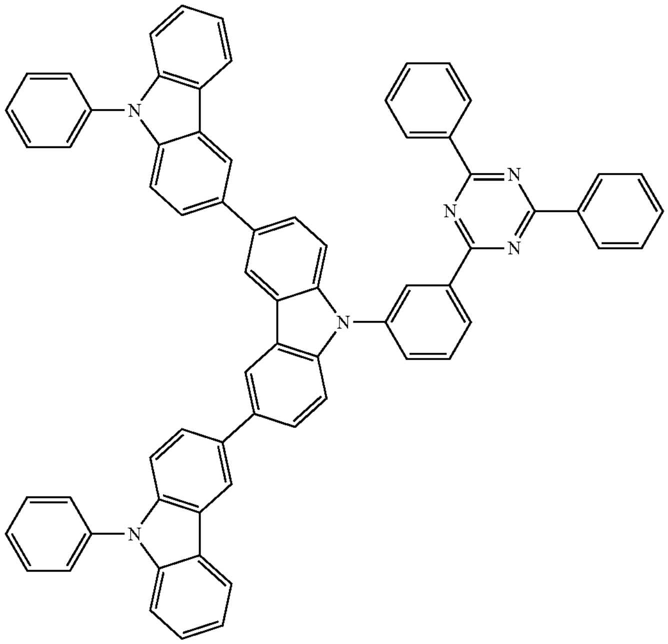
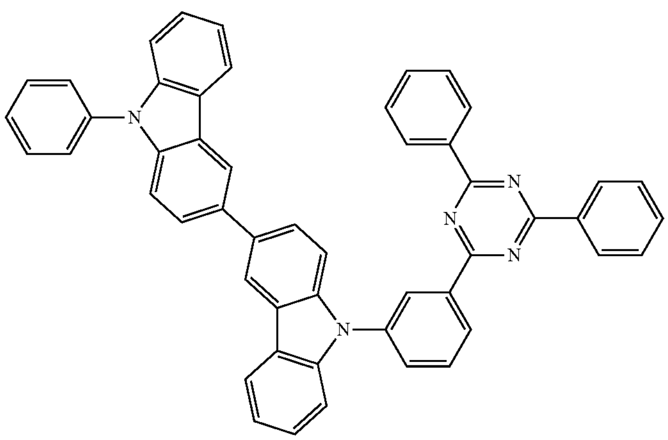
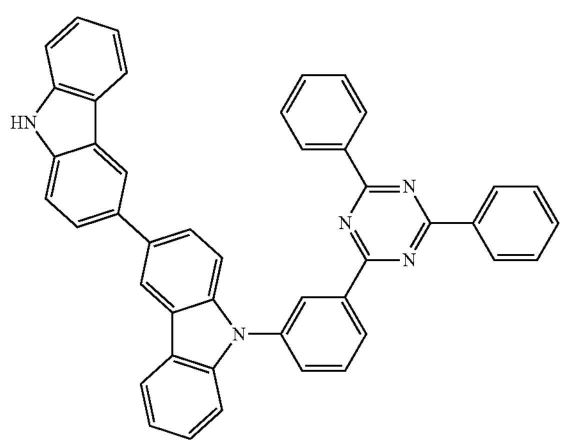

-continued
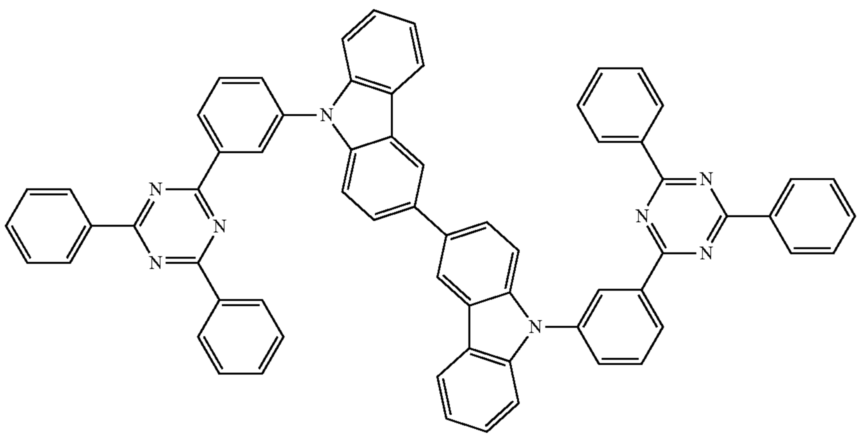
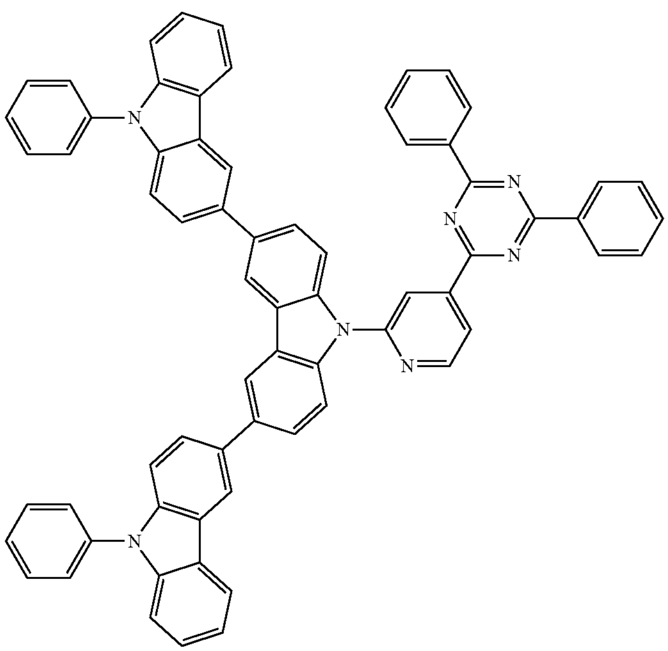
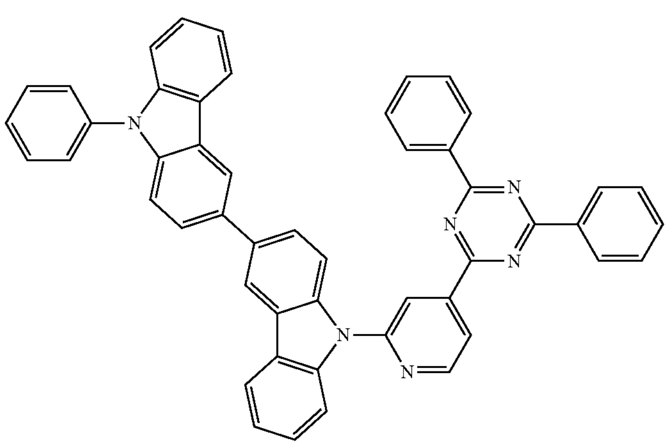

-continued
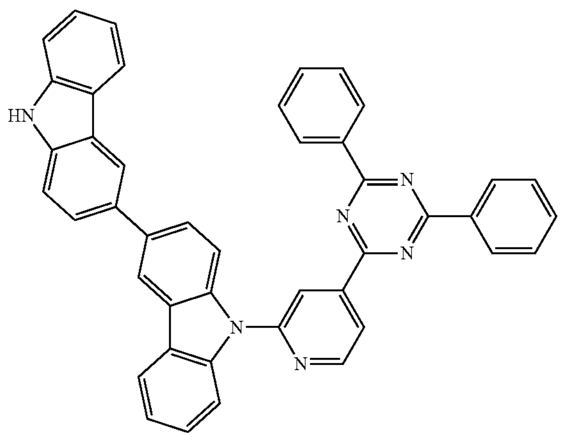
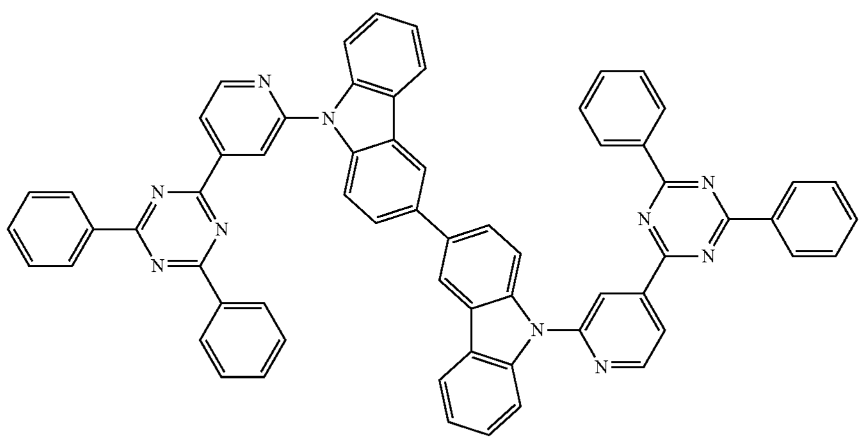
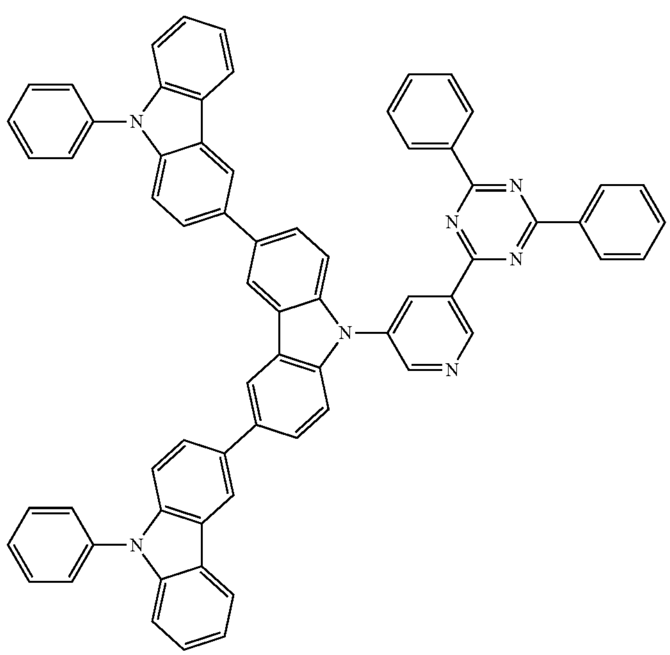

-continued
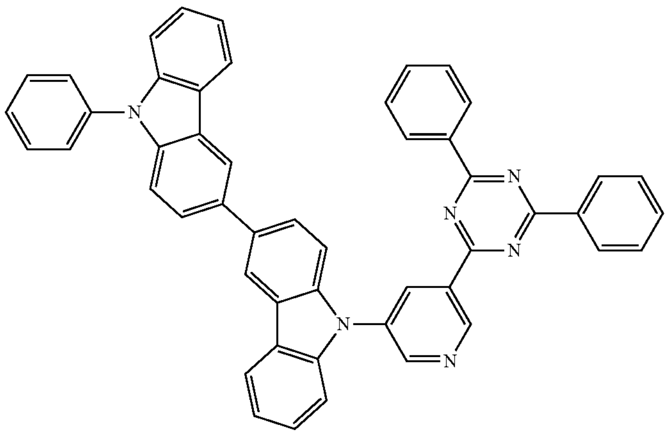
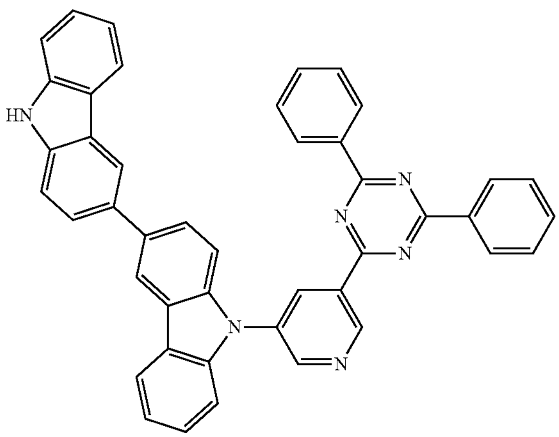
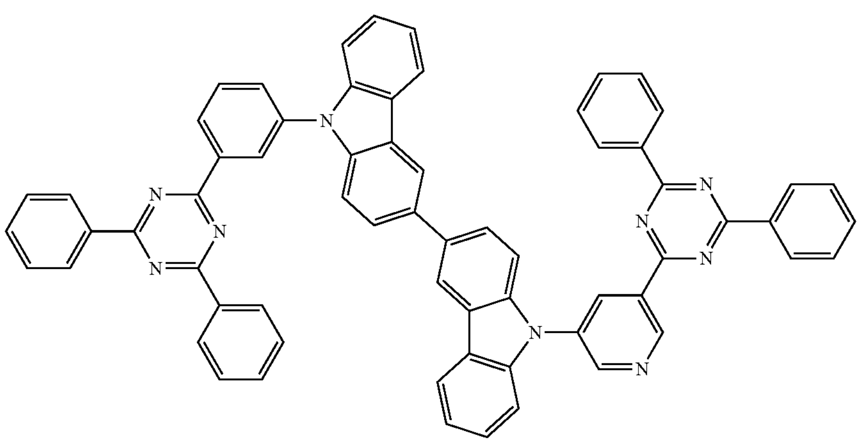

-continued
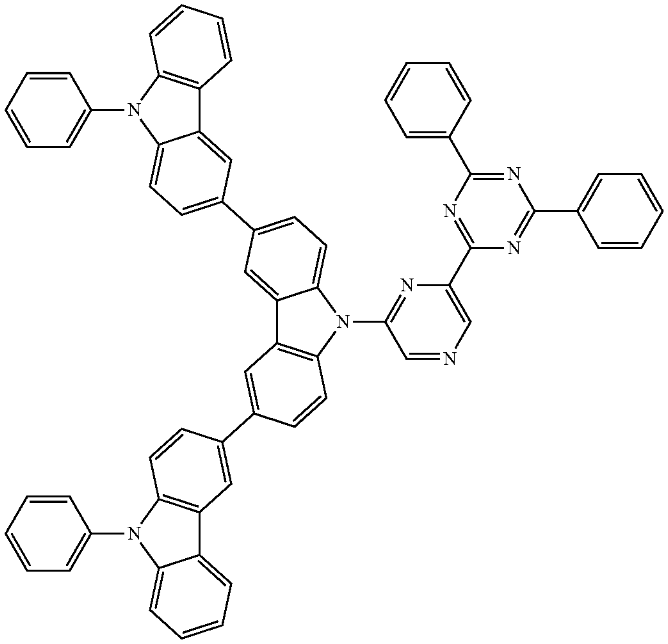
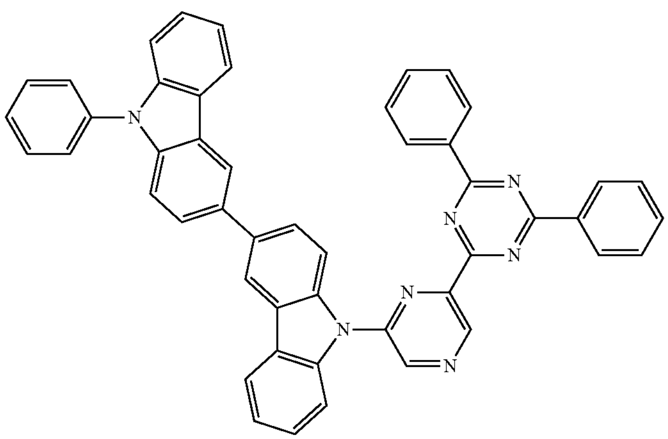
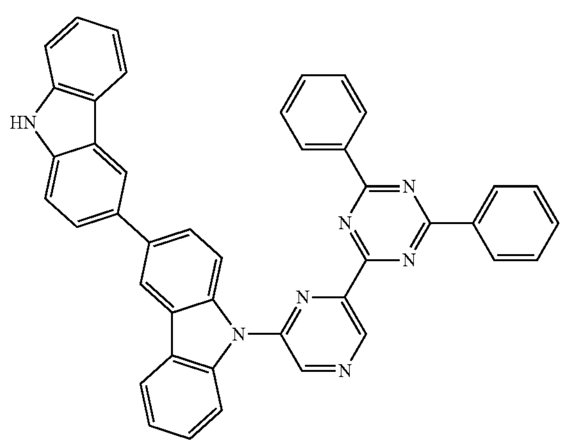

-continued
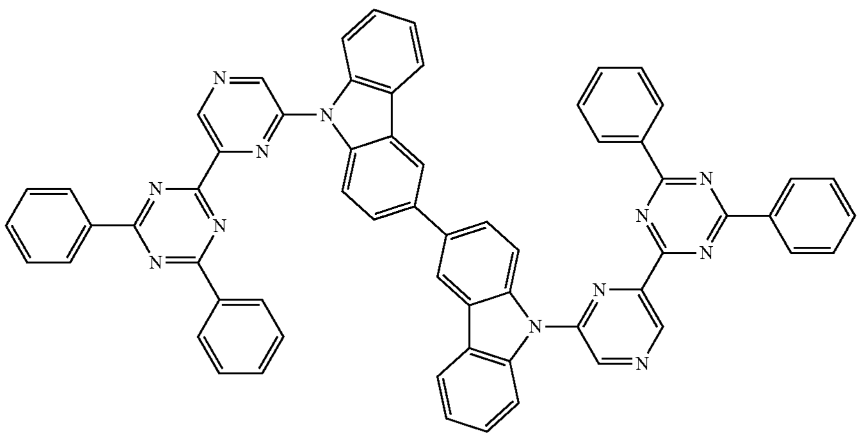
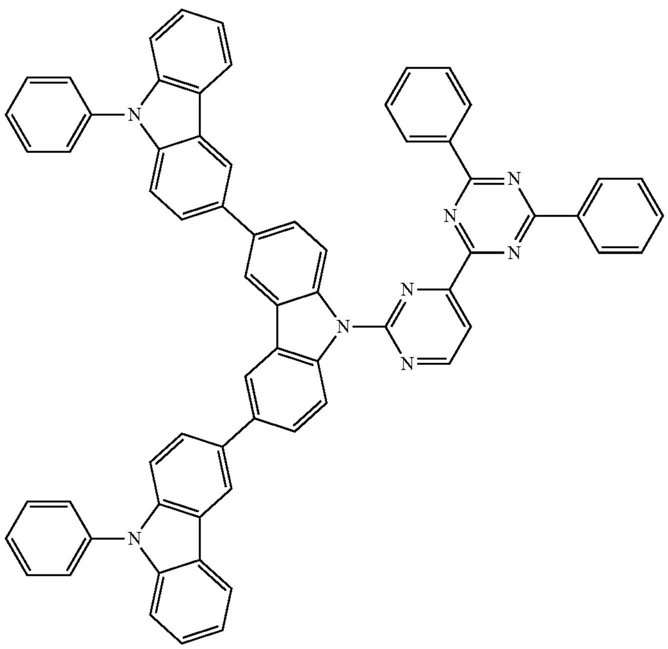
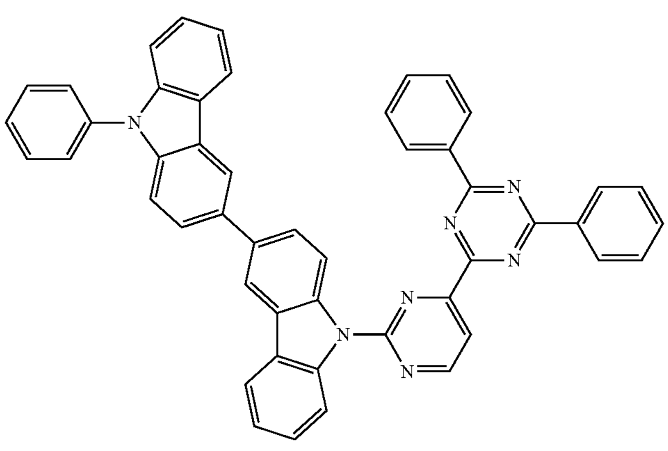

-continued
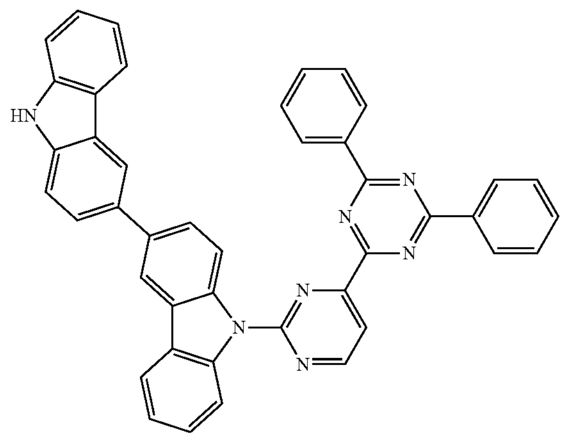
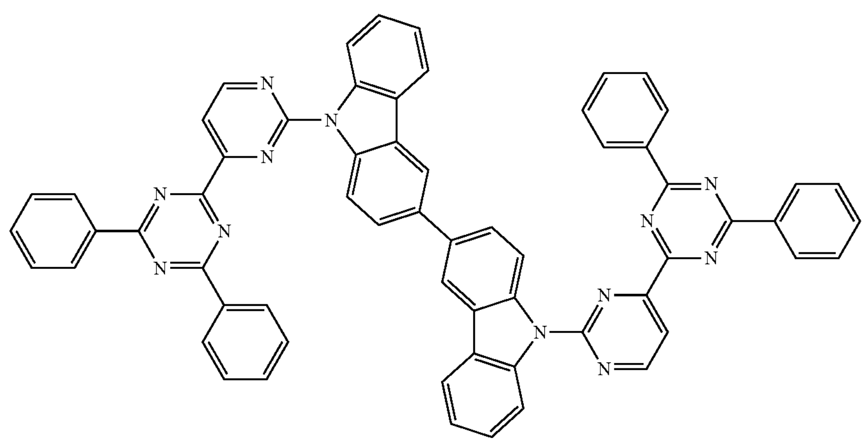
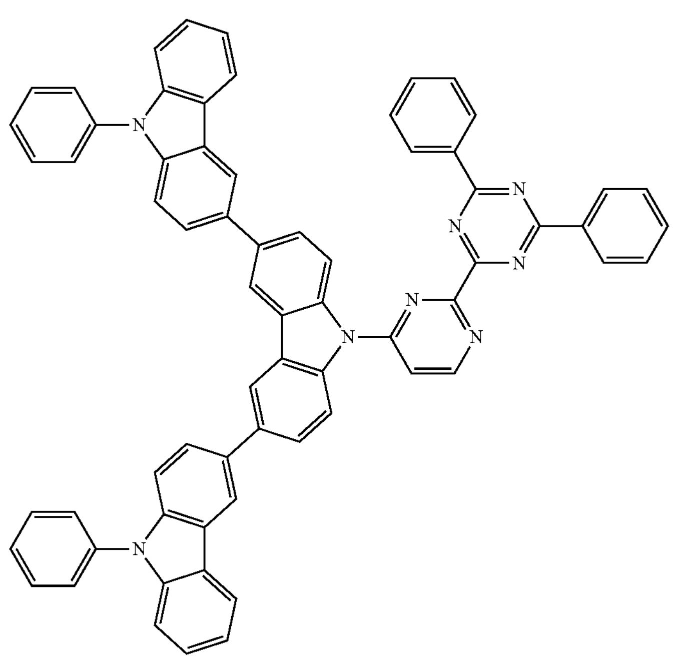

-continued
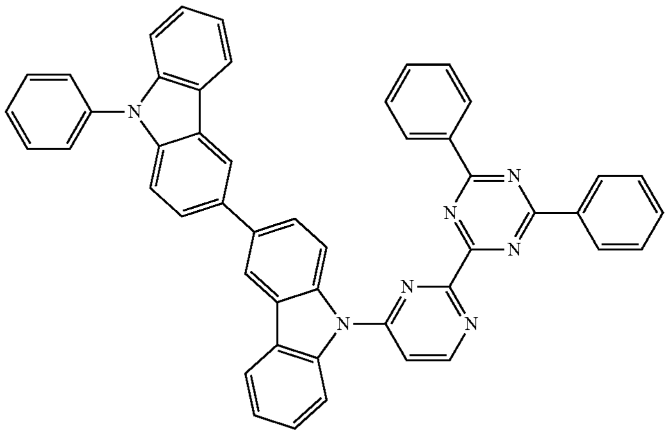
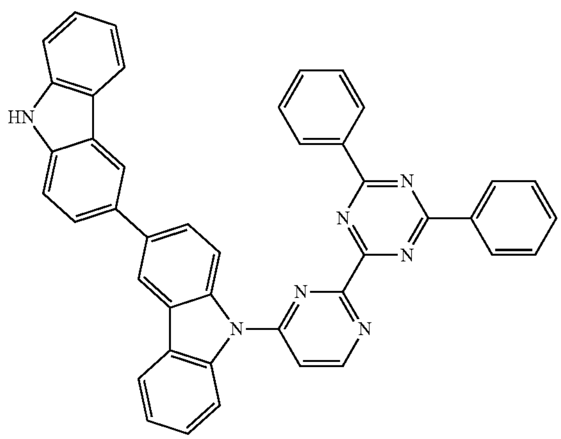
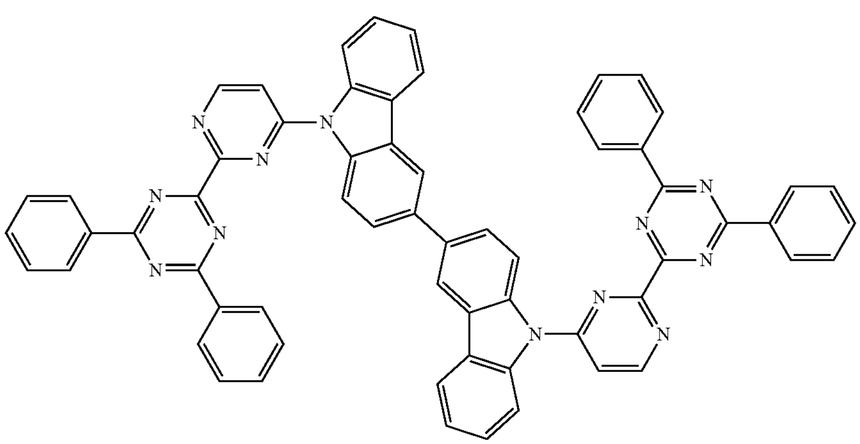

-continued
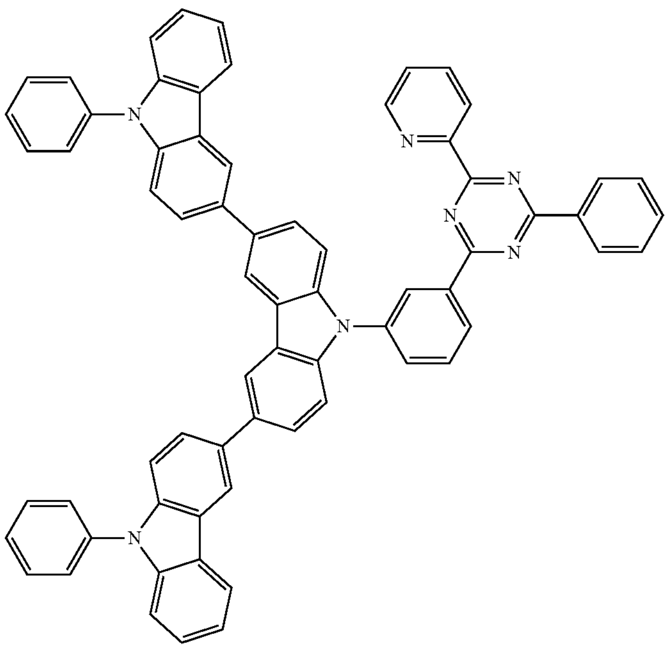
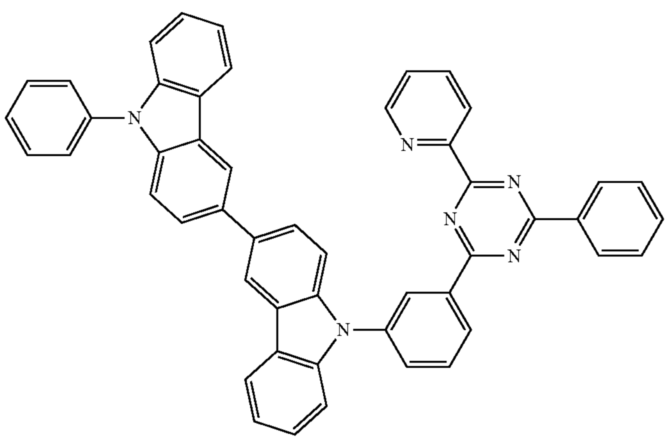
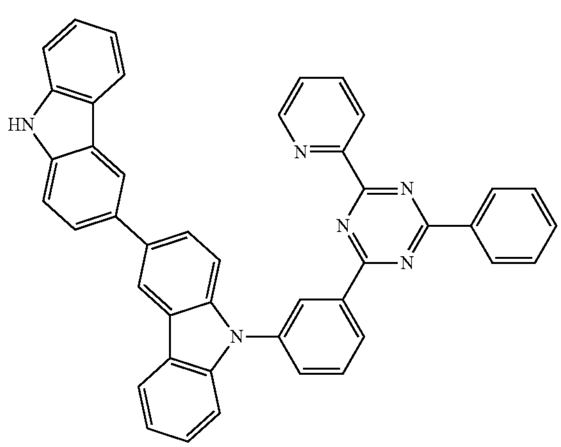

-continued
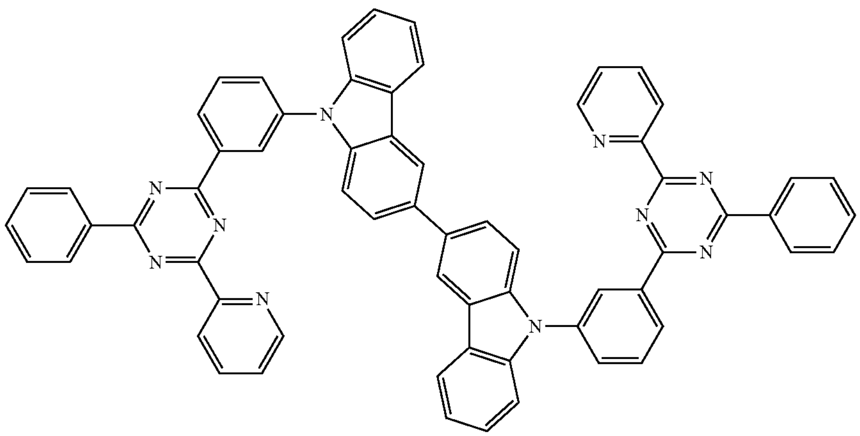
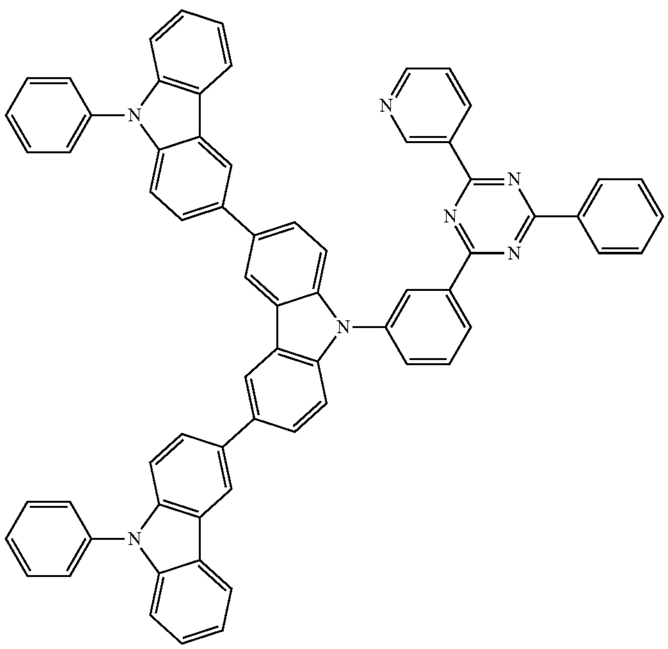
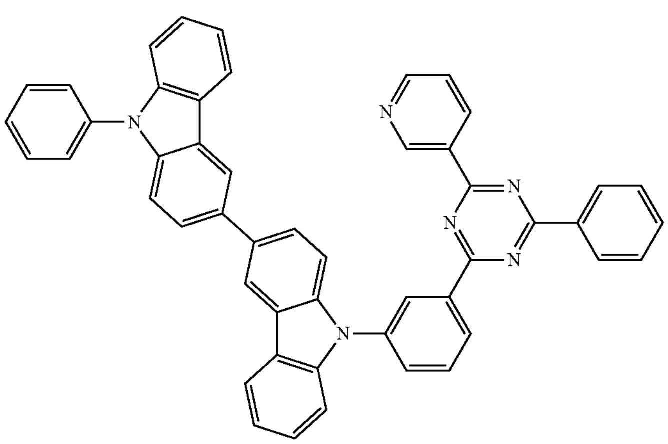

-continued
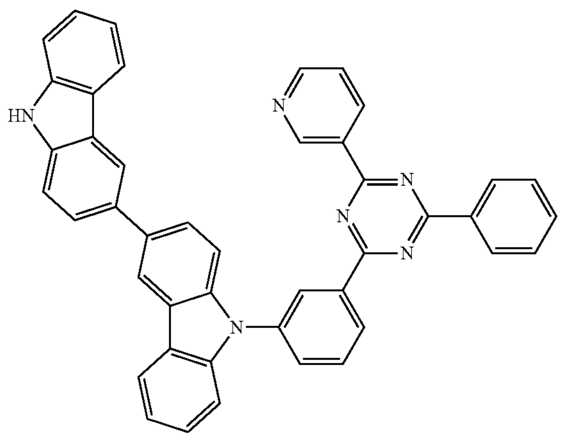
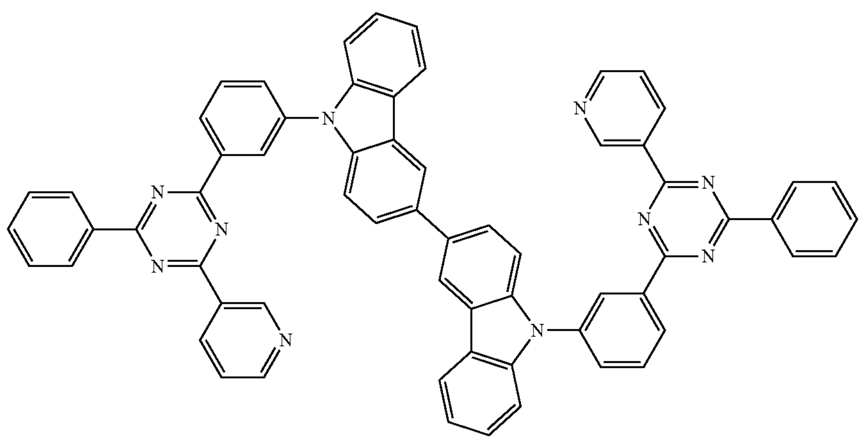
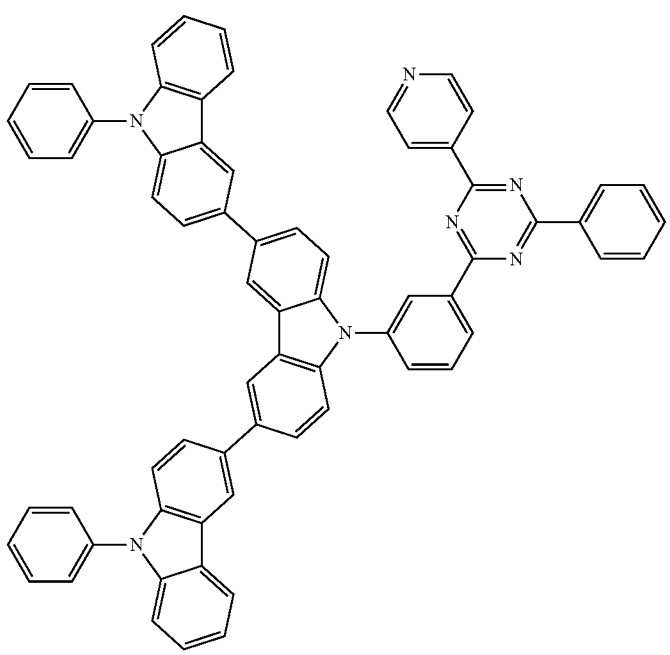

-continued
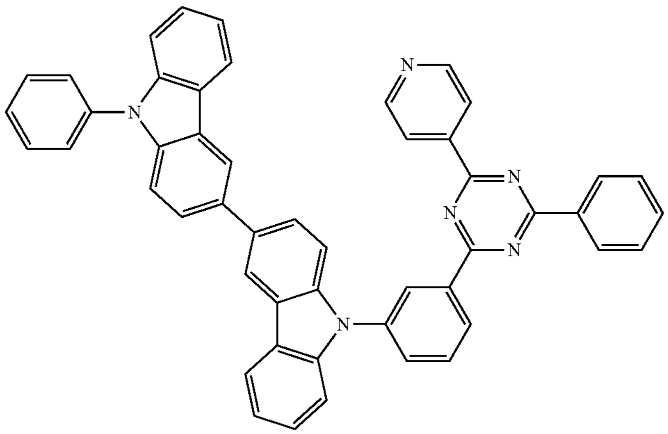
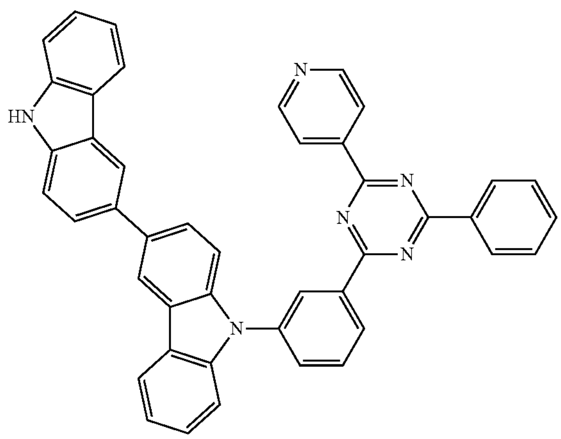
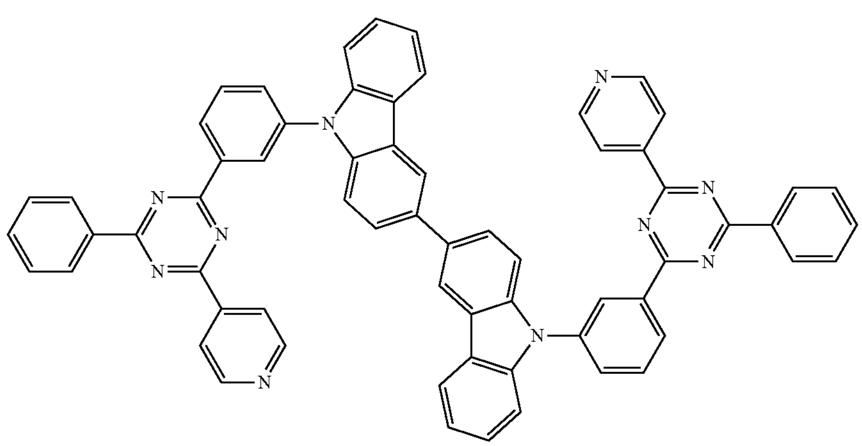

-continued
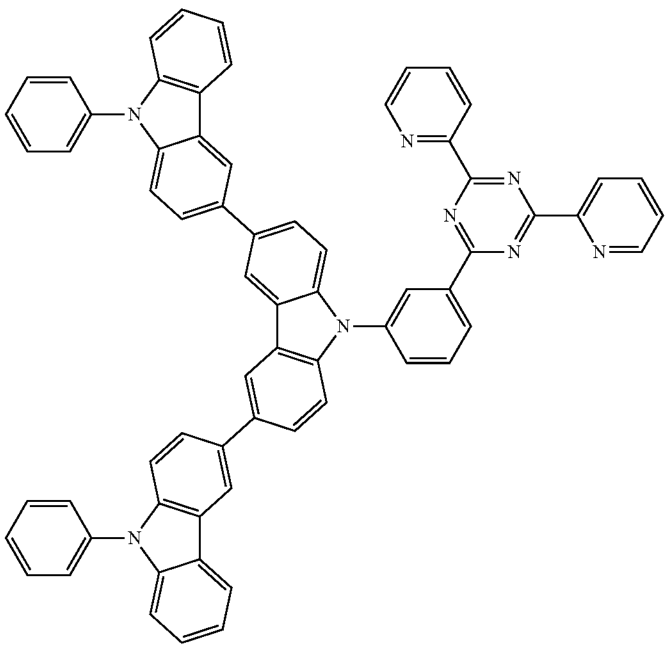
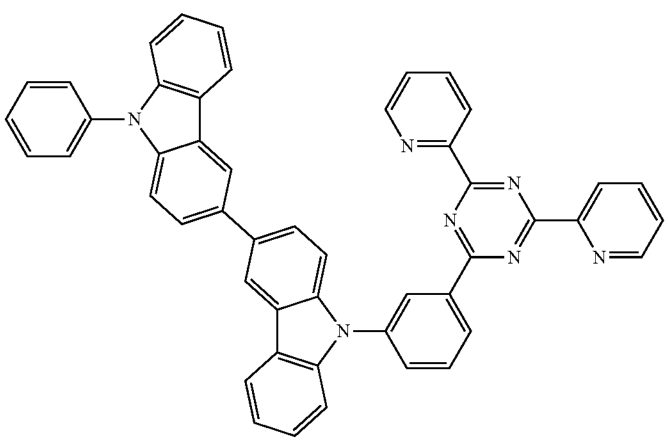
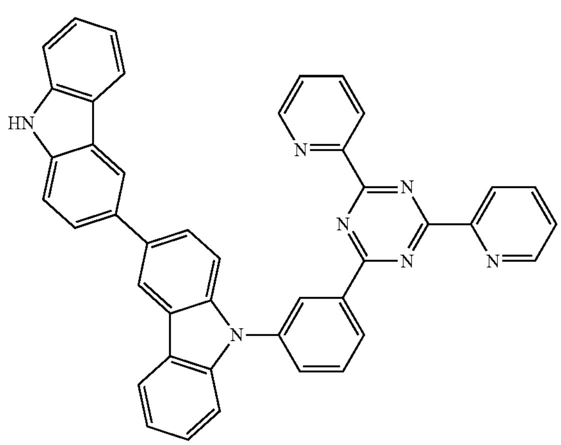

-continued
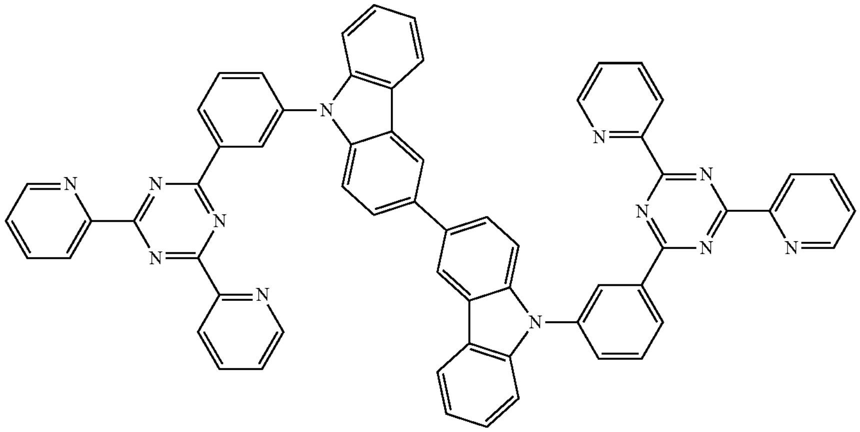
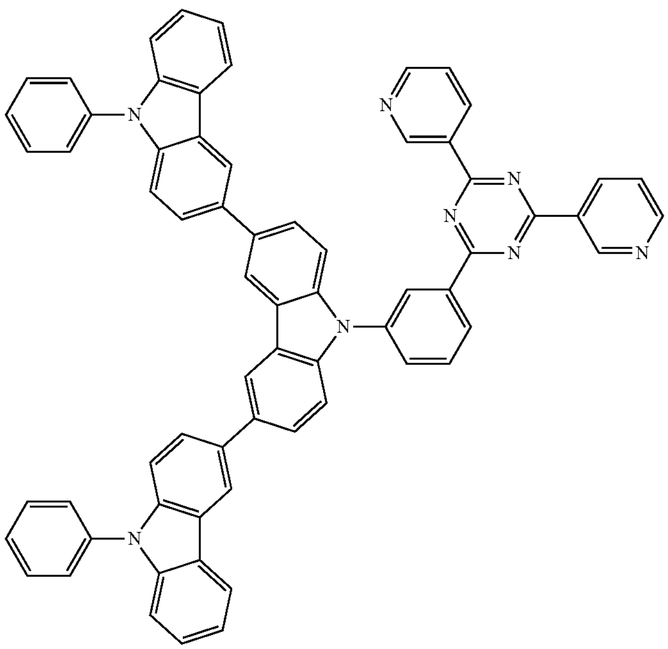
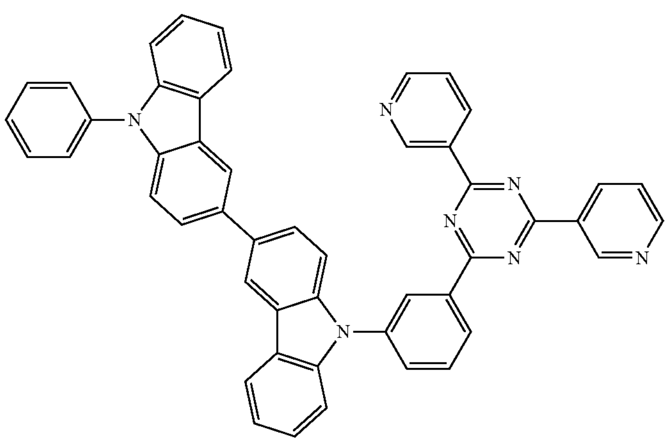

-continued
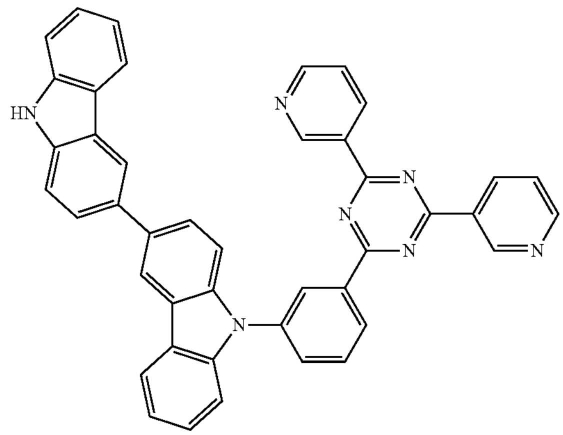
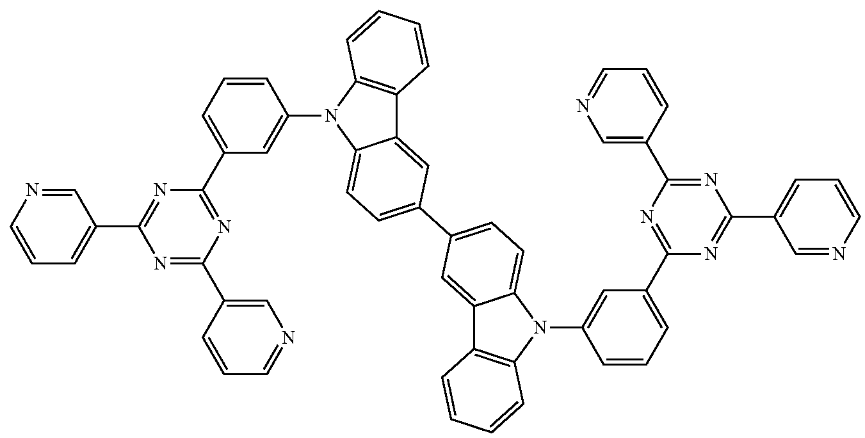
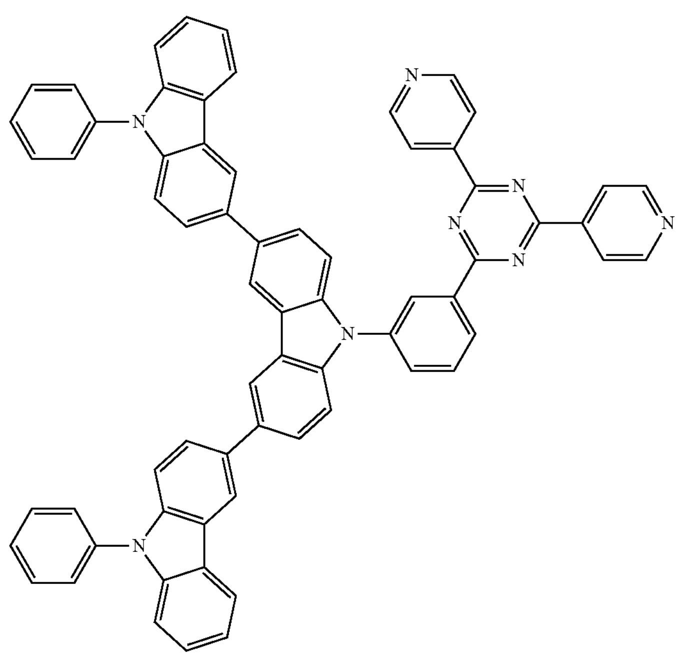

-continued

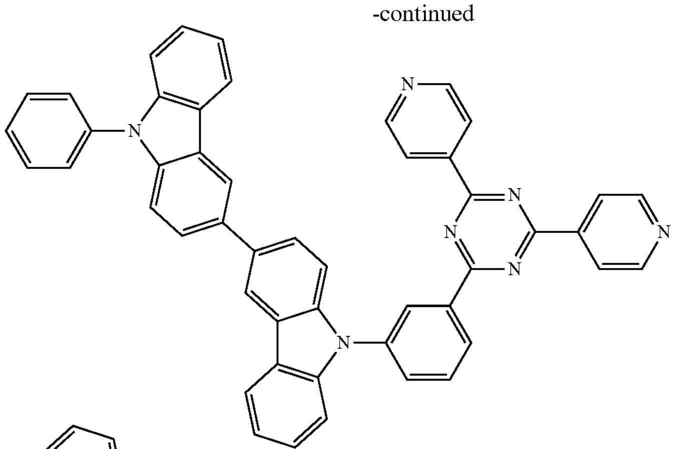

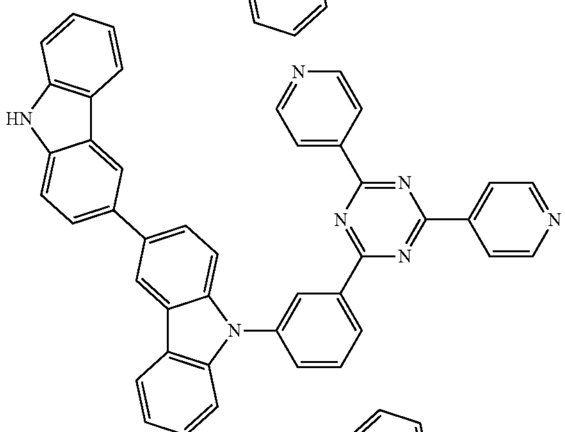

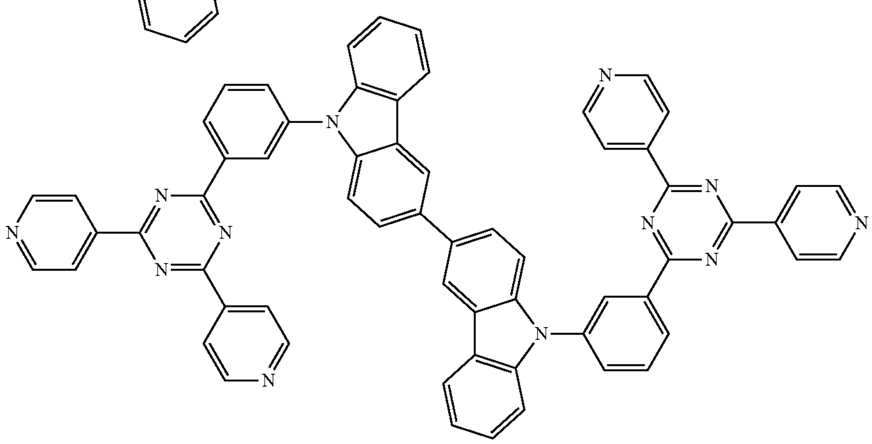

Examples of the preferred light emitting material include compounds represented by the following general formulae (211) and (212). The entire description of WO 2013/133359 including the paragraphs 0007 to 0032 and 0079 to 0084 is incorporated herein by reference.

General Formula (211)

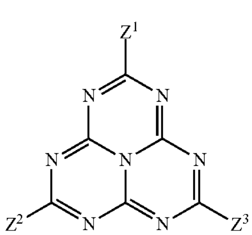

wherein in the general formula (211), $Z^1$, $Z^2$ and $Z^3$ each independently represent a substituent.

General Formula (212)

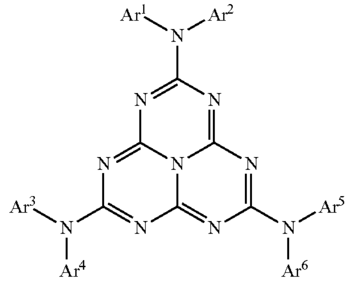

wherein in the general formula (212), $Ar^1$, $Ar^2$, $Ar^3$, $Ar^4$, $Ar^5$ and $Ar^6$ each independently represent a substituted or unsubstituted aryl group.

Specific examples of the compound represented by the general formula (212) include the compound represented by the following structural formula.

Compound 4001

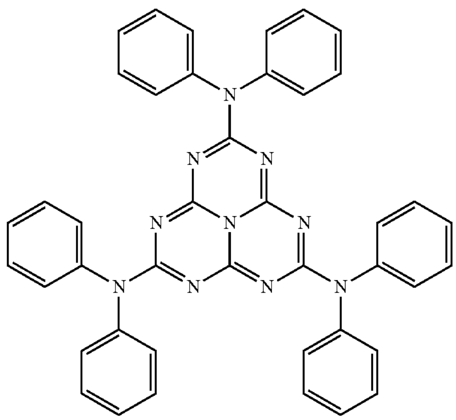

Specific examples of the compound represented by the general formula (212) include the compounds shown in the following table. In the compounds shown in the table, $Ar^1$, $Ar^2$, $Ar^3$, $Ar^4$, $Ar^5$ and $Ar^6$ are the same as each other, and are expressed by Ar.

TABLE 21

| Compound No. | Ar |
|---|---|
| 4002 | 4-fluorophenyl |
| 4003 | 3-fluorophenyl |
| 4004 | 2-fluorophenyl |
| 4005 | 3,5-difluorophenyl |
| 4006 | 2,4,6-trifluorophenyl |
| 4007 | 4-methylphenyl |
| 4008 | 3-methylphenyl |
| 4009 | 2-methylphenyl |

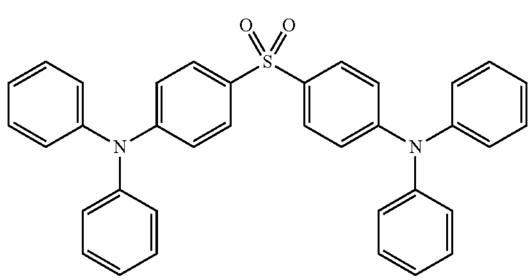

TABLE 21-continued

| Compound No. | Ar |
|---|---|
| 4010 | 3,5-dimethylphenyl |
| 4011 | 2,4,6-trimethylphenyl |
| 4012 | 4-ethylphenyl |
| 4013 | 3-ethylphenyl |
| 4014 | 2-ethylphenyl |
| 4015 | 3,5-diethylphenyl |
| 4016 | 4-propylphenyl |
| 4017 | 3-propylphenyl |
| 4018 | 3,5-dipropylphenyl |
| 4019 | 4-tert-butylphenyl |
| 4020 | 3-tert-butylphenyl |
| 4021 | 3,5-di-tert-butylphenyl |
| 4022 | 1-naphthyl |
| 4023 | 2-naphthyl |

Examples of the preferred light emitting material include compounds represented by the following general formula (221). The entire description of WO 2013/161437 including the paragraphs 0008 to 0054 and 0101 to 0121 is incorporated herein by reference.

General Formula (221)

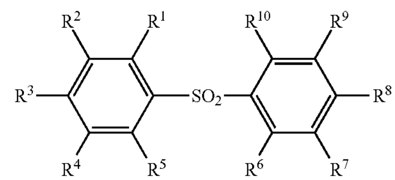

wherein in the general formula (221), $R^1$ to $R^{10}$ each independently represent a hydrogen atom or a substituent, provided that at least one of $R^1$ to $R^{10}$ represents a substituted or unsubstituted aryl group, a substituted or unsubstituted diarylamino group or a substituted or unsubstituted 9-carbazolyl group, and $R^1$ and $R^2$, $R^2$ and $R^3$, $R^3$ and $R^4$, $R^4$ and $R^5$, $R^5$ and $R^6$, $R^6$ and $R^7$, $R^7$ and $R^8$, $R^8$ and $R^9$, and $R^9$ and $R^{10}$ each may be bonded to each other to form a ring structure.

Specific examples of the compound includes the following compounds.

-continued
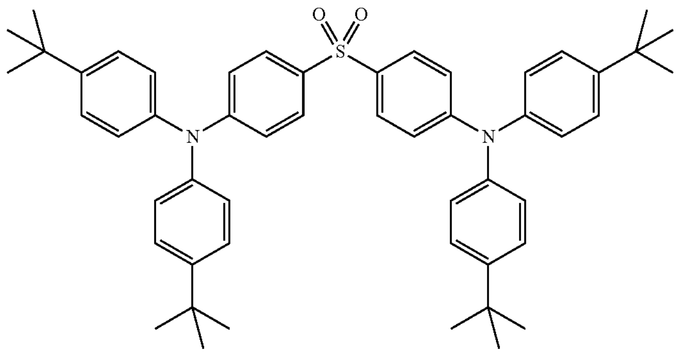
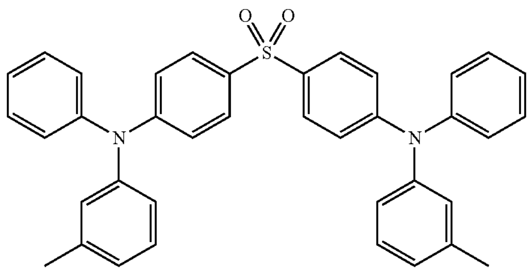
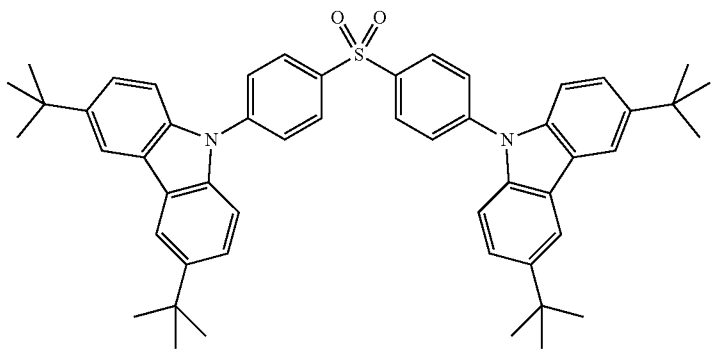
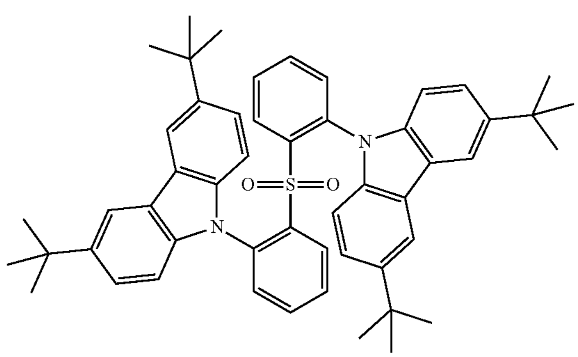
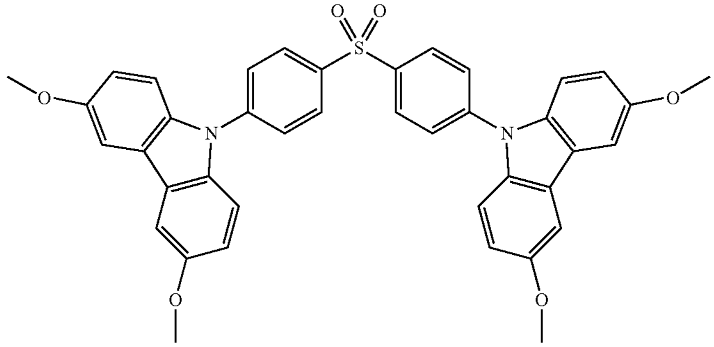

-continued
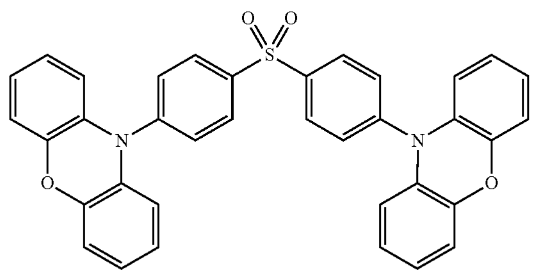
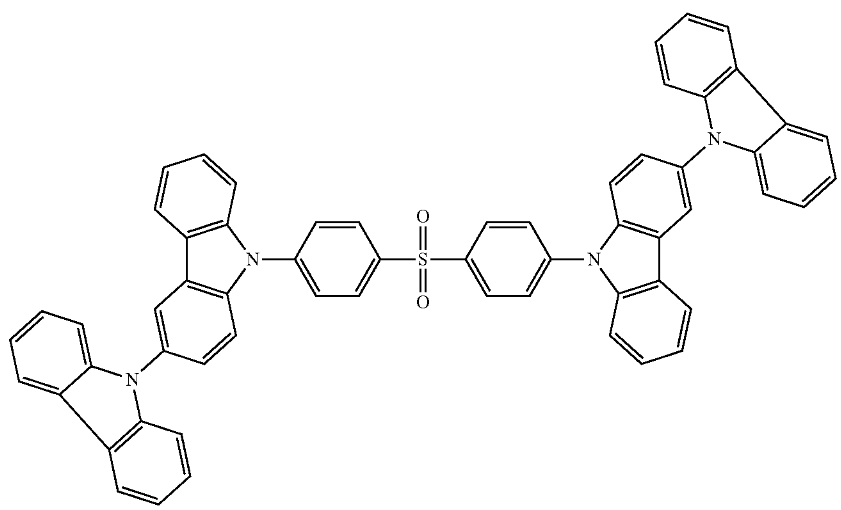
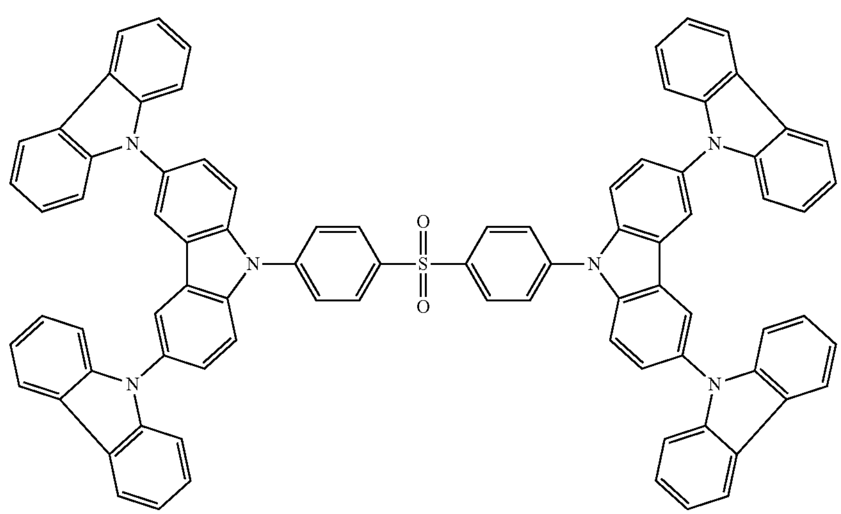

-continued
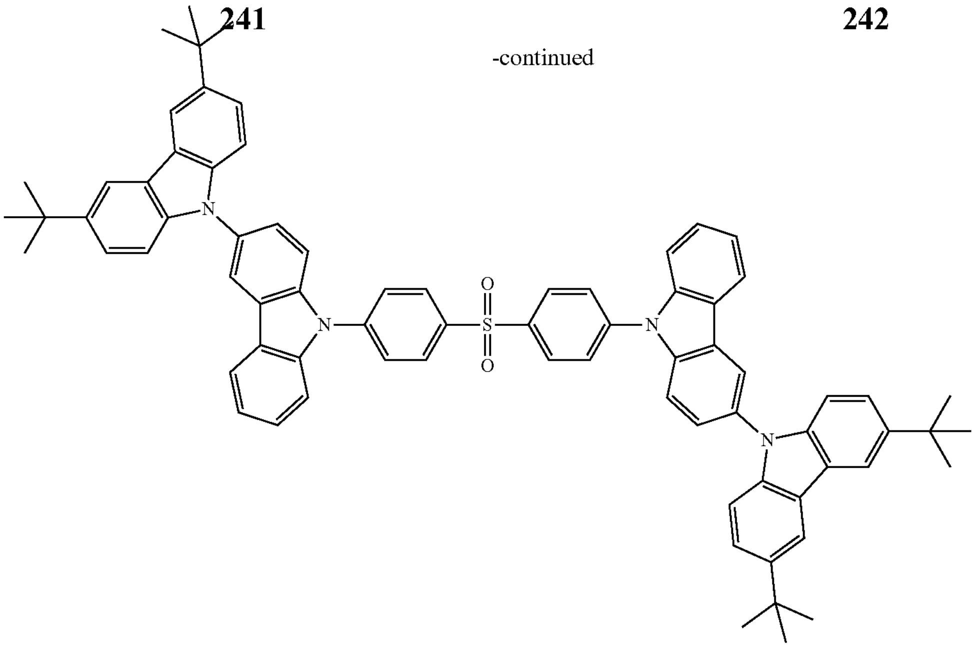
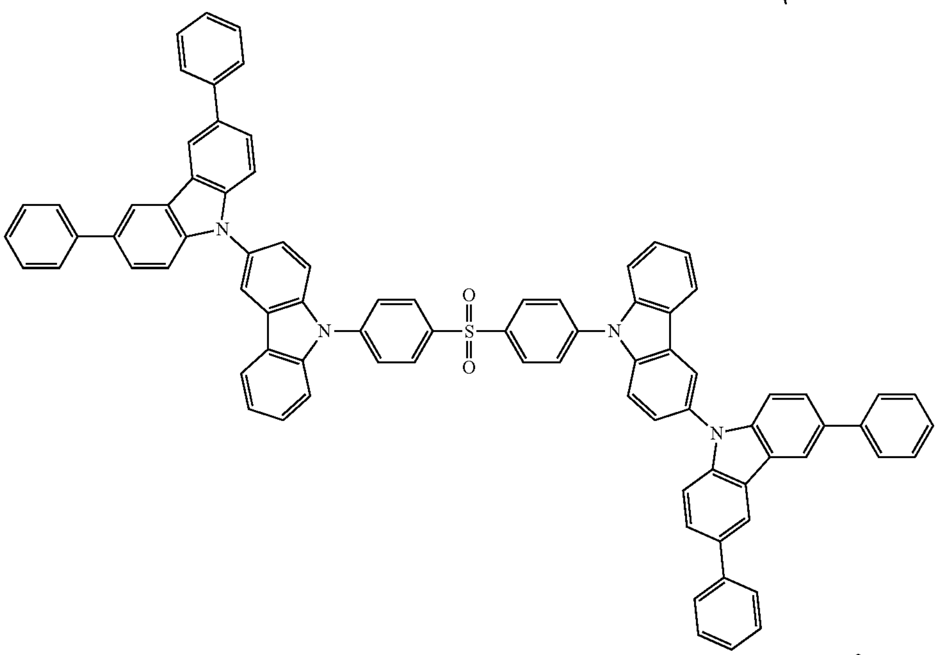
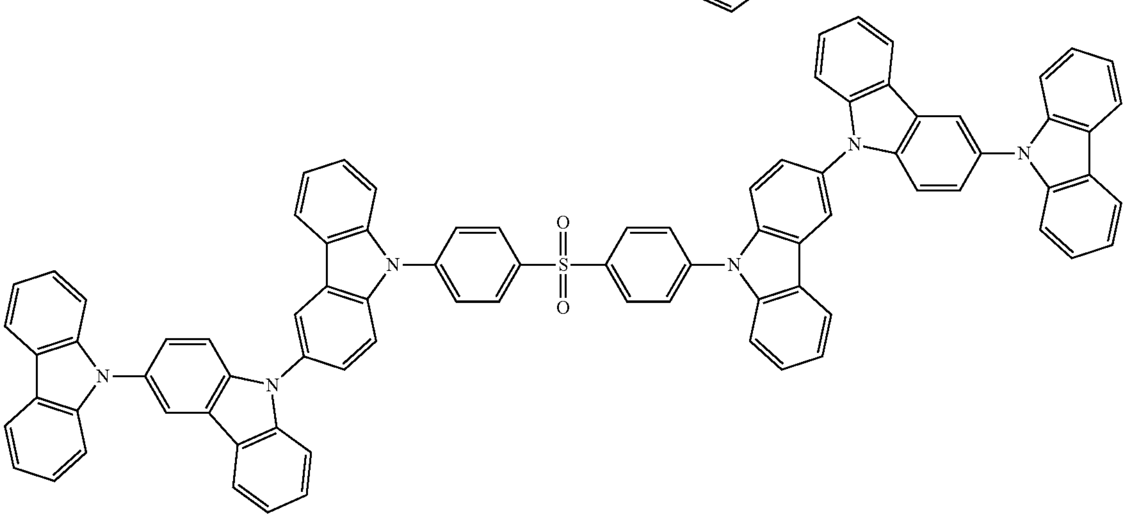

-continued

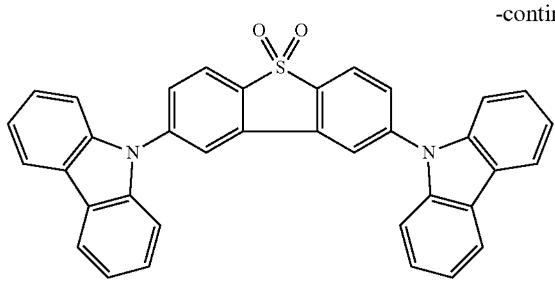

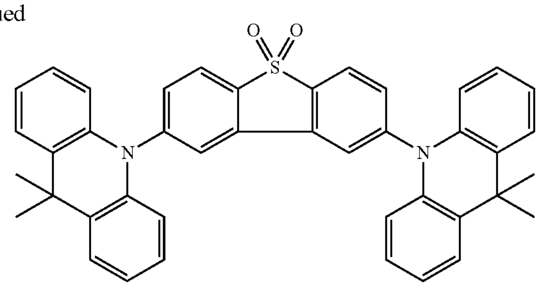

Examples of the preferred light emitting material include compounds represented by the following general formula (231). The entire description of JP-A-2014-9352 including the paragraphs 0007 to 0041 and 0060 and 0069 is incorporated herein by reference.

General Formula (231)

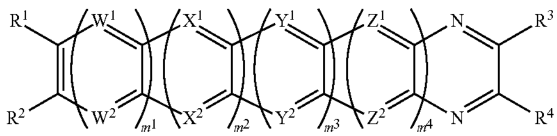

wherein in the general formula (231), $R^1$ to $R^4$ each independently represent a hydrogen atom or a substituted or unsubstituted (N,N-diarylamino)aryl group, provided that at least one of $R^1$ to $R^4$ represents a substituted or unsubstituted (N,N-diarylamino)aryl group, and two aryl groups constituting the diarylamino moiety of the (N,N-diarylamino)aryl group may be bonded to each other; $W^1$, $W^2$, $X^1$, $X^2$, $Y^1$, $Y^2$, $Z^1$ and $Z^2$ each independently represent a carbon atom or a nitrogen atom; and $m^1$ to $m^4$ each independently represent 0, 1 or 2.

Specific examples of the compound include the following compounds.

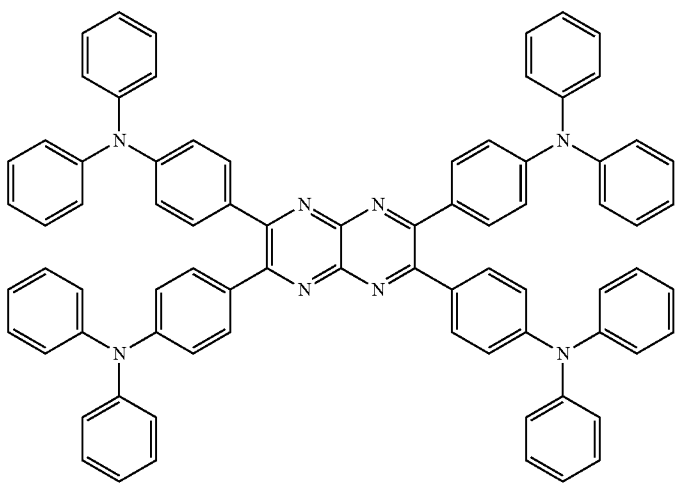

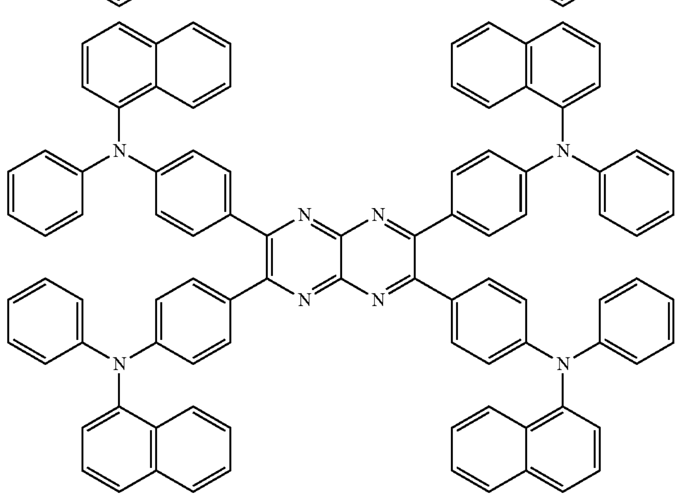

-continued
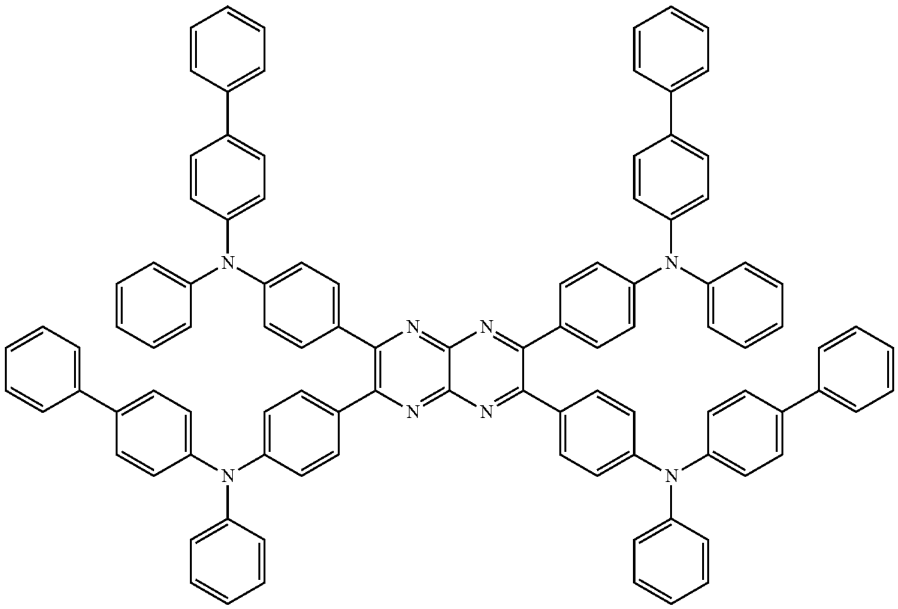
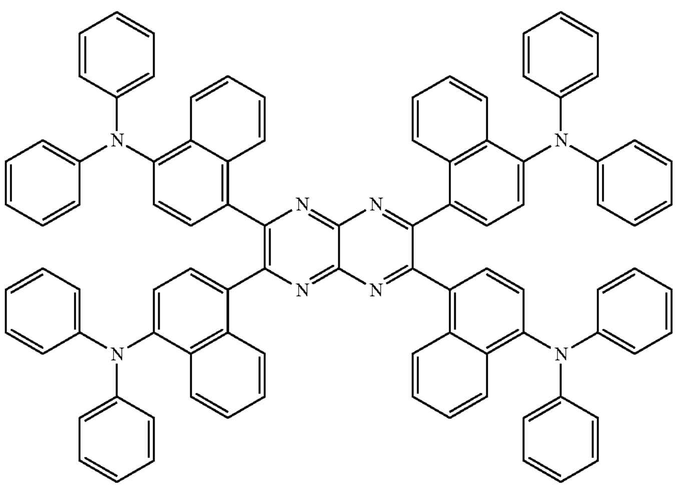
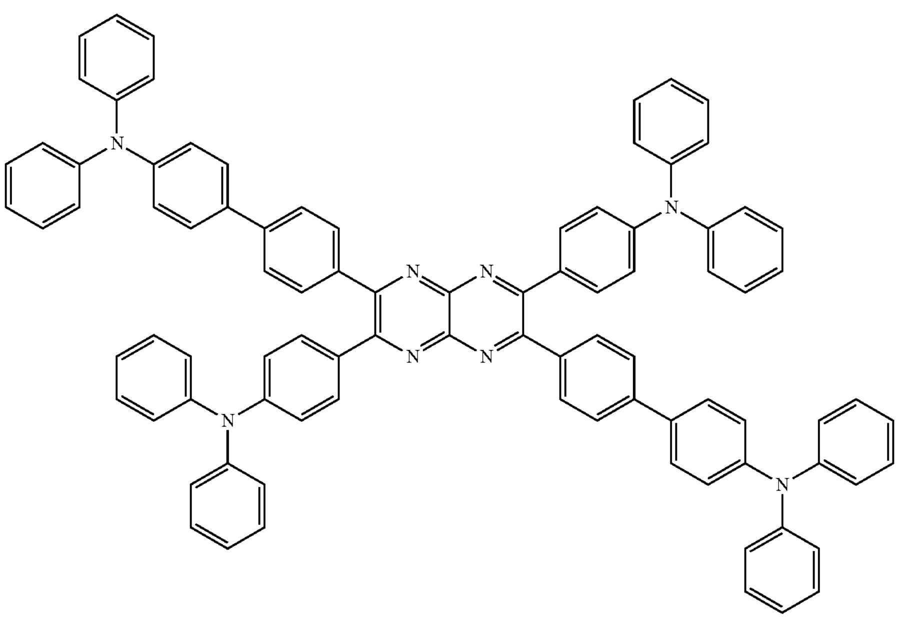

-continued
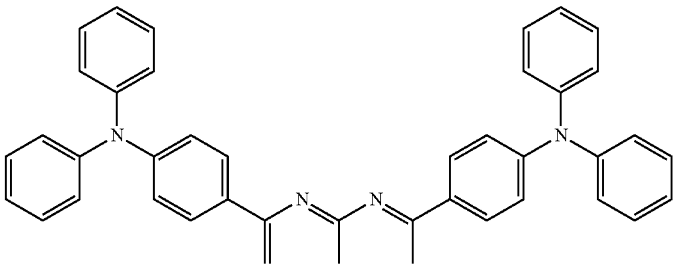
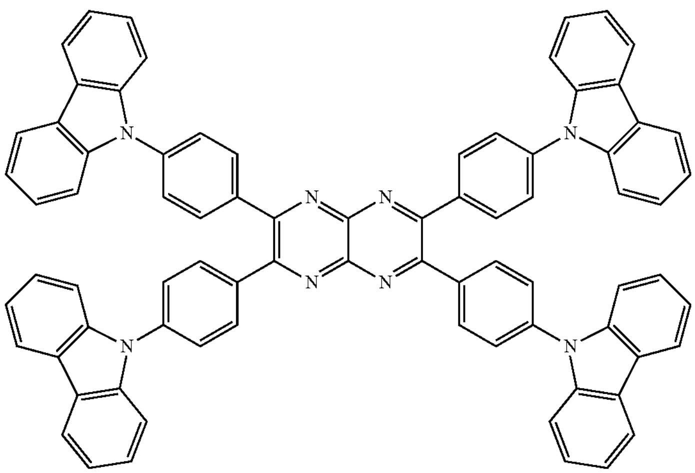
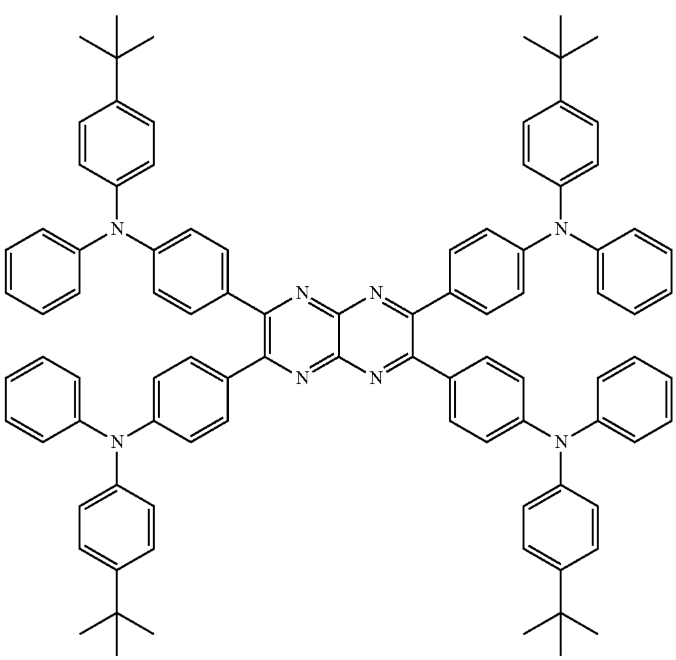

-continued
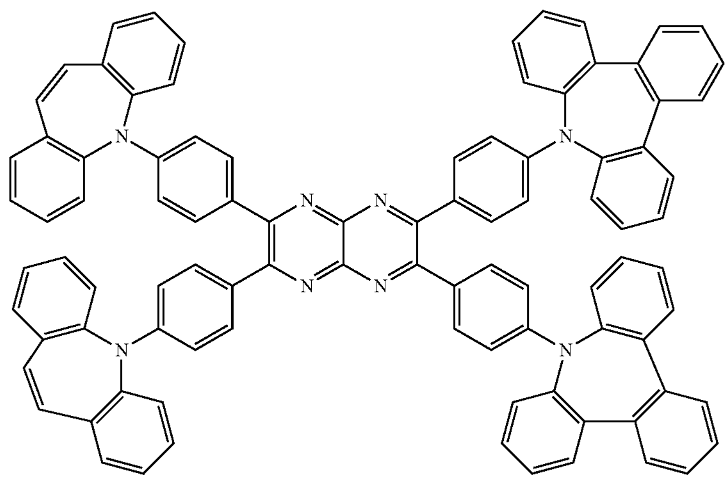
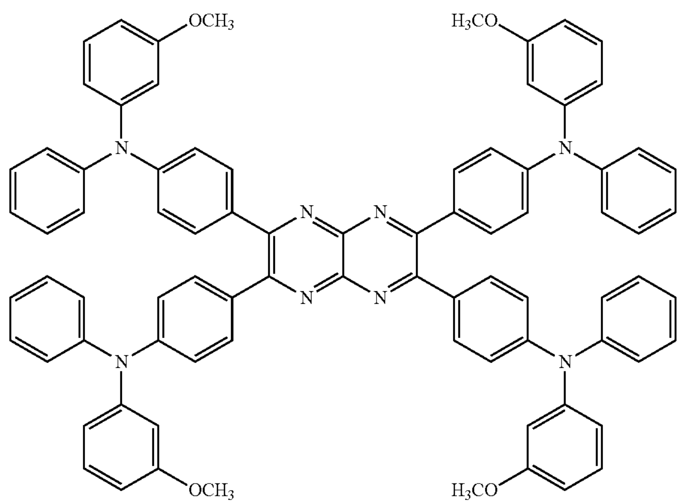
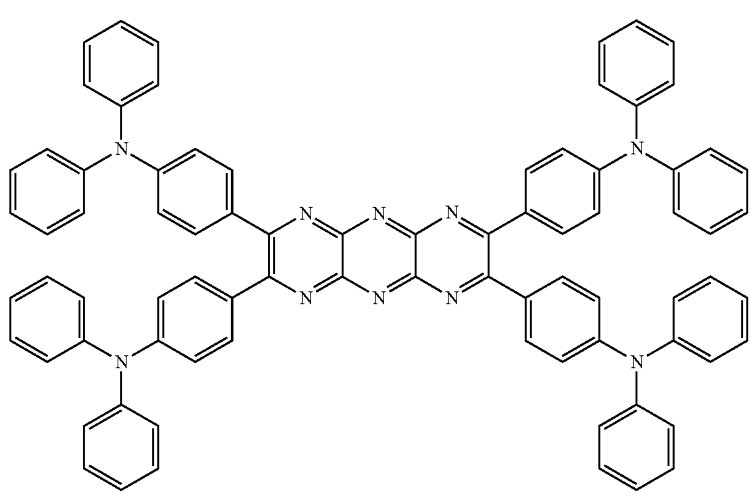

-continued
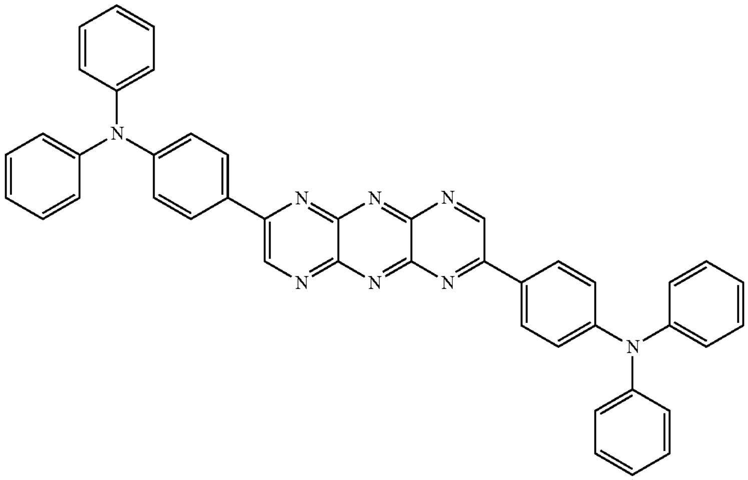
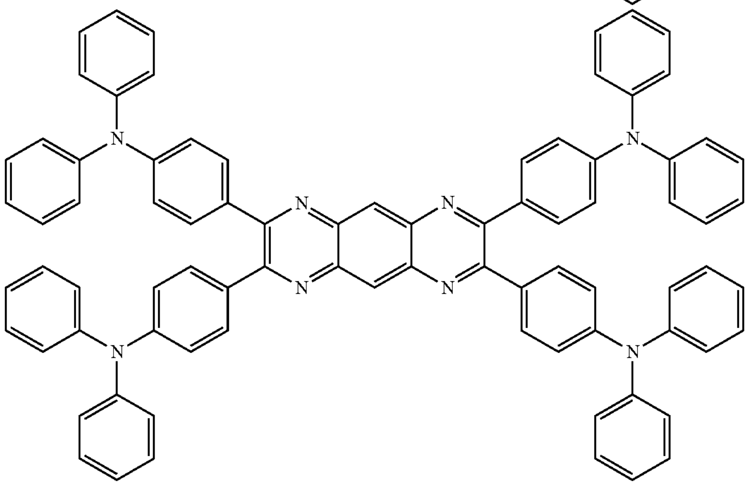
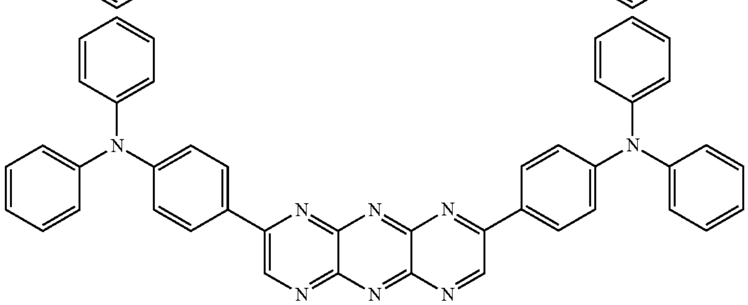
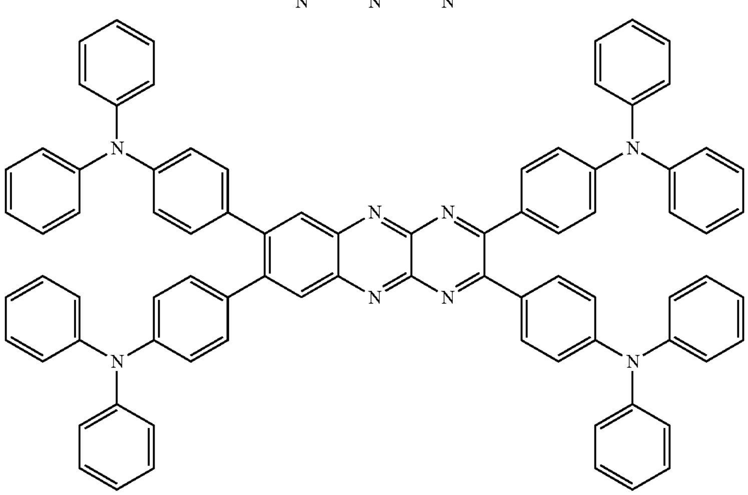

-continued
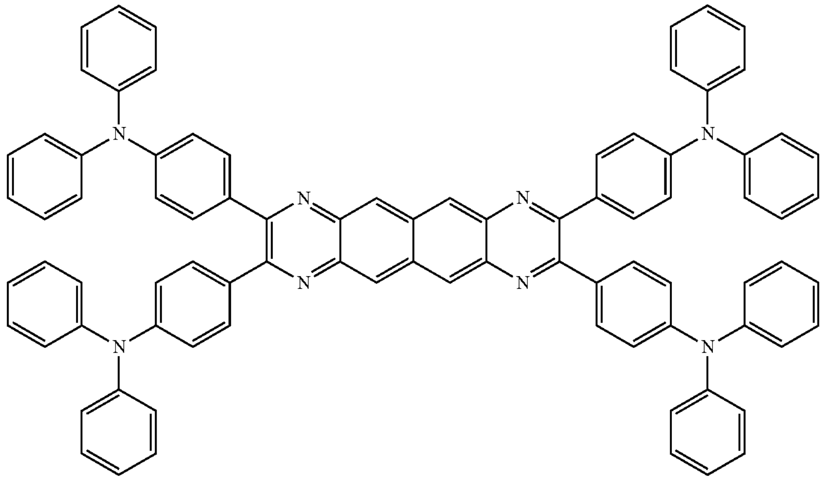
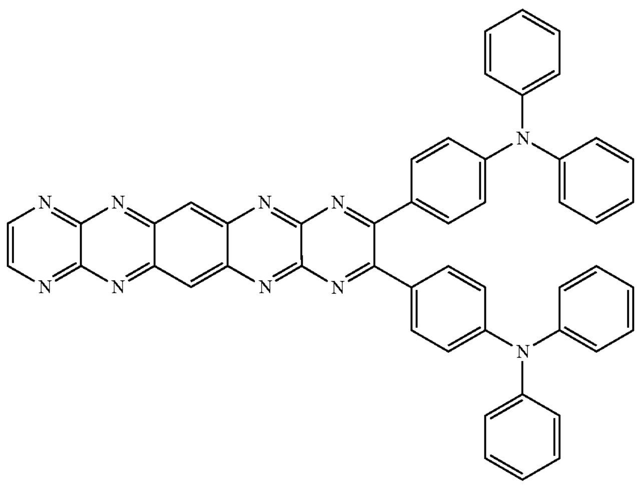
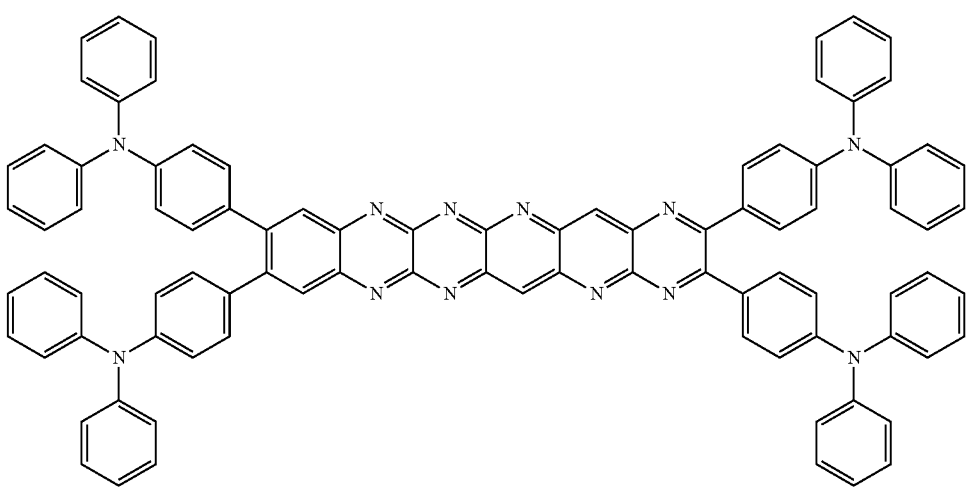

-continued
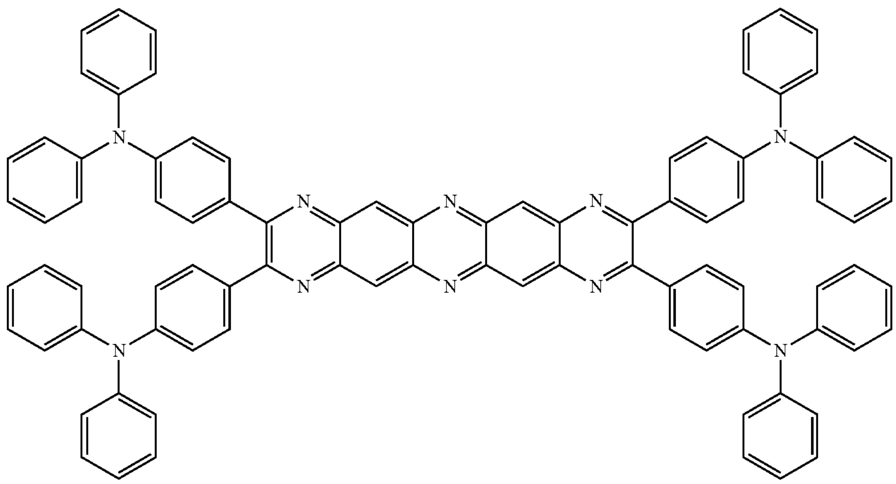
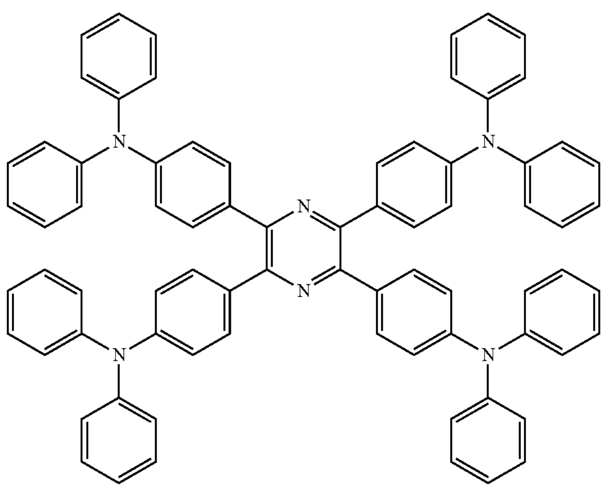

Examples of the preferred light emitting material include compounds represented by the following general formula (241). The entire description of JP-A-2014-9224 including the paragraphs 0008 to 0048 and 0067 to 0076 is incorporated herein by reference.

General Formula (241)

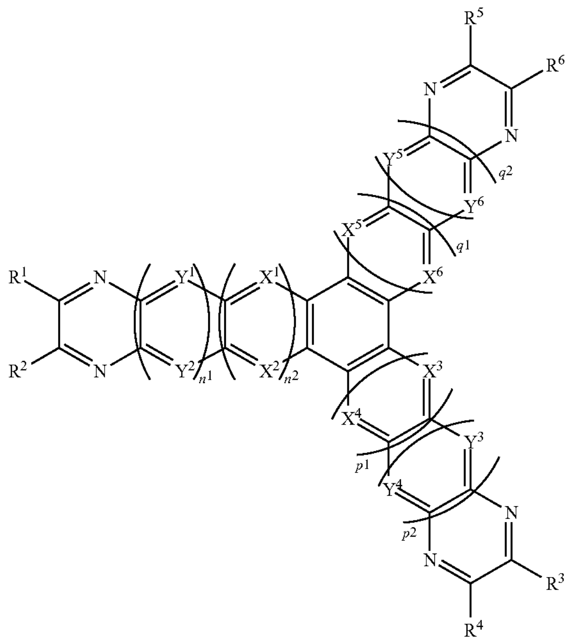

wherein in the general formula (241), $R^1$ to $R^6$ each independently represent a hydrogen atom or a substituent, provided that at least one of $R^1$ to $R^6$ represents a substituted or unsubstituted (N,N-diarylamino)aryl group, and two aryl groups constituting the diarylamino moiety of the (N,N-diarylamino)aryl group may be bonded to each other; $X^1$ to $X^6$ and $Y^1$ to $Y^6$ each independently represent a carbon atom or a nitrogen atom; and $n^1$, $n^2$, $p^1$, $p^2$, $q^1$ and $q^2$ each independently represent 0, 1 or 2.

Specific examples of the compound include the following compounds.

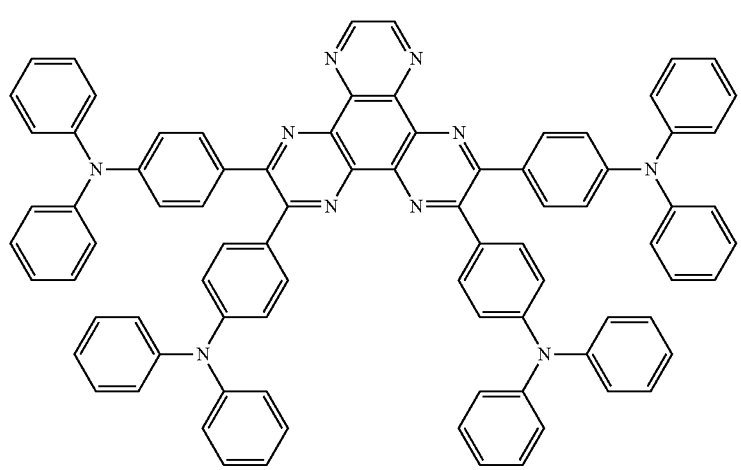

-continued
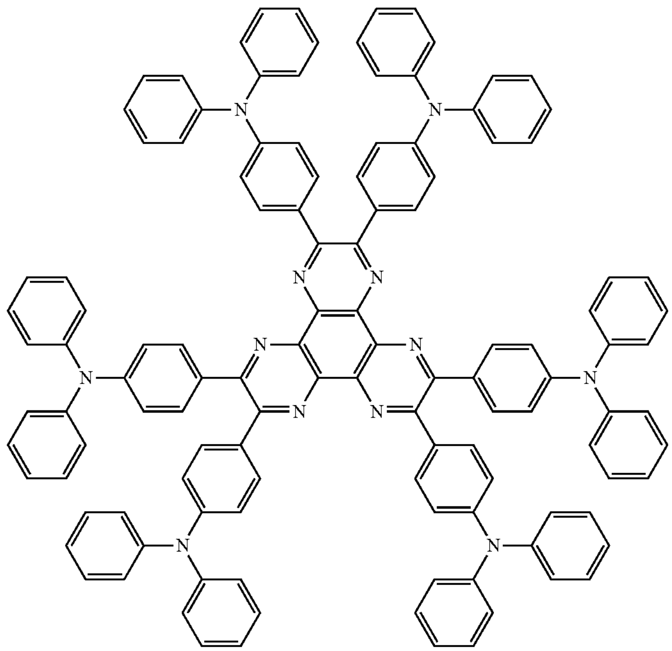
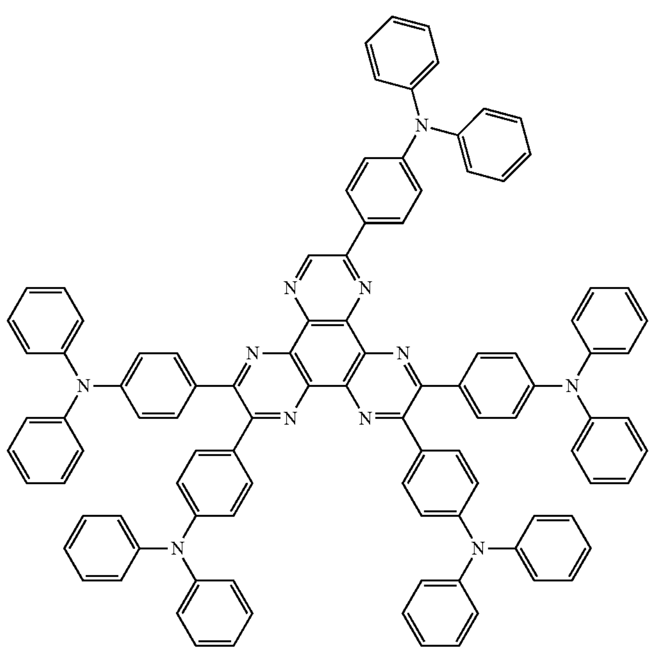

-continued
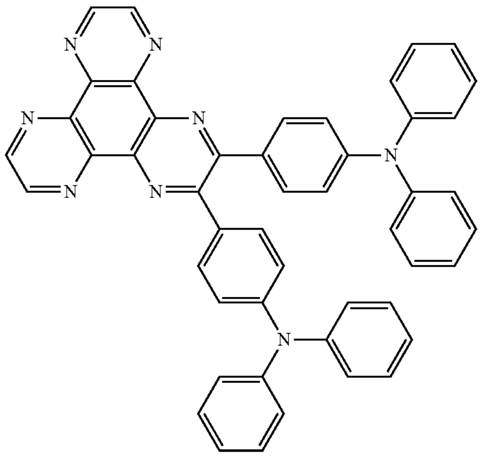
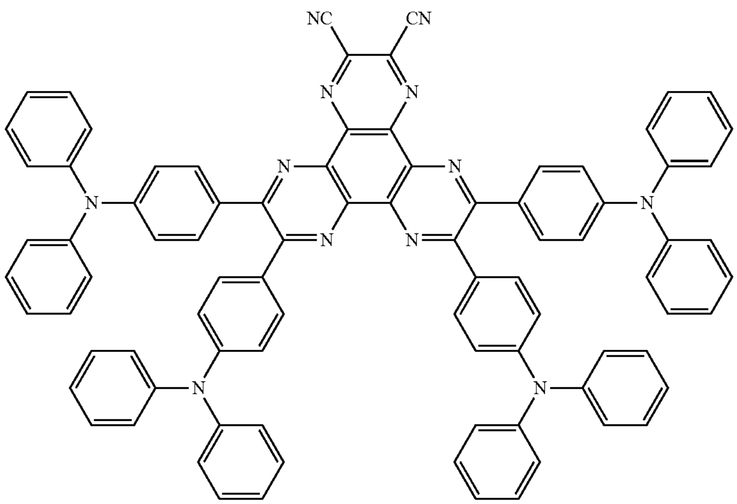
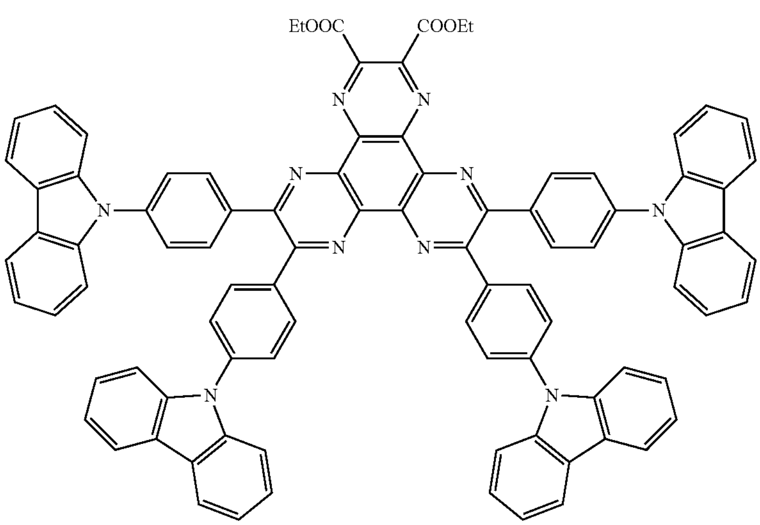

-continued
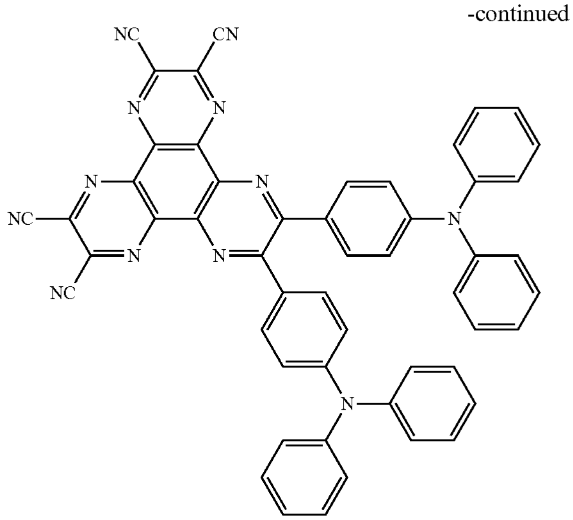
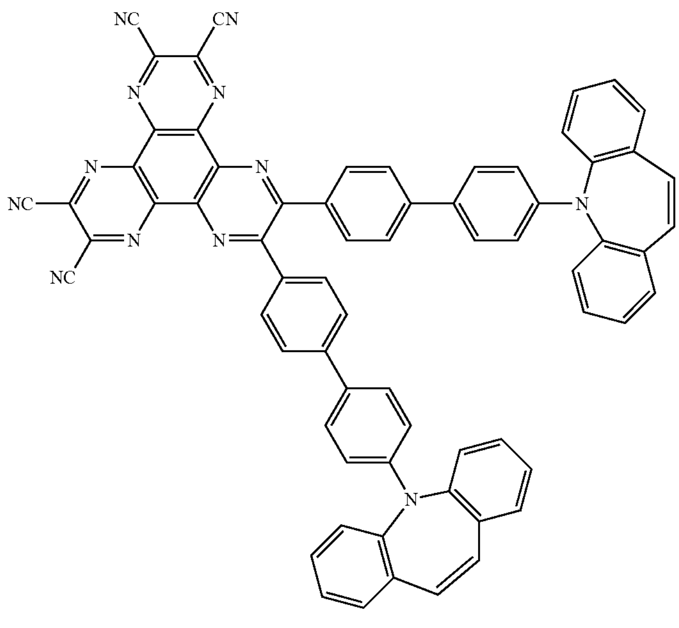
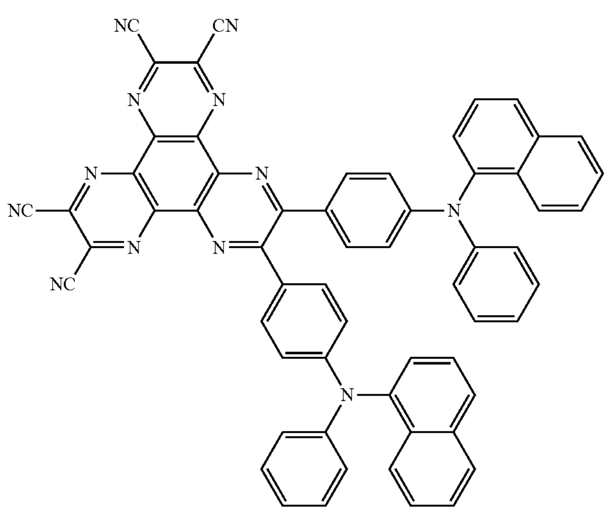

-continued
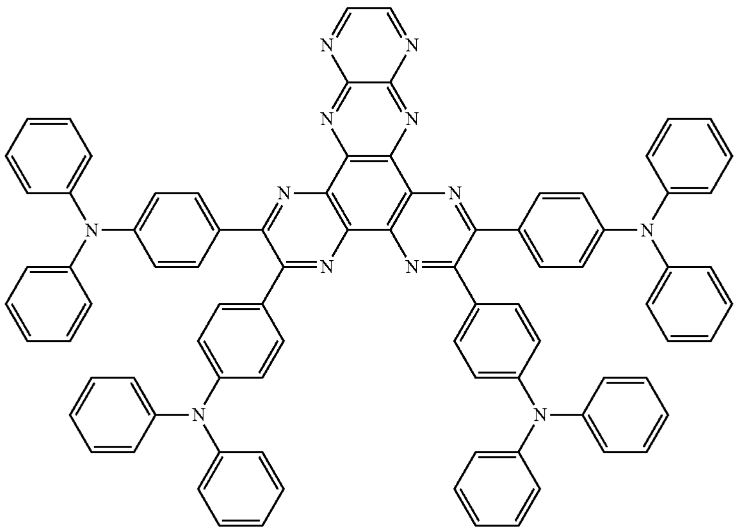
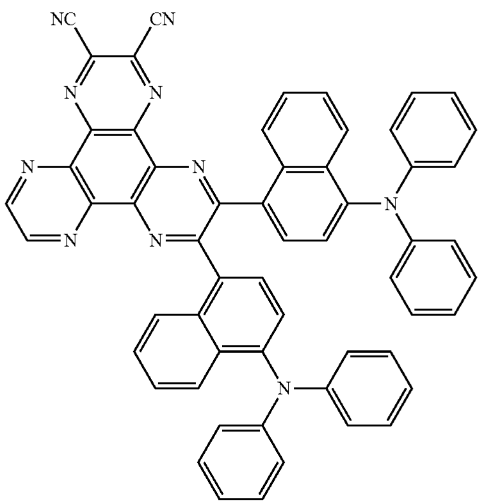
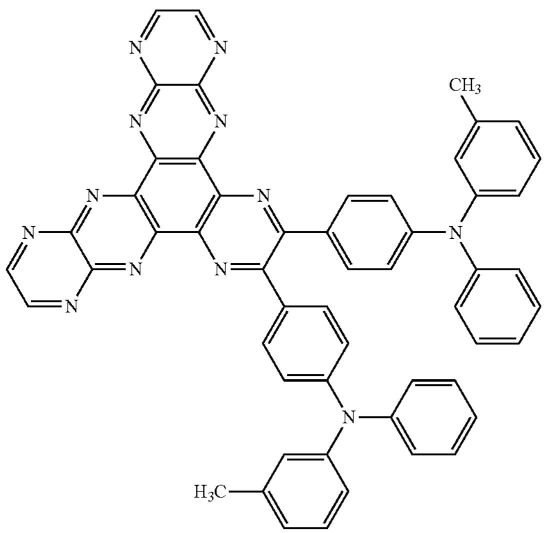
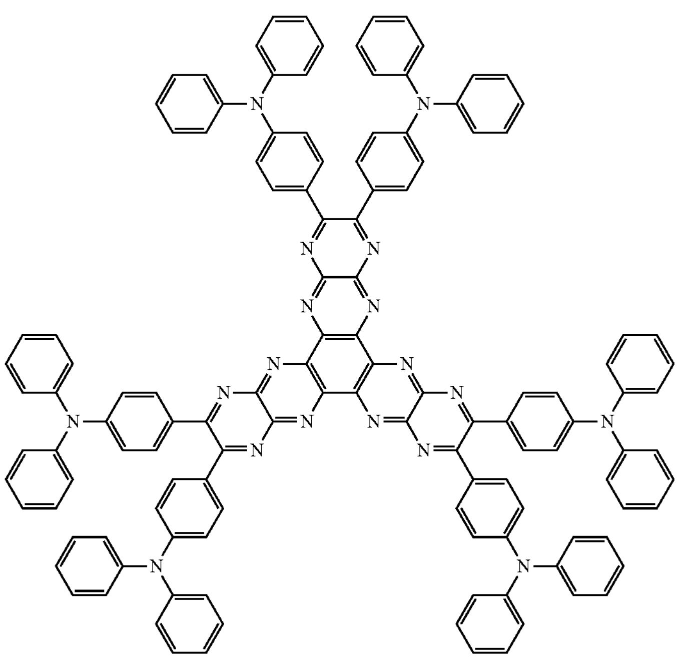

-continued
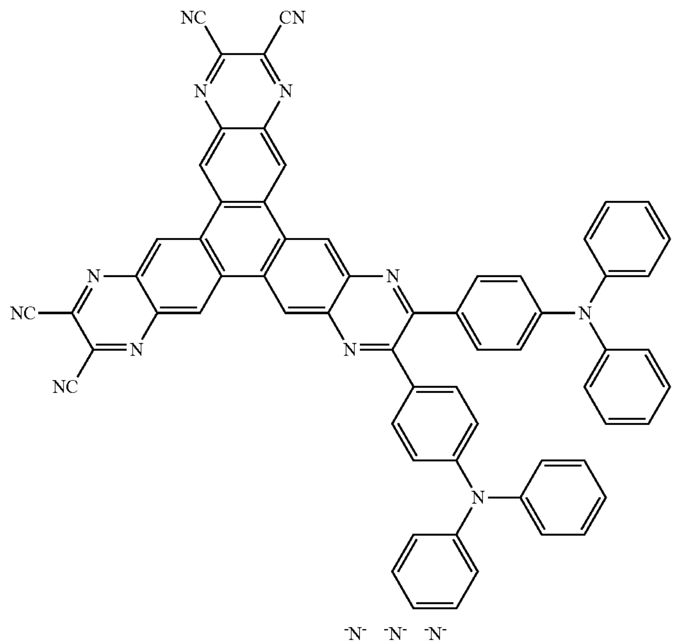
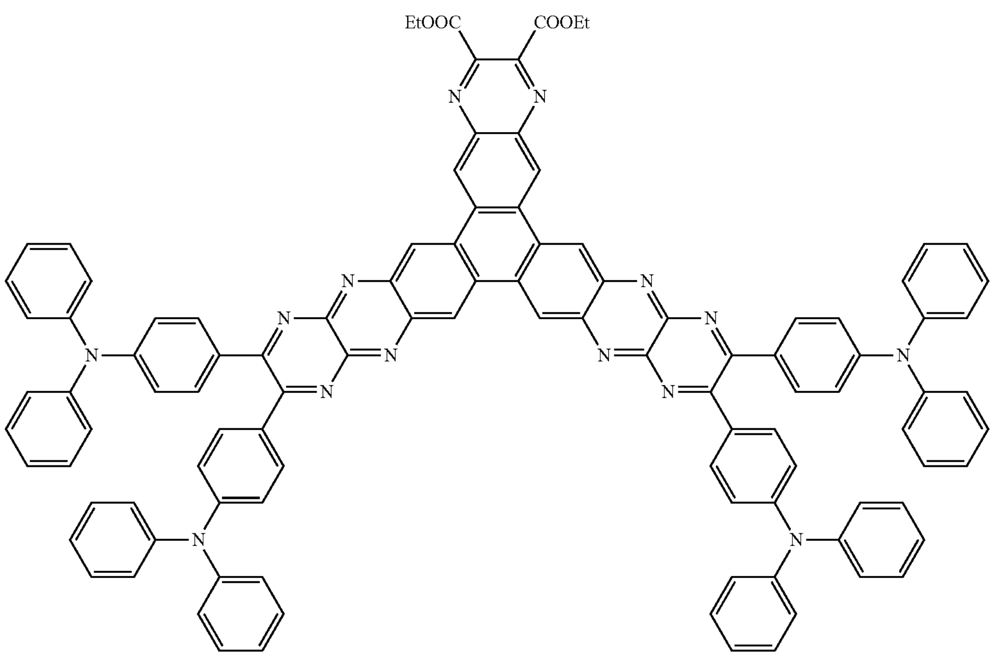

-continued

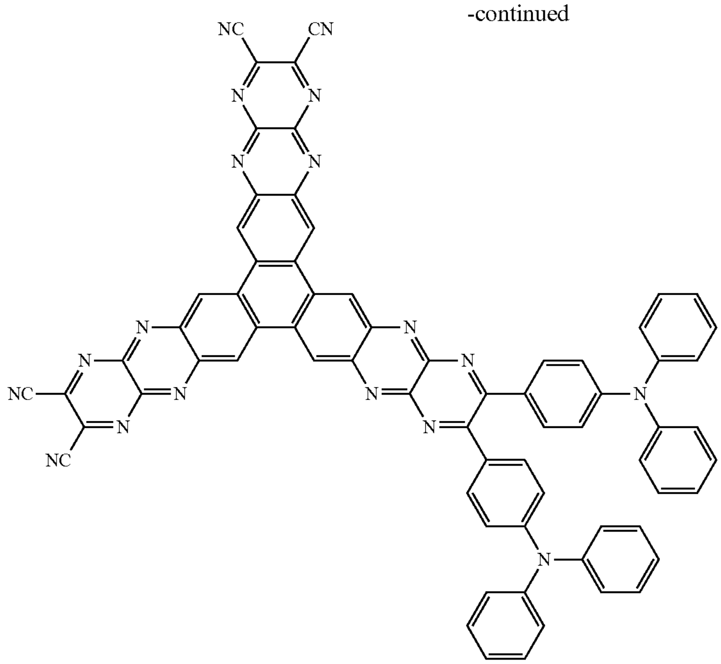

Examples of the preferred light emitting material include the following compounds.

(1) A compound represented by the following general formula (251):

General Formula (251)

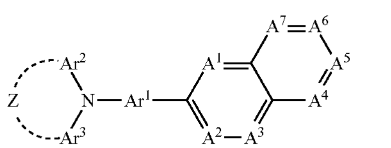

wherein in the general formula (251), one of $A^1$ to $A^7$ represents N, and the balance each independently represent C—R; R represents a non-aromatic group; $Ar^1$ to $Ar^3$ each independently represent a substituted or unsubstituted arylene group; and Z represents a single bend or a linking group.

(2) The compound according to the item (1), wherein the compound represented by the general formula (251) has a structure represented by the following general formula (252):

General Formula (252)

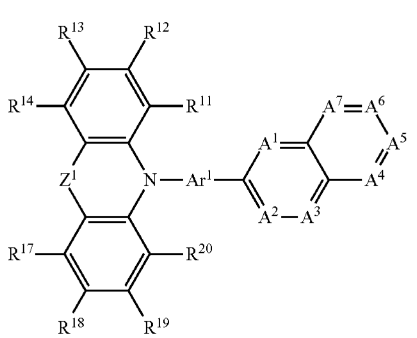

wherein in the general formula (252), 1 to 4 of $A^1$ to $A^7$ represents N, and the balance each independently represent C—R; R represents a non-aromatic group; $Ar^1$ represents a substituted or unsubstituted arylene group; $R^{11}$ to $R^{14}$ and $R^{17}$ to $R^{20}$ each independently represent a hydrogen atom or a substituent, in which $R^{11}$ and $R^{12}$, $R^{12}$ and $R^{13}$, $R^{13}$ and $R^{14}$, $R^{17}$ and $R^{18}$, $R^{18}$ and $R^{19}$, and $R^{19}$ and $R^{20}$ each may be bonded to each other to form a cyclic structure; and $Z^1$ represents a single bond or a linking group having 1 or 2 linking chain atoms.

(3) The compound according to the item (1), wherein the compound represented by the general formula (251) has a structure represented by the following general formula (253):

General Formula (253)

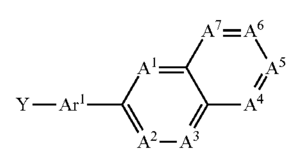

wherein in the general formula (253), from 2 to 4 of $A^1$ to $A^7$ represent N, and the balance represent C—R; R represents a non-aromatic group; $Ar^1$ represents a substituted or unsubstituted arylene group; and Y represents a substituted or unsubstituted carbazol-9-yl group, a substituted or unsubstituted 10H-phenoxazin-10-yl group, a substituted or unsubstituted 10H-phenothiazin-10-yl group, or a substituted or unsubstituted 10H-phenazin-5-yl group.

(4) The compound according to the item (3), wherein in the general formula (253), Y represents a group represented by any one of the following general formulae (254) to (257):

General Formula (254)

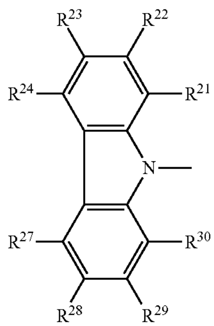

General Formula (255)

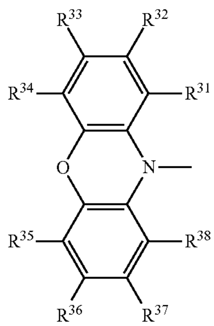

General Formula (256)

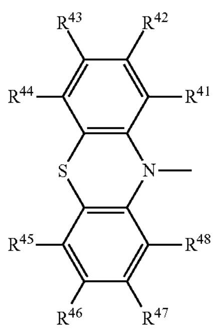

General Formula (257)

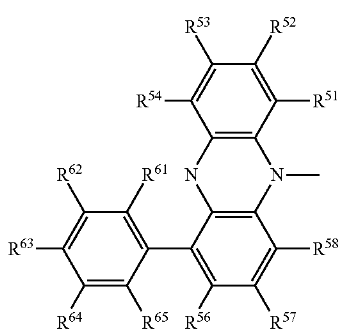

wherein in the general formulae (254) to (257), $R^{21}$ to $R^{24}$, $R^{27}$ to $R^{38}$, $R^{41}$ to $R^{48}$, $R^{51}$ to $R^{58}$, and $R^{61}$ to $R^{65}$ each independently represent a hydrogen atom or a substituent, in which $R^{21}$ and $R^{22}$, $R^{22}$ and $R^{23}$, $R^{23}$ and $R^{24}$, $R^{27}$ and $R^{28}$, $R^{28}$ and $R^{29}$, $R^{29}$ and $R^{30}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{64}$ and $R^{65}$, $R^{54}$ and $R^{61}$, and $R^{55}$ and $R^{65}$ each may be bonded to each other to form a cyclic structure.

(5) The compound according to the item (3), wherein in the general formula (253), Y represents a group represented by the following general formula (258):

General Formula (258)

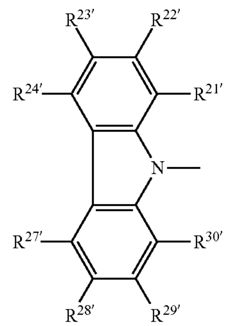

wherein in the general formula (258), $R^{21'}$ to $R^{24'}$ and $R^{27'}$ to $R^{30'}$ each independently represent a hydrogen atom or a substituent, provided that at least one of $R^{23'}$ and $R^{28'}$ represents a substituent, and $R^{21'}$ and $R^{22'}$, $R^{22'}$ and $R^{23'}$, $R^{23'}$ and $R^{24'}$, $R^{27'}$ and $R^{28'}$, $R^{28'}$ and $R^{29'}$, and $R^{29'}$ and $R^{30'}$ each may be bonded to each other to form a cyclic structure.

(6) The compound according to the item (5), wherein in the general formula (258), at least one of $R^{23'}$ an $R^{28'}$ represents a substituted or unsubstituted diarylamino group or a substituted or unsubstituted carbazol-9-yl group.

(7) The compound according to the item (4), wherein in the general formula (253), Y represents a group represented by the general formula (255).

Examples of the compound include the following compounds.

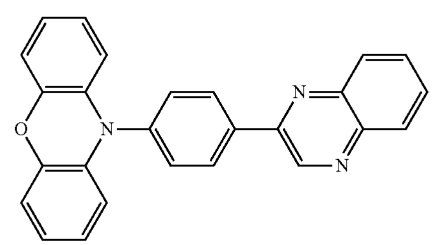

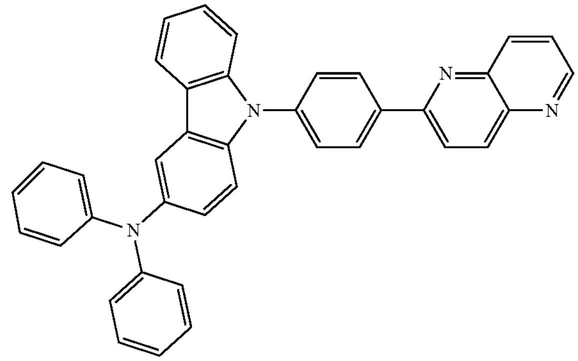

-continued
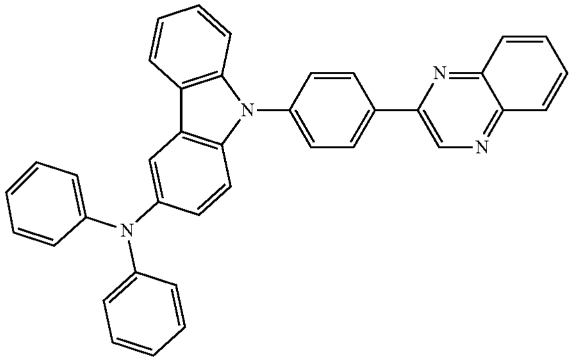
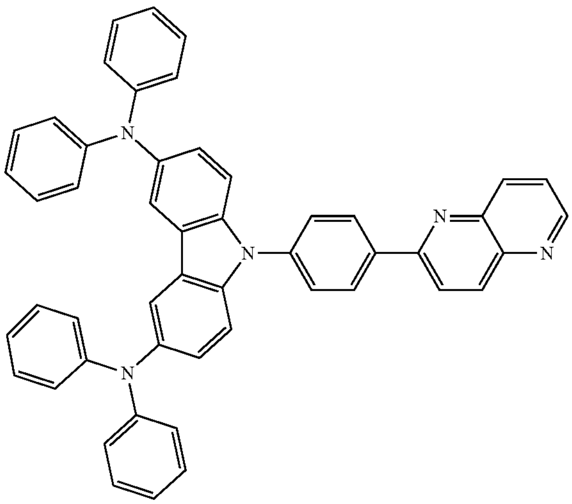
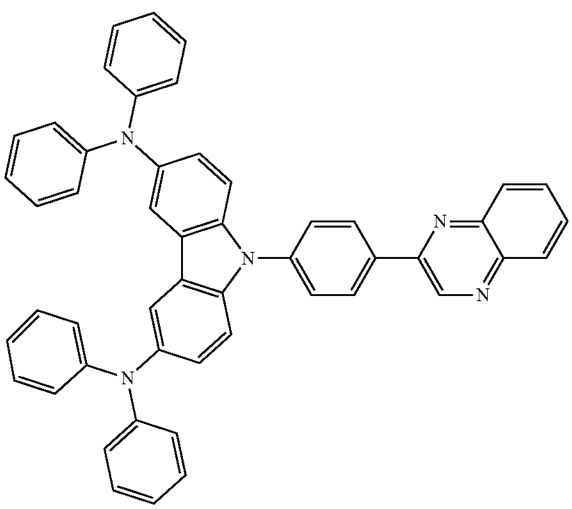
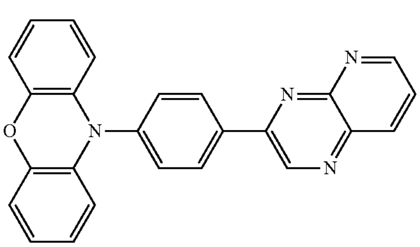
-continued
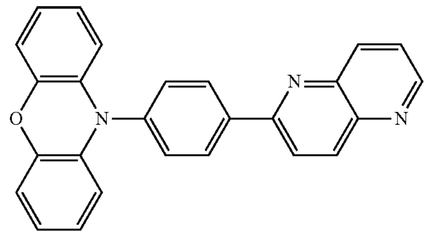
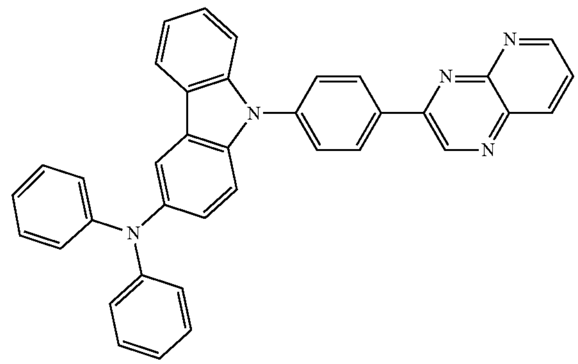
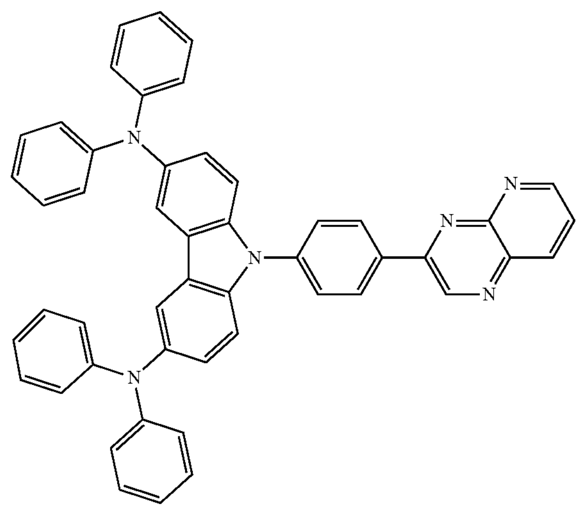
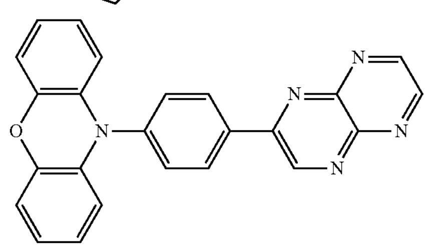
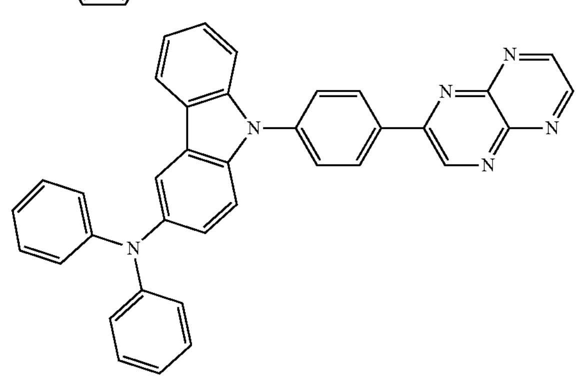

-continued

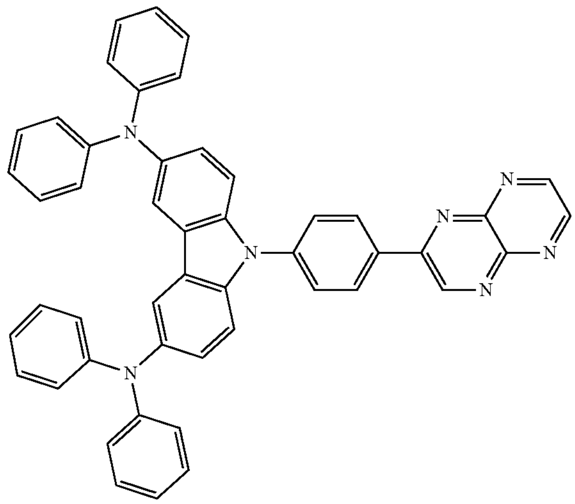

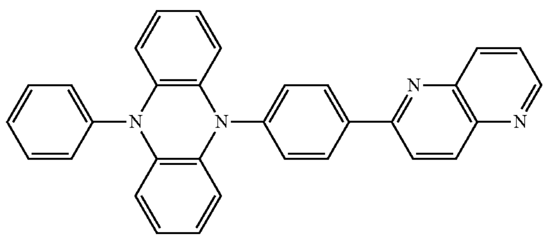

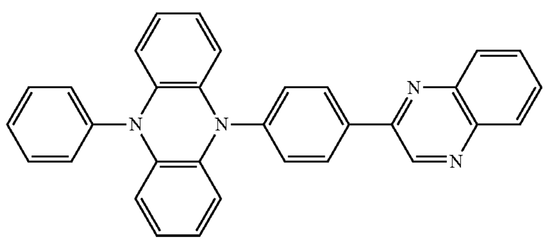

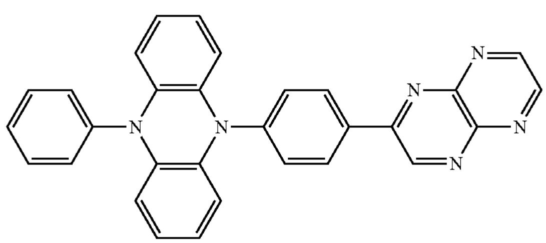

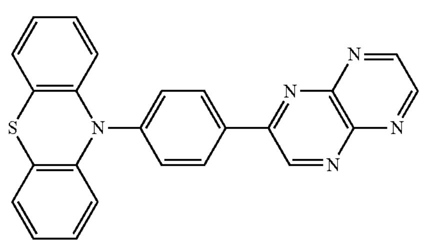

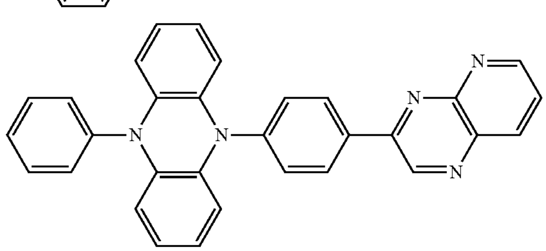

-continued

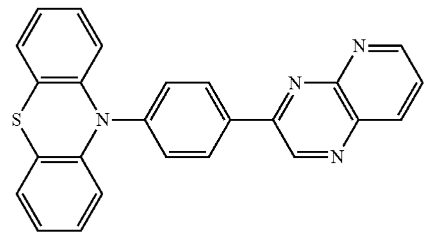

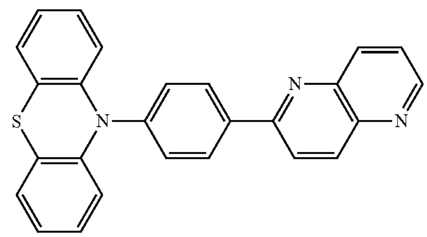

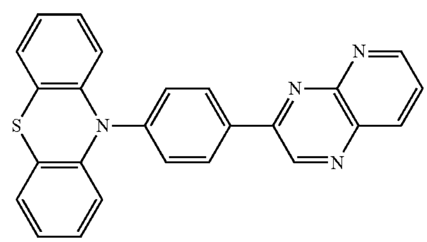

Examples of the preferred light emitting material include the following compounds.

(1) A compound represented by the following general formula (271):

General Formula (271)

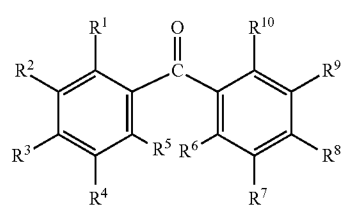

wherein in the general formula (271), $R^1$ to $R^{10}$ each independently represent a hydrogen atom or a substituent, provided that at least one of $R^1$ to $R^{10}$ each independently represent a group represented by the following general formula (272), and $R^1$ and $R^2$, $R^2$ and $R^3$, $R^3$ and $R^4$, $R^4$ and $R^5$, $R^6$ and $R^7$, $R^7$ and $R^8$, $R^8$ and $R^9$, and $R^9$ and $R^{10}$ each may be bonded to each other to form a cyclic structure:

General Formula (272)

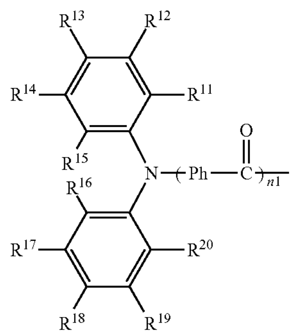

wherein in the general formula (272), $R^{11}$ to $R^{20}$ each independently represent a hydrogen atom or a substituent, in which $R^{11}$ and $R^{12}$, $R^{12}$ and $R^{13}$, $R^{13}$ and $R^{14}$, $R^{14}$ and $R^{15}$, $R^{15}$ and $R^{16}$, $R^{16}$ and $R^{17}$, $R^{17}$ and $R^{18}$, $R^{18}$ and $R^{19}$, and $R^{19}$ and $R^{20}$ each may be bonded to each other to form a cyclic structure; Ph represents a substituted or unsubstituted phenylene group; and n1 represents 0 or 1.

(2) The compound according to the item (1), wherein the group represented by the general formula (272) is a group represented by any one of the following general formulae (273) to (278):

General Formula (273)

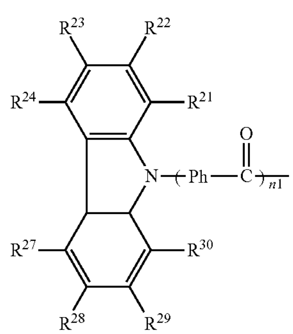

General Formula (274)

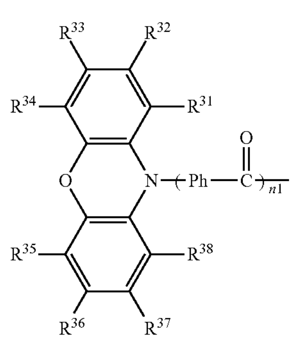

-continued

General Formula (275)

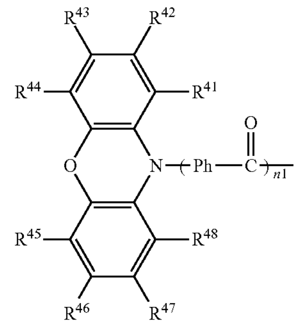

General Formula (276)

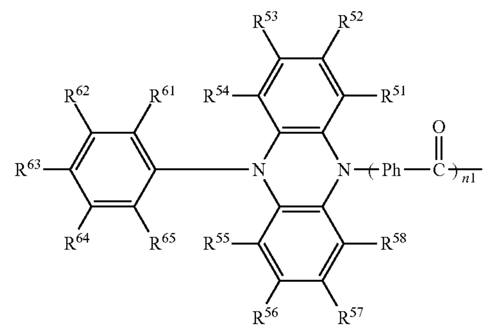

General Formula (277)

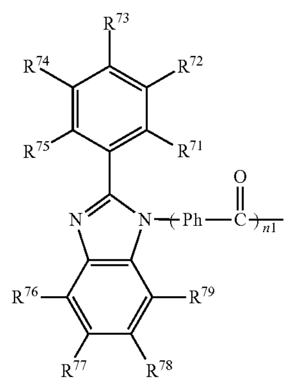

General Formula (278)

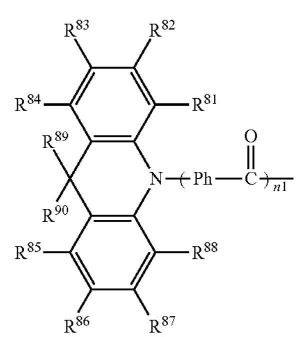

wherein the general formulae to (273) to (278), $R^{21}$ and $R^{24}$, $R^{27}$ to $R^{38}$, $R^{41}$ to $R^{48}$, $R^{51}$ to $R^{58}$, $R^{61}$ to $R^{65}$, $R^{71}$ to $R^{79}$, and $R^{81}$ to $R^{90}$ each independently represent a hydrogen atom or a substituent, in which $R^{21}$ and $R^{22}$, $R^{22}$ and $R^{23}$, $R^{23}$ and $R^{24}$, $R^{27}$ and $R^{28}$, $R^{28}$ and $R^{29}$, $R^{29}$ and $R^{30}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{64}$ and $R^{65}$, $R^{54}$ and $R^{61}$, $R^{55}$ and $R^{65}$, $R^{71}$ and $R^{72}$, $R^{72}$ and $R^{73}$, $R^{73}$ and $R^{74}$, $R^{74}$ and $R^{75}$, $R^{76}$ and $R^{77}$, $R^{77}$ and $R^{78}$, $R^{78}$ and $R^{79}$, $R^{81}$ and $R^{82}$, $R^{82}$ and $R^{83}$, $R^{83}$ and $R^{84}$, $R^{85}$ and $R^{86}$, $R^{86}$ and $R^{87}$, $R^{87}$ and $R^{88}$, and $R^{89}$ and $R^{90}$ each may be bonded to each other to form a cyclic structure; Ph represents a substituted or unsubstituted phenylene group; and n1 represents 0 or 1.

(3) The compound according to the item (1) or (2), wherein in the general formula (271), at least one of $R^1$ to $R^5$ and at least one of $R^6$ to $R^{10}$ each represent a group represented by the general formula (272).

(4) The compound according to the item (3), wherein in the general formula (271), $R^3$ and $R^8$ each represent a group represented by the general formula (272).

(5) The compound according to any one of the items (1) to (4), wherein the group represented by the general formula (272) is a group represented by the general formula (274).

(6) The compound according to any one of the items (1) to (4), wherein the group represented by the general formula (272) is a group represented by the general formula (273).

(7) The compound according to the item (6), wherein in the general formula (273), at least one of $R^{21}$ to $R^{24}$ and $R^{27}$ to $R^{30}$ represents a substituent.

(8) The compound according to the item (7), wherein the substituent is a group represented by any one of the general formulae (273) to (278).

(9) The compound according to the item (8), wherein in the general formula (273), at least one of $R^{23}$ and $R^{28}$ represents the substituent.

Examples of the compound include the following compounds.

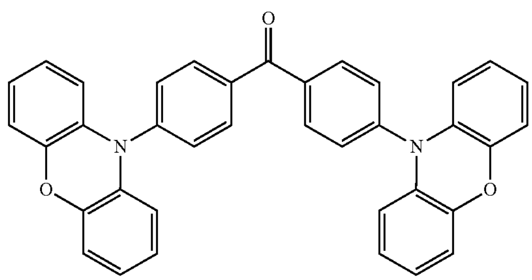

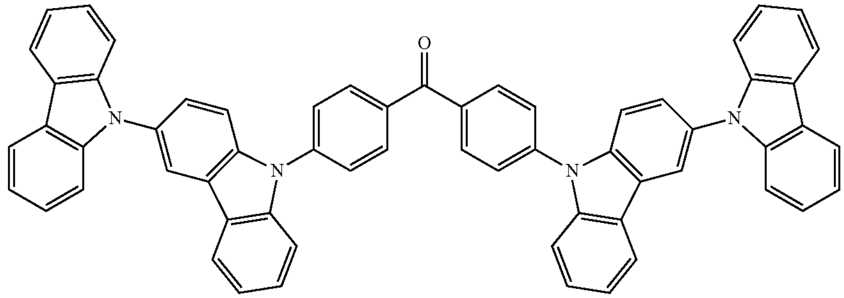

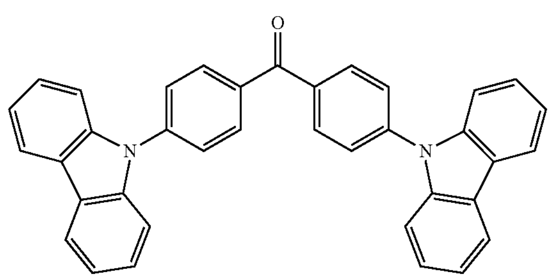

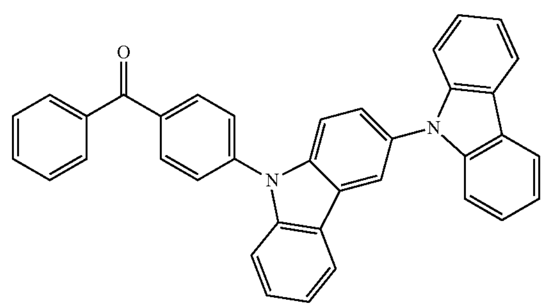

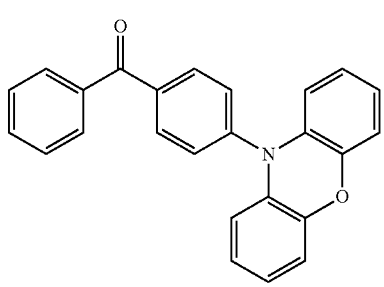

-continued
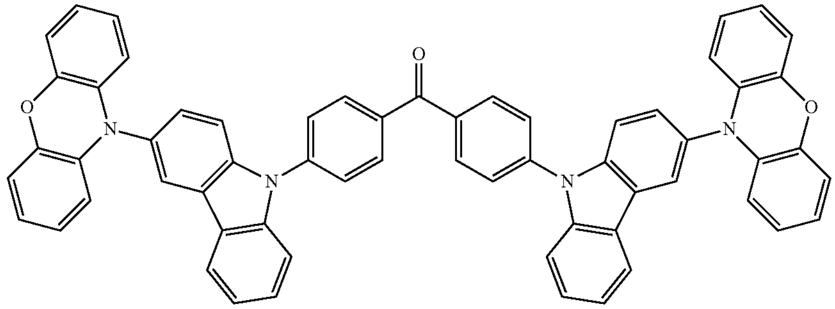
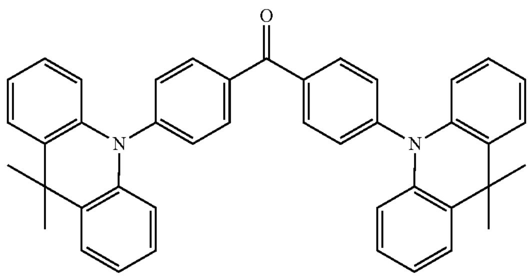
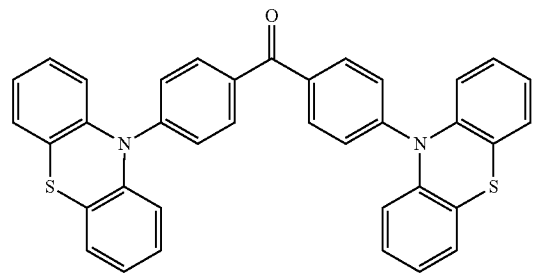
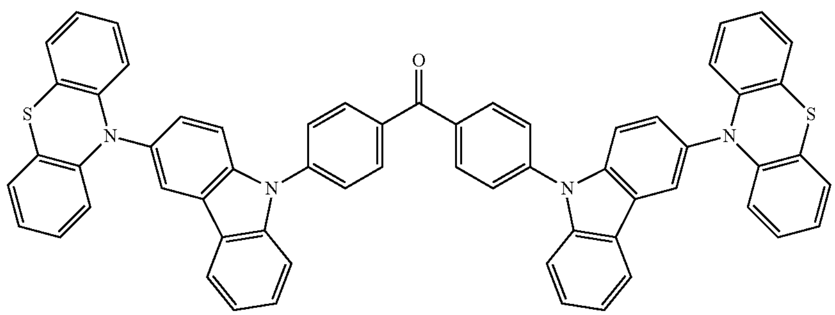
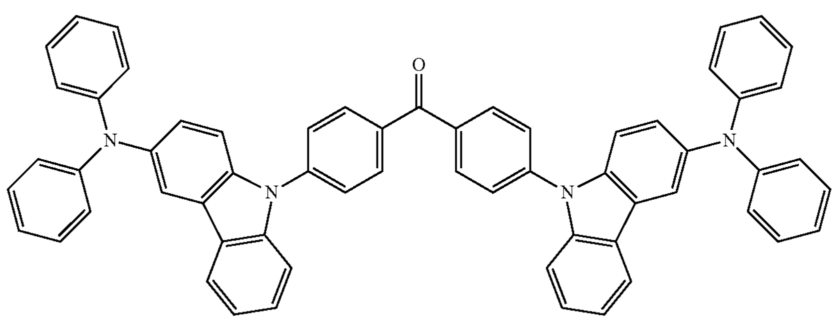
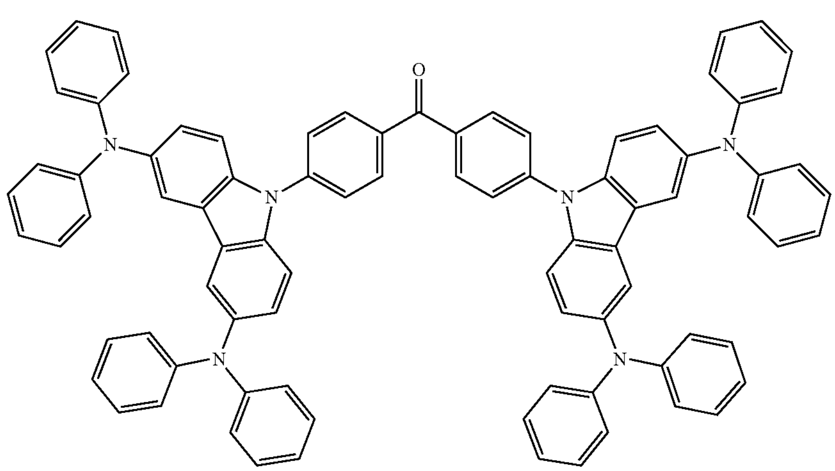

-continued
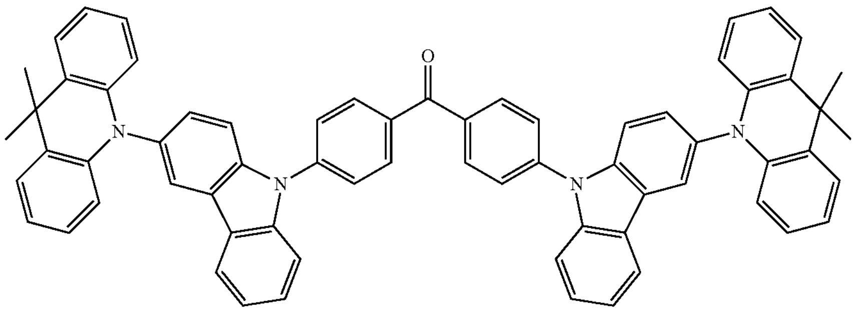
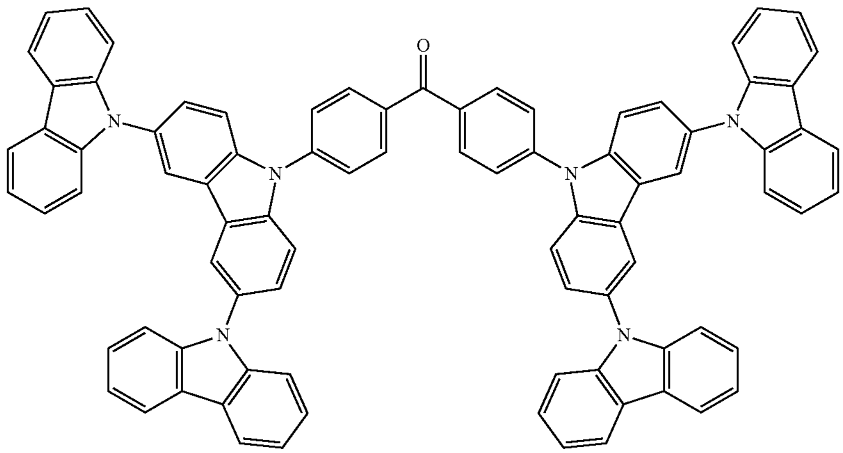
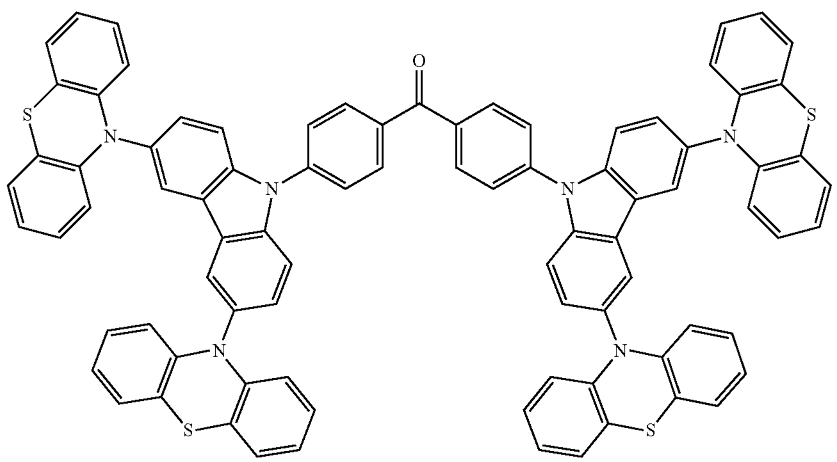
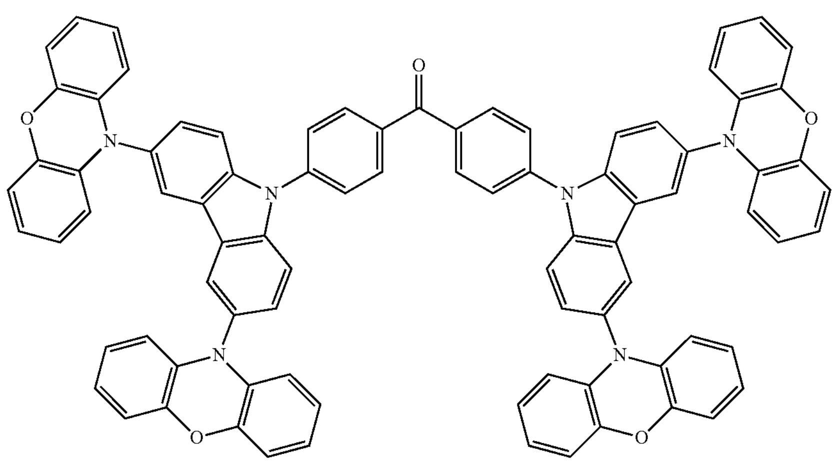

-continued
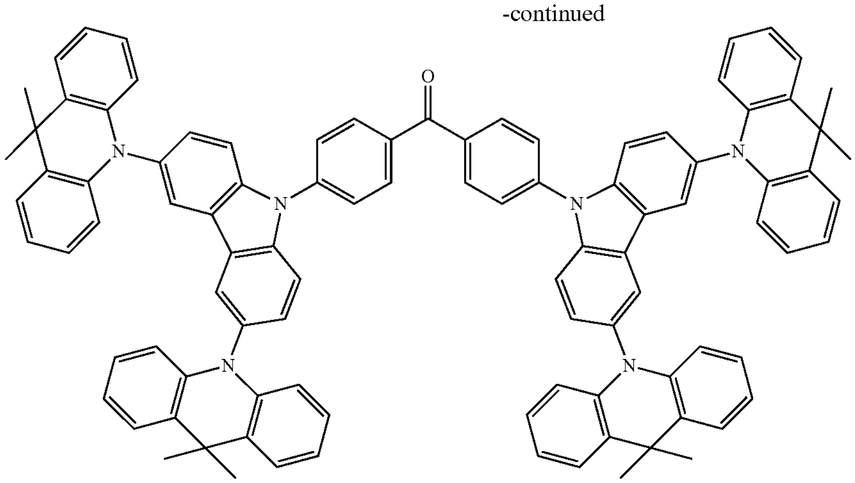
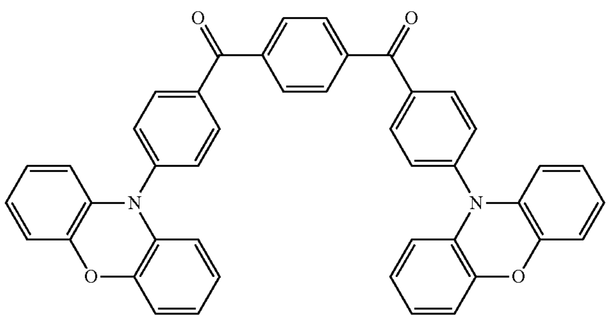
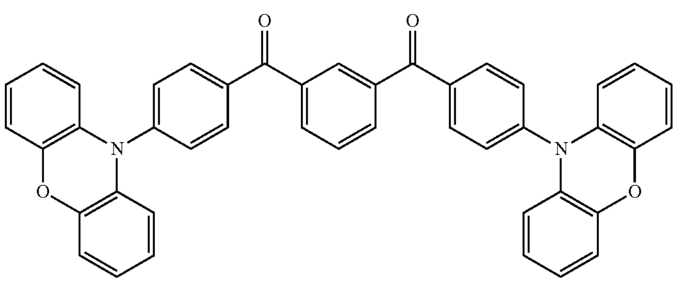
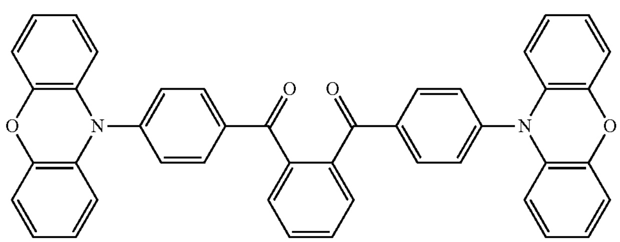
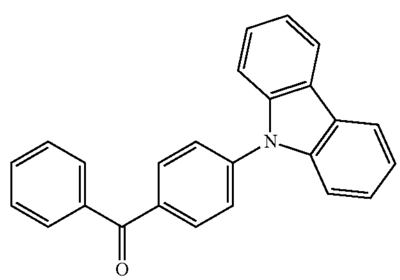
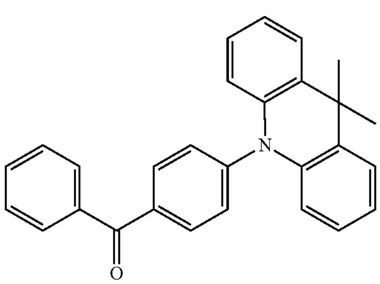
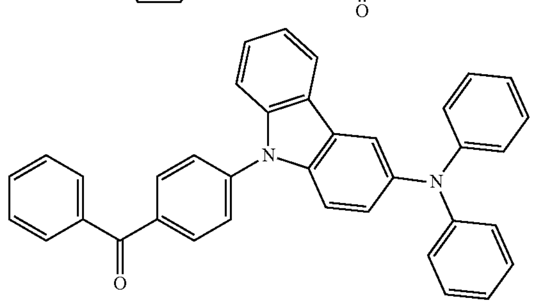

-continued
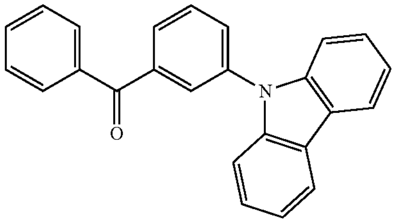
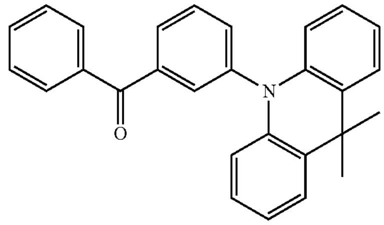
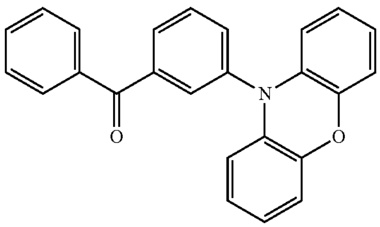
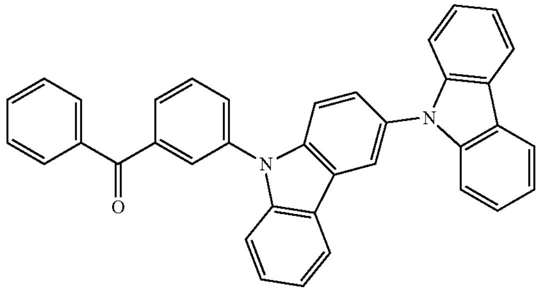
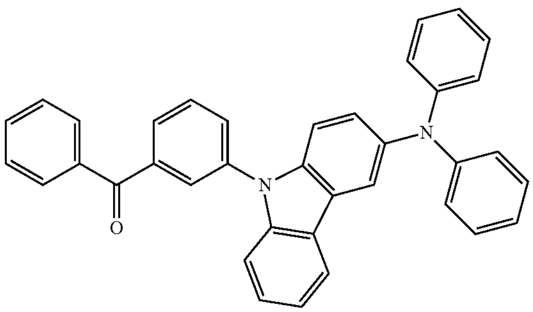
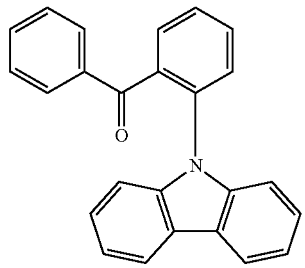
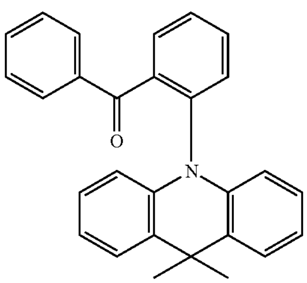
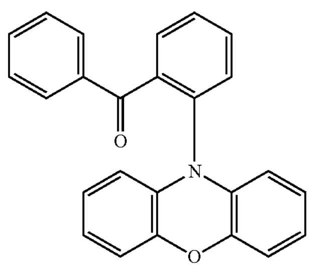
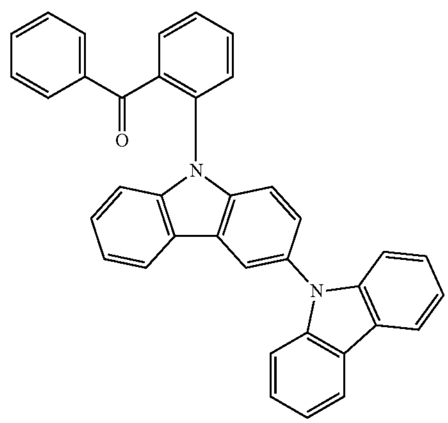
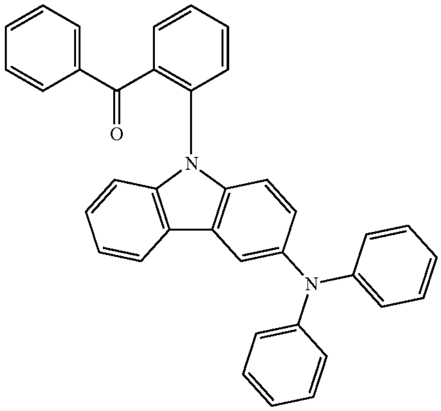
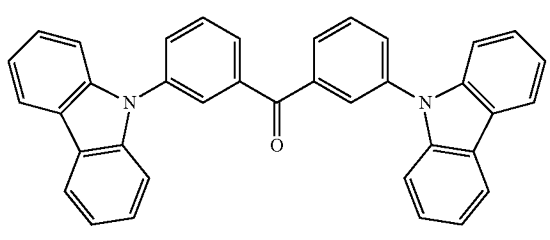

-continued
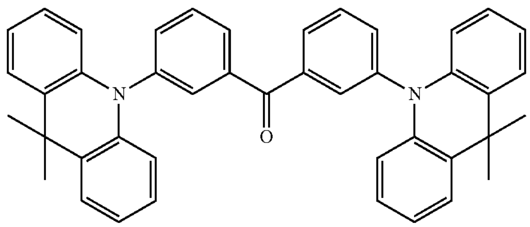
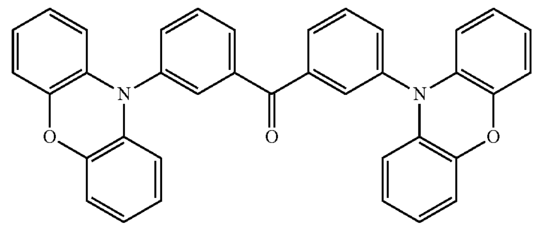
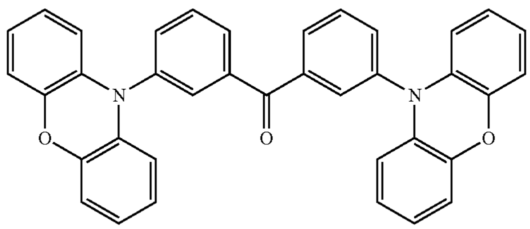
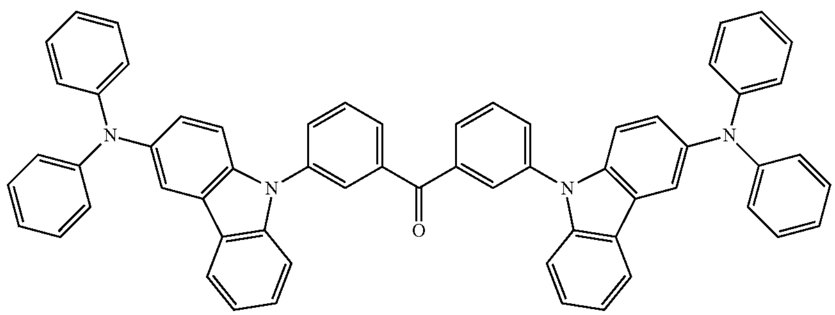
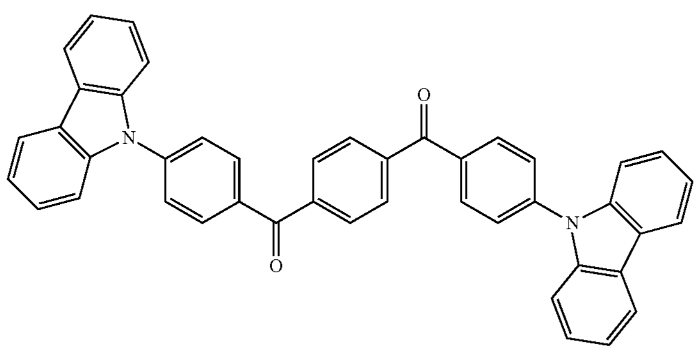
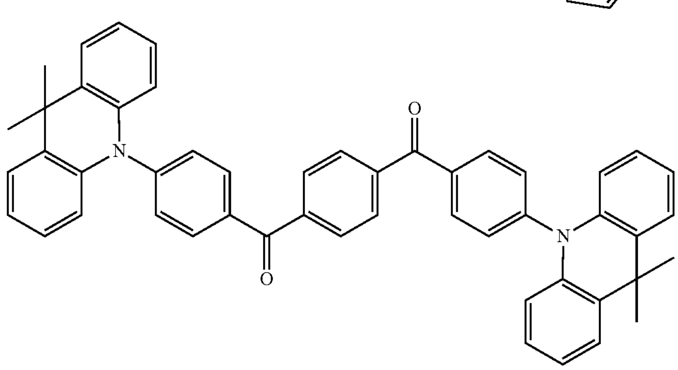

-continued
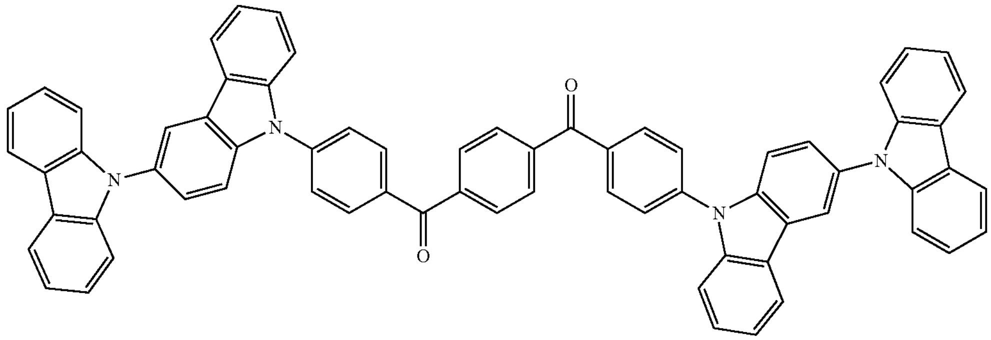
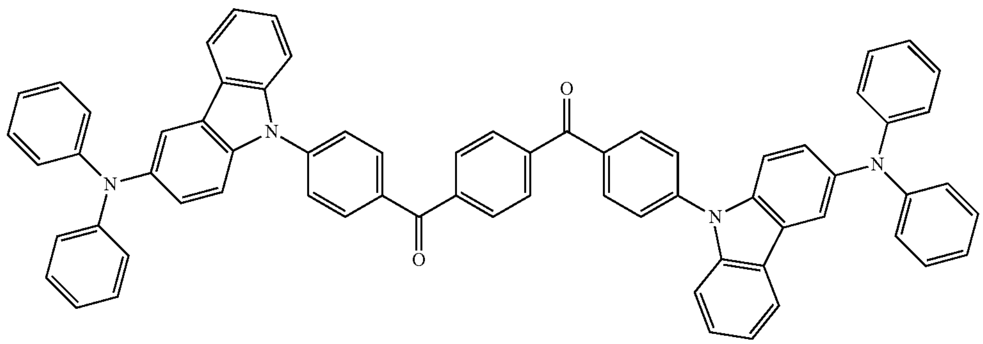
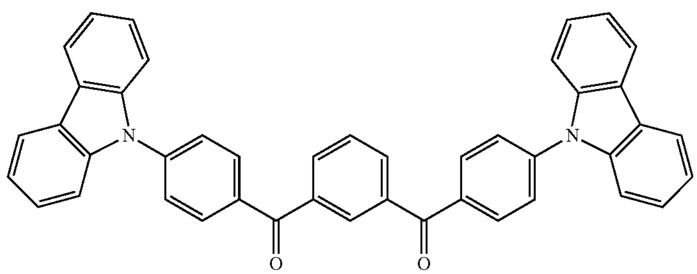
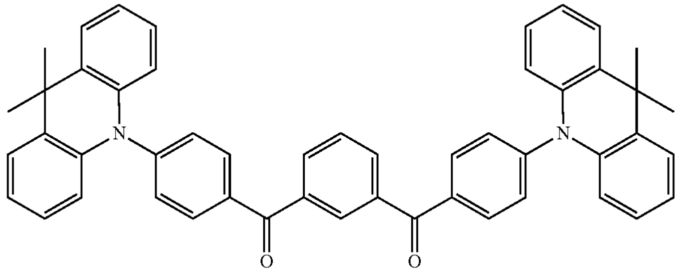
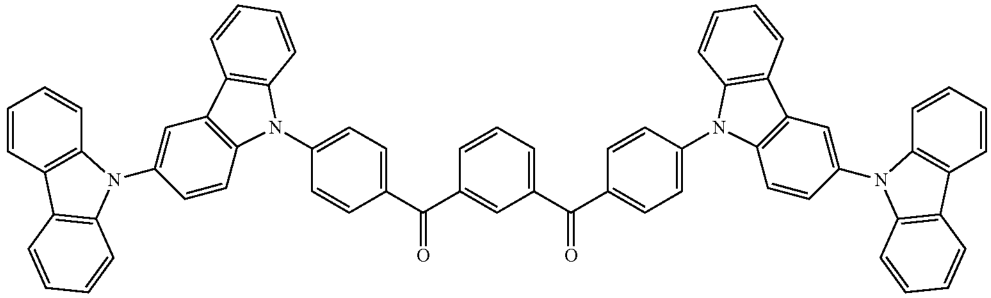

-continued
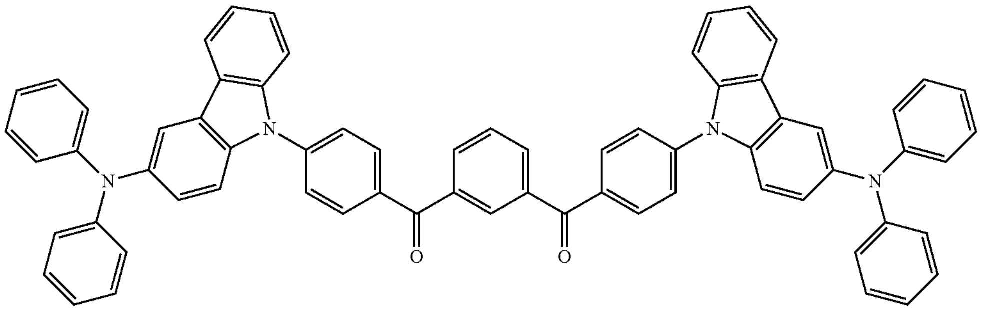
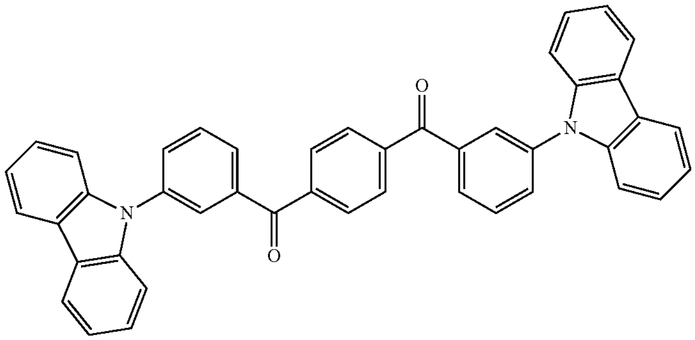
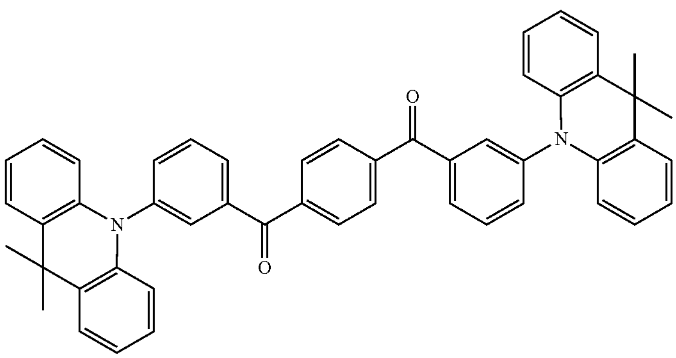
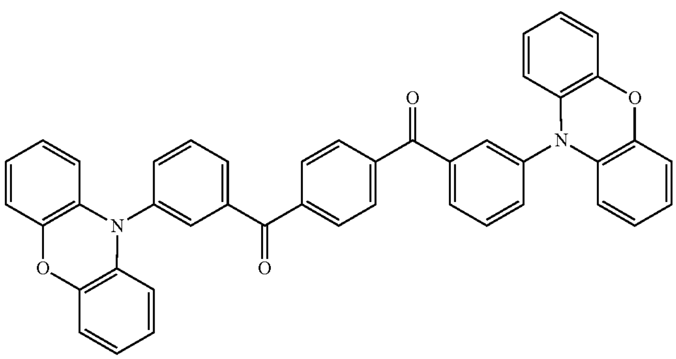
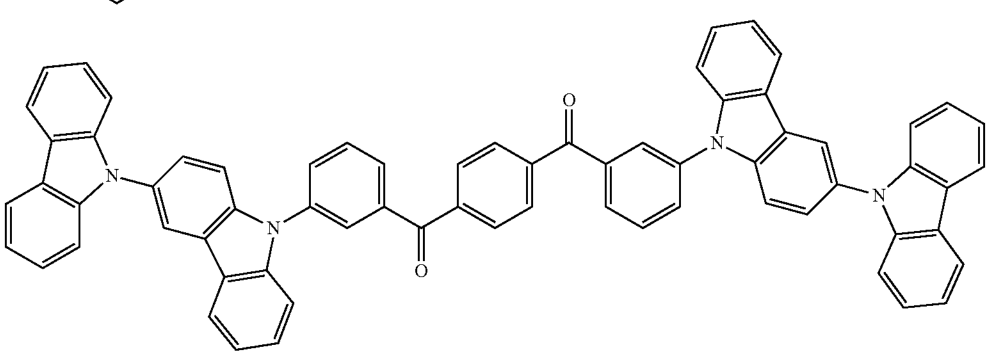

-continued
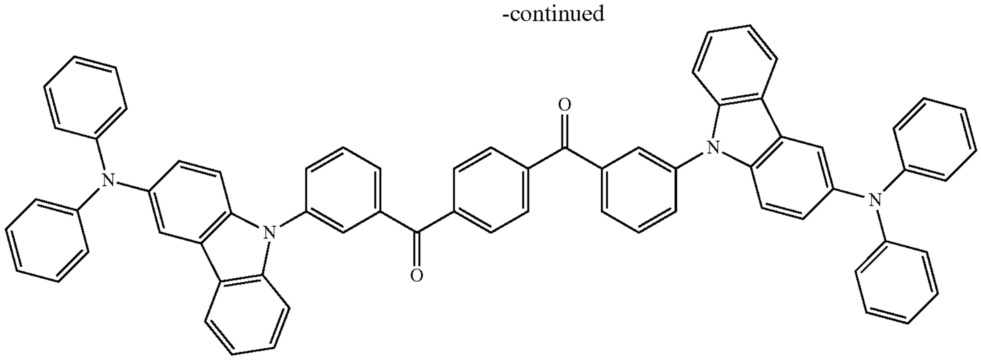
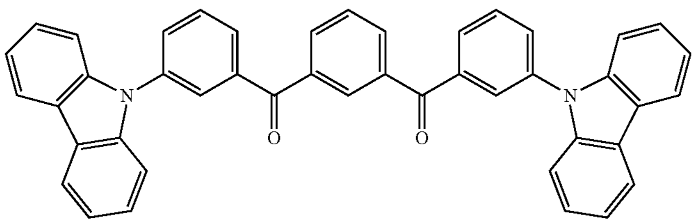
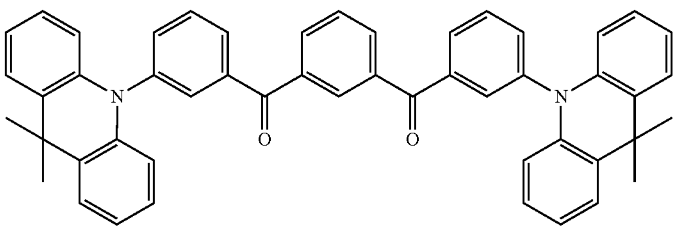
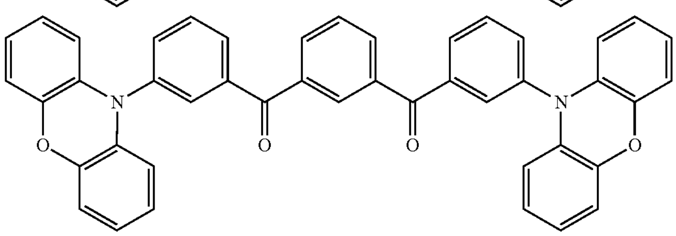
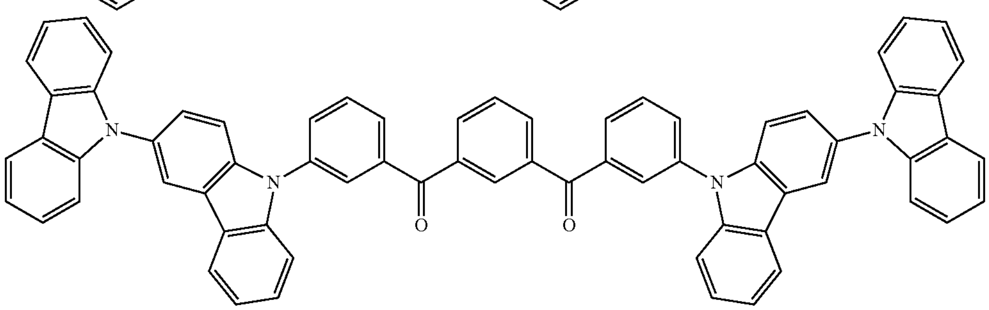
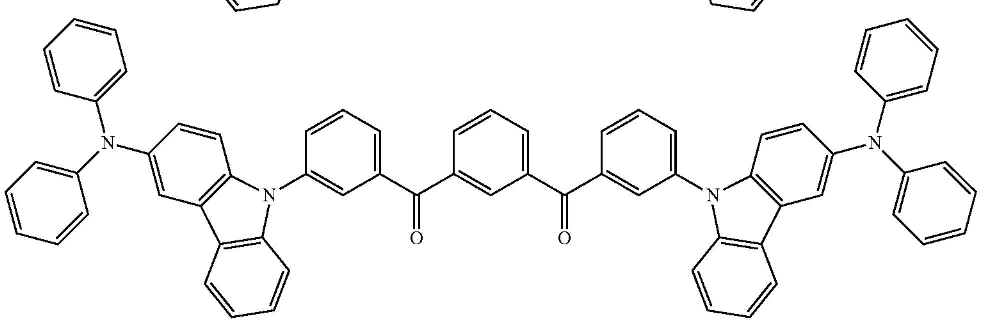

-continued
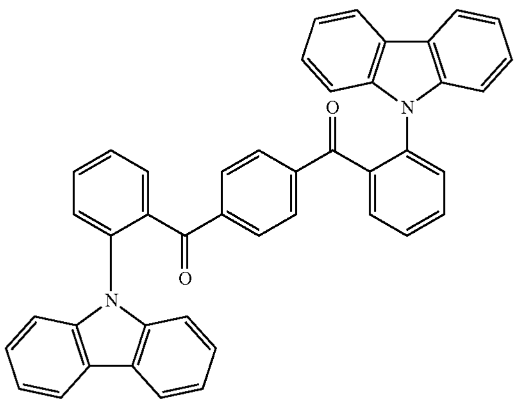
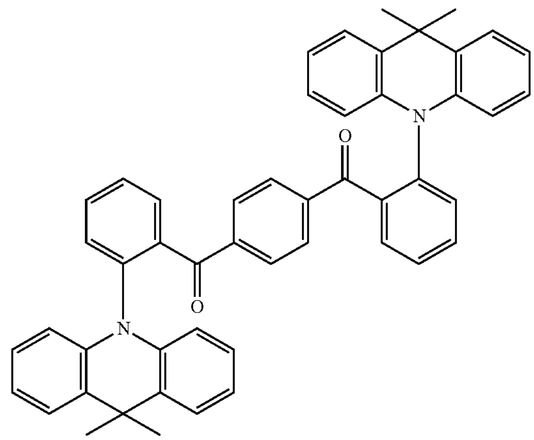
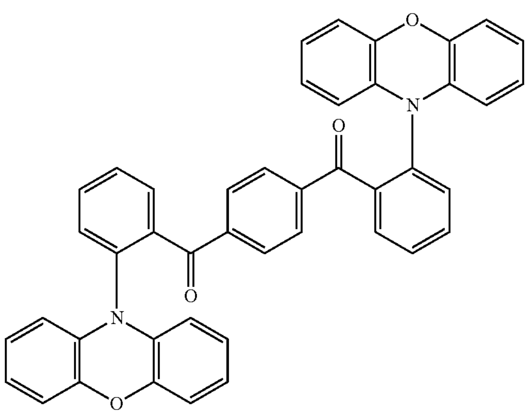
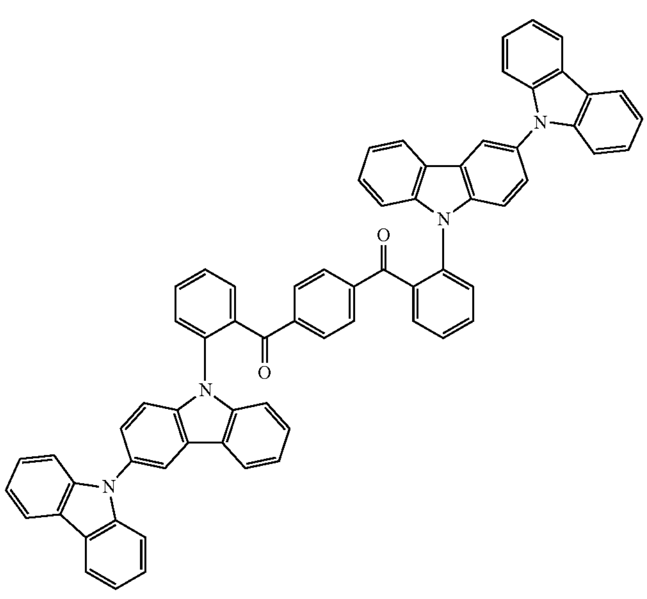

-continued
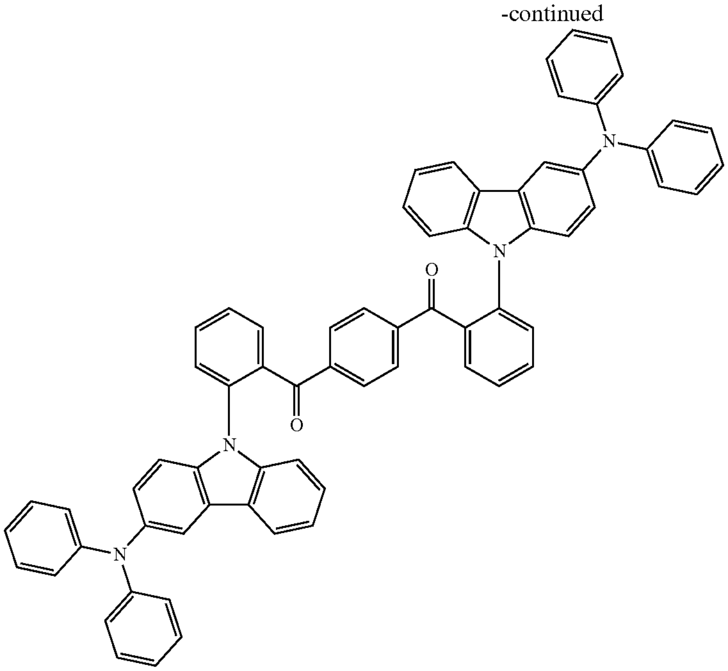
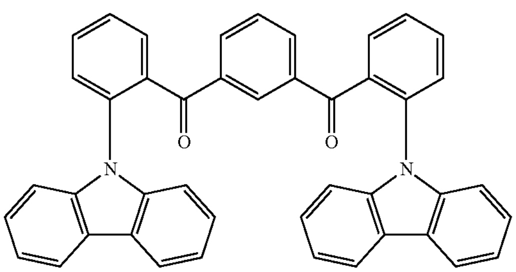
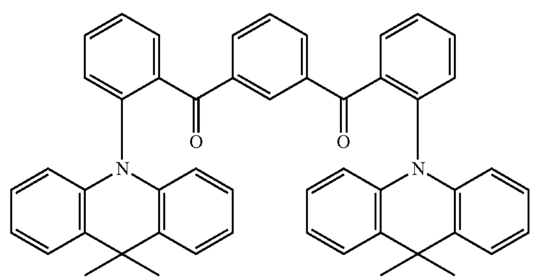
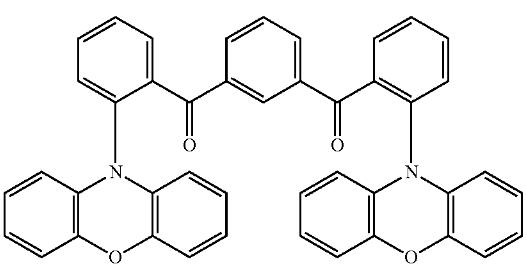
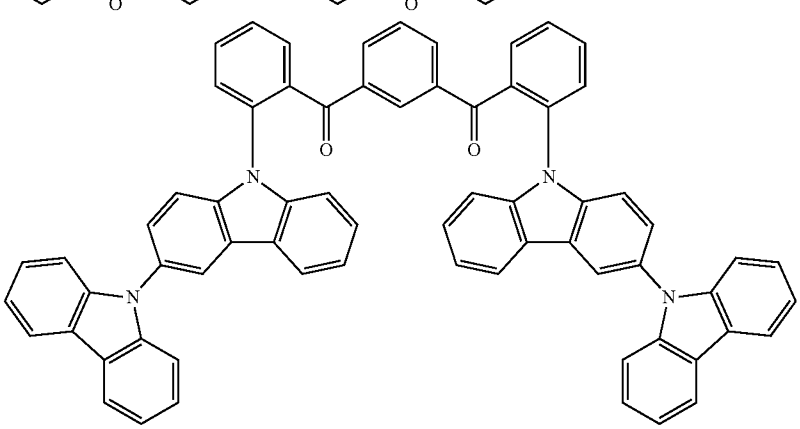

-continued
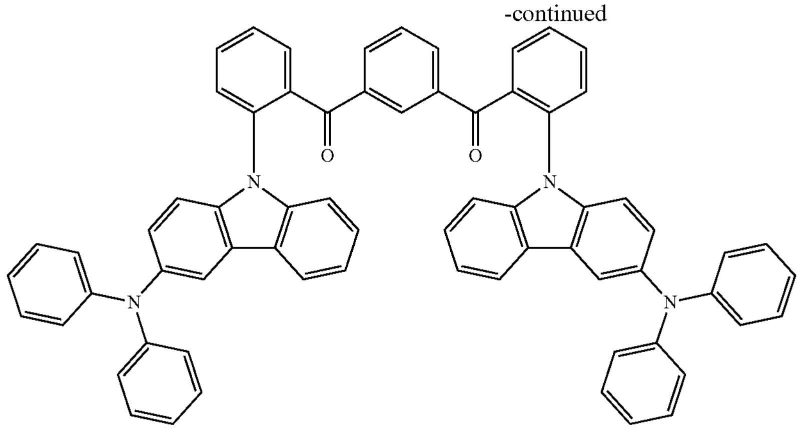
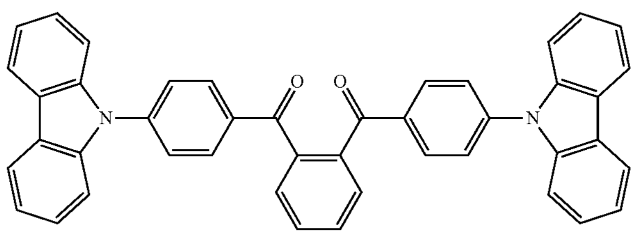
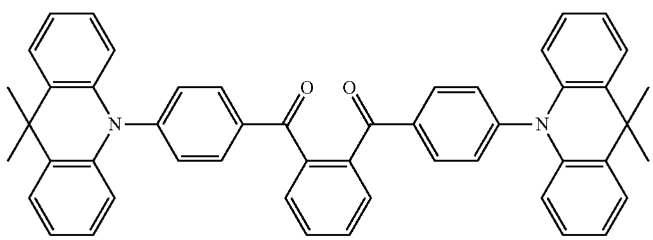
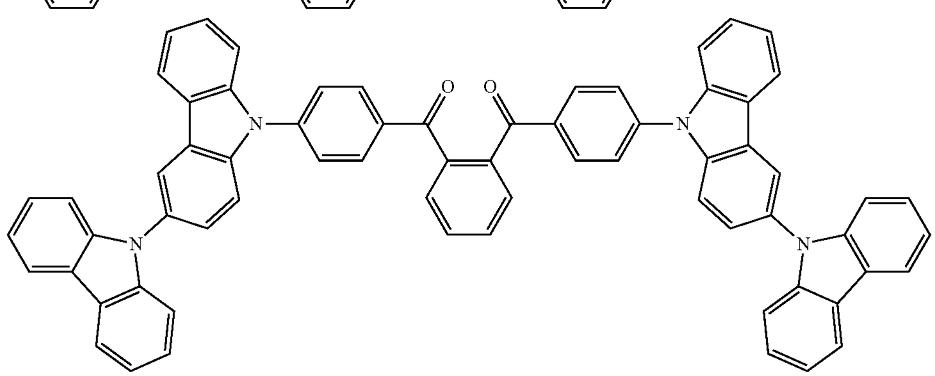
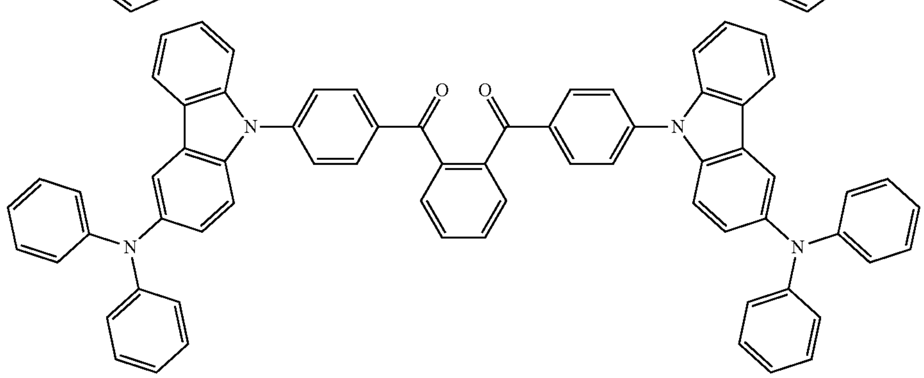

-continued
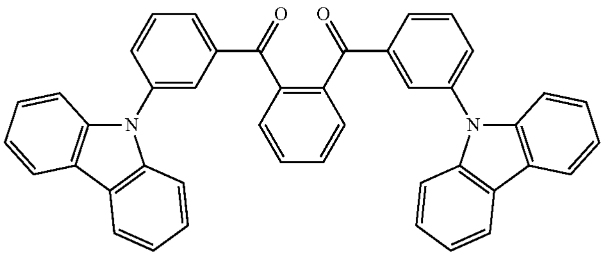
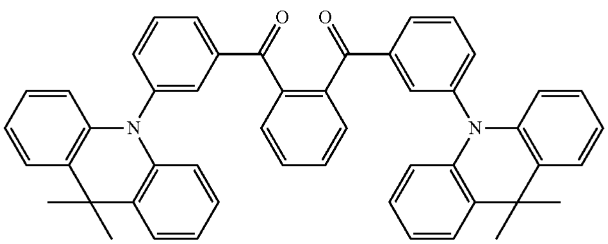
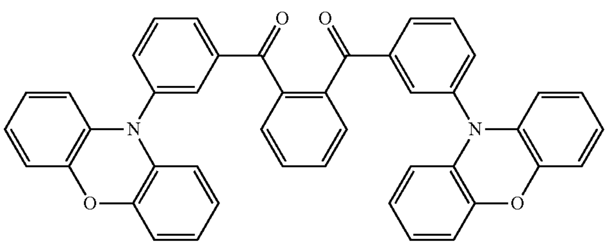
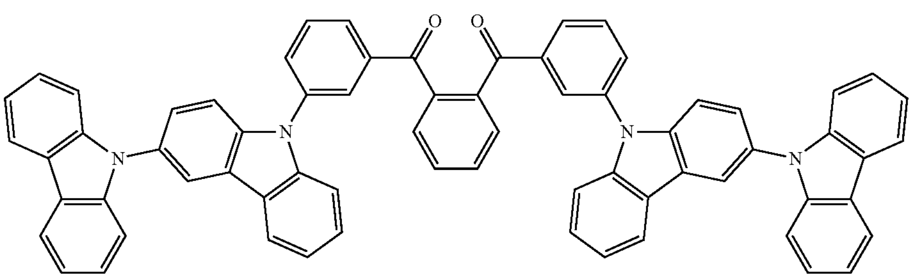
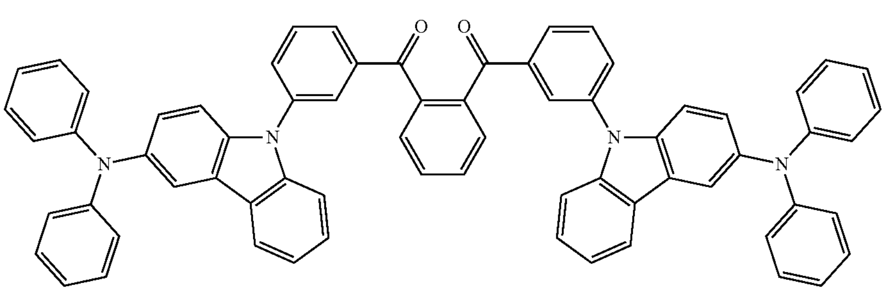

-continued
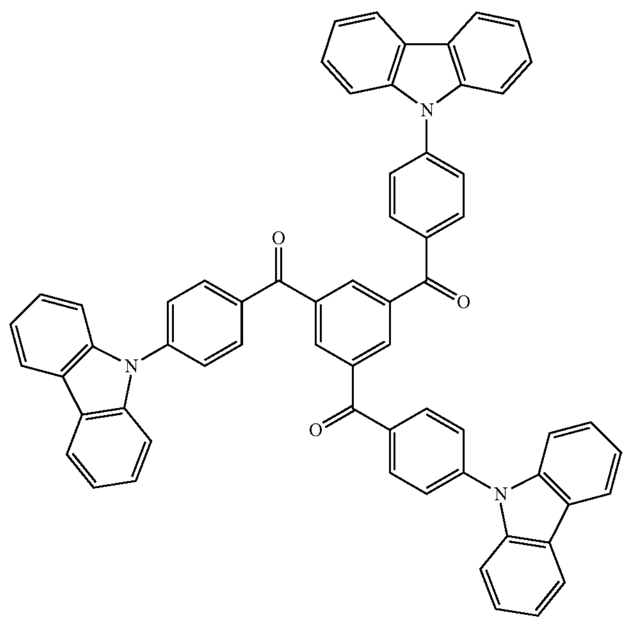
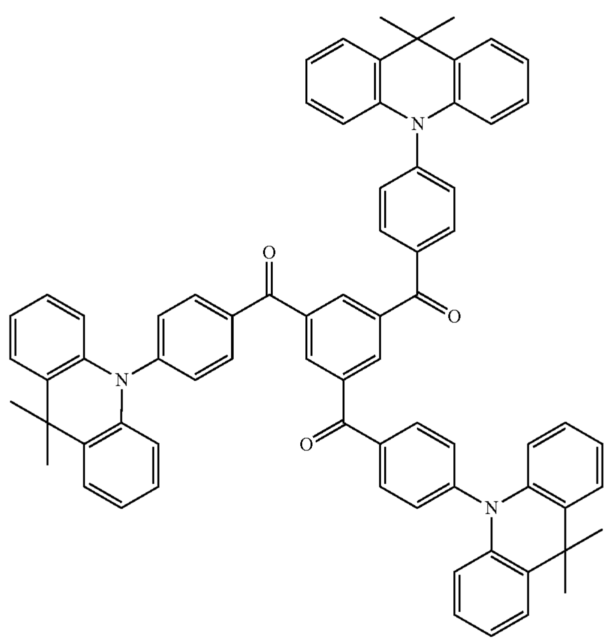

-continued
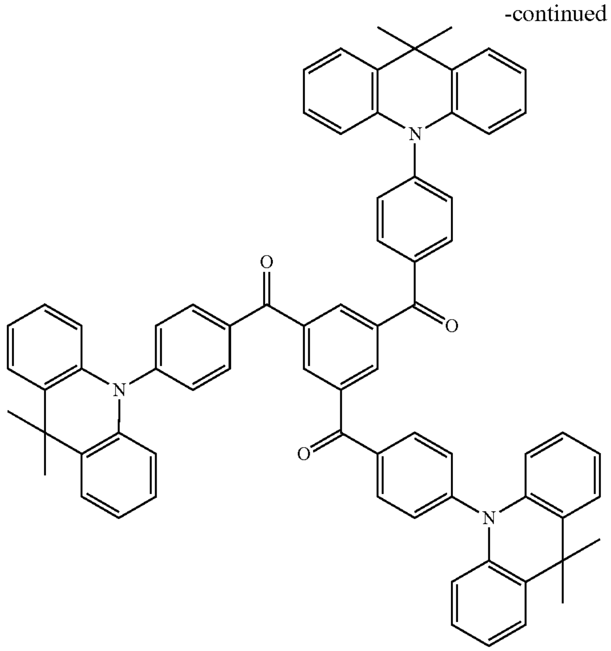
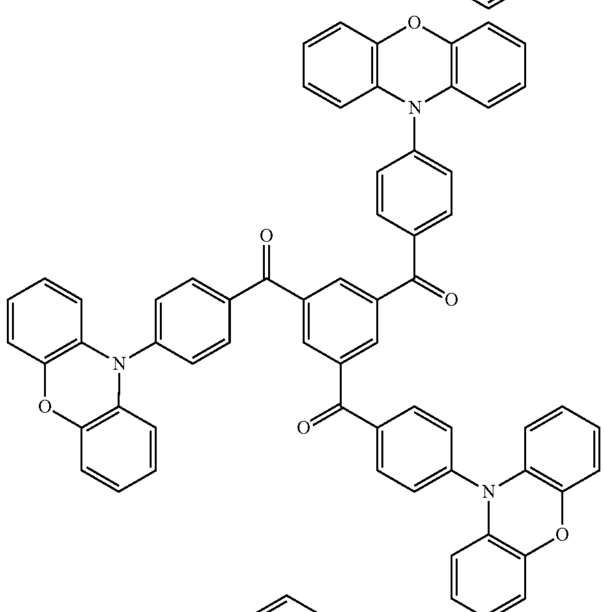
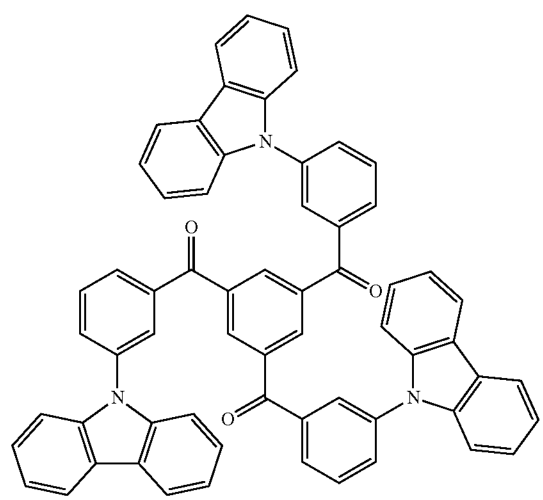
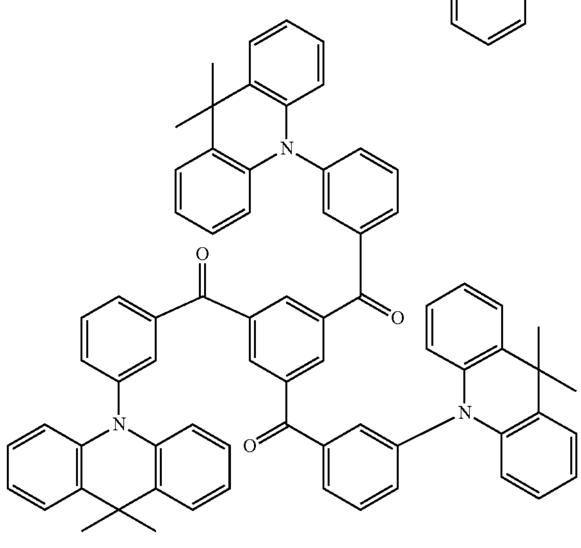

-continued
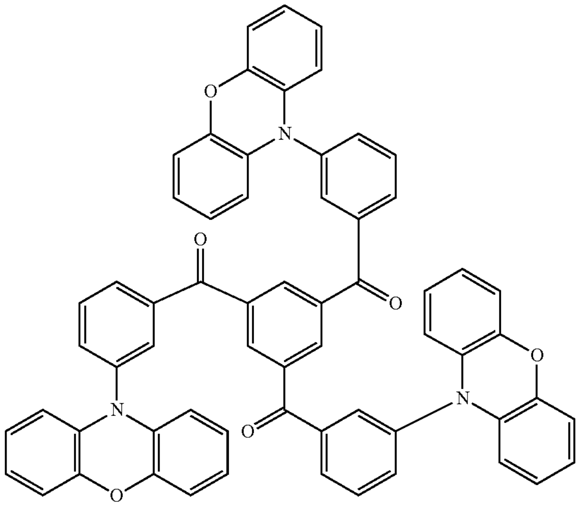
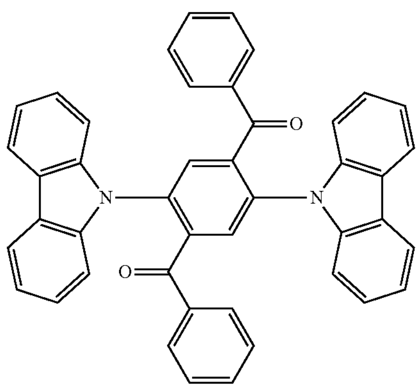
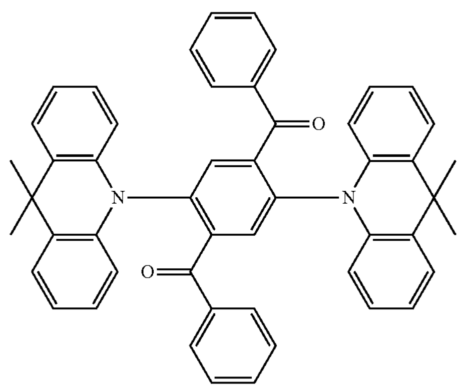
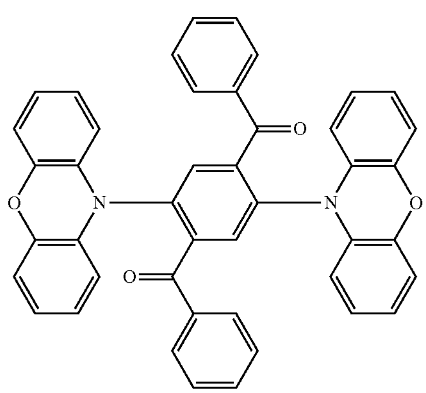
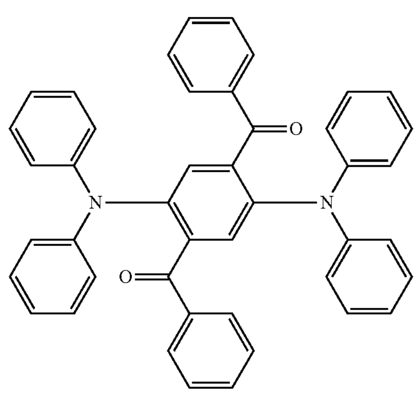

-continued
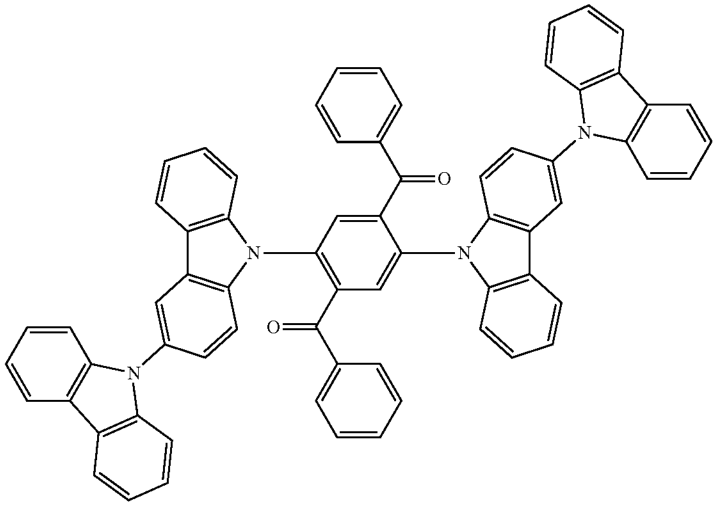
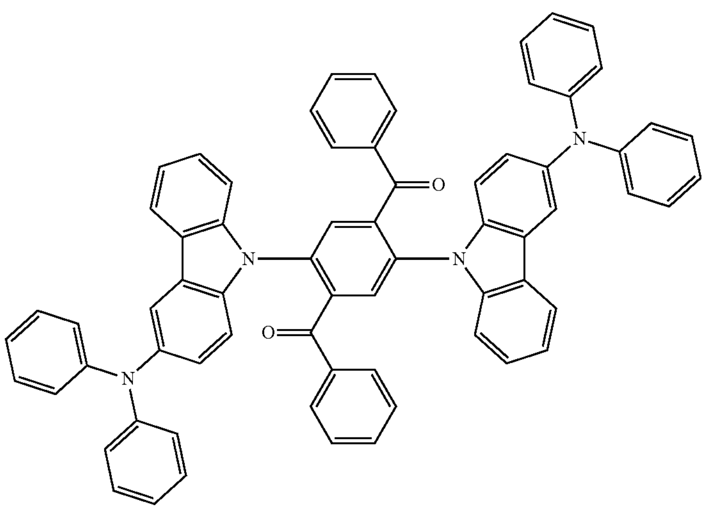
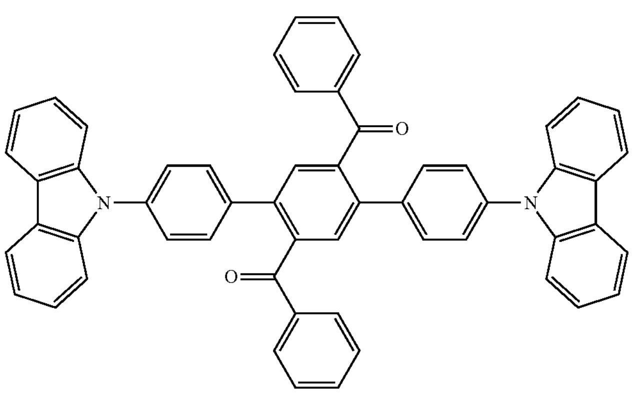

-continued

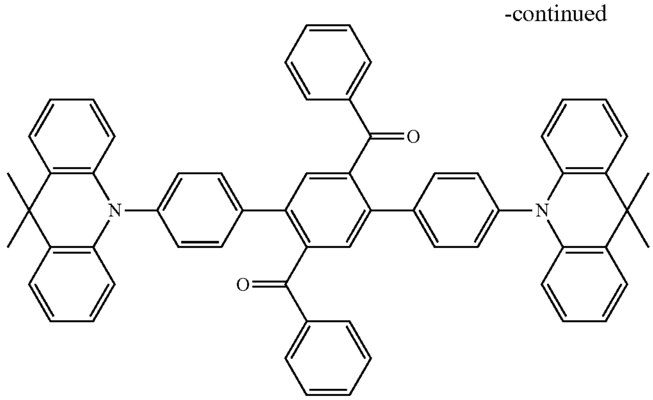

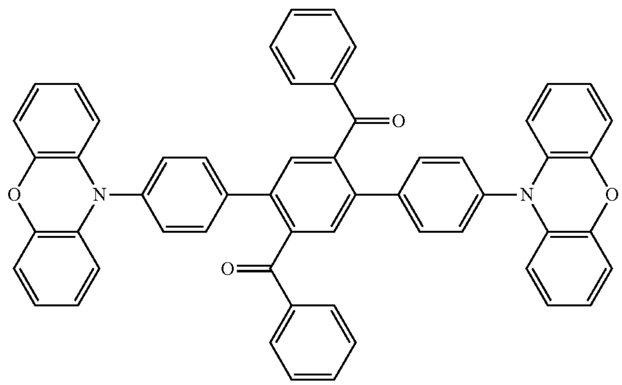

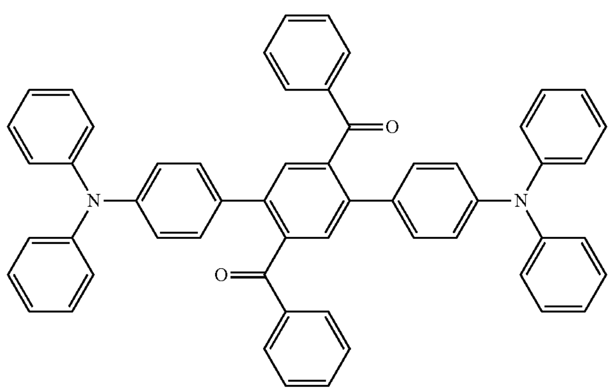

Examples of the preferred light emitting material include the following compounds.

(1) A compound represented by the following general formula (281):

General Formula (281)

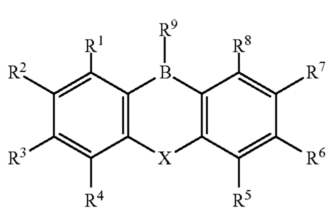

wherein in the general formula (281), X represents an oxygen atom or a sulfur atom; $R^1$ to $R^8$ each independently represent a hydrogen atom or a substituent, provided that at least one of $R^1$ to $R^8$ represents a group represented by any one of the following general formulae (282) to (287), and $R^1$ and $R^2$, $R^2$ and $R^3$, $R^3$ and $R^4$, $R^5$ and $R^6$, $R^6$ and $R^7$, $R^7$ and $R^8$, $R^8$ and $R^9$, and $R^9$ and $R^1$ may be bonded to each other to form a cyclic structure; and $R^9$ represents a substituent, provided that when $R^9$ contains an atom that contains a lone electron pair without forming a single bond to the boron atom, the atom may form a cyclic structure through a coordination bond with the boron atom:

General Formula (282)

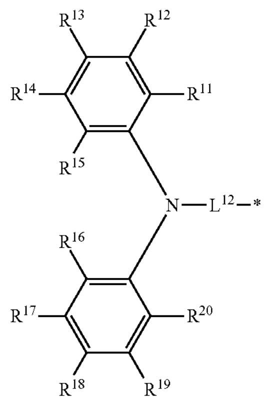

General Formula (283)

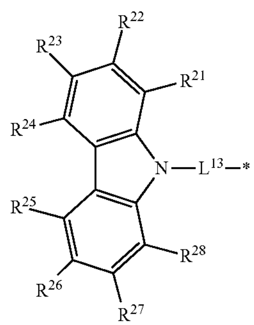

General Formula (284)

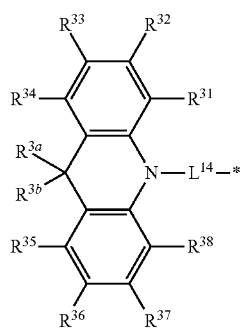

General Formula (285)

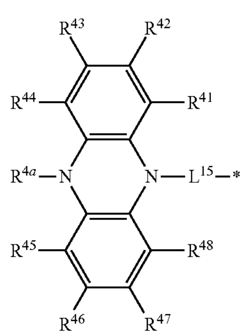

-continued

General Formula (286)

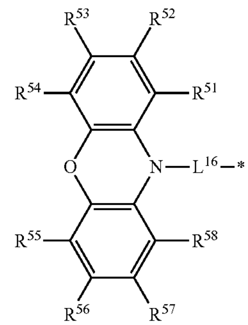

General Formula (287)

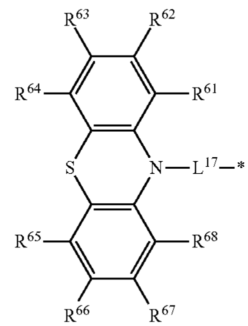

wherein in the general formulae (282) to (287), $L^{12}$ to $L^{17}$ each independently represent a single bond or a divalent linking group; * represents the position bonded to the benzene ring in the general formula (281); and $R^{11}$ to $R^{20}$, $R^{21}$ to $R^{28}$, $R^{31}$ to $R^{38}$, $R^{3a}$, $R^{3b}$, $R^{41}$ to $R^{48}$, $R^{4a}$, $R^{51}$ to $R^{58}$, $R^{61}$ to $R^{68}$ each independently represent a hydrogen atom or a substituent, in which $R^{11}$ and $R^{12}$, $R^{12}$ and $R^{13}$, $R^{13}$ and $R^{14}$, $R^{14}$ and $R^{15}$, $R^{16}$ and $R^{17}$, $R^{17}$ and $R^{18}$, $R^{18}$ and $R^{19}$, $R^{19}$ and $R^{20}$, $R^{21}$ and $R^{22}$, $R^{22}$ and $R^{23}$, $R^{23}$ and $R^{24}$, $R^{24}$ and $R^{25}$, $R^{25}$ and $R^{26}$, $R^{26}$ and $R^{27}$, $R^{27}$ and $R^{28}$, $R^{31}$ and $R^{32}$, $R^{32}$ and $R^{33}$, $R^{33}$ and $R^{34}$, $R^{35}$ and $R^{36}$, $R^{36}$ and $R^{37}$, $R^{37}$ and $R^{38}$, $R^{3a}$ and $R^{3b}$, $R^{41}$ and $R^{42}$, $R^{42}$ and $R^{43}$, $R^{43}$ and $R^{44}$, $R^{45}$ and $R^{46}$, $R^{46}$ and $R^{47}$, $R^{47}$ and $R^{48}$, $R^{51}$ and $R^{52}$, $R^{52}$ and $R^{53}$, $R^{53}$ and $R^{54}$, $R^{55}$ and $R^{56}$, $R^{56}$ and $R^{57}$, $R^{57}$ and $R^{58}$, $R^{61}$ and $R^{62}$, $R^{62}$ and $R^{63}$, $R^{63}$ and $R^{64}$, $R^{65}$ and $R^{66}$, $R^{66}$ and $R^{67}$, $R^{67}$ and $R^{68}$ each may be bonded to each other to form a cyclic structure.

(2) The compound according to the item (1), wherein in the general formula (281), at least one of $R^1$ to $R^8$ represents a group represented by any one of the general formulae (283) to (287).

(3) The compound according to the item (1) or (2), wherein in the case where at least one of $R^1$ to $R^8$ in the general formula (281) represents a group represented by the general formula (283), at least one of $R^{21}$ to $R^{28}$ in the general formula (283) represents a substituent.

(4) The compound according to any one of the items (1) to (3), wherein in the general formula (281), at least one of $R^2$, $R^3$, $R^6$, and $R^7$ represents a group represented by any one of the general formulae (282) to (287).

(5) The compound according so the item (4), wherein in the general formula (281), at least one of $R^3$ to $R^5$ represents a group represented by any one of the general formulae (282) to (287).

(6) The compound according to the item (5), wherein in the general formula (281), $R^3$ and $R^5$ each independently represent a group represented by any one of the general formulae (282) to (287).

(7) The compound according to any one of the items (1) to (6), wherein at least one of $R^{11}$ to $R^{20}$ in the general formula (282), at least one of $R^{21}$ to $R^{28}$ in the general formula (283), at least one of $R^{31}$ to $R^{38}$ and at least one of $R^{3a}$ and $R^{3b}$ in the general formula (284), at least one of $R^{41}$ to $R^{48}$ in the general formula (285), at least one of $R^{51}$ to $R^{58}$ in the general formula (286), and at least one of $R^{61}$ to $R^{68}$ in the general formula (287) each represent a substituent.

(8) The compound according to the item (7), wherein at least one of $R^{13}$ and $R^{18}$ in the general formula (282), at least one of $R^{23}$ and $R^{26}$ in the general formula (283), at least one of $R^{33}$ and $R^{36}$ and at least one of $R^{3a}$ and $R^{3b}$ in the general formula (284), at least one of $R^{43}$ and $R^{46}$ in the general formula (285), at least one of $R^{53}$ and $R^{56}$ in the general formula (286), and at least one of $R^{63}$ and $R^{66}$ in the general formula (287) each represent a substituent.

(9) The compound according to the item (8), wherein at least one of $R^{13}$ and $R^{18}$ in the general formula (282), at least one of $R^{23}$ and $R^{26}$ in the general formula (283), at least one of $R^{33}$ and $R^{36}$ and at least one of $R^{3a}$ and $R^{3b}$ in the general formula (284), at least one of $R^{43}$ and $R^{46}$ in the general formula (285), at least one of $R^{53}$ and $R^{56}$ in the general formula (286), and at least one of $R^{63}$ and $R^{66}$ in the general formula (287) each represent a group represented by any one of the general formulae (282) to (287).

(10) The compound according to any one of the items (1) to (9), wherein in the general formulae (282) to (287), $L^{12}$ to $L^{17}$ each represent a single bond.

(11) The compound according to any one of the items (1) to (10), wherein in the general formula (281), X represents an oxygen atom.

(12) The compound according to any one of the items (1) to (11), wherein in the general formula (281), $R^9$ represents a group represented by the following general formula (a):

General Formula (a)

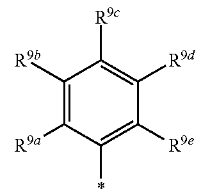

wherein in the general formula (a), * represents the position bonded to the boron atom in the general formula (281); and $R^{9a}$, $R^{9b}$, $R^{9c}$, $R^{9d}$, and $R^{9e}$ each independently represent a hydrogen atom or a substituent, in which $R^{9a}$ and $R^{9b}$, $R^{9b}$ and $R^{9c}$, $R^{9c}$ and $R^{9d}$, and $R^{9d}$ and $R^{9e}$ may be bonded to each other to form a cyclic structure.

(13) The compound according to the item (12), wherein in the general formula (a), $R^{9a}$ and $R^{9b}$ each represent a substituent.

(14) The compound according to any one of the items (1) to (13), wherein in the general formula (281), at least one of $R^1$ to $R^8$ represents a group represented by the general formula (284).

(15) The compound according to any one of the items (1) to (4), and (7) to (14), wherein in the general formula (281), $R^3$ and $R^6$, or $R^2$ and $R^7$ each represent a group represented by the general formula (284).

(16) The compound according to the item (14) or (15), wherein in the general formula (284), $R^{3a}$ and $R^{3b}$ each represent a substituent.

(17) The compound according to any one of the items (14) to (16), wherein the substituent is an alkyl group having from 1 to 15 carbon atoms or a phenyl group.

(18) The compound according to any one of the items (14) to (16), wherein in the general formula (284), $R^{3a}$ and $R^{3b}$ are bonded to each other to form a cyclic structure.

Examples of the compound include the following compounds.

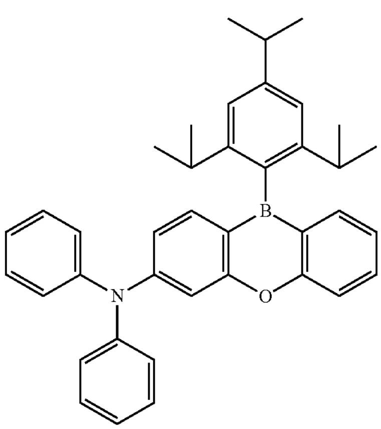

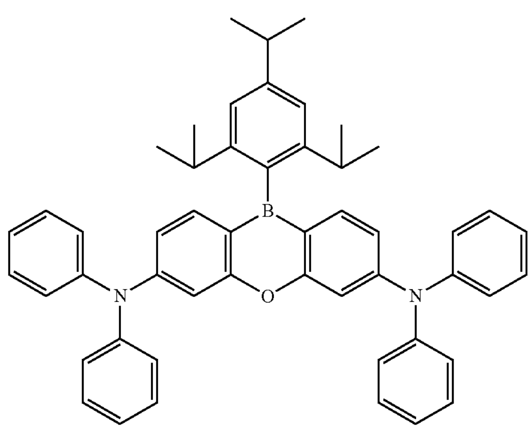

-continued
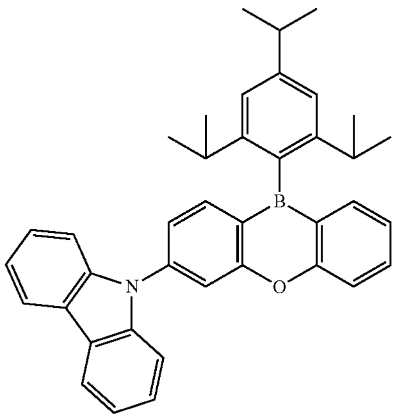
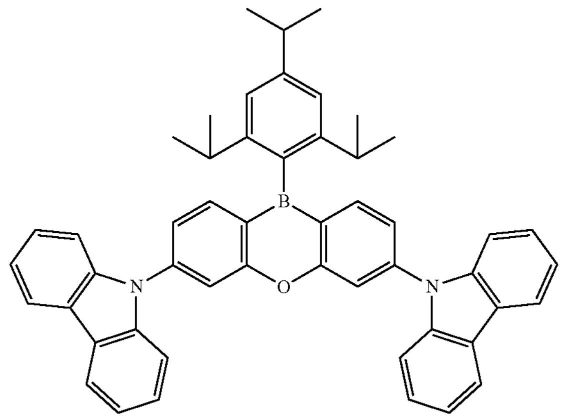
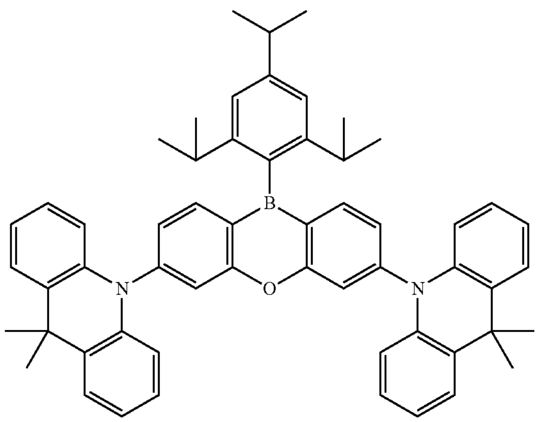
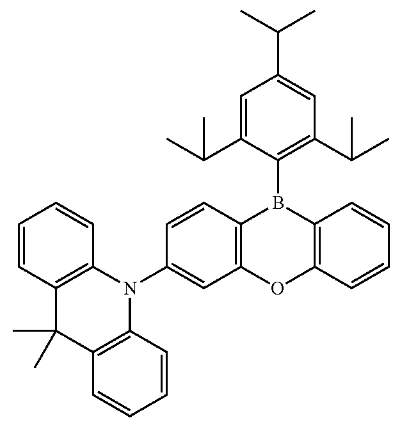
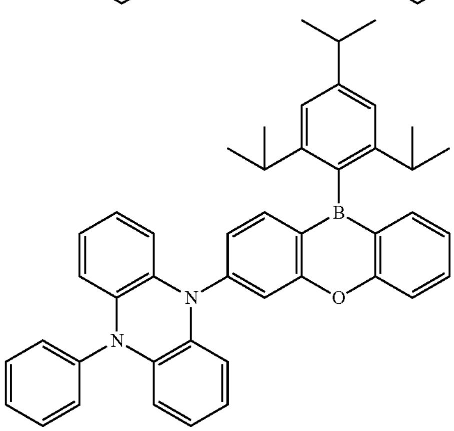
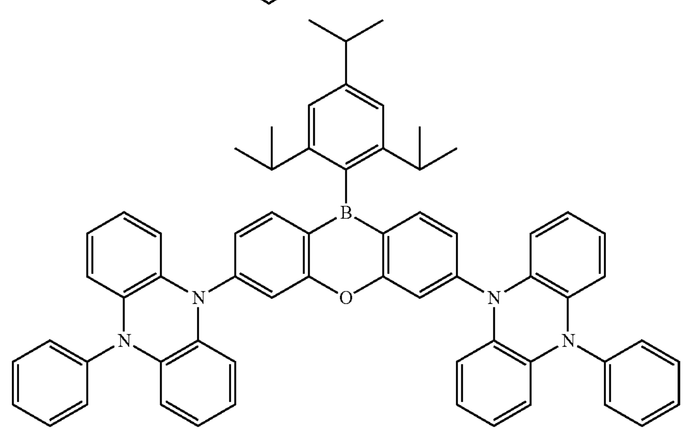
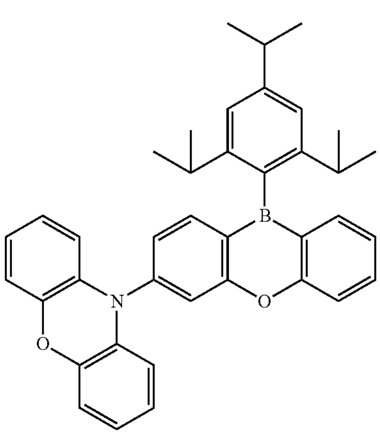
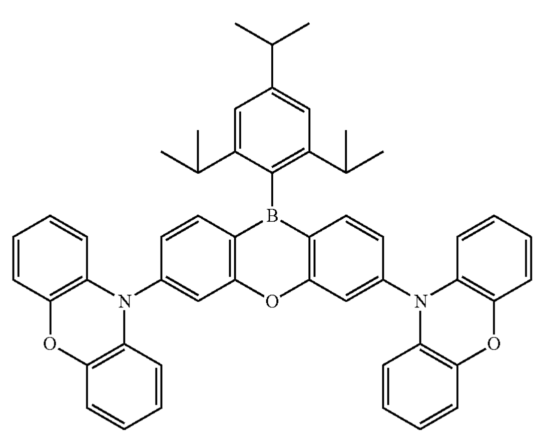

-continued
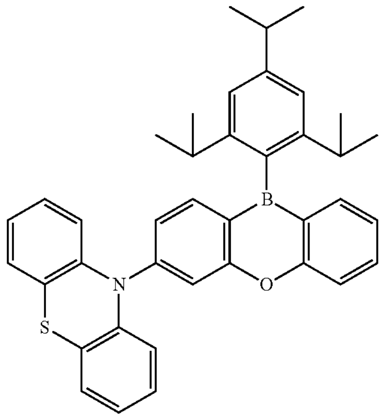
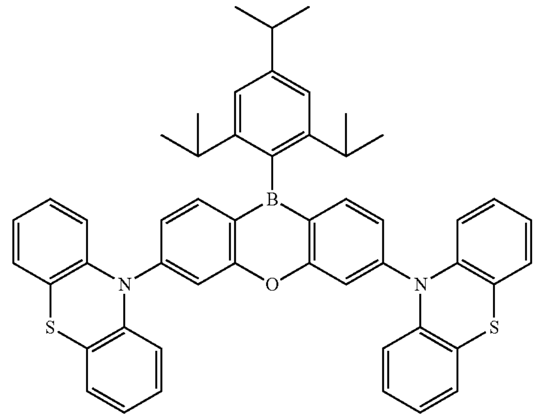
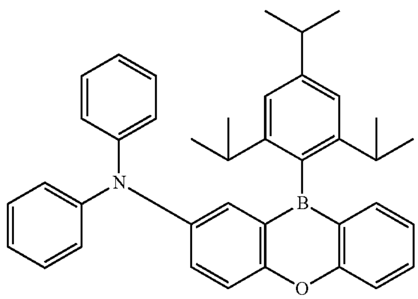
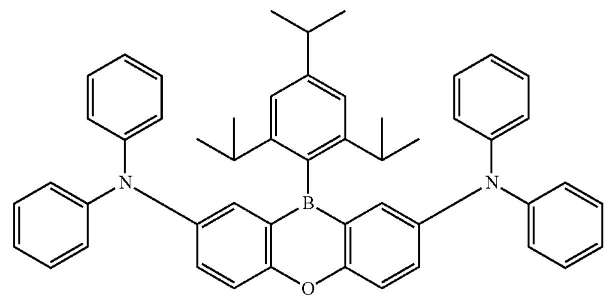
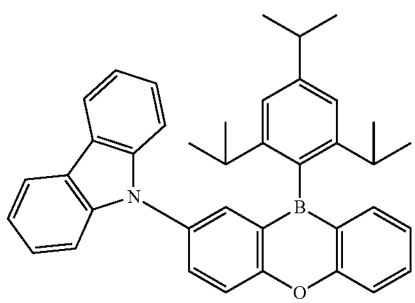
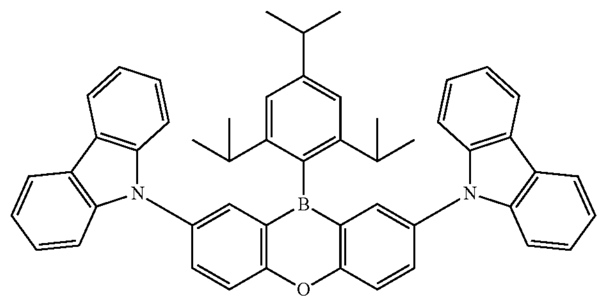
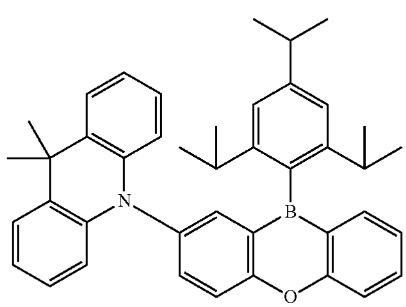
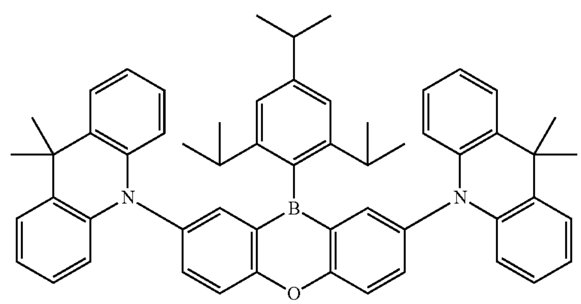
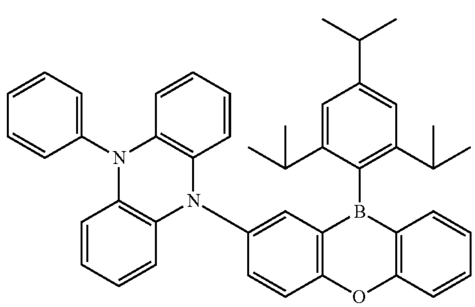

-continued
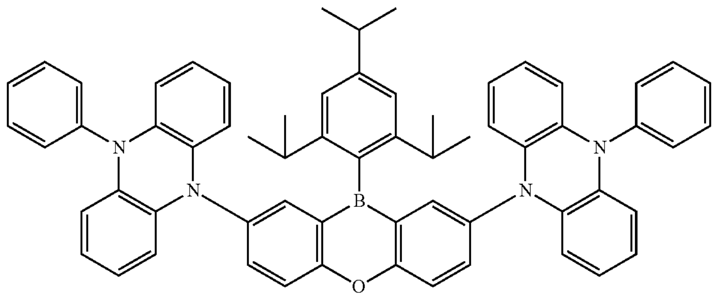
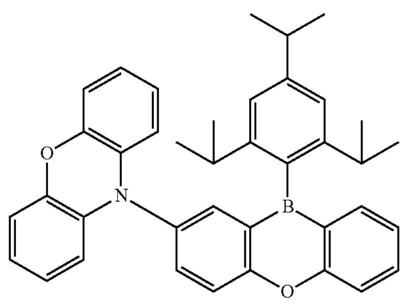
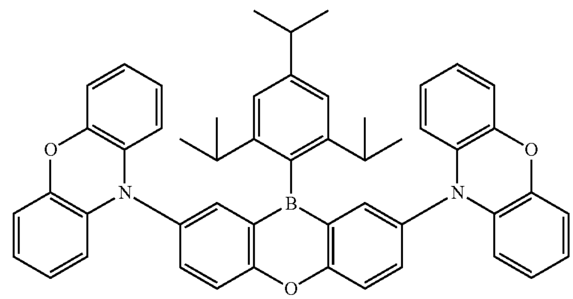
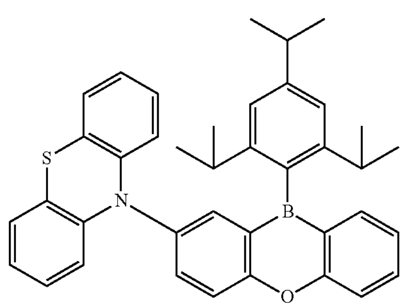
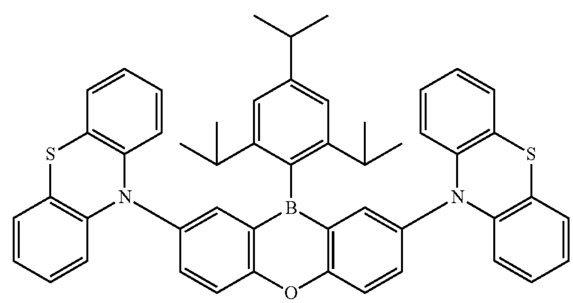
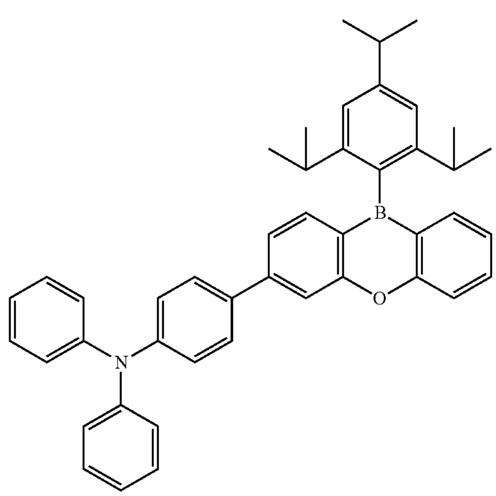

-continued
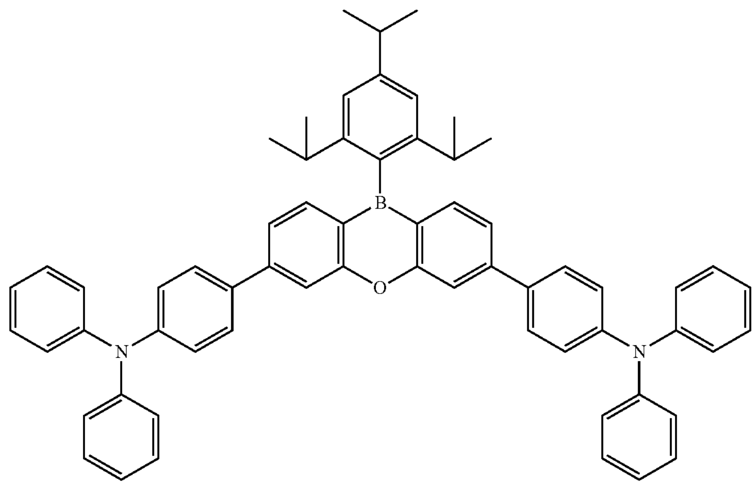
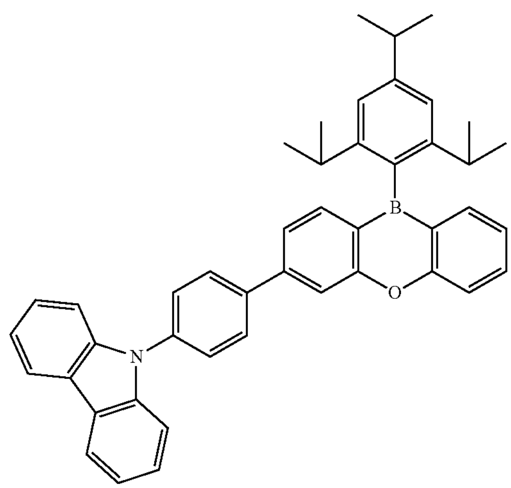
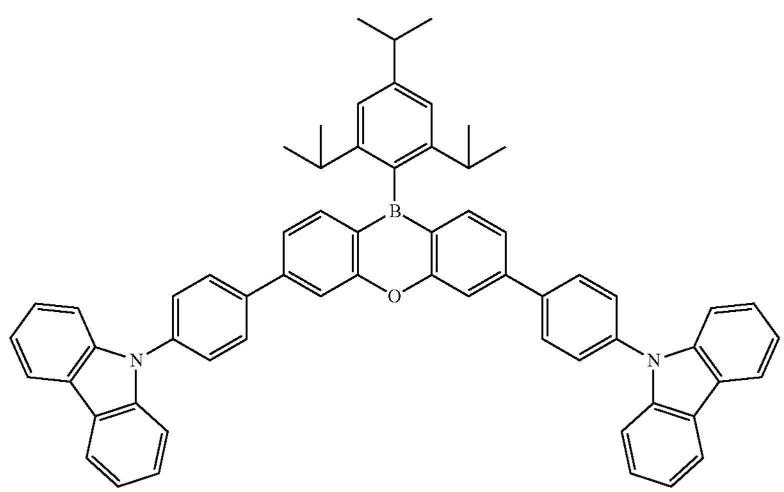

-continued
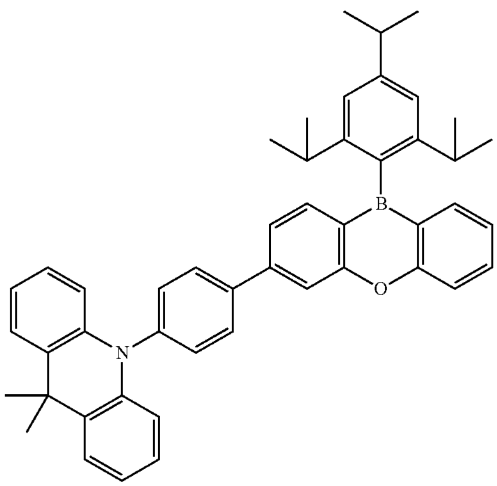
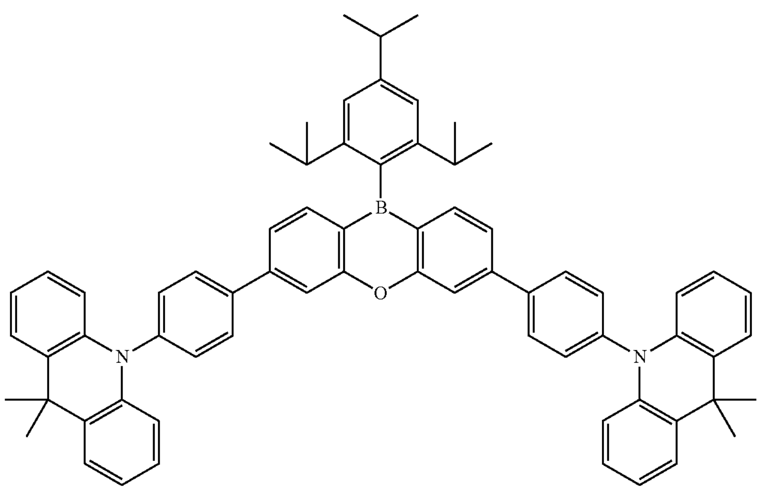
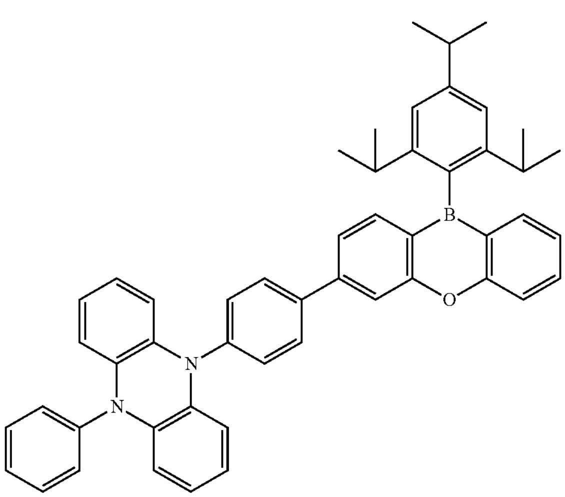

-continued
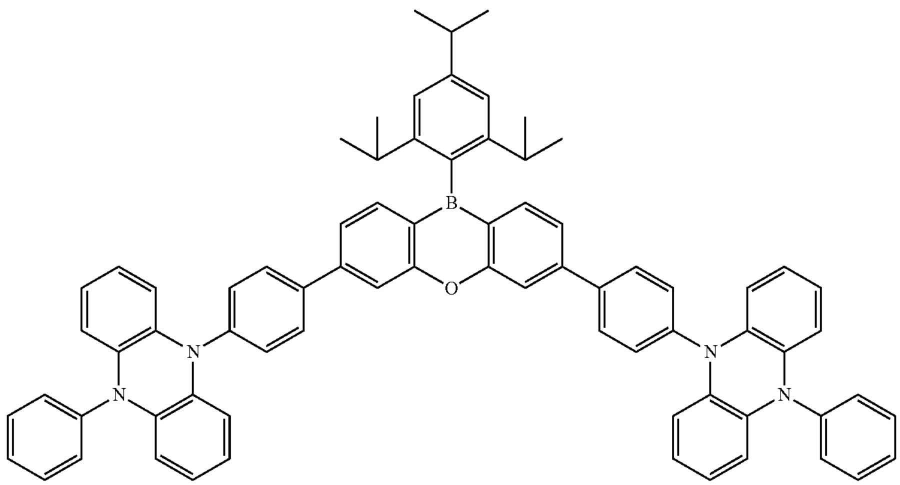
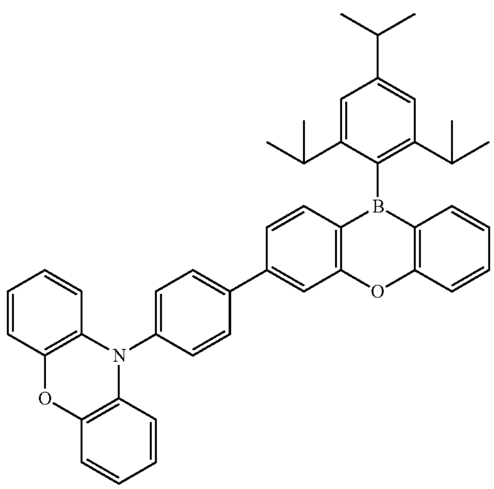
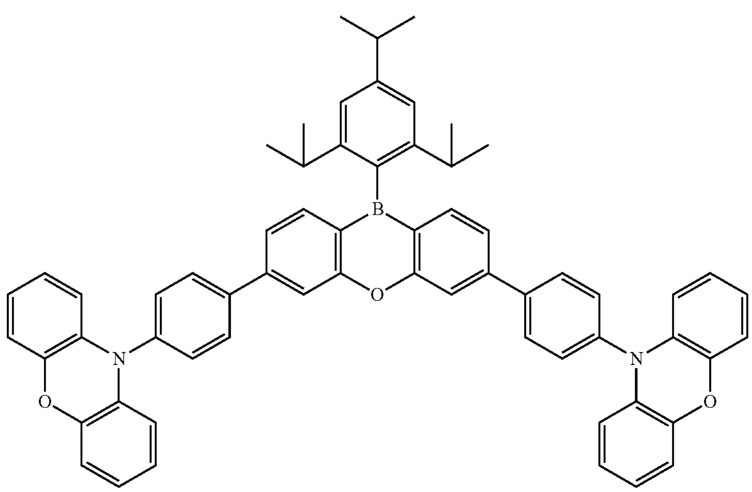

-continued
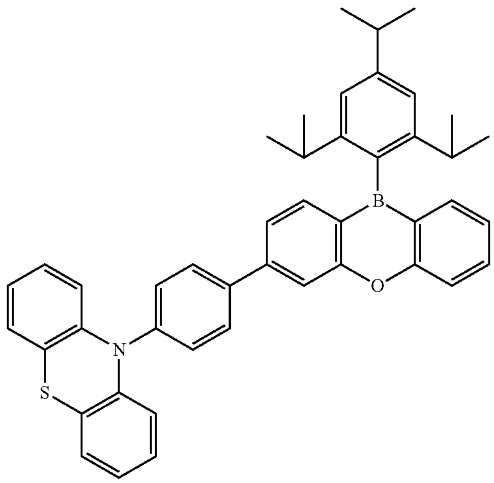
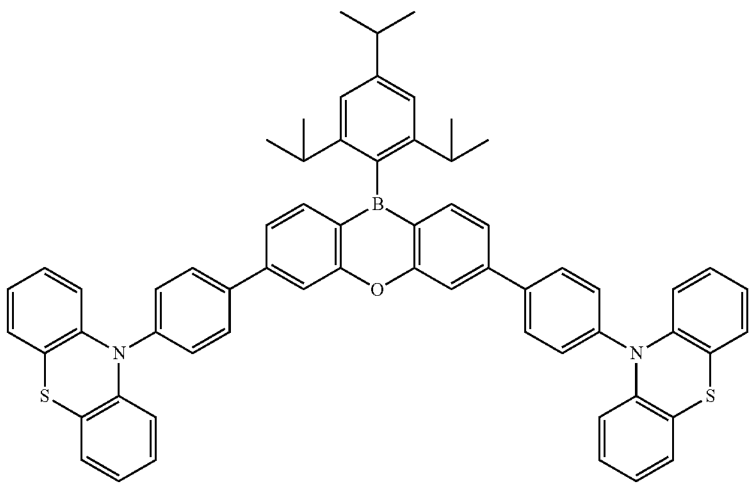
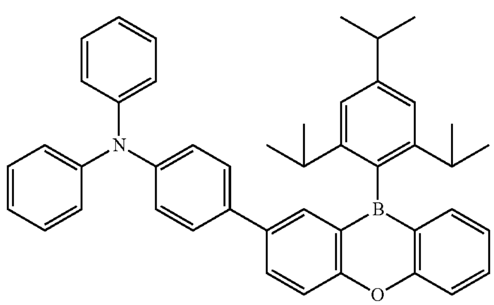
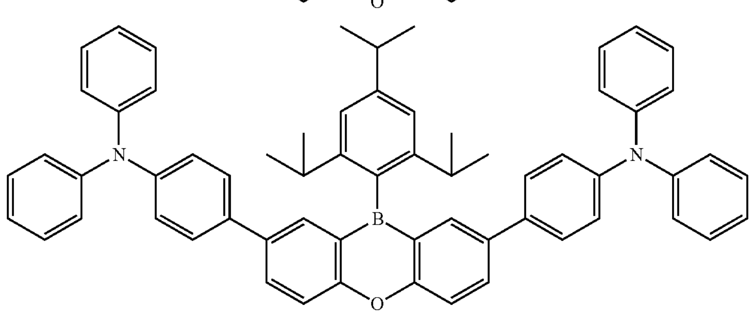

-continued
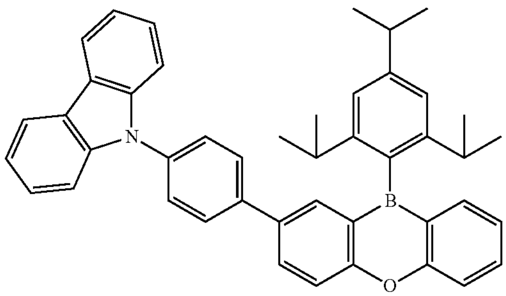
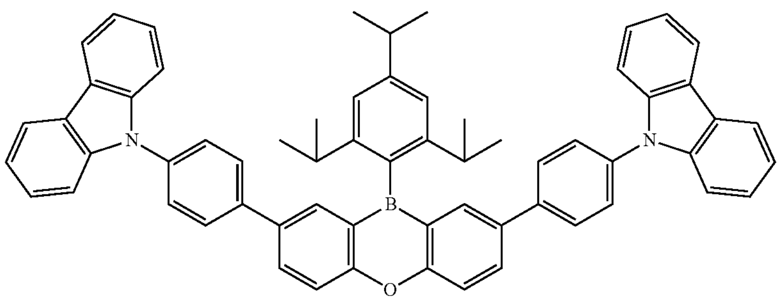
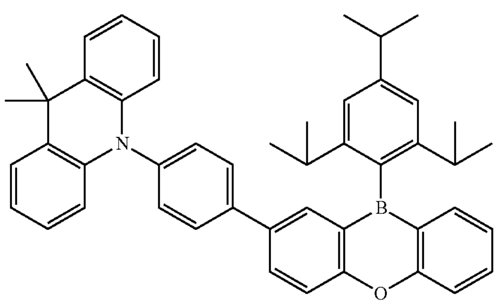
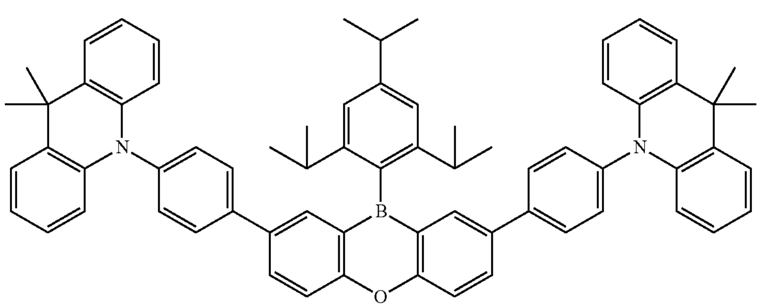
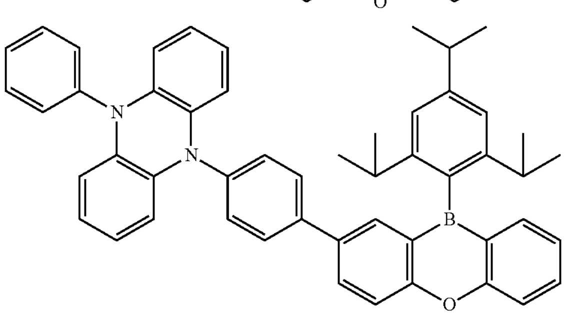

-continued
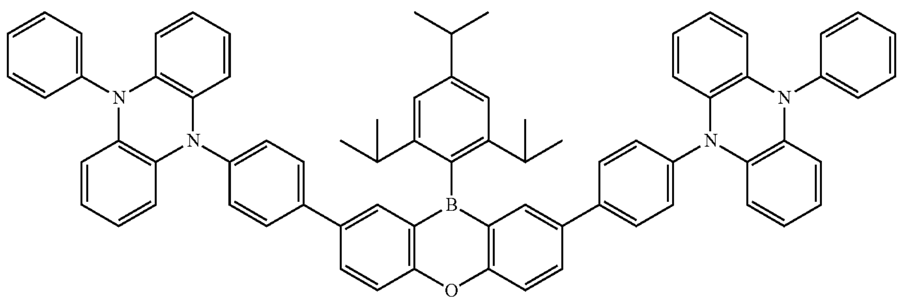
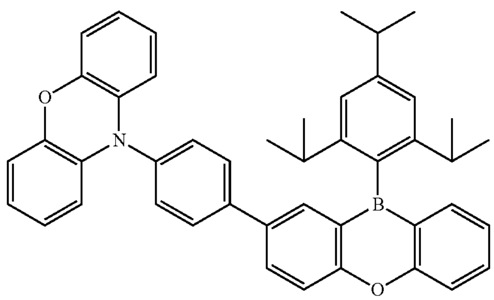
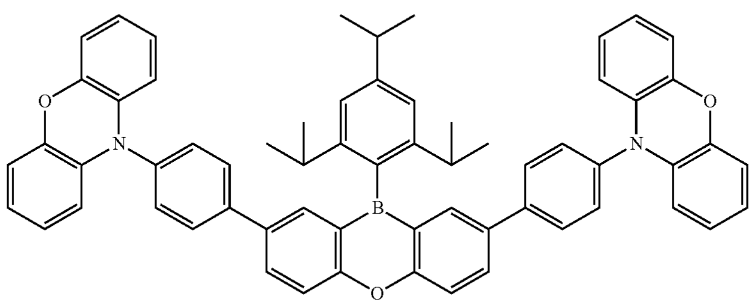
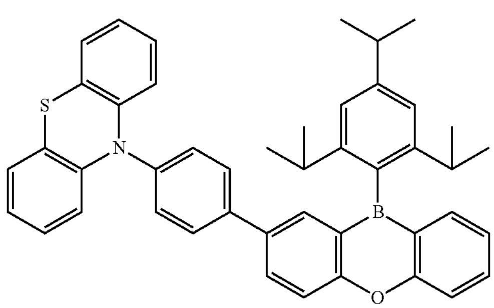
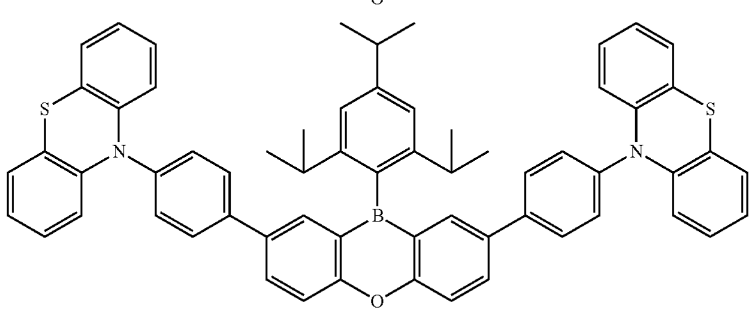

-continued
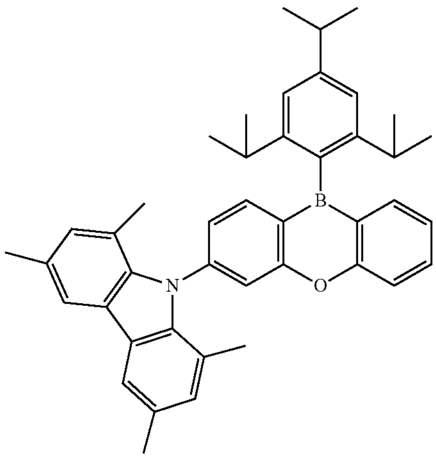
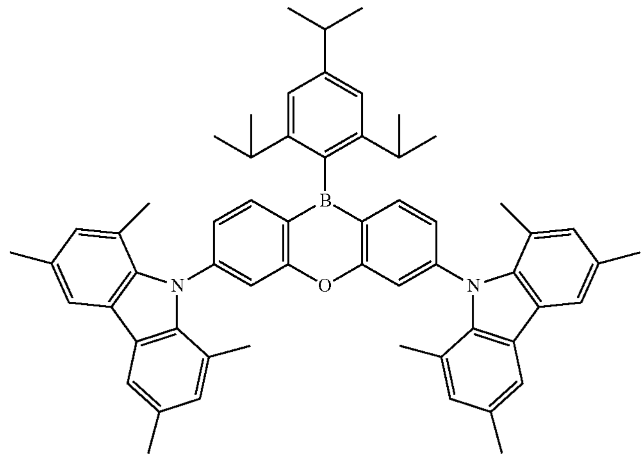
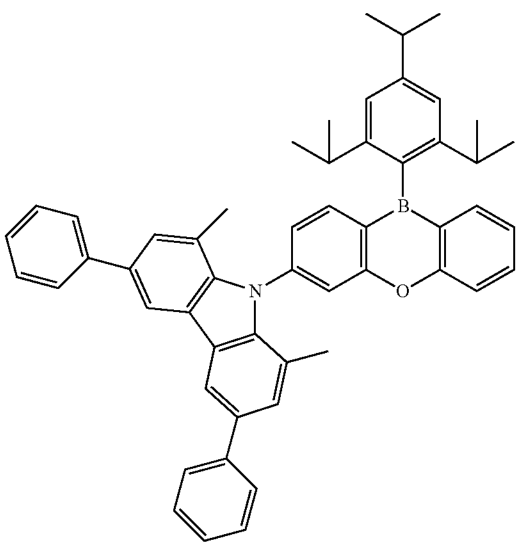
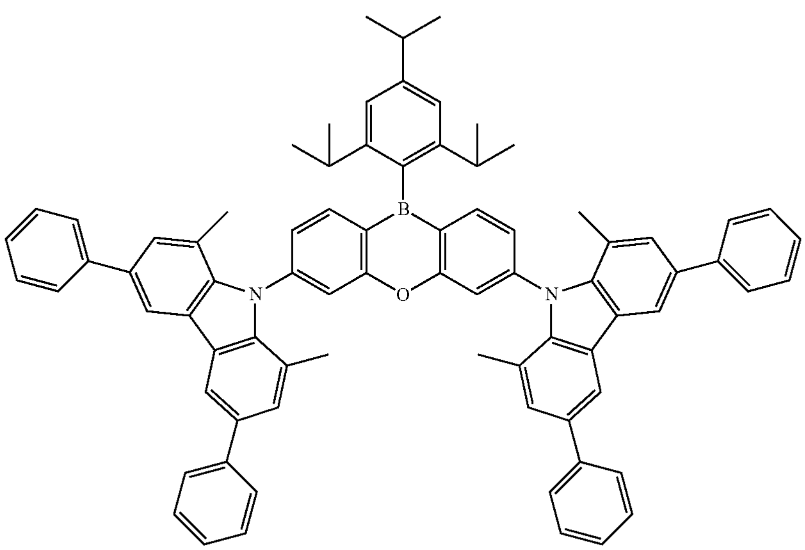

-continued
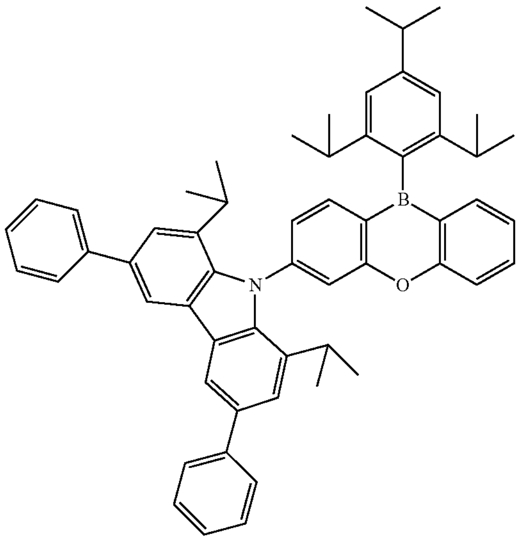
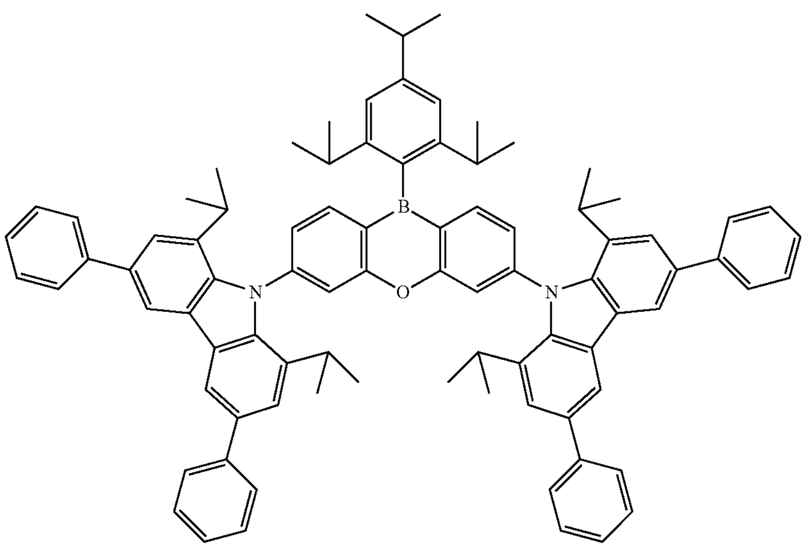
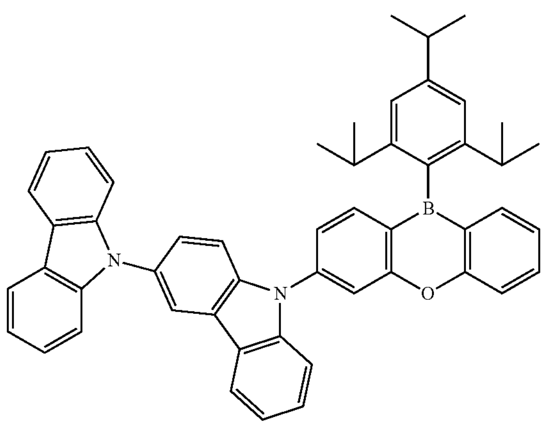
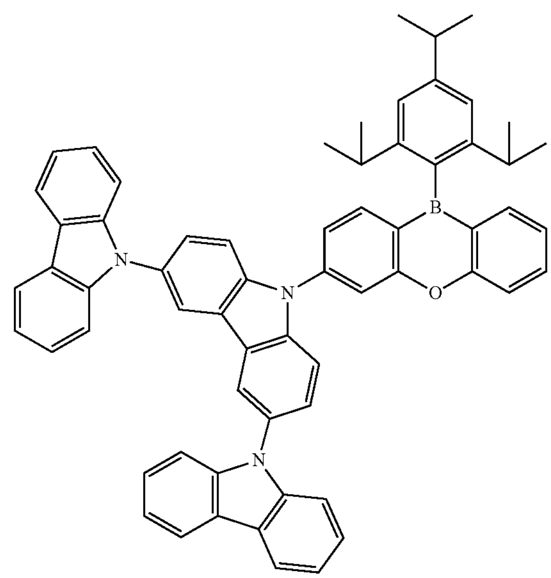

-continued
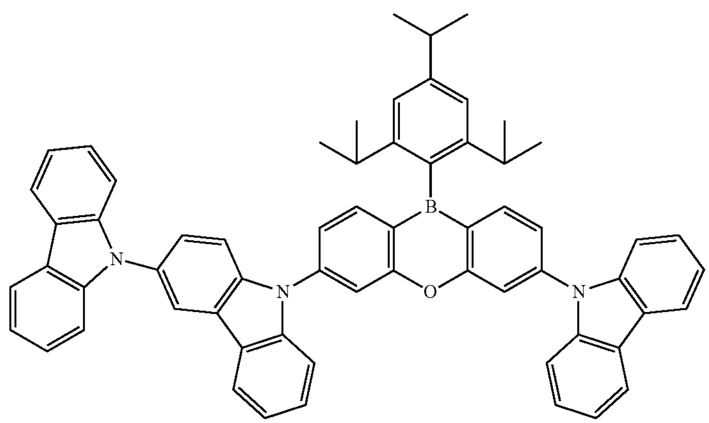
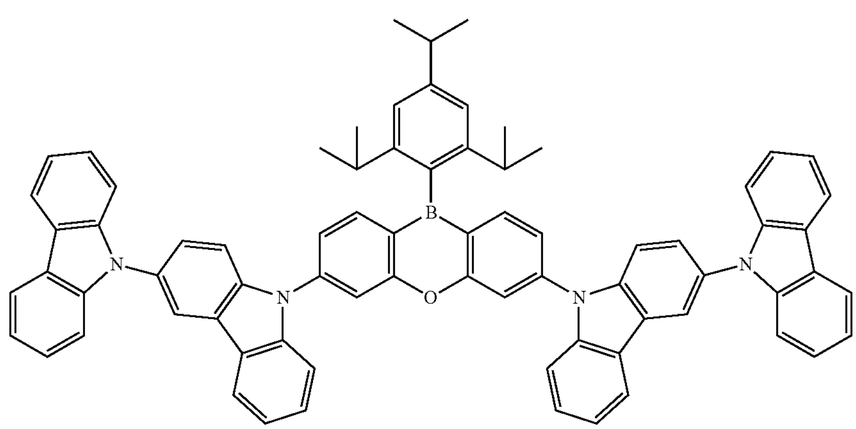
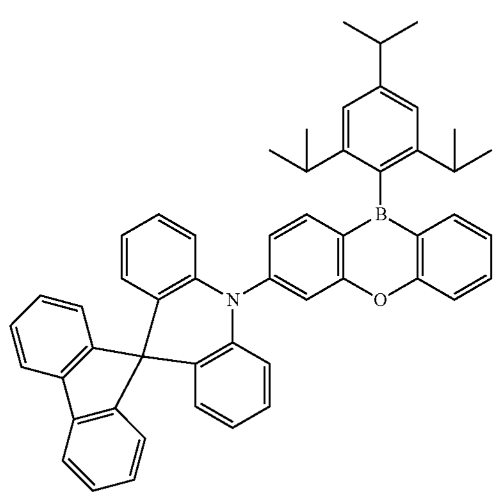

-continued
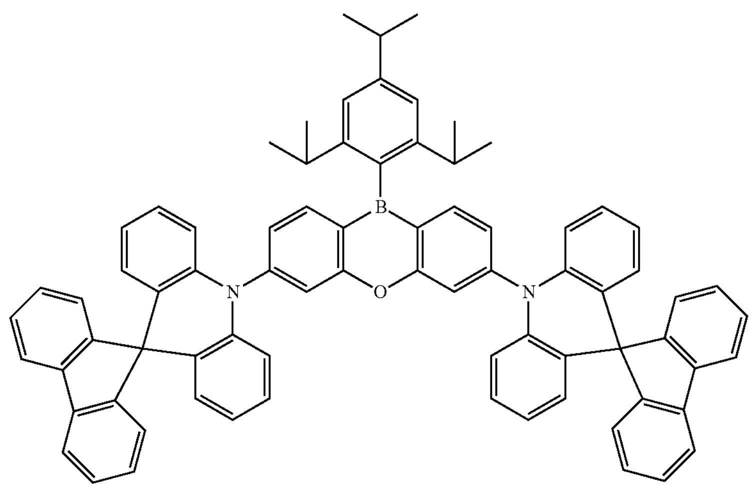
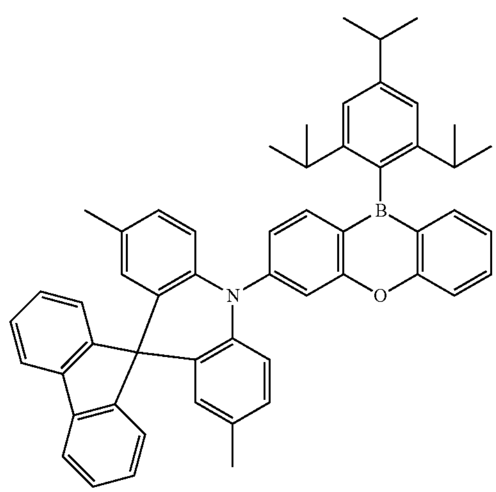
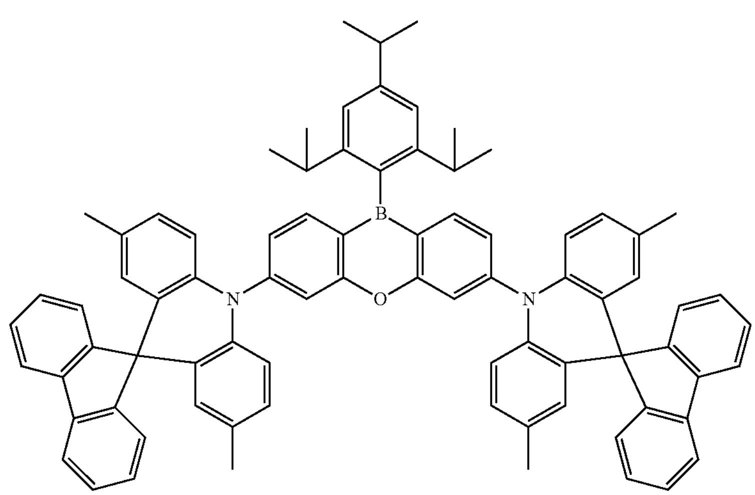

-continued
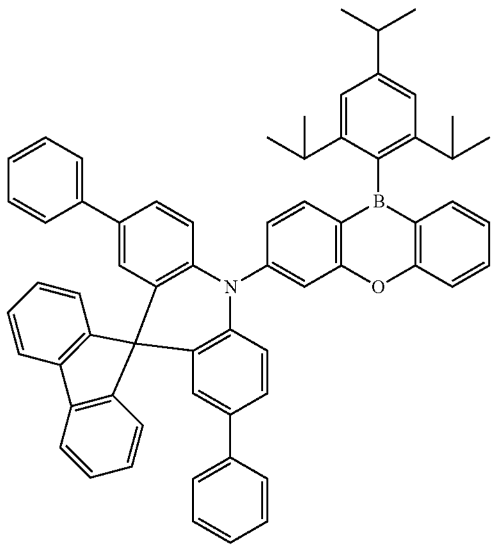
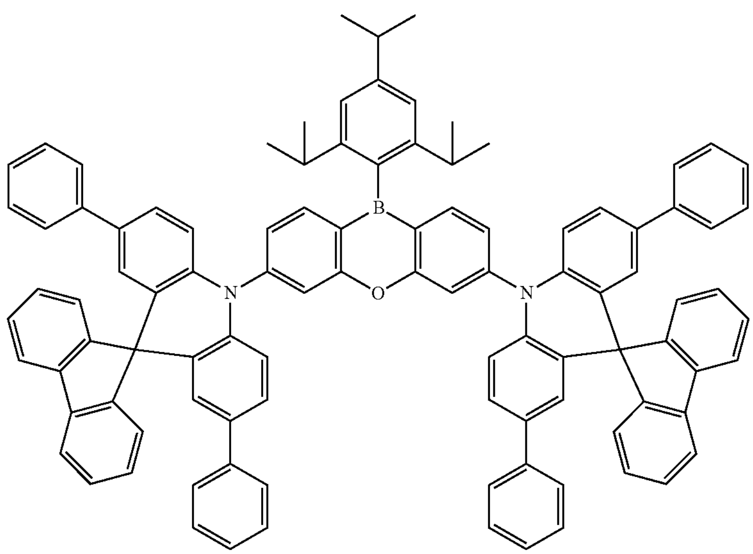
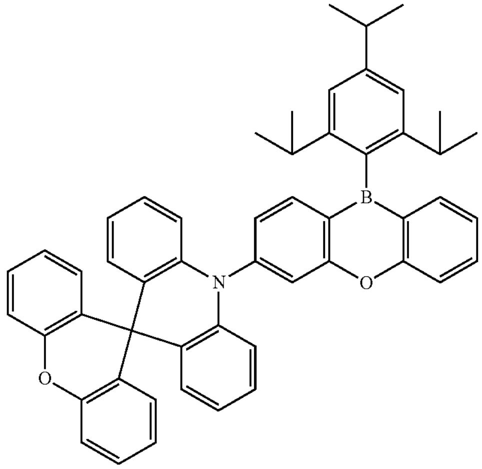

-continued
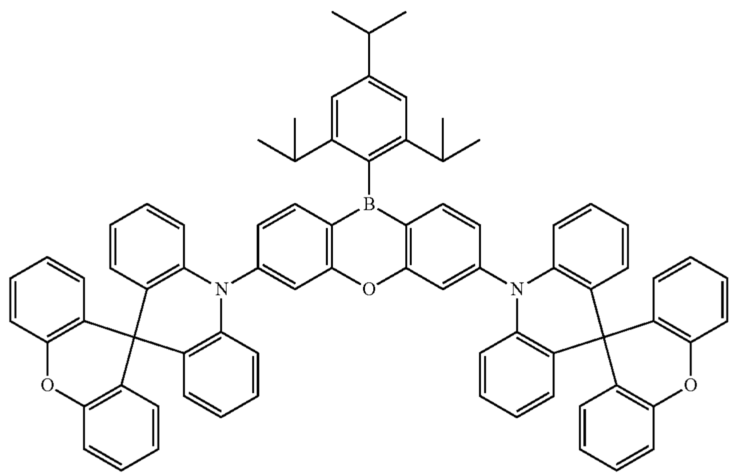
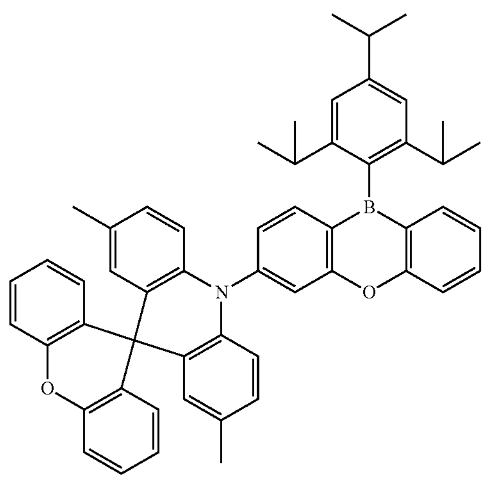
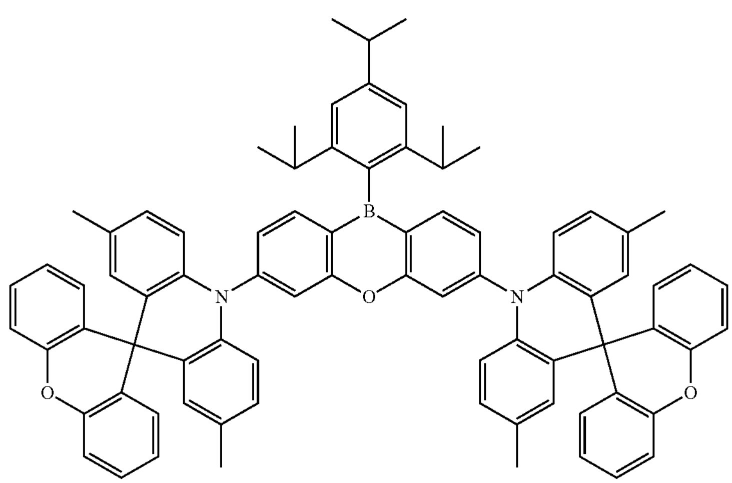

-continued
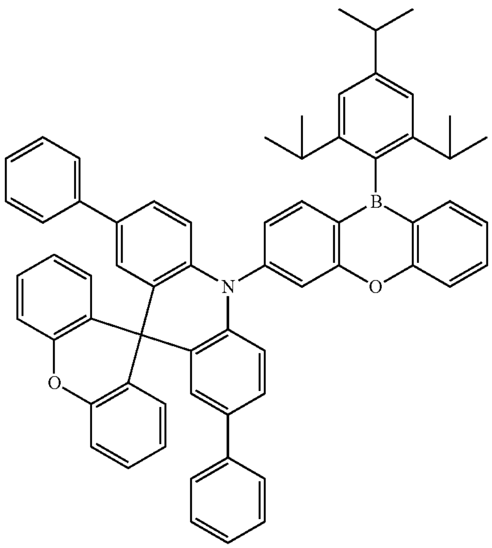
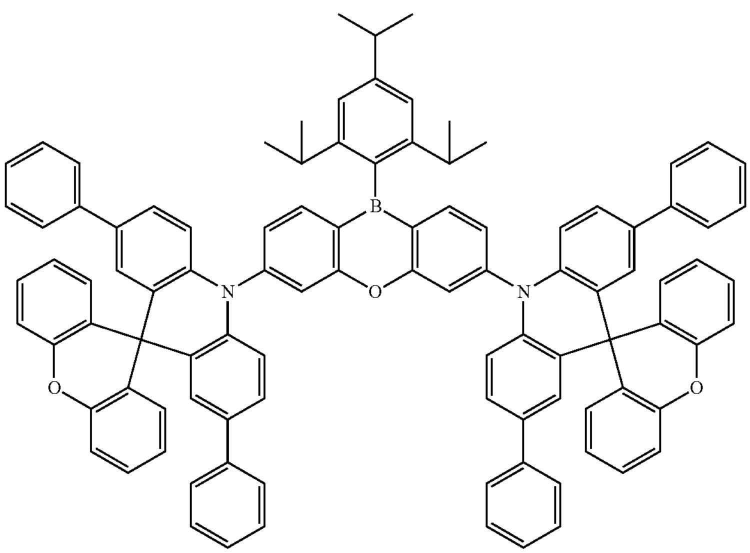
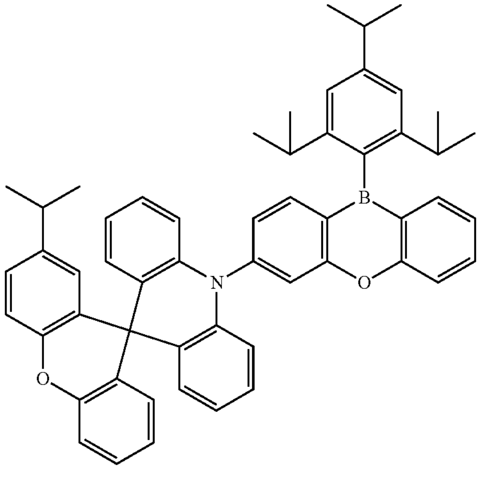
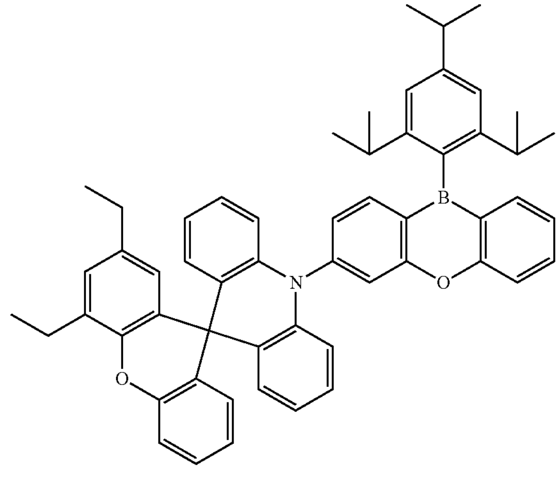

-continued
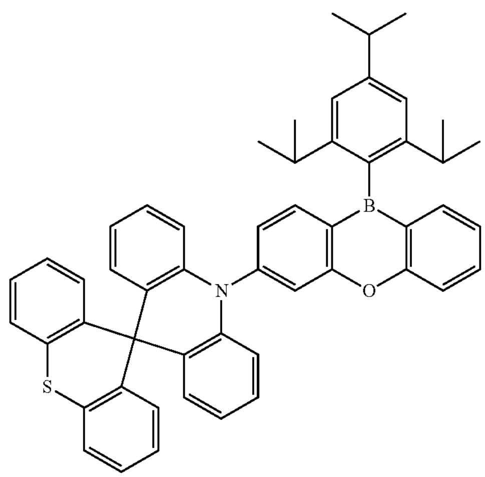
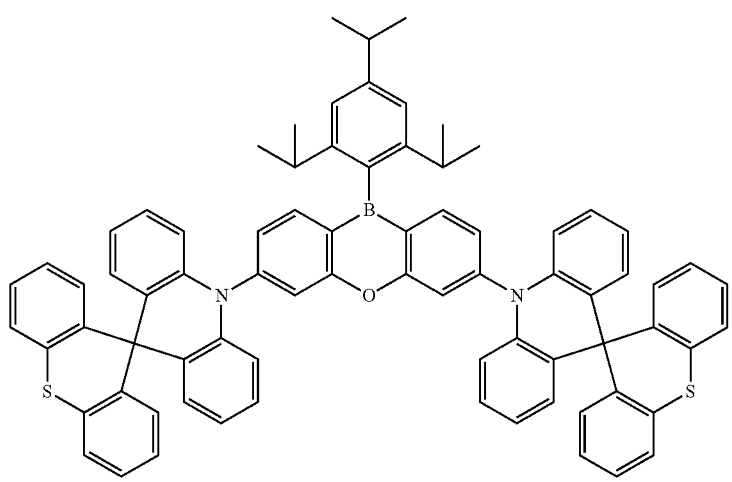
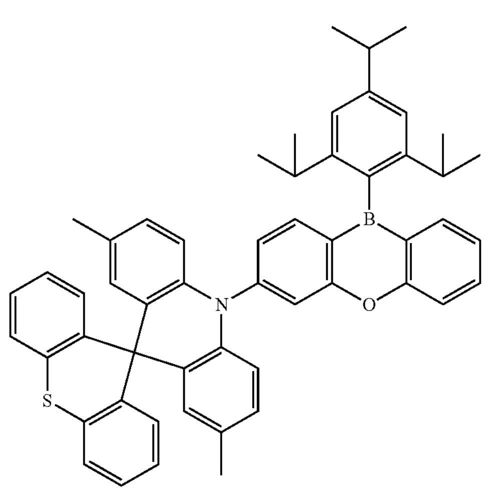

-continued
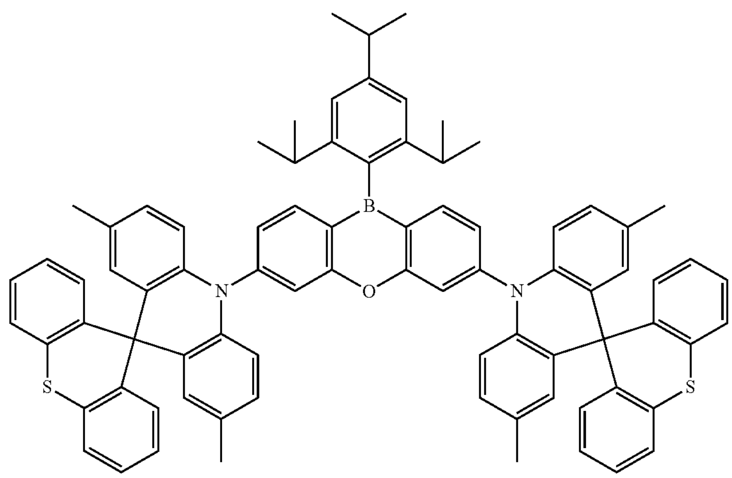
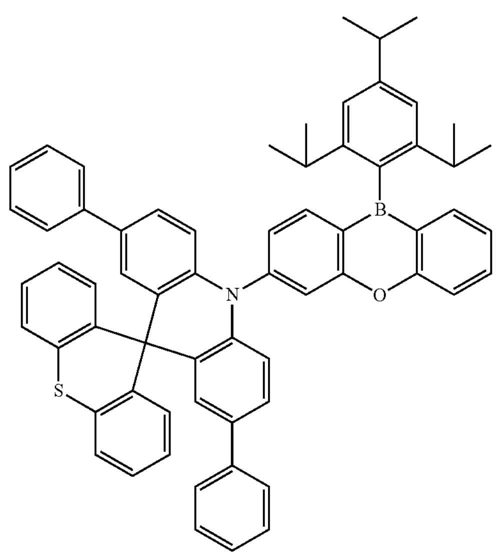
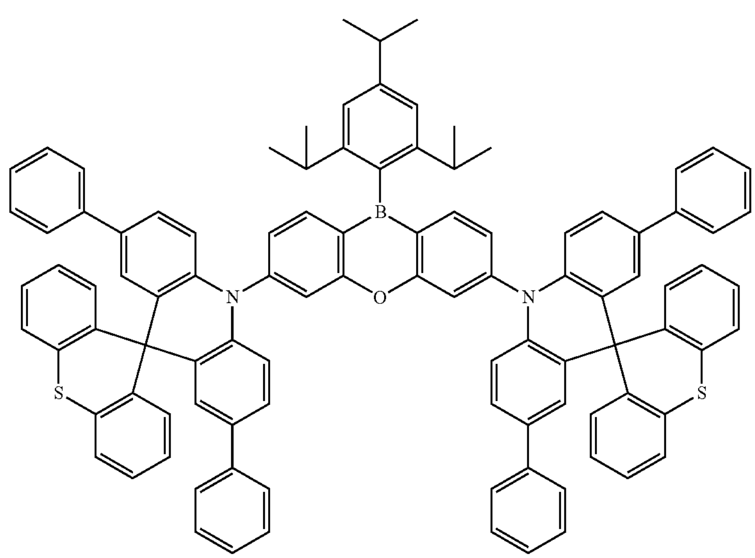

-continued
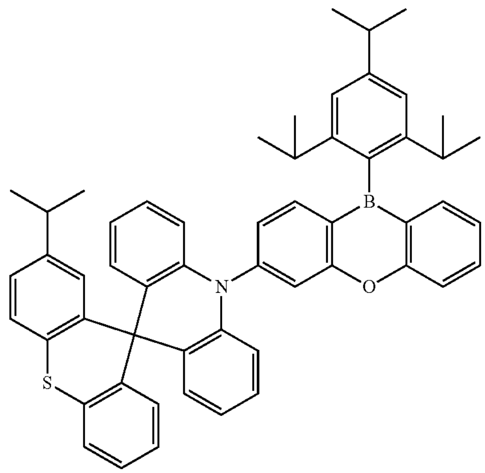
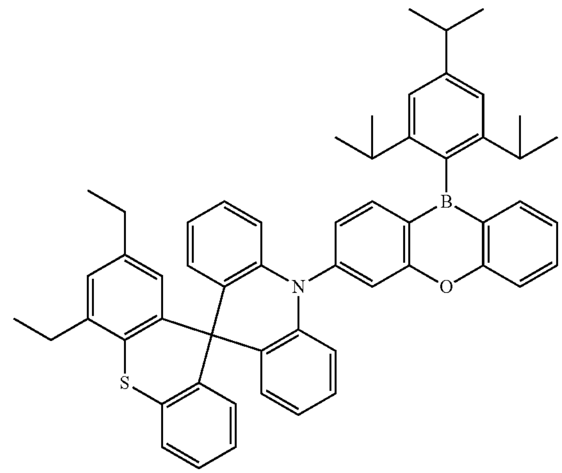
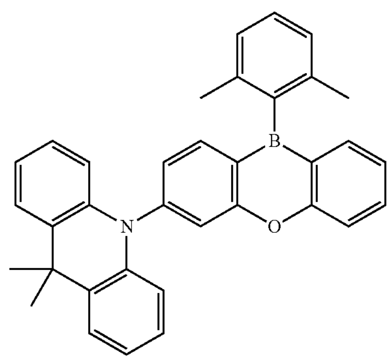
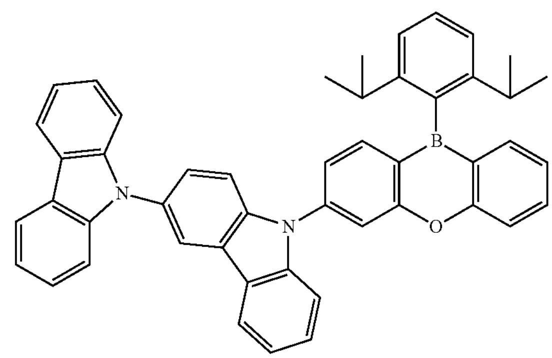
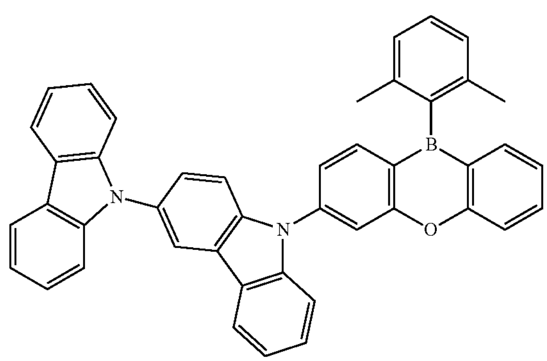
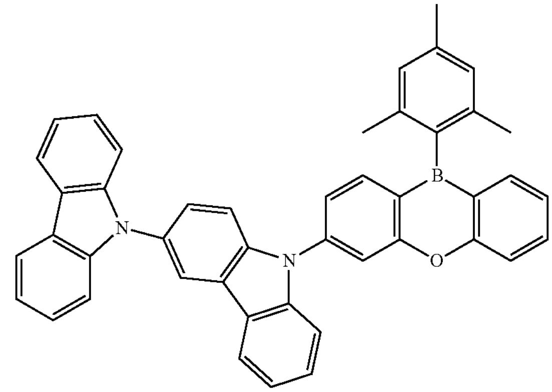
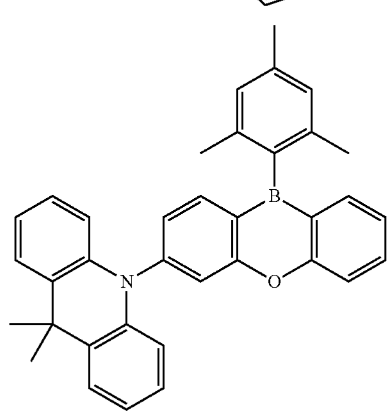
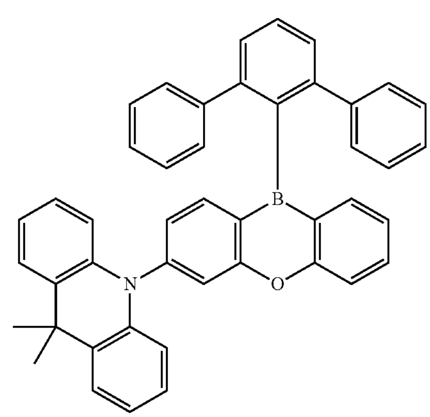

-continued
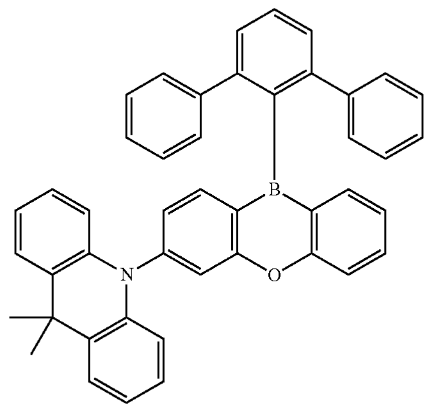
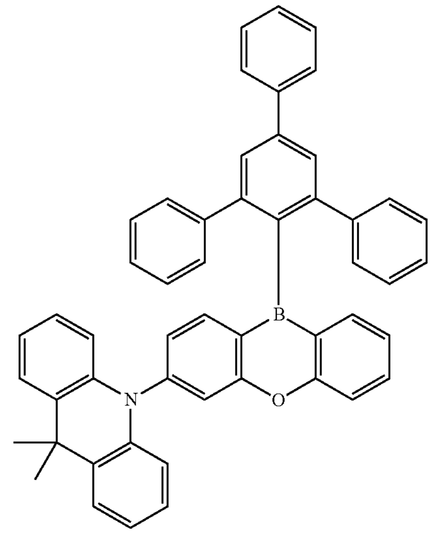
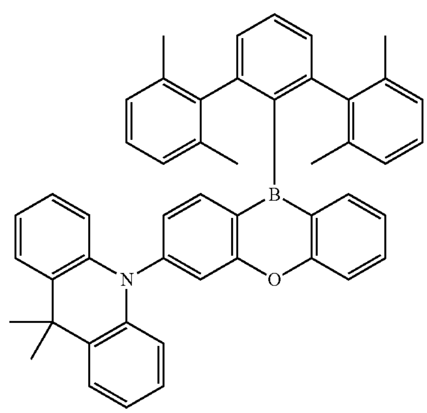
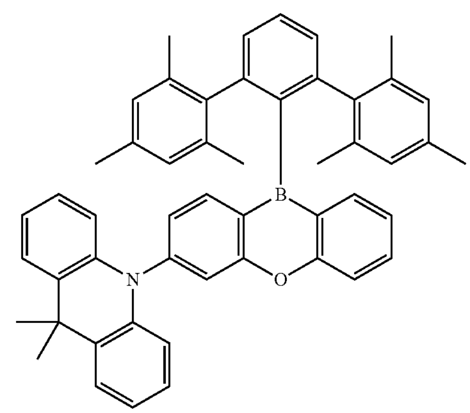
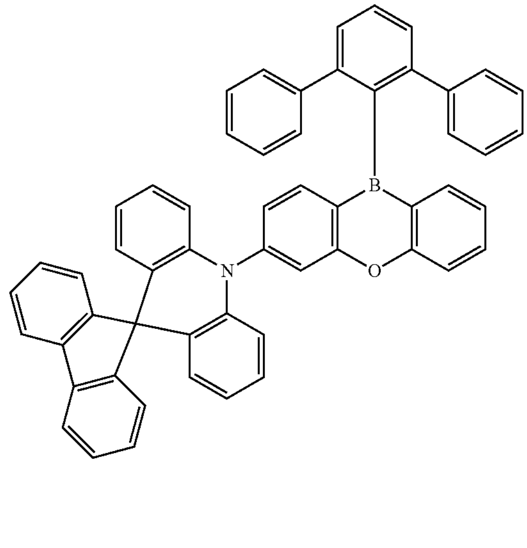
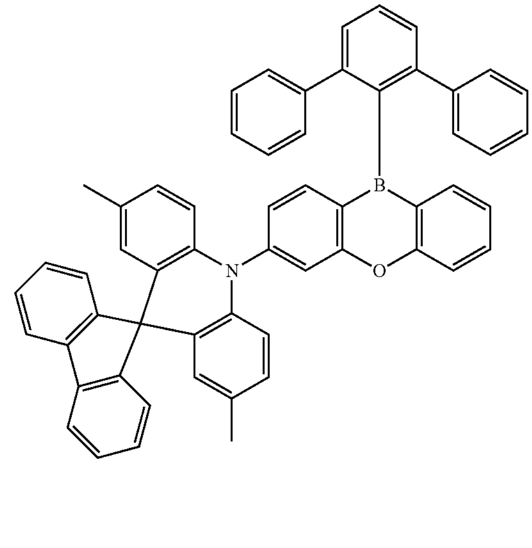

-continued
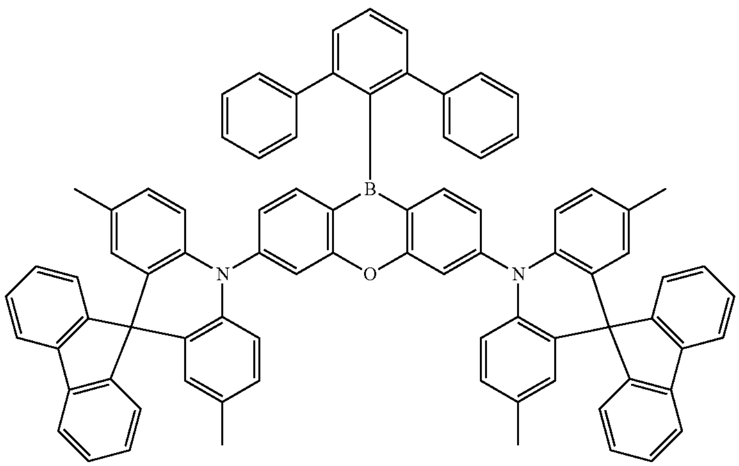
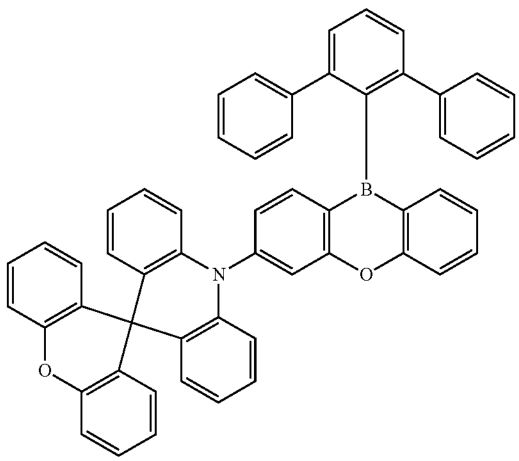
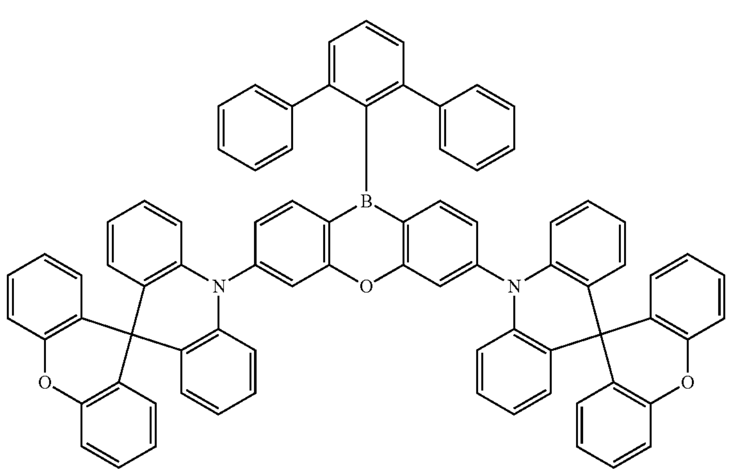

-continued
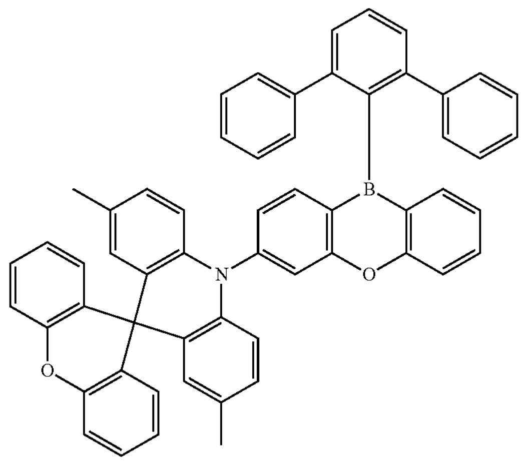
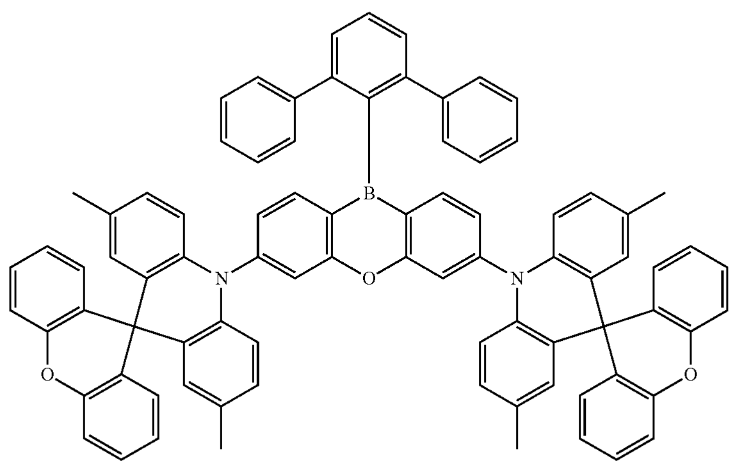
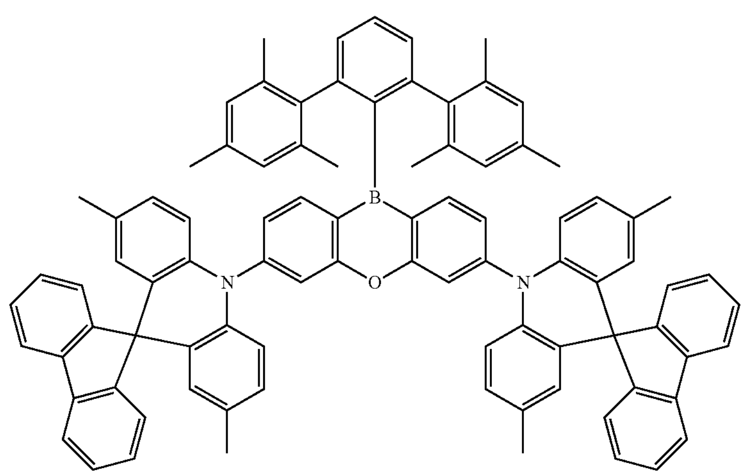

-continued
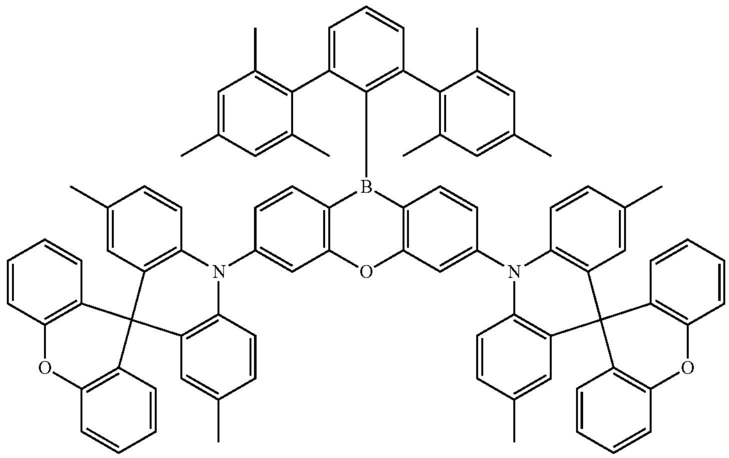
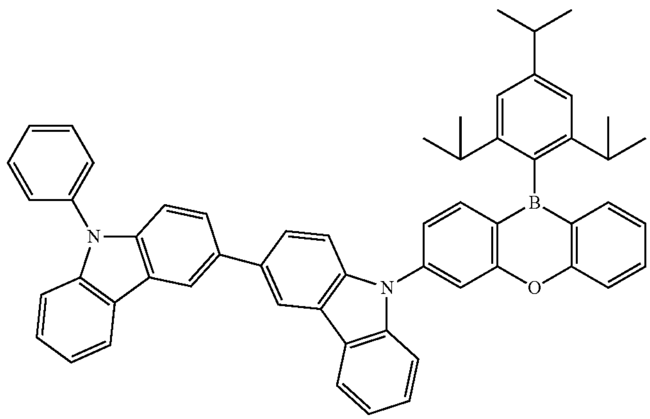
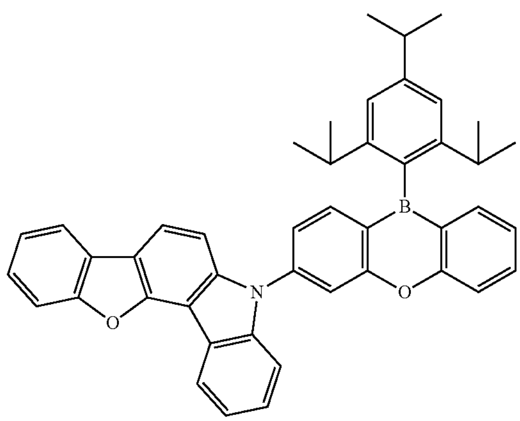
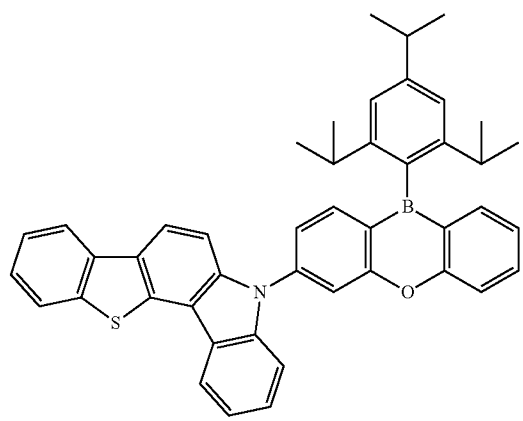
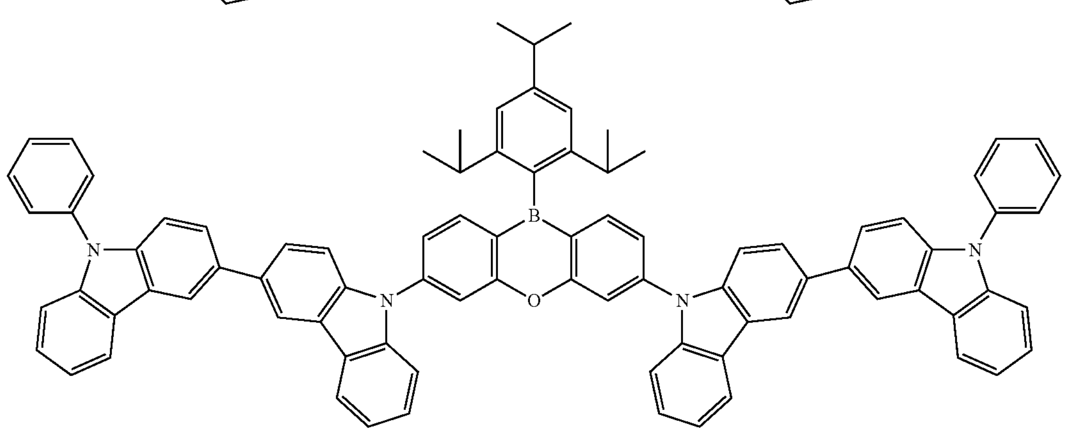

-continued
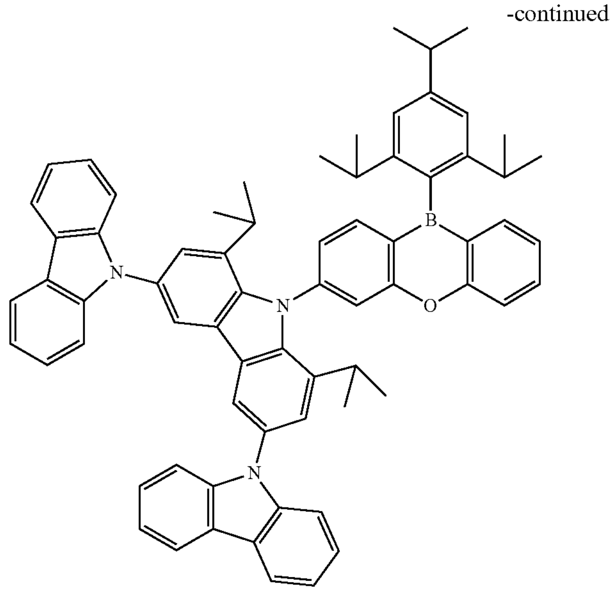
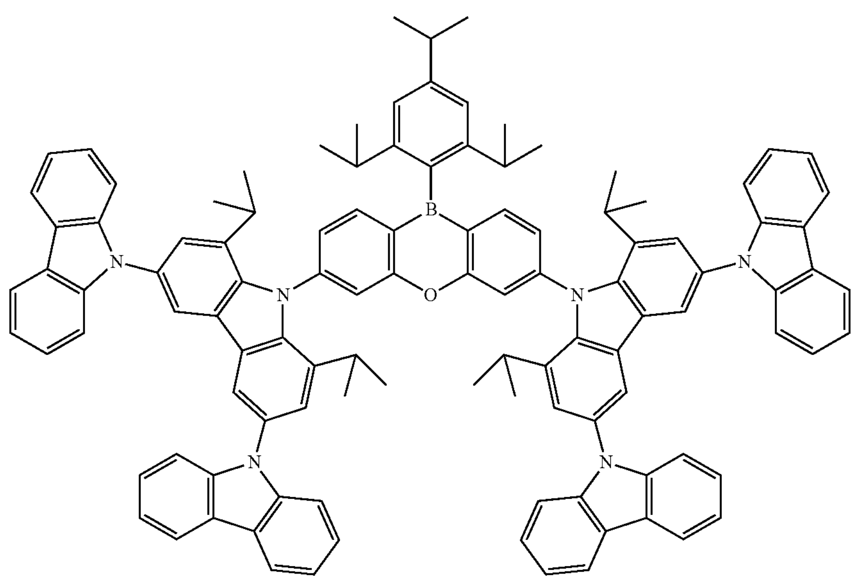
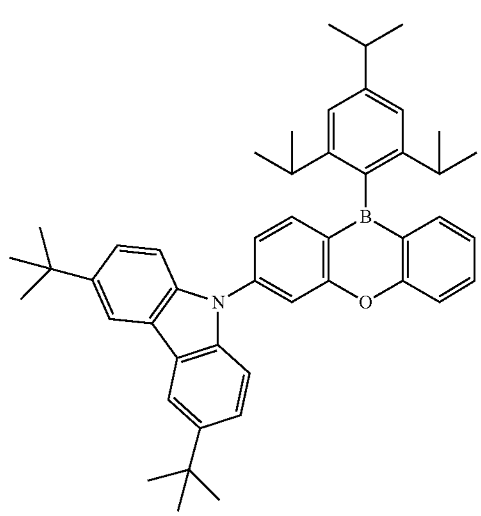

-continued
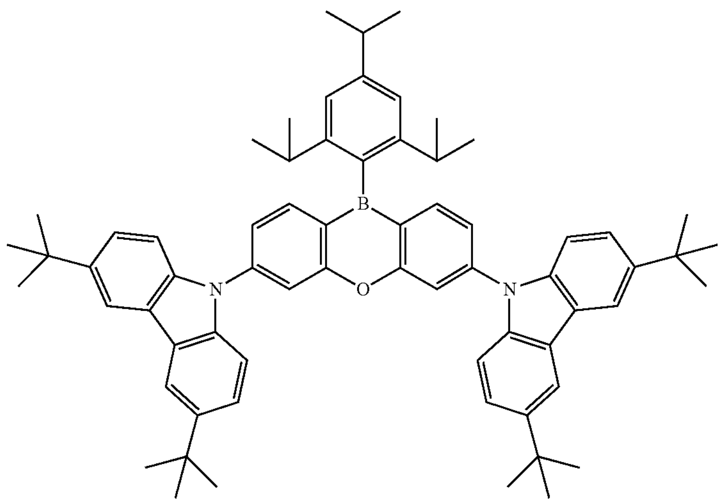
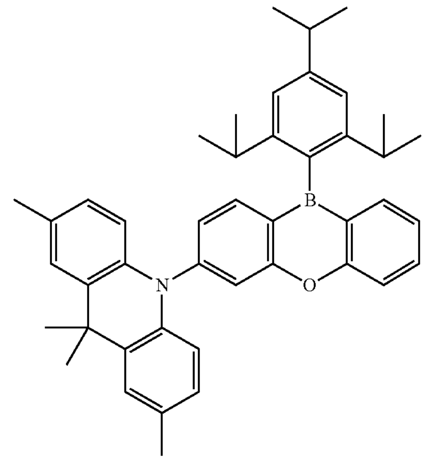
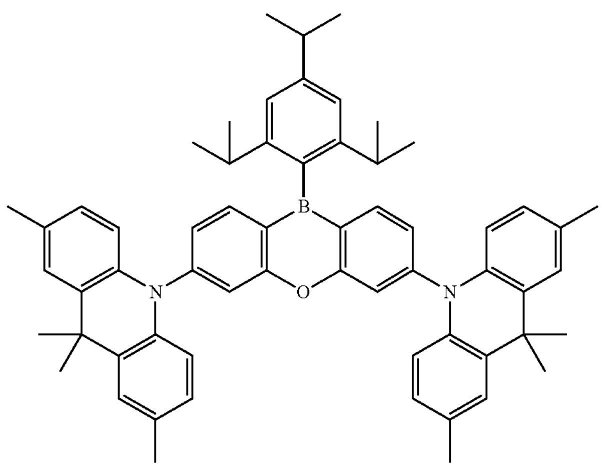
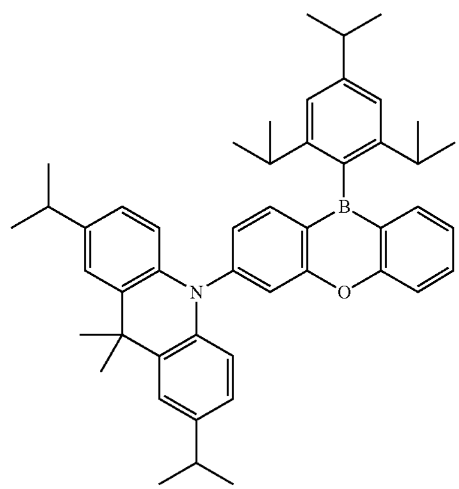
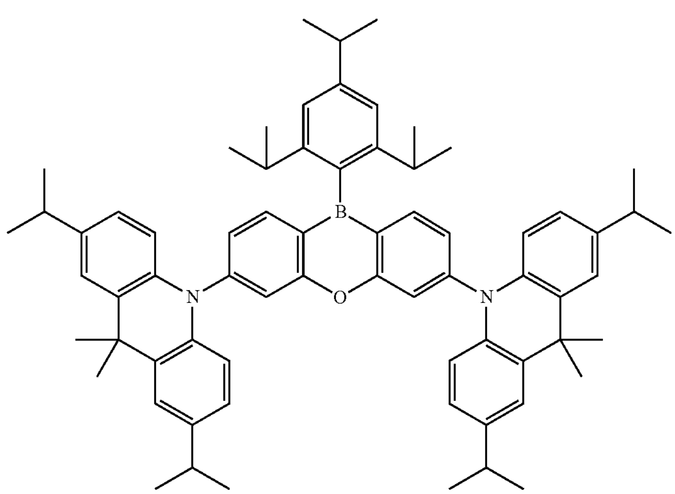
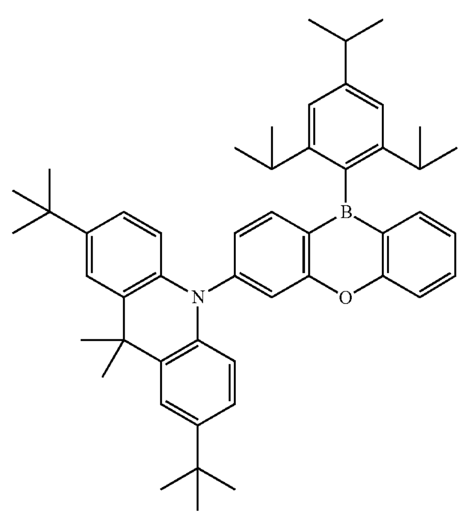

-continued
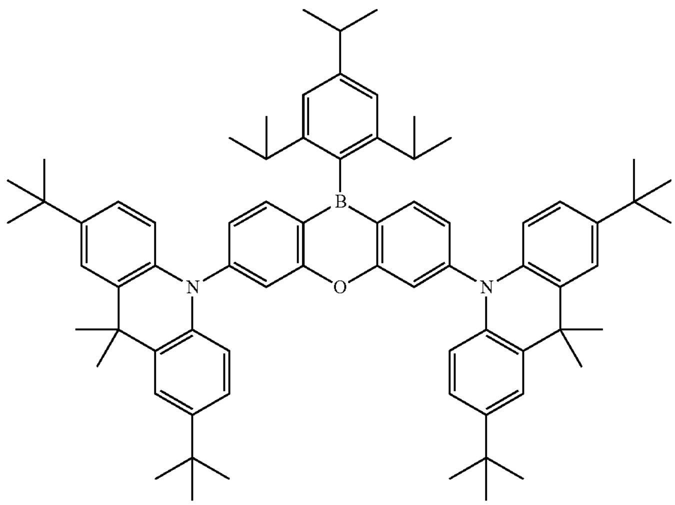
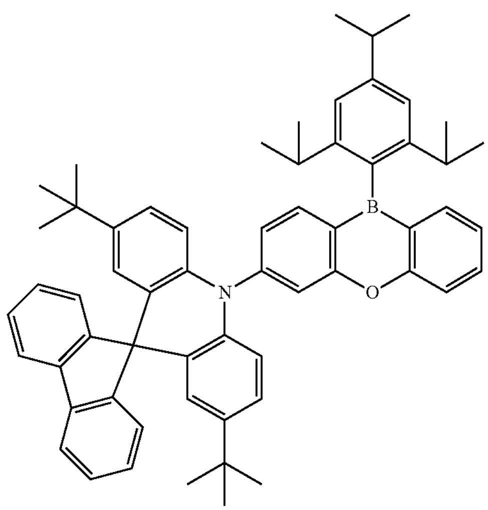
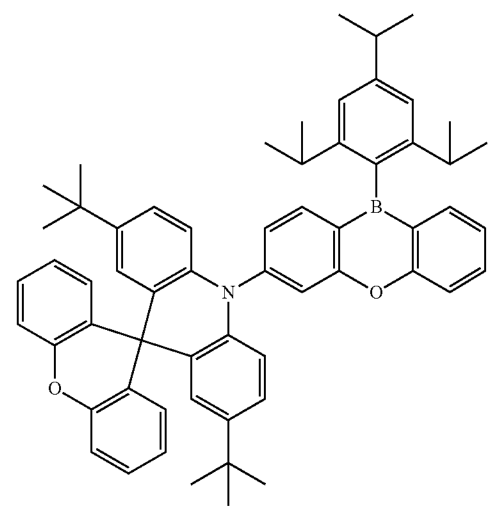
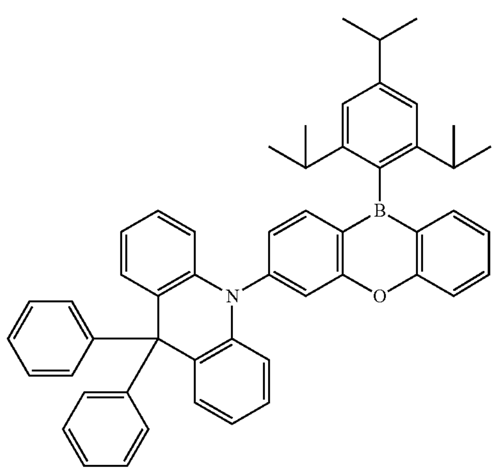

-continued
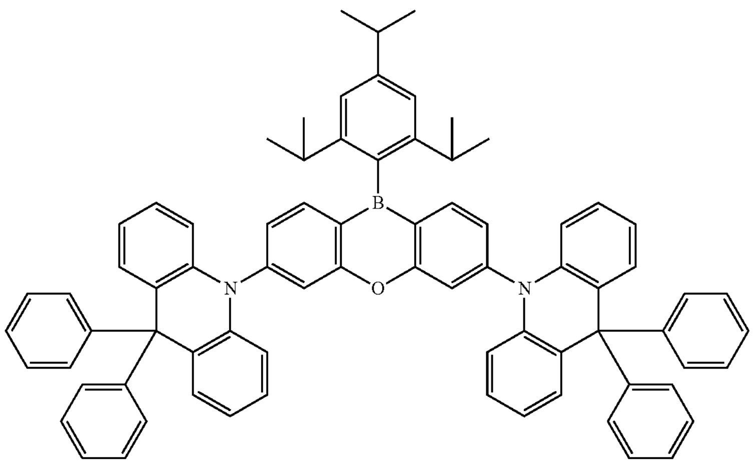
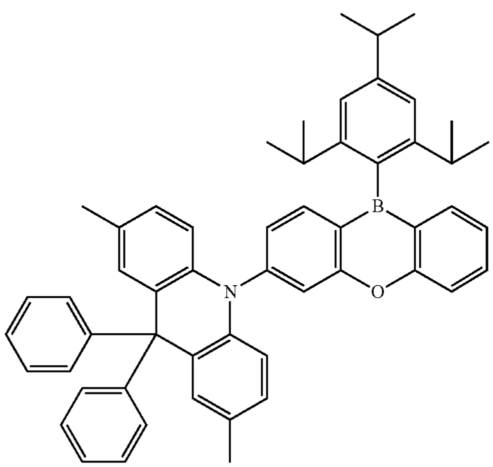
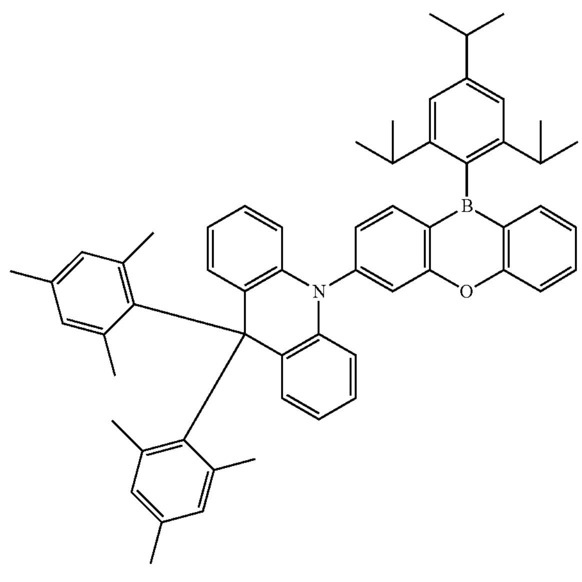
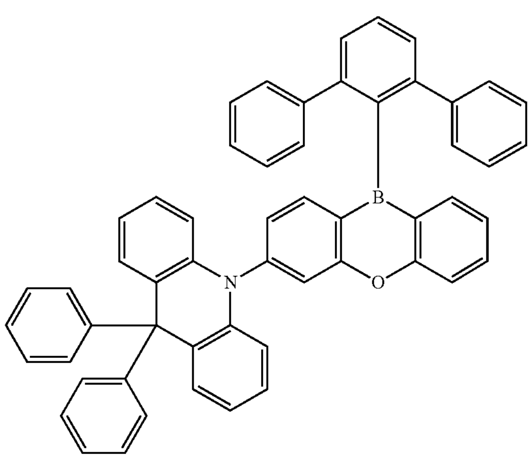
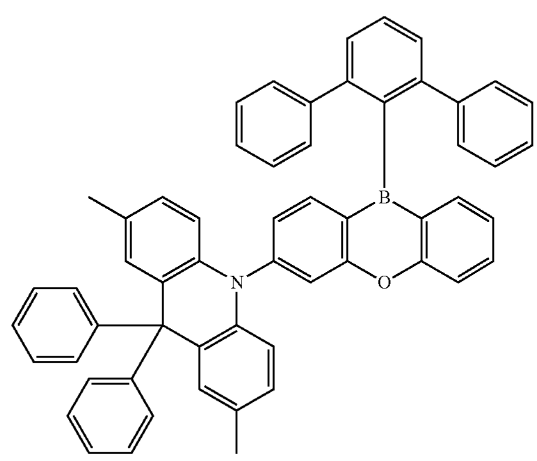

-continued
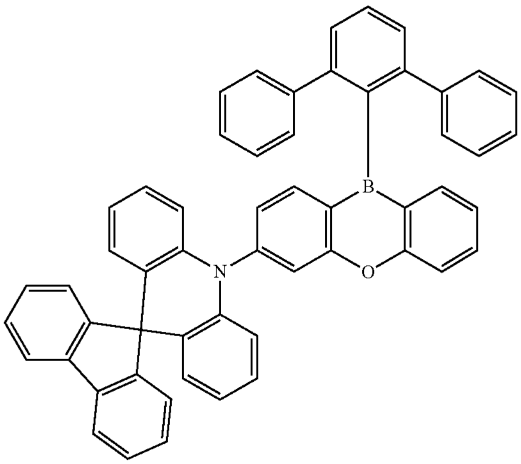
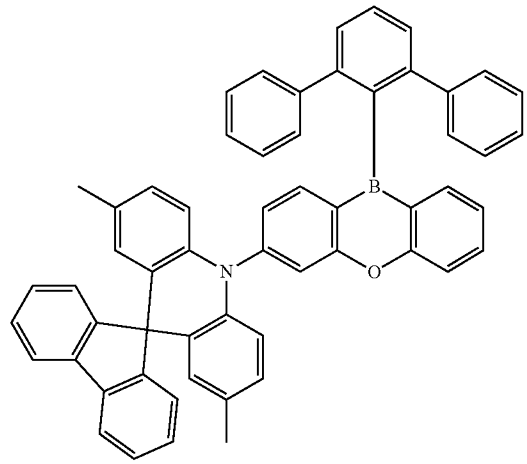
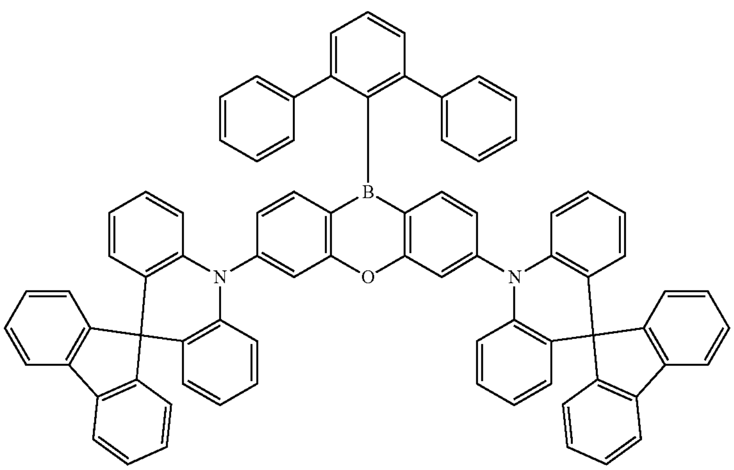
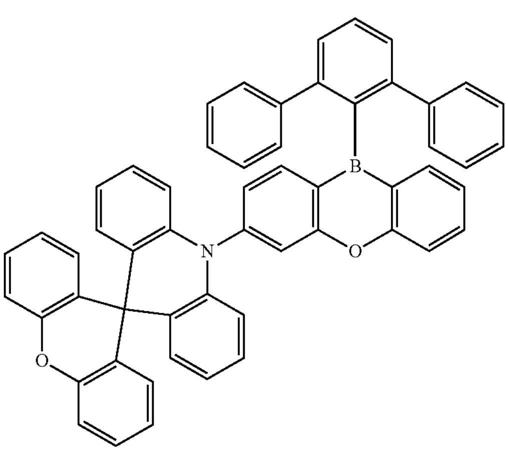
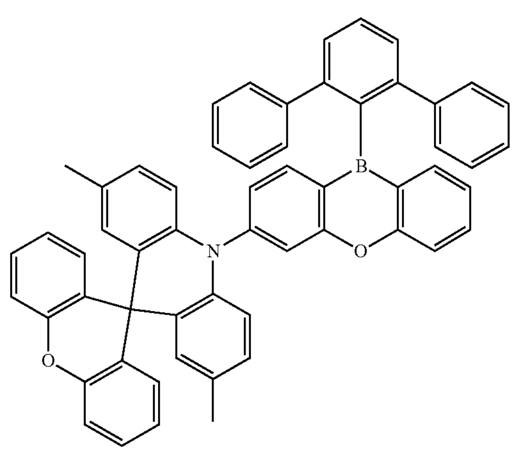

-continued
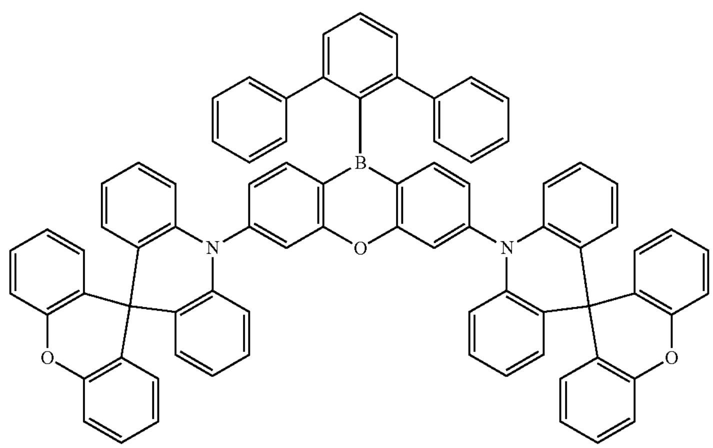
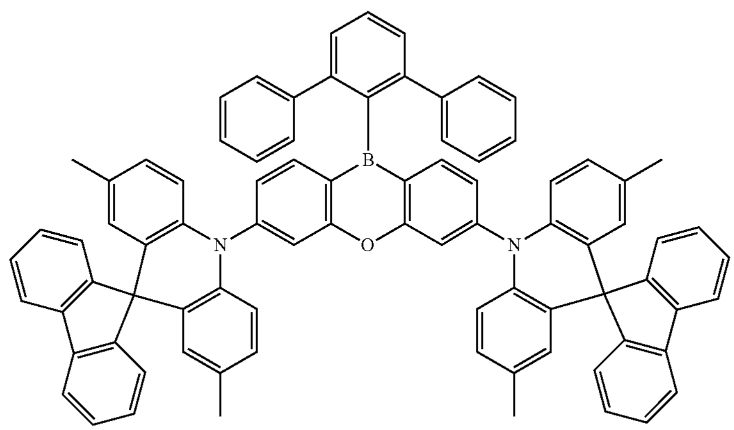
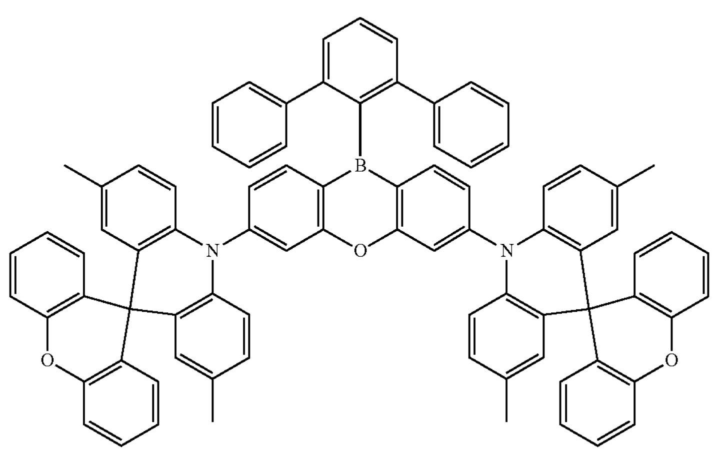

-continued
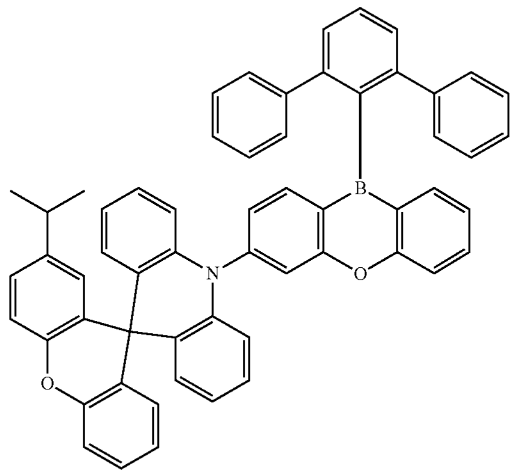
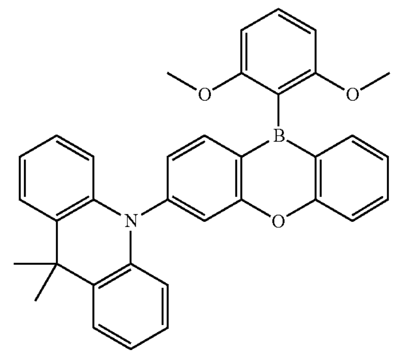
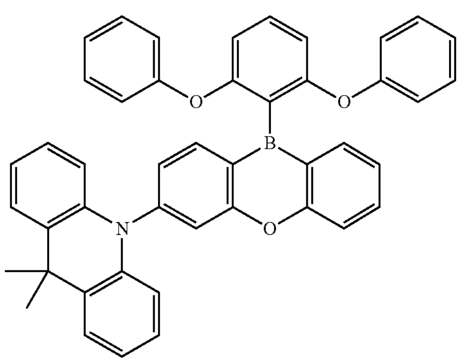
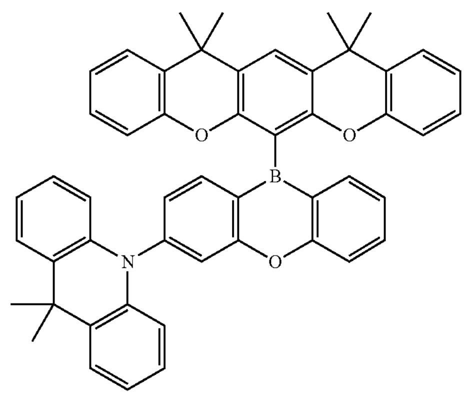
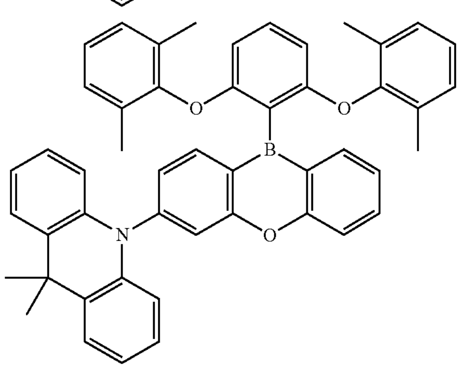
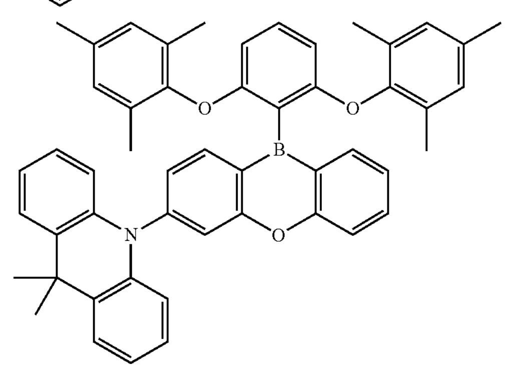
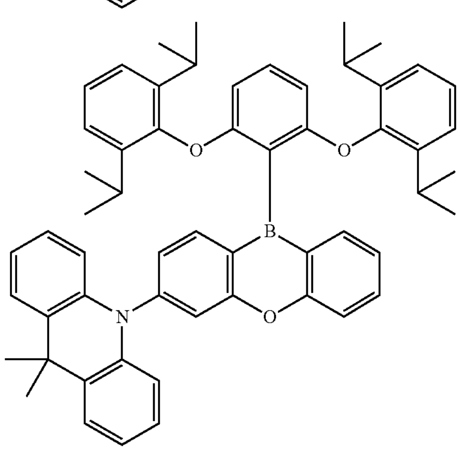
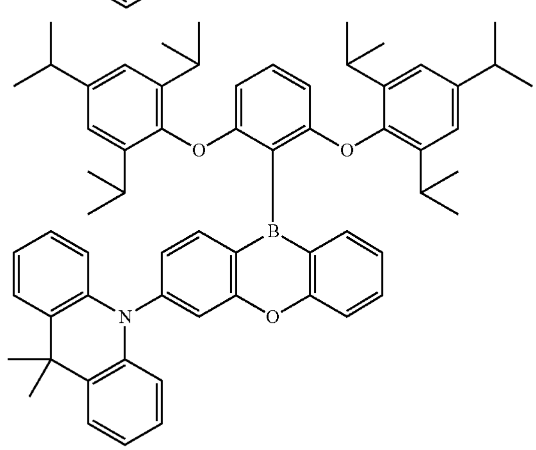

-continued
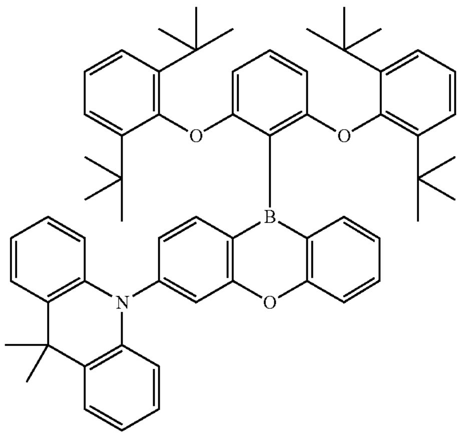
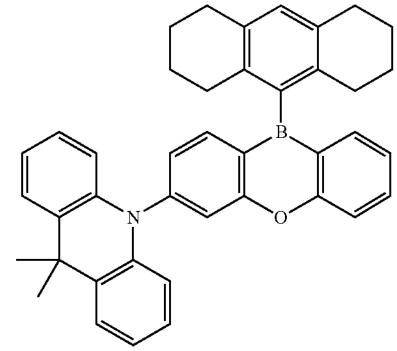
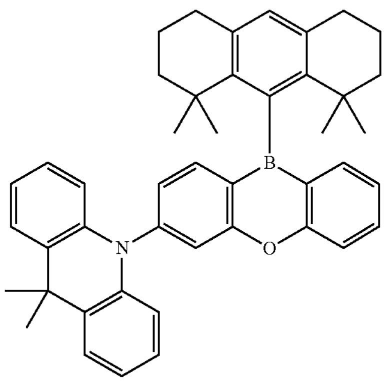
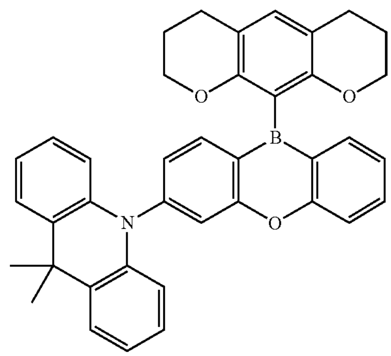
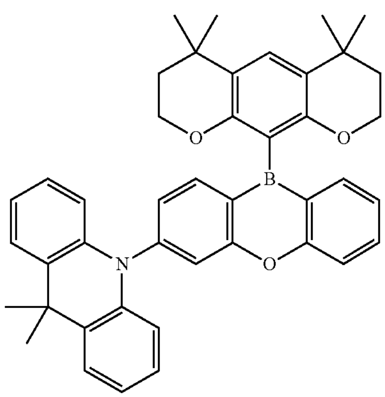
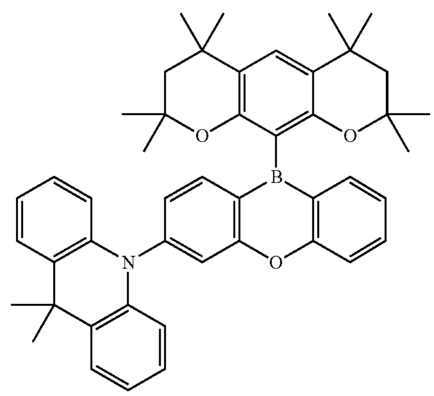
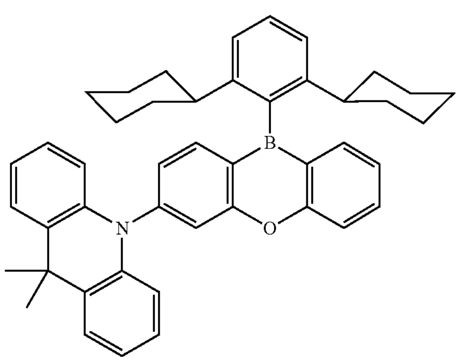
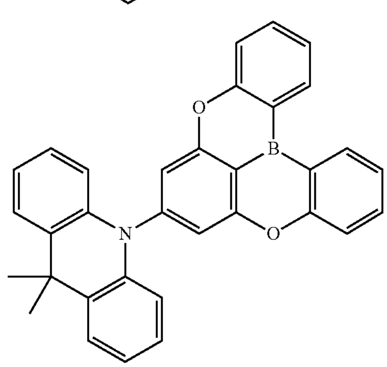

-continued
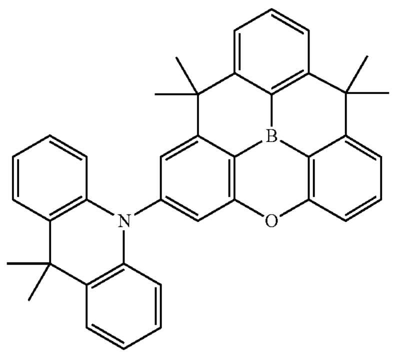
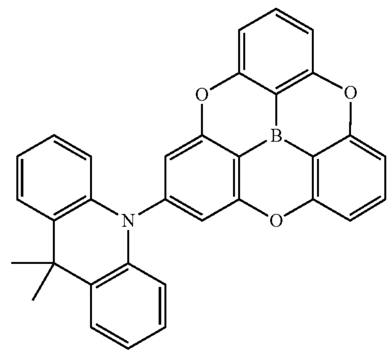
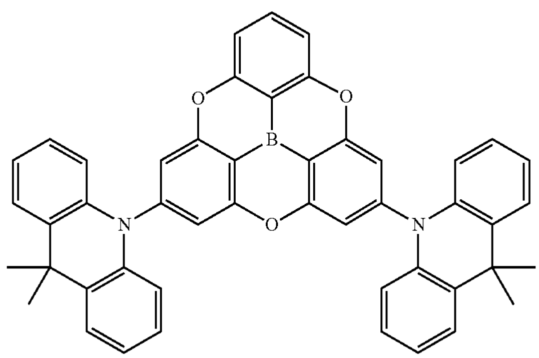
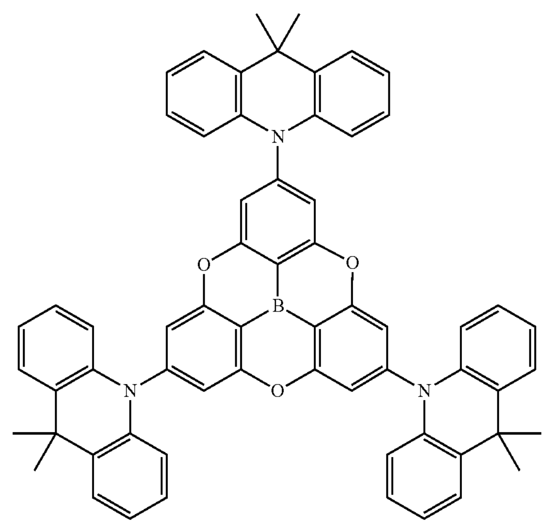
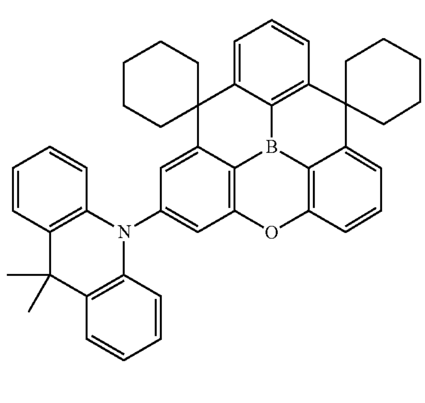
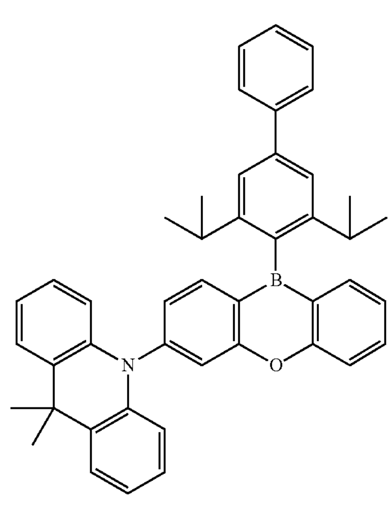

-continued
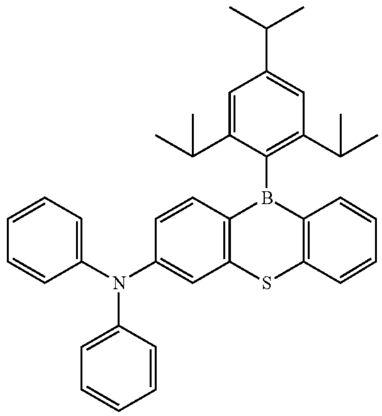
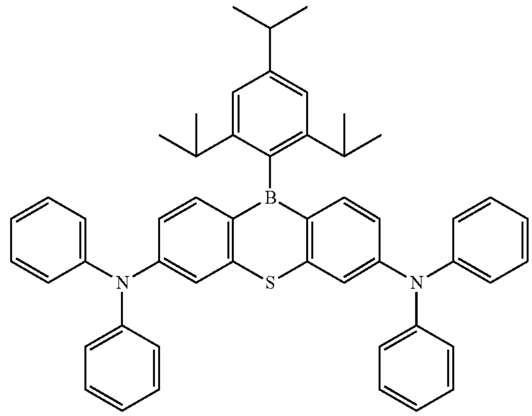
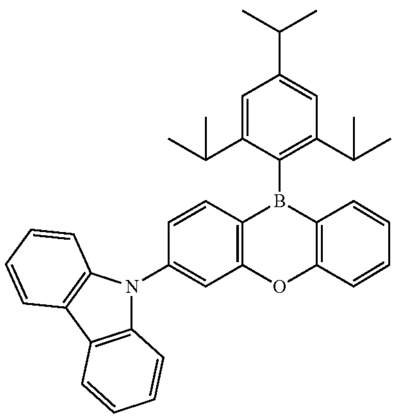
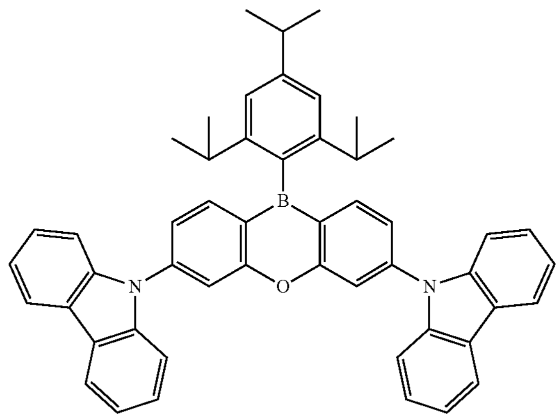
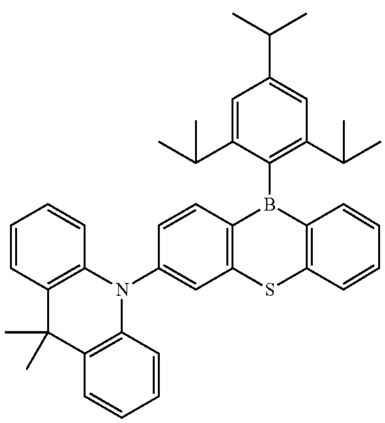
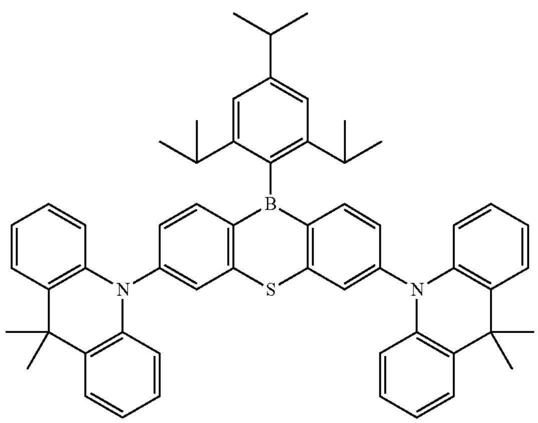
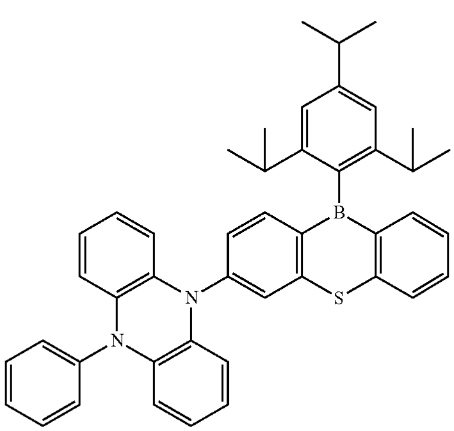
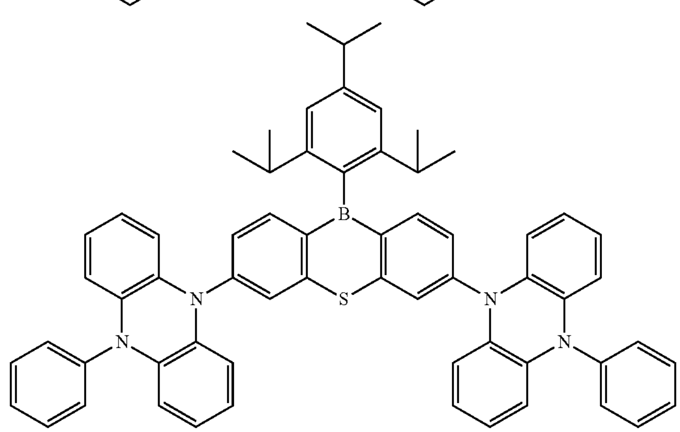

-continued
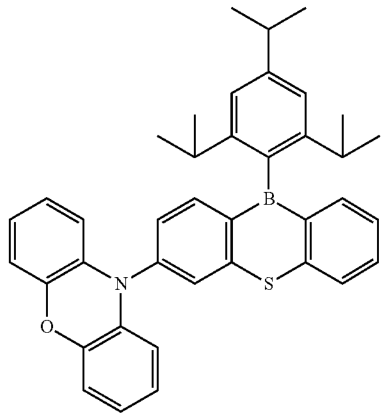
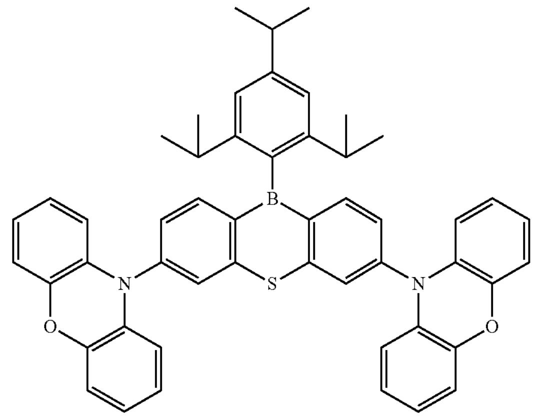
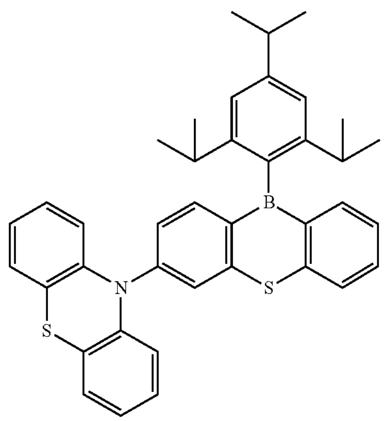
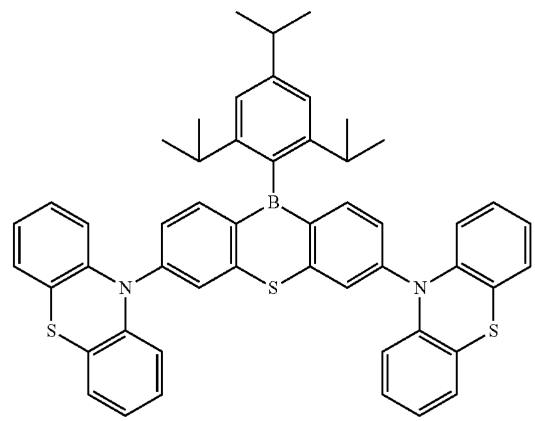
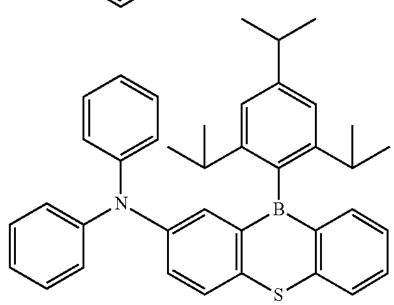
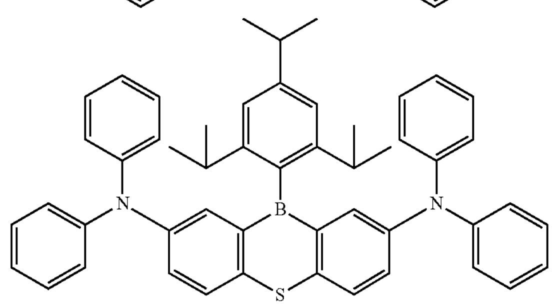
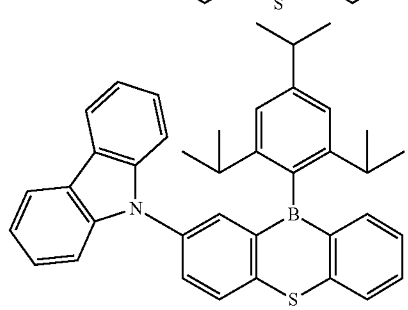
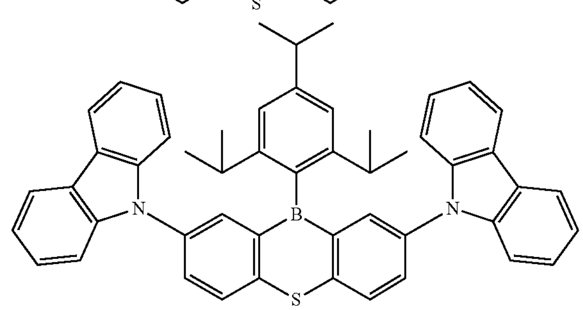
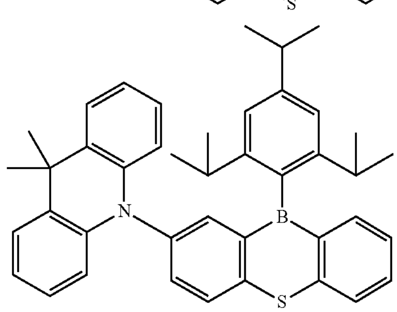
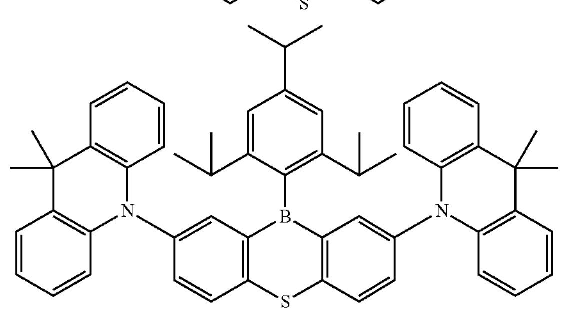

-continued
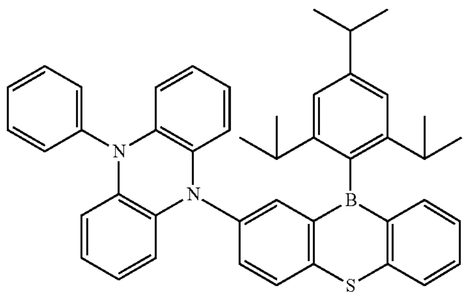
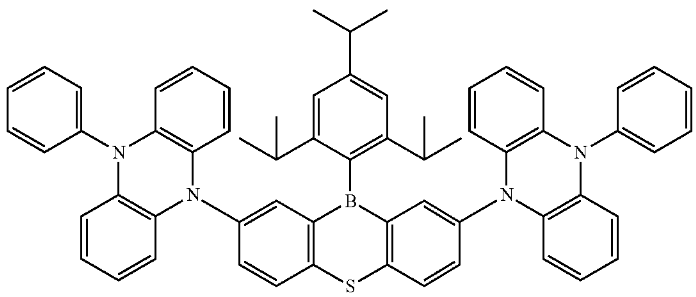
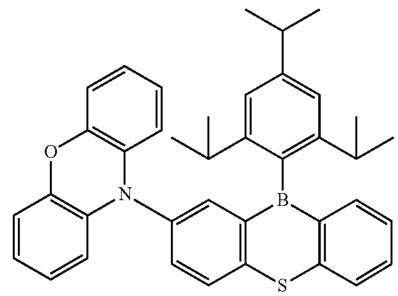
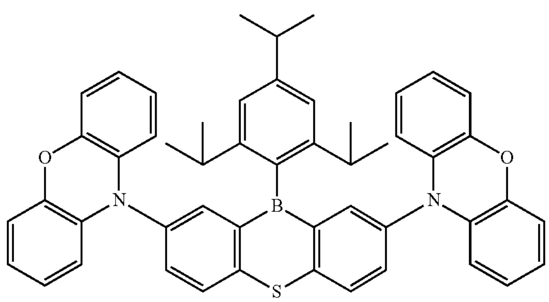
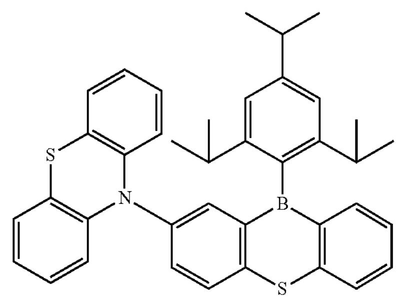
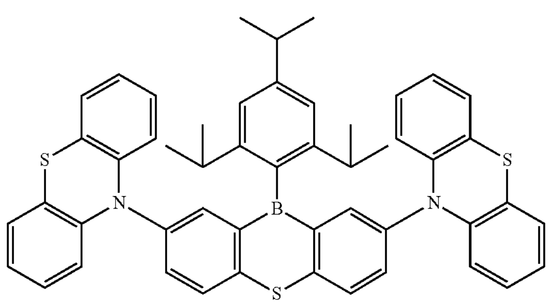
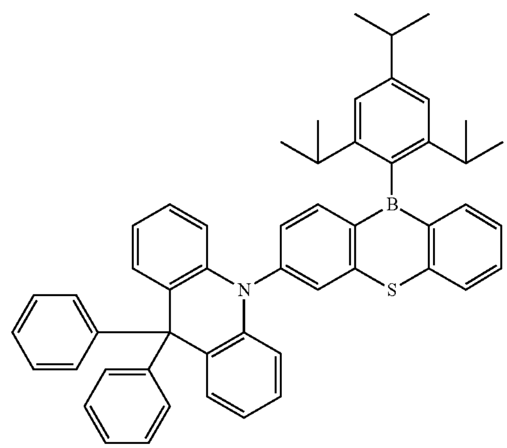
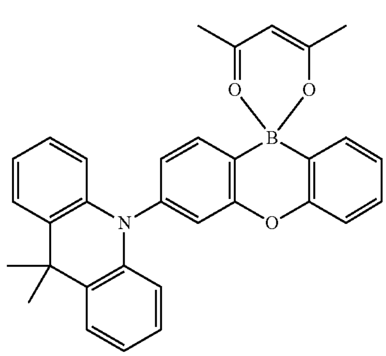
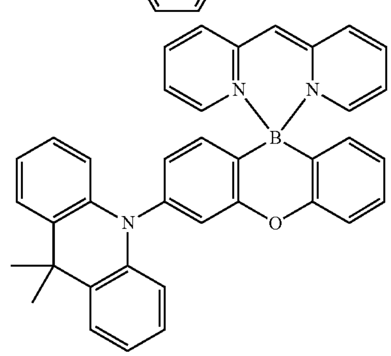

-continued
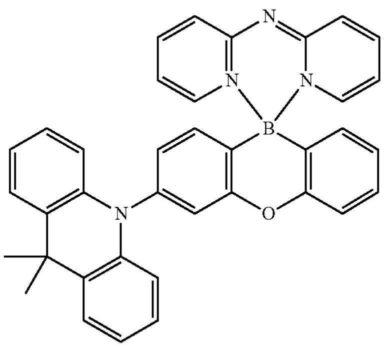
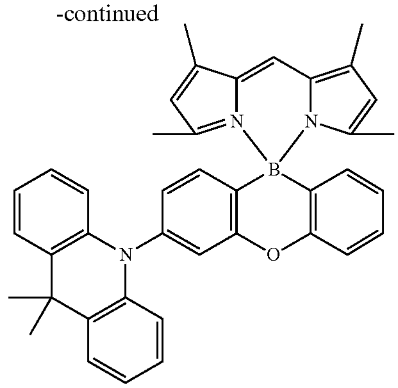
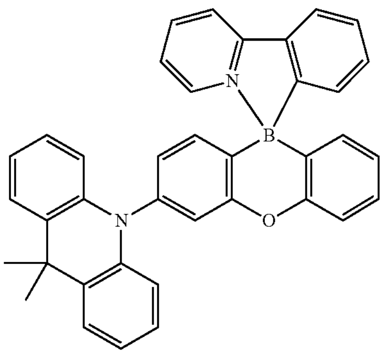
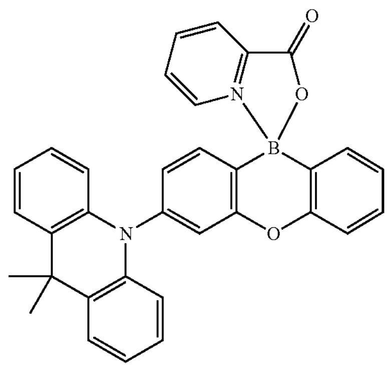
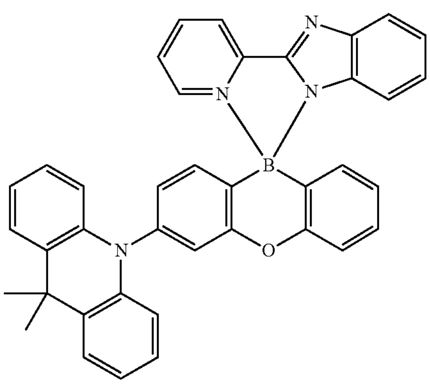
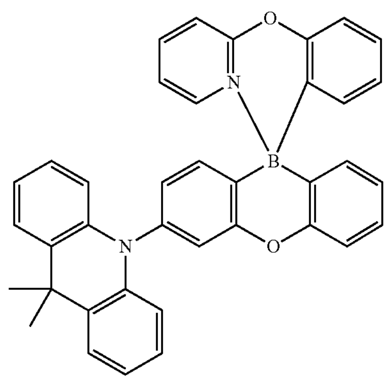
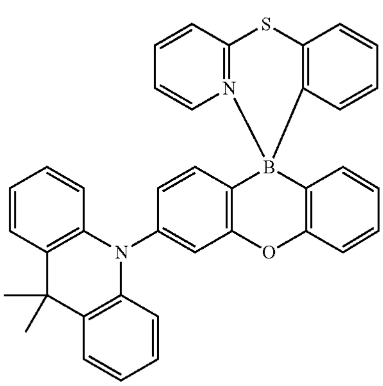
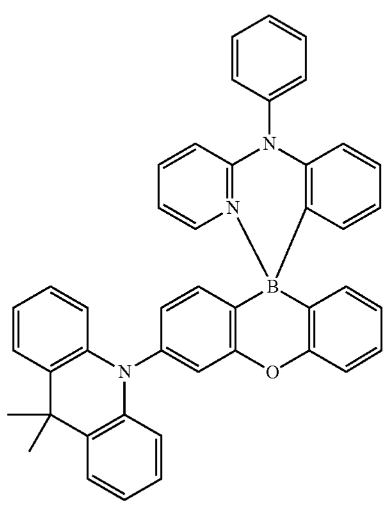

-continued
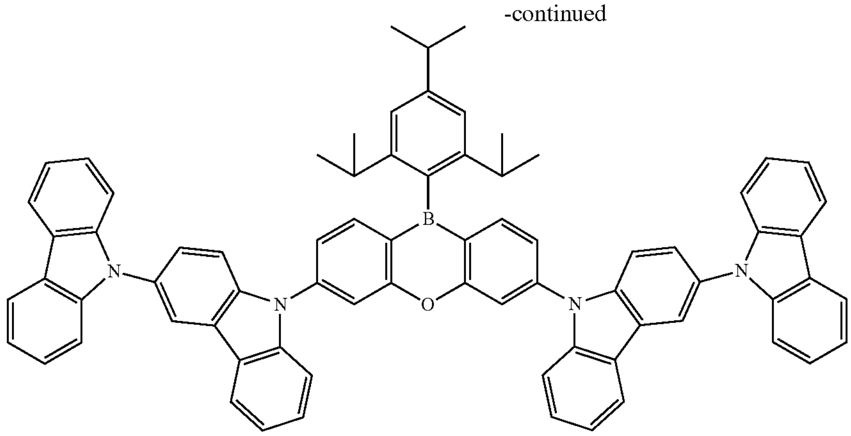
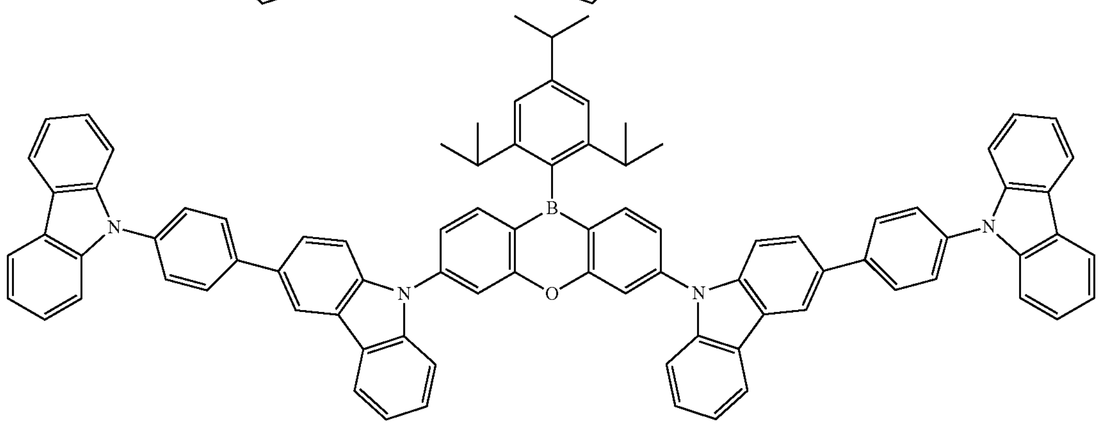
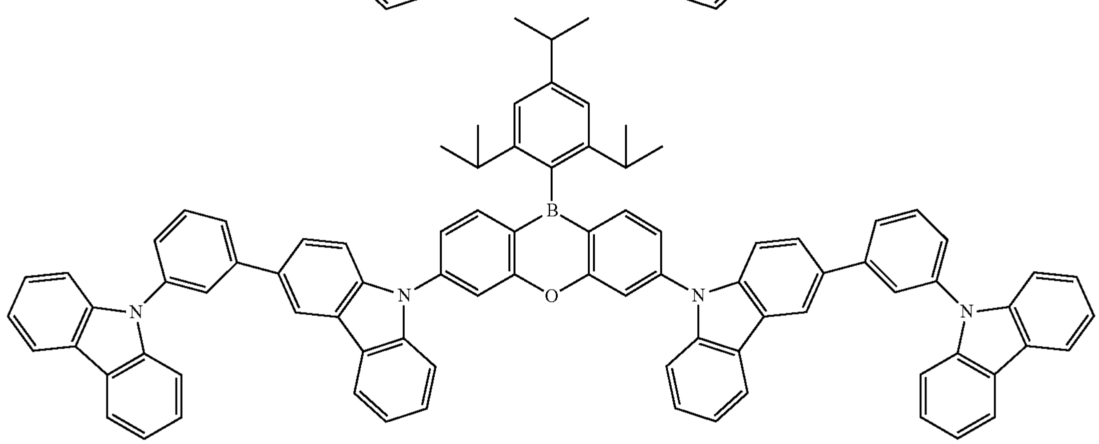
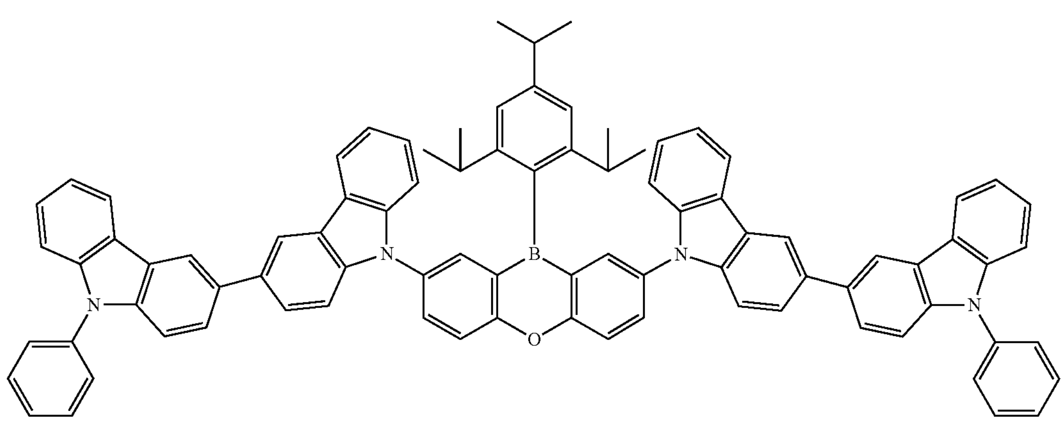

-continued
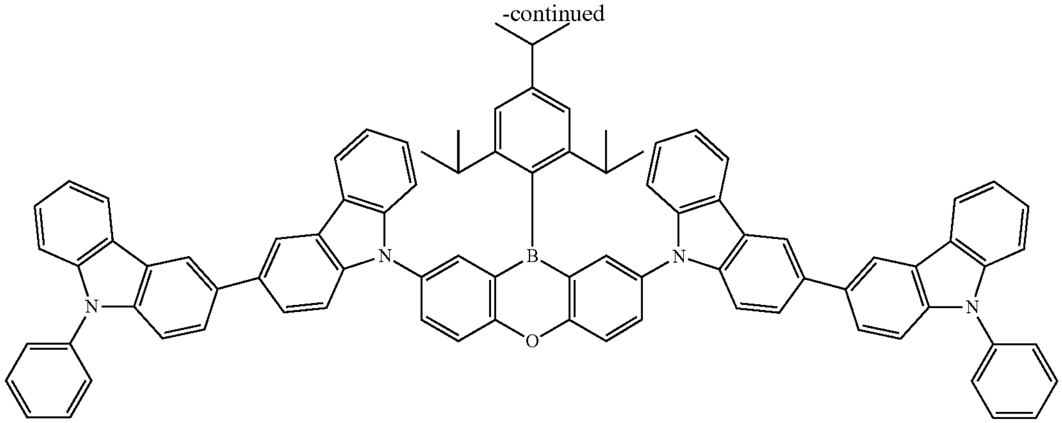
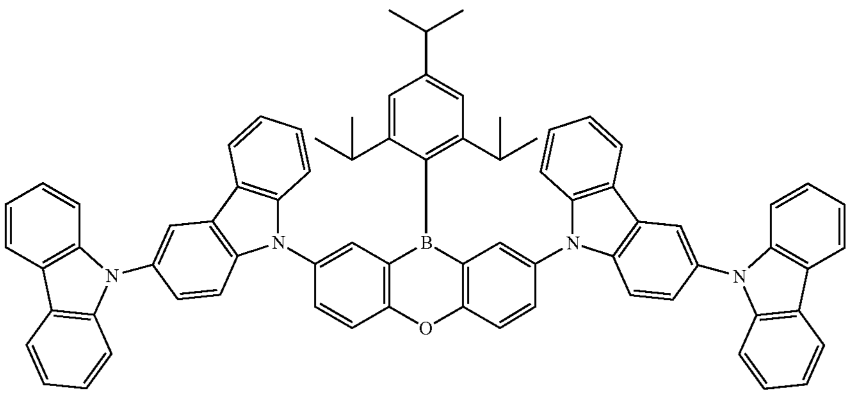
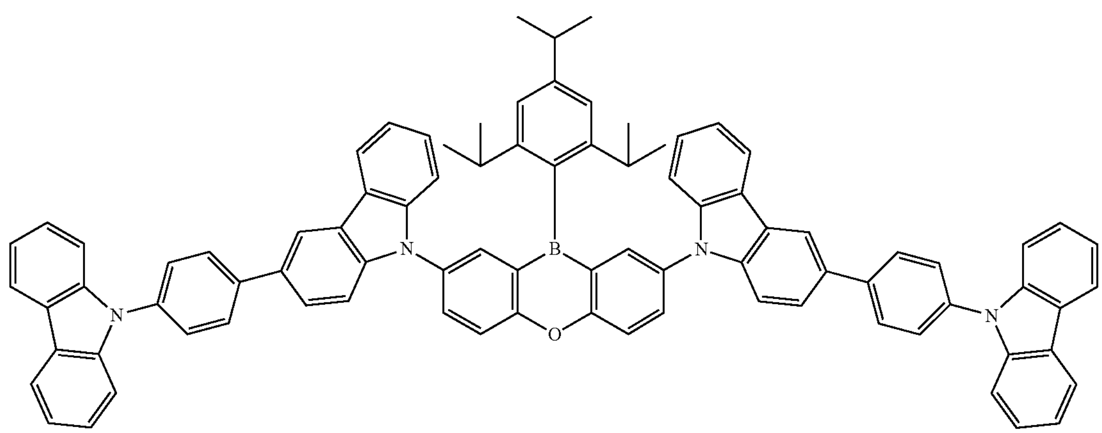
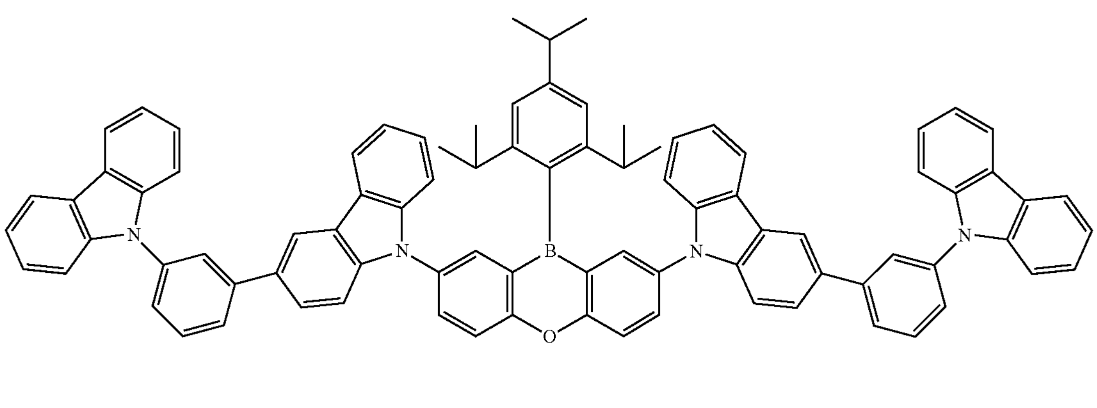

Examples of the preferred light emitting material include the following compounds.

(1) A compound represented fey the following general formula (291):

General Formula (291)

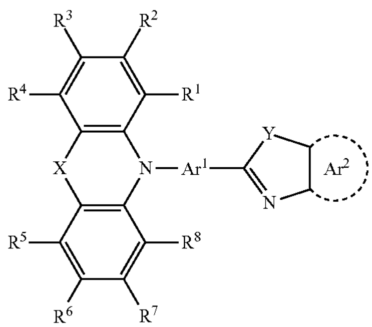

wherein in the general formula (291), X represents O, S, N—$R^{11}$, C═O, C($R^{12}$) ($R^{13}$), or Si($R^{14}$) ($R^{15}$); Y represents O, S, or N—$R^{16}$; $Ar^1$ represents a substituted or unsubstituted arylene group; $Ar^2$ represents an aromatic ring or a heteroaromatic ring; and $R^1$ to $R^8$ and $R^{11}$ to $R^{16}$ each independently represent a hydrogen atom or a substituent, in which $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure.

(2) The compound according to the item (1), wherein the compound represent by the general formula (291) is a compound represented by the following general formula (292):

General Formula (292)

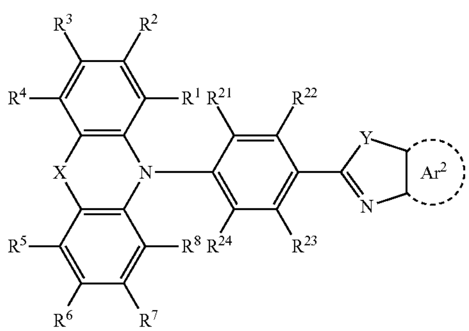

wherein in the general formula (292), X represents O, S, N—$R^{11}$, C═O, C($R^{12}$) ($R^{13}$), or Si($R^{14}$) ($R^{15}$); Y represents O, S, or N—$R^{16}$; $Ar^2$ represents an aromatic ring or a heteroaromatic ring; and $R^1$ to $R^8$ and $R^{11}$ to $R^{16}$, and $R^{21}$ to $R^{24}$ each independently represent a hydrogen atom or a substituent, in which $R^1$ and $R^2$, $R^2$ and $R^3$, $R^3$ and $R^4$, $R^5$ and $R^6$, $R^6$ and $R^7$, $R^7$ and $R^8$, $R^{21}$ and $R^{22}$, and $R^{23}$ and $R^{24}$ each may be bonded to each other to form a cyclic structure.

(3) The compound according to the item (1), wherein the compound represented by the general formula (291) is a compound represented by the following general formula (293):

General Formula (293)

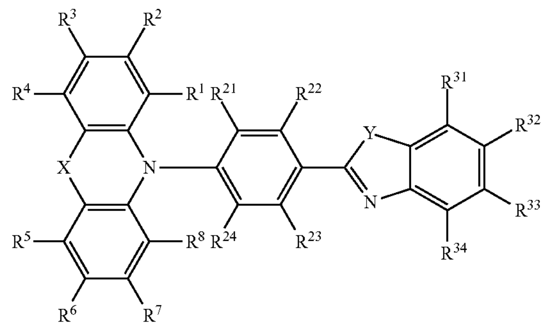

wherein in the general formula (293), X represents O, S, N—$R^{11}$, C═O, C($R^{12}$) ($R^{13}$), or Si($R^{14}$) ($R^{15}$); Y represents O, S, or N—$R^{16}$; and $R^1$ to $R^8$, $R^{11}$ to $R^{16}$, $R^{21}$ to $R^{24}$, and $R^{31}$ to $R^{34}$ each independently represent a hydrogen atom or a substituent, in which $R^1$ and $R^2$, $R^2$ and $R^3$, $R^3$ and $R^4$, $R^5$ and $R^6$, $R^6$ and $R^7$, $R^7$ and $R^8$, $R^{21}$ and $R^{22}$, $R^{23}$ and $R^{24}$, $R^{31}$ and $R^{32}$, $R^{32}$ and $R^{33}$, and $R^{33}$ and $R^{34}$ each may be bonded to each other to form a cyclic structure.

(4) The compound according to any one of the items (1) to (3), wherein X represent O or S.

(5) The compound according to any one of the items (1) to (4), wherein X represents O, S, or N—$R^{16}$, and $R^{16}$ represents a substituted or unsubstituted aryl group.

(6) The compound according to any one of the items (1) to (5), wherein $R^1$ to $R^8$ each independently represent a hydrogen atom, a fluorine atom, a chlorine atom, a cyano group, a substituted or unsubstituted alkyl group having from 1 to 10 carbon atoms, a substituted or unsubstituted alkoxy group having from 1 to 10 carbon atoms, a substituted or unsubstituted dialkylamino group having from 2 to 10 carbon atoms, a substituted or unsubstituted diarylamino group having from 12 to 40 carbon atoms, a substituted or unsubstituted aryl group having from 6 to 15 carbon atoms, a substituted or unsubstituted heteroaryl group having from 3 to 12 carbon atoms.

Examples of the compound include the following compounds.

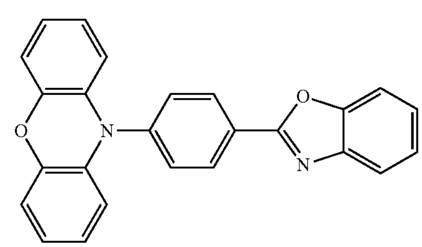

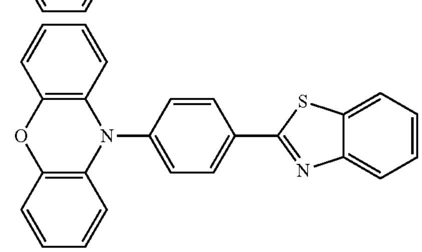

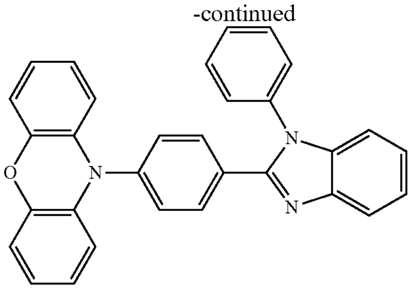
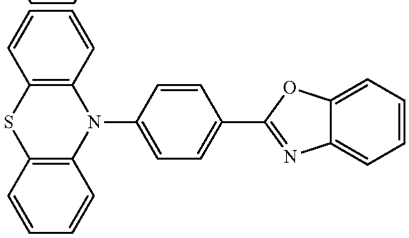
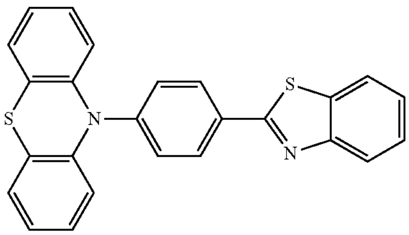
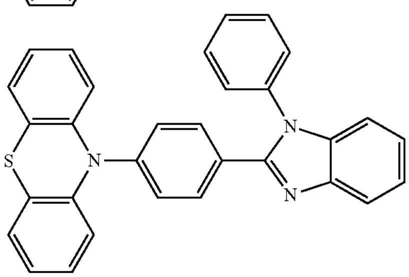
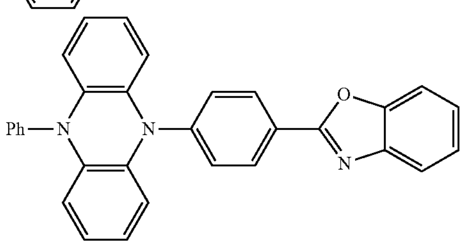
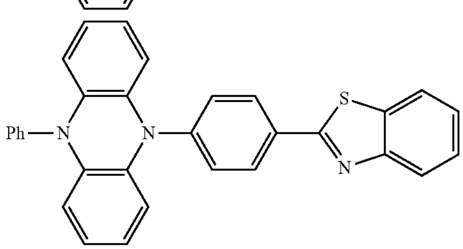
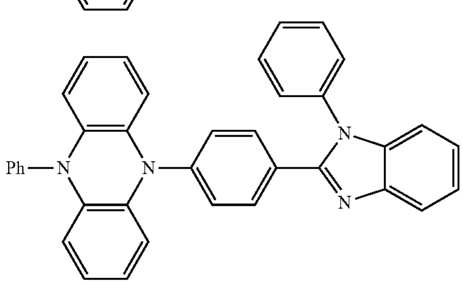
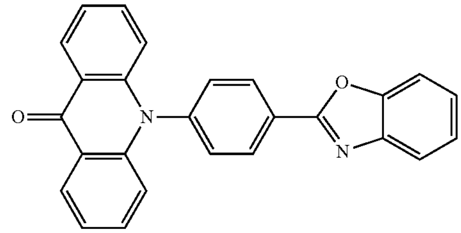
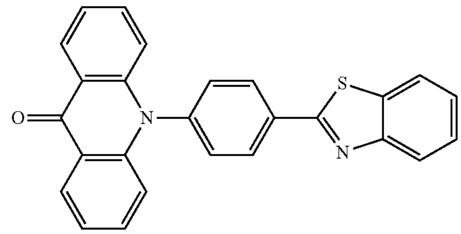
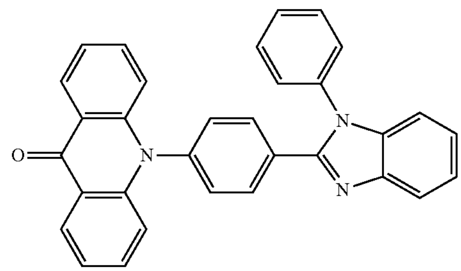
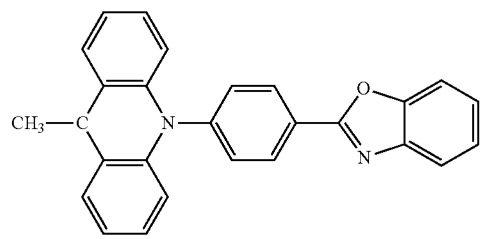
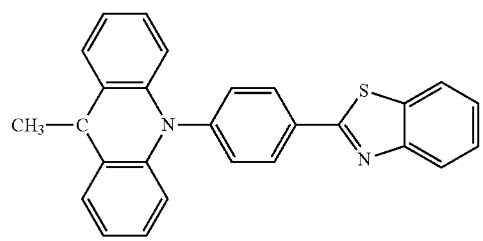
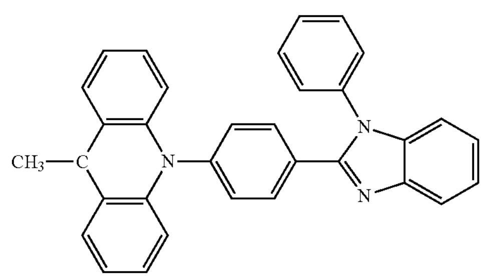
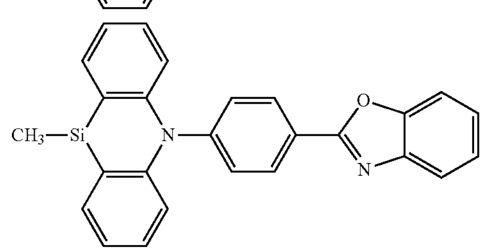

-continued

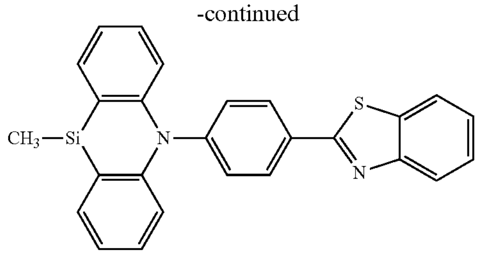

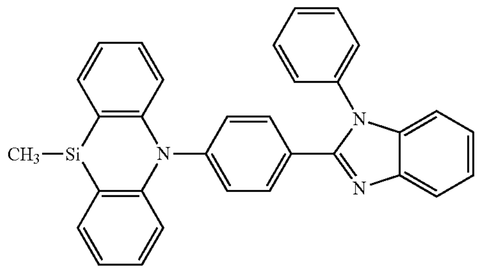

Examples of the preferred light emitting material include the following compounds.

(1) A compound represented by the following general formula (301):

$(D)_n$-A General Formula (301)

wherein in the general formula (301), D represents a group represented by the following general formula (302); A represents an n-valent group containing a structure represented by the following general formula (303); and n represents an integer of from 1 to 8:

General Formula (302)

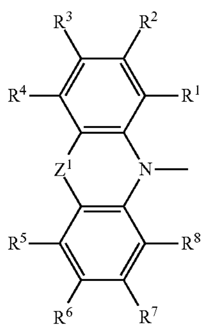

wherein in the general formula (302), $Z^1$ represents O, S, C═O, $C(R^{21})(R^{22})$, $Si(R^{23})(R^{24})$, N—$Ar^3$, or a single bond; $R^{21}$ to $R^{24}$ each independently represent an alkyl group having from 1 to 8 carbon atoms; $Ar^3$ represents a substituted or unsubstituted aryl group; and $R^1$ to $R^8$ each independently represent a hydrogen atom or a substituent, in which $R^1$ and $R^2$, $R^2$ and $R^3$, $R^3$ and $R^4$, $R^5$ and $R^6$, $R^6$ and $R^7$, and $R^7$ and $R^8$ may be bonded to each other to form a cyclic structure, and when $Z^1$ represents a single bond, at least one of $R^1$ to $R^8$ represents a substituted or unsubstituted diarylamino group:

General Formula (303)

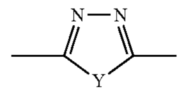

wherein in the general formula (303), Y represents O, S, or N—$Ar^4$; and $Ar^4$ represents a substituted or unsubstituted aryl group.

(2) The compound according to the item (1), wherein in the general formula (302), $Z^1$ represents O, S, C═O, $C(R^{21})(R^{22})$, $Si(R^{23})(R^{24})$, or a single bond.

(3) The compound according to the item (1), wherein in the general formula (302), $Z^1$ represents N—$Ar^3$.

(4) The compound according to any one of the items (1) to (3), wherein in the general formula (301), A represents a group having a structure represented by the following general formula (304):

General Formula (304)

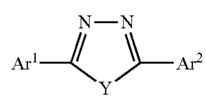

wherein in the general formula (304), Y represents O, S, or N—$Ar^4$; and $Ar^1$ and $Ar^2$ each independently represent a substituted or unsubstituted aromatic group.

(5) The compound according to any one of the items (1) to (4), wherein in the general formula (301), n represents an integer of from 1 to 4.

(6) The compound according to any one of the items (1) to (3), wherein the compound is represented by the following general formula (305):

General Formula (305)

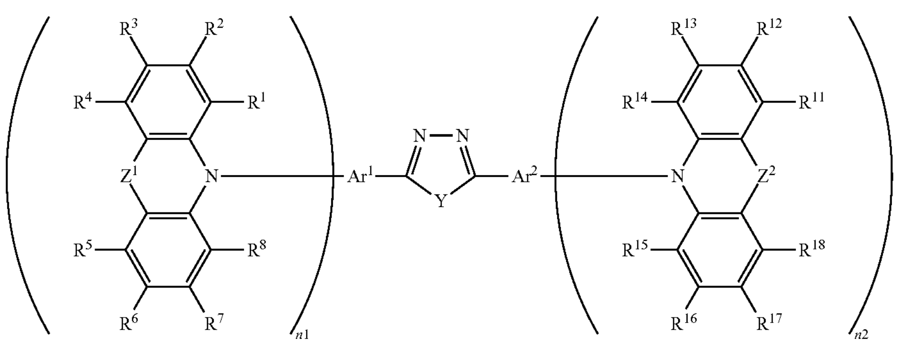

wherein in the general formula (305), $Z^1$ and $Z^2$ each independently represent O, S, C═O, C($R^{21}$) ($R^{22}$), Si($R^{23}$) ($R^{24}$), N—$Ar^3$, or a single bond; $R^{21}$ to $R^{24}$ each independently represent an alkyl group having from 1 to 8 carbon atoms; $Ar^3$ represents a substituted or unsubstituted aryl group; $Ar^1$ and $Ar^2$ each independently represent a substituted or unsubstituted aromatic group; Y represents O, S, or N—$Ar^4$; $Ar^4$ represents a substituted or unsubstituted aryl group; $R^1$ to $R^8$ and $R^{11}$ to $R^{18}$ each independently represent a hydrogen atom or a substituent, in which $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{12}$ and $R^{13}$, $R^{13}$ and $R^{14}$, $R^{15}$ and $R^{16}$, $R^{15}$ and $R^{17}$, and $R^{17}$ and $R^{18}$ each may be bonded to each other to form a cyclic structure, provided that when $Z^1$ represents a single bond, at least one of $R^1$ to $R^8$ represents a substituted or unsubstituted diarylamino group, and when $Z^2$ represents a single bond, at least one of $R^{11}$ to $R^{18}$ represents a substituted or unsubstituted diarylamino group; and n1 and $n^2$ each independently represent an integer of from 0 to 8, provided that the sum of n1 and n2 is from 1 to 8.

(7) The compound according to the item (6), wherein in the general formula (305), $Z^1$ and $Z^2$ each independently represent O, S, N—$Ar^3$, or a single bond.

(8) The compound according to the item (6) or (7), wherein in the general formula (305), Y represents O or N—$Ar^4$.

(9) The compound according to any one of the items (1) to (3), wherein the compound is represented by the following general formula (306):

General Formula (306)

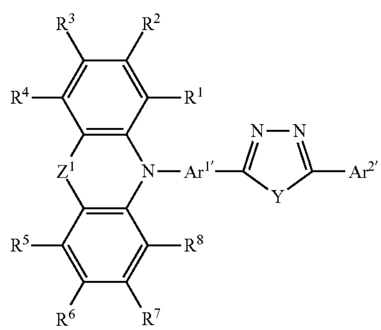

wherein in the general formula (306), $Z^1$ represents O, S, C═O, C($R^{21}$) ($R^{22}$), Si($R^{23}$) ($R^{24}$), N—$Ar^3$, or a single bond; $R^{21}$ to $R^{24}$ each independently represent an alkyl group having from 1 to 8 carbon atoms; $Ar^3$ represents a substituted or unsubstituted aryl group; $Ar^{1'}$ represents a substituted or unsubstituted aryl one group; $Ar^{2'}$ represents a substituted or unsubstituted aryl group; Y represents O, S, or N—$Ar^4$; $Ar^4$ represents a substituted or unsubstituted aryl group; and $R^1$ to $R^8$ each independently represent a hydrogen atom or a substituent, in which $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure, provided that when $Z^1$ represents a single bond, at least one of $R^1$ to $R^8$ represents a substituted or unsubstituted diarylamino group.

(10) The compound according to any one of the items (1) to (3), wherein the compound is represented by the following general formula (307):

General Formula (307)

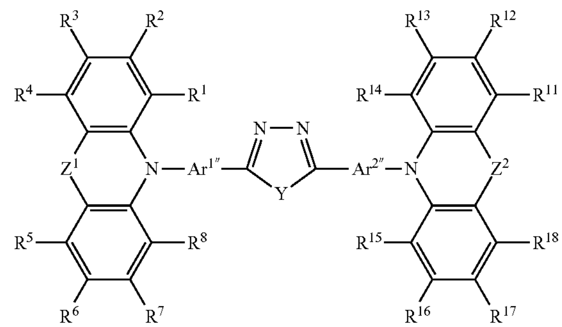

wherein in the general formula (307), $Z^1$ and $Z^2$ each independently represent O, S, C═O, C($R^{21}$) ($R^{22}$), Si($R^{23}$) ($R^{24}$), N—$Ar^3$, or a single bond; $R^{21}$ to $R^{24}$ each independently represent an alkyl group having from 1 to 8 carbon atoms; $Ar^3$ represents a substituted or unsubstituted aryl group; $Ar^{1''}$ and $Ar^{2''}$ each independently represent a substituted or unsubstituted arylene group; Y represents O, S, or N—$Ar^4$; $Ar^4$ represents a substituted or unsubstituted aryl group; and $R^1$ to $R^8$ and $R^{11}$ to $R^{18}$ each independently represent a hydrogen atom or a substituent, in which $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{12}$ and $R^{13}$, $R^{13}$ and $R^{14}$, $R^{15}$ and $R^{16}$, $R^{16}$ and $R^{17}$, and $R^{17}$ and $R^{18}$ each may be bonded to each other to form a cyclic structure, provided that when $Z^1$ represents a single bond, at least one of $R^1$ to $R^8$ represents a substituted or unsubstituted diarylamino group, and when $Z^2$ represents a single bond, at least one of $R^{11}$ to $R^{18}$ represents a substituted or unsubstituted diarylamino group.

(11) The compound according to the item (10), wherein in the general formula (307), $Z^1$ and $Z^2$ are the same as each other, $Ar^{1''}$ and $Ar^{2''}$ are the same as each other, $R^1$ and $R^{14}$ are the same as each other, $R^2$ and $R^{13}$ are the same as each other, $R^3$ and $R^{12}$ are the same as each other, $R^4$ and $R^{11}$ are the same as each other, $R^5$ and $R^{18}$ are the same as each other, $R^6$ and $R^{17}$ are the same as each other, $R^7$ and $R^{16}$ are the same as each other, and $R^8$ and $R^{15}$ are the same as each other.

(12) The compound according to the item (10) or (11), wherein in the general formula (307), $Z^1$ an $Z^2$ each independently represents O, S, or N—$Ar^3$.

Examples of the compound include the following compounds.

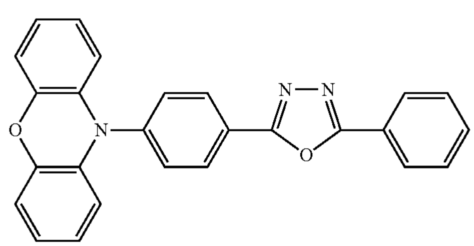

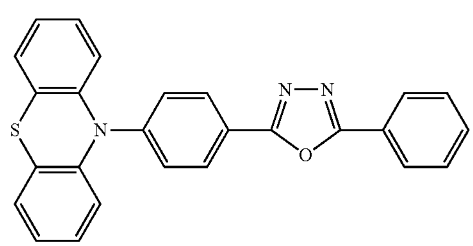

-continued
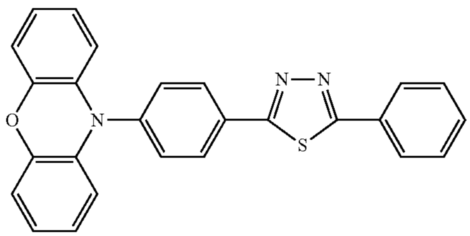
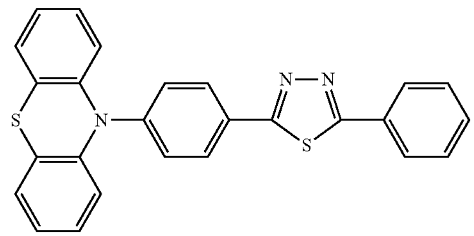
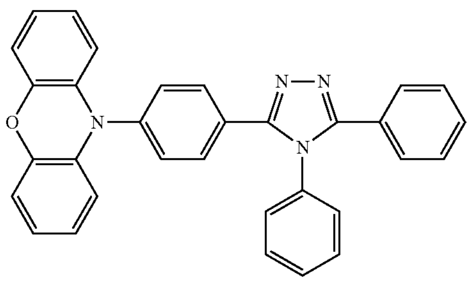
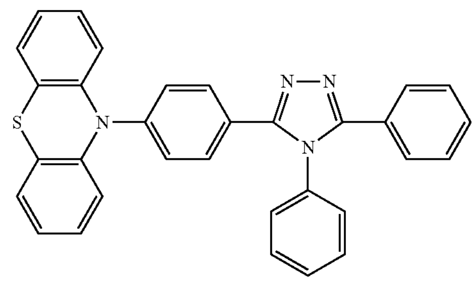
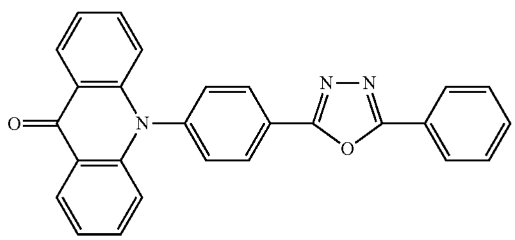
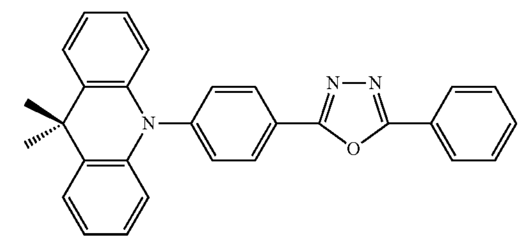
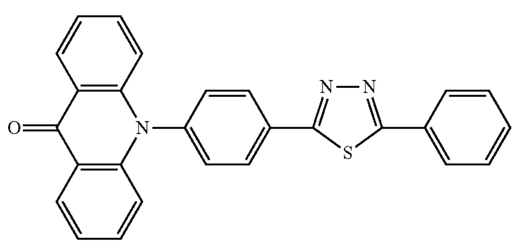
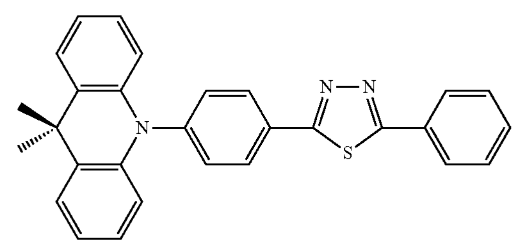
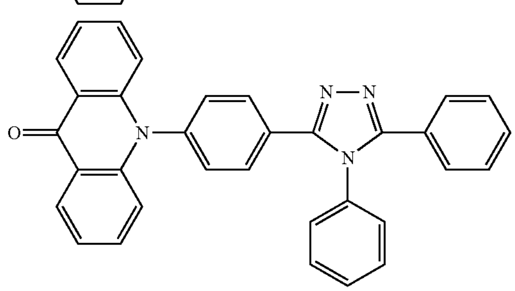
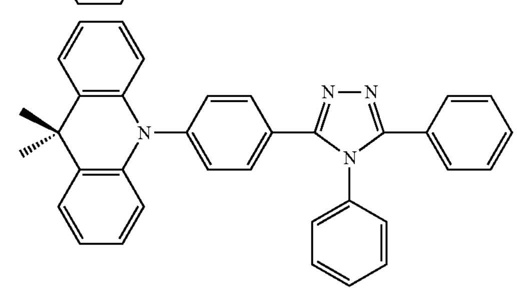
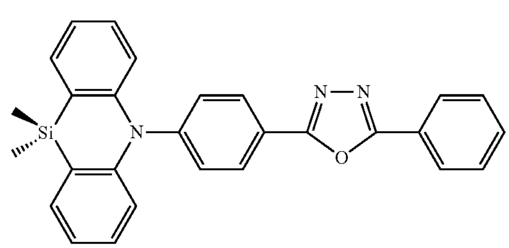
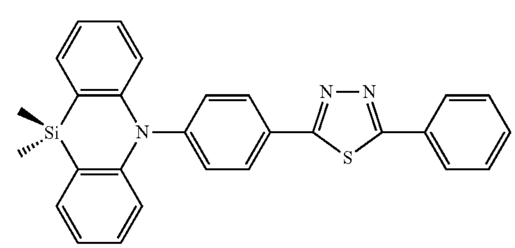

-continued
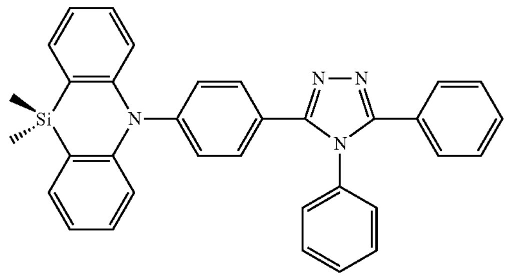
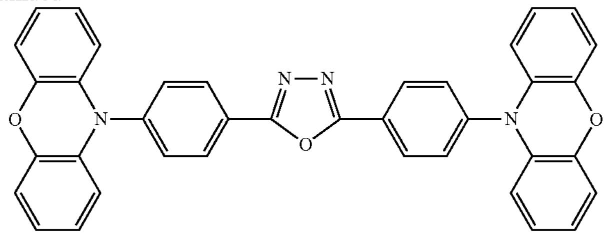
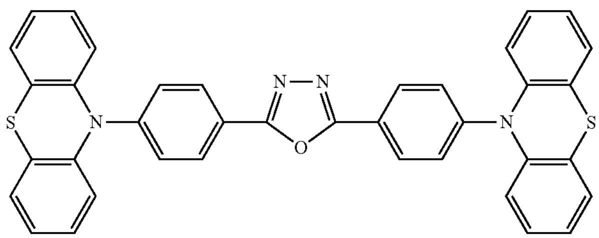
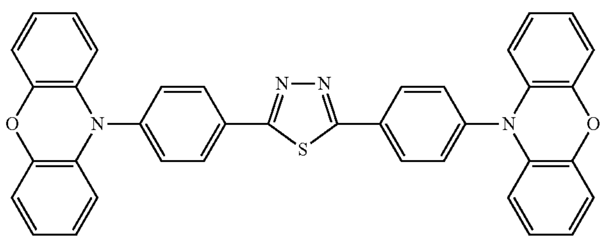
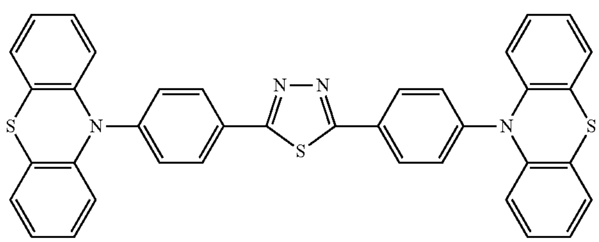
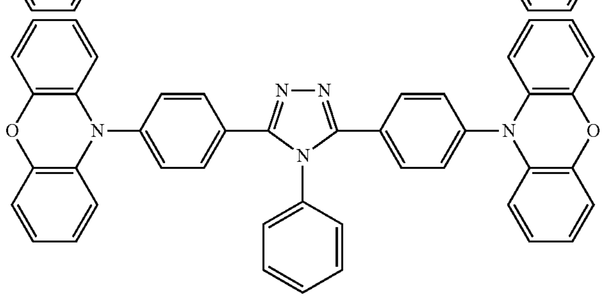
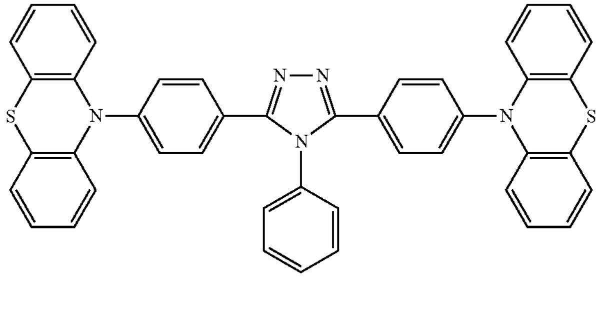

-continued
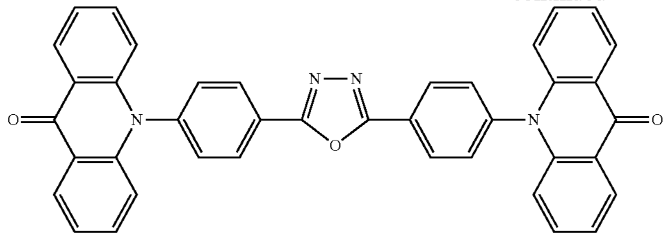
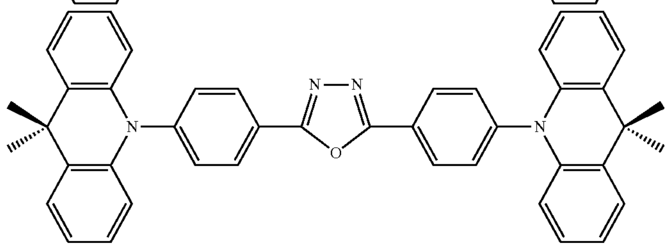
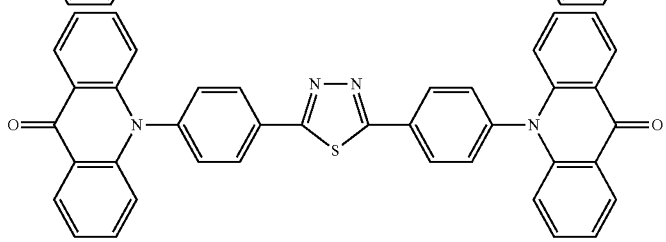
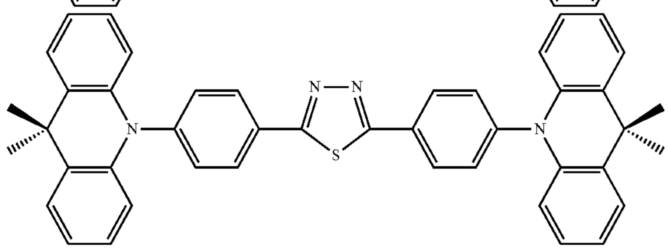
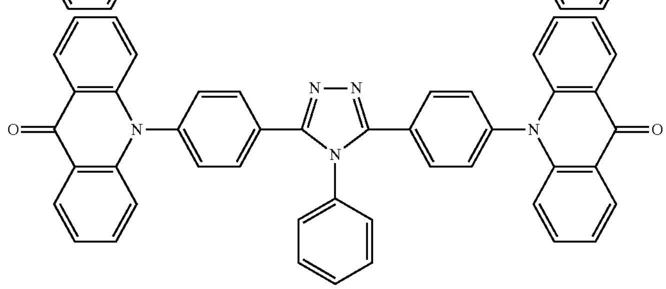
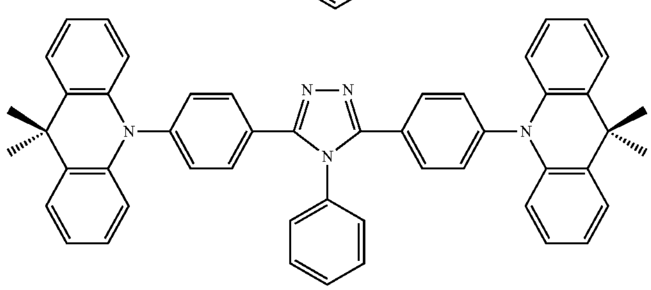
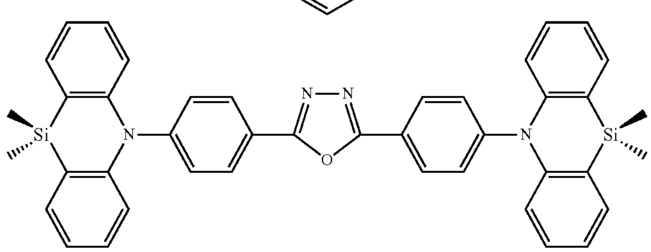

-continued
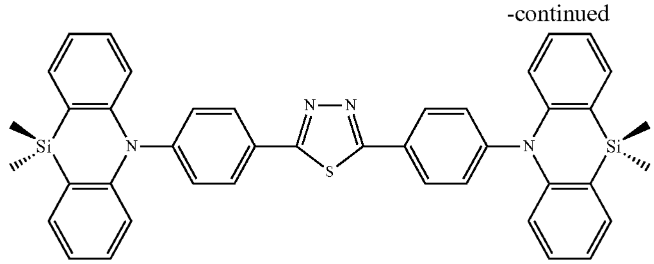
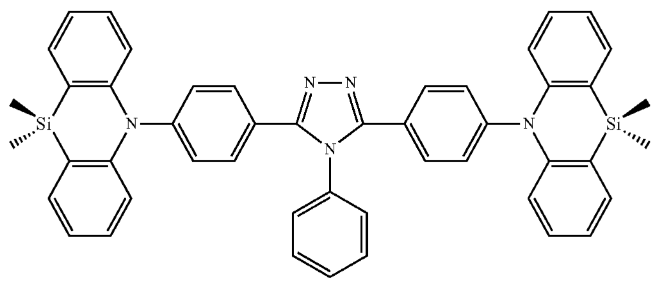
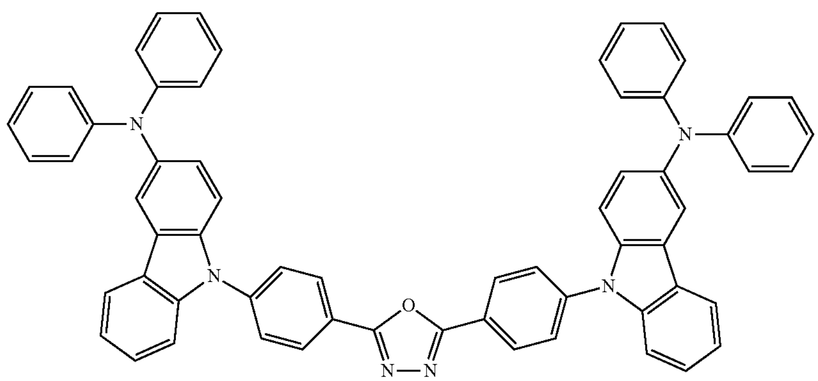
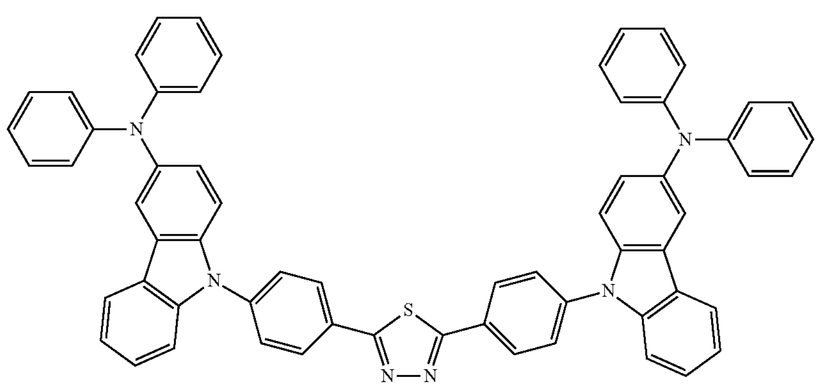
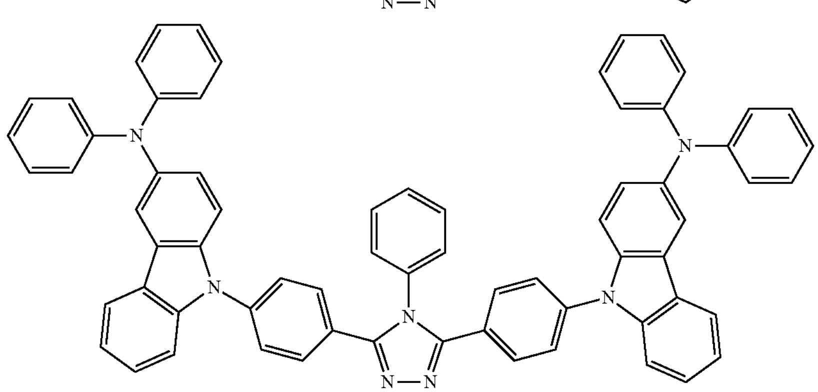

-continued
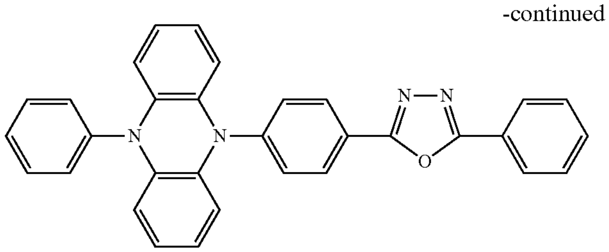
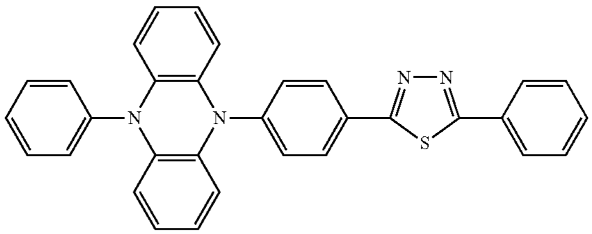
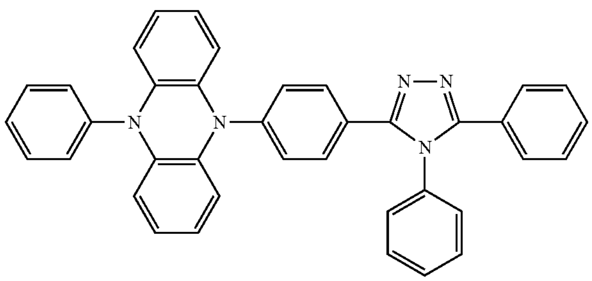
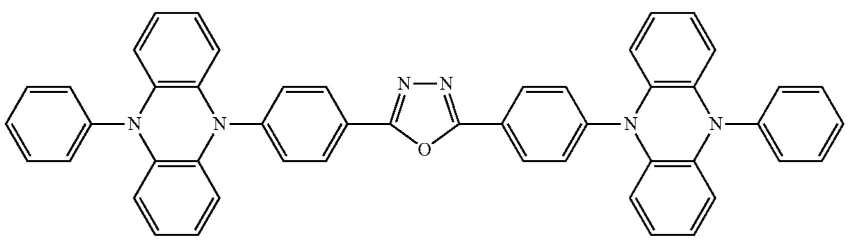
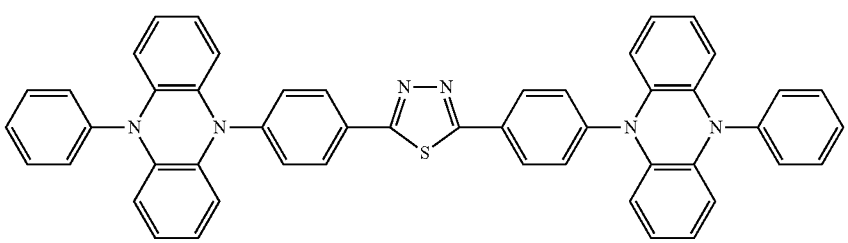
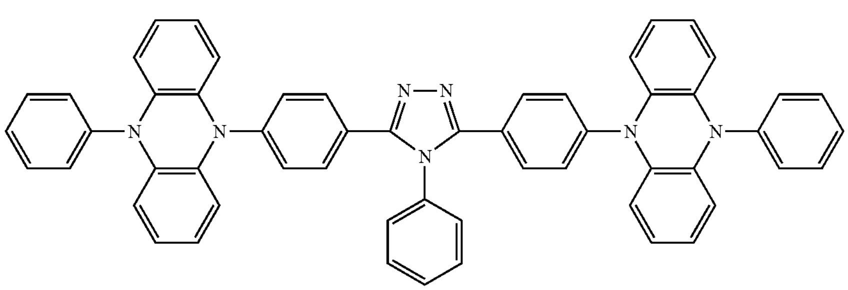

Examples of the preferred light emitting material include the following compounds.

(1) A compound represented by the following general formula (311):

A-D-A General Formula (311)

wherein in the general formula (311), D represents a divalent group containing a structure represented by the following formula (in which hydrogen atoms in the structure each may be substituted by a substituent):

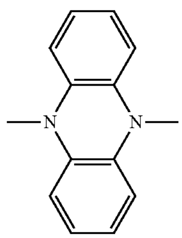

and two groups represented by A each independently are a group having a structure selected from the following group (in which hydrogen atoms in the structure each may be substituted by a substituent):

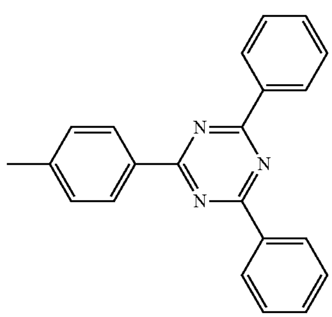

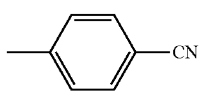

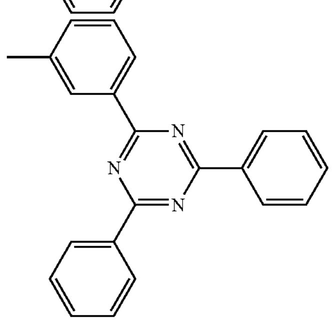

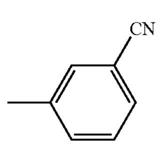

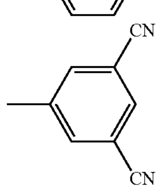

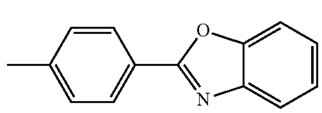

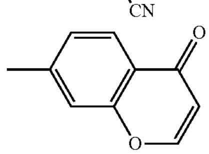

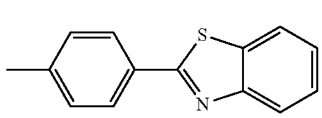

-continued

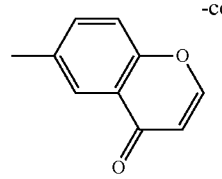

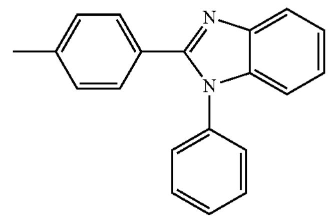

(2) The compound according to the item (1), wherein in the general formula (311), D represents a group having a structure represented by the following general formula (312):

General Formula (312)

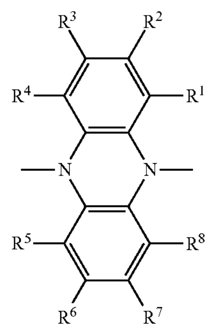

wherein in the general formula (312), $R^1$ to $R^8$ each independently represent a hydrogen atom or a substituent, in which $R^1$ and $R^2$, $R^2$ and $R^3$, $R^3$ and $R^4$, $R^5$ and $R^6$, $R^6$ and $R^7$, and $R^7$ and $R^8$ each may be bonded to each other to form a cyclic structure.

(3) The compound according to the item (1) or (2), wherein in the general formula (311), the two groups represented by A have the same structure.

(4) The compound according to any one of the items (1) to (3), wherein the compound is represented by the following general formula (313):

General Formula (313)

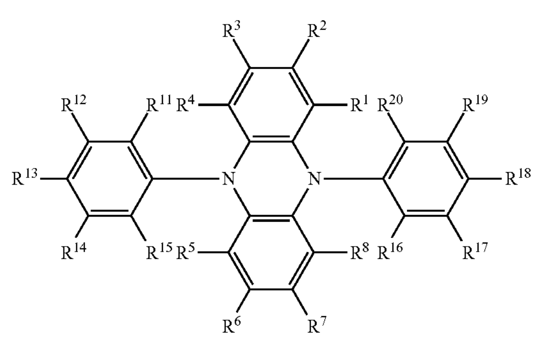

wherein in the general formula (313), $R^1$ to $R^8$ and $R^{11}$ to $R^{20}$ each independently represent a hydrogen atom or a substituent, in which $R^1$ and $R^2$, $R^2$ and $R^3$, $R^3$ and $R^4$, $R^5$ and $R^6$, $R^6$ and $R^7$, $R^7$ and $R^8$, $R^{11}$ and $R^{12}$, $R^{12}$ and $R^{13}$, $R^{13}$ and $R^{14}$, $R^{14}$ and $R^{15}$, $R^{16}$ and $R^{17}$, $R^{17}$ and $R^{18}$, $R^{18}$ and $R^{19}$, and $R^{19}$ and $R^{20}$ each may be bonded to each other to form a cyclic structure, provided that the general formula (313) satisfies the following conditions <1> and <2>:

<1> represents a cyano group or a group having the following structure (in which hydrogen atoms each may be substituted by a substituent):

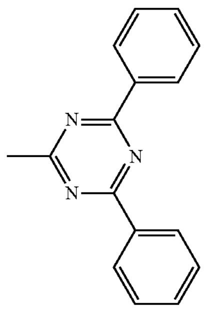 [SMILES: Cc1nc(-c2ccccc2)nc(-c2ccccc2)n1]

or $R^{13}$ represents a cyano group, or a group having any one of the following structures (in which hydrogen atoms each may be substituent by a substituent):

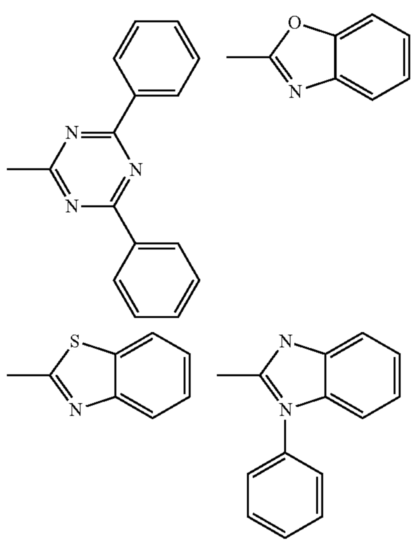

or $R^{12}$ and $R^{13}$ are bonded to each other to form a group having any one of the following structures (in which hydrogen atoms each may substituted by a substituent) with the benzene ring, to which $R^{12}$ and $R^{13}$ are bonded:

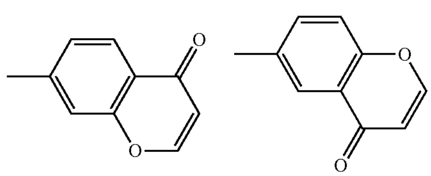

and

<2> $R^{17}$ represents a cyano group or a group having the following structure (in which hydrogen atoms each may be substituted by a substituent):

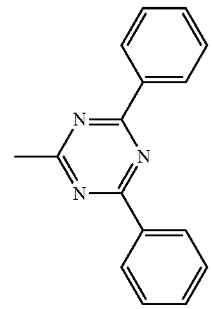 [SMILES: Cc1nc(-c2ccccc2)nc(-c2ccccc2)n1]

or $R^{18}$ represents a cyano group or a group having any one of the following structures (in which hydrogen atoms each may by substituted by a substituent):

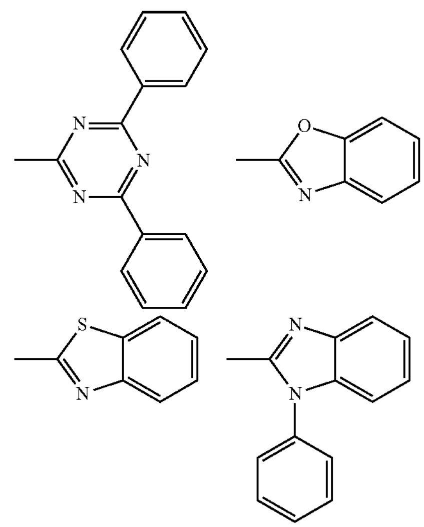

or $R^{17}$ and $R^{18}$ are bonded to each other to form a group having any one of the following structures (in which hydrogen atoms each may be substituted by a substituent) with the benzene ring, to which $R^{17}$ and $R^{18}$ are bonded:

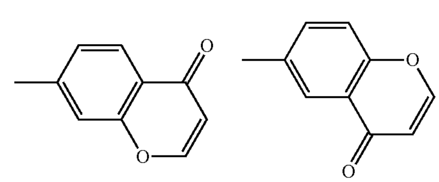

(5) The compound according to the item (4), wherein in the general formula (313), $R^1$ to $R^8$ each independently represent a hydrogen atom, a substituted or unsubstituted alkyl group having from 1 to 10 carbon atoms, a substituted or unsubstituted alkoxy group having from 1 to 10 carbon atoms, a substituted or unsubstituted aryl group having from 6 to 15 carbon atoms, or a substituted or unsubstituted heteroaryl group having from 3 to 12 carbon atoms.

(6) The compound according to the item (4) or (5), wherein in the general formula (313), at least two of $R^{12}$, $R^{13}$, $R^{17}$, and $R^{18}$ each have a substituent to satisfy the conditions <1> and <2>, and the other of $R^{11}$ to $R^{20}$ each independently represent a hydrogen atom, a fluorine atom, a chlorine atom, a cyano group, a substituted or unsubstituted alkyl group having from 1 to 10 carbon atom, a substituted or unsubstituted alkoxy group having from 1 to 10 carbon atoms, a substituted or unsubstituted dialkylamino group having from 2 to 10 carbon atoms, a substituted or unsubstituted diarylamino group having from 12 to 40 carbon atoms, a substituted or unsubstituted aryl group having from 6 to 15 carbon atoms, or a substituted or unsubstituted heteroaryl group having from 3 to 12 carbon atoms.

(7) The compound according to any one of the items (4) to (6), wherein in the general formula (313), a substituent, by which hydrogen atoms in the structures in the conditions <1> and <2> may be substituted, is selected from the group consisting of a fluorine atom, a chlorine atom, a cyano group, a substituted or unsubstituted alkyl group having from 1 to 10 carbon atoms, a substituted or unsubstituted alkoxy group having from 1 to 10 carbon atoms, a substituted or unsubstituted dialkylamino group having from 2 to 10 carbon atoms, a substituted or unsubstituted diarylamino group having from 12 to 40 carbon atoms, a substituted or unsubstituted aryl group having from 6 to 15 carbon atoms, or a substituted or unsubstituted heteroaryl group having from 3 to 12 carbon atoms.

Examples of the compound include the following compounds.

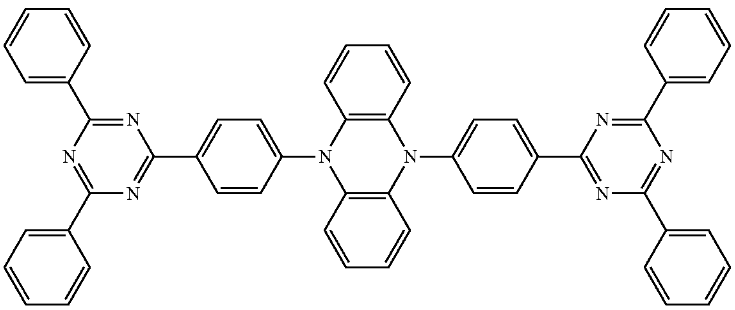

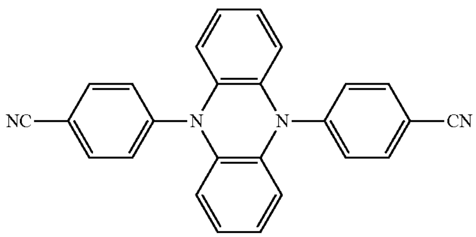

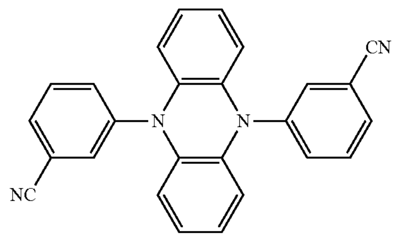

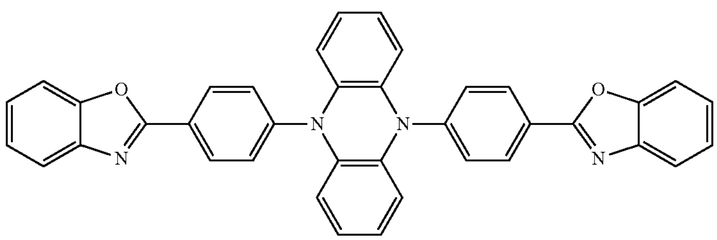

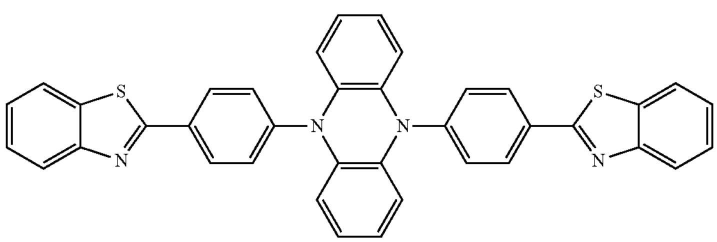

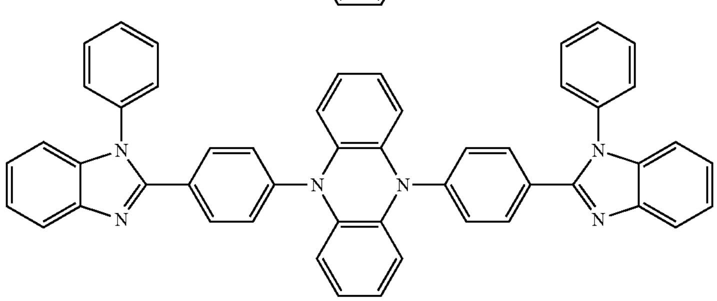

-continued

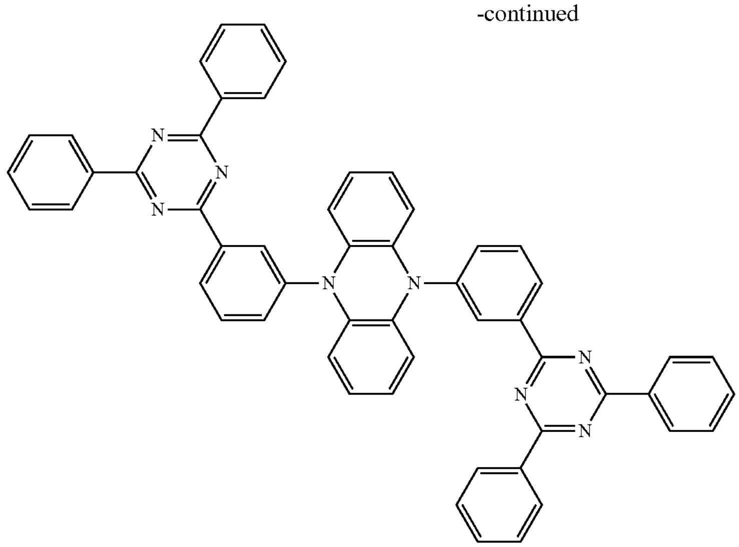

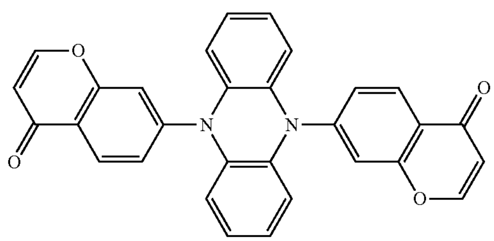

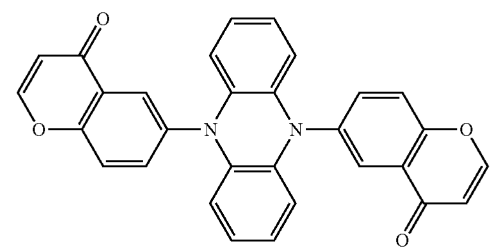

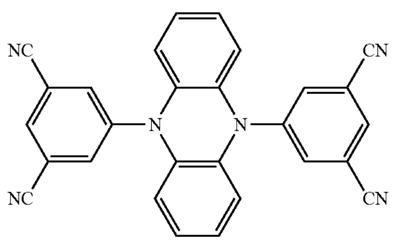

The molecular weight of the second organic compound is preferably 1,500 or less, more preferably 1,200 or less, further preferably 1,000 or less, and still further preferably 800 or less, for example, in the case where a light emitting layer containing the second organic compound is intended to be formed as a film by a vapor deposition method. The lower limit of the molecular weight, for example, of the compound represented by the general formula (1) or (9) is the molecular weight of the smallest compound represented by the general formula.

In the case where the light emitting layer is formed by a coating method, the compound that has a relatively large molecular weight may also be preferably used irrespective of the molecular weight thereof.

In the present invention, the delayed fluorescent material that is capable of being used as the second organic compound is not limited to the compound represented by the general formula (1), and any delayed fluorescent material that satisfies the expression (A) other than the compounds represented by the general formula (1) may be used. Examples of the delayed fluorescent material include compounds having a structure obtained by replacing the triazine skeleton of the general formula (1) by a pyridine skeleton, and compounds having a benzophenone skeleton or a xanthone skeleton having various heterocyclic structures substituted thereon.

First Organic Compound

The first organic compound is an organic compound having the lowest singlet excitation energy that is larger than those of the second organic compound and the third organic compound, and has a function as a host material assuming the transfer of the carrier and a function of confining the energy of the third organic compound within the compound. Due to the use of the first organic compound, the third organic compound can efficiently convert the energy formed through recombination of holes and electrons in the compound and the energy received from the first organic compound and the second organic compound to the light emission, and thus an organic electroluminescent device having a high light emission efficiency can be achieved.

The first organic compound is preferably such an organic compound that has a hole transporting function and an electron transporting function, prevents the light emission from having a longer wavelength, and has a high glass transition temperature. Examples of the preferred compound capable of being used as the first organic compound are shown below. In the structural formulae of the example compounds, R and $R^1$ to $R^{10}$ each independently represent a hydrogen atom or a substituent, and n represents an integer of from 3 to 5.

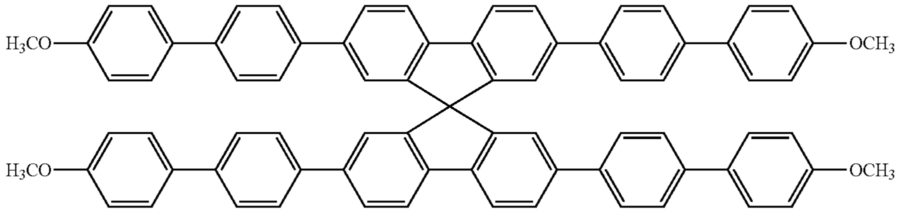
H3CO
OCH3
H3CO
OCH3
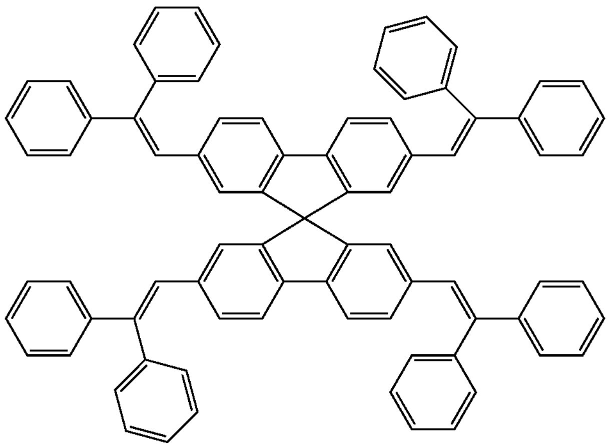
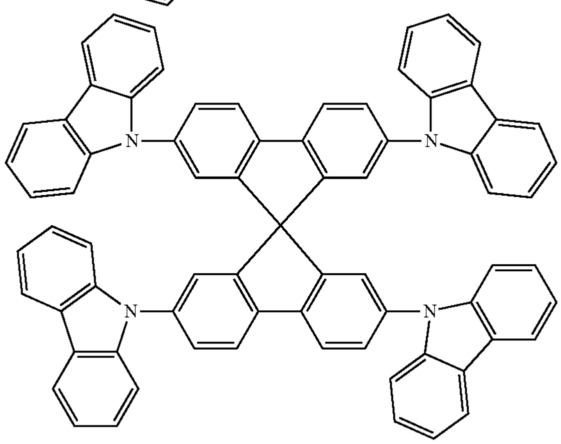
N
N
N
N
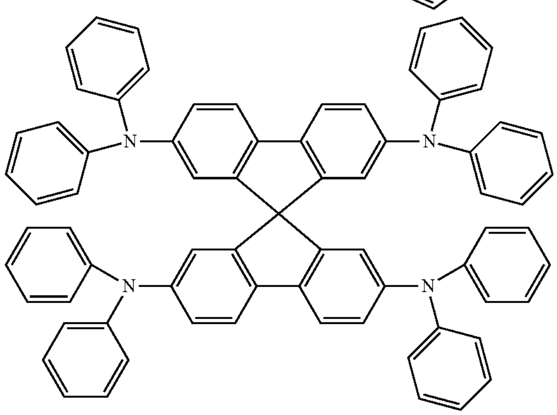
N
N
N
N
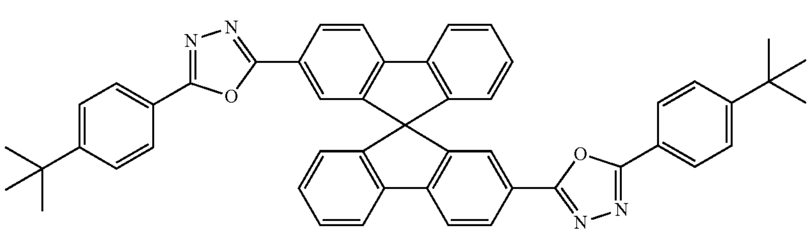
N
N
O
O
N
N -continued
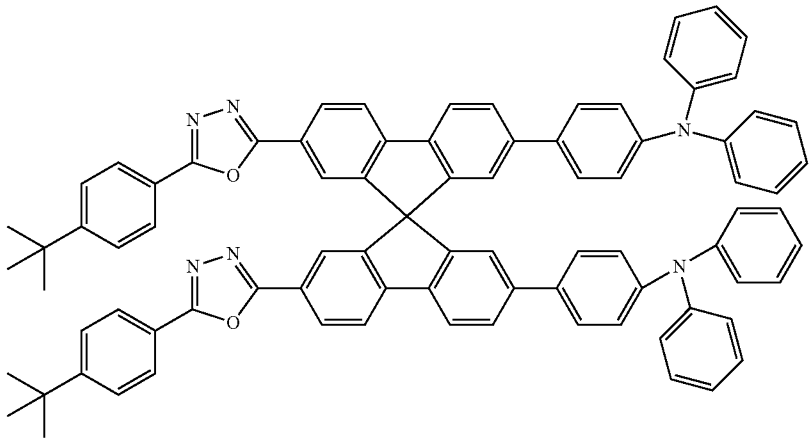
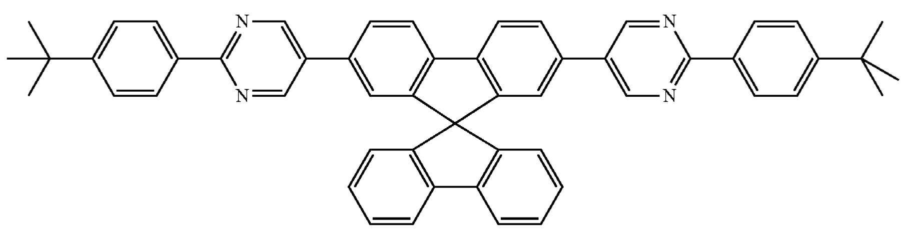
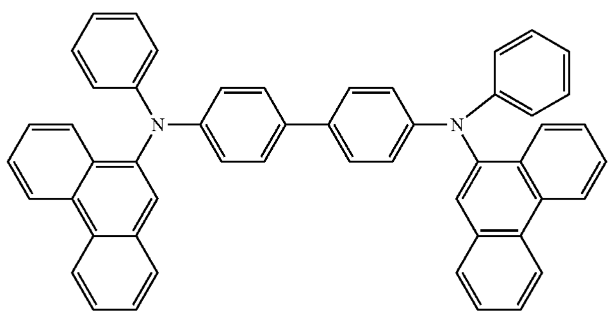
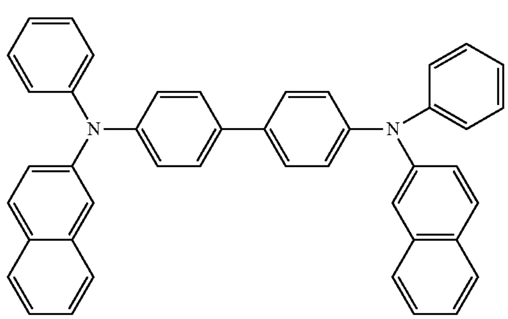
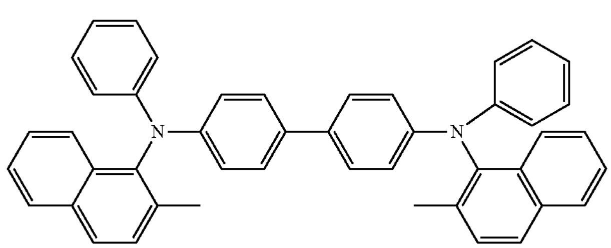

-continued
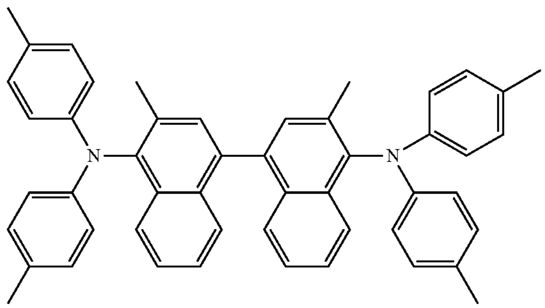
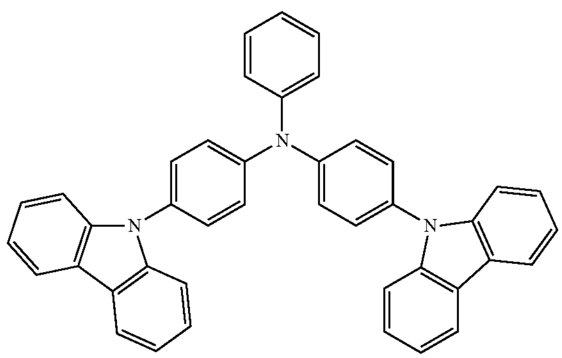
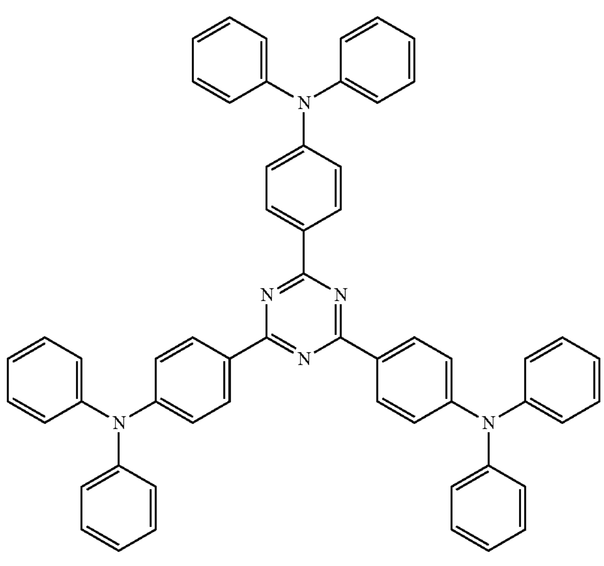
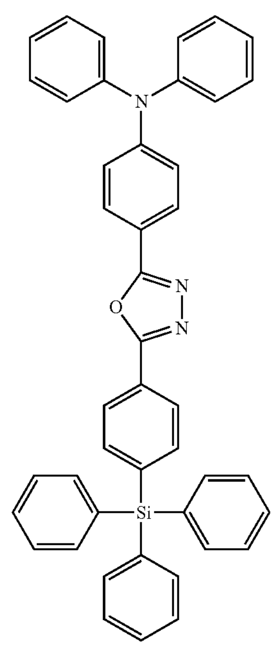

-continued
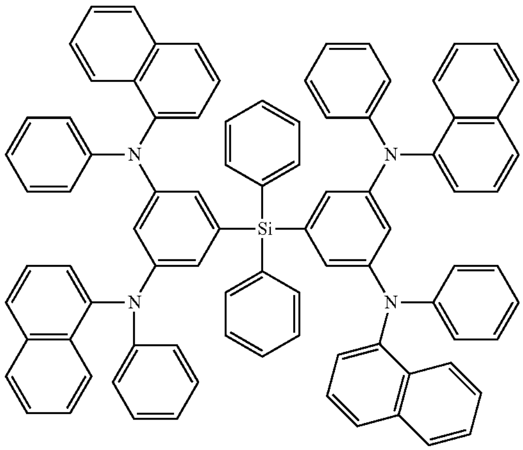
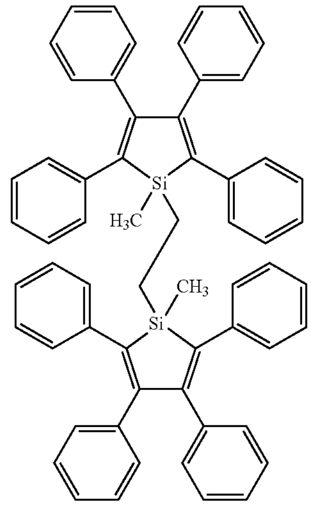
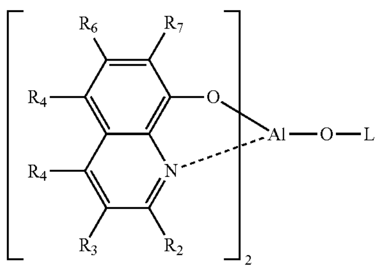
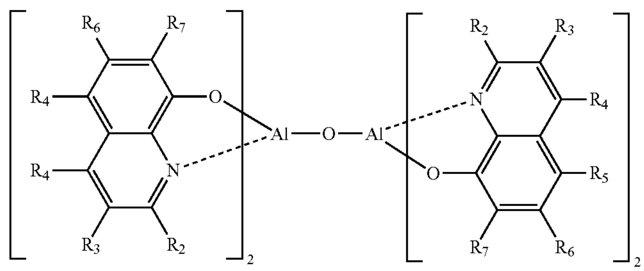
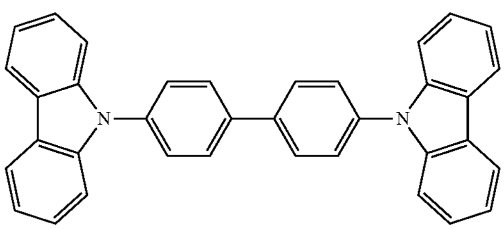
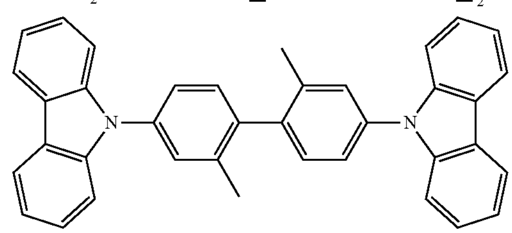
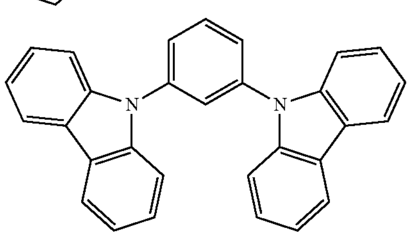
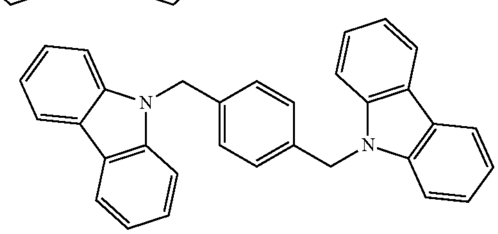
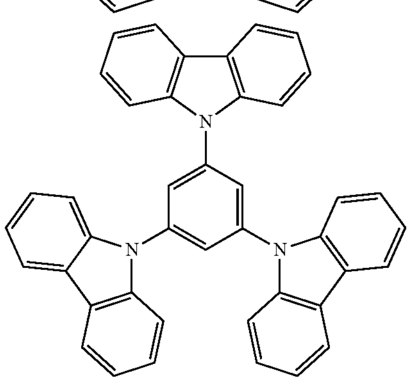
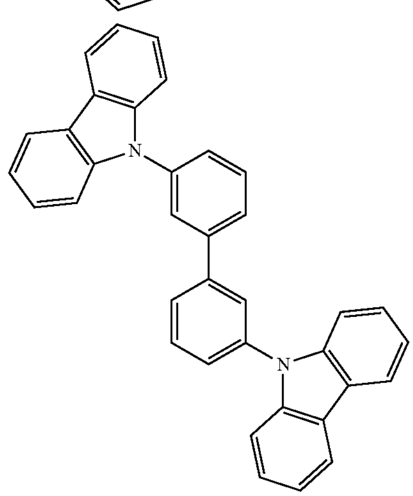

-continued
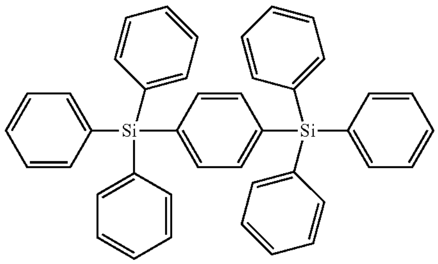
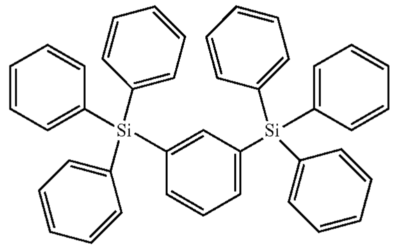
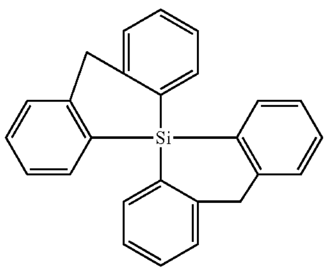
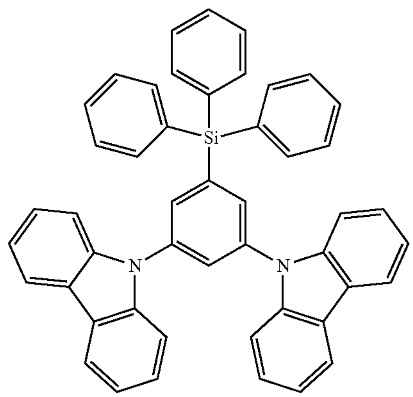
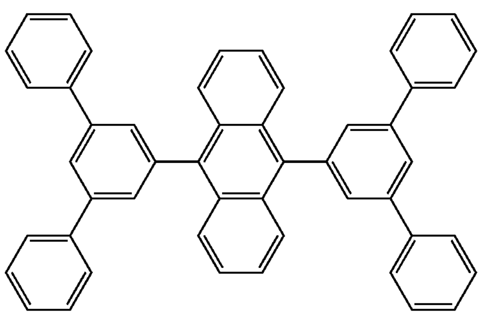
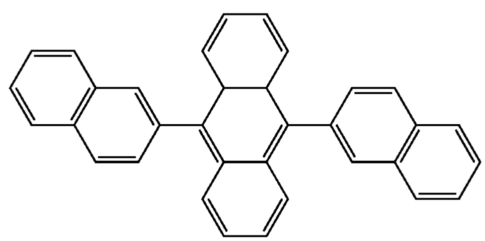
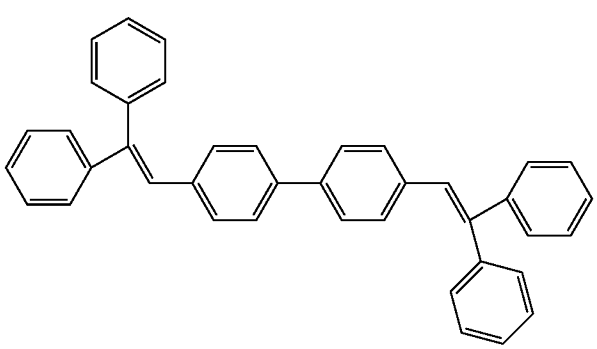

-continued
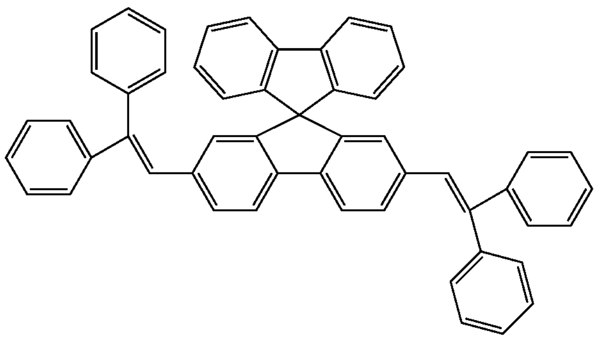
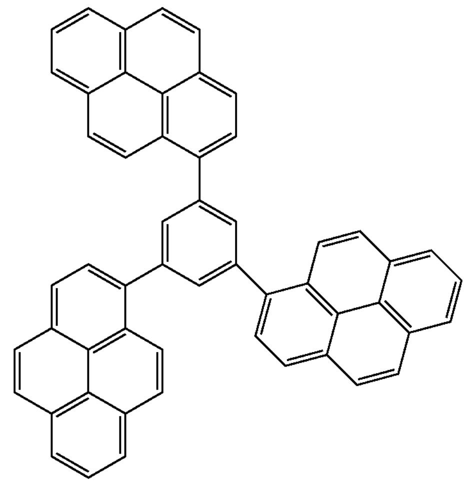
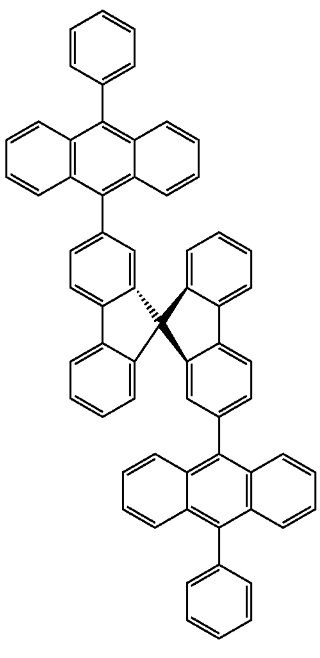
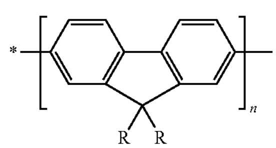
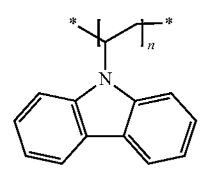
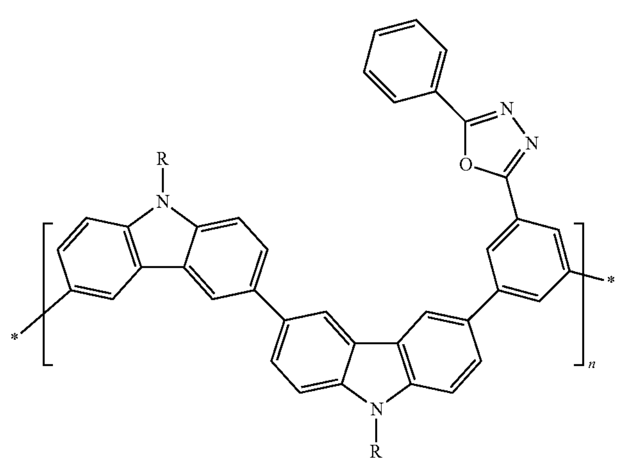
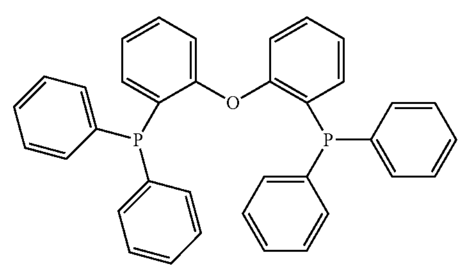

-continued

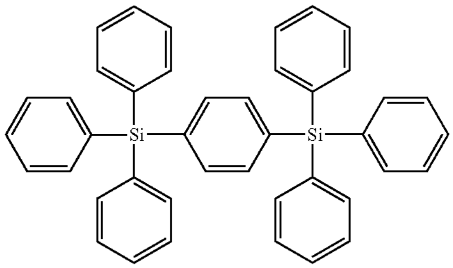

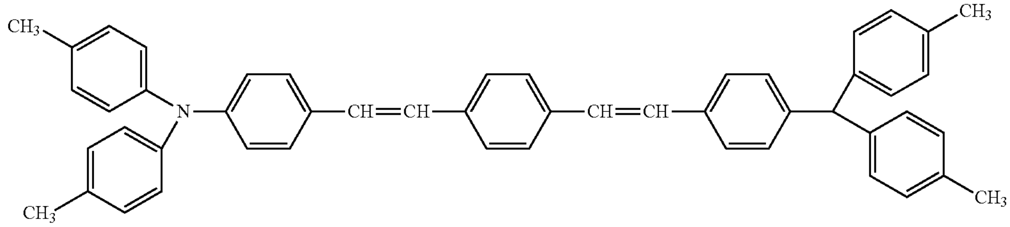

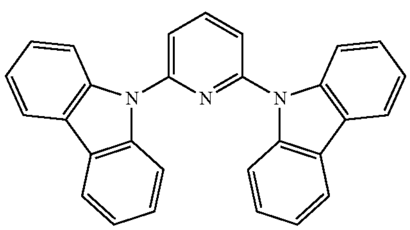 [SMILES: c1cc(-n2c3ccccc3c3ccccc32)nc(-n2c3ccccc3c3ccccc32)c1]

Third Organic Compound

The third organic compound is a light emitting material having the lowest singlet excitation energy that is smaller than those of the first organic compound and the second organic compound. The third organic compound is transferred to the singlet excited state through reception of energy from the first organic compound and the second organic compound that are in the singlet excited state and the second organic compound that is in the singlet excited stare that is achieved through the inverse intersystem crossing from the triplet excited state, and emits fluorescent light on returning to the ground state. The light emitting material used as the third organic compound is not particularly limited, as far as the compound is capable of emitting light through reception of energy from the first organic compound and the second organic compound, and the light emission thereof may be fluorescence, delayed fluorescence, or phosphorescence. Among the compounds, the light emitting material used as the third organic compound is preferably a compound that emits fluorescent light on returning from the lowest singlet excitation energy level to the ground energy level. The third organic compound used may be two or more kinds of compounds, as far as the compounds satisfy the relationship of the expression (A). For example, the use of two or more kinds of the third organic compounds having different light emission colors may enable light emission with a desired color.

Examples of the preferred compounds capable of being used as the third organic compound are shown below for the light emission colors. In the structural formulae of the example compounds, Et represents en ethyl group, and i-Pr represents an isopropyl group.

(1) Green Light Emitting Compound

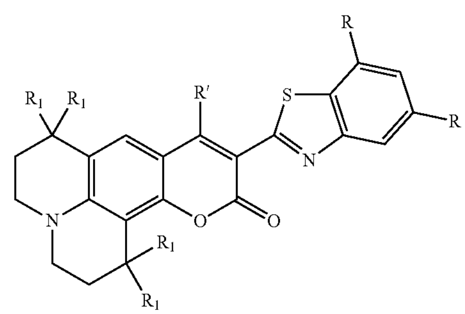

$R_1 = R = R' = H$,
$R_1 = CH_3$, $R = R' = H$,
$R_1 = CH_3$, $R = H$; $R' = CH_3$,
$R_1 = CH_3$, $R$ = t-butyl; $R' = H$

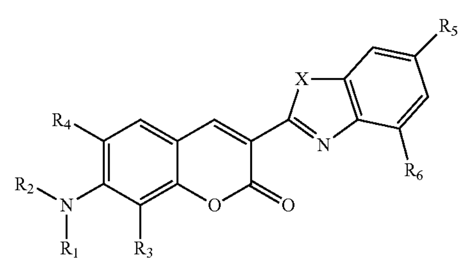

X = S, O

-continued
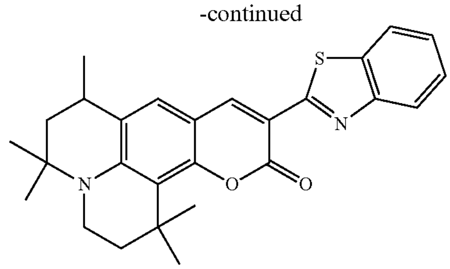
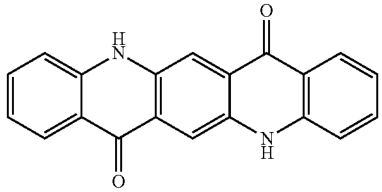
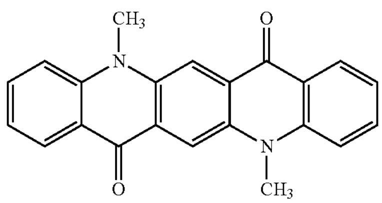
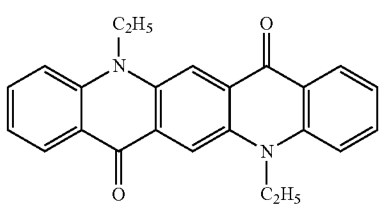
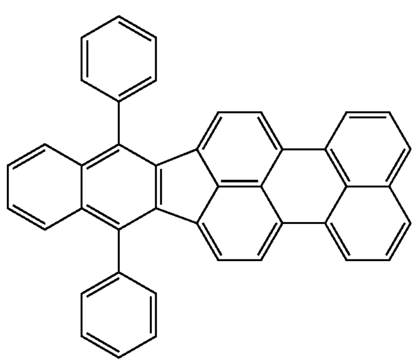
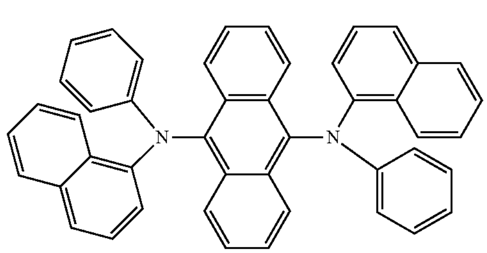
-continued
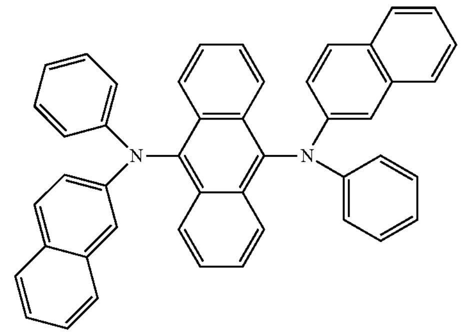
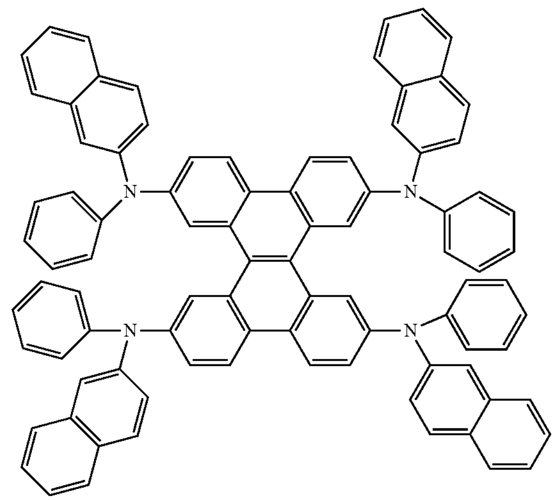
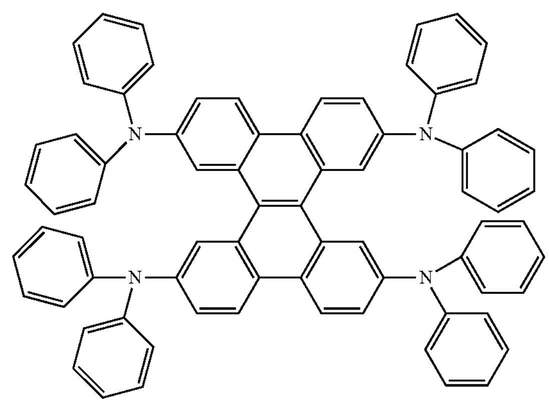
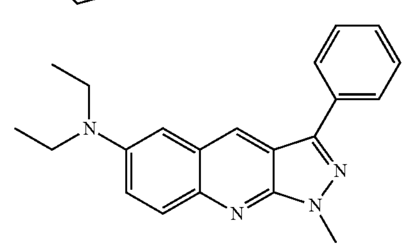
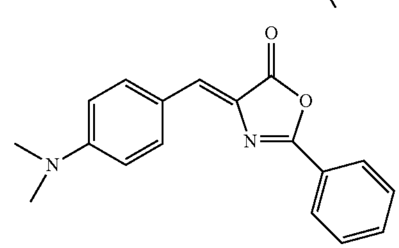

-continued
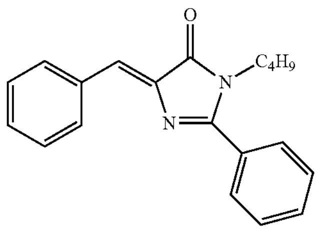
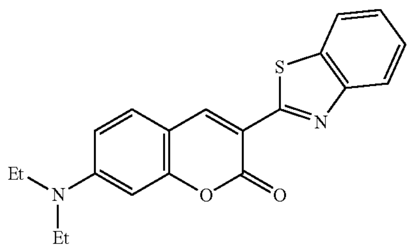
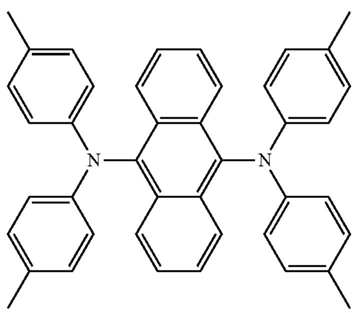
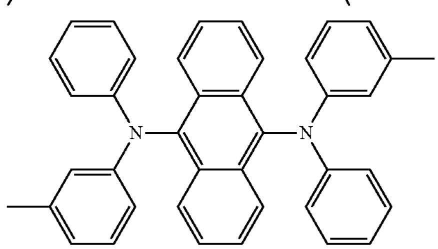
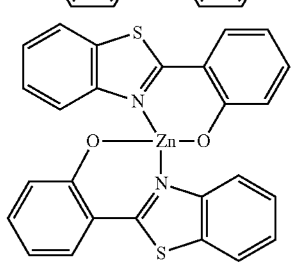
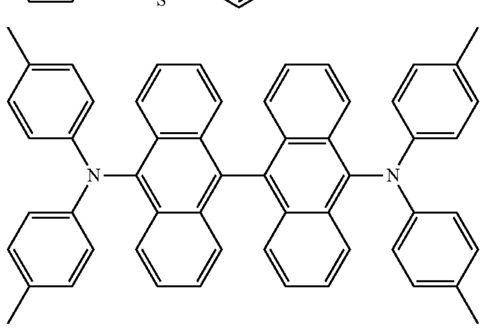
-continued
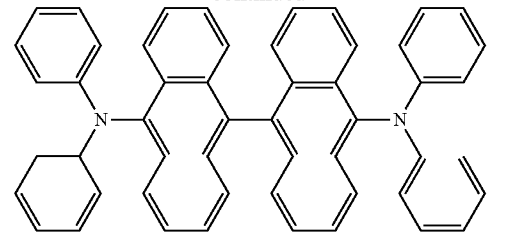
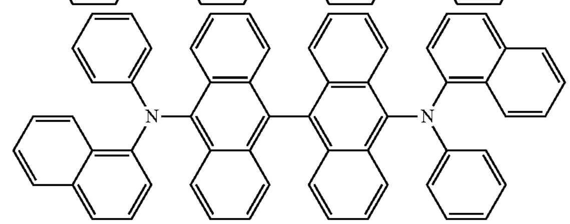
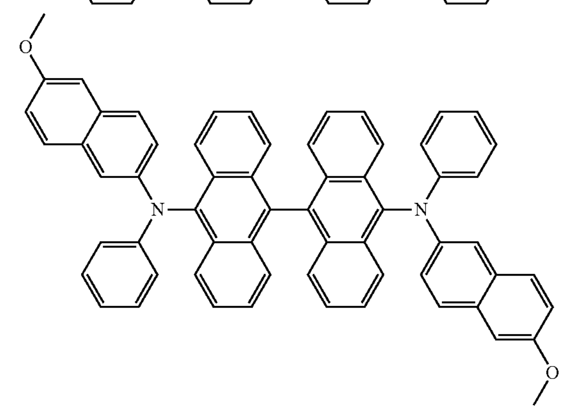
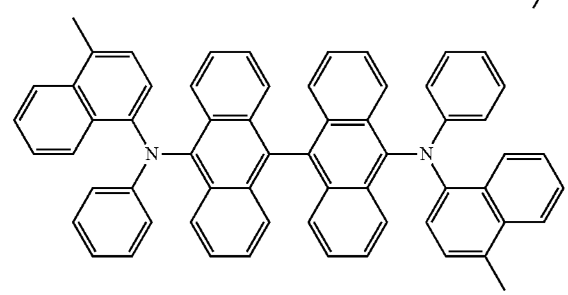
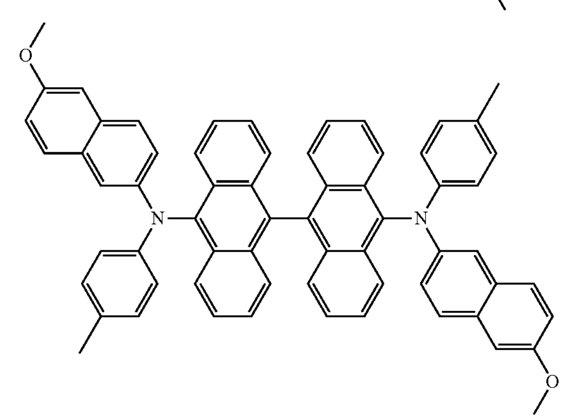
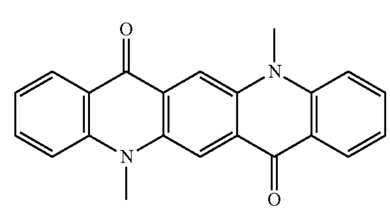

-continued
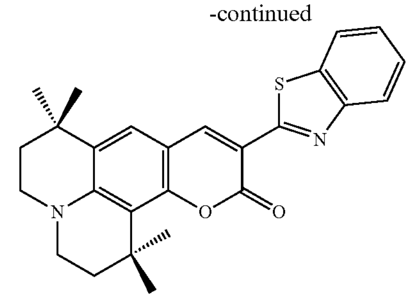
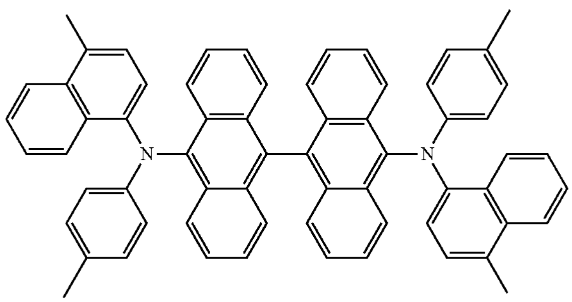
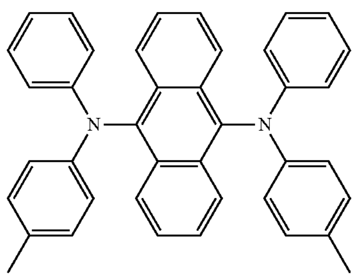
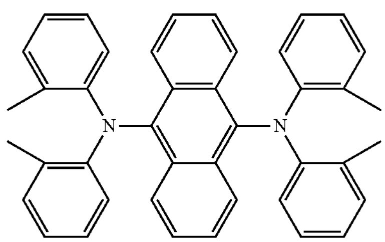
-continued
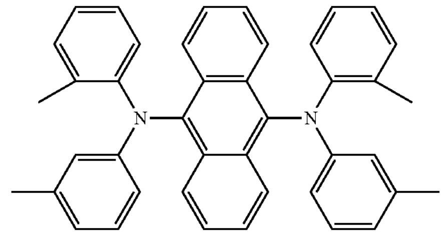
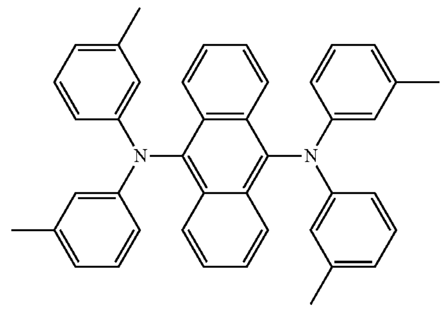
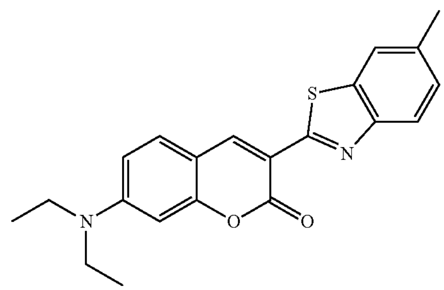
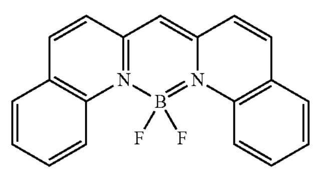
(2) Red Light Emitting Compound
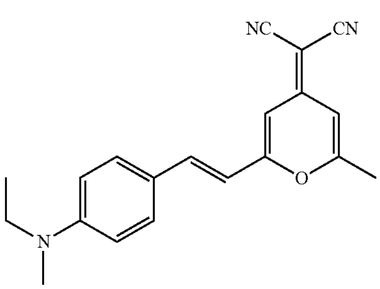
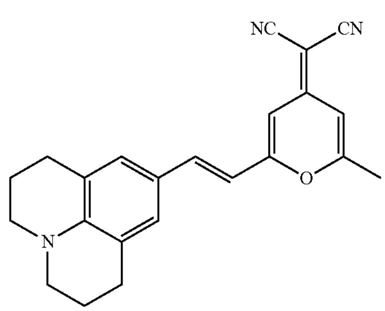

-continued
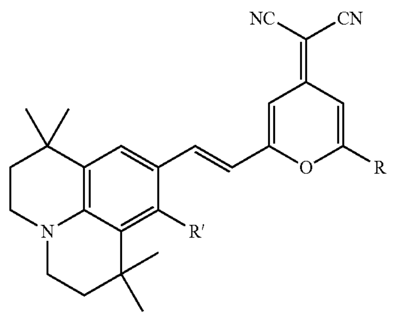
R = t-butyl; R′ = H,
R = i-Pr; R′ = H,
R = t-butyl; R′ = $OCH_3$
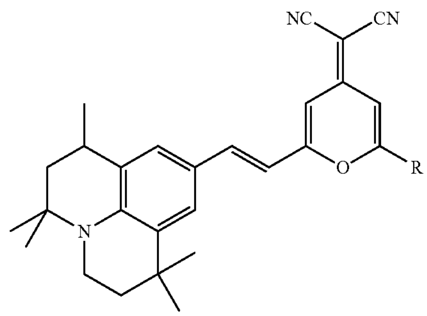
R = $CH_3$, $C_2H_5$, iso-propyl, t-butyl
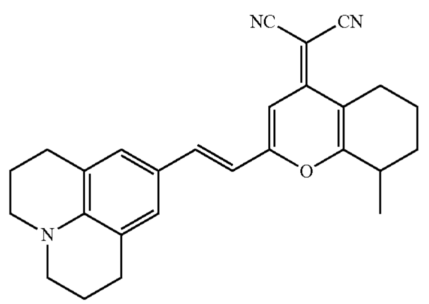
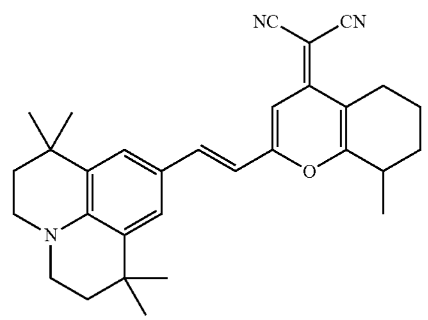
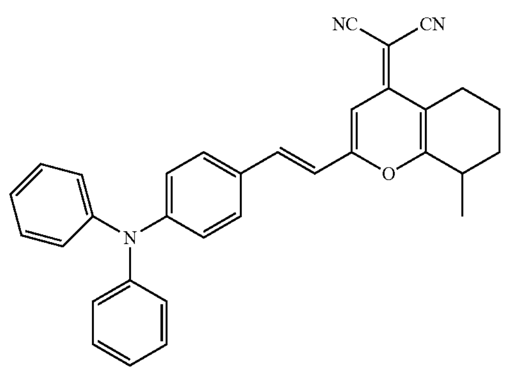
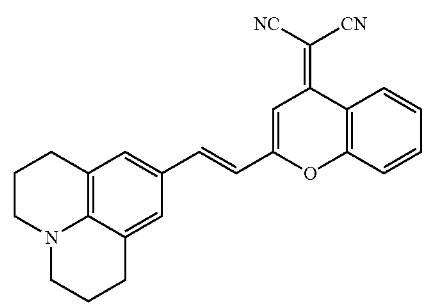
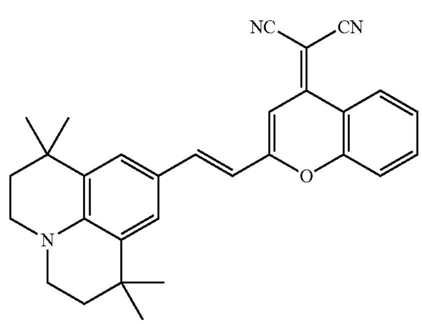
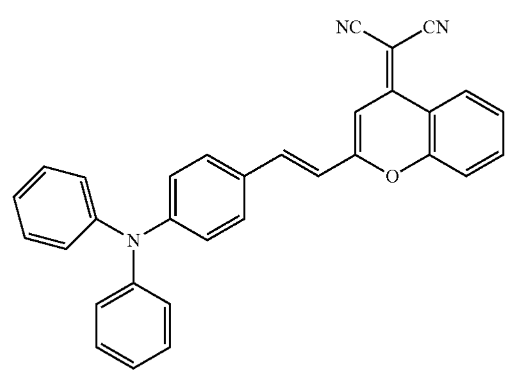

-continued
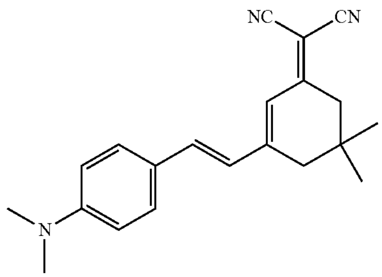
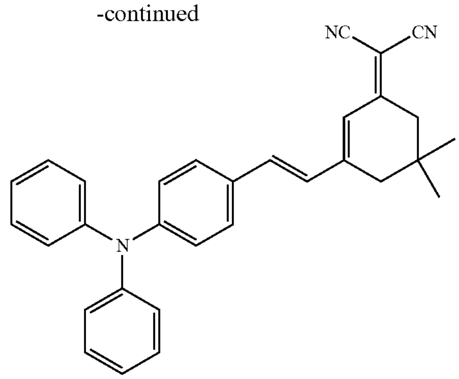
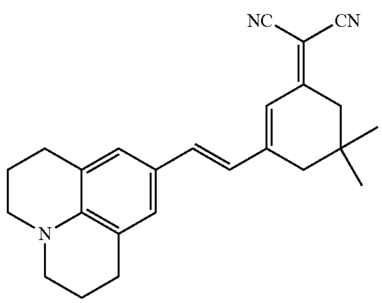
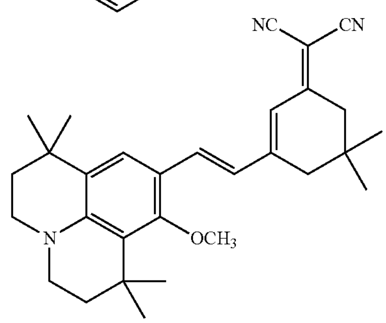
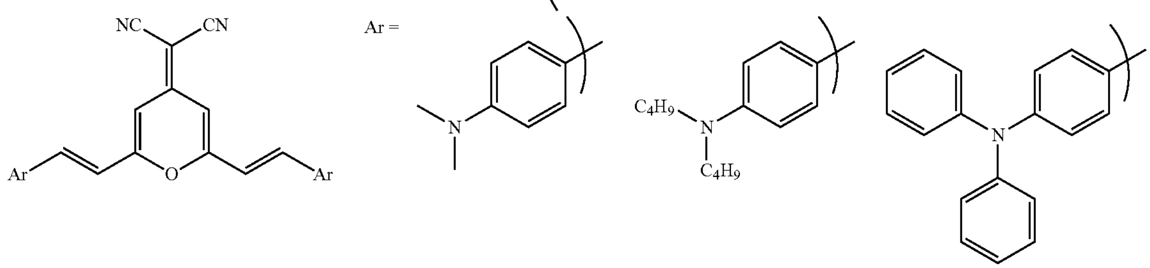
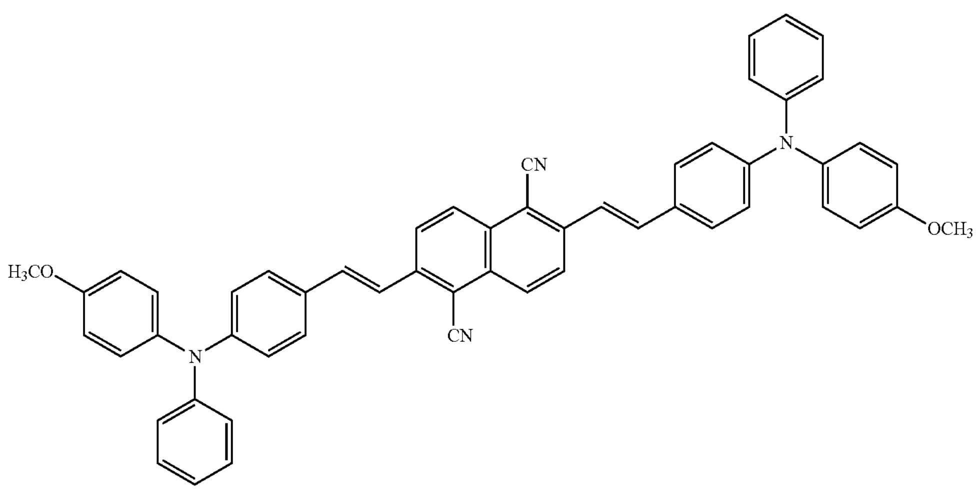
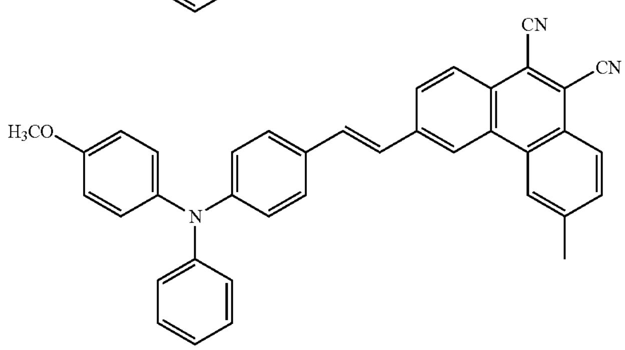

-continued
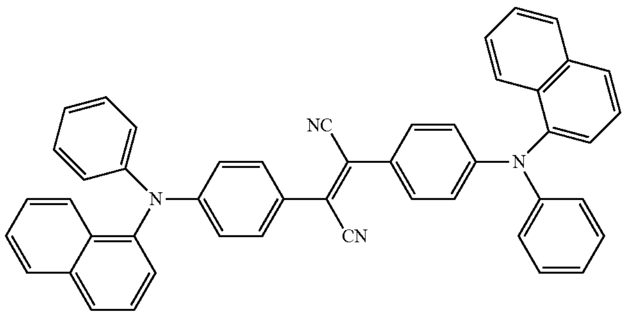
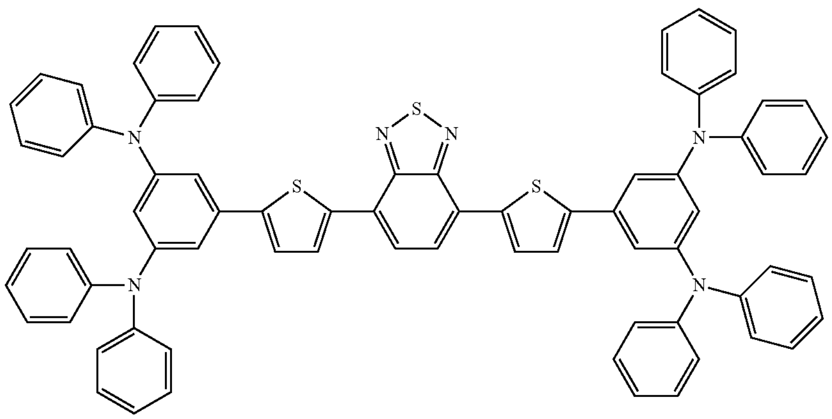
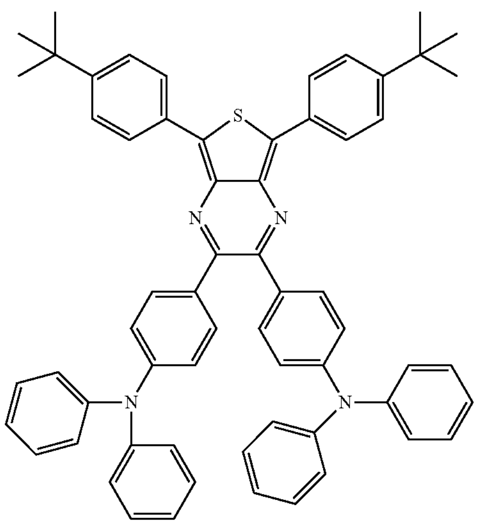
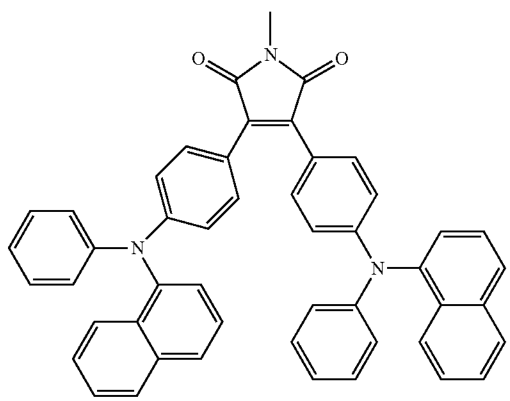
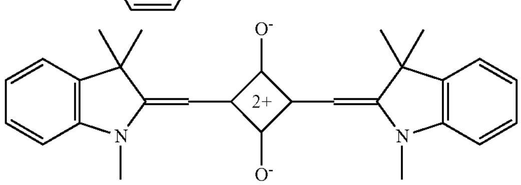
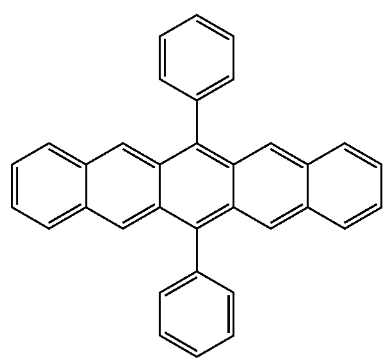

-continued
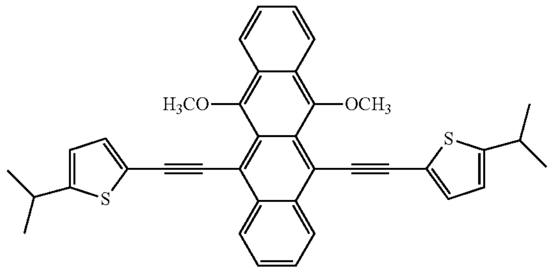
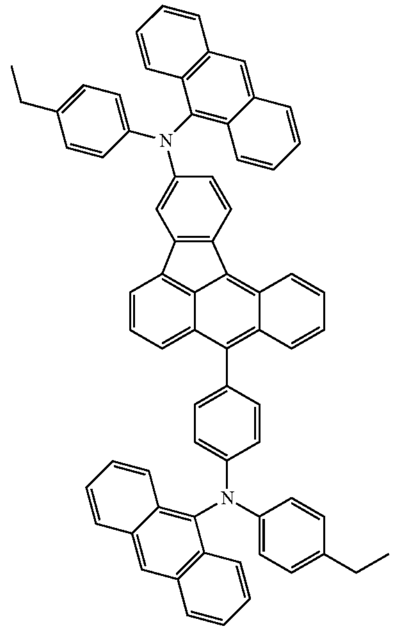
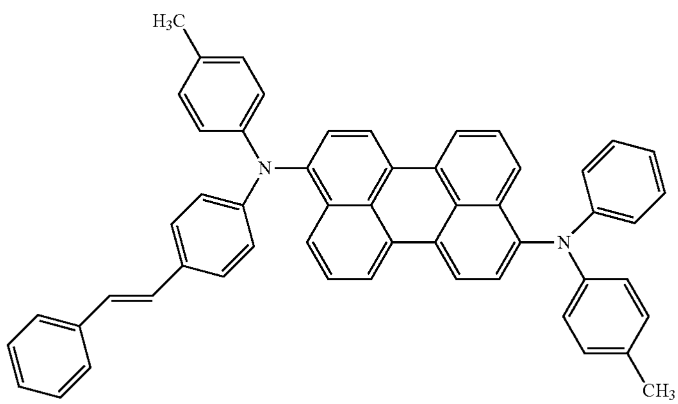
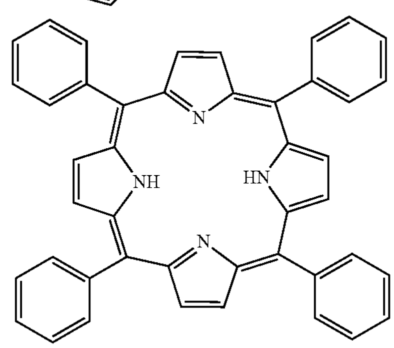
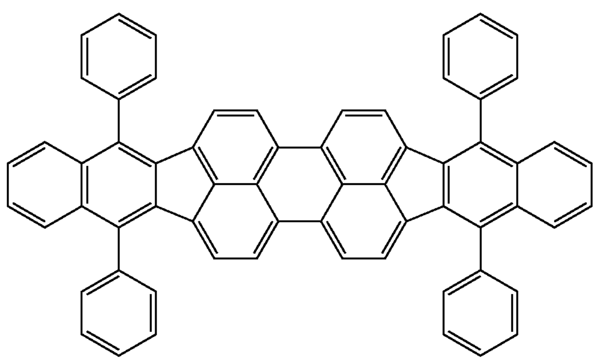
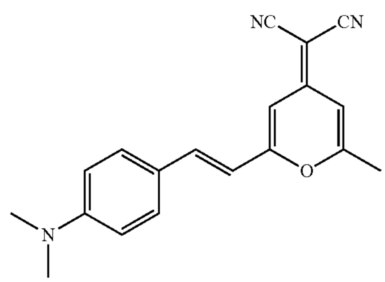
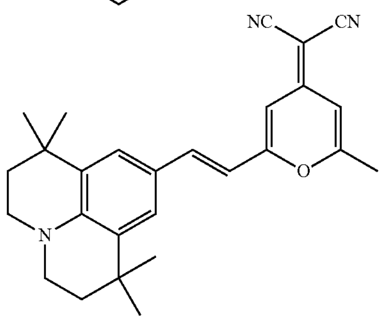
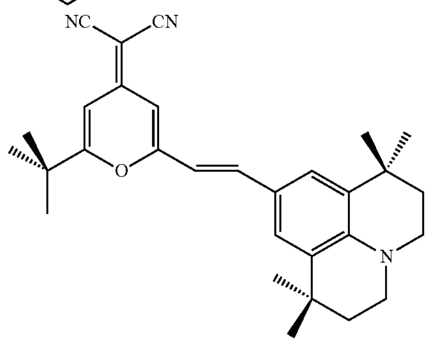

-continued
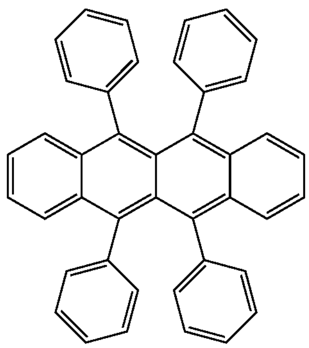
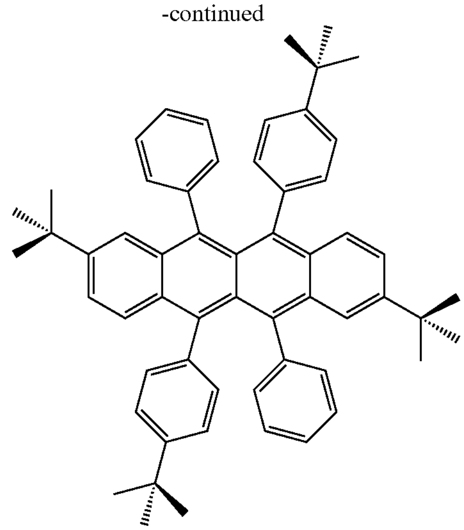
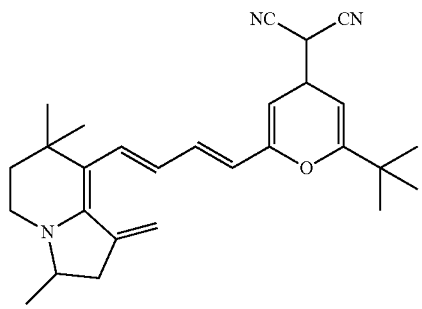
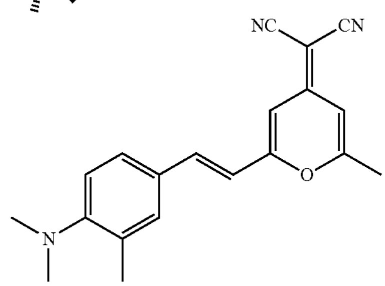
(3) Blue Light Emitting Compound
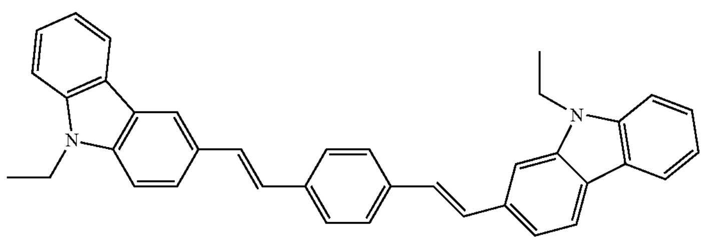
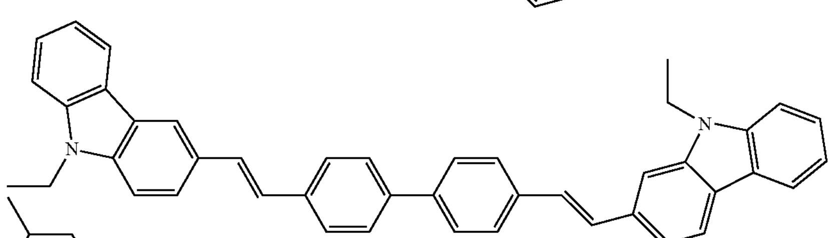
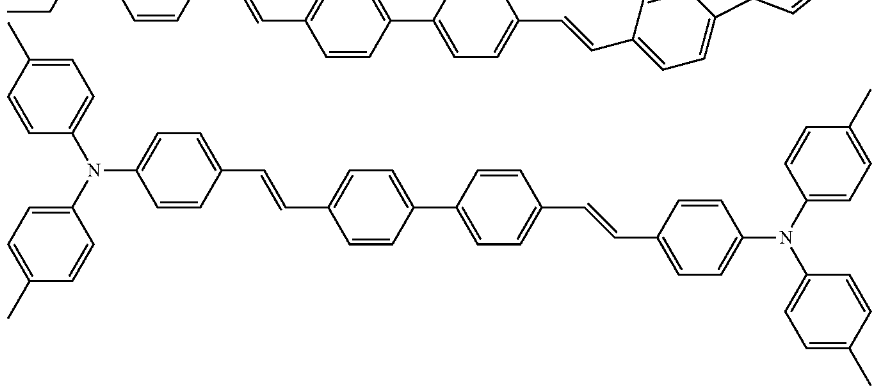

-continued
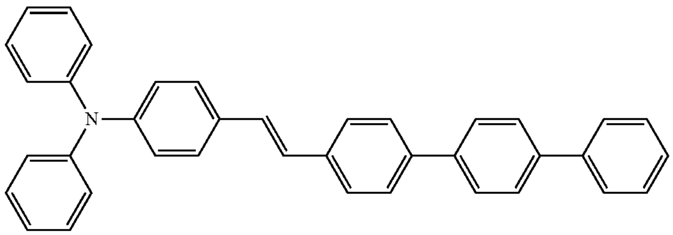
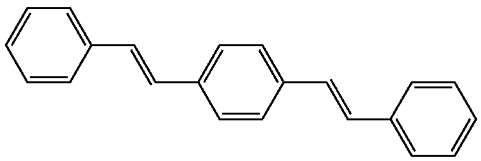
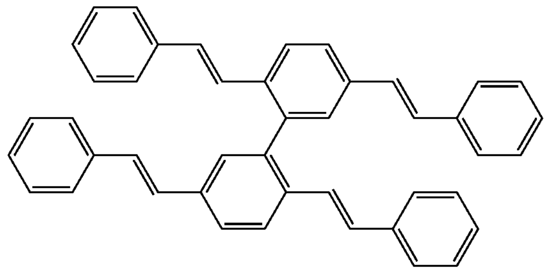
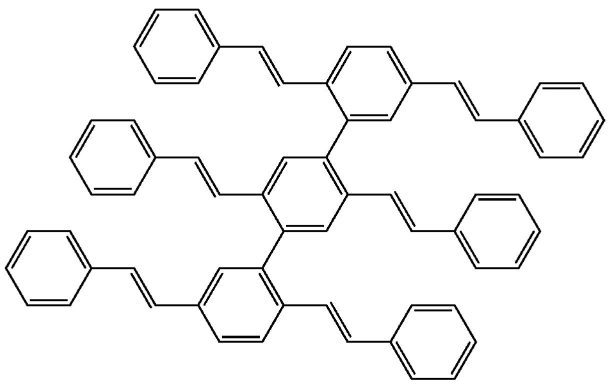
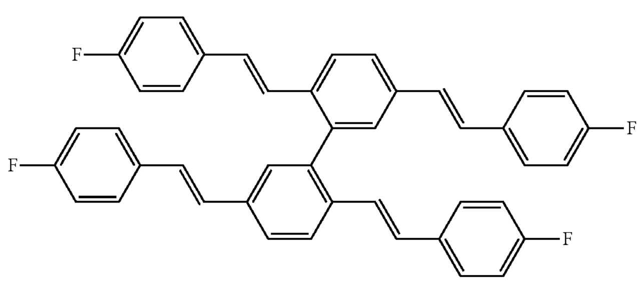
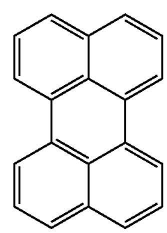
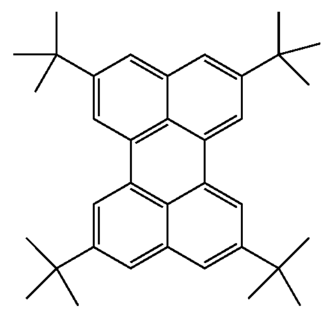
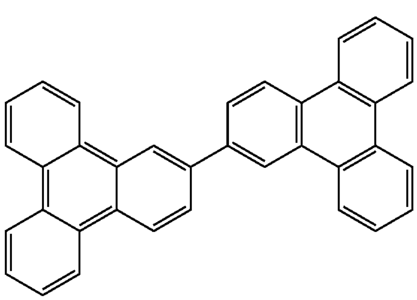
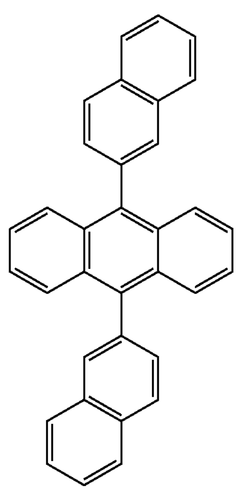
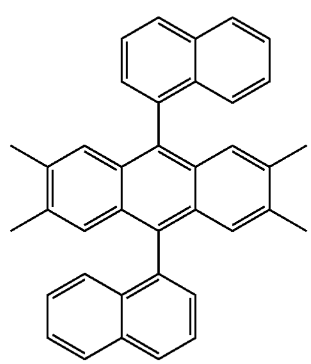

-continued
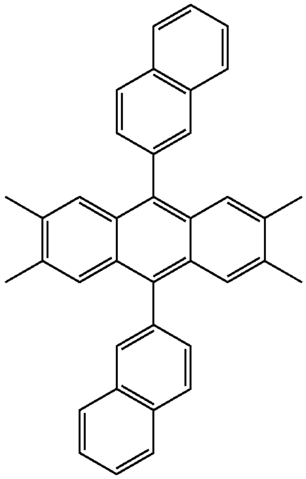
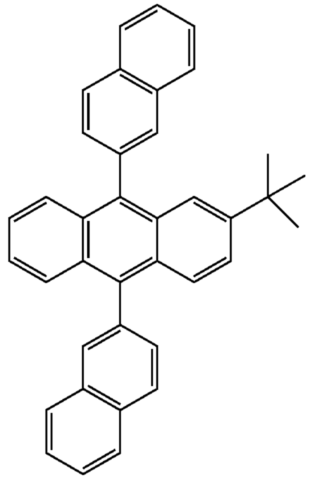
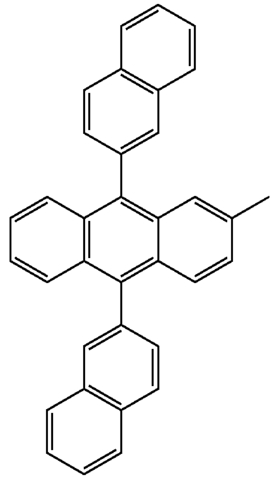
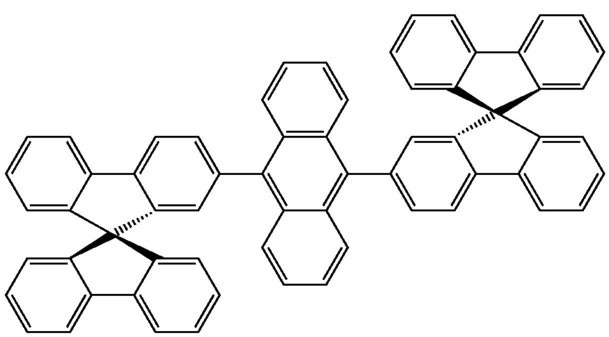
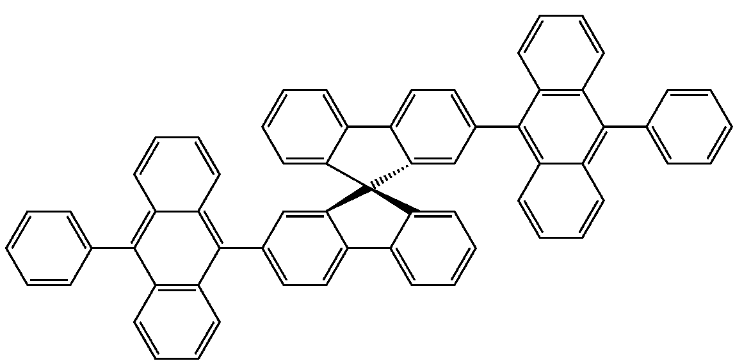

-continued
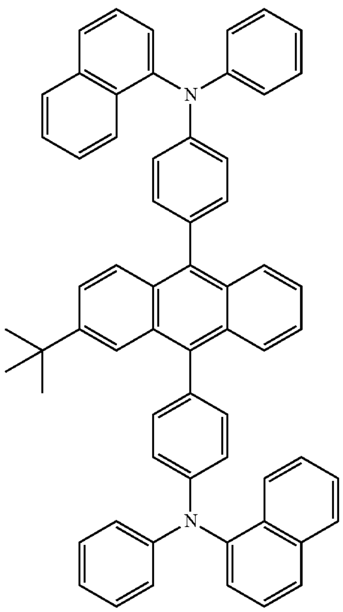
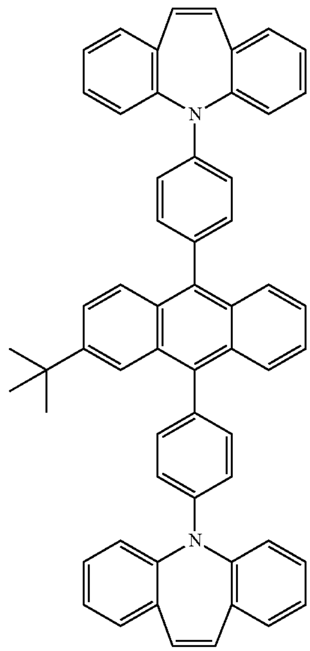
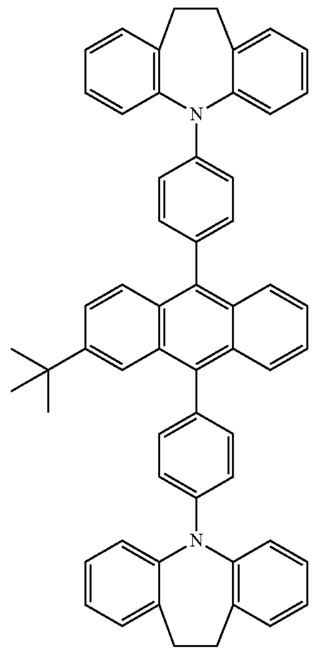
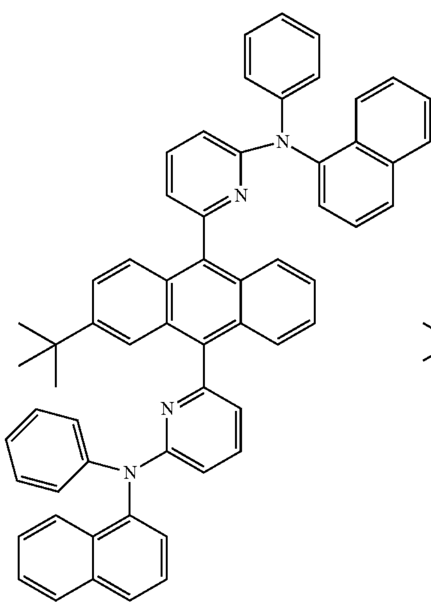
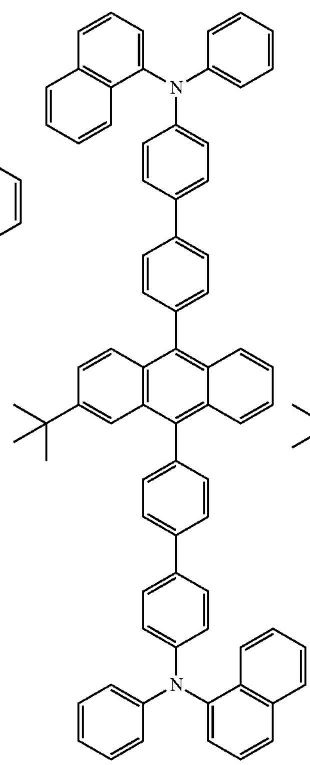
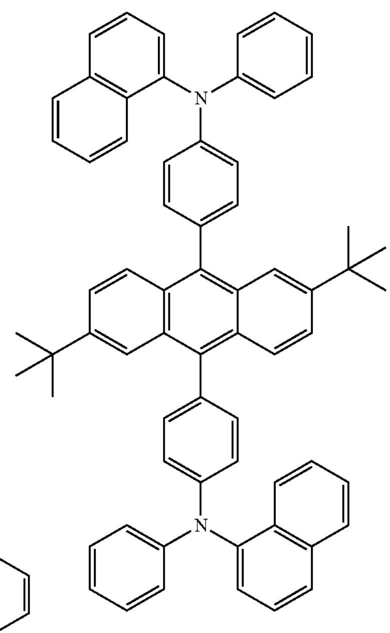

-continued
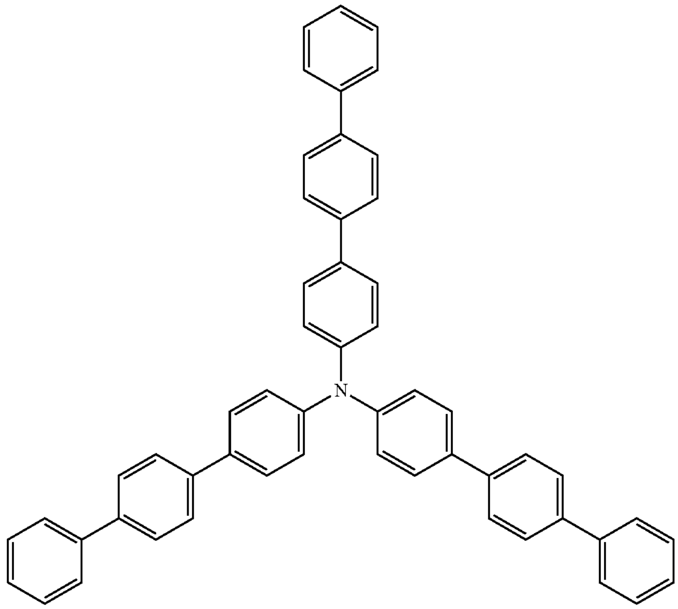
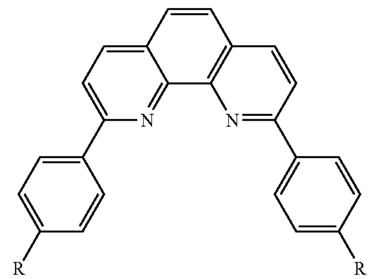
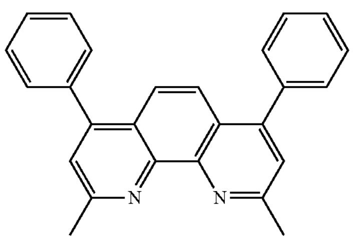
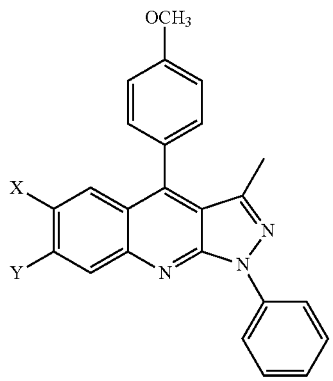
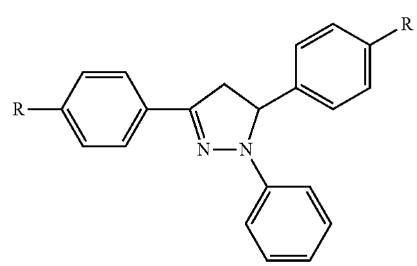
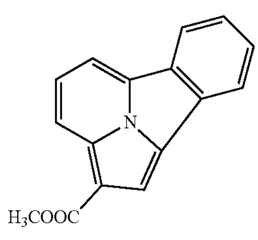
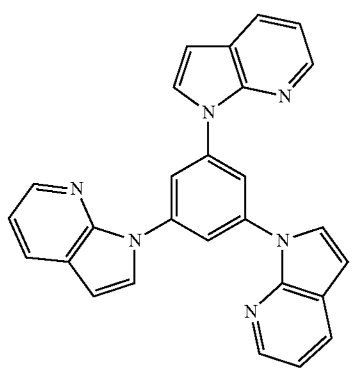
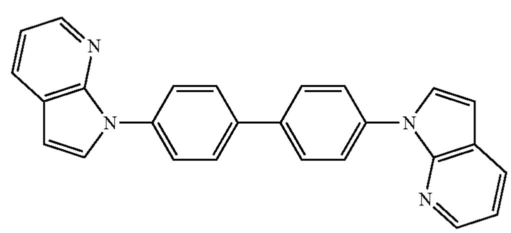
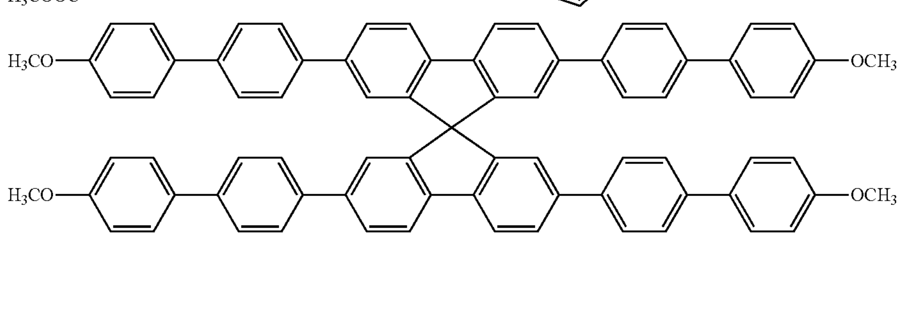

-continued
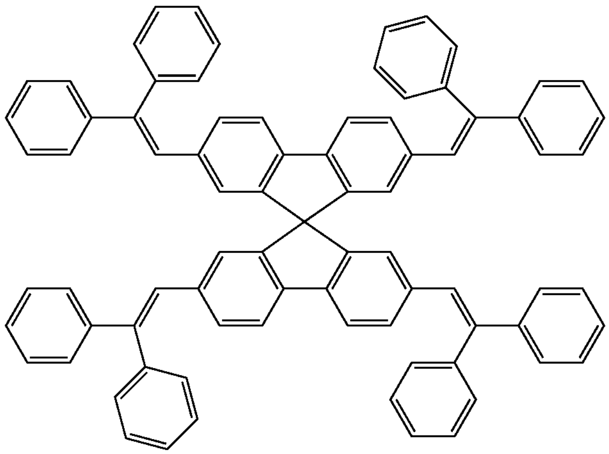
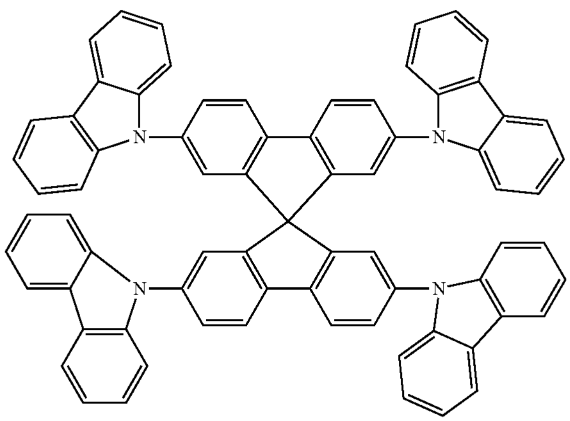
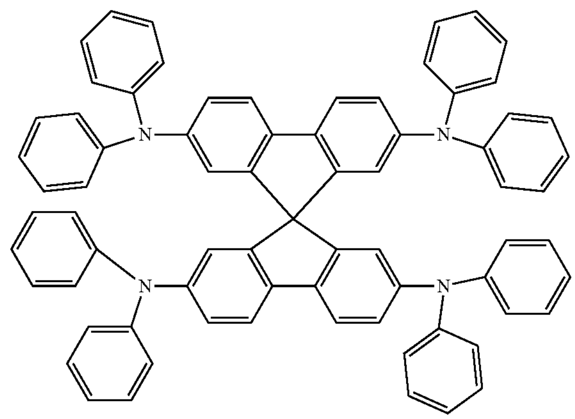
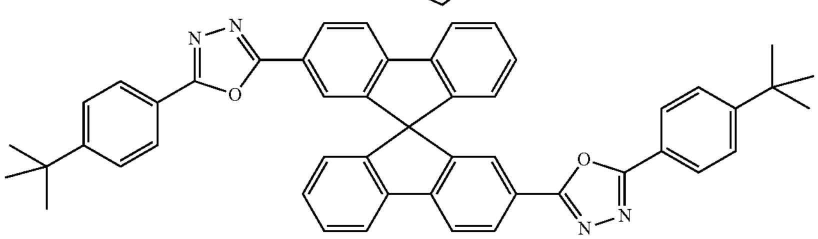
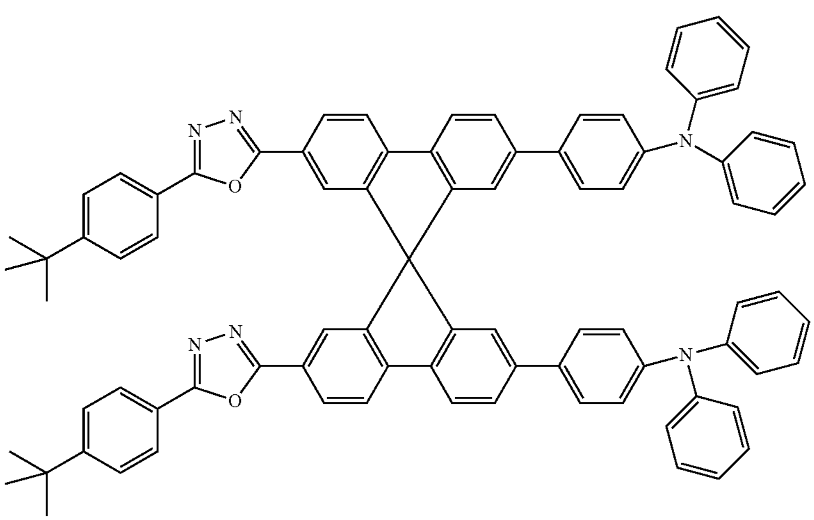

-continued
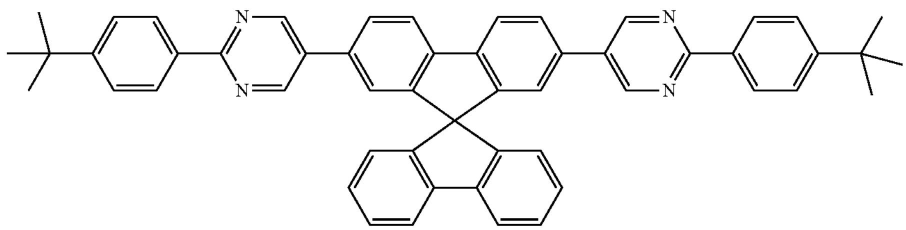
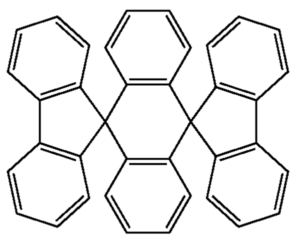
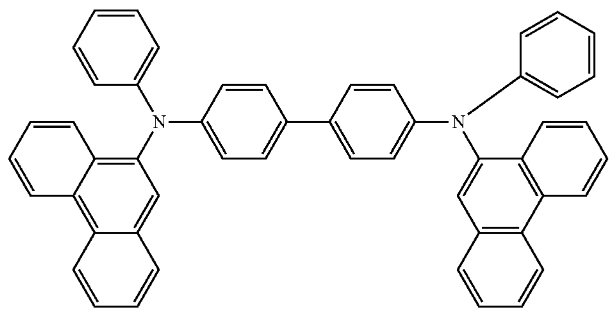
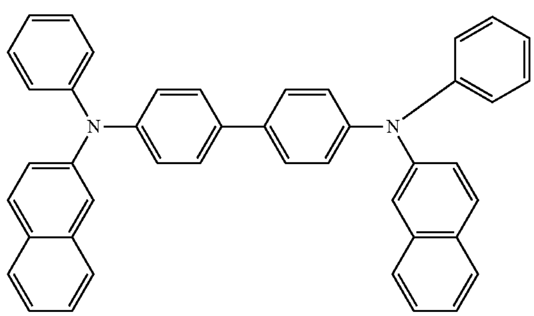
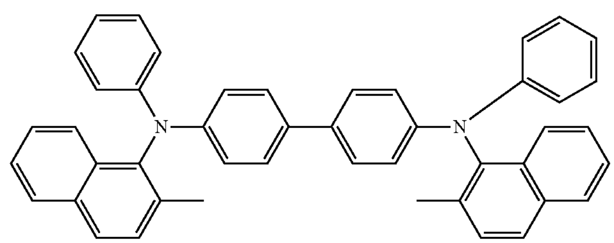
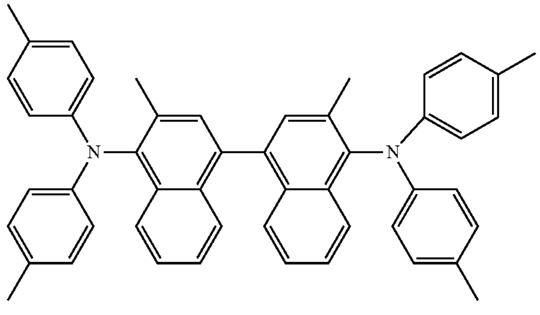
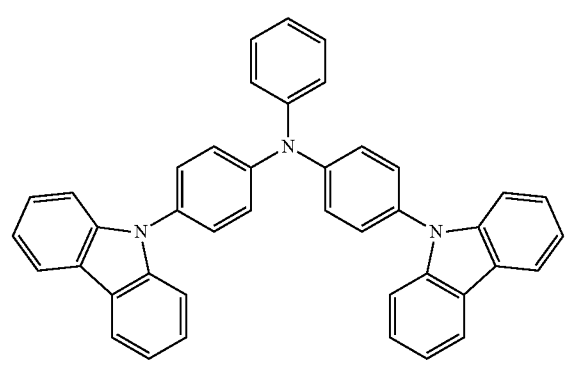

-continued
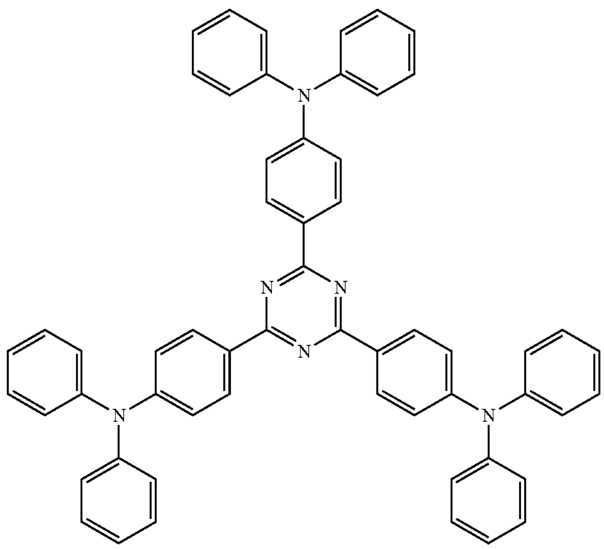
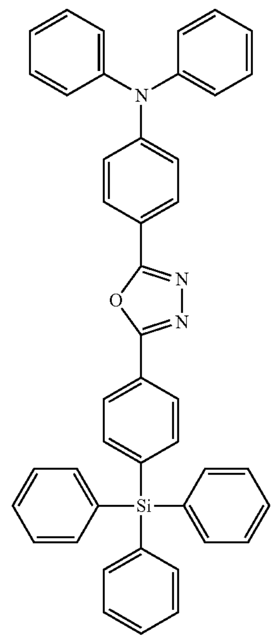
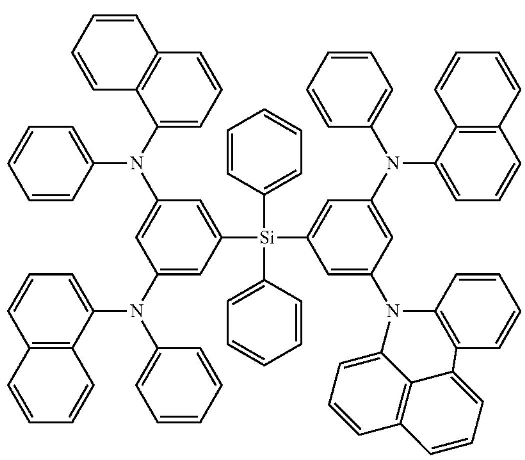
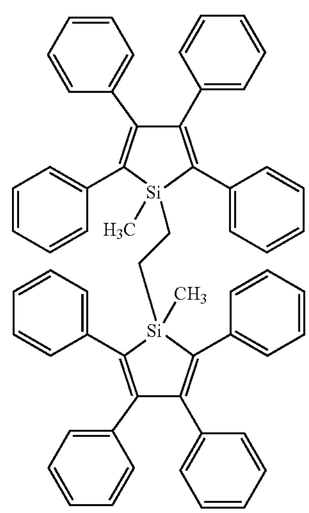
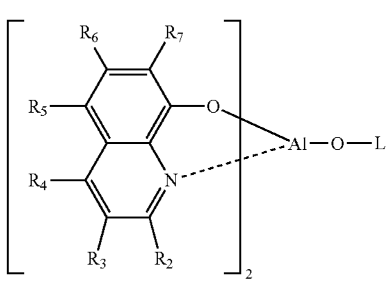
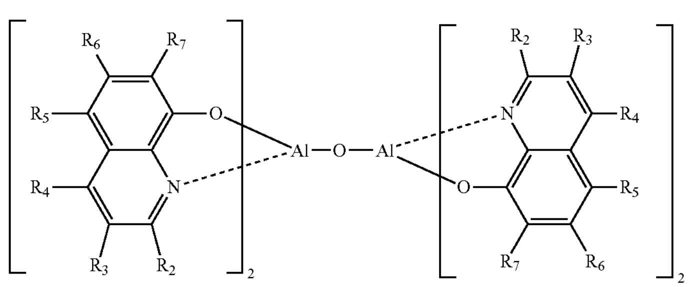

-continued
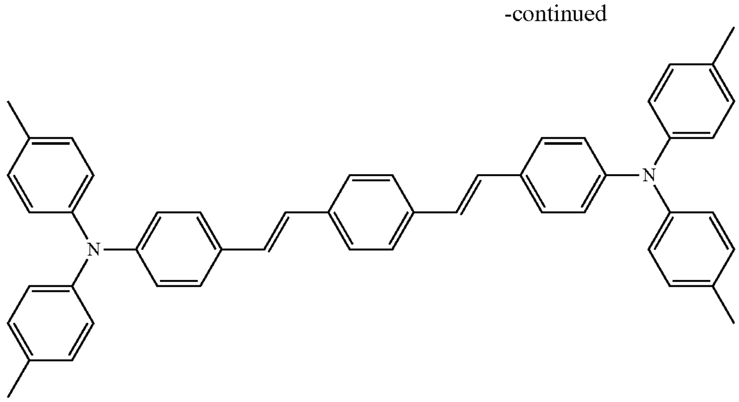
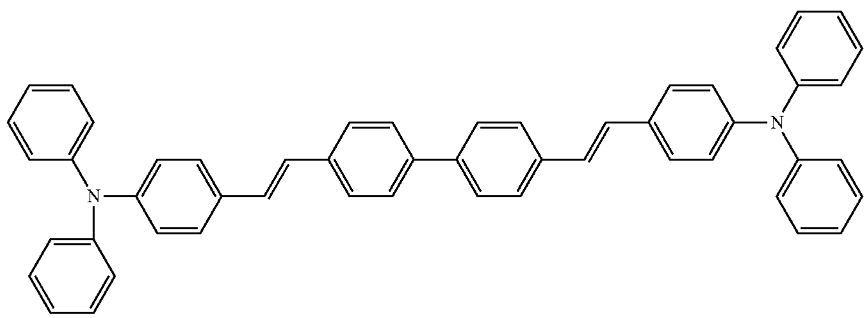
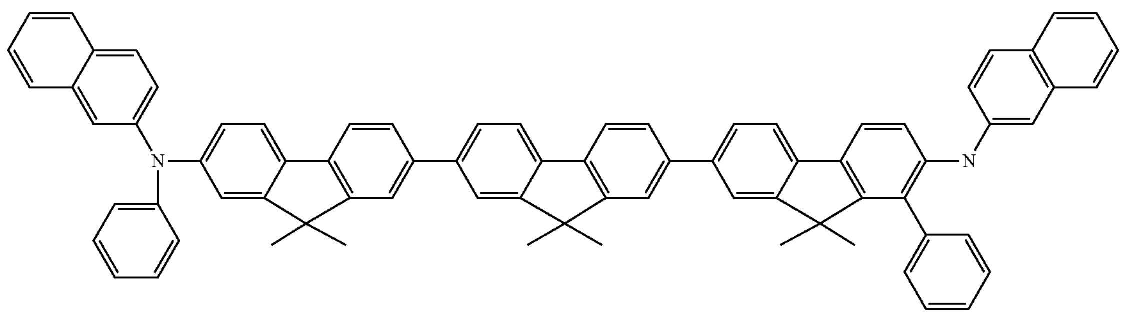
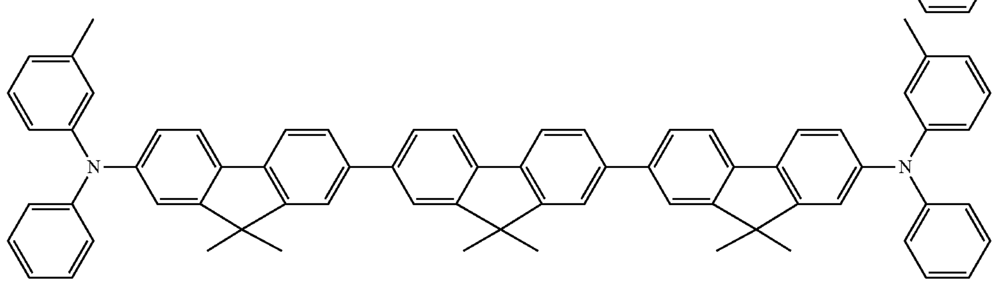
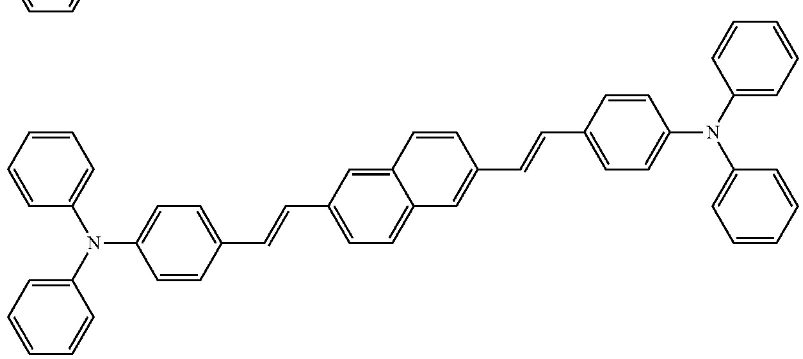

-continued
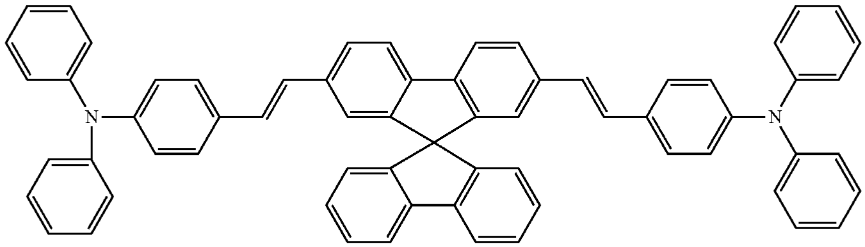
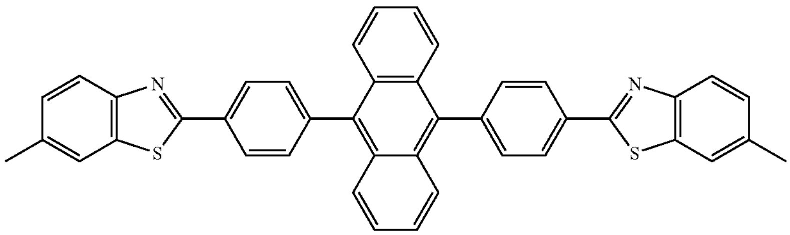
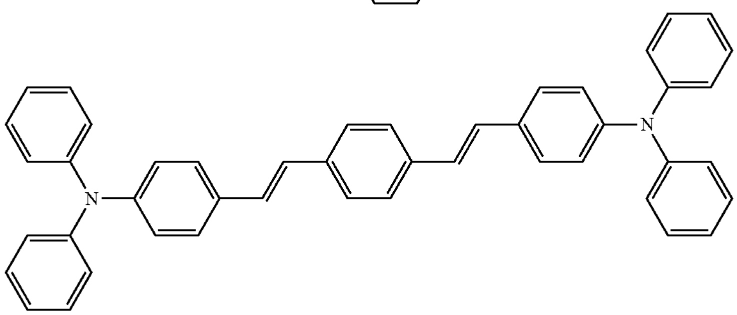
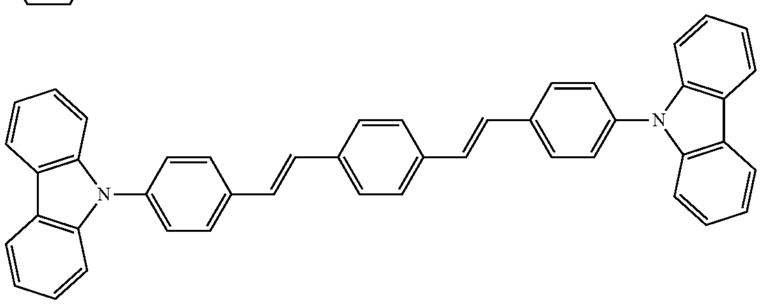
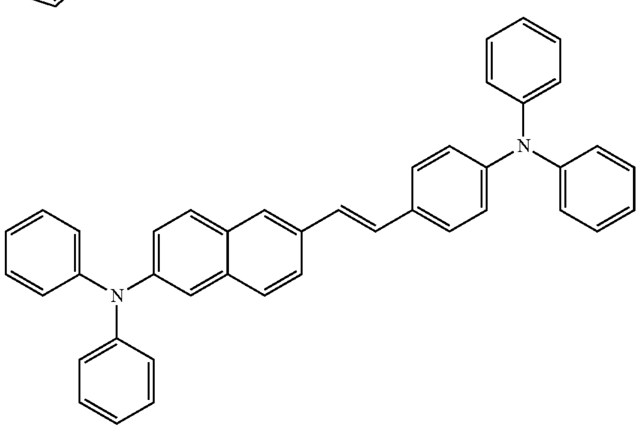
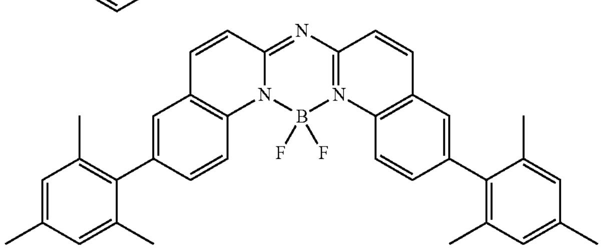

-continued
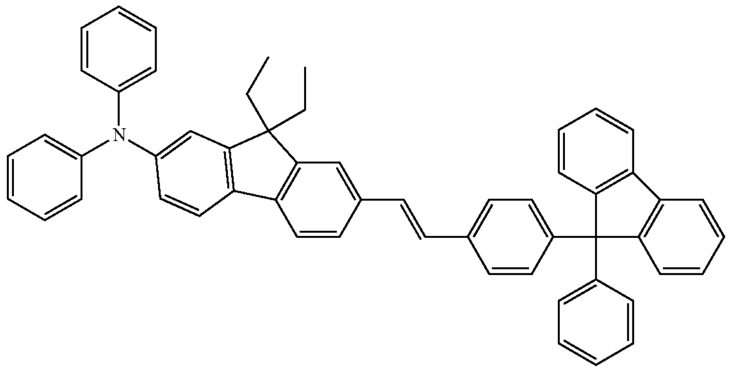
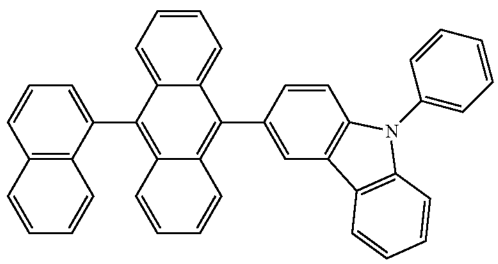
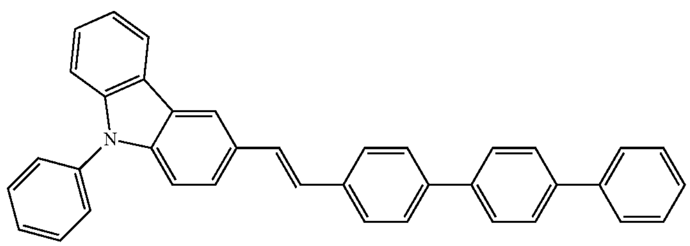
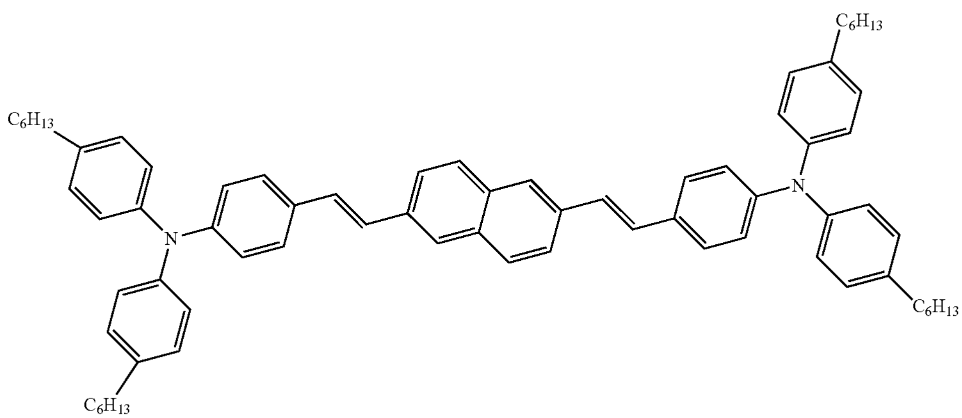
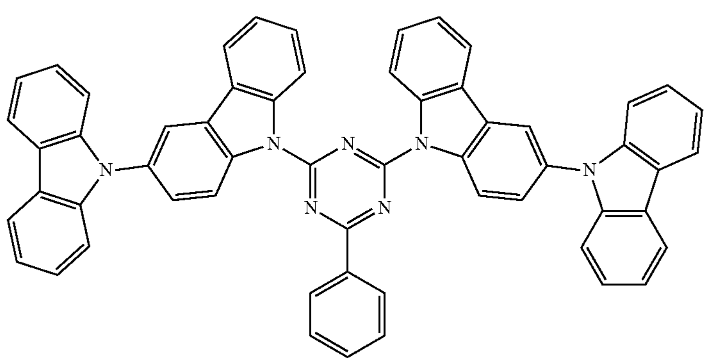
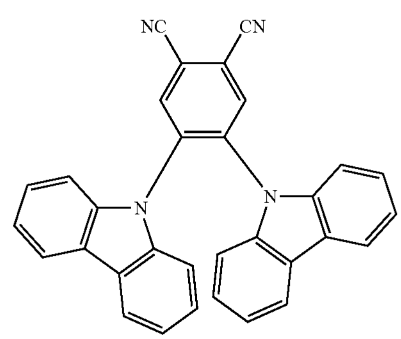

-continued

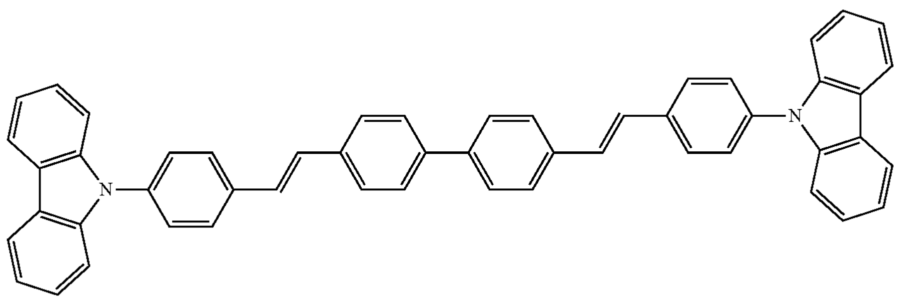

(4) Yellow Light Emitting Compound

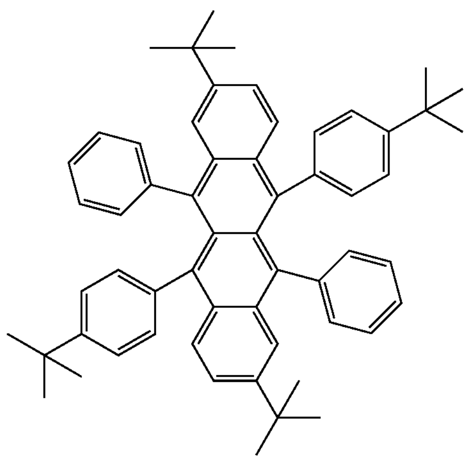 [SMILES: CC(C)(C)c1ccc(-c2c3ccc(C(C)(C)C)cc3c(-c3ccccc3)c3c(-c4ccc(C(C)(C)C)cc4)c4ccc(C(C)(C)C)cc4c(-c4ccccc4)c23)cc1]

In addition to the aforementioned compounds for light emission colors, the following compounds may also be used as the third organic compound.

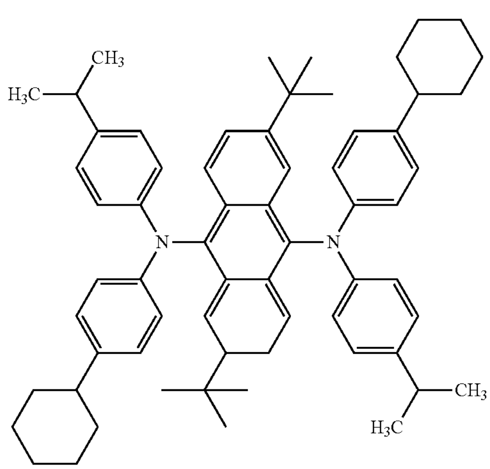

-continued

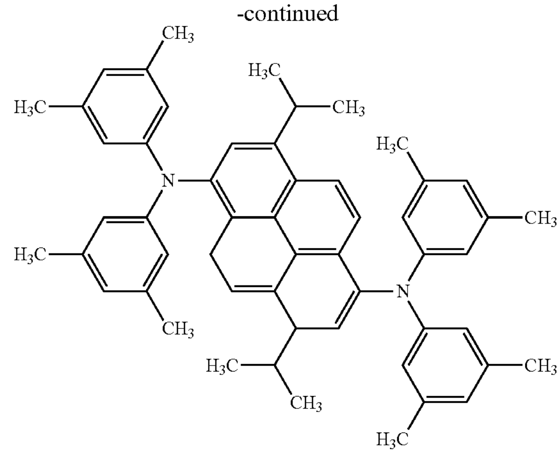

Contents of First Organic Compound, Second Organic Compound and Third Organic Compound The contents of the organic compounds contained in the light emitting layer are not particularly limited, and the content of the second organic compound is preferably smaller than the content of the first organic compound, by which a higher light emission efficiency may be obtained. Specifically, assuming that the total weight of the content W1 of the first organic compound, the content W2 of the second organic compound, and the content W3 of the third organic compound is 100% by weight, the content W1 of the first organic compound is preferably 15% by weight or more and by weight or less, the content W2 of the second organic compound is preferably 5.0% by weight or more and 50% by weight or less, and the content W3 of the third organic compound is preferably 0.5% by weight or more and 5.0% by weight or less.

Additional Organic Compound

The light emitting layer may be constituted only by the first to third organic compounds, and may contain an additional organic compound other than the first to third organic compounds. Examples of the additional organic compound other than the first to third organic compounds include an organic compound having a hole transporting function and an organic compound having an electron transporting function. For examples of the organic compound having a hole transporting function and the organic compound having an electron transporting function, reference may be made to the hole transporting materials and the electron transporting materials described later.

Substrate

The organic electroluminescent device of the invention is preferably supported by a substrate. The substrate is not particularly limited and may be those that have been commonly used in an organic electroluminescent device, and examples thereof used include those formed of glass, transparent plastics, quartz and silicon.

Anode

The anode of the organic electroluminescent device used is preferably formed of as an electrode material a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness thereof may be generally selected from a range of from 10 to 1,000 nm, and preferably from 10 to 200 nm, while depending on the material used.

Cathode

The cathode is preferably formed of as an electrode material a metal having a small work function (4 eV or less) (referred to as an electron injection metal), an alloy or an electroconductive compound each having a small work function (4 ev or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

Injection Layer

The injection layer is a layer that is provided between the electrode and the organic layer, for decreasing the driving voltage and enhancing the light emission luminance, and includes a hole injection layer and an electron injection layer, which may be provided between the anode and the light emitting layer or the hole transporting layer and between the cathode and the light emitting layer or the electron transporting layer. The injection layer may be provided depending on necessity.

Barrier Layer

The barrier layer is a layer that is capable of inhibiting charges (electrons or holes) and/or excitons present in the light emitting layer from being diffused outside the light emitting layer. The electron barrier layer may be disposed between the light emitting layer and the hole transporting layer, and inhibits electrons from passing through the light emitting layer toward the hole transporting layer. Similarly, the hole barrier layer may be disposed between the light emitting layer and the electron transporting layer, and inhibits holes from passing through the light emitting layer toward the electron transporting layer. The barrier layer may also be used for inhibiting excitons from being diffused outside the light emitting layer. Thus, the electron barrier layer and the hole barrier layer each may also have a function as an exciton barrier layer. The term "the electron barrier layer" or "the exciton barrier layer" referred herein is intended to include a layer that has both the functions of an electron barrier layer and an exciton barrier layer by one layer.

Hole Barrier Layer

The hole barrier layer has the function of an electron transporting layer in a broad sense. The hole barrier layer has a function of inhibiting holes from reaching the electron transporting layer while transporting electrons, and thereby enhances the recombination probability of electrons and holes in the light emitting layer. As the material for the hole barrier layer, the materials for the electron transporting layer described later may be used depending on necessity.

Electron Barrier Layer

The electron barrier layer has the function of transporting holes in a broad sense. The electron barrier layer has a function of inhibiting electrons from reaching the hole transporting layer while transporting holes, and thereby enhances the recombination probability of electrons and holes in the light emitting layer.

Exciton Barrier Layer

The exciton barrier layer is a layer for inhibiting excitons generated through recombination of holes and electrons in the light emitting layer from being diffused to the charge transporting layer, and the use of the layer inserted enables effective confinement of excitons in the light emitting layer, and thereby enhances the light emission efficiency of the device. The exciton barrier layer may be inserted adjacent to the light emitting layer on any of the side of the anode and the side of the cathode, and on both the sides. Specifically, in the case where the exciton barrier layer is present on the side of the anode, the layer may be inserted between the hole transporting layer and the light emitting layer and adjacent to the light emitting layer, and in the case where the layer is inserted on the side of the cathode, the layer may be inserted between the light emitting layer and the cathode and adjacent to the light emitting layer. Between the anode and the exciton barrier layer that is adjacent to the light emitting layer on the side of the anode, a hole injection layer, an electron barrier layer and the like may be provided, and between the cathode and the exciton barrier layer that is adjacent to the light emitting layer on the side of the cathode, an electron injection layer, an electron transporting layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light emitting material, respectively.

Hole Transporting Layer

The hole transporting layer is formed of a hole transporting material having a function of transporting holes, and the hole transporting layer may be provided as a single layer or plural layers.

The hole transporting material has one of injection or transporting property of holes and barrier property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

Electron Transporting Layer

The electron transporting layer is formed of a material having a function of transporting electrons, and the electron transporting layer may be provided as a single layer or plural layers.

The electron transporting material (which may also function as a hole barrier material in some cases) needs only to have a function of transporting electrons, which are injected from the cathode, to the light emitting layer. Examples of the electron transporting layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and an oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attracting group. Furthermore, polymer materials having these materials introduced to the polymer chain or having these materials used as the main chain of the polymer may also be used.

In the production of the organic electroluminescent device, the compound represented by the general formula (1) not only may be used in the light emitting layer, but also may be used in the other layers than the light emitting layer. In this case, the compound represented by the general formula (1) used in the light emitting layer and the compound represented by the general formula (1) used in the other layers than the light emitting layer may be the same as or different from each other. For example, the compound represented by the general formula (1) may be used in the injection layer, the barrier layer, the hole barrier layer, the electron barrier layer, the exciton barrier layer, the hole transporting layer, the electron transporting layer and the like described above. The film forming method of the layers are not particularly limited, and the layers may be produced by any of a dry process and a wet process.

Specific examples of preferred materials that may be used in the organic electroluminescent device are shown below, but the materials that may be used in the invention are not construed as being limited to the example compounds. The compound that is shown as a material having a particular function may also be used as a material having another function. In the structural formulae of the example compounds, R and $R_2$ to $R_7$ each independently represent a hydrogen atom or a substituent, and n represents an integer of from 3 to 5.

Preferred examples of a compound that may be used as the hole injection material are shown below.

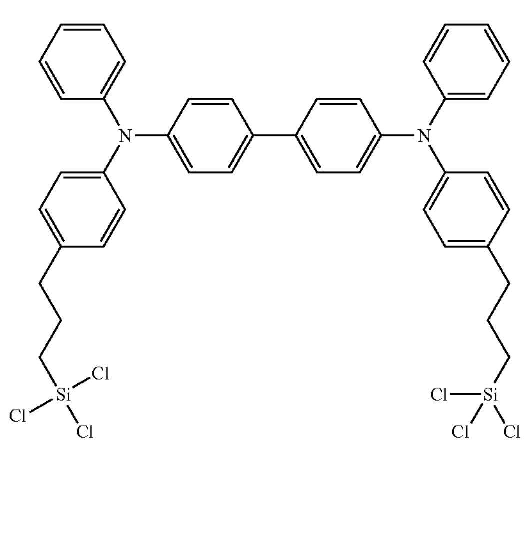

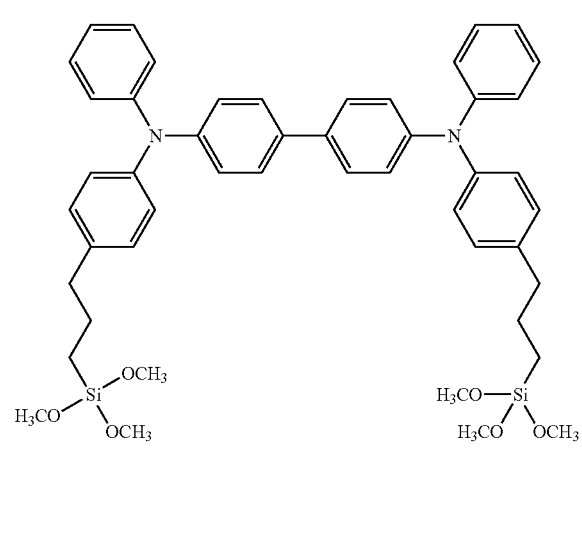

-continued
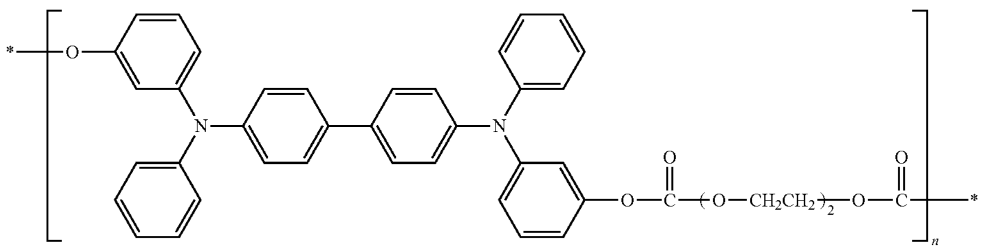
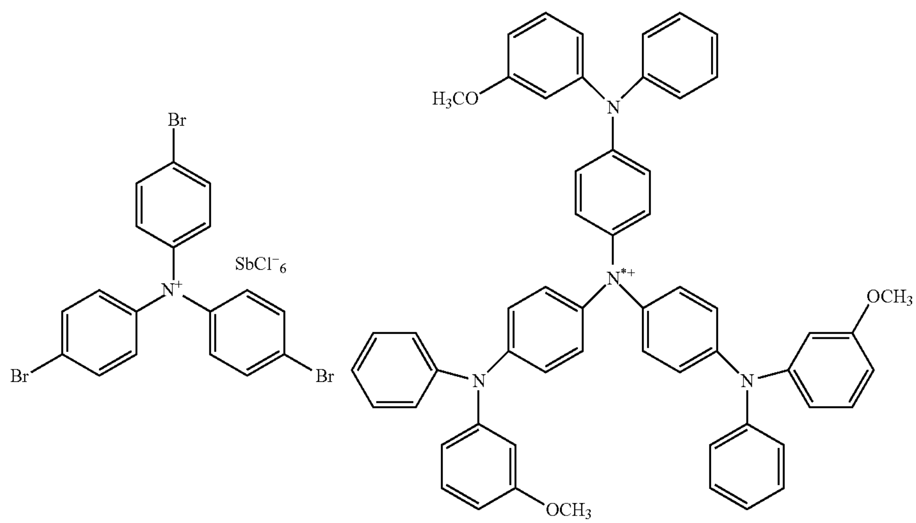
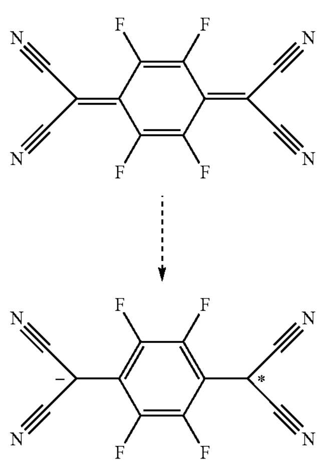
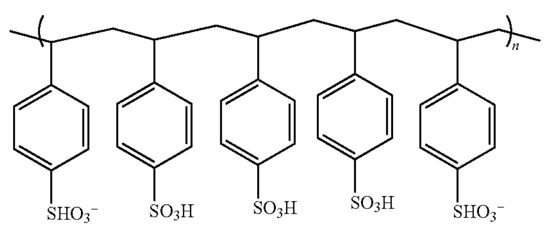
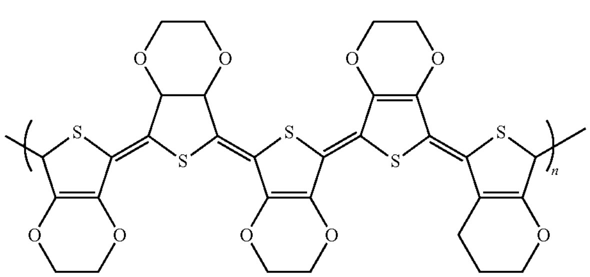

Preferred examples of a compound that may be used as the hole transporting material are shown below.
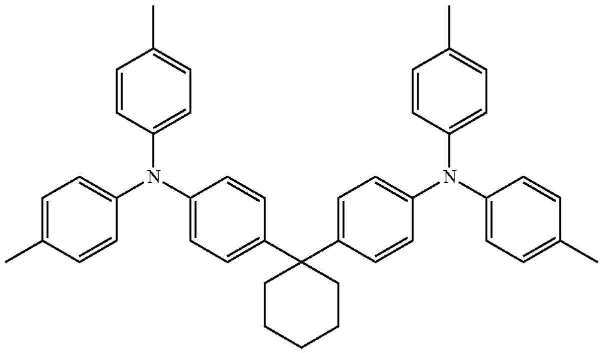
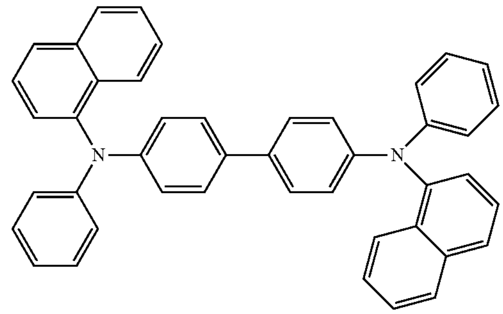
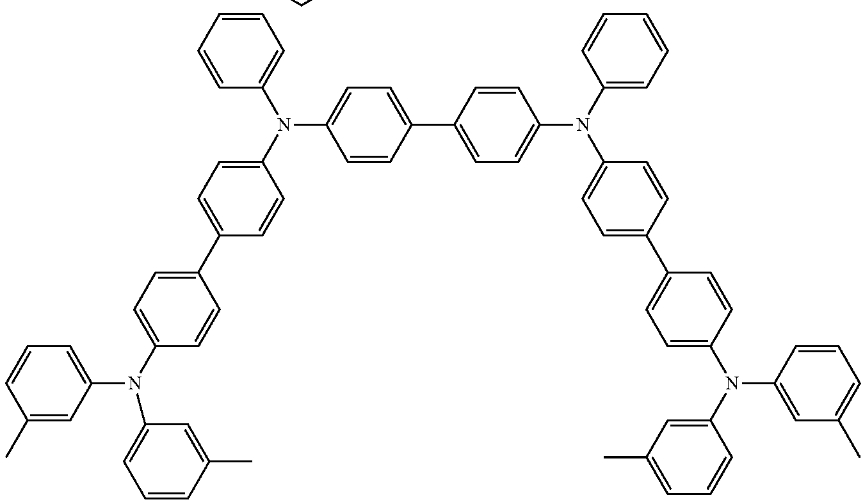
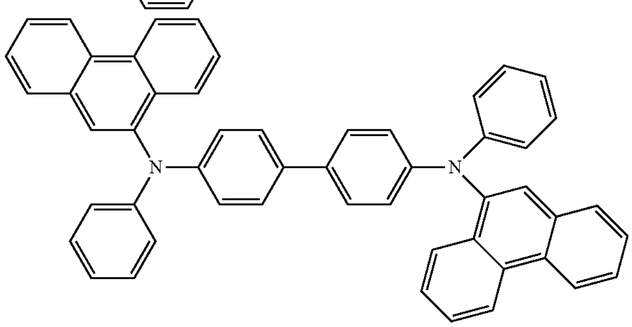
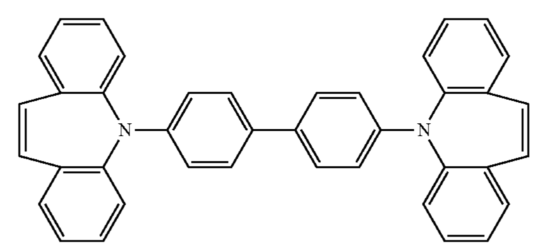
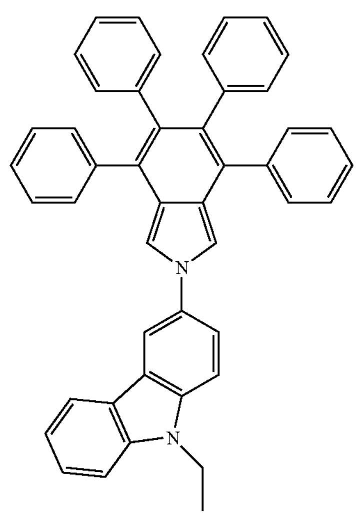

-continued
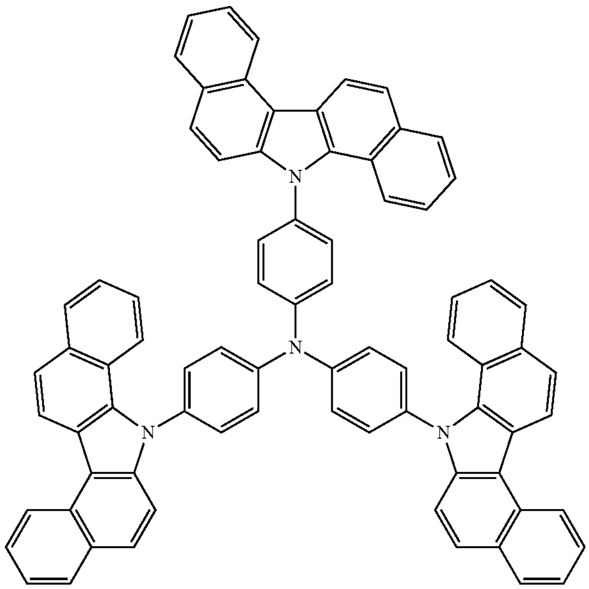
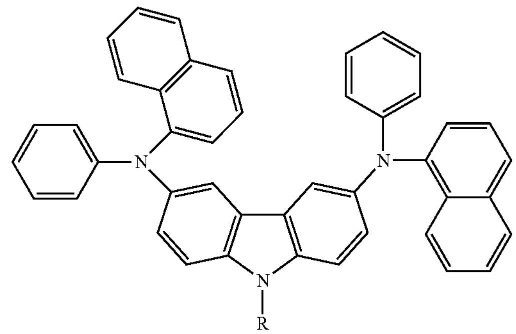
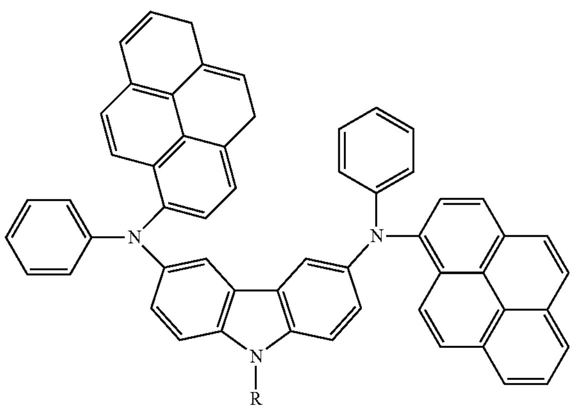
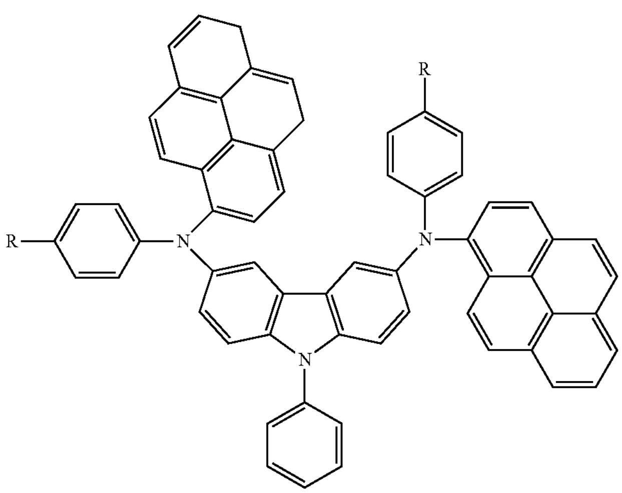

-continued
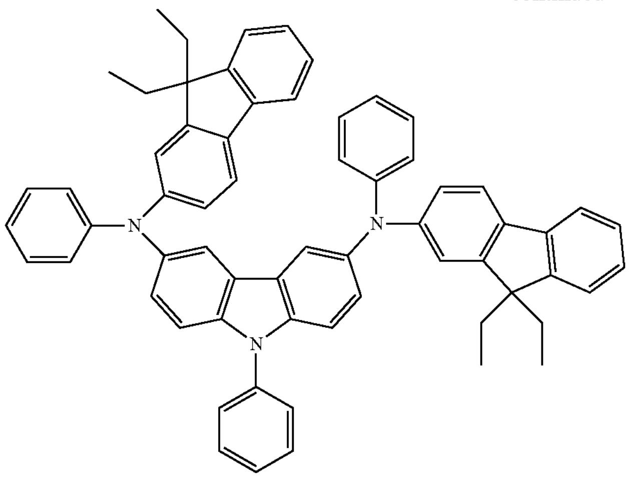
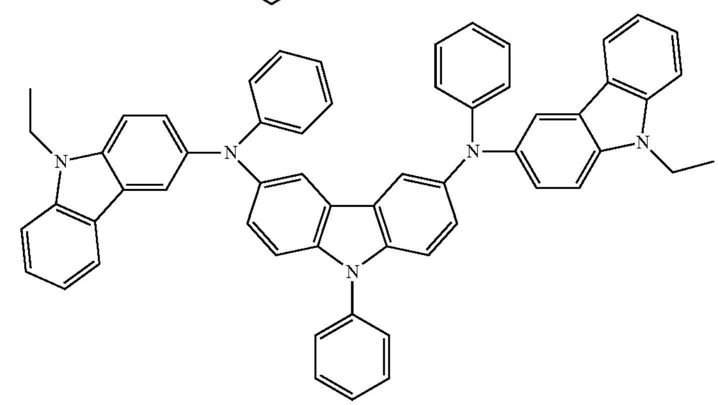
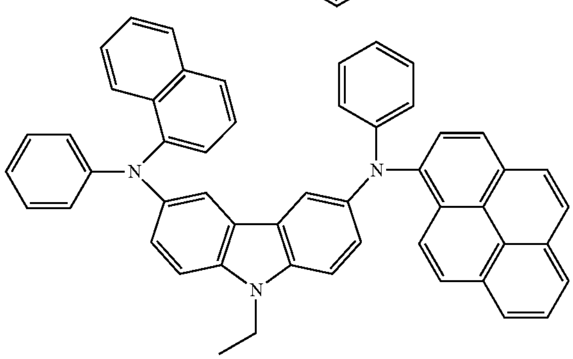
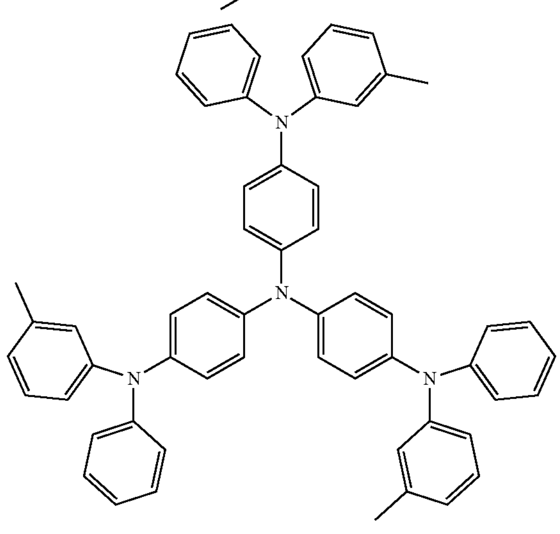
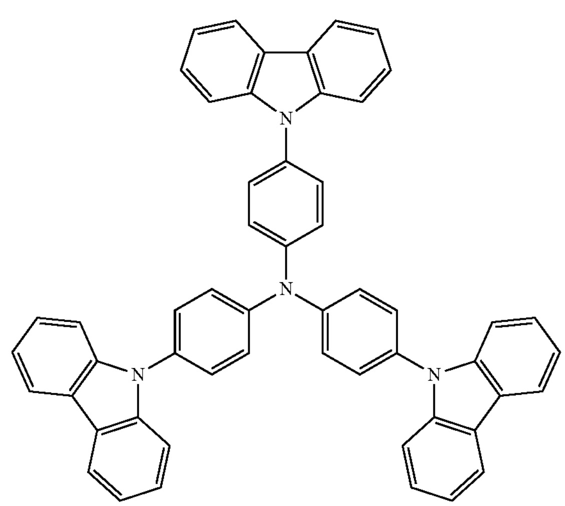

-continued
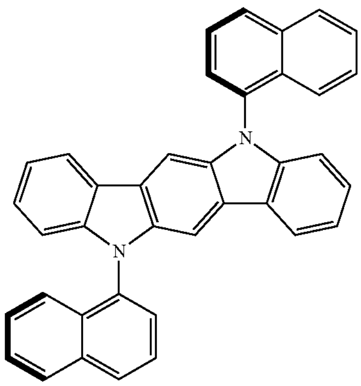
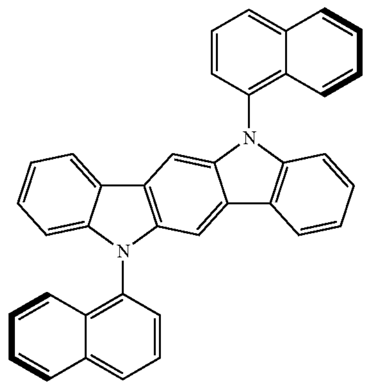
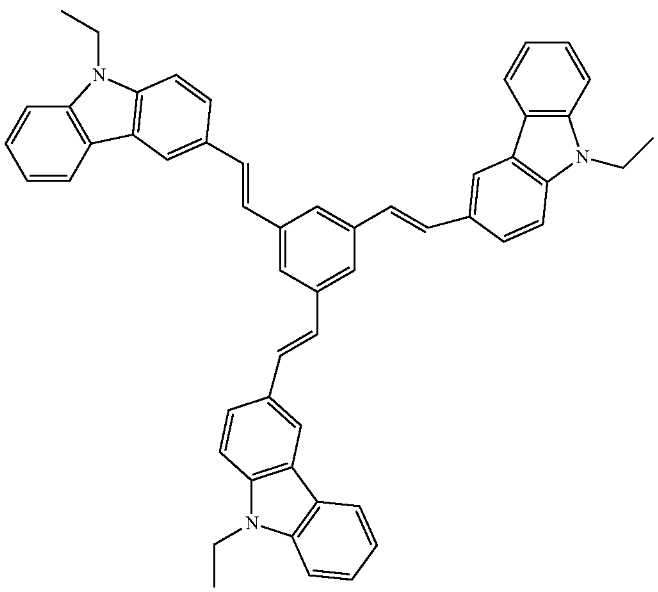
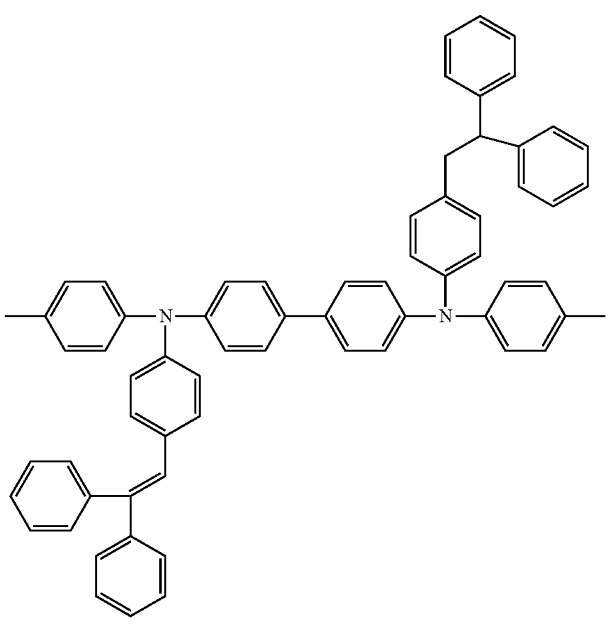

-continued
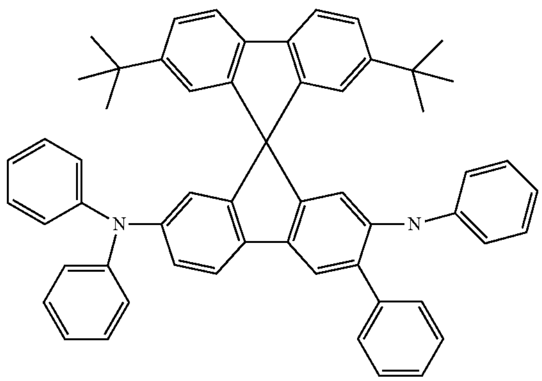
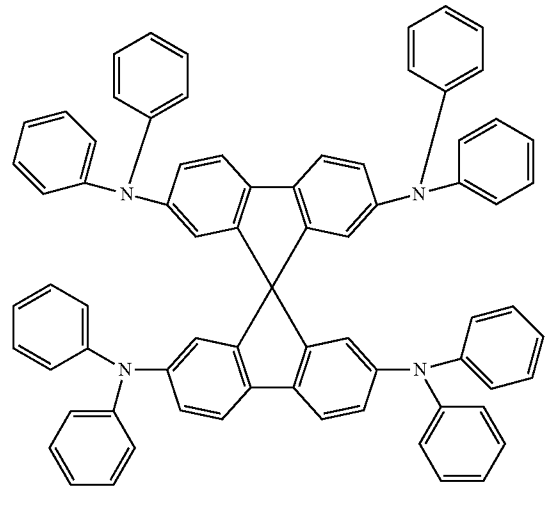
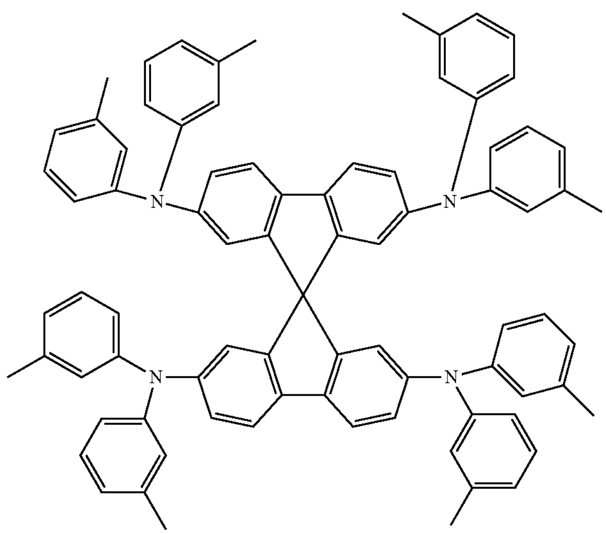
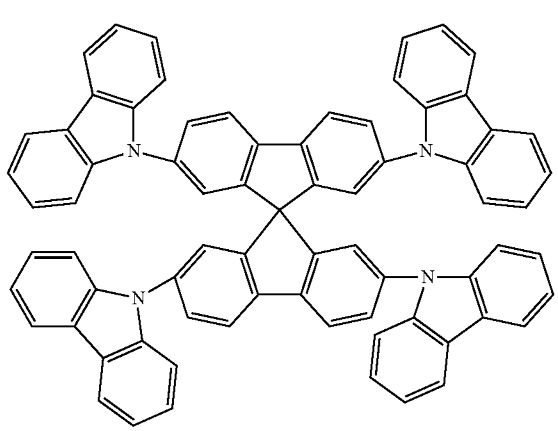
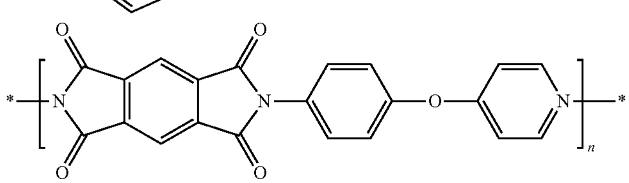

-continued
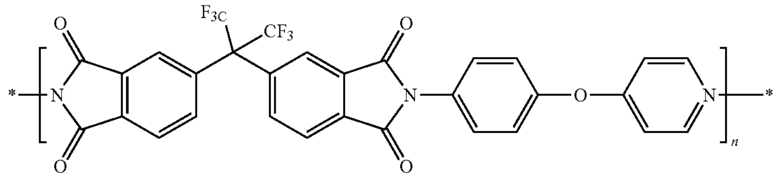
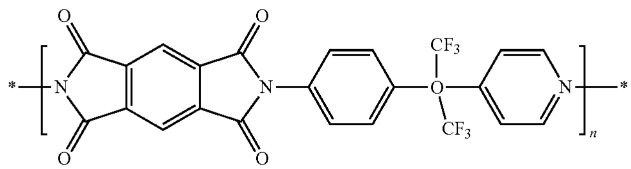
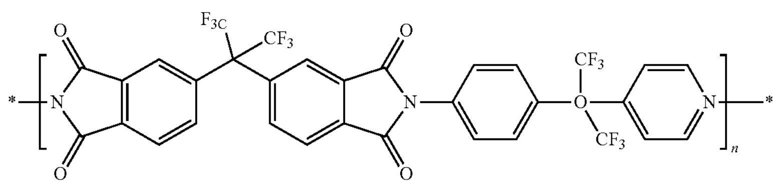
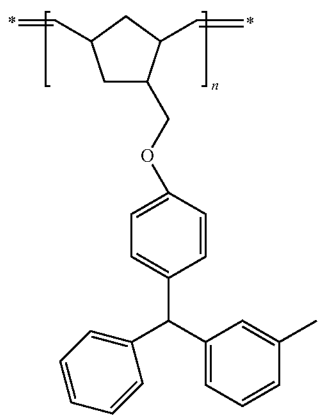
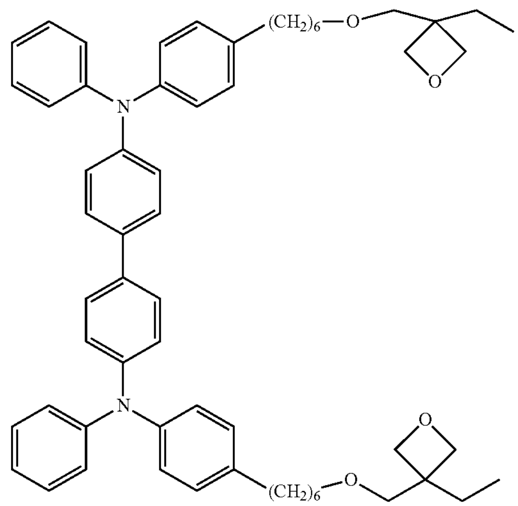
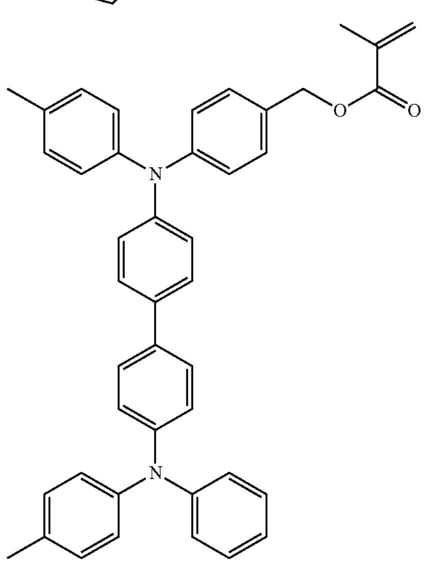
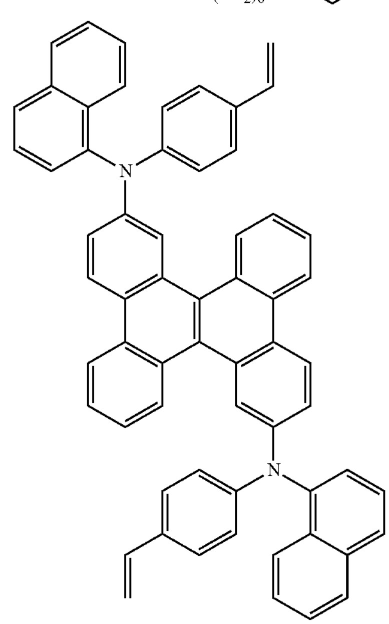

-continued
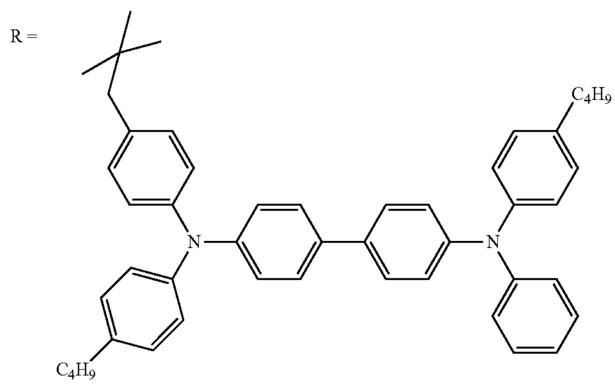
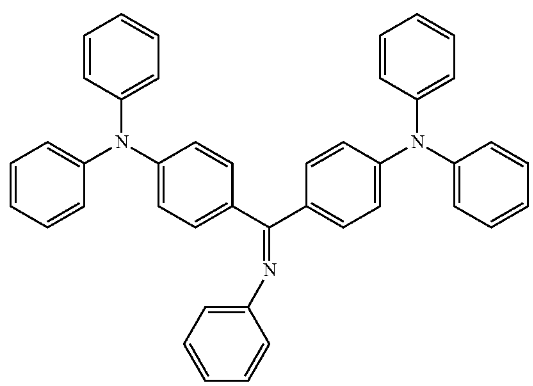
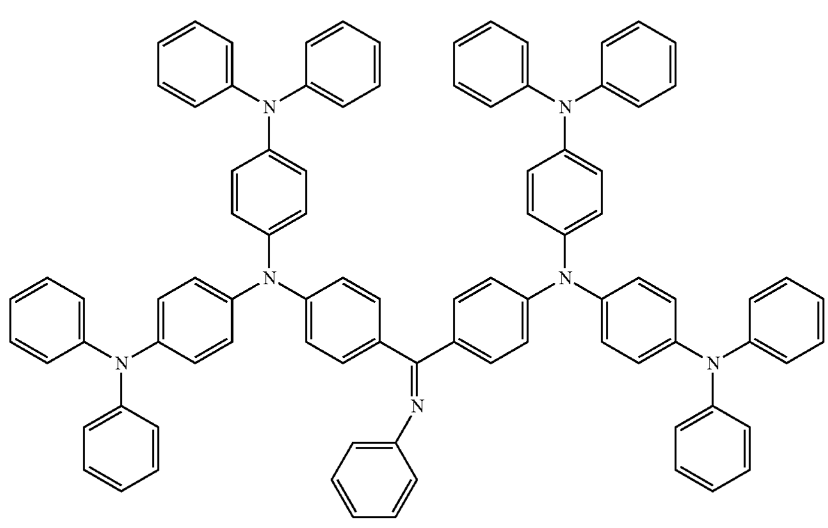

-continued
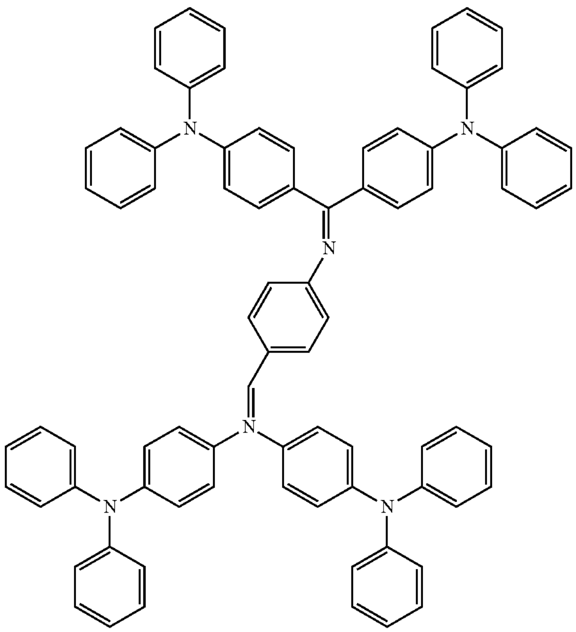
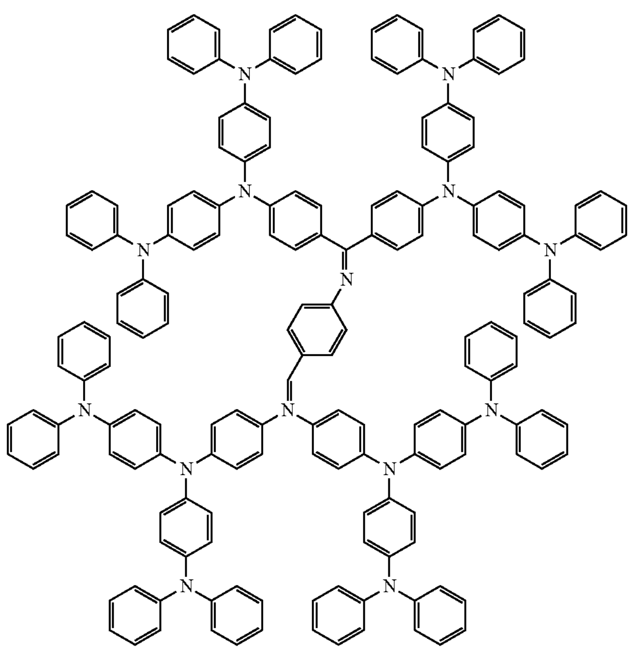

-continued
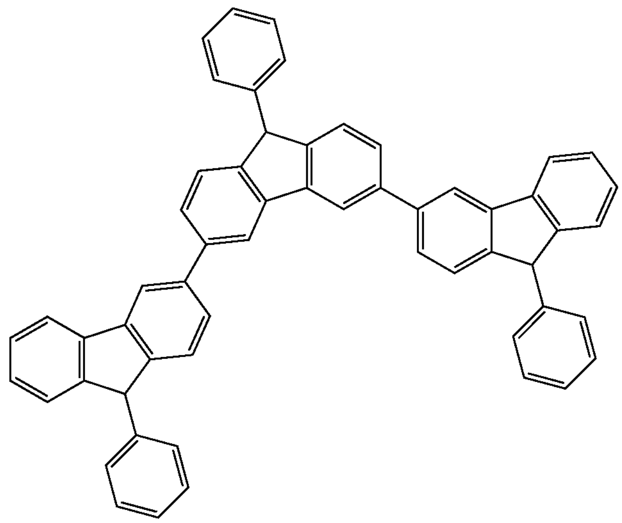
Preferred examples or a compound that may be used as the electron barrier material are shown below.
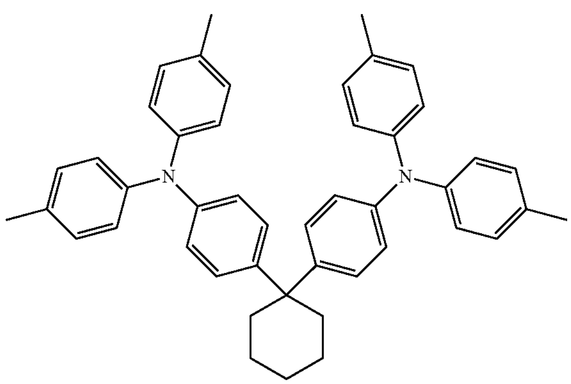
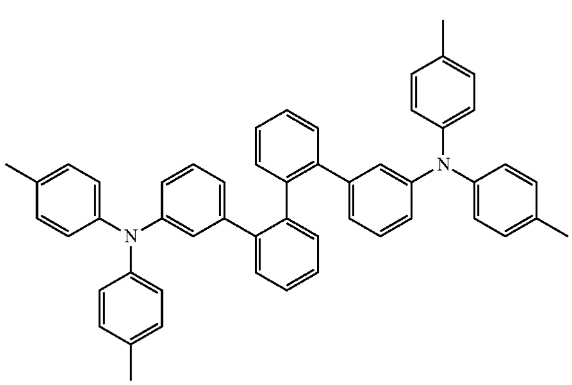
-continued
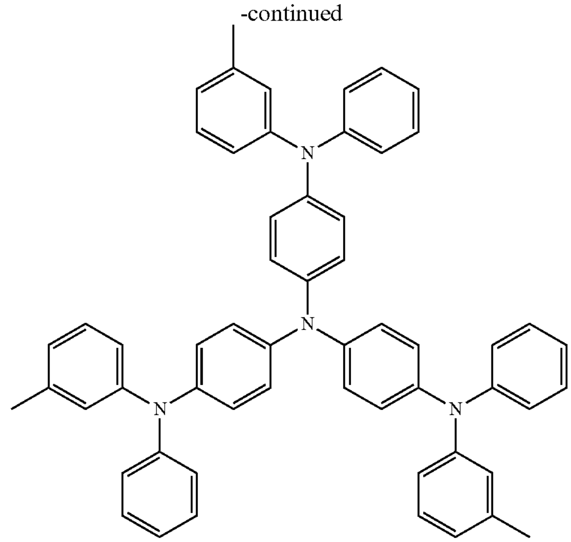
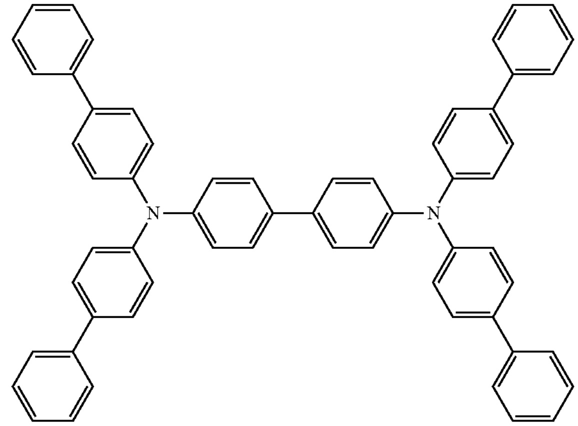
Preferred examples of a compound that may be used as the hole barrier material are shown below.

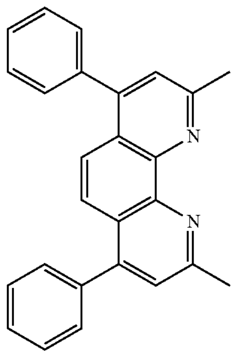
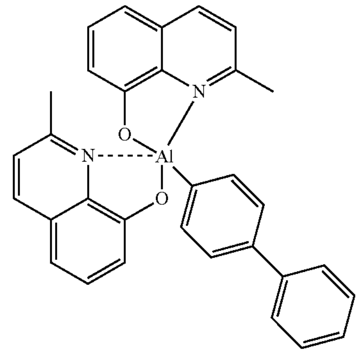
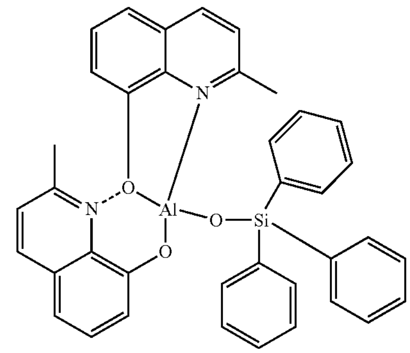
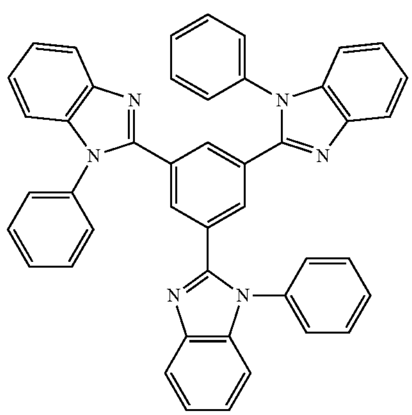
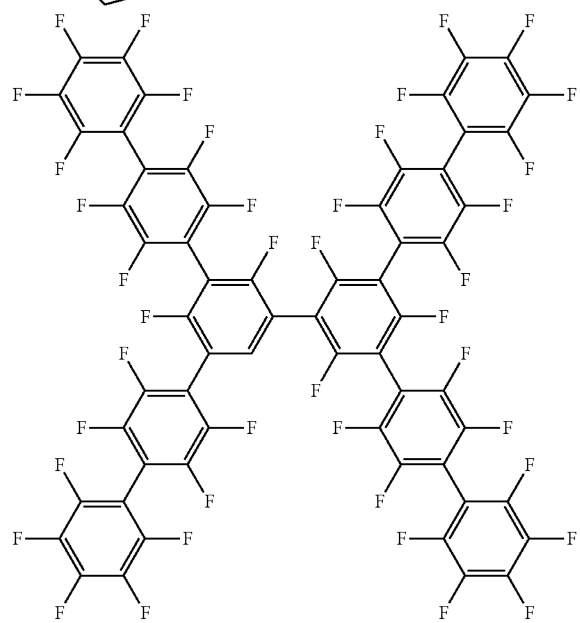
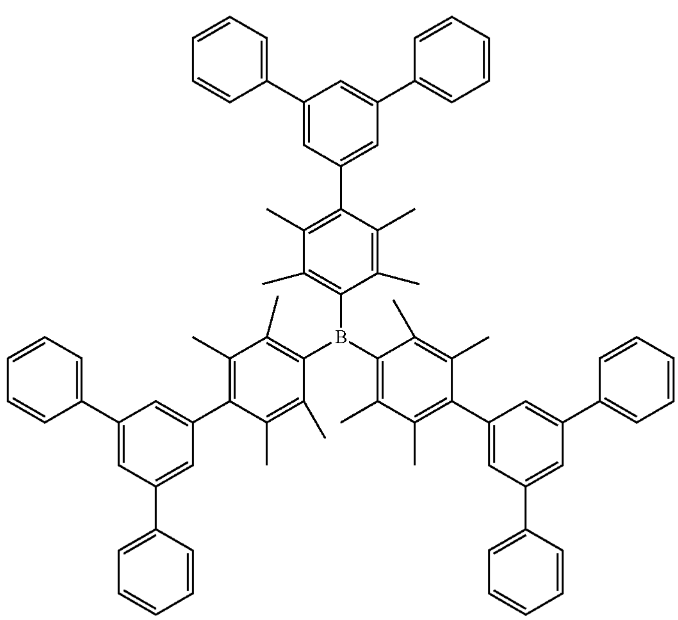

-continued
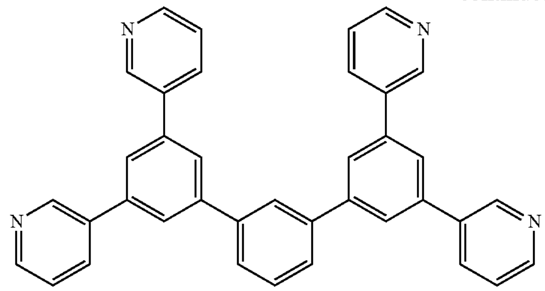
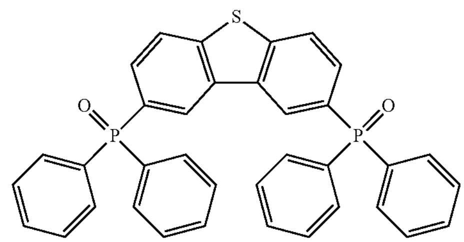
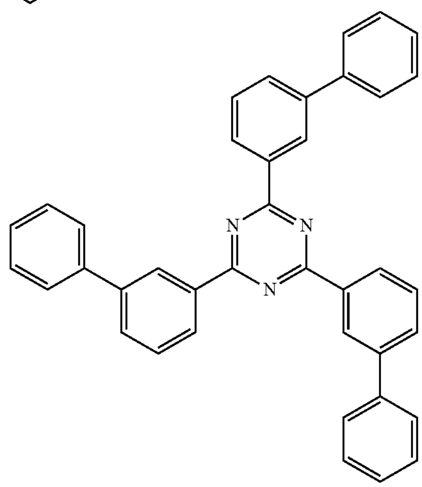
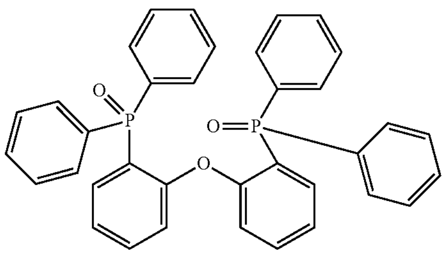
Preferred examples of a compound that may be used as the electron transporting material are shown below.
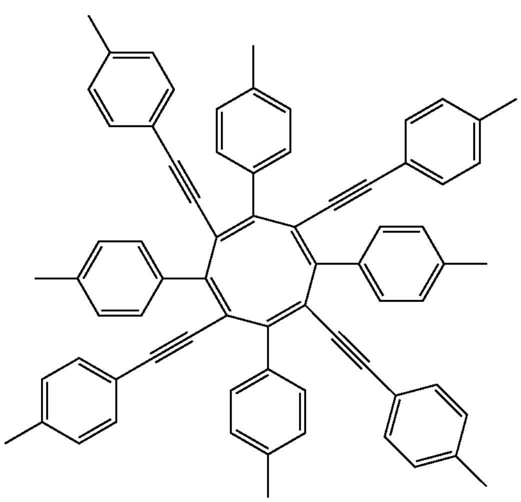
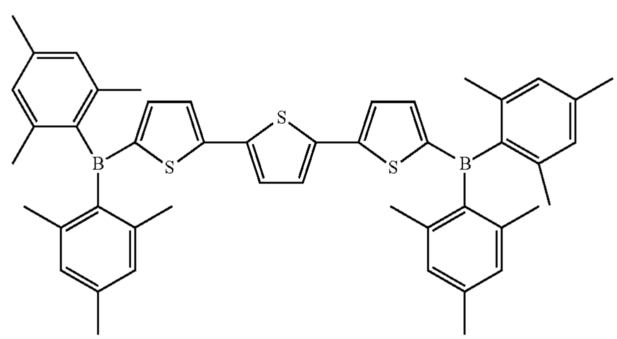
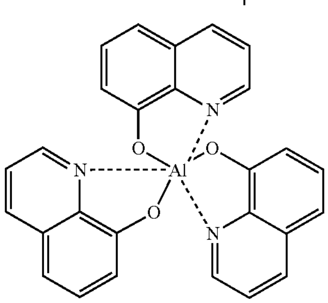
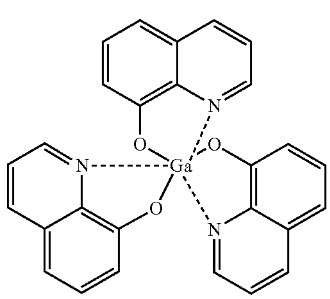
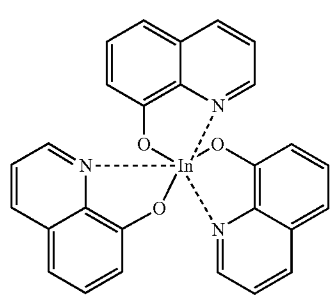

-continued
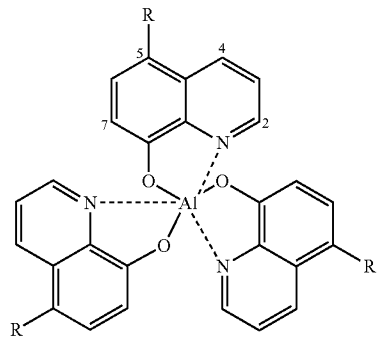
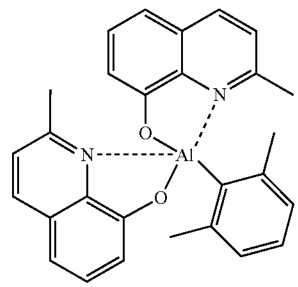
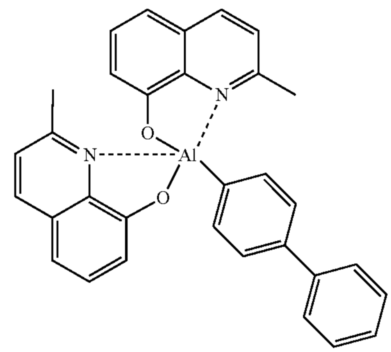
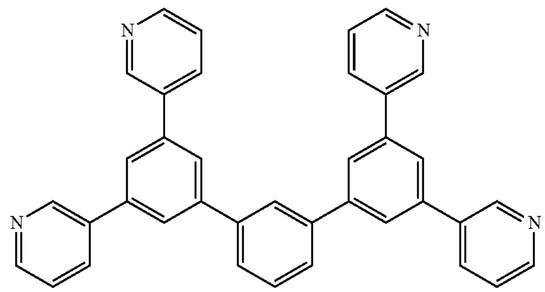
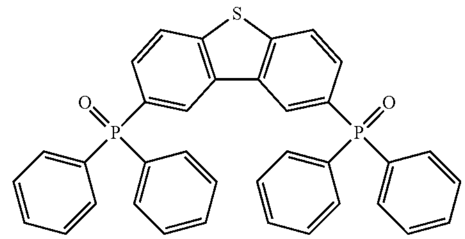
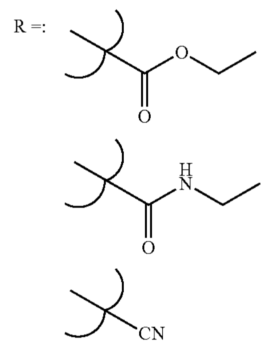
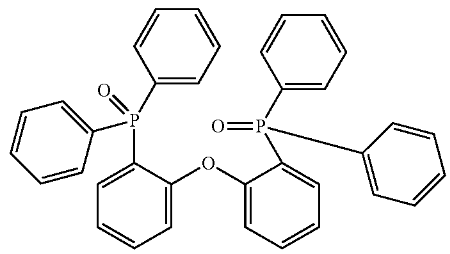
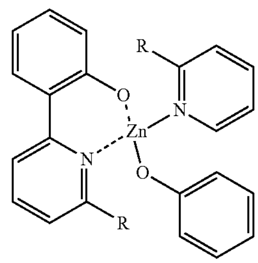
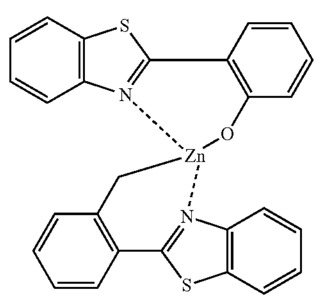
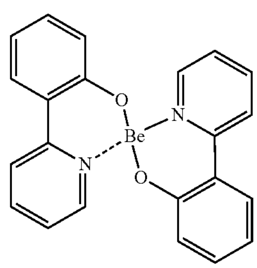
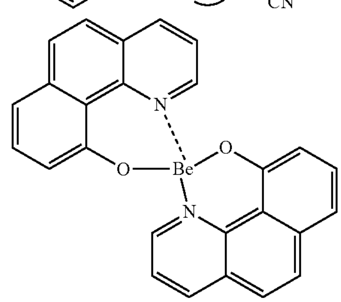
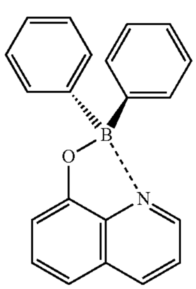
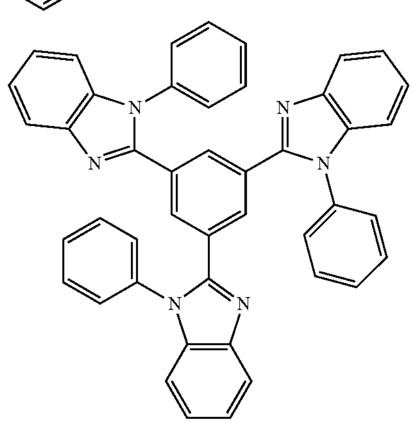

-continued
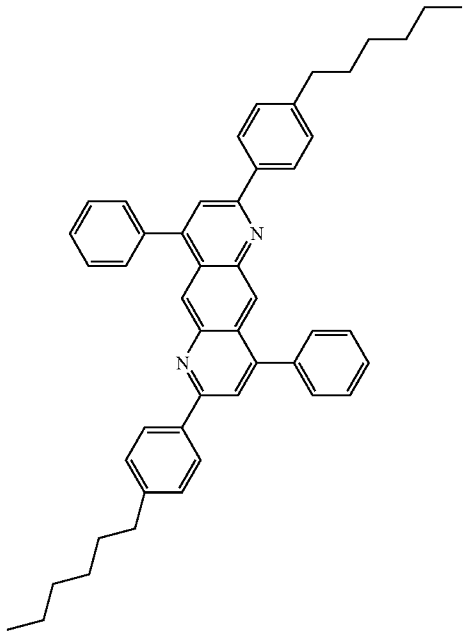
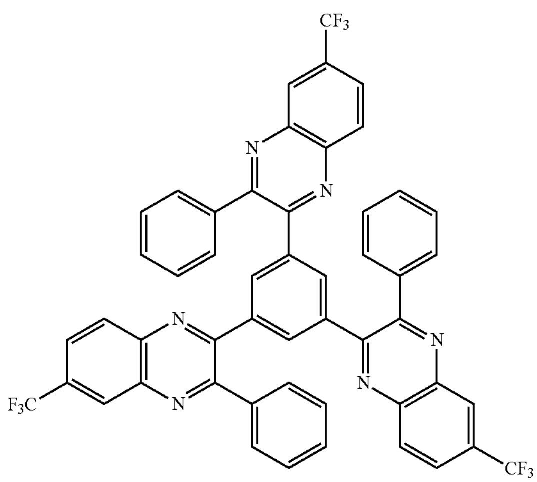
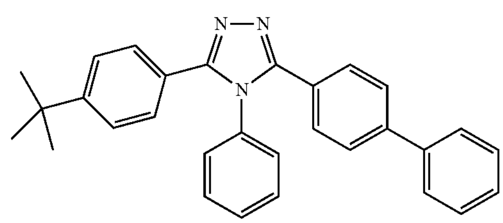
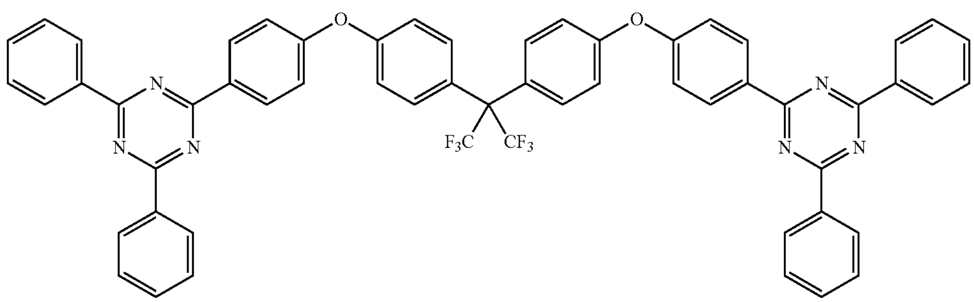
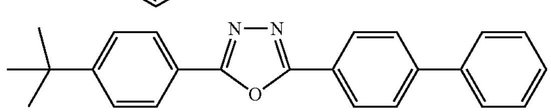
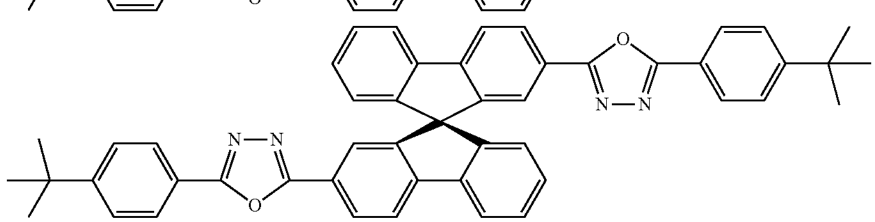

-continued
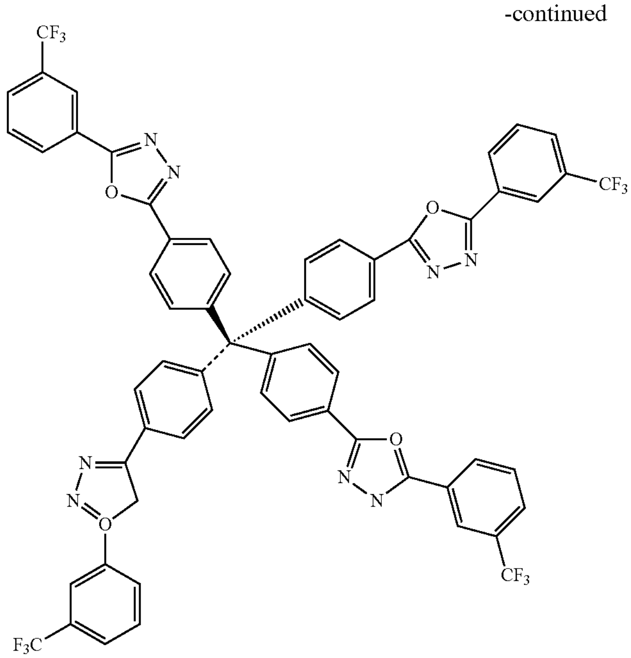
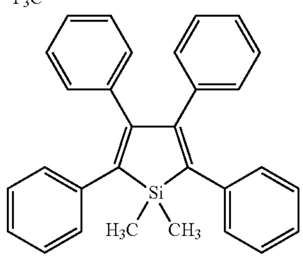
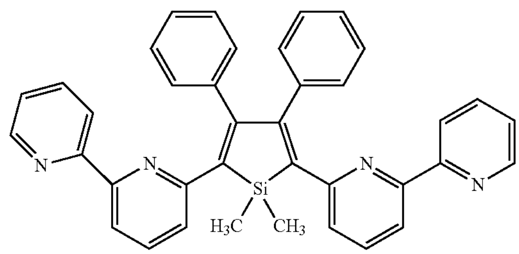
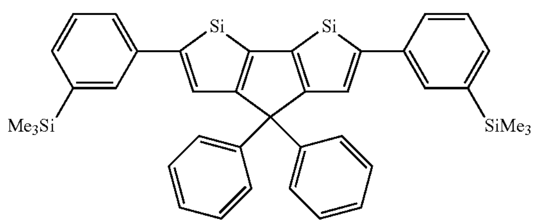
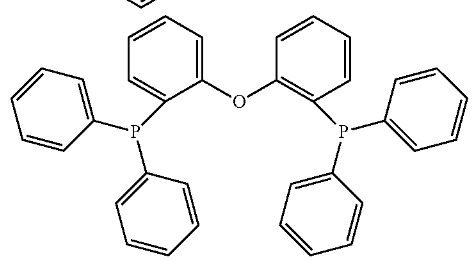
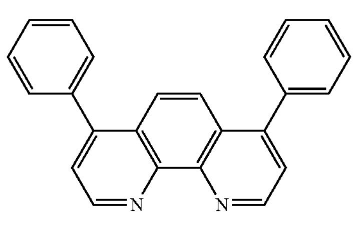
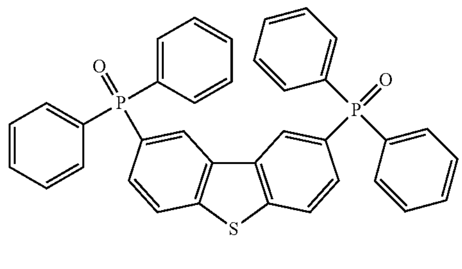
Preferred examples of a compound that may be used as the electron injection material are shown below.
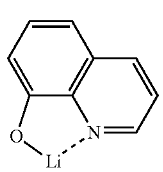
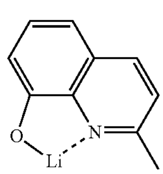
-continued
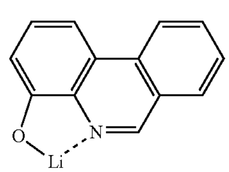

-continued

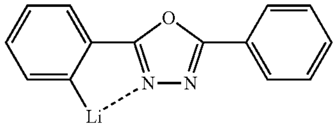

Preferred examples of a compound as a material that may be added are shown below. For example, the compound may be added as a stabilizing material.

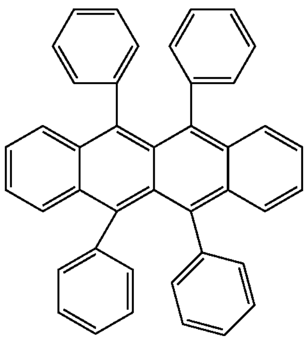

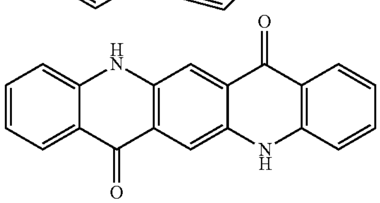

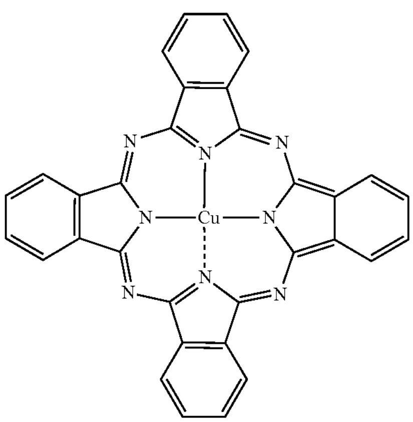

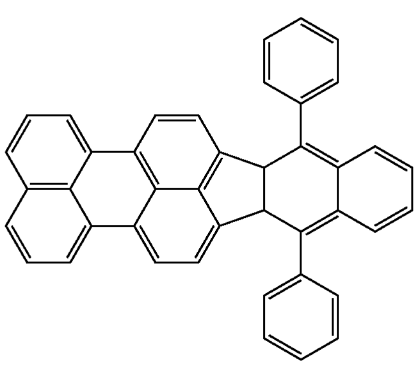

-continued

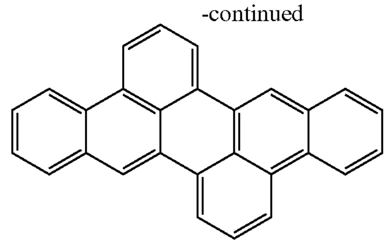

The organic electroluminescent device thus produced by the aforementioned method emits light on application of an electric field between the anode and the cathode of the device. In this case, when the light emission is caused by the singlet excitation energy, light having a wavelength that corresponds to the energy level thereof may be confirmed as fluorescent light and delayed fluorescent light. When the light emission is caused by the triplet excitation energy, light having a wavelength that corresponds to the energy level thereof may be confirmed as phosphorescent light. The normal fluorescent light has a shorter light emission lifetime than the delayed fluorescent light, and thus the light emission lifetime may be distinguished between the fluorescent light, and the delayed fluorescent light.

On the other hand, phosphorescent light is substantially not observed at room temperature since in an ordinary organic compound, such as the compound of the invention, the triplet excitation energy is converted to heat or the like due to the instability thereof, and thus is immediately deactivated with a short lifetime. The triplet excitation energy of the ordinary organic compound may be measured only by observing light emission under an extremely low temperature condition.

The organic electroluminescent device of the invention may be applied to any of a single device, a structure with plural devices disposed in an array, and a structure having anodes and cathodes disposed in an X-Y matrix. According to the invention, an organic light emitting device that is largely improved in light emission efficiency may be obtained by adding the compound represented by the general formula (1) in the light emitting layer. The organic light emitting device, such as the organic electroluminescent device of the invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to organic electroluminescent illumination and backlight which are highly demanded.

EXAMPLE

The features of the invention will be described more specifically with reference to examples below. The materials, processes, procedures and the like shown below may be appropriately modified unless they deviate from the substance of the invention. Accordingly, the scope of the invention is not construed as being limited to the specific examples shown below. The light emission characteristics were evaluated by using High-performance UV/Vis/NIR Spectrophotometer (Lambda 950, produced by PerkinElmer, Co., Ltd.), Fluorescence Spectrophotometer (FluoroMax-4, produced by Horiba, Ltd.), Absolute PL Quantum Yield Measurement System (C11347, produced by Hamamatsu Photonics K.K.), Source Meter (2400 Series, produced by Keithley Instruments Inc.), Semiconductor Parameter Analyzer (E5273A, produced by Agilent Technologies, Inc.), Optical Power Meter (1930C, produced by Newport Corporation), Fiber Optic Spectrometer (USB2000, produced by Ocean Optics, Inc.), Spectroradiometer (SR-3, produced by Topcon Corporation), and Streak Camera (Model C4334, produced by Hamamatsu Photonics K.K.).

The lowest singlet excitation energy level $E_{S1}$ and the lowest triplet excitation energy level $E_{T1}$ of the compounds used in Examples and Comparative Examples were measured in the following procedures. The energy difference $\Delta E_{S1}$ between the lowest singlet excited state and the lowest triplet excited state at 77 K was obtained by measuring the difference between $E_{S1}$ and $E_{T1}$.

(1) Lowest Singlet Excitation Energy Level $E_{S1}$

The compound to be measured was vapor-deposited on a Si substrate to produce a specimen, and the specimen was measured for a fluorescent spectrum at ordinary temperature (300 K). In the fluorescent spectrum, the ordinate is the light emission, and the abscissa is the wavelength. A tangent line was drawn for the downfalling part of the light emission spectrum on the short wavelength side, and the wavelength λedge (nm) of the intersection point of the tangent line and the abscissa was obtained. The wavelength value was converted to an energy value according to the following conversion expression to provide the singlet energy $E_{S1}$.

Conversion Expression $$E_{S1}(\text{eV})=1239.85/\lambda\text{edge}$$

The light emission spectrum was measured with a nitrogen laser (MNL200, produced by Lasertectnik Berlin GmbH) as an excitation light source and Streak Camera (C4334, produced by Hamamatsu Photonics K.K.) as a detector.

(2) Lowest Triplet Excitation Energy Level $E_{T1}$

The same specimen as used for the singlet energy $E_{S1}$ was cooled to 77 K, the specimen for measuring phosphorescent light was irradiated with excitation light (337 nm), and the phosphorescence intensity was measured with a streak camera. A tangent line was drawn for the upstanding part of the phosphorescent spectrum on the short wavelength side, and the wavelength λedge (nm) of the intersection point of the tangent line and the abscissa was obtained. The wavelength value was converted to an energy value according to the following conversion expression to provide the singlet energy $E_{T1}$.

Conversion Expression $$E_{T1}(\text{eV})=1239.85/\lambda\text{edge}$$

The tangent line for the upstanding part of the phosphorescent spectrum on the short wavelength side was drawn in the following manner. Over the range in the phosphorescent spectrum curve of from the short wavelength end to the maximum peak value closest to the short wavelength end among the maximum peak values of the spectrum, a tangent line was assumed while moving within the range toward the long wavelength side. The gradient of the tangent line increased while the curve was standing up (i.e., the value of the ordinate was increased). The tangent line that was drawn at the point where the gradient thereof became maximum was designated as the tangent line for the upstanding part of the phosphorescent spectrum on the short wavelength side.

A maximum peak having a peak intensity that was 10% or less of the maximum peak point intensity of the spectrum was not included in the maximum peak values and thus was not designated as the maximum peak value closest to the short wavelength end, and the tangent line that was drawn at the point where the gradient became maximum that was closest to the maximum peak value closest to the short wavelength end was designated as the tangent line for the upstanding part of the phosphorescent spectrum on the short wavelength side.

Example 1

Production and Evaluation of Organic Electroluminescent Devices using mCBP (First Organic Compound), PXZ-TRZ (Second Organic Compound), and TBRb (Third Organic Compound)

The following organic compounds were prepared as materials of a light emitting layer.

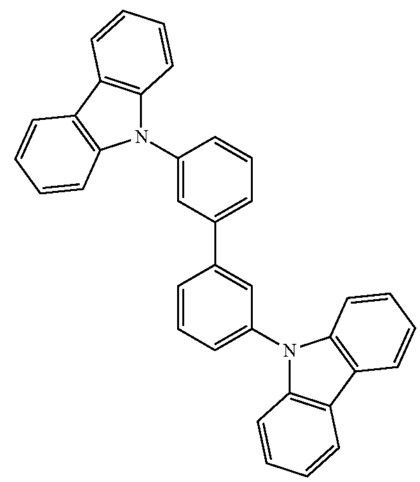

mCBP

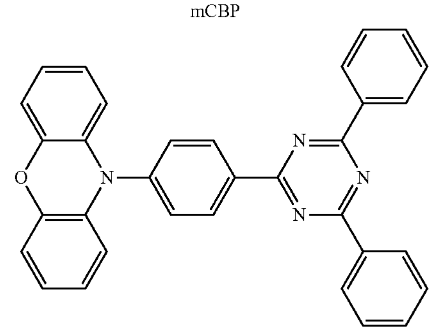

PXZ-TRZ

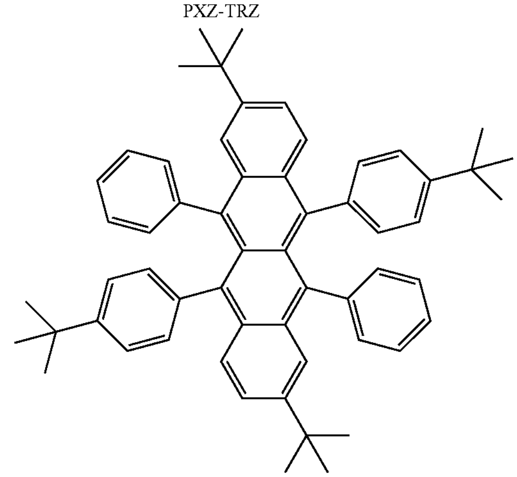

Figure 2:
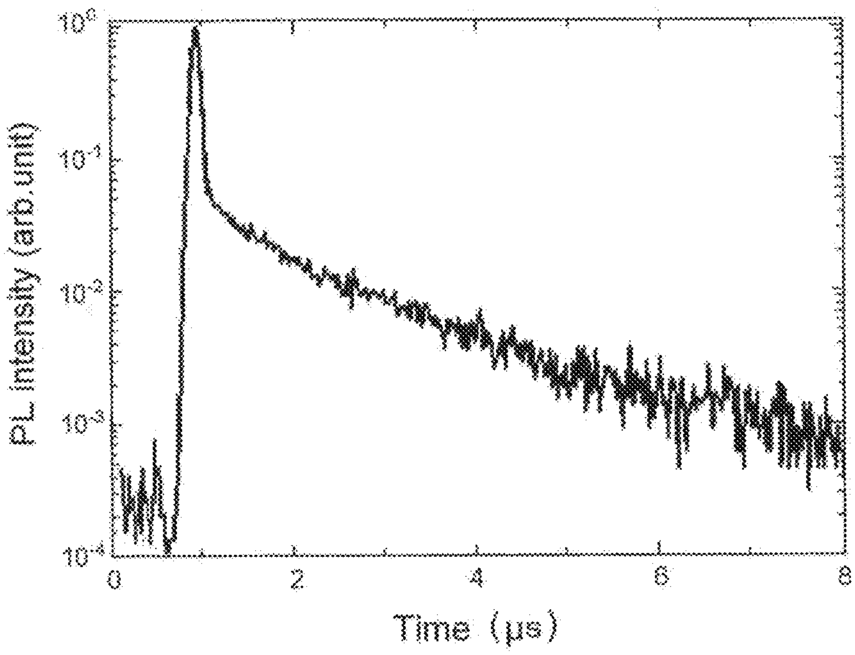
FIG. 2 is a transient decay curve of a PXZ-TRZ thin film.

TBRb mCBP has a lowest singlet excitation energy level $E_{S1}$ of 2.7 eV and a lowest triplet excitation energy level $E_{T1}$ of 2.90 eV, PXZ-TRZ has a lowest singlet excitation energy level $E_{S1}$ of 2.3 eV and a lowest triplet excitation energy level $E_{T1}$ of 2.23 eV, and TBRb has a lowest singlet excitation energy level $E_{S1}$ of 2.18 eV. FIG. 2 shows a transient decay curve of a PXZ-TRZ thin film. It was confirmed from FIG. 2 that PXZ-TRZ was an organic compound that exhibited delayed fluorescence. The energy difference $\Delta E_{st}$ between the lowest singlet excited state and the lowest triplet excited state at 77 K of PXZ-TRZ was 0.070 eV.

An organic electroluminescent device was produced by using mCBP, PXZ-TRZ, and TBRb as materials of a light emitting layer.

Thin films were laminated on a glass substrate having formed thereon an anode formed of indium tin oxide (ITO) having a thickness of 110 nm, by a vacuum vapor deposition method at a vacuum degree of $5.0\times10^{-5}$ Pa or less. Firstly, HATCN was formed to a thickness of 10 nm on ITO, and thereon TrisPCz was formed to a thickness of 30 nm. mCBP, PXZ-TRZ, and TBRb were then vapor-co-deposited from separate vapor deposition sources to form a layer having a thickness of 15 n, which was designated as a light emitting layer. At this time, the concentration of PXZ-TRZ was selected from a range of from 10 to 50% by weight, and the concentration of TBRb was 1% by weight. T2T was then formed to a thickness of 10 nm, and thereon BPyTP2 was formed to a thickness of 55 nm. Lithium fluoride (LiF) was then vacuum vapor-deposited to a thickness of 0.8 nm, and then aluminum (Al) was vapor-deposited to a thickness of 100 nm to form a cathode, thereby producing organic electroluminescent devices having various compositional ratios of the light emitting layer.

Figure 3:
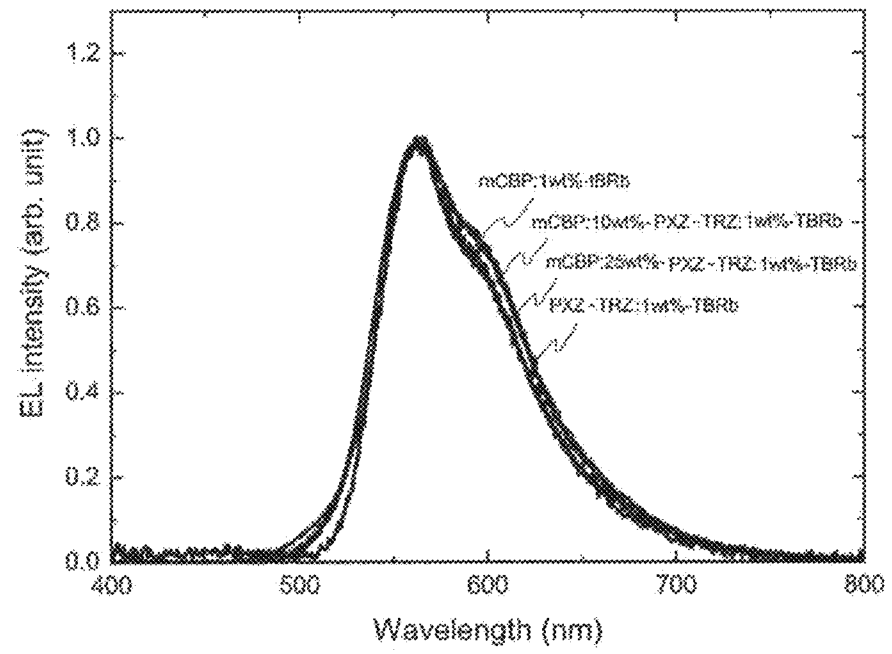
FIG. 3 is the light emission spectra of the organic electroluminescent devices produced in Example 1 and Comparative Examples 1 and 2.
Figure 4:
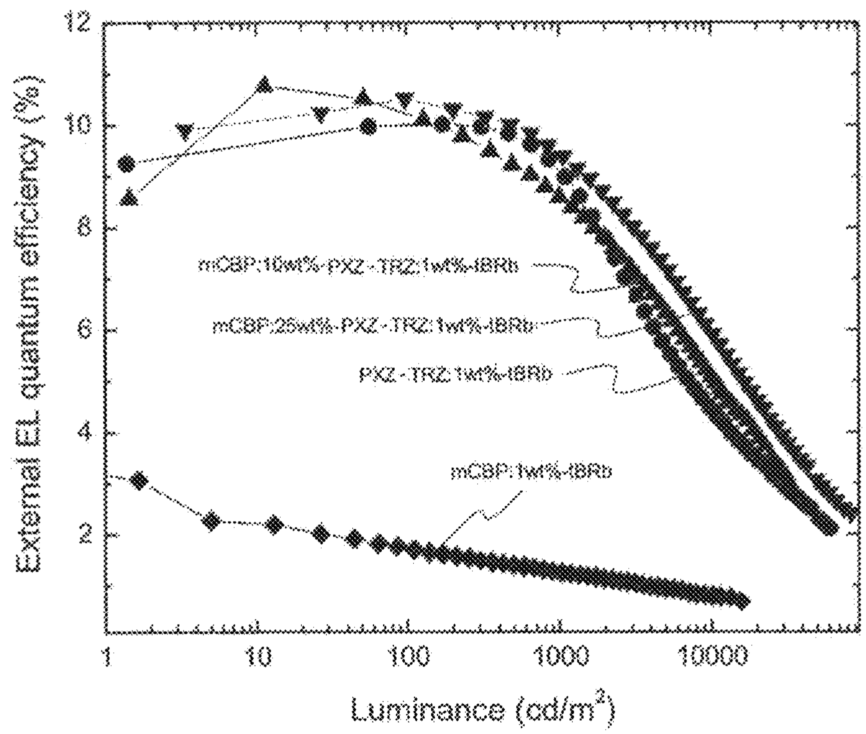
FIG. 4 is a graphs showing the luminance-external quantum efficiency characteristics of the organic electroluminescent devices produced in Example 1 and Comparative Examples 1 and 2.
Figure 5:
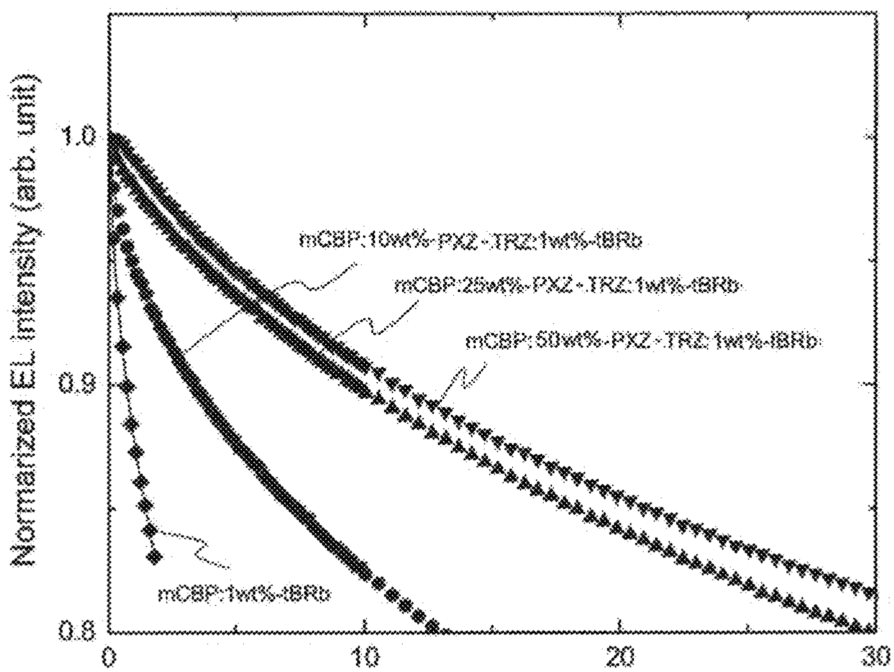
FIG. 5 is the transient decay curves of the organic electroluminescent devices produced in Example 1 and Comparative Example 1.
Figure 6:
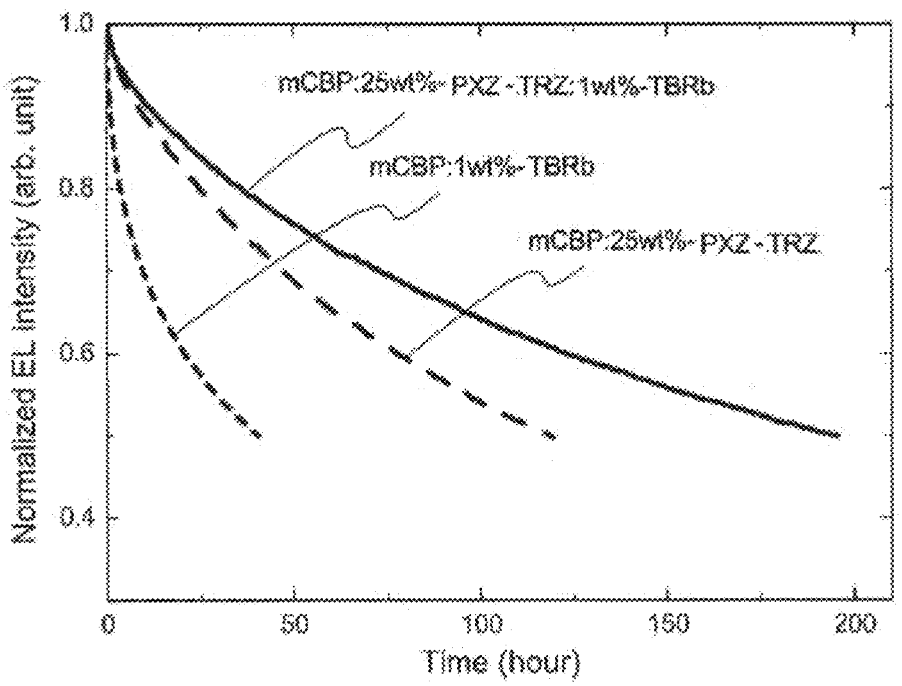
FIG. 6 is the transient decay curves of the organic electroluminescent devices produced in Example 1 and Comparative Examples 1 and 3.

FIG. 3 shows the light emission spectra of the organic electroluminescent devices thus produced, FIG. 4 shows the luminance-external quantum efficiency characteristics thereof, and FIGS. 5 and 6 show the transient decay curves thereof.

Comparative Example 1

Production and Evaluation of Organic Electroluminescent Device using mCBP and TBRb An organic electroluminescent device was produced in the same manner as in Example 1 except that in the production of the light emitting layer, the vapor deposition source for PXZ-TRZ was not used to form a vapor deposition film containing mCBP and 1% by weight of TBRb.

FIGS. 3 to 6 show the light emission spectrum, the luminance-external quantum efficiency characteristics, and the transient decay curve of the organic electroluminescent device thus produced, along with the measurement results of Example 1.

Comparative Example 2

Production and Evaluation of Organic Electroluminescent Device using PXZ-TRZ and TBRb An organic electroluminescent device was produced in the same manner as in Example 1 except that in the production of the light emitting layer, the vapor deposition source for mCBP was not used to form a vapor deposition film containing only PXZ-TRZ and 1% by weight of TBRb.

FIGS. 3 and 4 show the light emission spectrum and the luminance-external quantum efficiency characteristics of the organic electroluminescent device thus produced, along with the measurement results of Example 1.

Comparative Example 3

Production and Evaluation of Organic Electroluminescent Device using mCBP and PXZ-TRZ An organic electroluminescent device was produced in the same manner as in Example 1 except that in the production of the light emitting layer, the vapor deposition source for TBRb was not used to form a vapor deposition film containing mCBP and 25% by weight of PXZ-TRZ.

FIG. 6 shows the transient decay curve of the organic electroluminescent device thus produced, along with the measurement results of Example 1 and Comparative Example 1.

The characteristic values of the organic electroluminescent devices obtained from the characteristic graphs are shown in Table 22, and the initial luminances in the measurement of the transient decay curves shown in FIG. 6 and the luminance half-life periods obtained from FIG. 6 are shown in FIG. 23.

TABLE 22

| | Composition of light emitting layer | External quantum efficiency (%) | Current density (mA/cm²) | Voltage (V) | Power efficiency (lm/W) | CIE chromaticity (x, y) | Light emission peak wavelength (nm) |
|---|---|---|---|---|---|---|---|
| Example 1 | mCBP + 10 wt % PXZ-TRZ + 1 wt % TBRb | 9.12 | 3.51 | 3.52 | 25.52 | 0.4746, 0.5182 | 562.7 |
| | mCBP + 25 wt % PXZ-TRZ + 1 wt % TBRb | 9.44 | 3.52 | 4.14 | 21.59 | 0.4854, 0.5069 | 565.7 |
| Comparative Example 1 | mCBP + 1 wt % TBRb | 1.26 | 25.66 | 7.56 | 1.62 | 0.4692, 0.4957 | 561.2 |
| Comparative Example 2 | PXZ-TRZ + 1 wt % TBRb | 9.7 | 3.77 | 4.57 | 18.28 | 0.4803, 0.5094 | 564.9 |

TABLE 23

| | Composition of light emitting layer | Initial luminance (cd/m²) | Luminance half-life period |
|---|---|---|---|
| Example 1 | mCBP + 25 wt % PXZ-TRZ + 1 wt % TBRb | 3,225 | 195 |
| Comparative Example 1 | mCBP + 1 wt % TBRb | 677 | 40 |
| Comparative Example 3 | mCBP + 25 wt % PXZ-TRZ | 2,791 | 119 |

As shown in Table 22, the organic electroluminescent device of Example 1 having a light emitting layer containing mCBP, PXZ-TRZ, and TBRb had a considerably high external quantum efficiency and a considerably high current efficiency and thus had excellent characteristics, as compared to the organic electroluminescent device of Comparative Example 1 using no PXZ-TRZ and the organic electroluminescent device of Comparative Example 2 using no mCBP.

As shown in Table 23, the organic electroluminescent device of Example 1 had a far longer luminance half-life period than the organic electroluminescent device of Comparative Example 1 using no PXZ-TRZ and the organic electroluminescent device of Comparative Example 3 using no TBRb.

It was found from FIG. 5 that on the load of the initial luminance (1,000 cd/$m^2$), the period of time TL90 where the luminance decayed to 90% was 1 hour for the content of PXZ-TRZ of 0%, 3.5 hours for the content of PXZ-TRZ of 10% by weight, 9.7 hours for the content of PXZ-TRZ of 25% by weight, and 12.5 hours for the content of PXZ-TRZ of 50% by weight, and thus it was understood therefrom that the addition of PXZ-TRZ to the light emitting layer largely enhanced the durability of the electroluminescent device. However, there was little difference between 25% and 50% for the concentration of PXZ-TRZ and thus it was understood therefrom that the concentration of PXZ-TRZ was preferably less than 50%, i.e., preferably smaller than the concentration of mCBP.

Example 2

Production and Evaluation of Organic Electroluminescent Device using ADN (First Organic Compound), PXZ-TRZ (Second Organic Compound), and TBRb (Third Organic Compound)

An electroluminescent device was produced and evaluated in the same manner as in Example 1 except that ADN was used as the first organic compound instead of mCBP in example 1. ADN has a lowest singlet excitation energy level $E_{S1}$ of 2.83 eV and a lowest triplet excitation energy level $E_{T1}$ of 1.69 eV. Light emission at a wavelength of approximately 560 nm was observed from the organic electroluminescent device of Example 2.

The organic electroluminescent device of Example 1 achieved an external quantum efficiency that was significantly higher than the organic electroluminescent device of Example 2, and thus was confirmed to have considerably excellent characteristics.

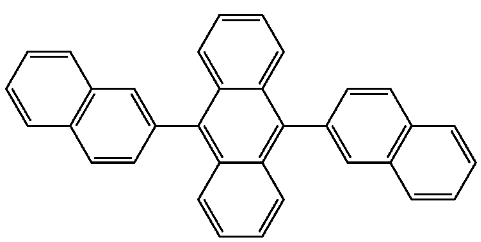

ADN

Example 3

Production and Evaluation of 4-Element Organic Electroluminescent Device using mCBP (First Organic Compound), PXZ-TRZ (Second Organic Compound), TBRb (Third Organic Compound A), and DBP (Third Organic Compound B)

While the organic electroluminescent device was produced by using only TBRb as the third organic compound in Example 1, an organic electroluminescent device was produced and evaluated by using further DBP shown below as the third organic compound in this example. DBP has a lowest singlet excitation energy level $E_{S1}$ of 2.0 eV.

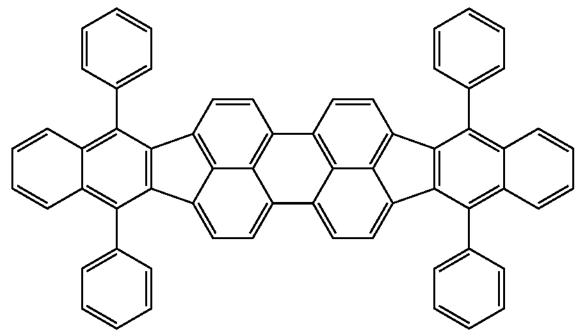

DBP

Thin films were laminated on a glass substrate having formed thereon as anode formed of indium tin oxide (ITO) having a thickness of 110 nm, by a vacuum vapor deposition method at a vacuum degree of $5.0\times10^{-5}$ Pa or less. Firstly, HATCN was formed to a thickness of 10 nm on ITO, and thereon TrisPCz was formed to a thickness of 30 nm. mCBP, PXZ-TRZ, TBRb, and DBP were then vapor-co-deposited from separate vapor deposition sources to form a layer having a thickness of 15 nm, which was designated as a light emitting layer. At this time, the concentration of PXZ-TRZ was selected from a range of from 10% by weight, the concentration of TBRb was 3.0% by weight, and the concentration of DBP was 1.0% by weight. T2T was then formed to a thickness of 10 nm, and thereon BPyTP2 was formed to a thickness of 55 nm. Lithium fluoride (LiF) was then vacuum vapor-deposited to a thickness of 0.8 nm, and than aluminum (Al) was vapor-deposited to a thickness of 100 nm to form a cathode, thereby producing an organic electroluminescent device.

Figure 7:
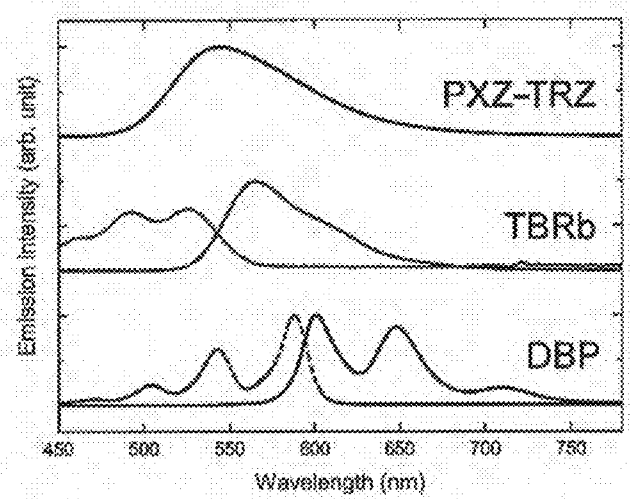
FIG. 7 is the absorption and emission spectra of the organic compounds used in Example 3.
Figure 8:
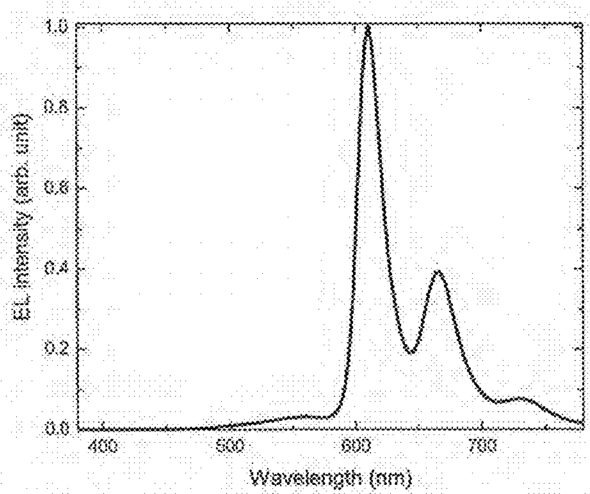
FIG. 8 is the light emission spectrum of the organic electroluminescent device produced in Example 3.
Figure 9:
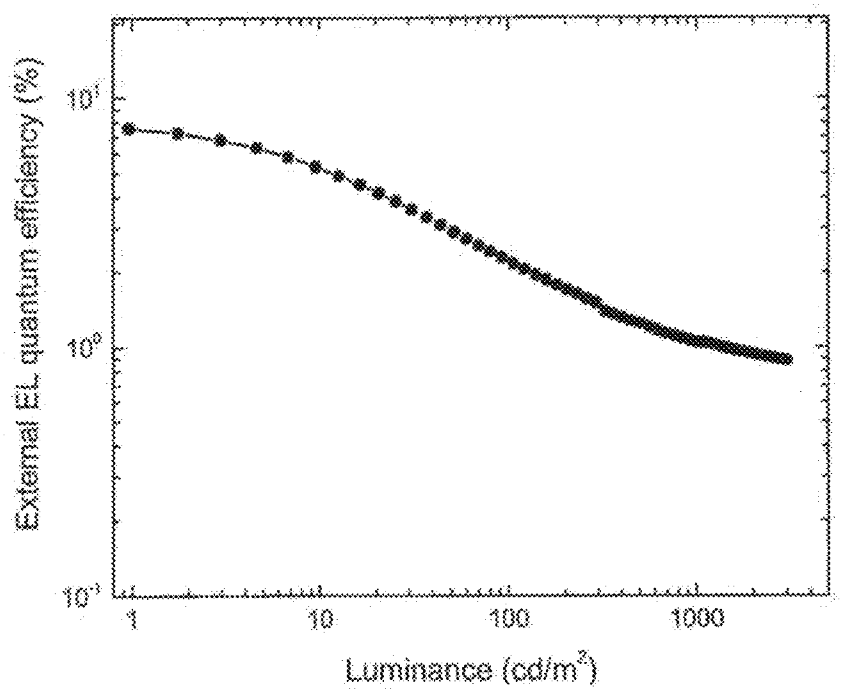
FIG. 9 is a graph showing the luminance-external quantum efficiency characteristics of the organic electroluminescent device produced in Example 3.
Figure 10:
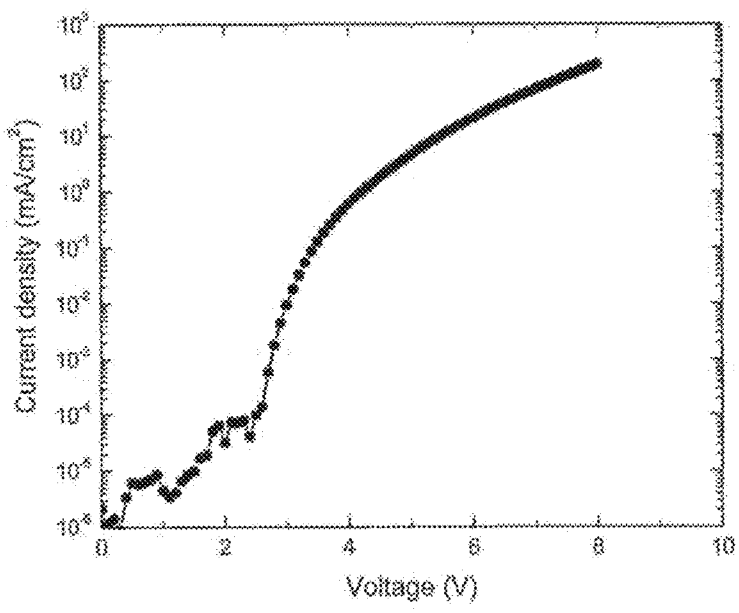
FIG. 10 is a graph showing the voltage-current density characteristics of the organic electroluminescent device produced in Example 3.

FIG. 7 shows the absorption and emission spectra of PXZ-TRZ (second organic compound), TBRb (third organic compound A), and DBP (third organic compound B), and FIG. 8 shows the light emission spectrum of the organic electroluminescent device thus produced. The CIE chromaticity (x,y) was (0.65, 0.35). FIG. 9 shows the luminance-external quantum efficiency characteristics of the organic electroluminescent device thus produced, FIG. 10 shows voltage-current density characteristics thereof. It was confirmed that the organic electroluminescent device thus produced achieved a high external quantum efficiency of 7.6%.

Example 4

Production and Evaluation of Organic Electroluminescent Device using CBP (First Organic Compound), ptris-PXZ-TRZ (Second Organic Compound), and DBP (Third Organic Compound)

In this example, an organic electroluminescent device was produced and evaluated by using CBP shown below as the first organic compound, ptris-PXZ-TRZ shown below as the second organic compound, and DBP as the third organic compound. CBP has a lowest singlet excitation energy level $E_{S1}$ of 3.26 eV and a lowest triplet excitation energy $E_{T1}$ of 2.55 eV, and ptris-PXZ-TRZ has a lowest singlet excitation energy level $E_{S1}$ of 2.30 eV and a lowest triplet excitation energy level $E_{T1}$ of 2.16 eV.

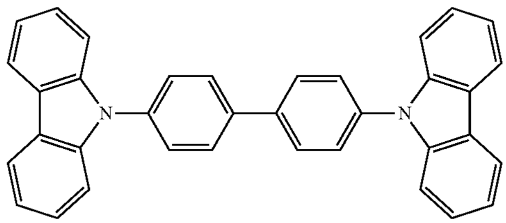

CBP

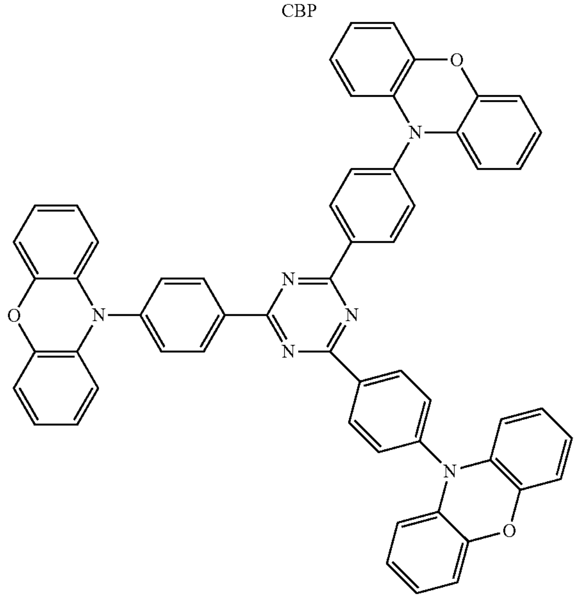

ptris-PXZ-TRZ

Thin films were laminated on a glass substrate having formed thereon an anode formed of indium tin oxide (ITO) having a thickness of 110 nm in the same manner as in Example 1.

Firstly, α-NPD was formed to a thickness of 35 nm on ITO, and thereon CBP, ptris-PXZ-TRZ, and DBP were vapor-co-deposited from separate vapor deposition sources to form a layer having a thickness of 15 nm, which was designated as a light emitting layer. At this time, the concentration of ptris-PXZ-TRZ was 15% by weight, and the concentration of DBP was 1% by weight. TPBi was then formed to a thickness of 65 nm, lithium fluoride (LiF) was vacuum vapor-deposited thereon to a thickness of 0.8 nm, and then aluminum (Al) was vapor-deposited to a thickness of 100 nm to form a cathode, thereby producing an organic electroluminescent device.

Figure 11:
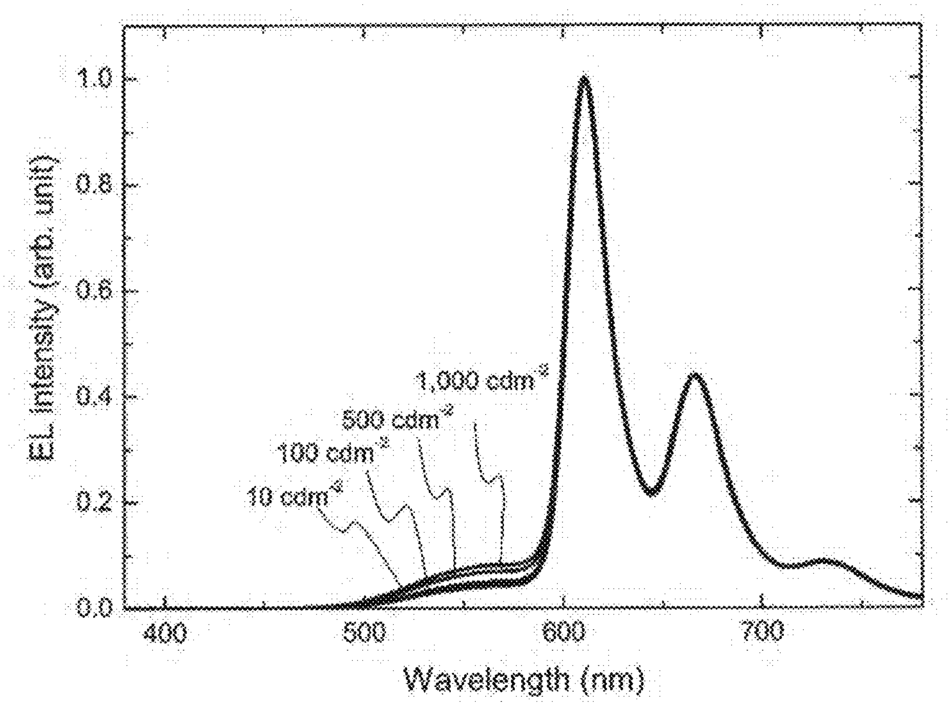
FIG. 11 is the light emission spectra of the organic electroluminescent device produced in Example 4.
Figure 12:
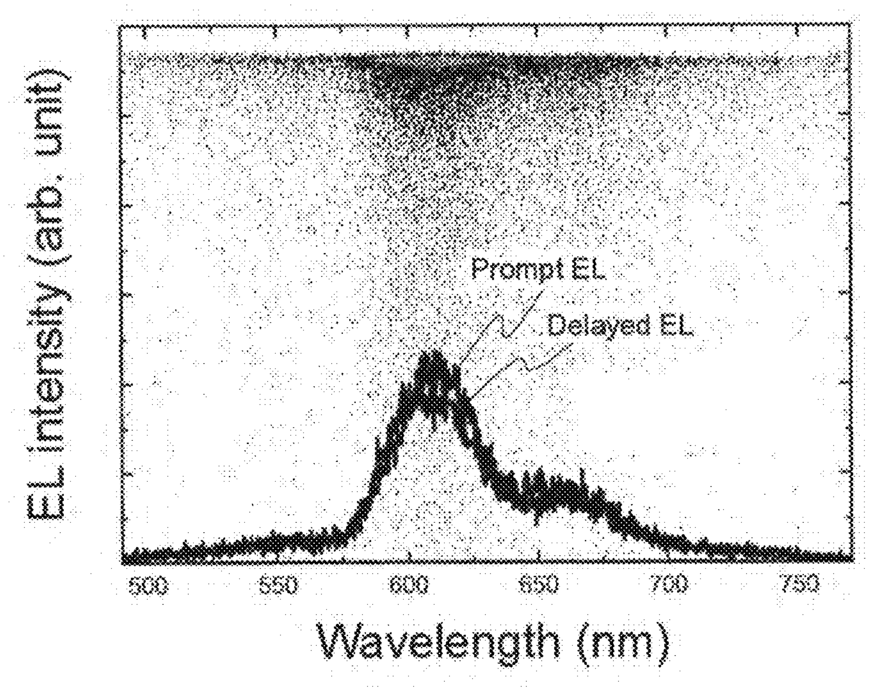
FIG. 12 is the delayed fluorescent component of the light emission spectrum of the organic electroluminescent device produced in Example 4.
Figure 13:
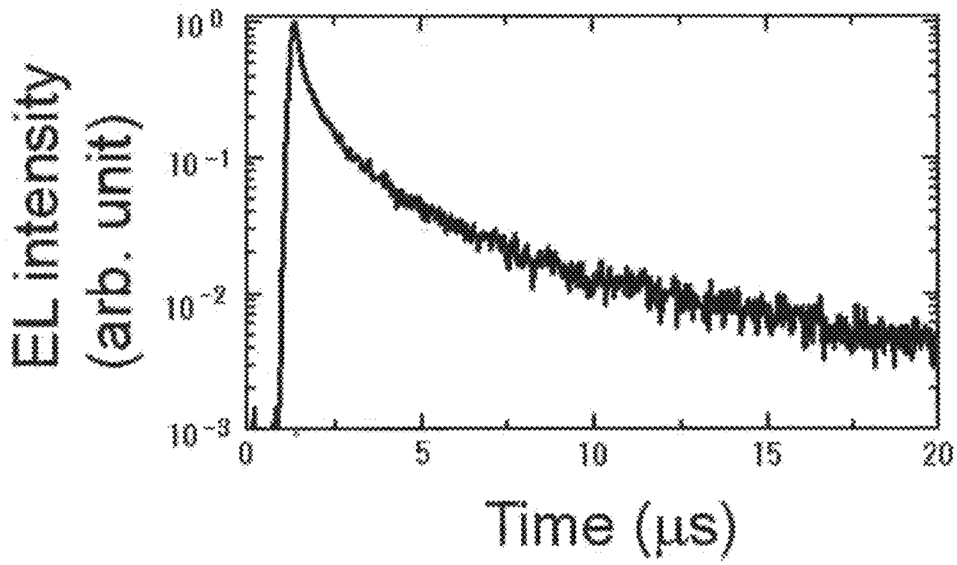
FIG. 13 is the transient decay curve of the organic electroluminescent devices produced in Example 4.
Figure 14:
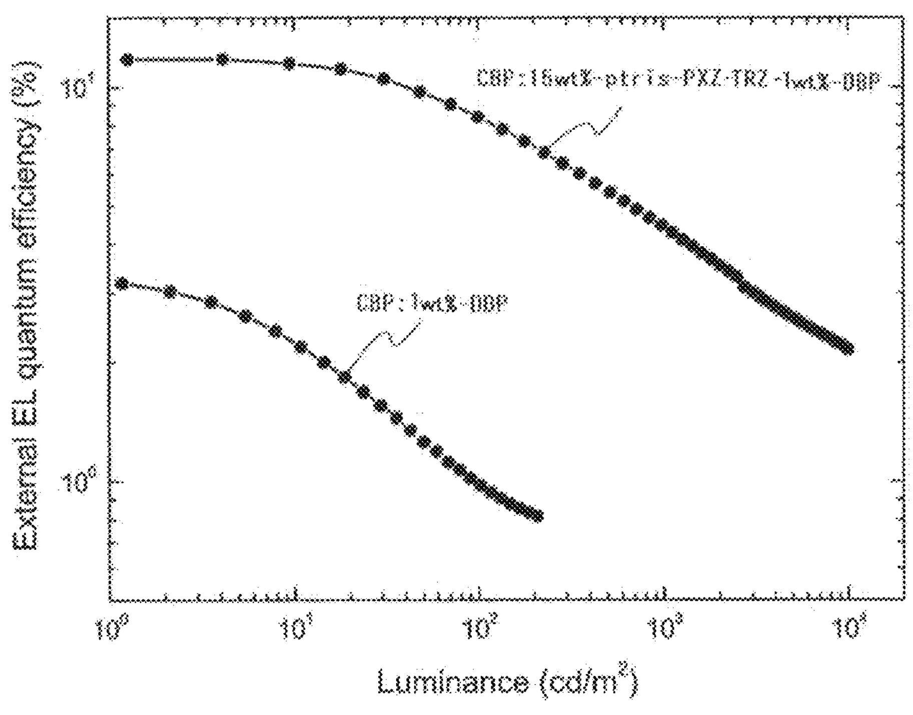
FIG. 14 is a graph showing the luminance-external quantum efficiency characteristics of the organic electroluminescent device produced in Example 4.

The organic electroluminescent device thus produced was measured for light emission spectra with a luminance set at 10 cd/m$^2$, 100 cd/m$^2$, 500 cd/m$^2$, and 1,000 cd/m$^2$. The results are shown in FIG. 11. The CIE chromaticity (x,y) was (0.64, 0.36). FIG. 12 shows the delayed fluorescent component of the light emission spectrum of the organic electroluminescent device thus produced, and FIG. 13 shows the transient decay curve thereof. The internal quantum efficiency $\eta_{inc}$ was 59%, and the single exciton formation efficiency $\eta\gamma_s$ was 74%. FIG. 14 shows the luminance-external quantum efficiency characteristics of the organic electroluminescent device thus produced. FIG. 14 also shows the luminance-external quantum efficiency characteristics of an organic electroluminescent device (CBP; 1 wt %-DBP) having a light emitting layer produced by using no ptris-PXZ-TRZ. It was confirmed that the organic electroluminescent device of this example achieved a high external quantum efficiency of 12%. The power efficiency thereof was 18.0 lm/W, and the current efficiency thereof was 16.5 cd/A.

Example 5

Production and Evaluation of Organic Electroluminescent Device using DPEPO (First Organic Compound), ASAQ (Second Organic Compound), and TBPe (Third Organic Compound)

In this example, an organic electroluminescent device was produced and evaluated by using DPEPO shown below as the first organic compound, ASAQ shown below as the second organic compound, and TBPe shown below as the third organic compound. DPEPO has a lowest singlet excitation energy level $E_{S1}$ of 3.20 eV and a lowest triplet excitation energy level $E_{T1}$ of 3.00 eV, ASAQ has a lowest singlet excitation energy level $E_{S1}$ of 2.75 eV and a lowest triplet excitation energy level $E_{T1}$ of 2.52 eV, and TBPe has a lowest singlet excitation energy level $E_{S1}$ of 2.70 eV.

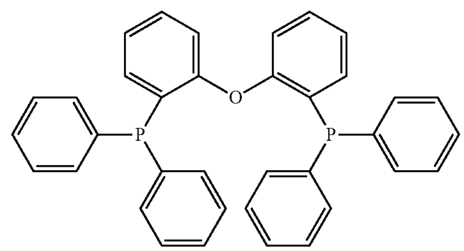

DPEPO

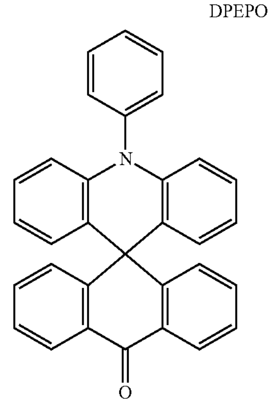

ASAQ

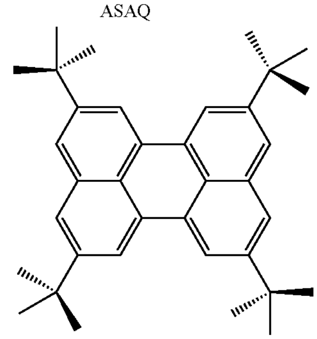

TBPe

Thin films were laminated on a glass substrate having formed thereon an anode formed of indium tin oxide (ITO) having a thickness of 110 nm in the same manner as in Example 1.

Firstly, α-NPD was formed to a thickness of 35 nm on ITO, and thereon mCP was formed to a thickness of 10 nm. DPEPO, ASAQ, and TBPe were then vapor-co-deposited from separate vapor deposition sources to form a layer having a thickness of 15. nm, which was designated as a light emitting layer. At this time, the concentration of ASAQ was 15% by weight, and the concentration of TBPe was 1% by weight. DPEPO was then formed to a thickness of 8 nm, and thereon TPBi was formed to a thickness of 37 nm. Lithium fluoride (LiF) was vacuum vapor-deposited thereon to a thickness of 0.8 nm, and then aluminum (Al) was vapor-deposited to a thickness of 100 nm to form a cathode, thereby producing an organic electroluminescent device.

Figure 15:
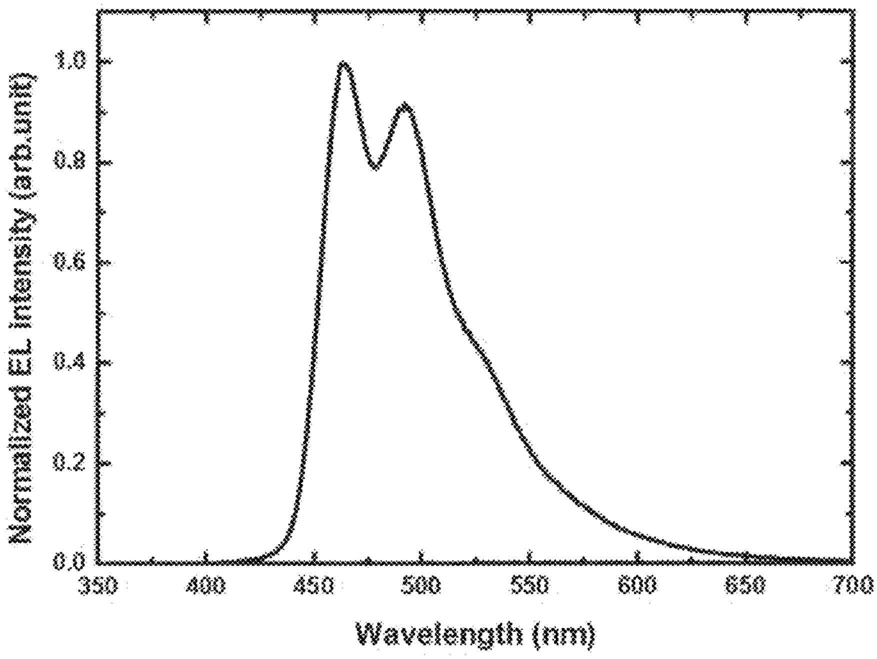
FIG. 15 is the light emission spectrum of the organic electroluminescent device produced in Example 5.
Figure 16:
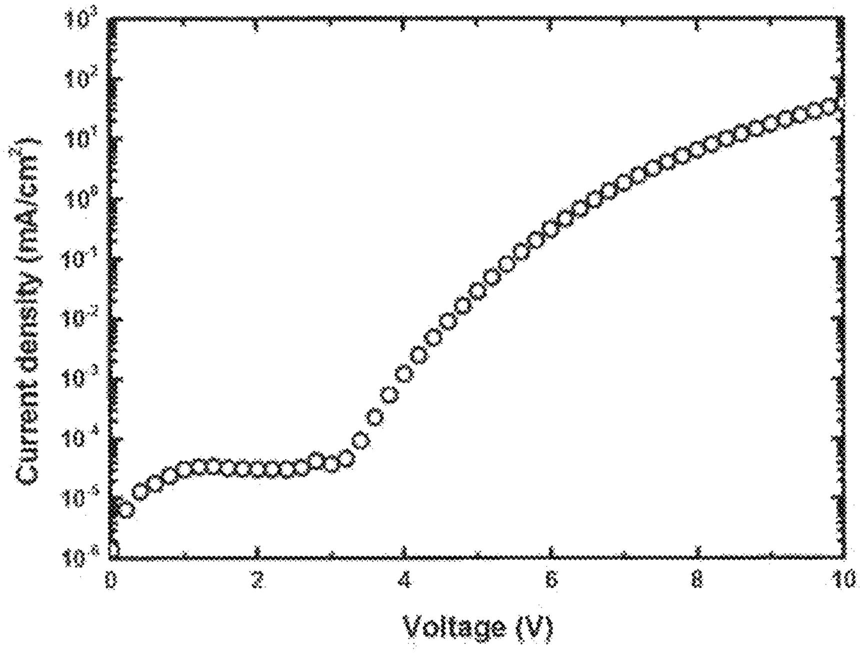
FIG. 16 is a graph showing the voltage-current density characteristics of the organic electroluminescent device produced in Example 5.
Figure 17:
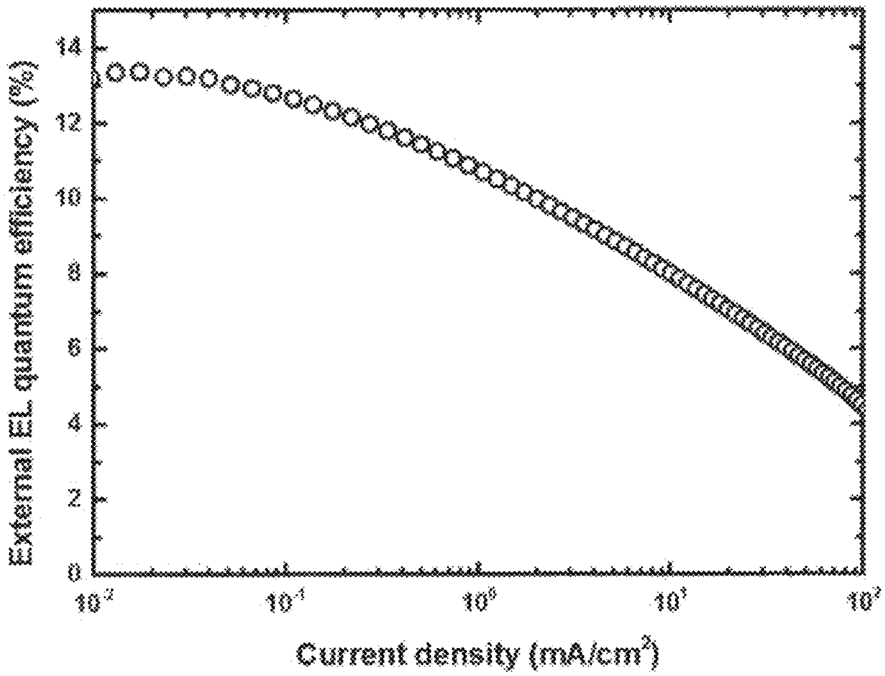
FIG. 17 is a graph showing the current density-external quantum efficiency characteristics of the organic electroluminescent device produced in Example 5.

FIG. 15 shows the light emission spectrum of the organic electroluminescent device thus produced. The CIE chromaticity (x,y) was (0.17, 0.30). FIG. 16 shows the voltage-current density characteristics of the organic electroluminescent device thus produced, and FIG. 17 shows the current density-external quantum efficiency characteristics thereof. It was confirmed that the organic electroluminescent device thus produced achieved a high external quantum efficiency of 13.4%.

Example 6

Production and Evaluation of Organic Electroluminescent Device using DPEPO (First Organic Compound), ASAQ (Second Organic Compound), and TBPe (Third Organic Compound)

An organic electroluminescent device was produced in the same manner as in Example 5 except that the thickness of TPBi was changed to 57 nm.

Figure 18:
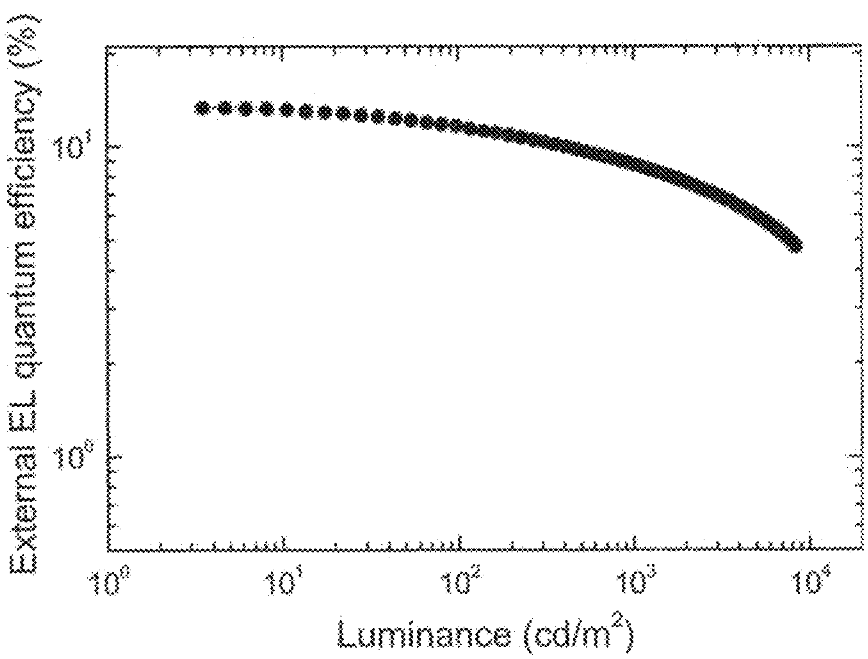
FIG. 18 is a graph showing the luminance-external quantum efficiency characteristics of the organic electroluminescent device produced in Example 6.

The energy difference $\Delta E_{st}$ between the lowest singlet excited state and the lowest triplet excited state and the photoluminescence quantum efficiency $\phi_{PL}$ of the light emitting layer thus formed are shown in Table 24. FIG. 18 shows the luminance-external quantum efficiency characteristics of the organic electroluminescent device thus produced, and the characteristic values thereof are shown in Table 25.

Example 7

Production and Evaluation of Organic Electroluminescent Device using mCP (First Organic Compound), MN04 (Second Organic Compound), and TTPA (Third Organic Compound)

In this example, an organic electroluminescent device was produced and evaluated by using mCP shown below as the first organic compound, MN04 shown below as the second organic compound, and TTPA shown below as the third organic compound. mCP has a lowest singlet excitation energy level $E_{S1}$ of 3.30 eV and a lowest triplet excitation energy level $E_{T1}$ of 2.90 eV, MN04 has a lowest singlet excitation energy level $E_{S1}$ of 2.60 eV and a lowest triplet excitation energy level $E_{T1}$ of 2.47 eV, and TTPA has a lowest singlet excitation energy level $E_{S1}$ of 2.34 eV.

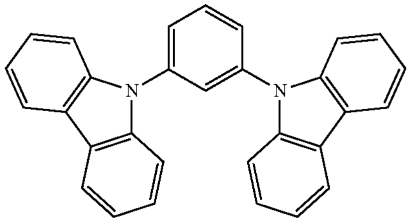

mCP

-continued

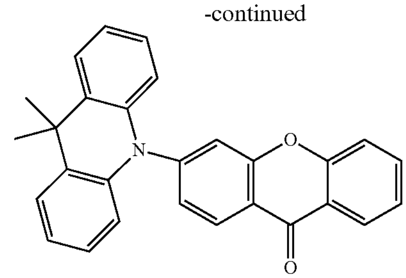

MN04

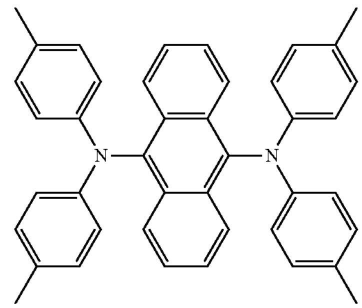

TTPA

Thin films were laminated on a glass substrate having formed thereon an anode formed of indium tin oxide (ITO) having a thickness of 110 nm in the same manner as in Example 1.

Firstly, TAPC was formed to a thickness of 35 nm on ITO, and thereon mCP, MN04, and TTPA were then vapor-co-deposited from separate vapor deposition sources to form a layer having a thickness of 15 nm, which was designated as a light emitting layer. At this time, the concentration of MN04 was 50% by weight, and the concentration of TTPA was 1% by weight. TPBi was then formed to a thickness of 65 nm, lithium fluoride (LiF) was vacuum vapor-deposited thereon to a thickness of 0.8 nm, and then aluminum (Al) was vapor-deposited to a thickness of 100 nm to form a cathode, thereby producing an organic electroluminescent device.

Figure 19:
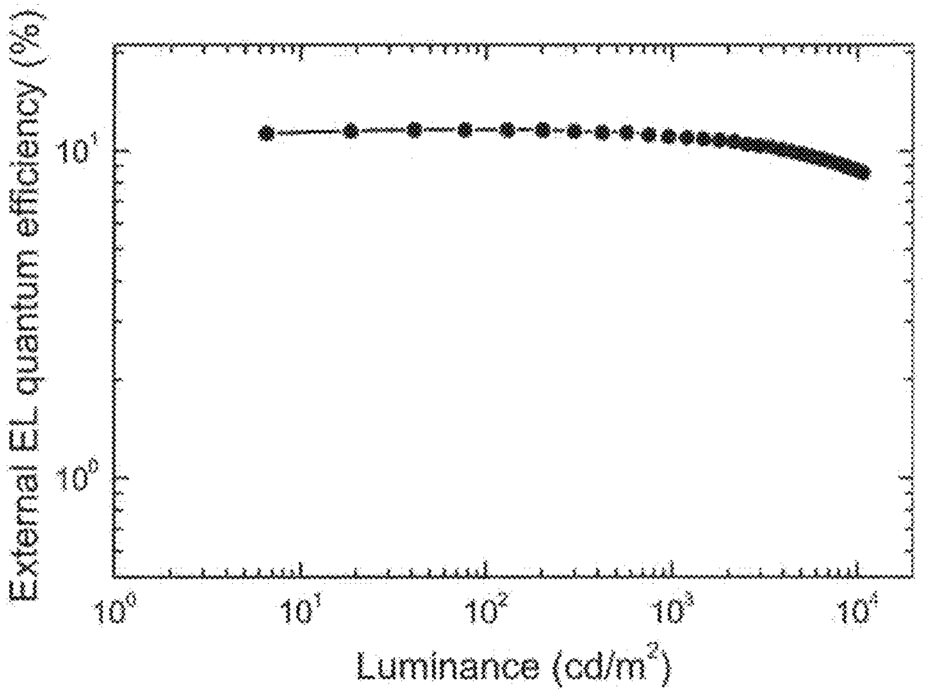
FIG. 19 is a graph showing the luminance-external quantum efficiency characteristics of the organic electroluminescent device produced in Example 7.

The energy difference $\Delta E_{st}$ between the lowest singlet excited state and the lowest triplet excited state and the photoluminescence quantum efficiency $\phi_{PL}$ of the light emitting layer thus formed are shown in Table 24. FIG. 19 shows the luminance-external quantum efficiency characteristics of the organic electroluminescent device thus produced, and the characteristic values thereof are shown in Table 25.

Example 8

Production and Evaluation of Organic Electroluminescent Device using mCBP (First Organic Compound), PXZ-TRZ (Second Organic Compound), and TBRb (Third Organic Compound)

In this example, an organic electroluminescent device was produced and evaluated by using mCBP as the first organic compound, PXZ-TRZ as the second organic compound, and TBRb as the third organic compound.

Thin films were laminated on a glass substrate having formed thereon an anode formed of indium tin oxide (ITO) having a thickness of 110 nm in the same manner as in Example 1.

Firstly, TAPC was formed to a thickness of 35 nm on ITO, and thereon mCBP, PXZ-TRZ, and TBRb were then vaporco-deposited from separate vapor deposition sources to form a layer having a thickness of 30 nm, which was designated as a light emitting layer. At this time, the concentration of PXZ-TRZ was 25% by weight, and the concentration of TBRb was 1% by weight. T2T was then formed to a thickness of 10 nm, and thereon Alq3 was formed to a thickness of 55 nm. Lithium fluoride (LiF) was vacuum vapor-deposited thereon to a thickness of 0.8 nm, and then aluminum (Al) was vapor-deposited to a thickness of 100 nm to form a cathode, thereby producing an organic electroluminescent device.

Figure 20:
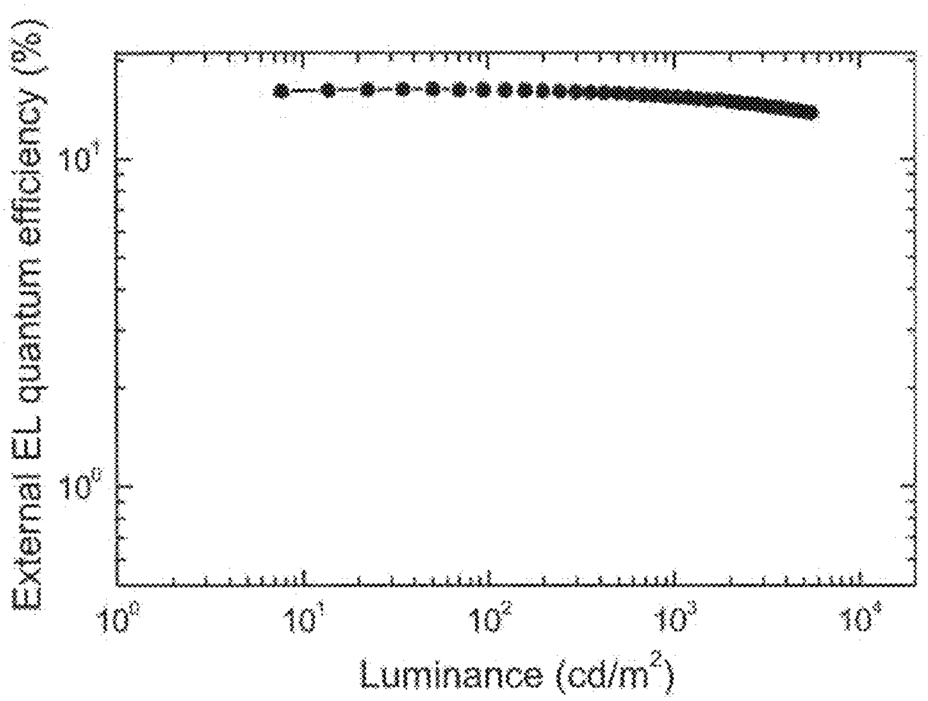
FIG. 20 is a graph showing the luminance-external quantum efficiency characteristics of the organic electroluminescent device produced in Example 8.

The energy difference $\Delta E_{st}$ between the lowest singlet excited state and the lowest triplet excited state and the photoluminescence quantum efficiency $\phi_{PL}$ of the light emitting layer thus formed are shown in Table 24. FIG. 20 shows the luminance-external quantum efficiency characteristics of the organic electroluminescent device thus produced, and the characteristic values thereof are shown in Table 25.

Example 9

Production and Evaluation of Organic Electroluminescent Device using CBP (First Organic Compound), ptris-PXZ-TRZ (Second Organic Compound), and DBP (Third Organic Compound)

In this example, an organic electroluminescent device was produced and evaluated by using CBP as the first organic compound, ptris-PXZ-TRZ as the second organic compound, and DBP as the third organic compound.

Thin films were laminated on a glass substrate having formed thereon an anode formed of indium tin oxide (ITO) having a thickness of 110 nm in the same manner as in Example 1.

Firstly, TAPC was formed to a thickness of 35 nm on ITO, and thereon CBP, ptris-PXZ-TRZ, and DBP were then vapor-co-deposited from separate vapor deposition sources to form a layer having a thickness of 15 nm, which was designated as a light emitting layer. At this time, the concentration of ptris-PXZ-TRZ was 15% by weight, and the concentration of DBP was 1% by weight. TPBi was then formed to a thickness of 65 nm, lithium fluoride (LiF) was vacuum vapor-deposited thereon to a thickness of 0.8 nm, and then aluminum (Al) was vapor-deposited to a thickness of 100 nm to form a cathode, thereby producing an organic electroluminescent device.

Figure 21:
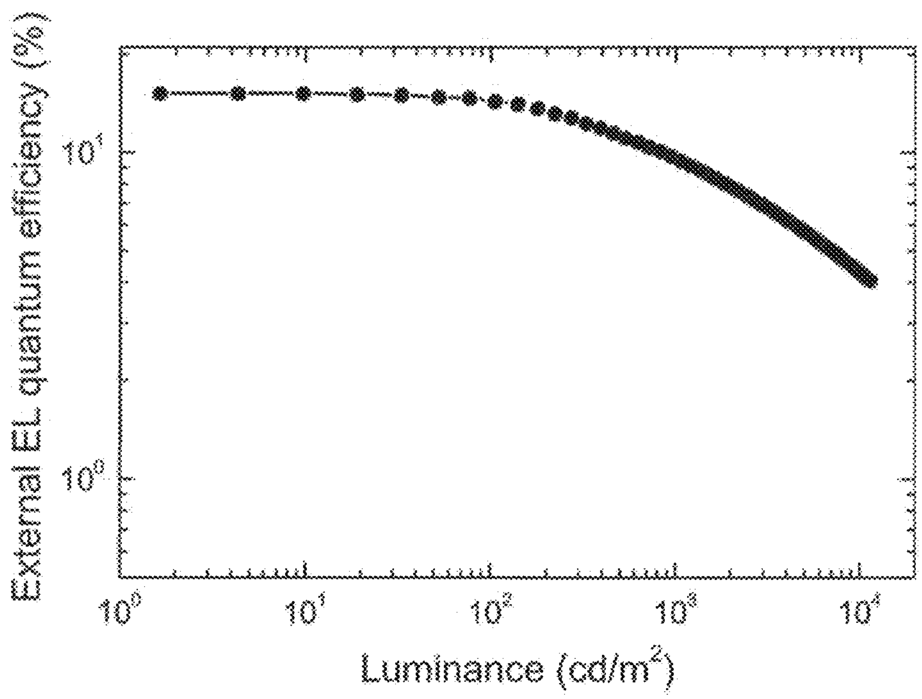
FIG. 21 is a graph showing the luminance-external quantum efficiency characteristics of the organic electroluminescent device produced in Example 9.

The energy difference $\Delta E_{st}$ between the lowest singlet excited state and the lowest triplet excited state and the photoluminescence quantum efficiency $\phi_{PL}$ of the light emitting layer thus formed are shown in Table 24. FIG. 21 shows the luminance-external quantum efficiency characteristics of the organic electroluminescent device thus produced, and the characteristic values thereof are shown in Table 25.

TABLE 24

| | Composition of light emitting layer | Light emission color | $\Delta E_{st}$ (eV) | $\phi_{PL}$ (%) |
|---|---|---|---|---|
| Example 6 | DPEPO + 15 wt % ASAQ + 1 wt % TBPe | blue | 0.03 | 80 ± 2 |
| Example 7 | mCP + 50 wt % MN04 + 1 wt % TTPA | green | 0.06 | 86 ± 2 |
| Example 8 | mCBP + 25 wt % PXZ-TRZ + 1 wt % TBRb | yellow | 0.07 | 90 ± 2 |
| Example 9 | CBP + 15 wt % ptris-PXZ-TRZ + 1 wt % DBP | red | 0.11 | 80 ± 2 |

TABLE 25

| | Turn-on voltage (V) | Maximum external quantum efficiency (%) | Maximum current efficiency (cd/A) | Maximum power efficiency (lm/W) | Exciton formation efficiency (%) | CIE chromaticity (x, y) | Characteristic values at 1,000 cd/m$^2$: Voltage (V) | External quantum efficiency (%) | Current efficiency (cd/A) | Power efficiency (lm/W) |
|---|---|---|---|---|---|---|---|---|---|---|
| Example 6 | 4.7 | 13.4 | 27 | 18 | 84 | 0.17, 0.03 | 7.8 | 8.7 | 18 | 7 |
| Example 7 | 3.0 | 11.7 | 40 | 41 | 66 | 0.29, 0.59 | 4.0 | 11.1 | 36 | 30 |
| Example 8 | 3.1 | 16.3 | 55 | 54 | 88 | 0.45, 0.53 | 5.1 | 15.5 | 52 | 32 |
| Example 9 | 3.0 | 15.2 | 25 | 26 | 95 | 0.61, 0.39 | 5.0 | 9.5 | 17 | 11 |

As shown in Table 25, all the organic electroluminescent devices of Examples 6 to 9 had a high current efficiency and a high power efficiency and achieved a high external quantum efficiency at 11% or more.

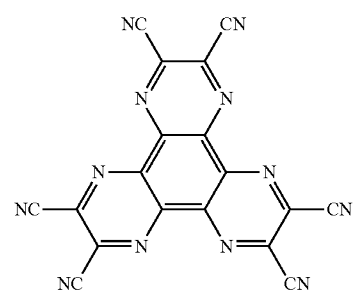

HATCN

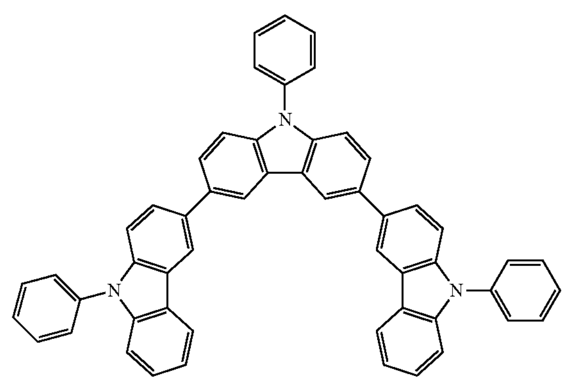

Tris-PCz

-continued

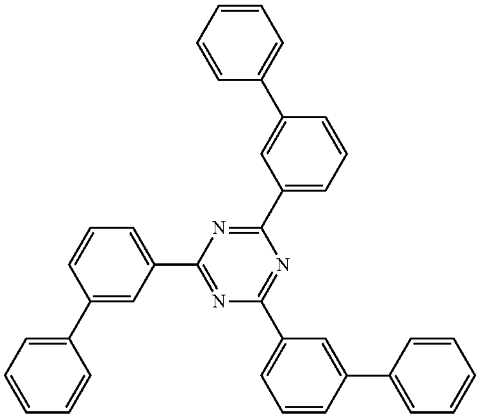

T2T

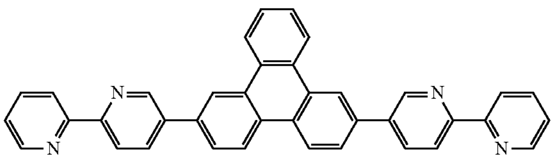

BPyTP2

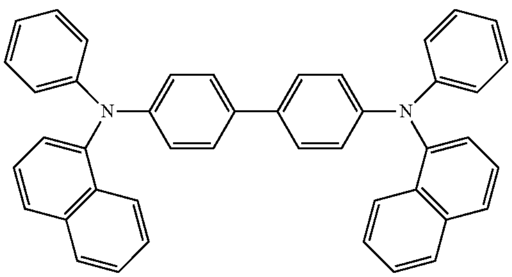

α-NPD

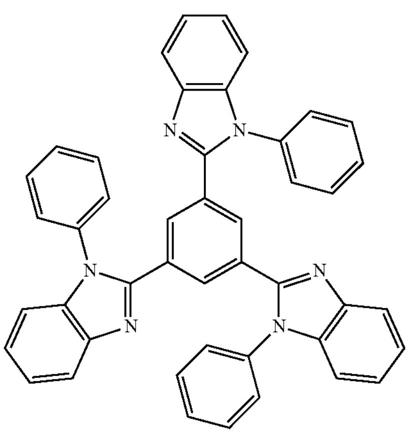

TPBi

-continued

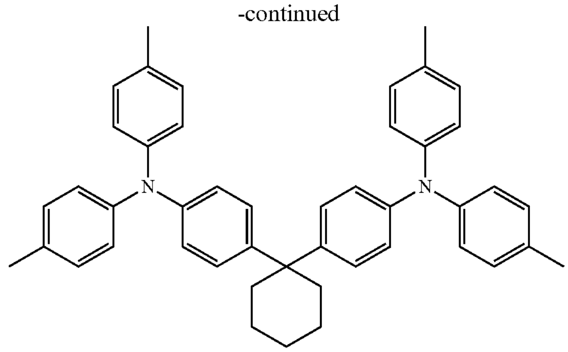

TAPC

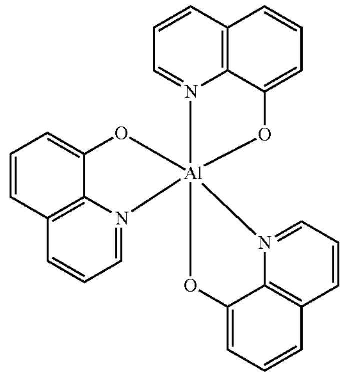

Alq3

INDUSTRIAL APPLICABILITY

The organic electroluminescent device of the invention provides a high light emission efficiency, and thus may be applied as an image display device to various equipments. Accordingly, the invention has a high industrial applicability.

REFERENCE SIGNS LIST

1 substrate
2 anode
3 hole injection layer
4 hole transporting layer
5 light emitting layer
6 electron transporting layer
7 cathode

The invention claimed is:

1. An organic electroluminescent device comprising an anode, a cathode, and at least one organic layer including a light emitting layer between the anode and the cathode, the light emitting layer containing a first organic compound, a second organic compound, and at least one third organic compound that satisfy the following expressions (A) and (B), the second organic compound being a delayed fluorescent material, the second organic compound having an energy difference $\Delta E_{st}$ between a lowest singlet excited state and a lowest triplet excited state at 77 K of 0.3 eV or less, and the third organic compound being a light emitting material:

$$E_{S1}(A)>E_{S1}(B)>E_{S1}(C) \quad (A)$$

wherein $E_{S1}(A)$ represents a lowest singlet excitation energy level of the first organic compound; $E_{S1}(B)$ represents a lowest singlet excitation energy level of the second organic compound; and $E_{S1}(C)$ represents a lowest singlet excitation energy level of the third organic compound;

$$E_{T1}(A)>E_{T1}(B) \quad \text{(B)}$$

wherein $E_{T1}(A)$ represents a lowest triplet excitation energy level at 77 K of the first organic compound; and $E_{T1}(B)$ represents a lowest triplet excitation energy level at 77 K of the second organic compound.

2. The organic electroluminescent device according to claim 1, wherein the second organic compound has an energy difference $\Delta E_{st}$ between a lowest singlet excited state and a lowest triplet excited state at 77 K of 0.08 eV or less.

3. The organic electroluminescent device according to claim 1, wherein the third organic compound emits fluorescent light on returning from the lowest singlet excitation energy level to a ground energy level.

4. The organic electroluminescent device according to claim 1, wherein in the light emitting layer, a content of the second organic compound is smaller than a content of the first organic compound.

5. The organic electroluminescent device according to claim 1, wherein the light emitting layer contains a plurality of third organic compounds that satisfy the expression (A) in relation to the first and second organic compounds.

6. The organic electroluminescent device according to claim 1, wherein the light emitting layer contains at least one organic compound, in addition to the first organic compound, the second organic compound, and the third organic compound.

* * * * *